US006795334B2

(12) United States Patent
Iwata et al.

(10) Patent No.: US 6,795,334 B2
(45) Date of Patent: Sep. 21, 2004

(54) MAGNETIC RANDOM ACCESS MEMORY

(75) Inventors: Yoshihisa Iwata, Yokohama (JP); Yoshiaki Asao, Yokohama (JP); Keiji Hosotani, Tokyo (JP); Junichi Miyamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 10/180,024

(22) Filed: Jun. 27, 2002

(65) Prior Publication Data

US 2003/0117834 A1 Jun. 26, 2003

(30) Foreign Application Priority Data

Dec. 21, 2001 (JP) ....................................... 2001-390670

(51) Int. Cl.[7] ................................................ G11C 11/00
(52) U.S. Cl. ........................ 365/158; 365/171; 365/173
(58) Field of Search ................................ 365/158, 171, 365/173

(56) References Cited

U.S. PATENT DOCUMENTS

| | | | | |
|---|---|---|---|---|
| 5,748,519 A | | 5/1998 | Tehrani et al. | |
| 5,852,574 A | * | 12/1998 | Naji | 365/158 |
| 5,894,447 A | | 4/1999 | Takashima | |
| 6,072,718 A | * | 6/2000 | Abraham et al. | 365/158 |
| 6,128,329 A | | 10/2000 | Takakusaki | |
| 6,134,138 A | | 10/2000 | Lu et al. | |
| 6,169,688 B1 | | 1/2001 | Noguchi | |
| 6,169,689 B1 | * | 1/2001 | Naji | 365/173 |
| 6,188,615 B1 | | 2/2001 | Perner et al. | |
| 2001/0035545 A1 | | 11/2001 | Schuster-Woldan et al. | |
| 2003/0198080 A1 | | 10/2003 | Iwata | |

FOREIGN PATENT DOCUMENTS

| | | |
|---|---|---|
| EP | 1109170 | 6/2001 |
| EP | 1202284 | 5/2002 |
| EP | 1253651 | 10/2002 |
| EP | 1321941 | 8/2003 |
| JP | 11-354728 | 12/1999 |
| JP | 2001-217398 | 8/2001 |
| JP | 2001-357666 | 12/2001 |
| WO | WO 99/14760 | 3/1999 |
| WO | WO 99/18578 | 4/1999 |
| WO | WO 00/19441 | 4/2000 |
| WO | WO 00/57423 | 9/2000 |
| WO | WO 02/41321 | 5/2002 |

OTHER PUBLICATIONS

R. Scheuerlein, et al., ISSCC 2000/Session 7/TD: Emerging Memory & Device Technologies/paper TA 7.2, pp. 128, 129, 409, 410 and 411, "A 10ns Read and Write Non–Volatile Memory Array Using a Magnetic Tunnel Junction and FET Switch in Each Cell", Feb. 8, 2000.

M. Durlam, et al., ISSCC 2000/Session 7/TD: Emerging Memory & Device Technologies/paper TA 7.2, pp. 129, 130, 131 and 95, 96 and 97, "Nonvolatile RAM Based on Magnetic Tunnel Junction Elements", Feb. 8, 2000.

U.S. patent application Ser. No. 09/961,326, filed Sep. 25, 2001, pending.

U.S. patent application Ser. No. 10/073,339, filed Feb. 13, 2002, pending.

(List continued on next page.)

*Primary Examiner*—Huan Hoang
(74) *Attorney, Agent, or Firm*—Oblon, Spivak, McClelland, Maier & Neustadt, P.C.

(57) ABSTRACT

A read blocks are connected to a read bit line. The read block has MTJ elements connected in series or in parallel, or arranged by combining series and parallel connections between the read bit line and a ground terminal. The MTJ elements are stacked on a semiconductor substrate. The read bit line is arranged on the MTJ elements stacked. A write word line extending in the X-direction and a write bit line extending in the Y-direction are present near the MTJ elements in the read block.

103 Claims, 194 Drawing Sheets

OTHER PUBLICATIONS

U.S. patent application Ser. No. 10/160,184, filed Jun. 4, 2002, pending.

U.S. patent application Ser. No. 10/162,605, filed Jun. 6, 2002, pending.

U.S. patent application Ser. No. 10/170,366, filed Jun. 14, 2002, pending.

U.S. patent application Ser. No. 10/180,024, filed Jun. 27, 2002, pending.

U.S. patent application Ser. No. 10/107,310, filed Mar. 28, 2002, pending.

U.S. patent application Ser. No. 10/160,058, filed Jun. 4, 2002, pending.

U.S. patent application Ser. No. 10/180,024, filed Jun. 27, 2002, pending.

U.S. patent application Ser. No. 10/180,517, filed Jun. 27, 2002, pending.

* cited by examiner

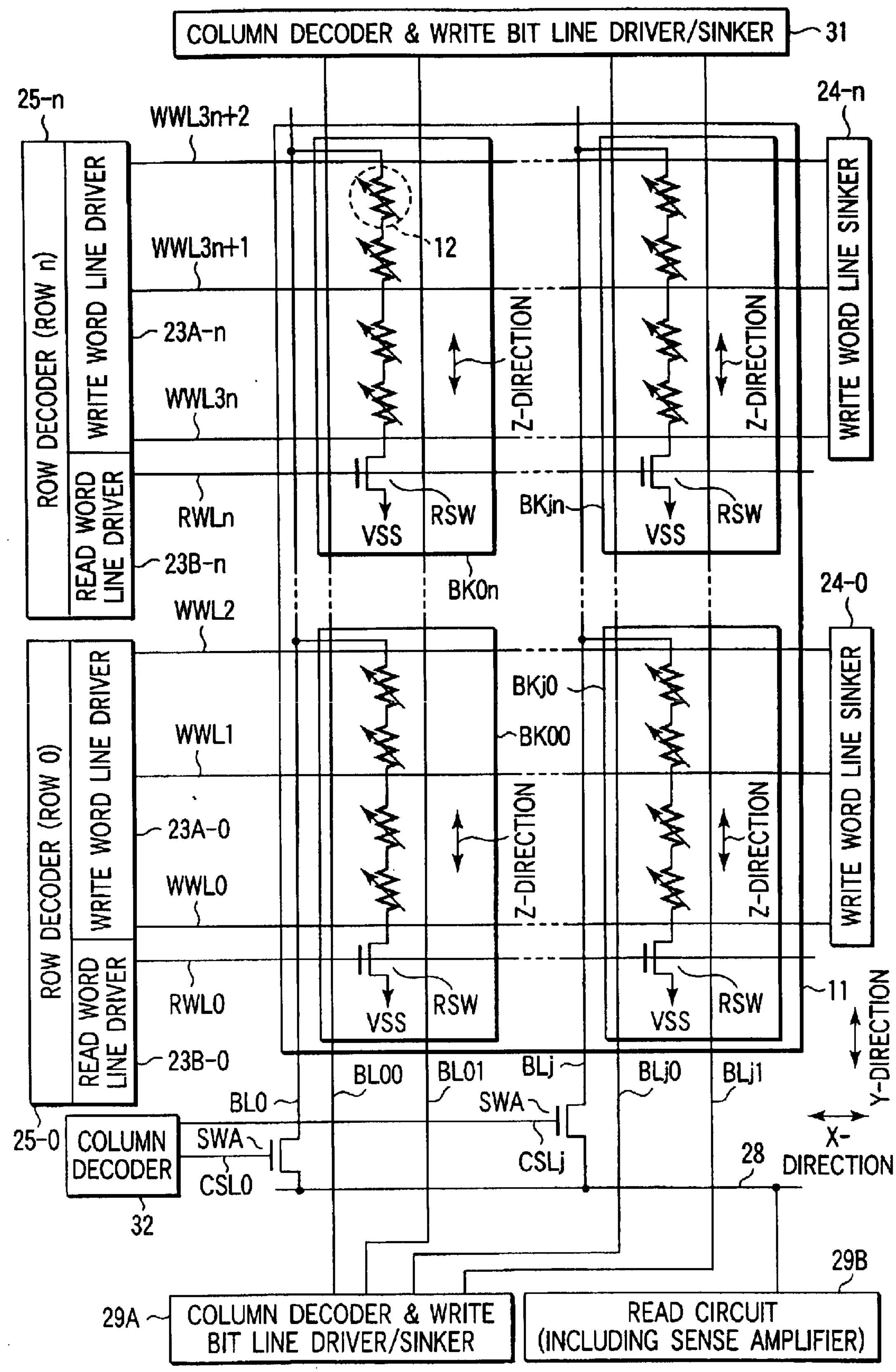
F I G. 1

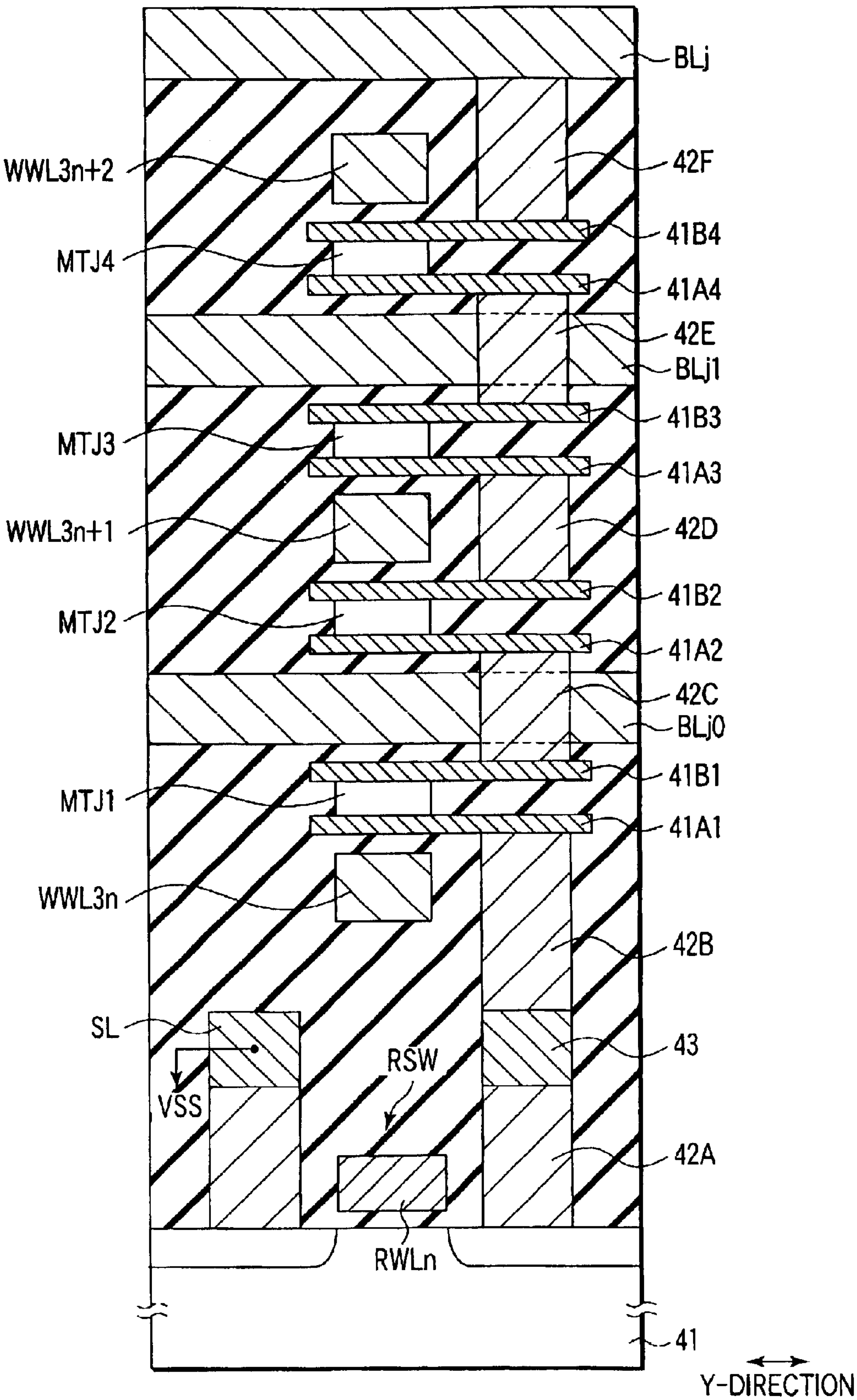
F I G. 2

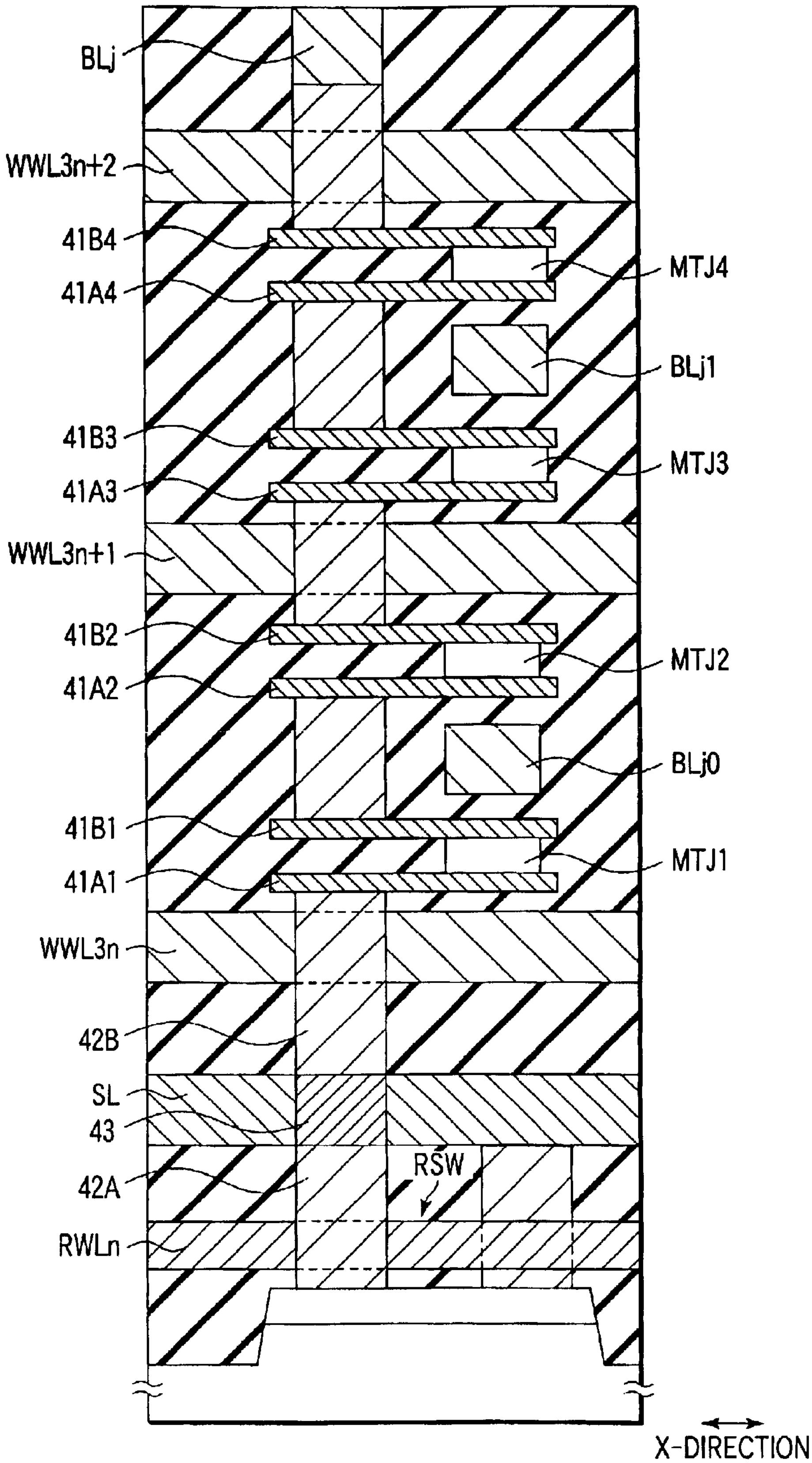
F I G. 3

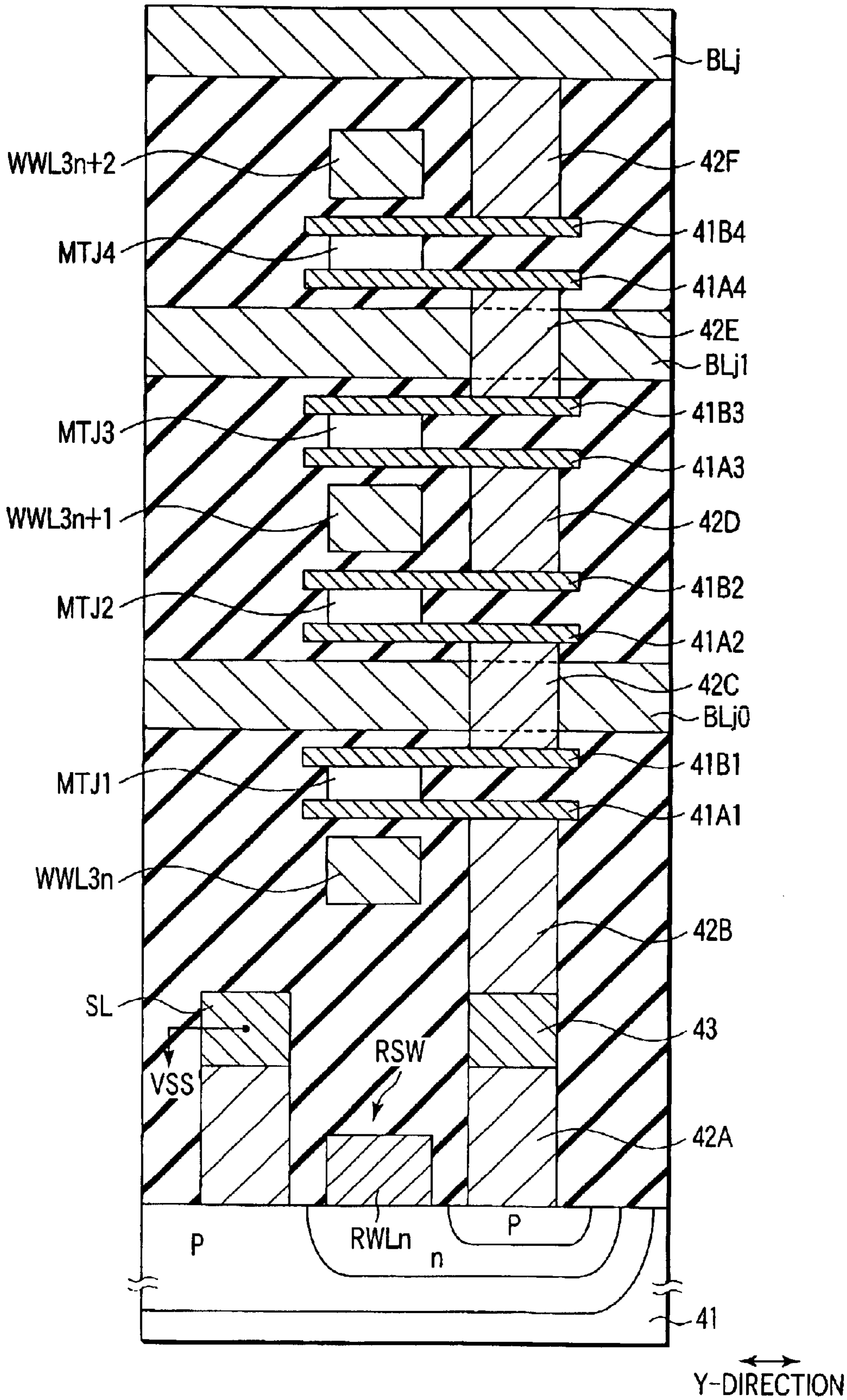
F I G. 7

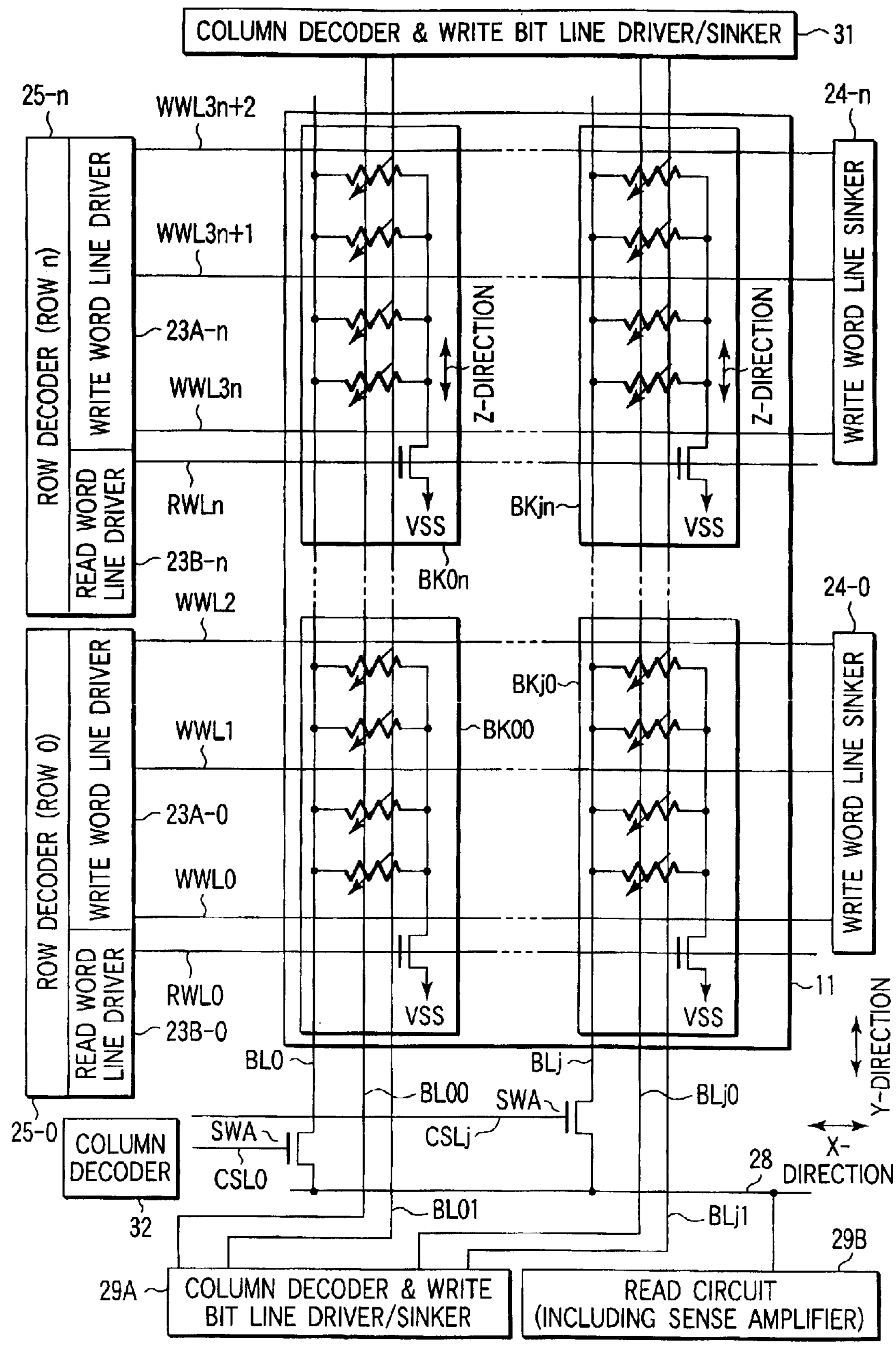
F I G. 8

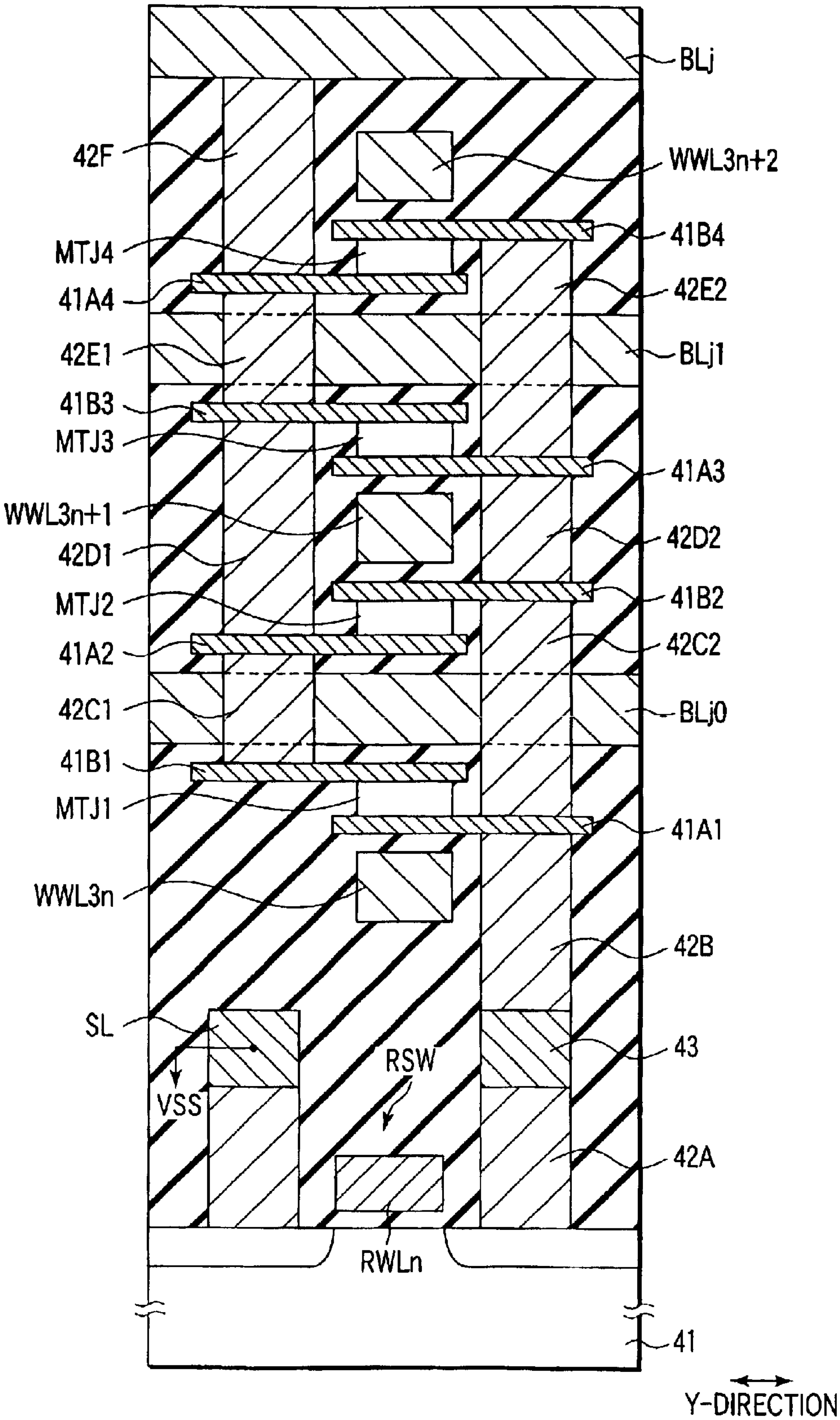
F I G. 9

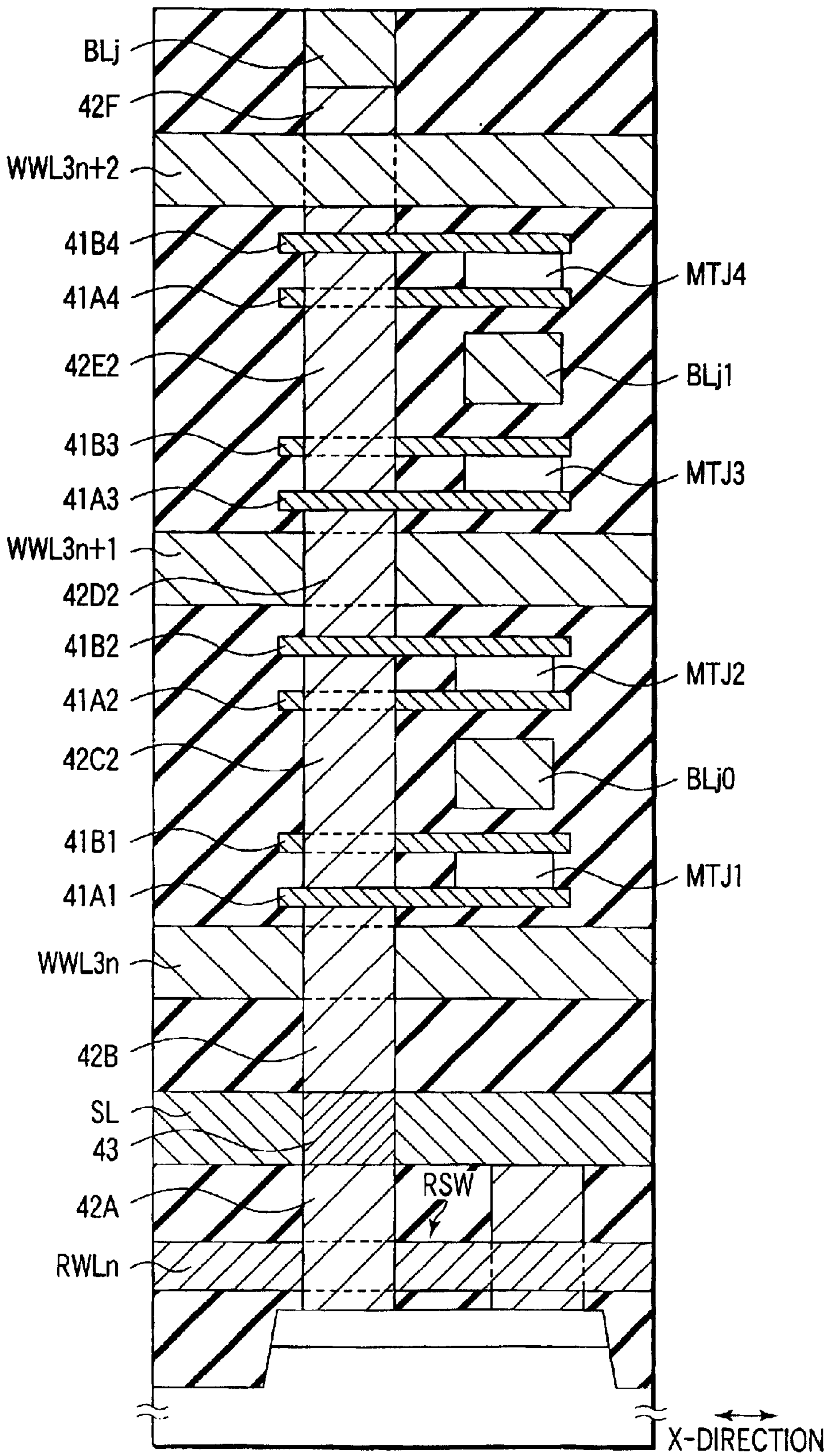
F I G. 10

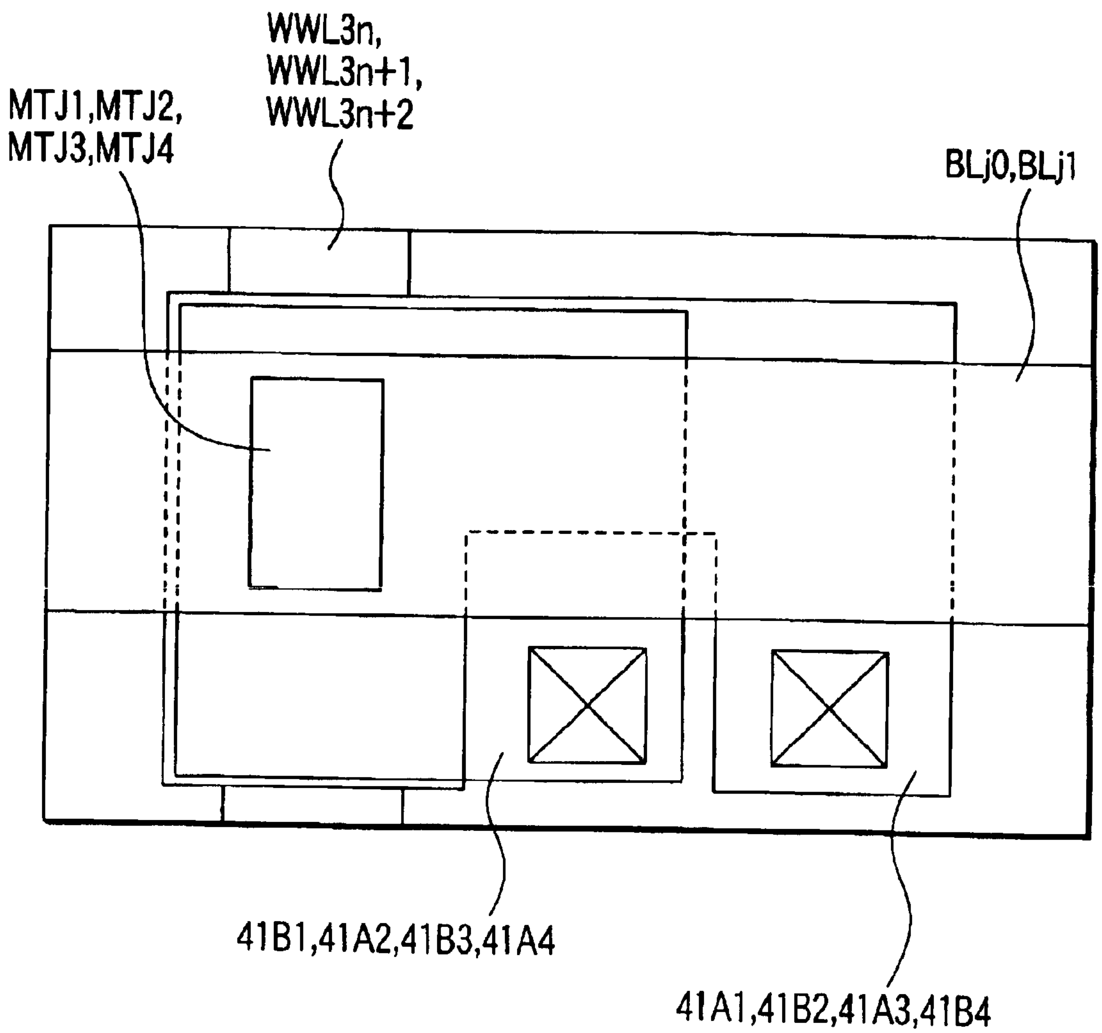
F I G. 12

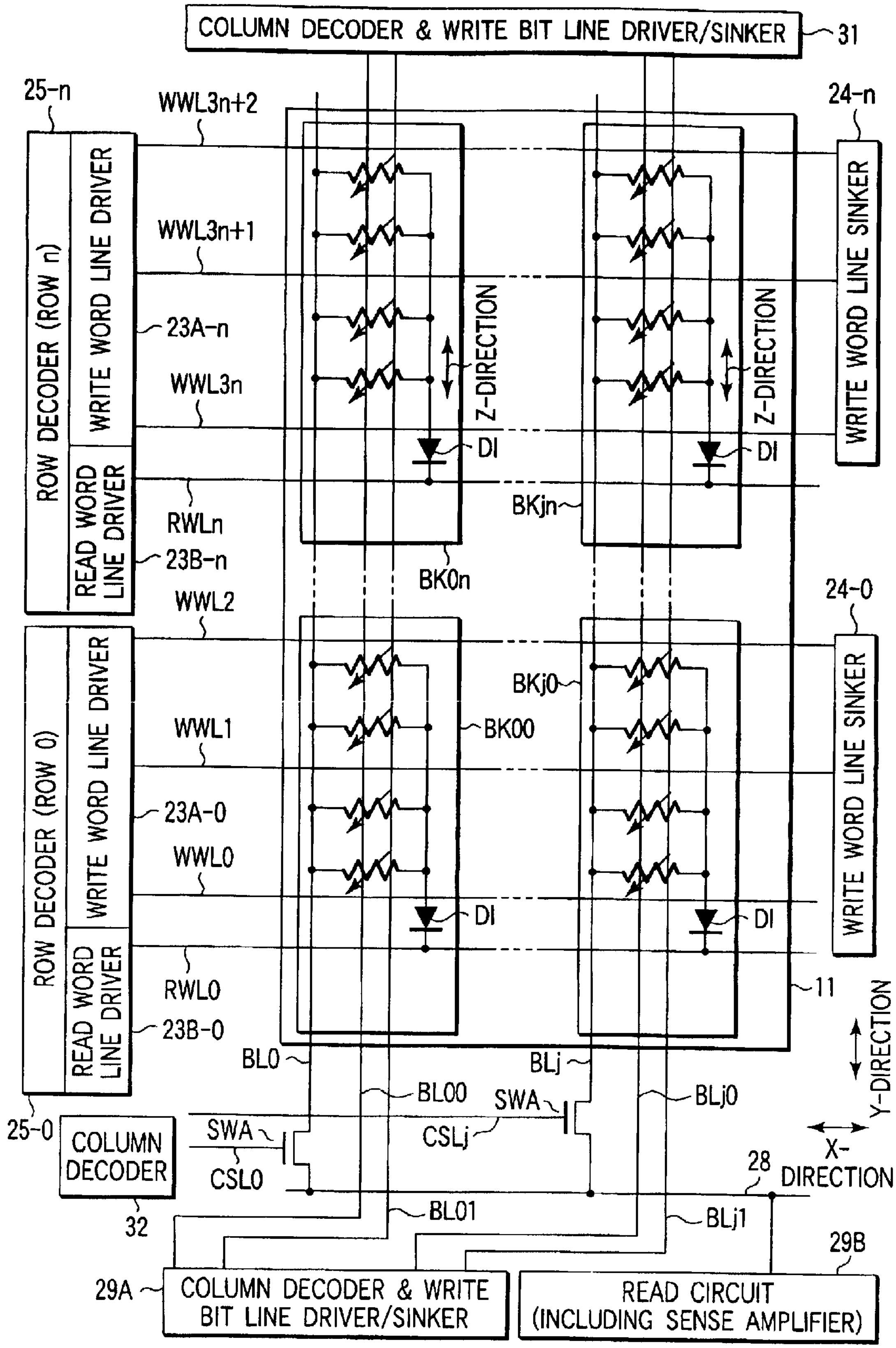
F I G. 13

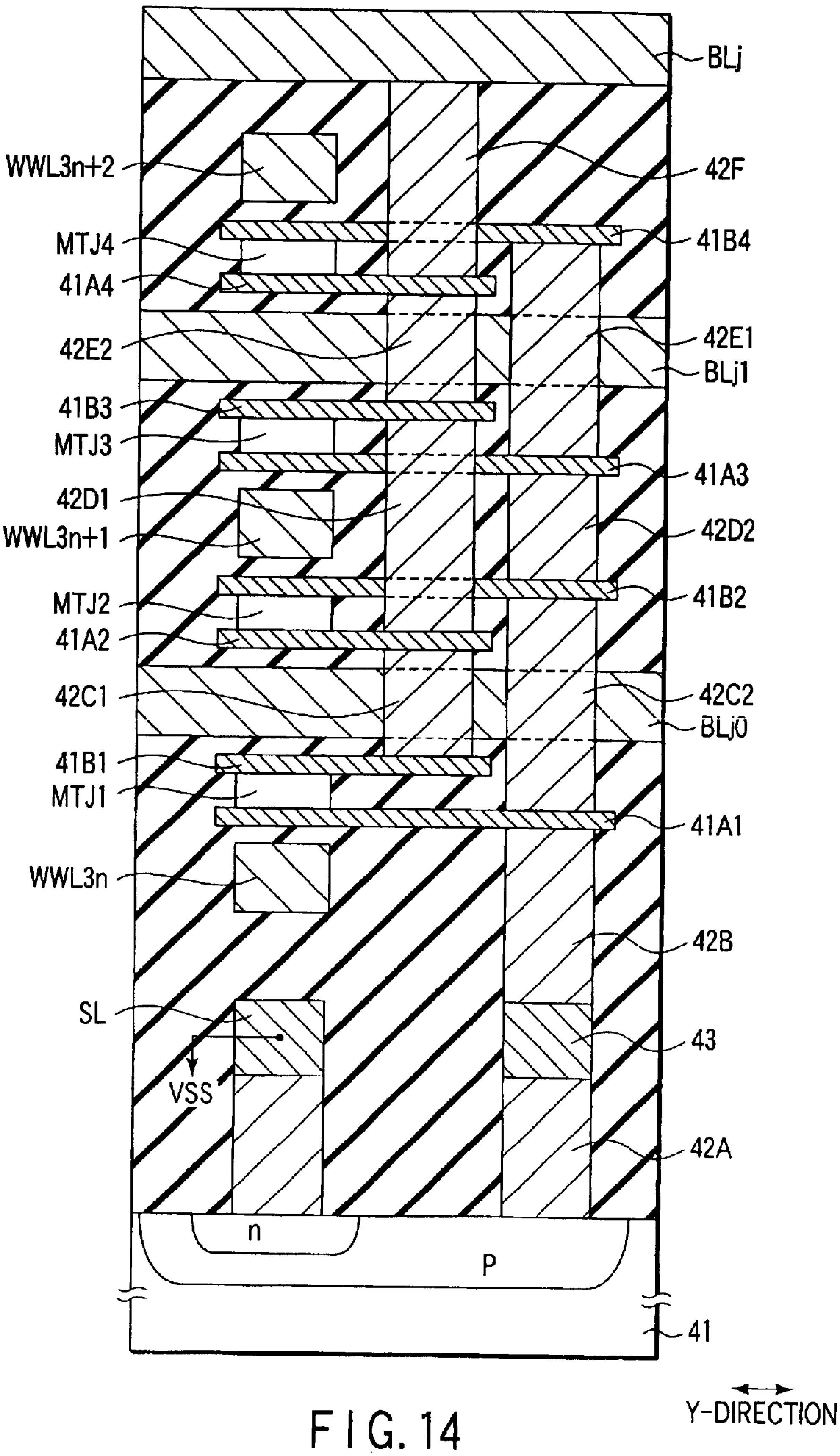
F I G. 14

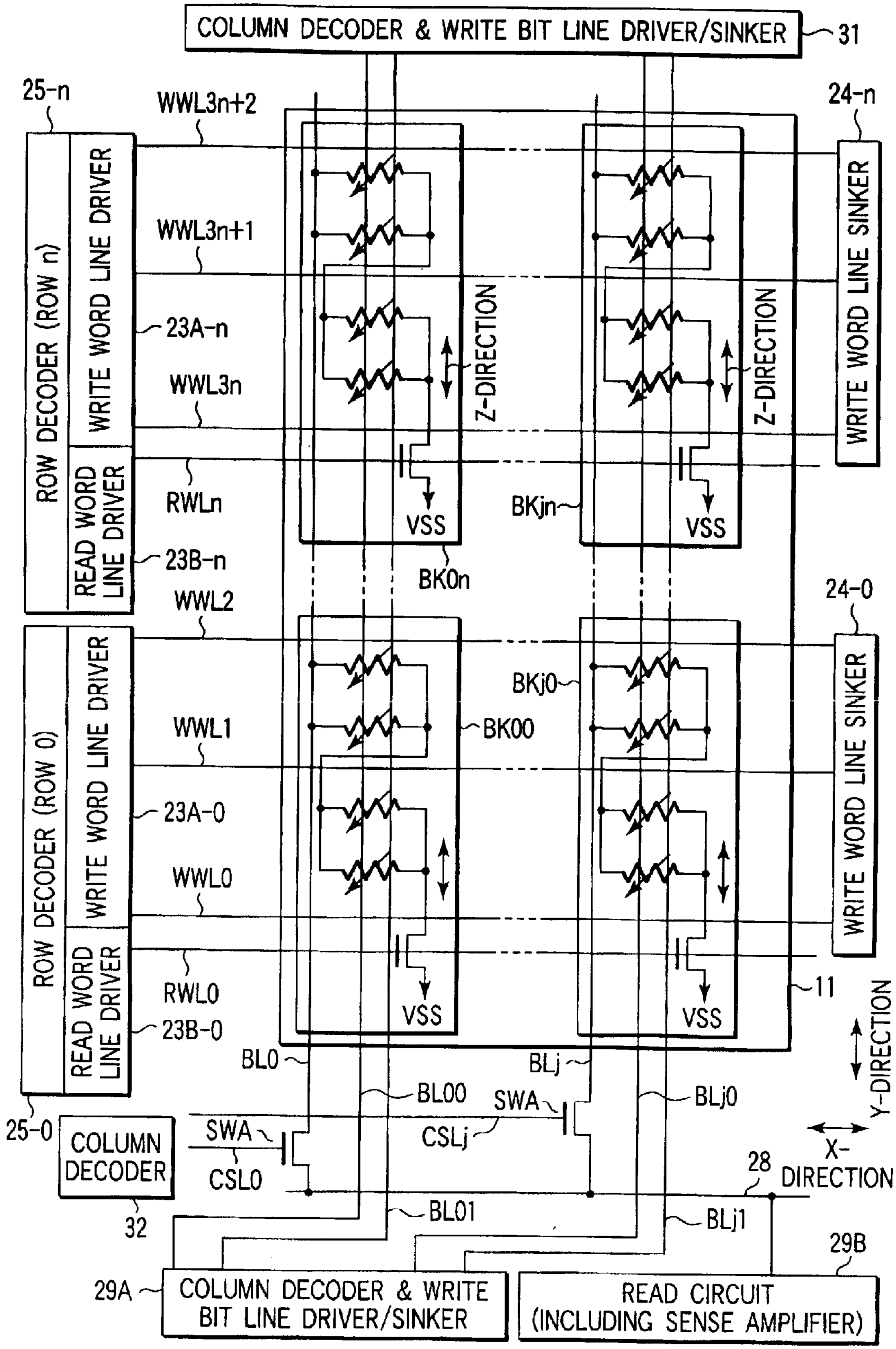
F I G. 17

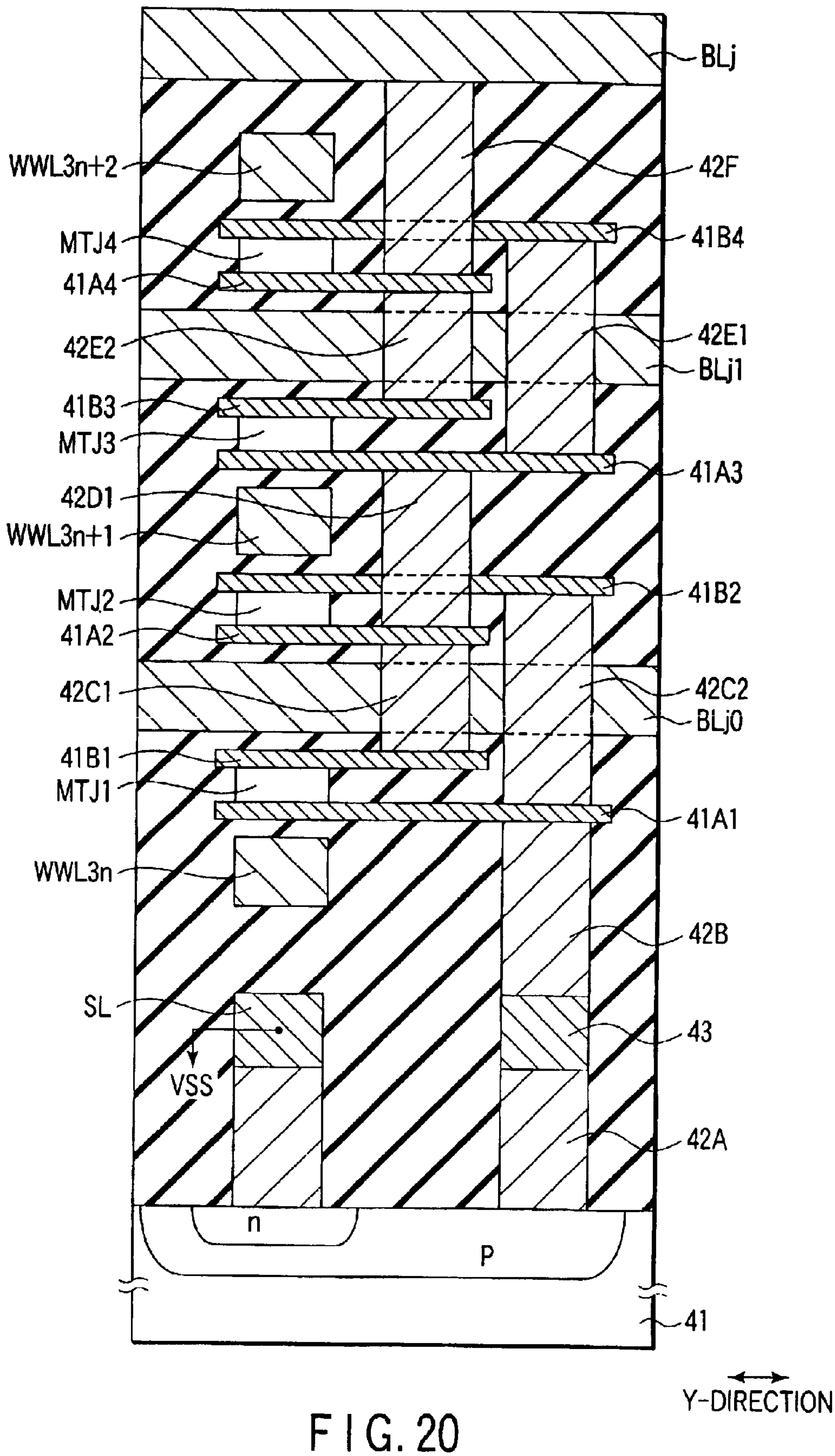
F I G. 20

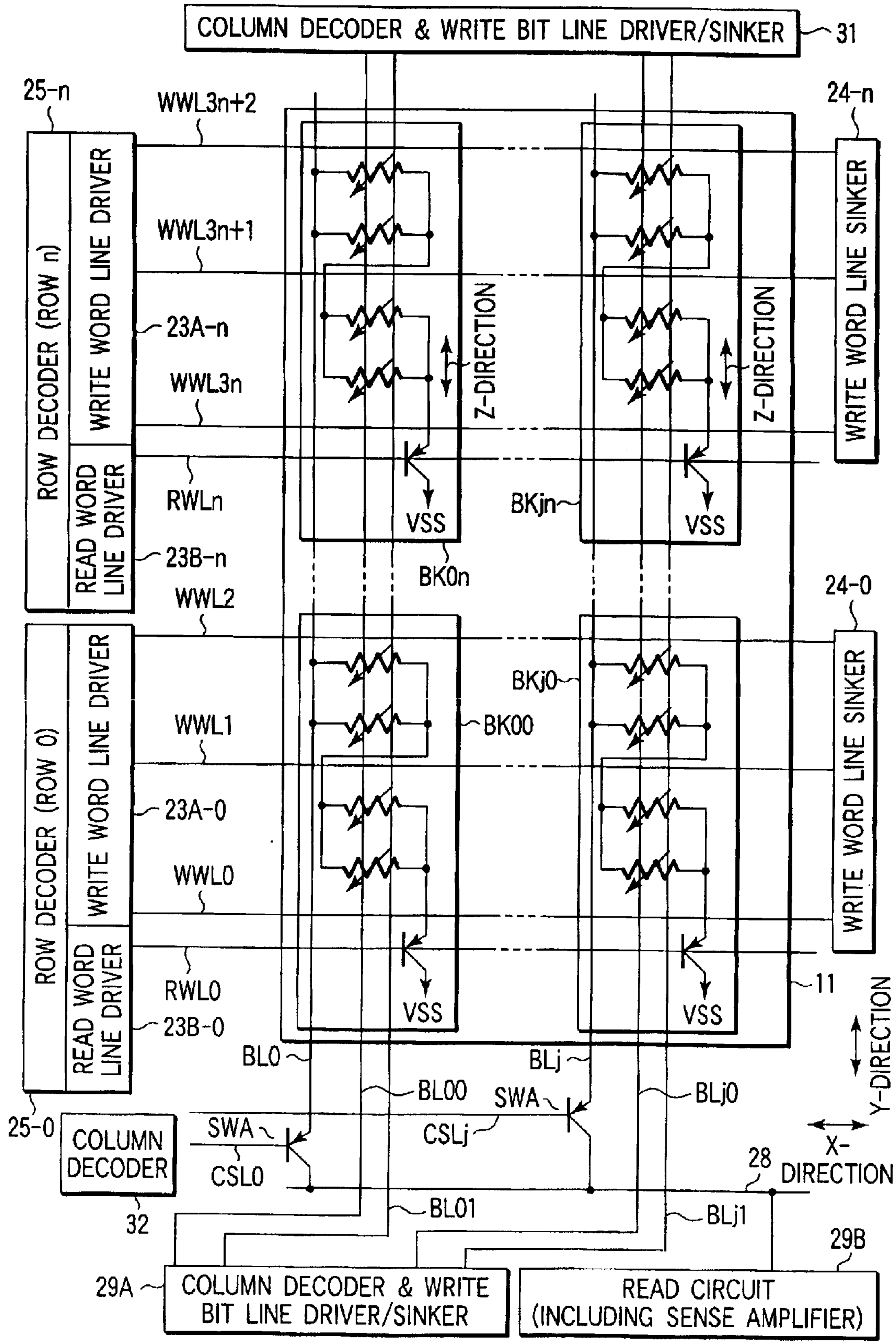
F I G. 21

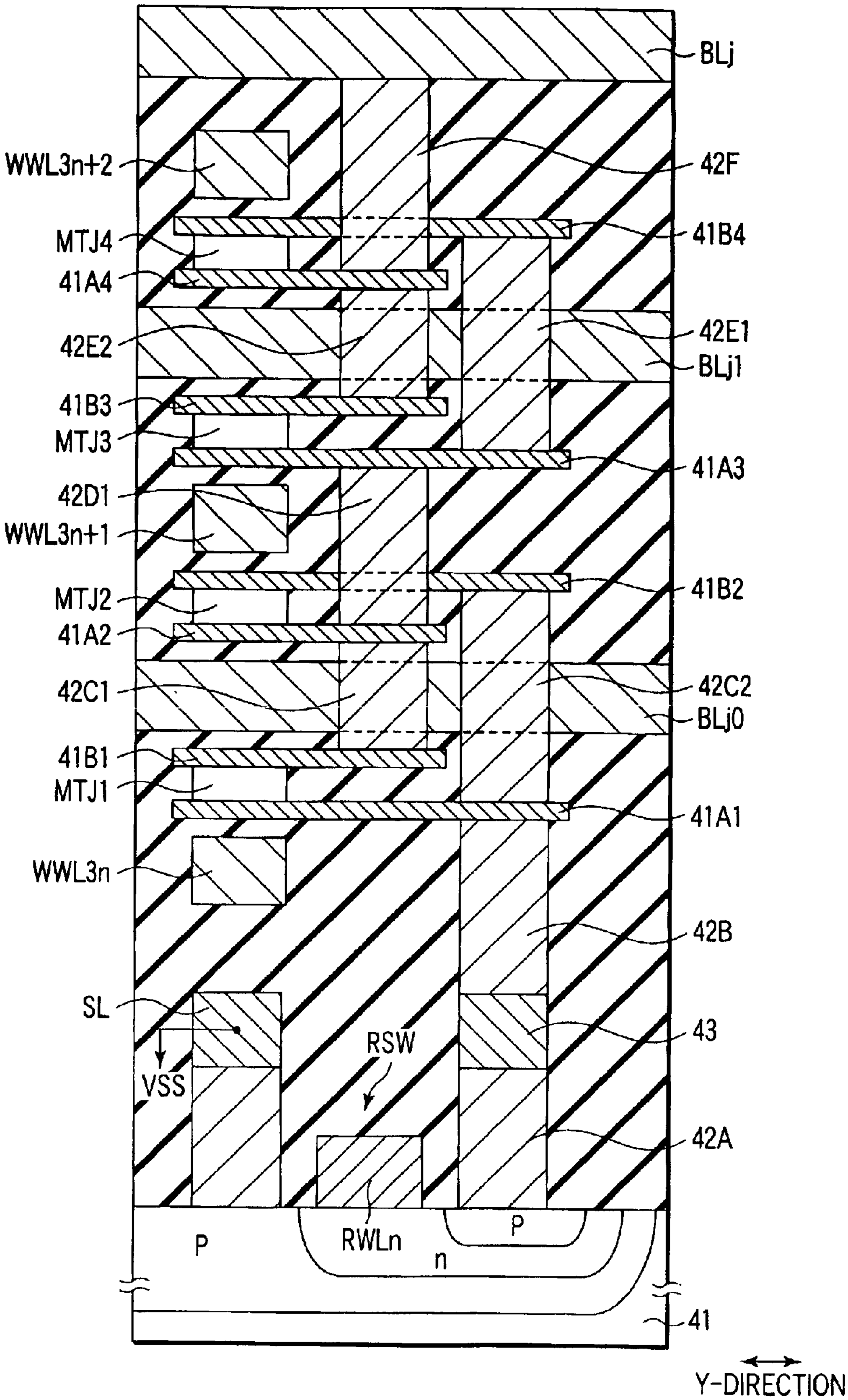
F I G. 22

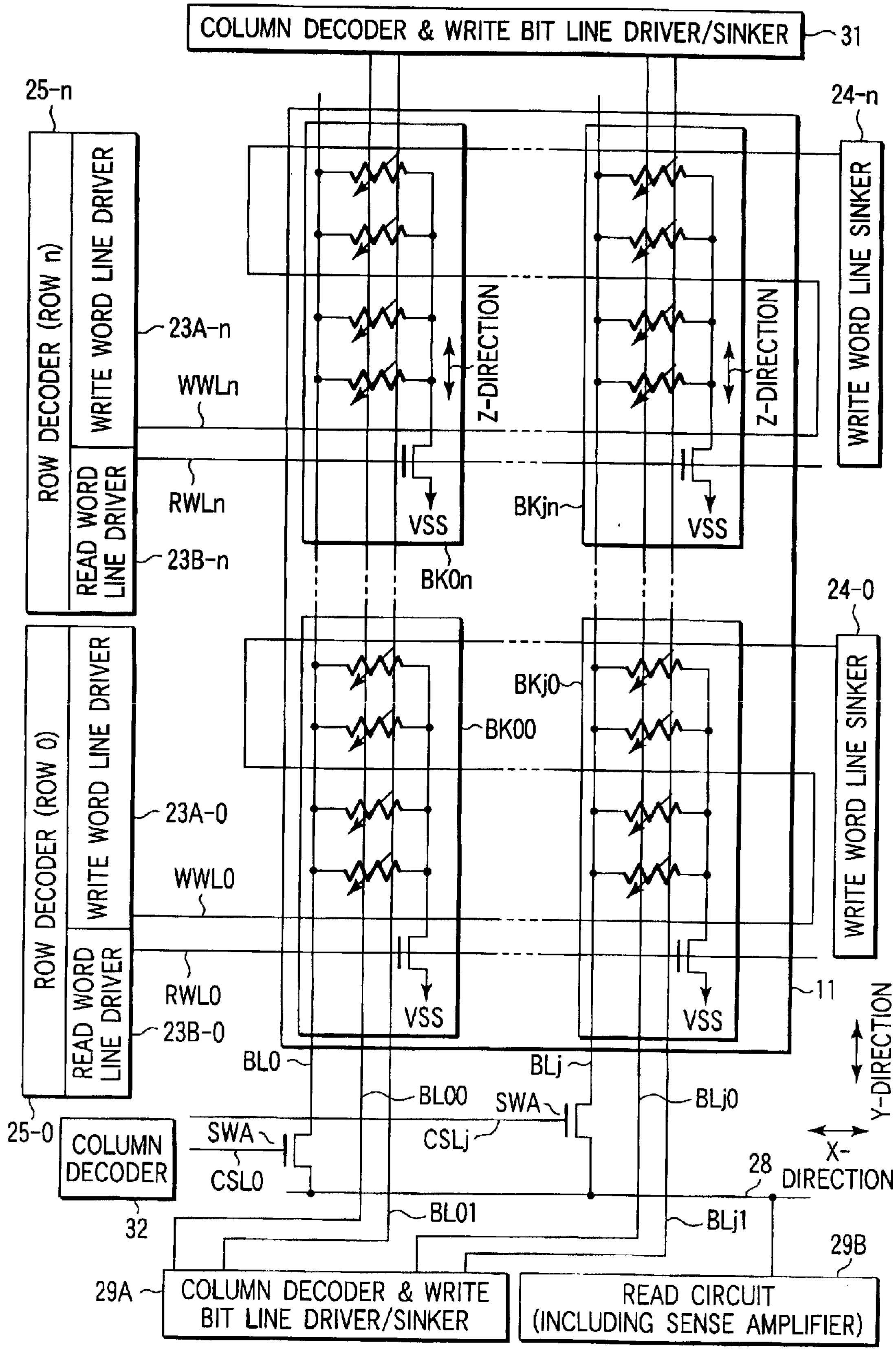
F I G. 24

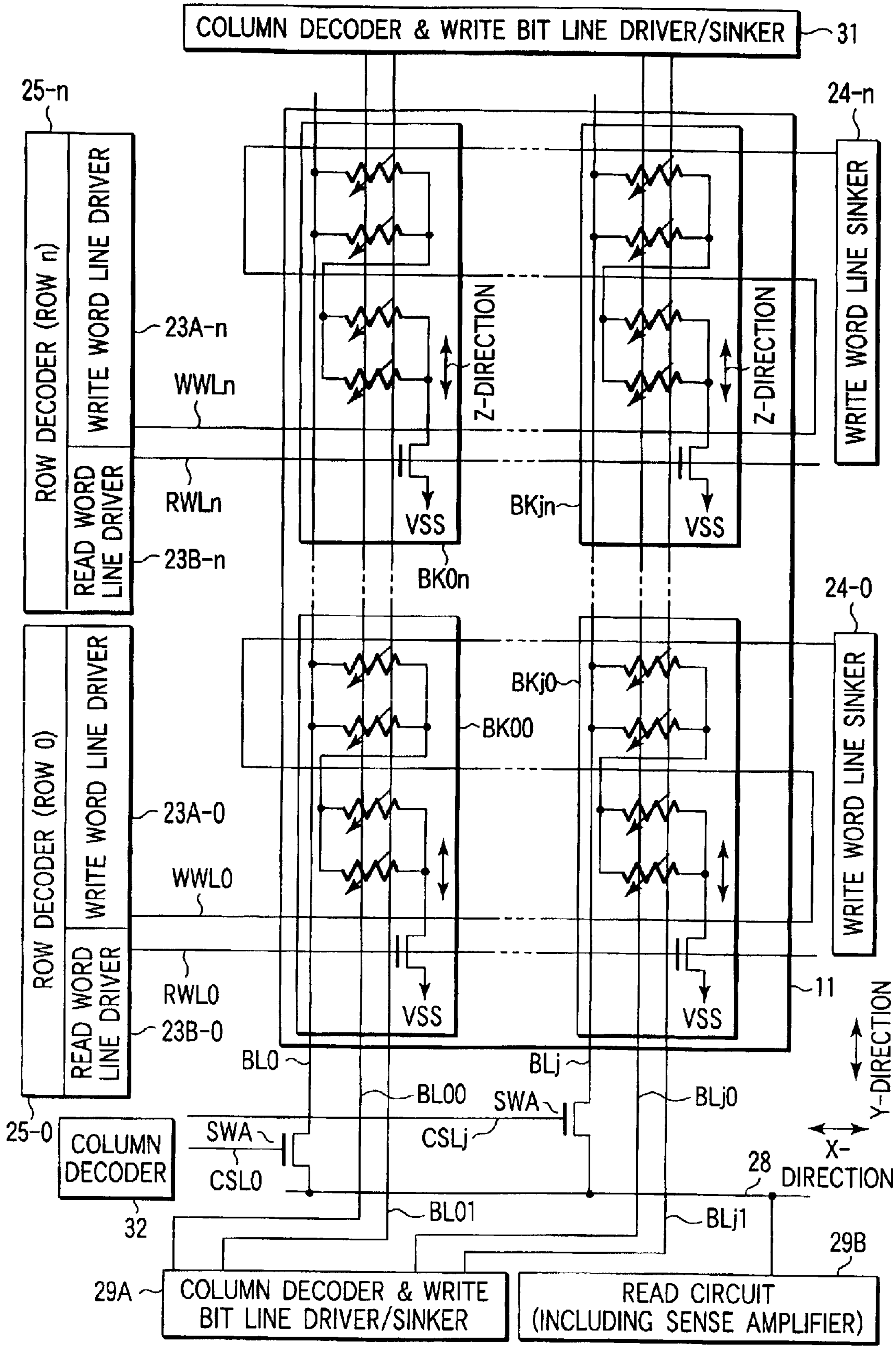
F I G. 25

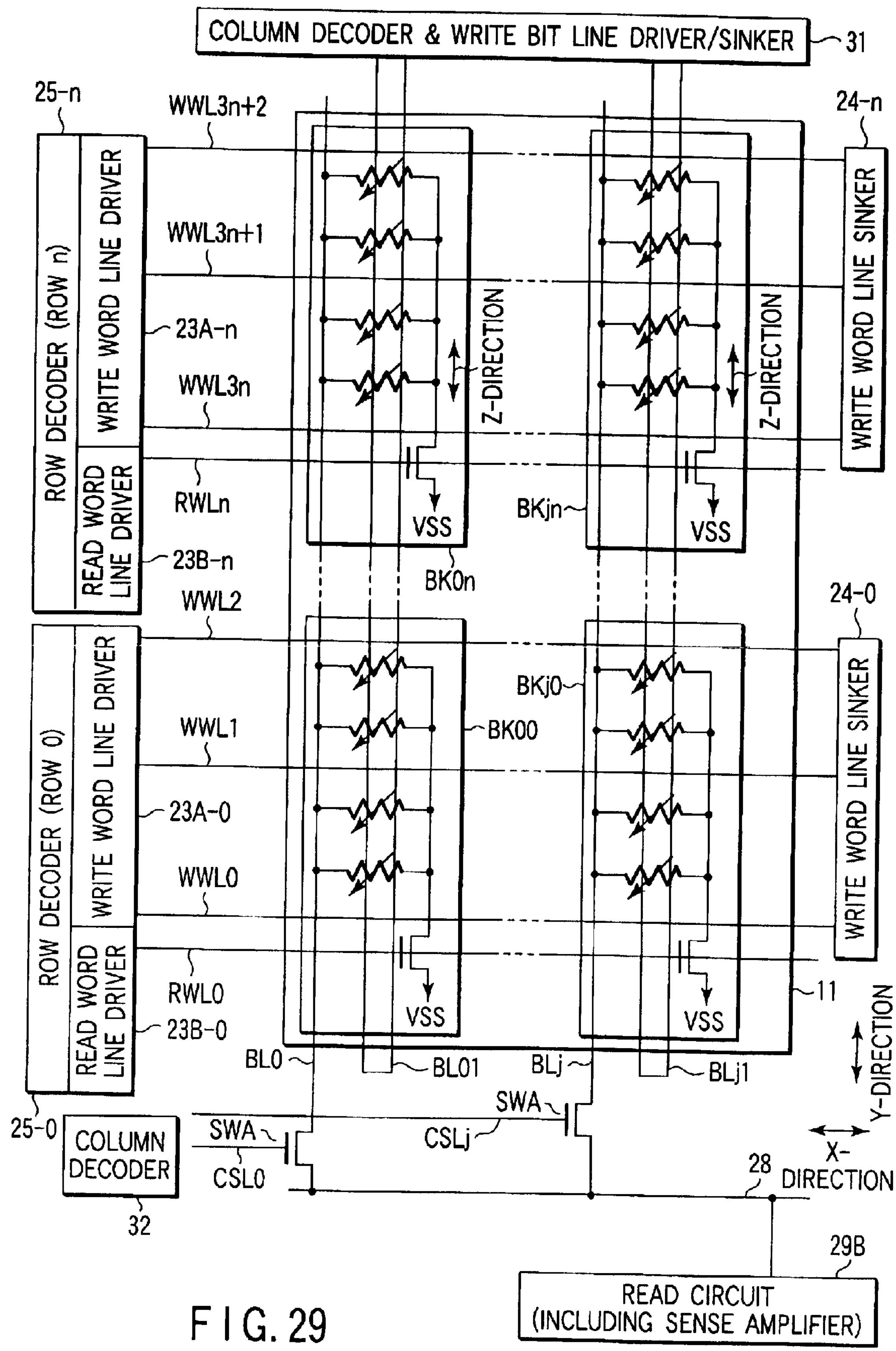
F I G. 29

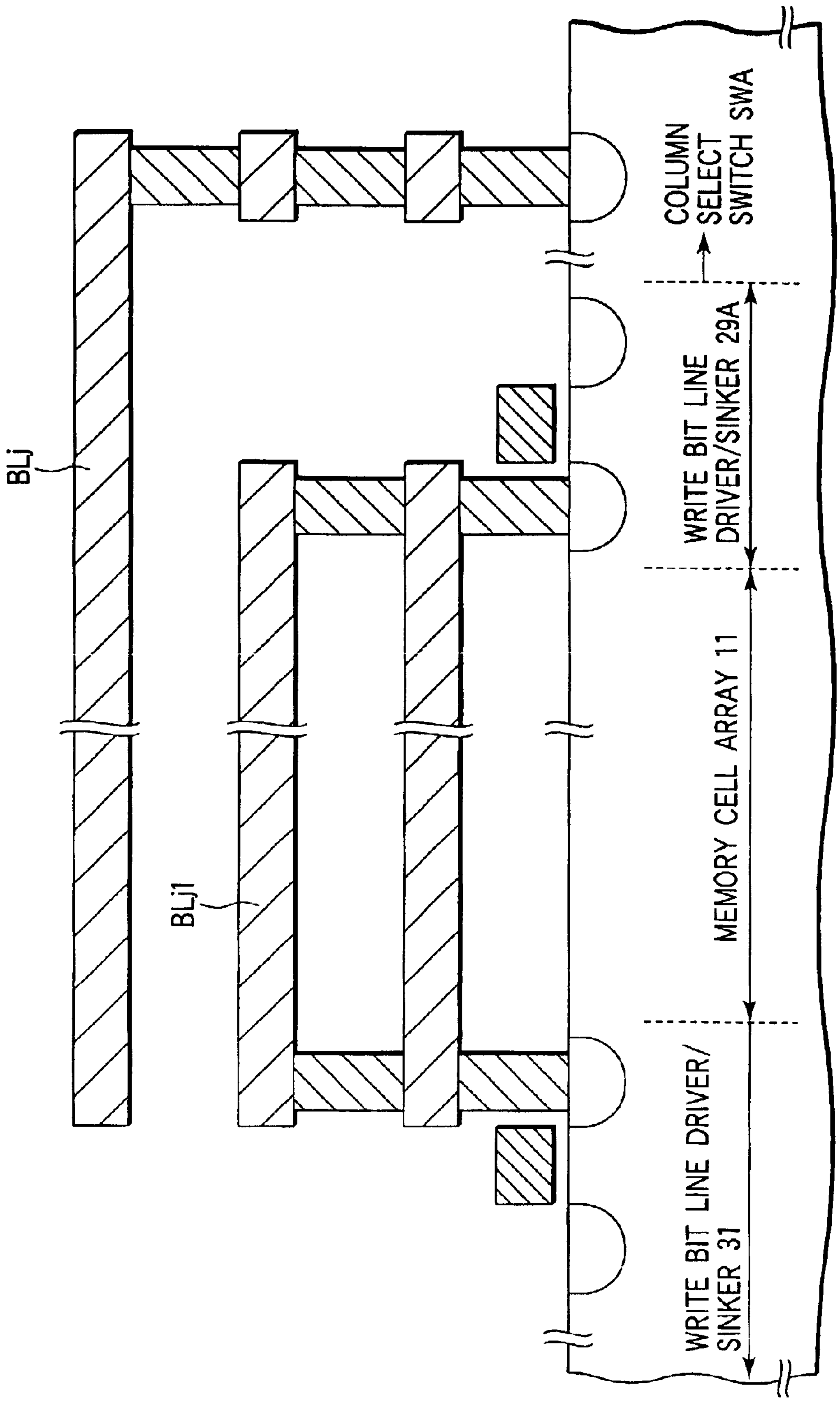
F I G. 32

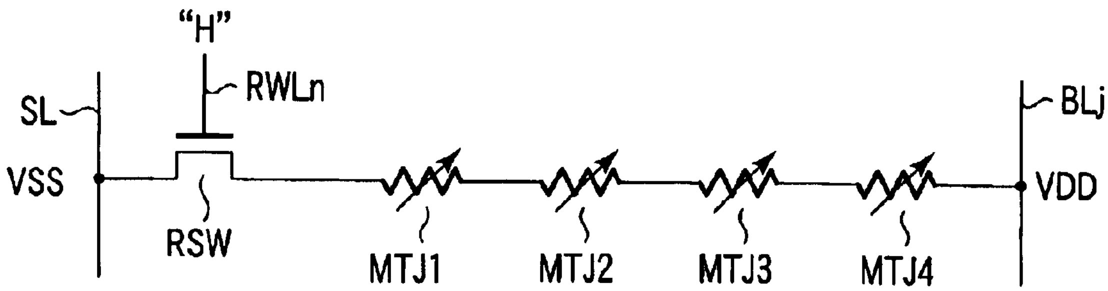
F I G. 33
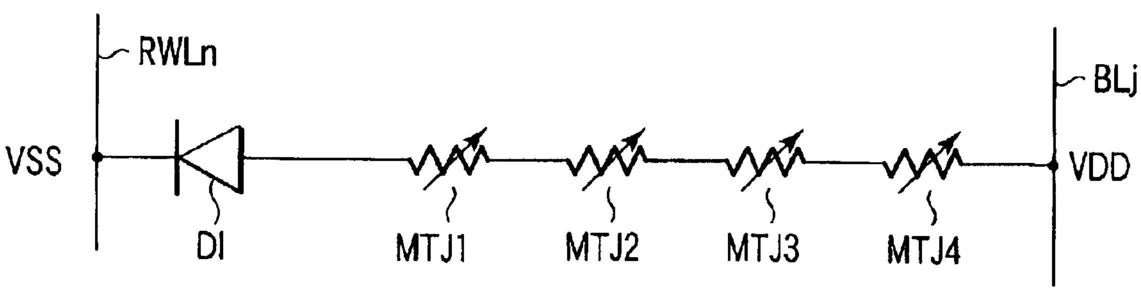
F I G. 34

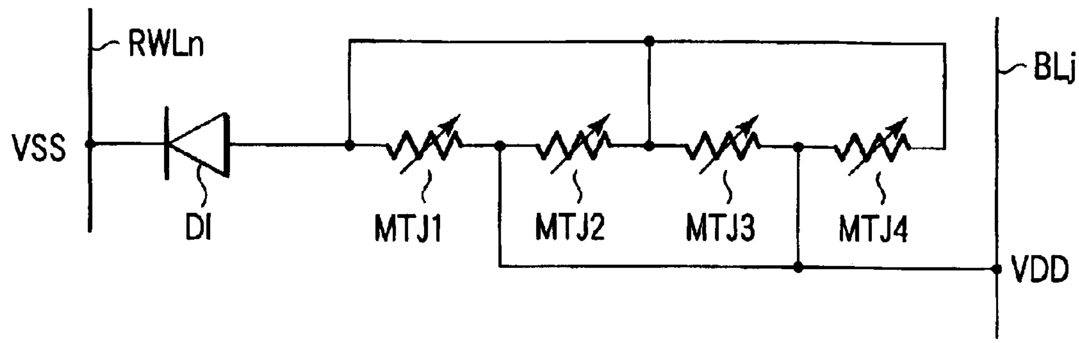
F I G. 37
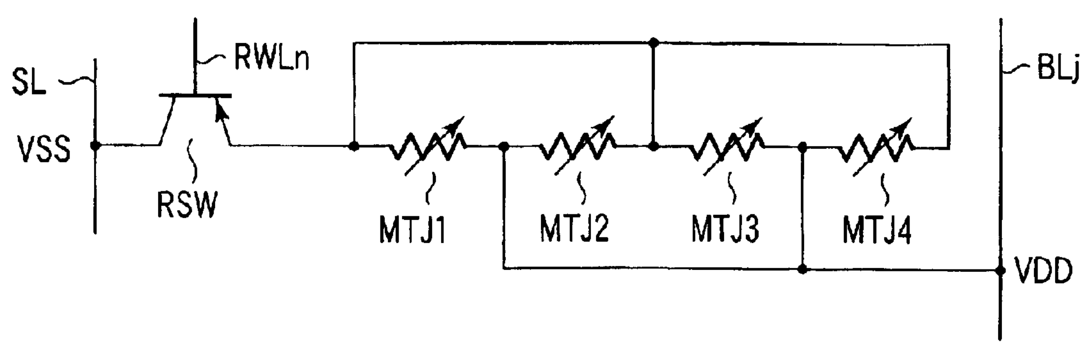
F I G. 38

EXAMPLE MTJ1

EXAMPLE MTJ2

EXAMPLE MTJ3

EXAMPLE MTJ4

EXAMPLE MTJ1

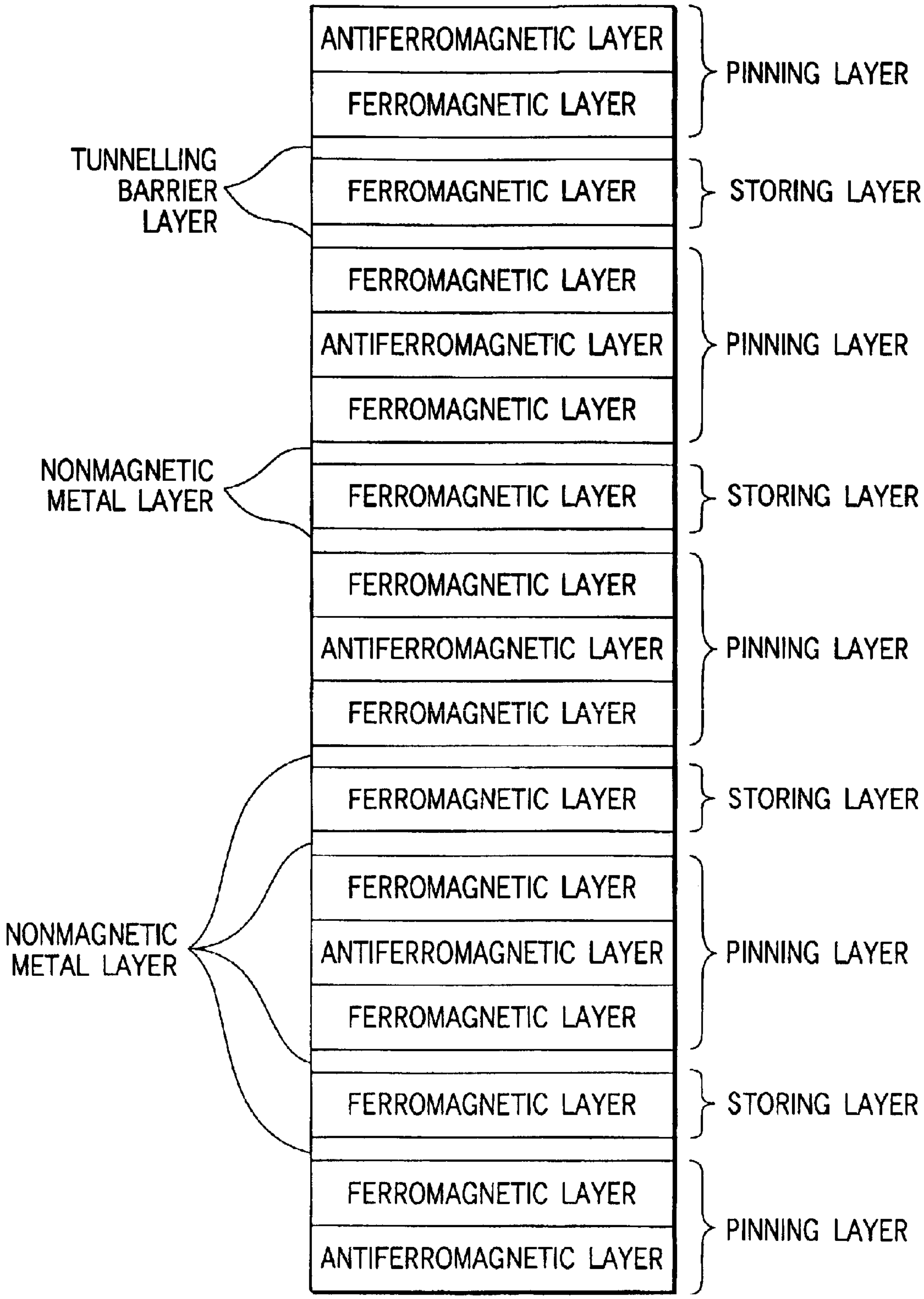
EXAMPLE MTJ2
F I G. 50

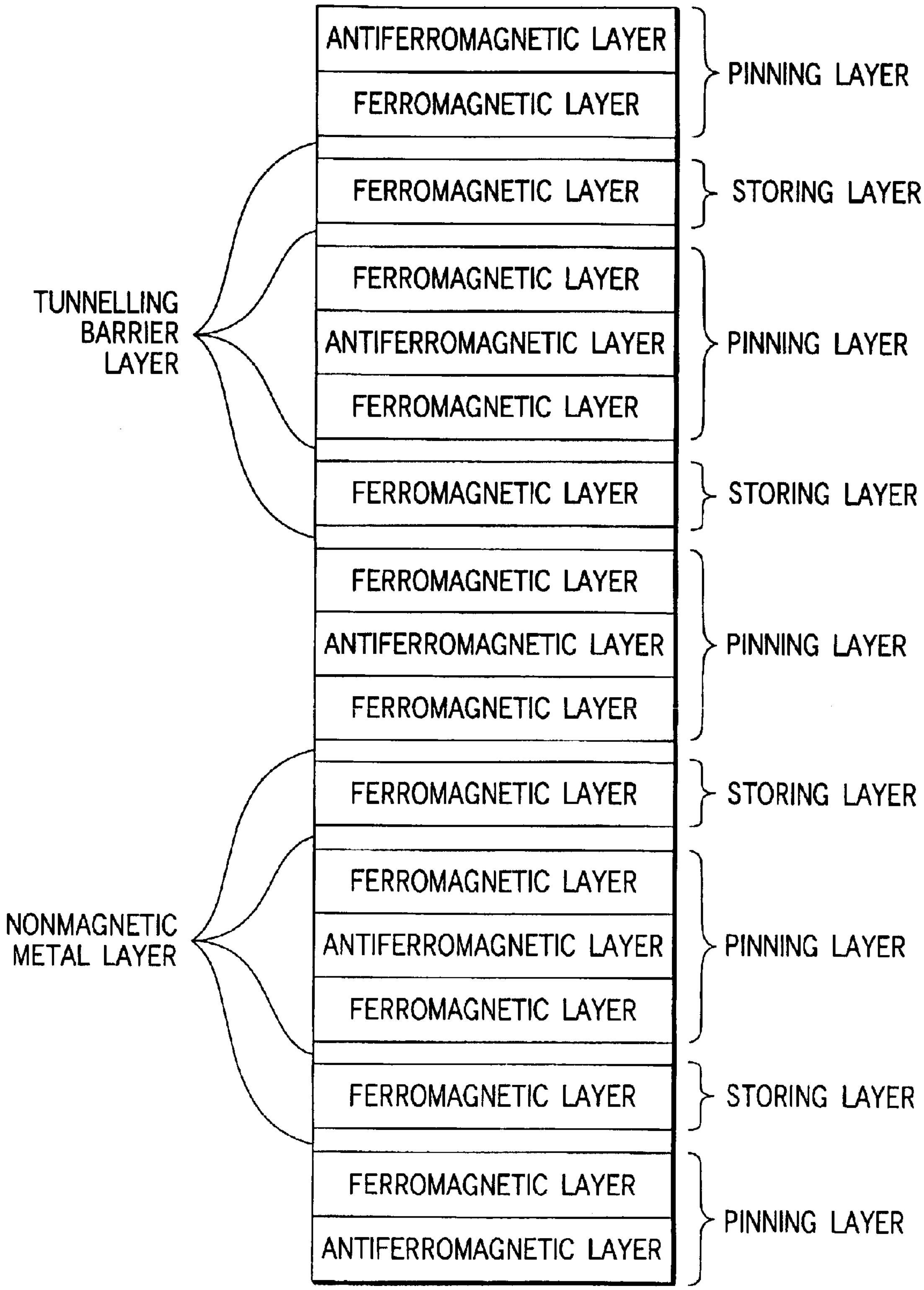
EXAMPLE MTJ3
F I G. 51

EXAMPLE MTJ4

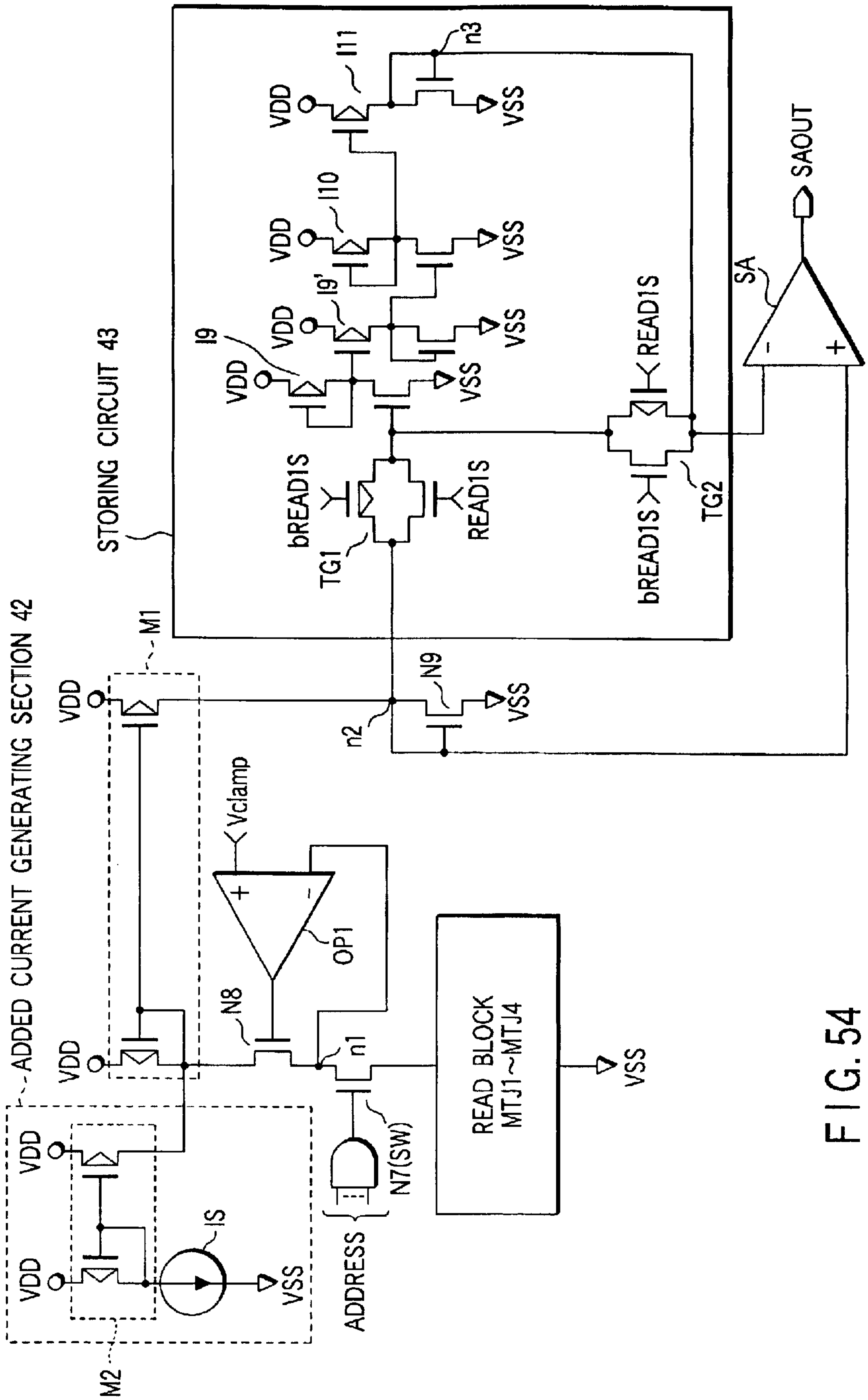
F I G. 54

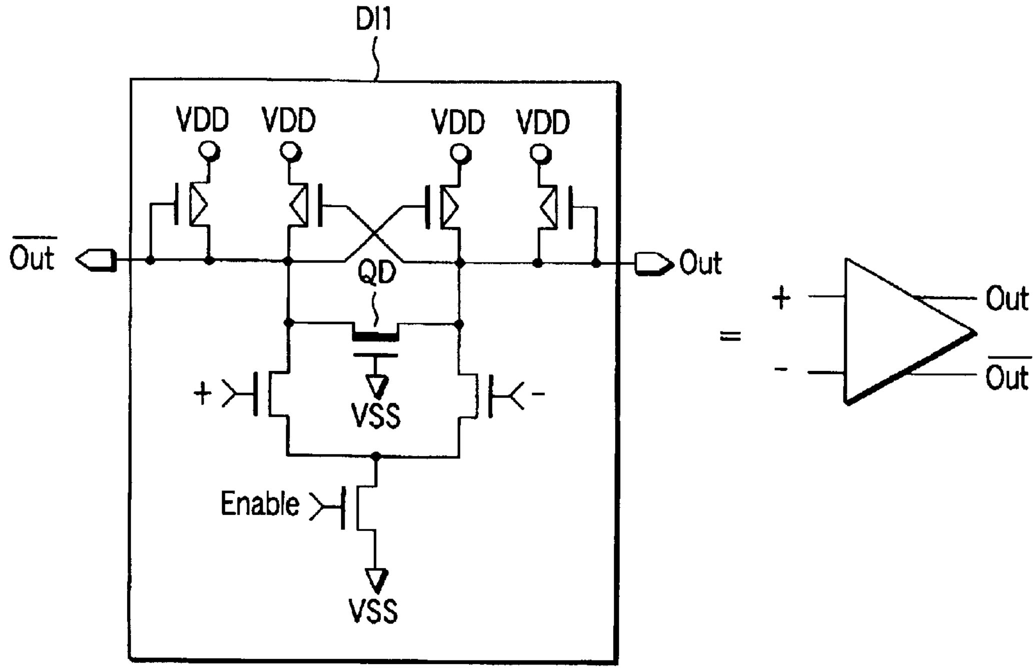
F I G. 58
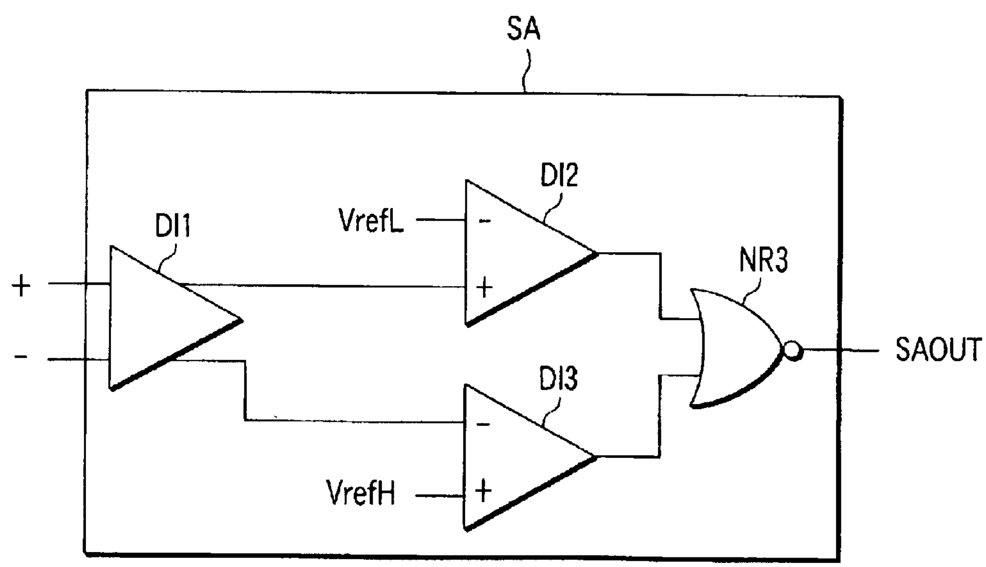
F I G. 59

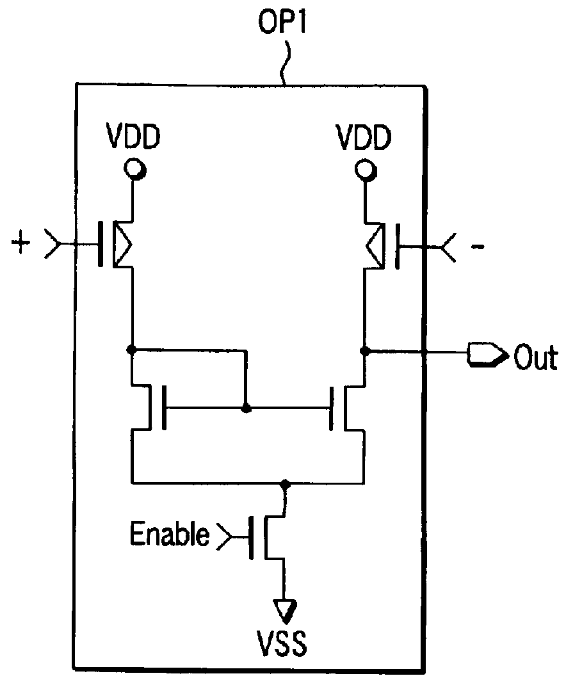
F I G. 60
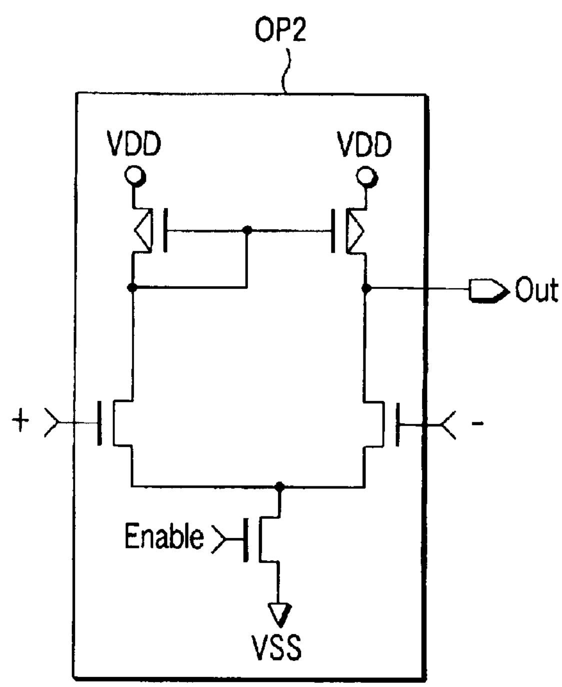
F I G. 61

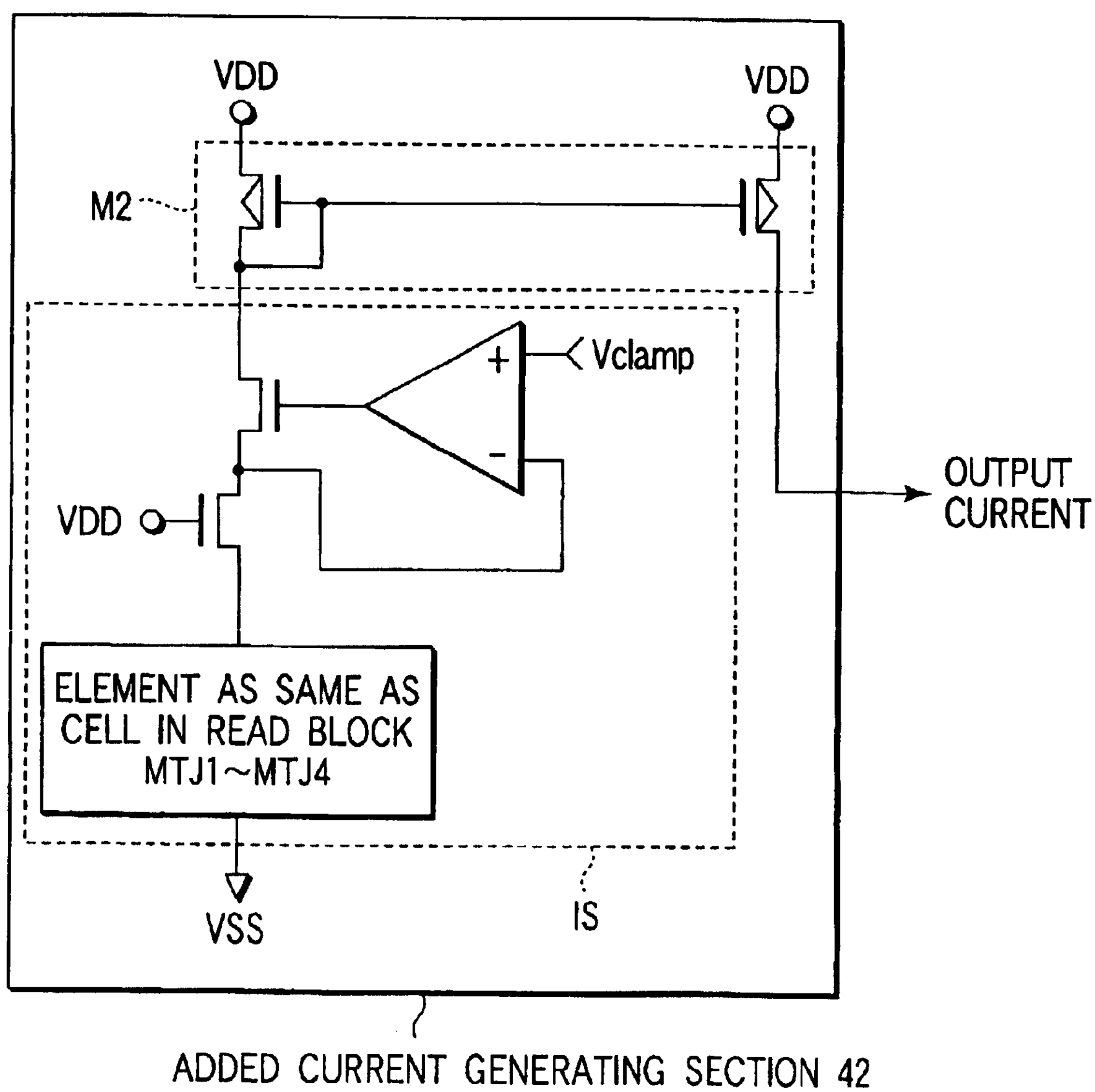
F I G. 62

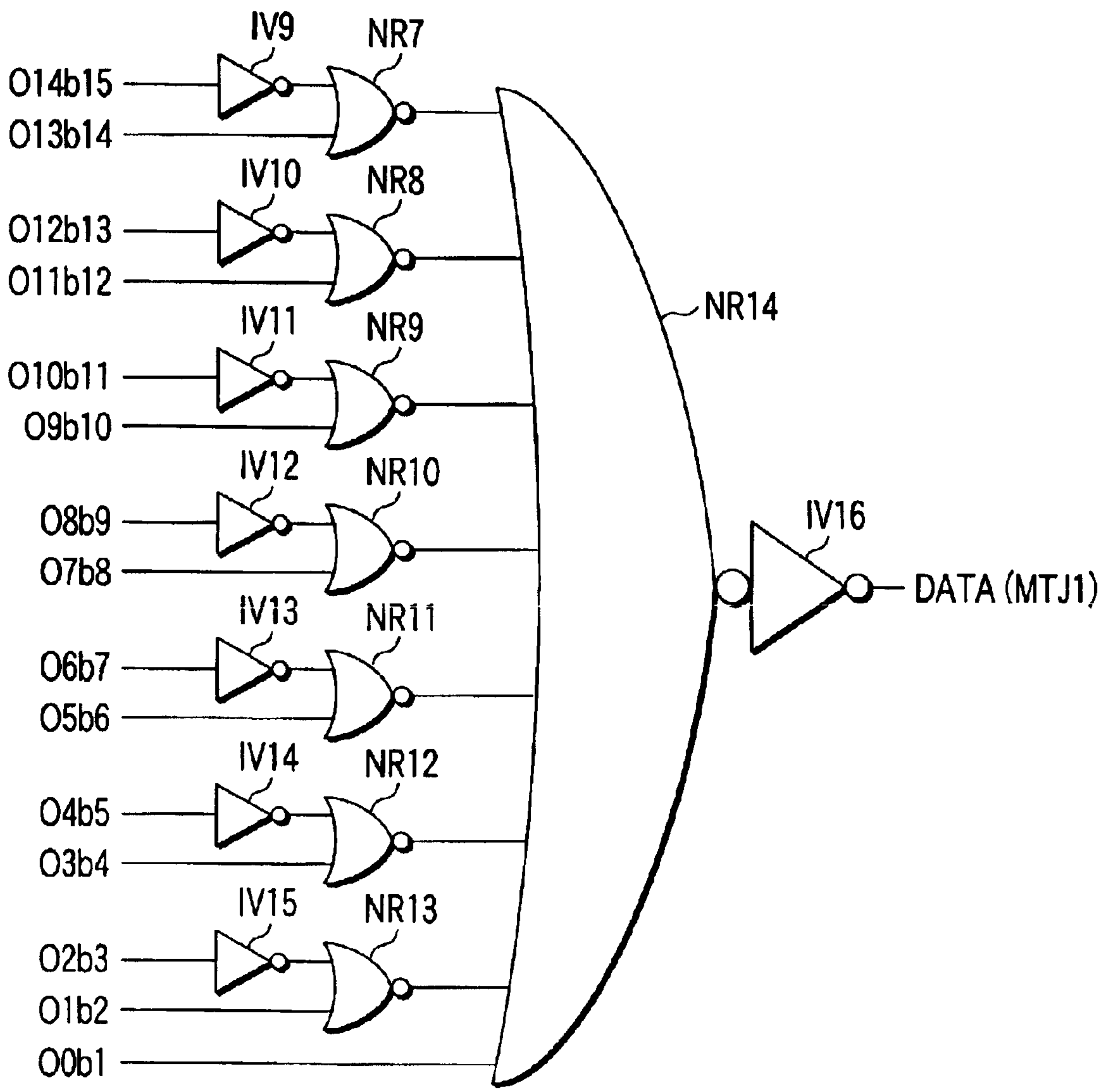
F I G. 67

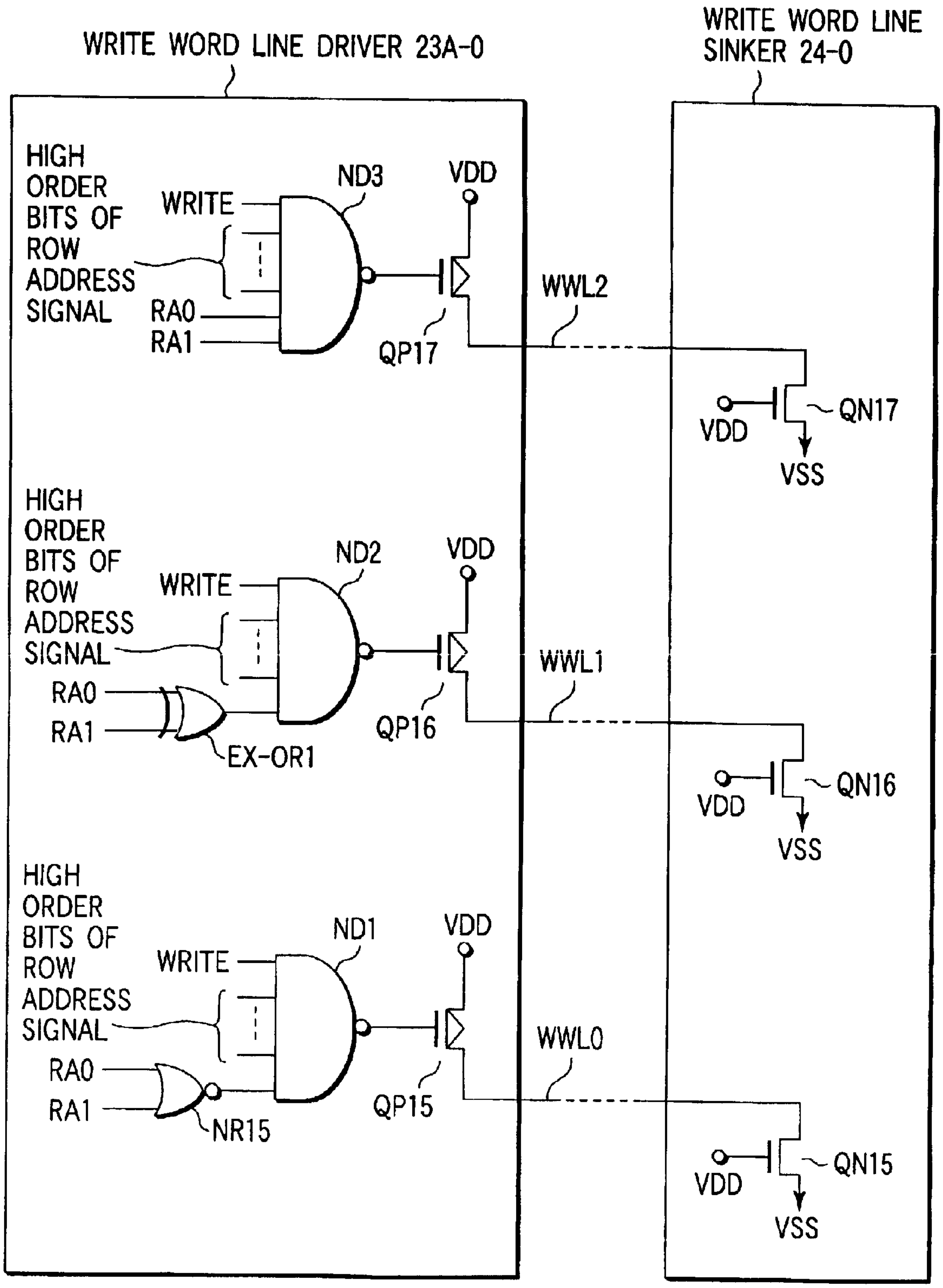
F I G. 68

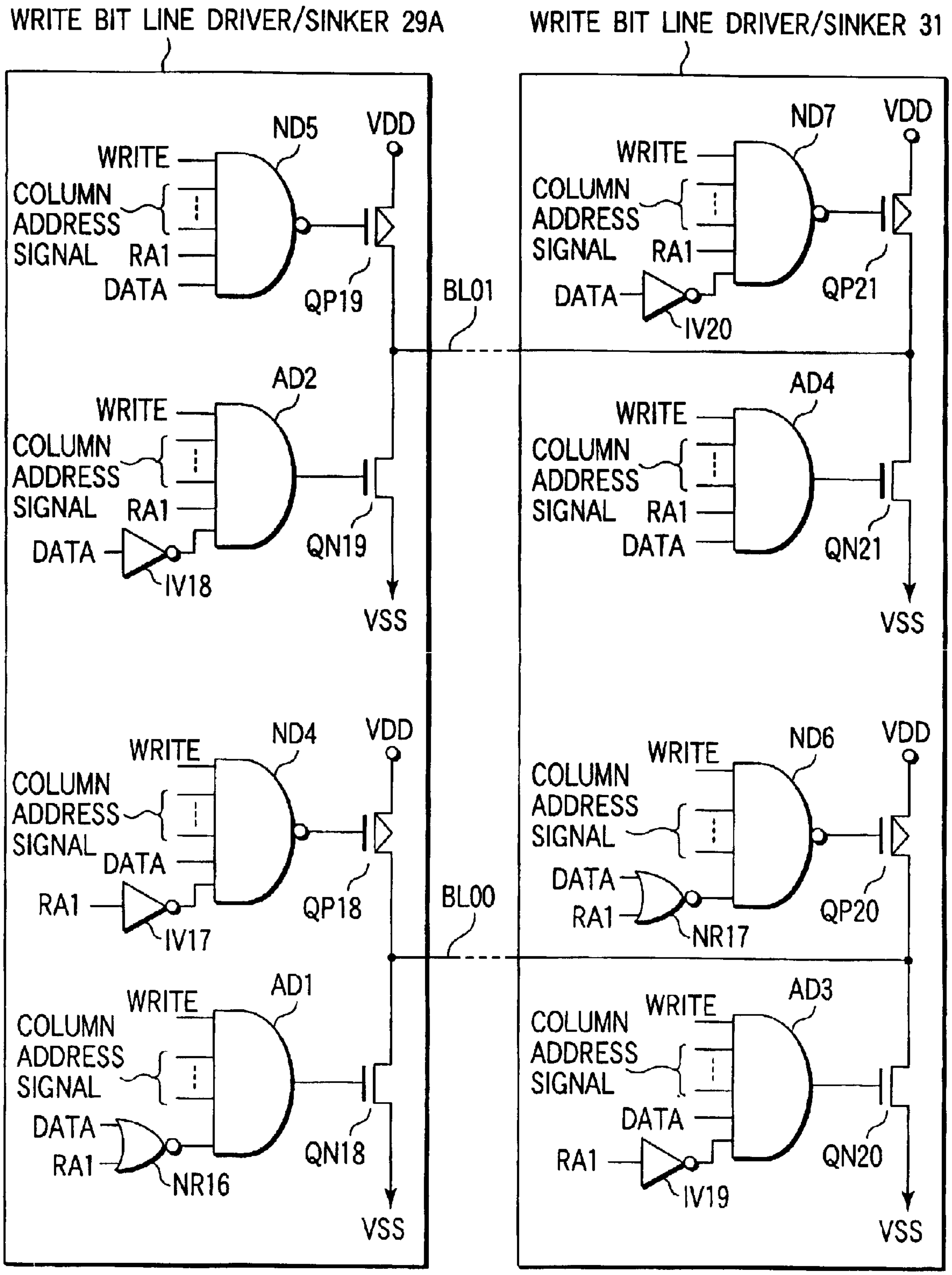
F I G. 69

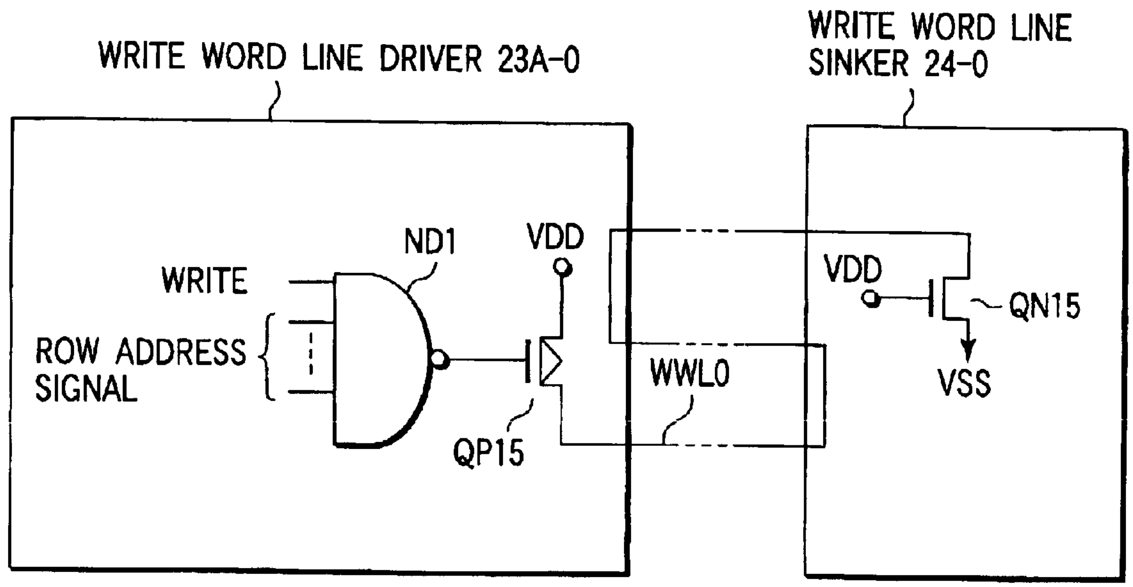
F I G. 72

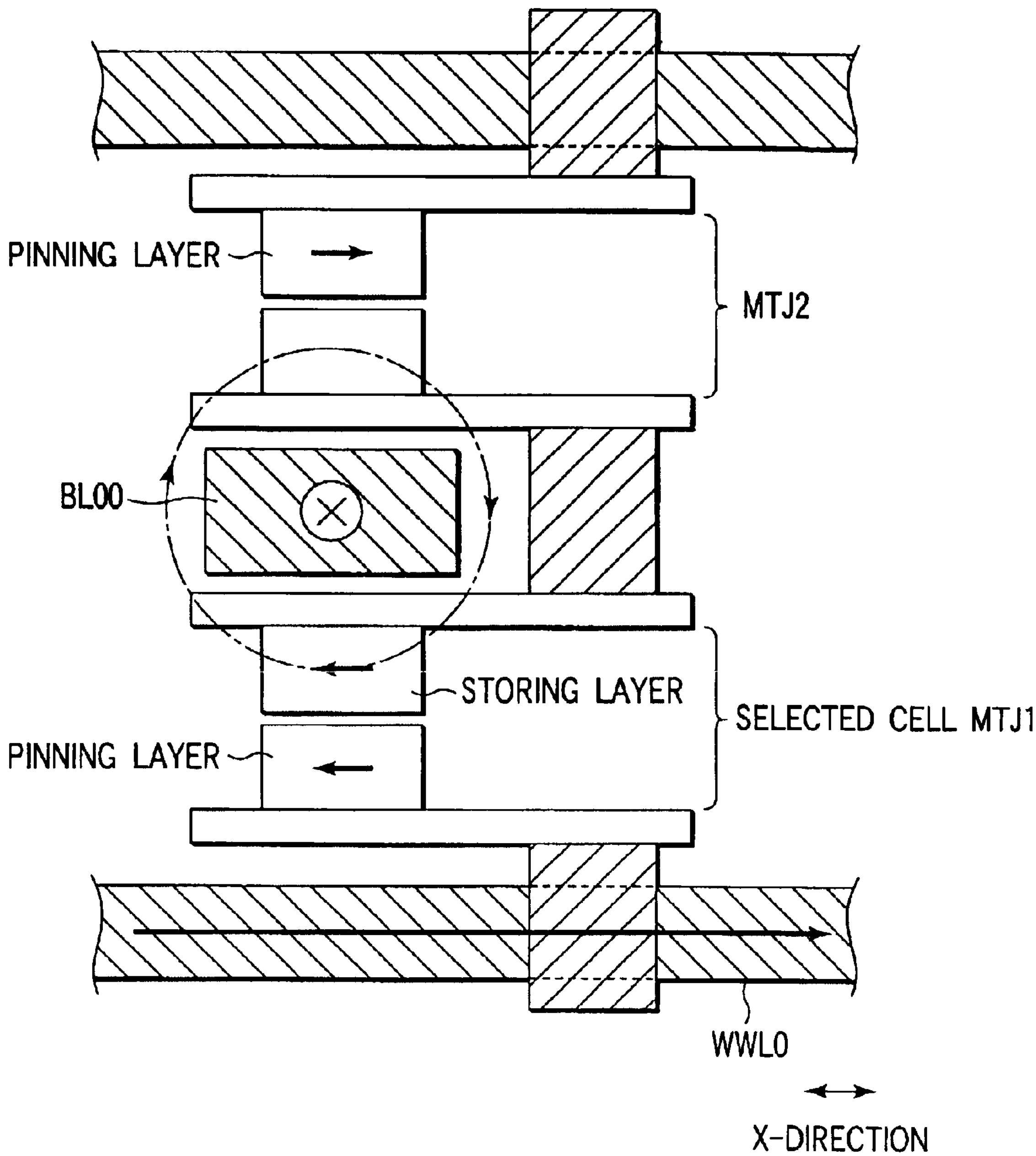
F I G. 75

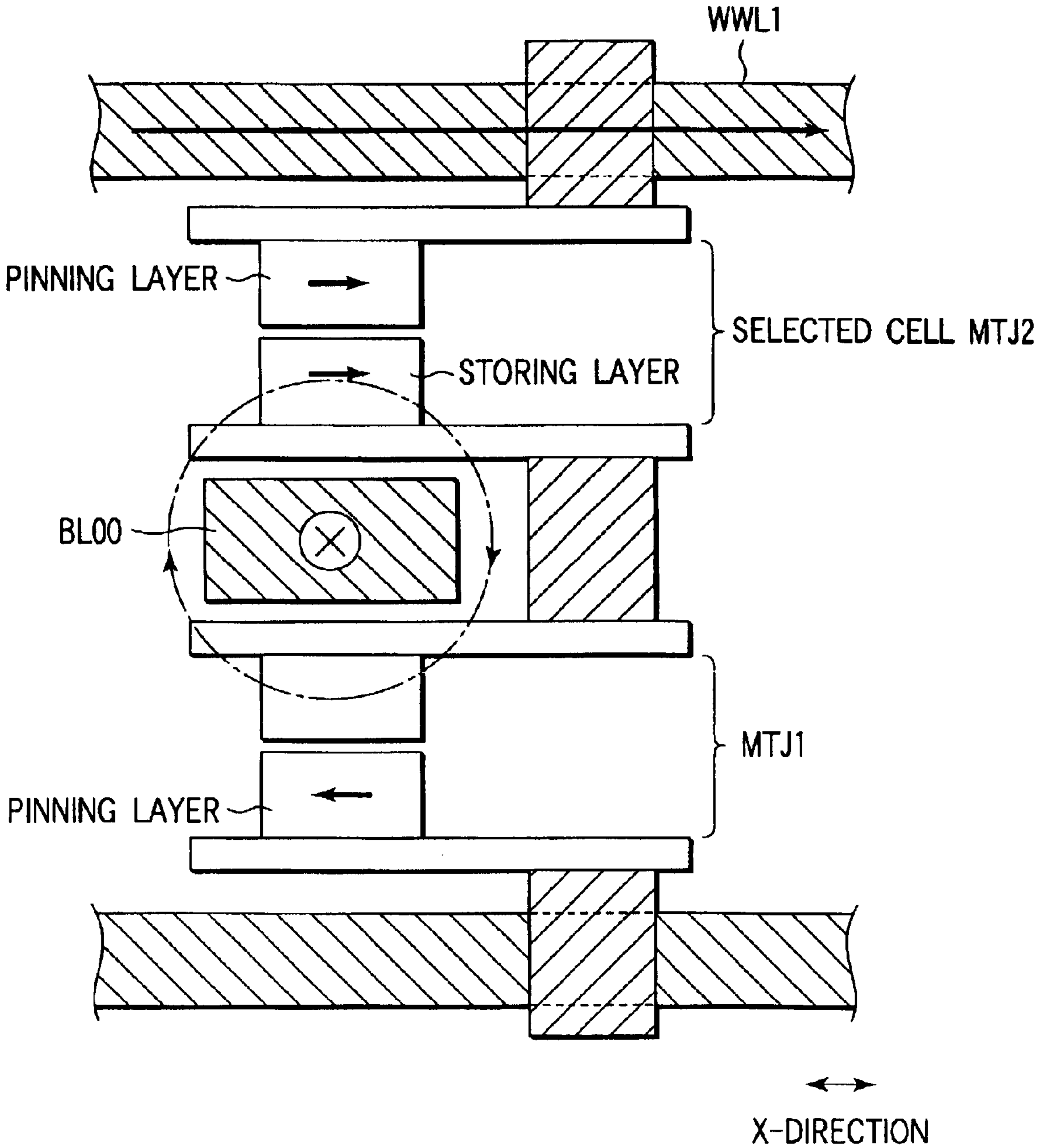
F I G. 76

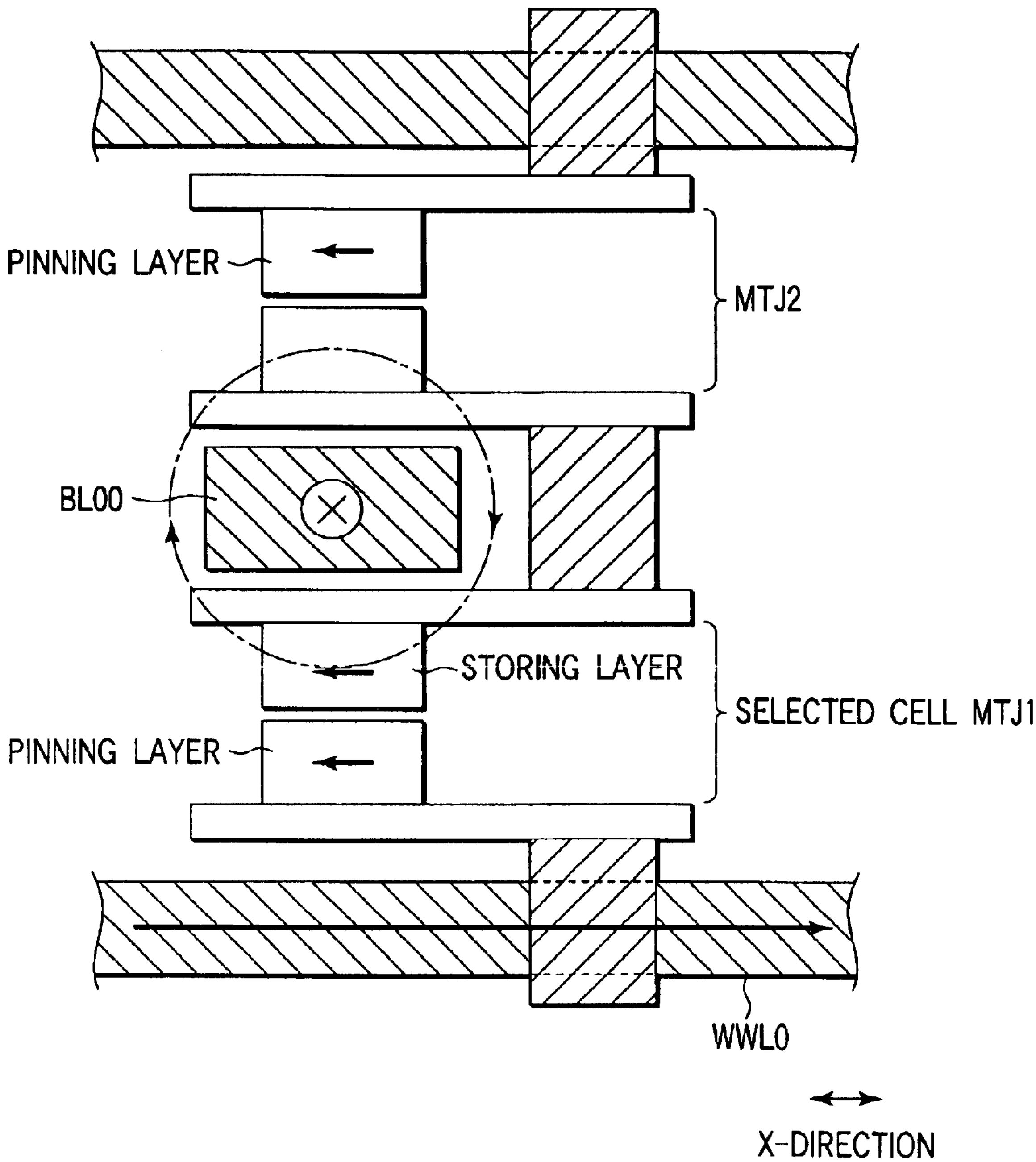
F I G. 77

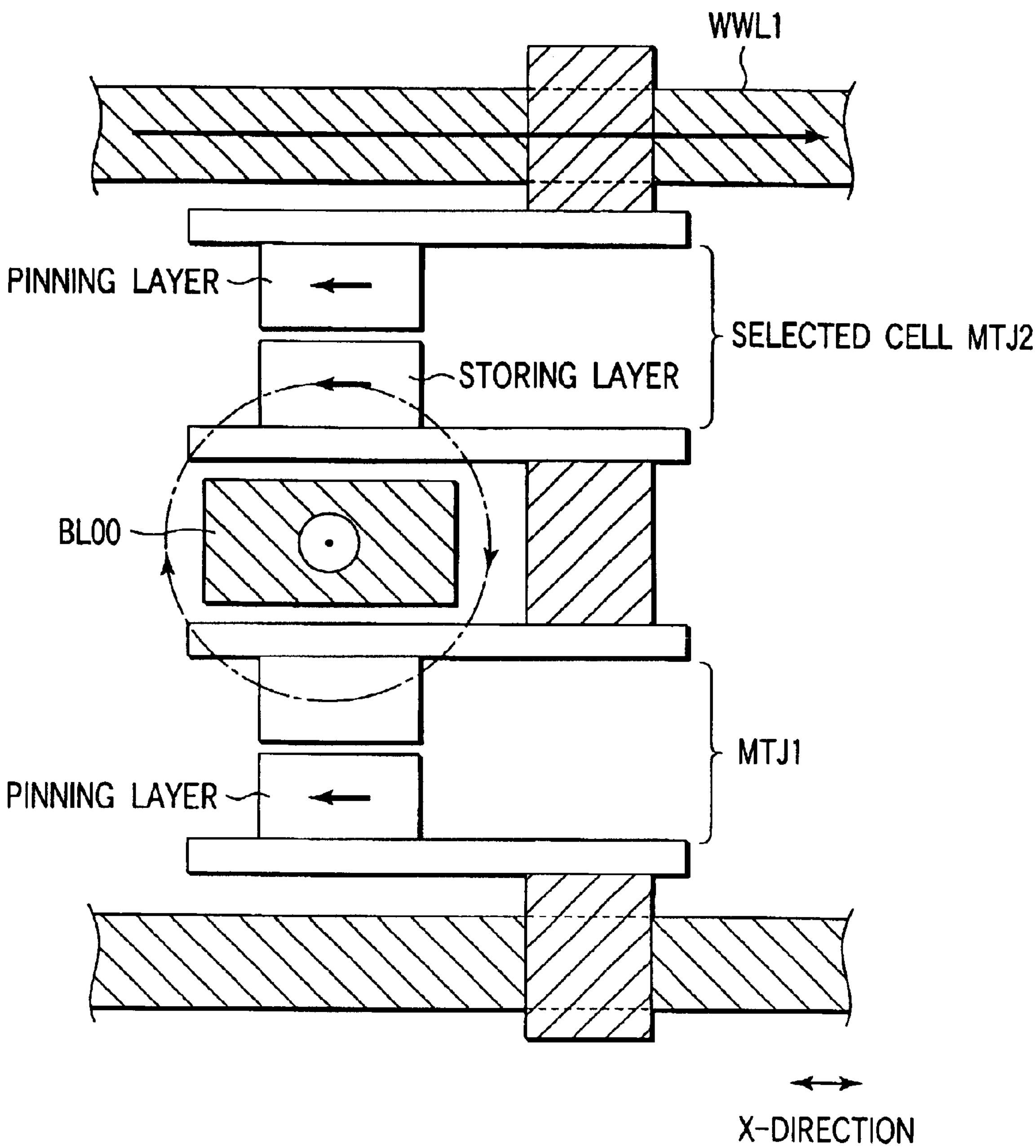
F I G. 79

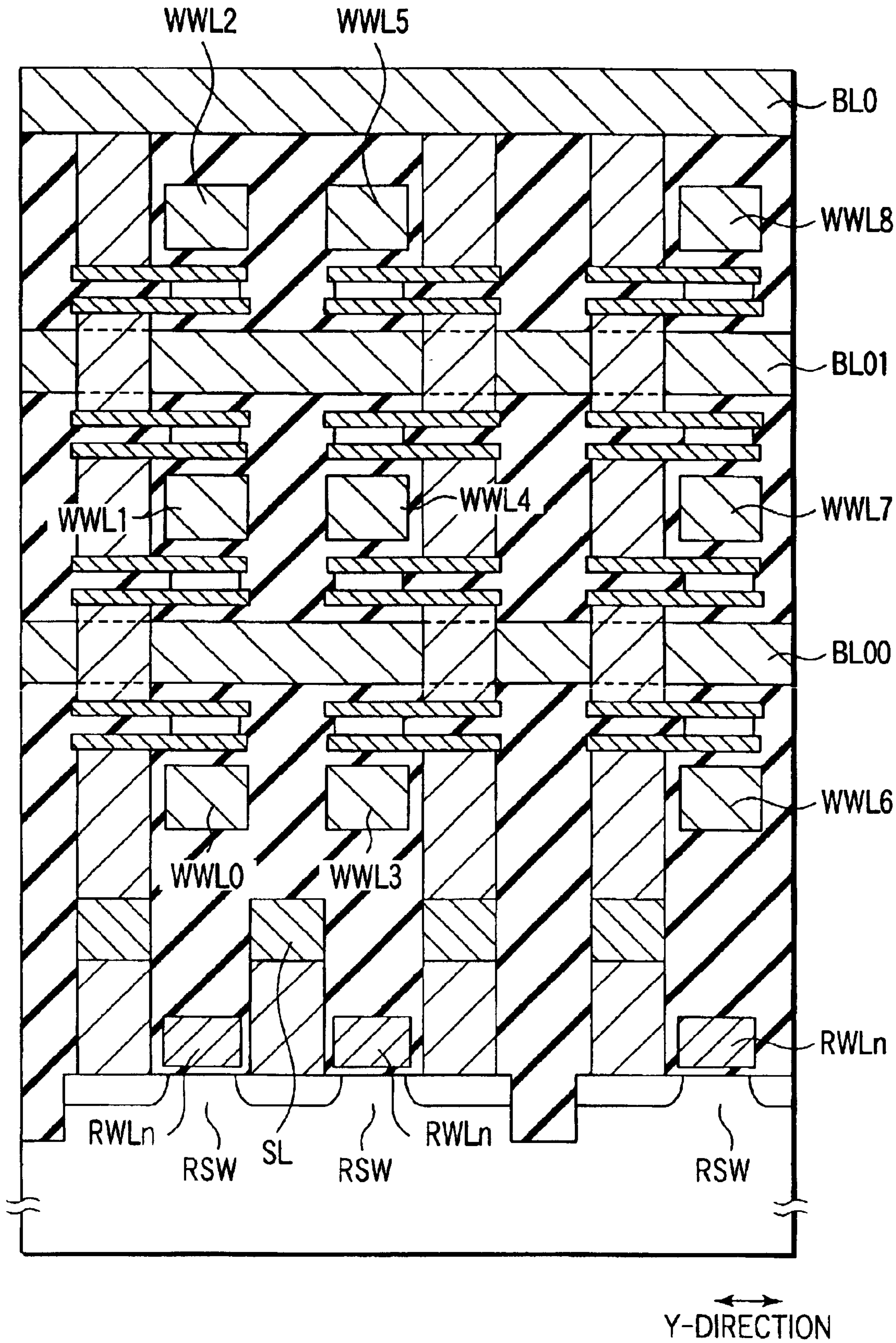
F I G. 81

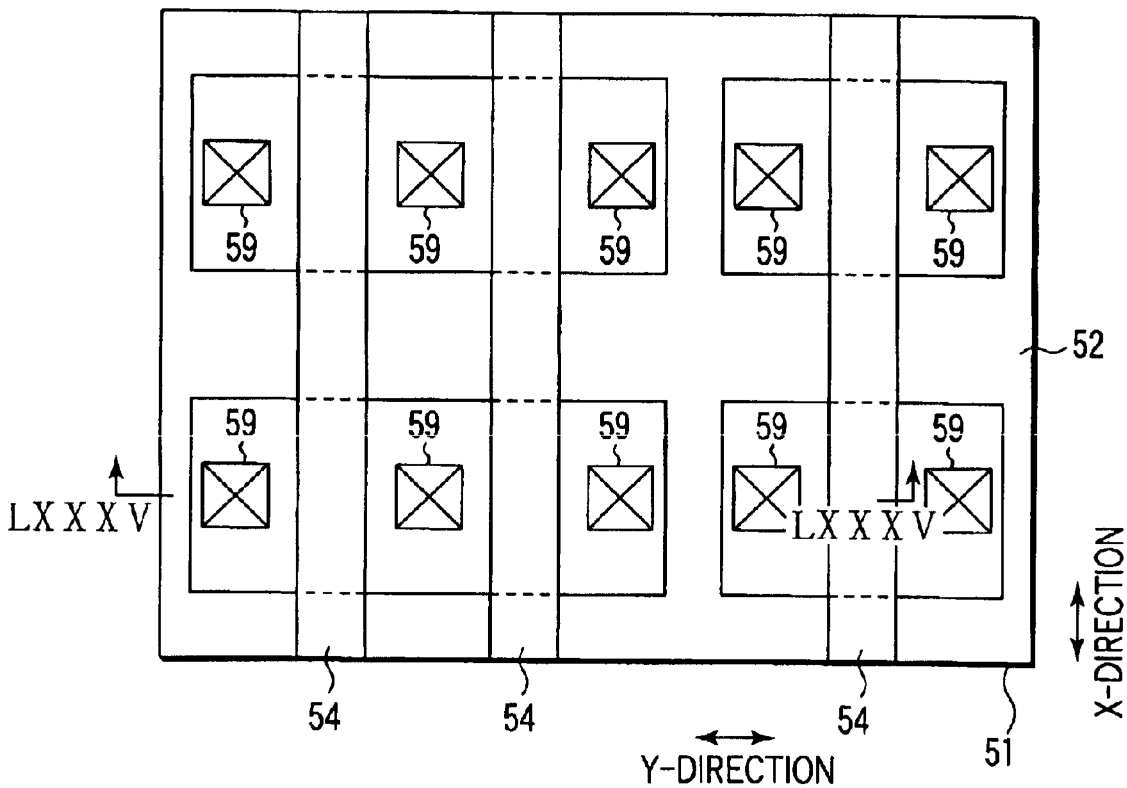
F I G. 84

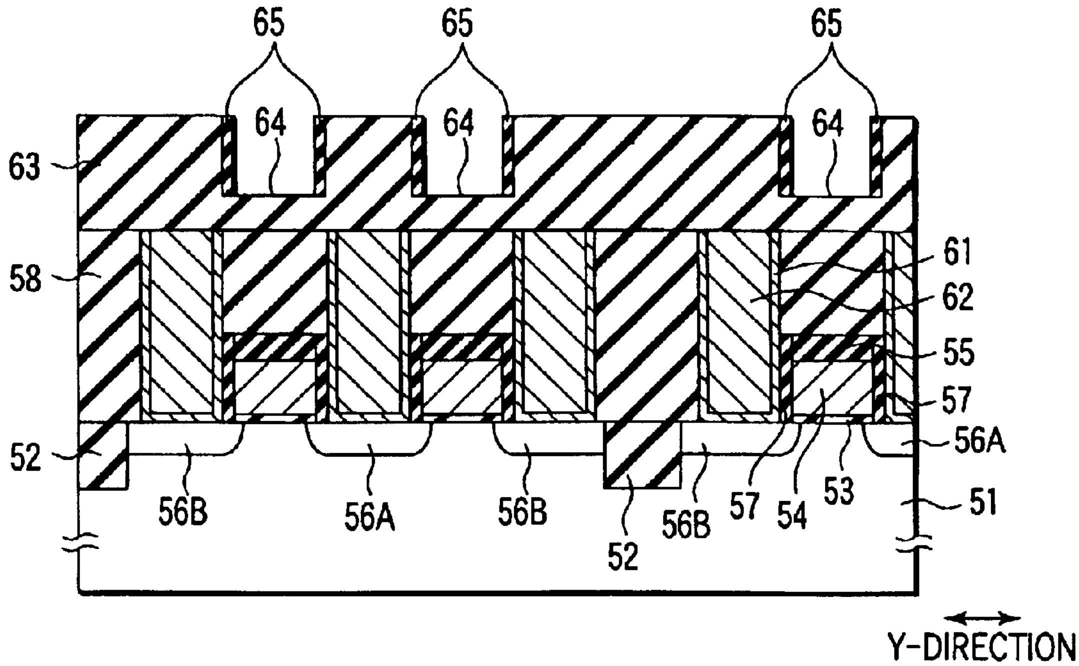
F I G. 89
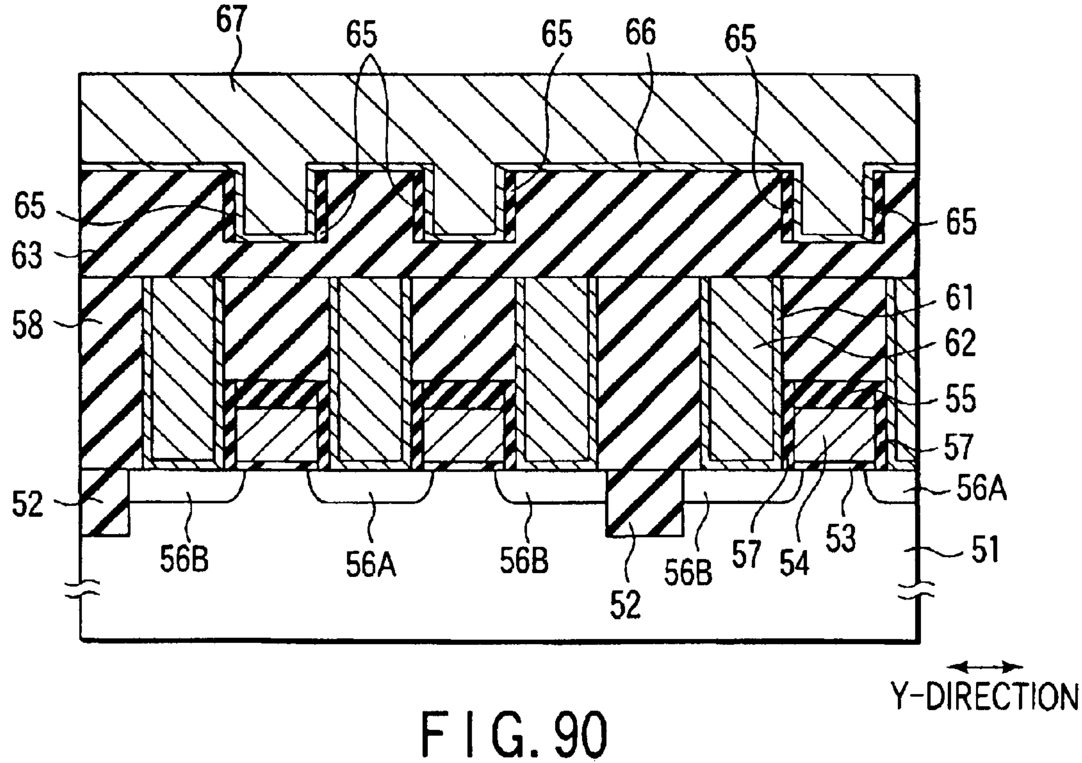
F I G. 90

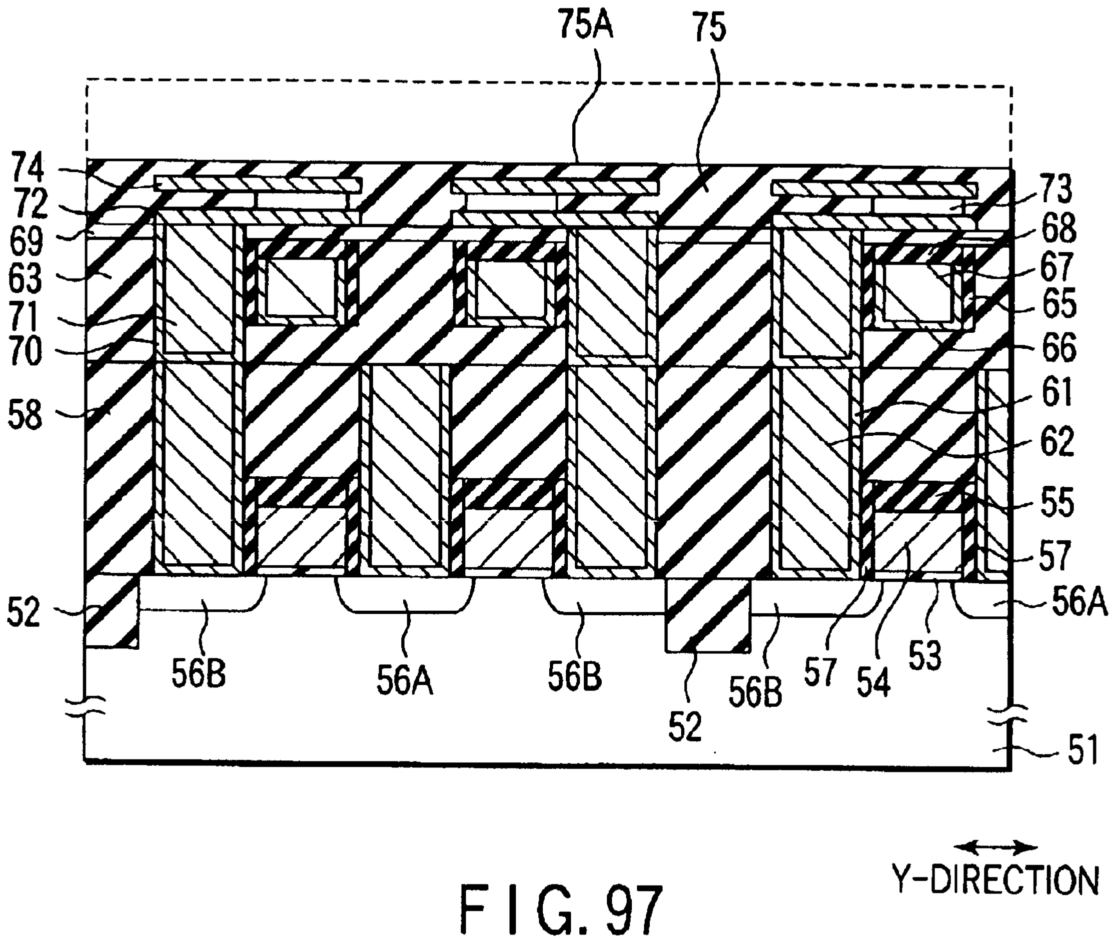
F I G. 97

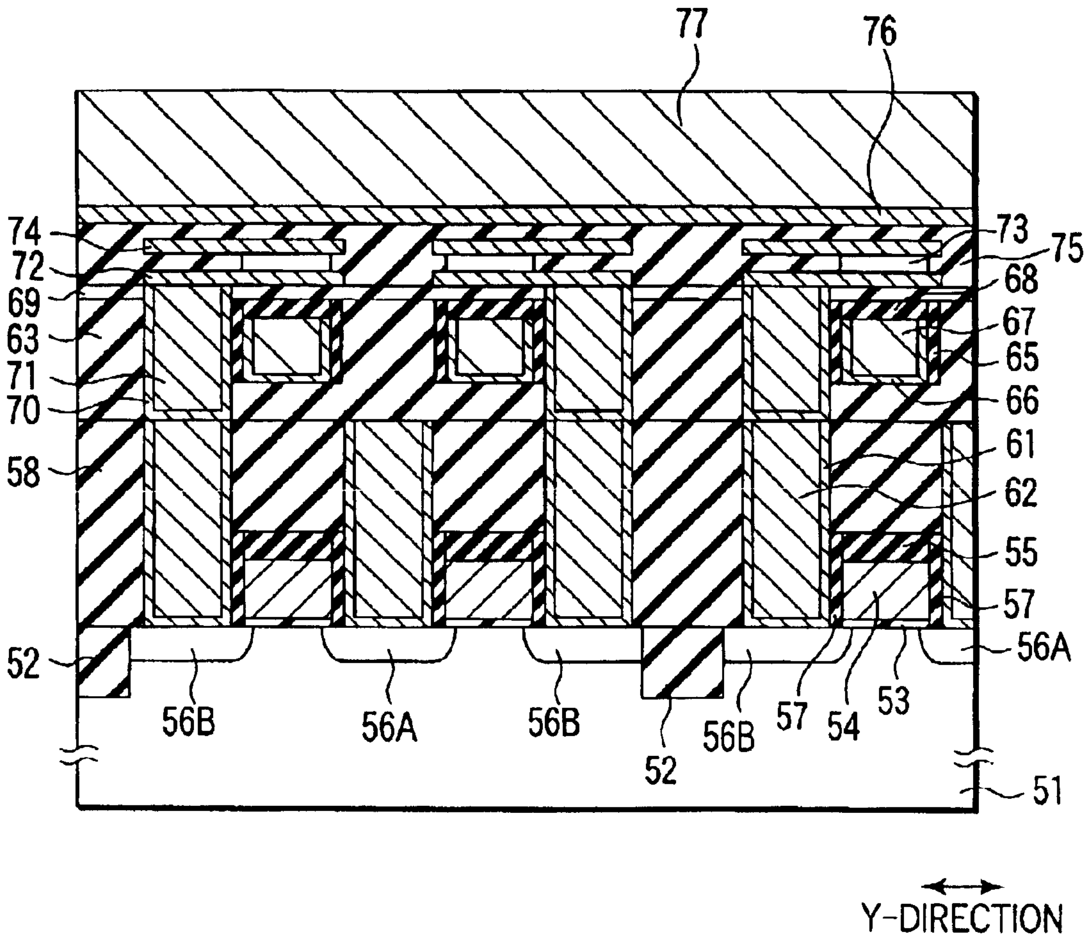
F I G. 98

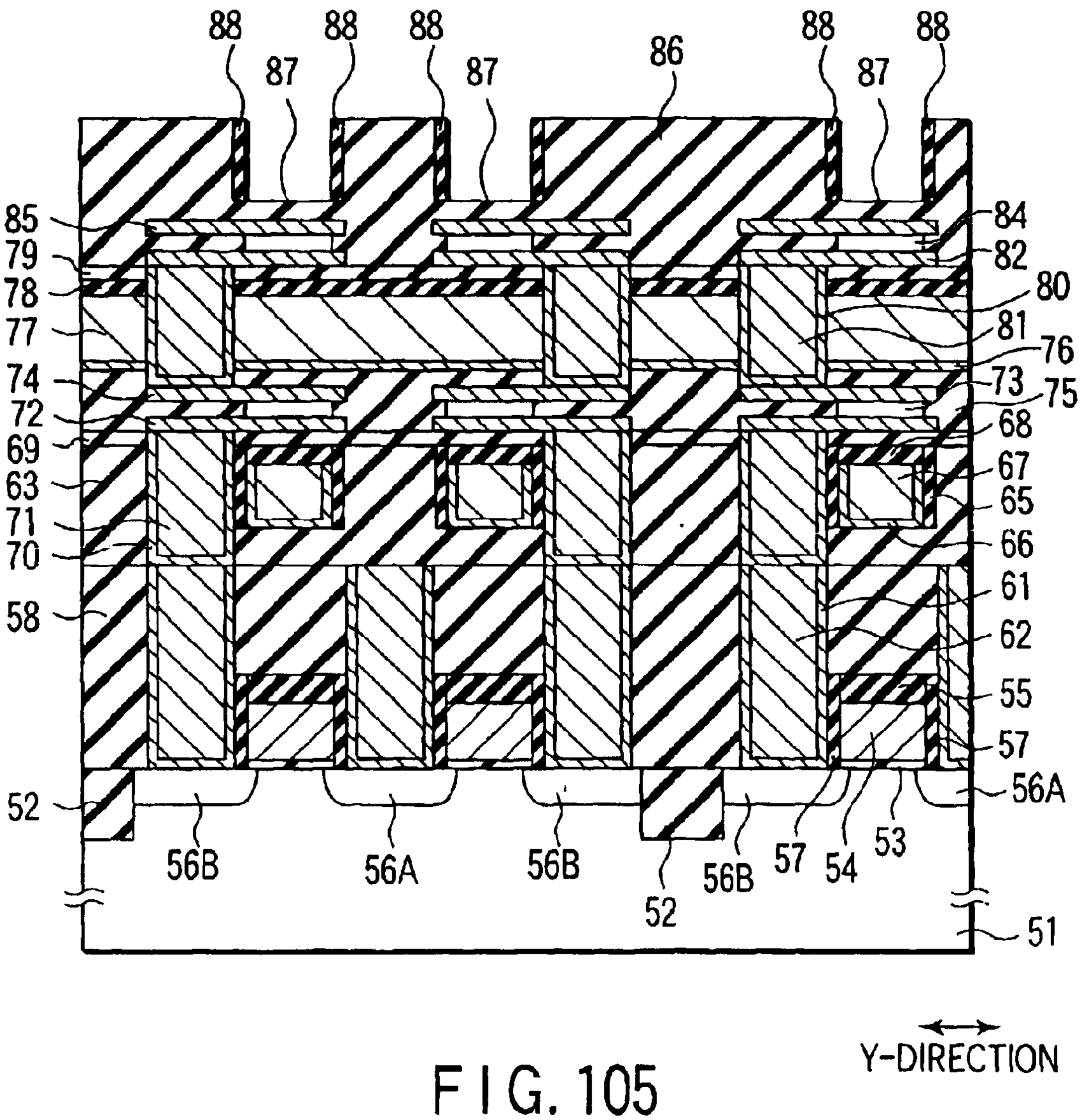
F I G. 105

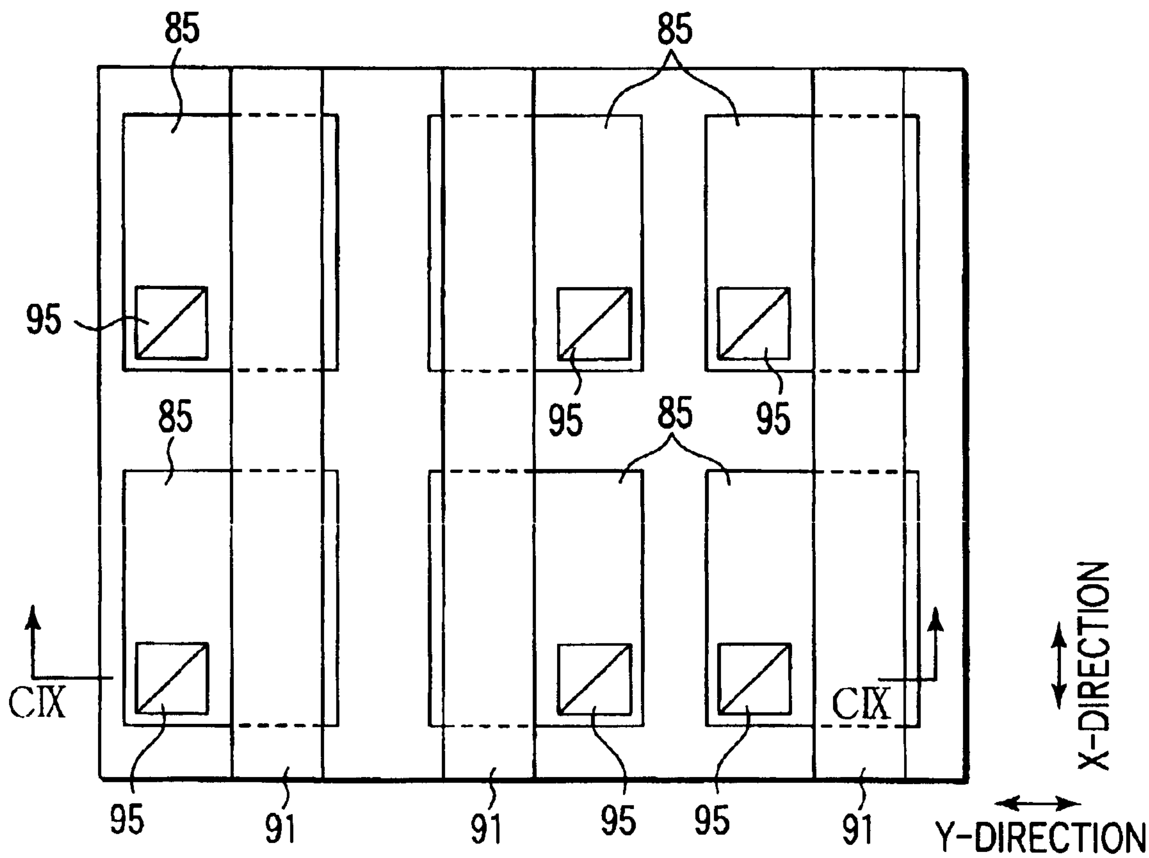
F I G. 108

Y-DIRECTION

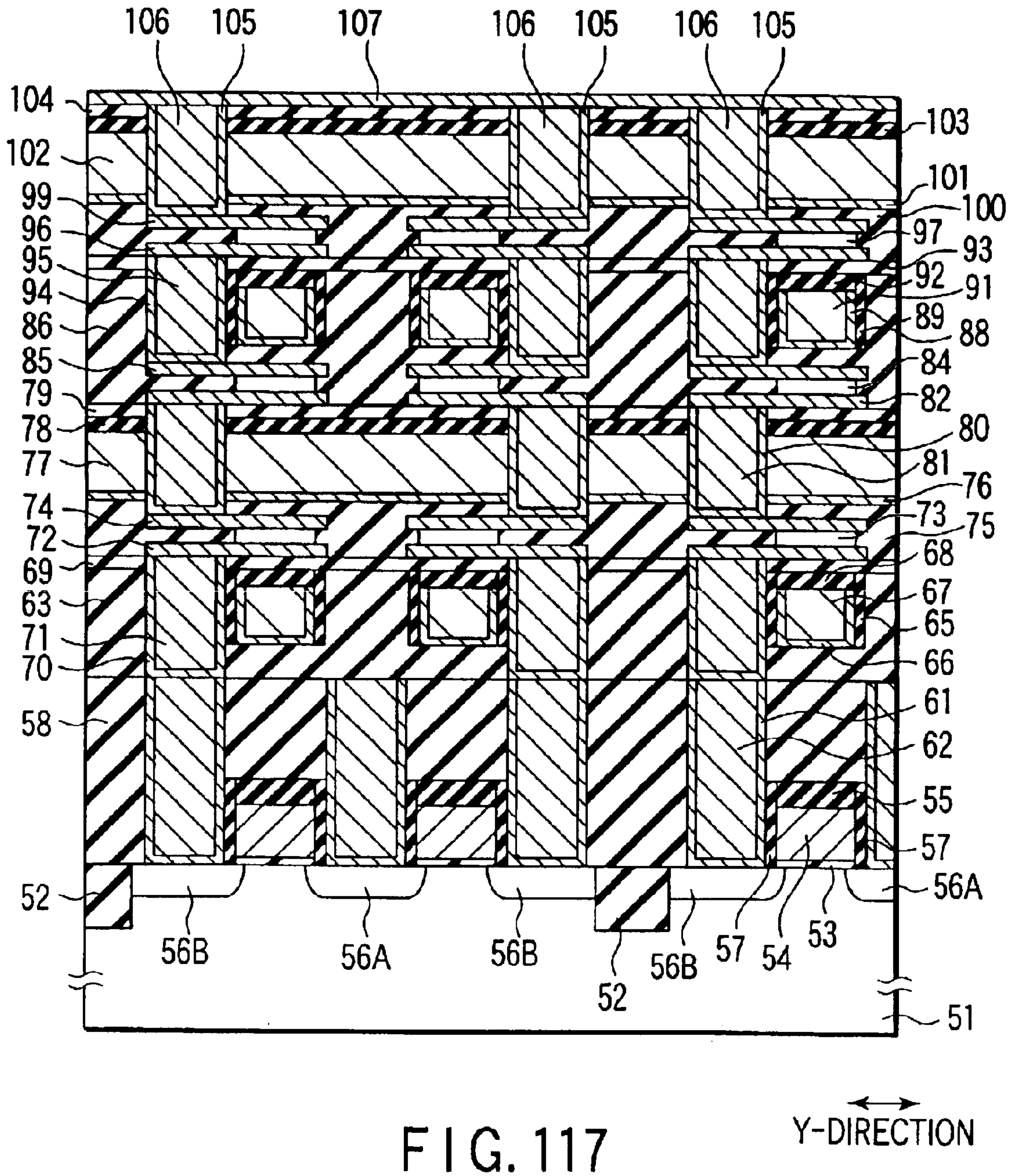
F I G. 117

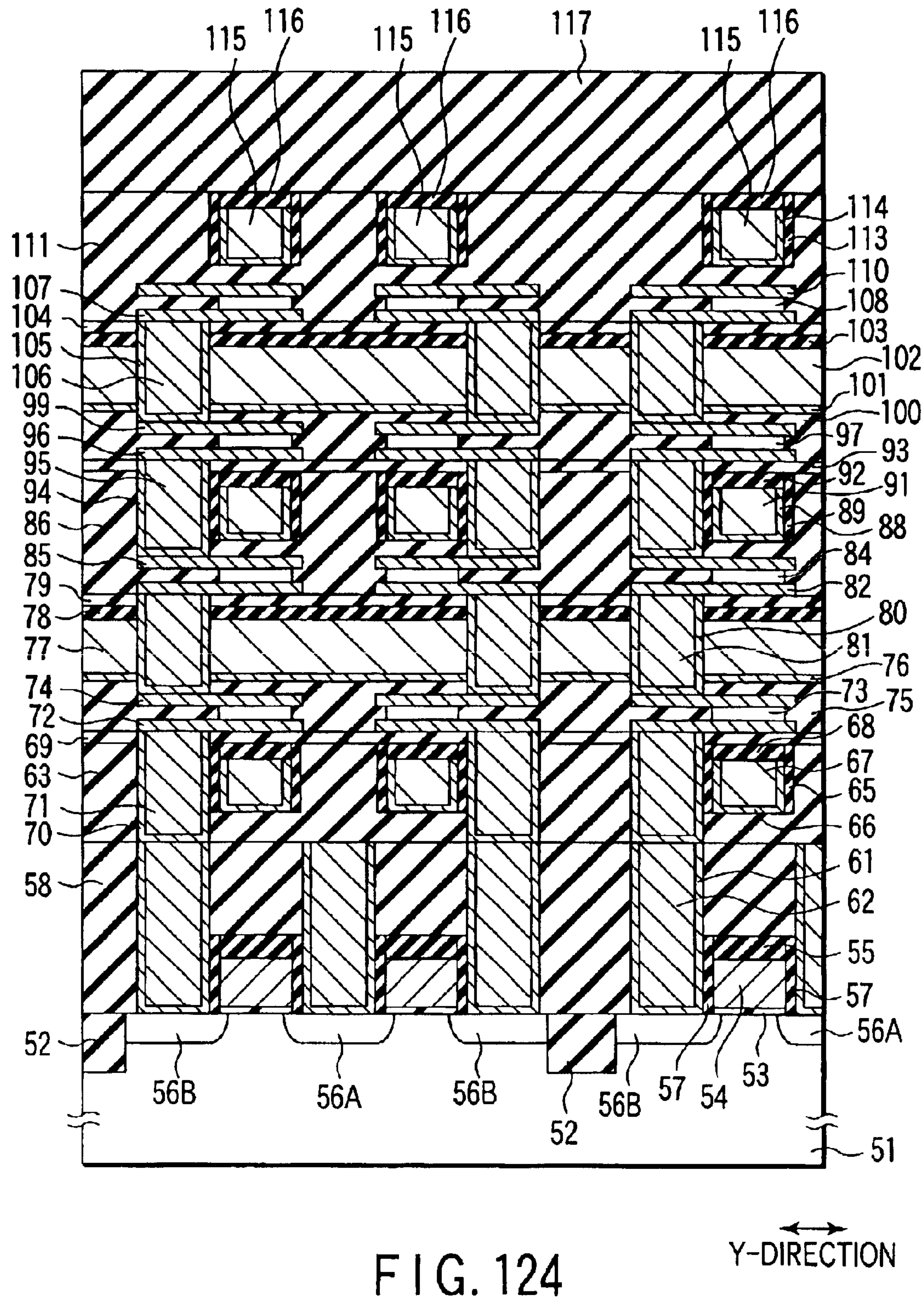
F I G. 124

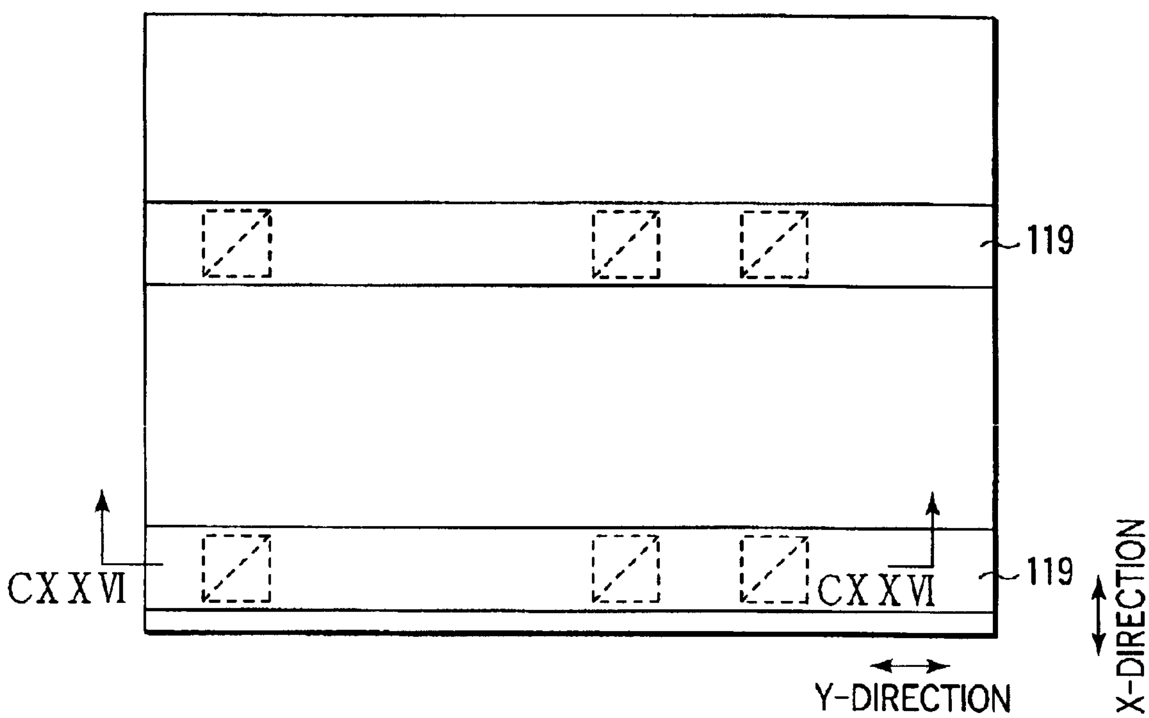
F I G. 125

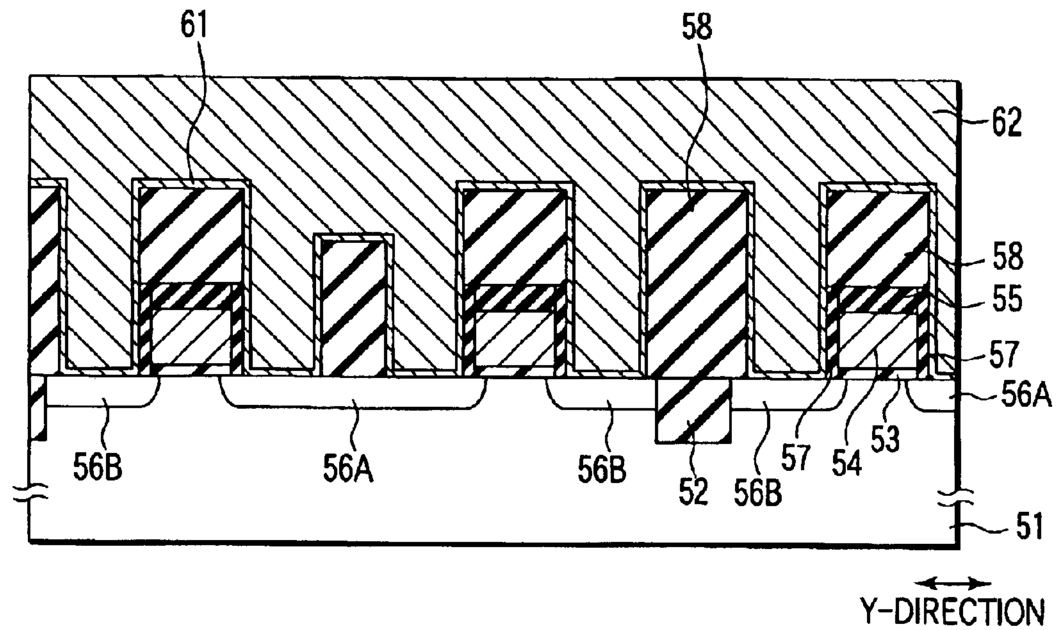
F I G. 133
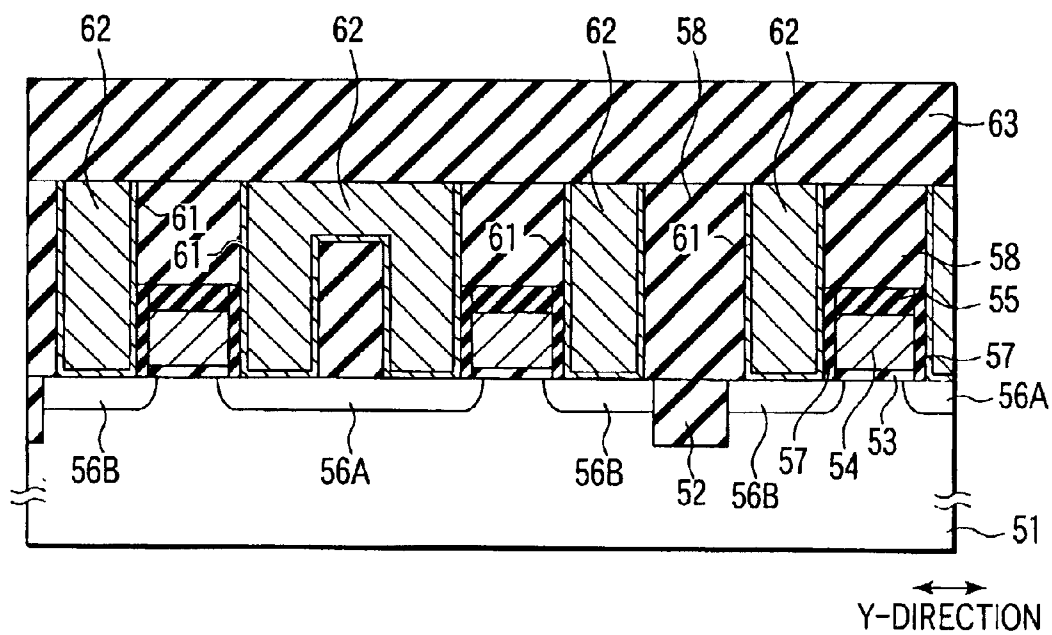
F I G. 134

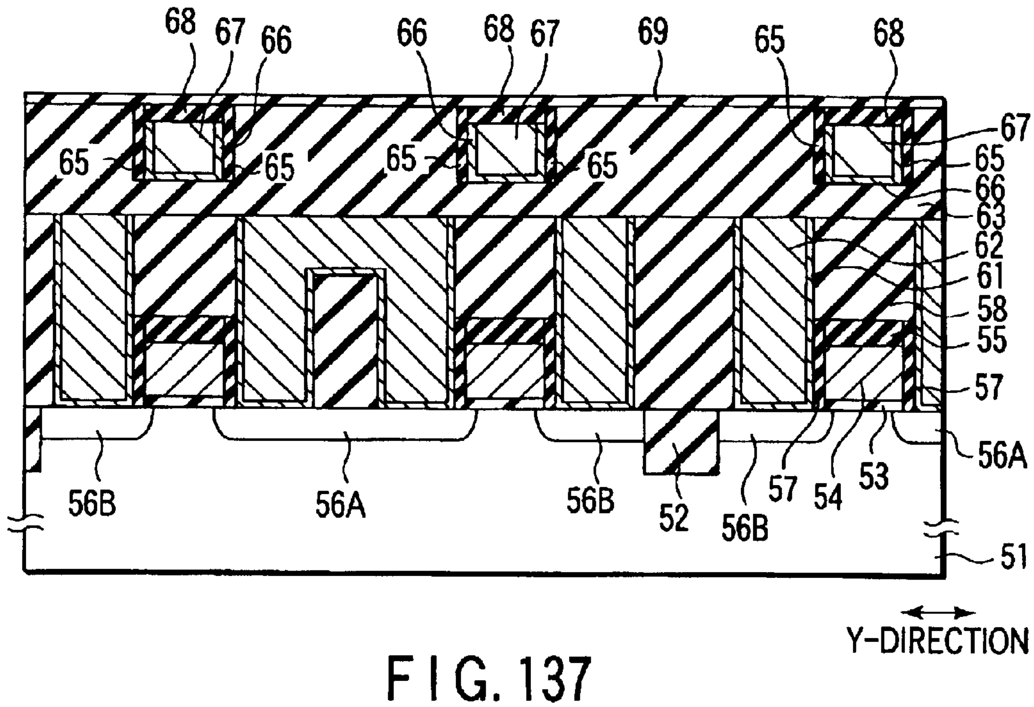
F I G. 137
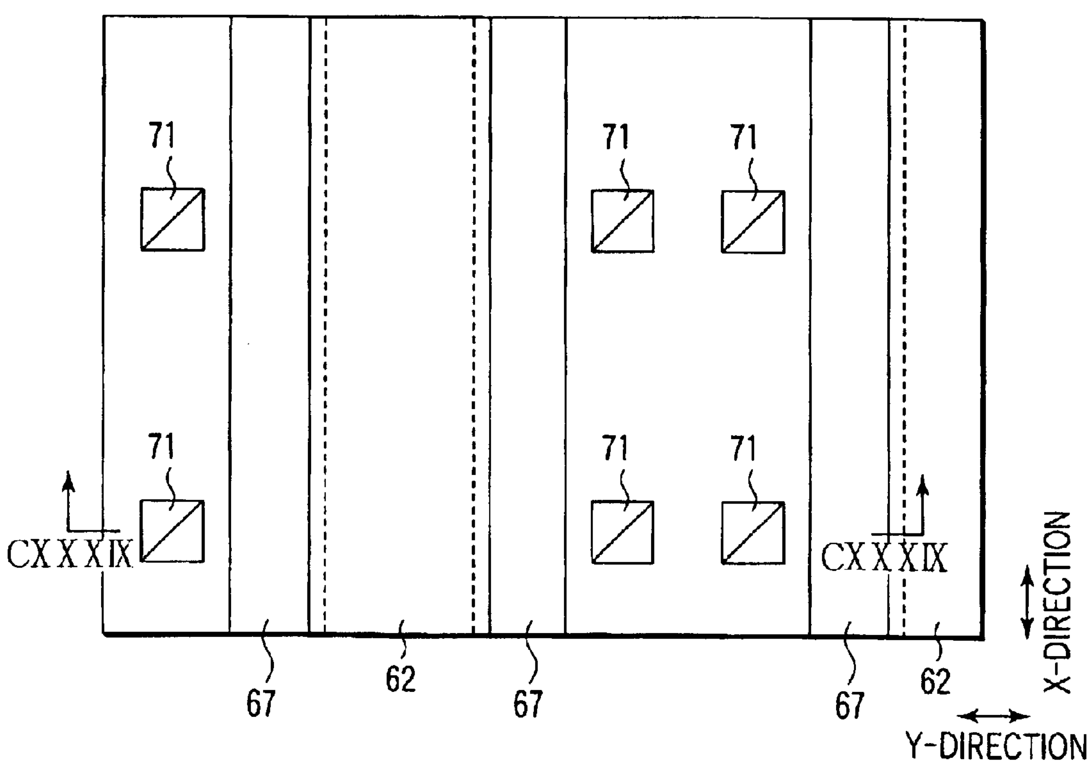
F I G. 138

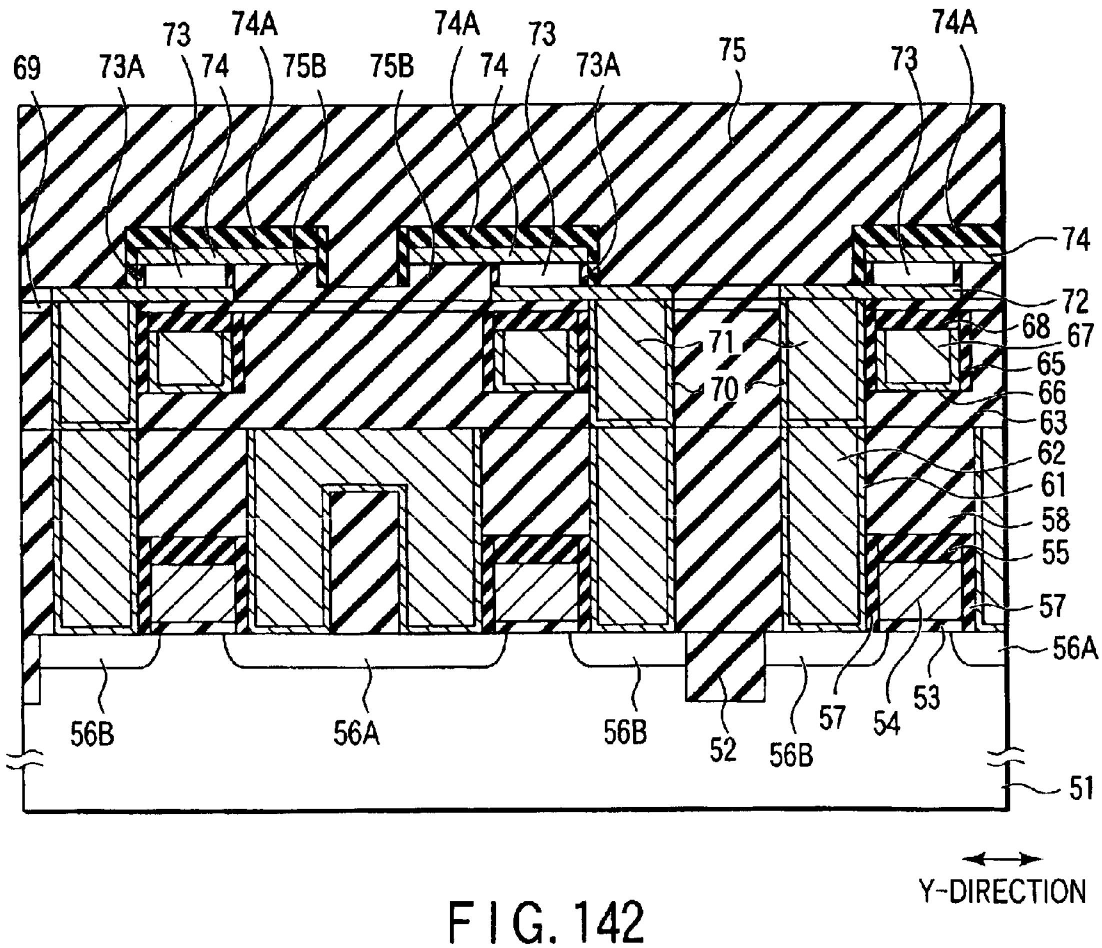
F I G. 142

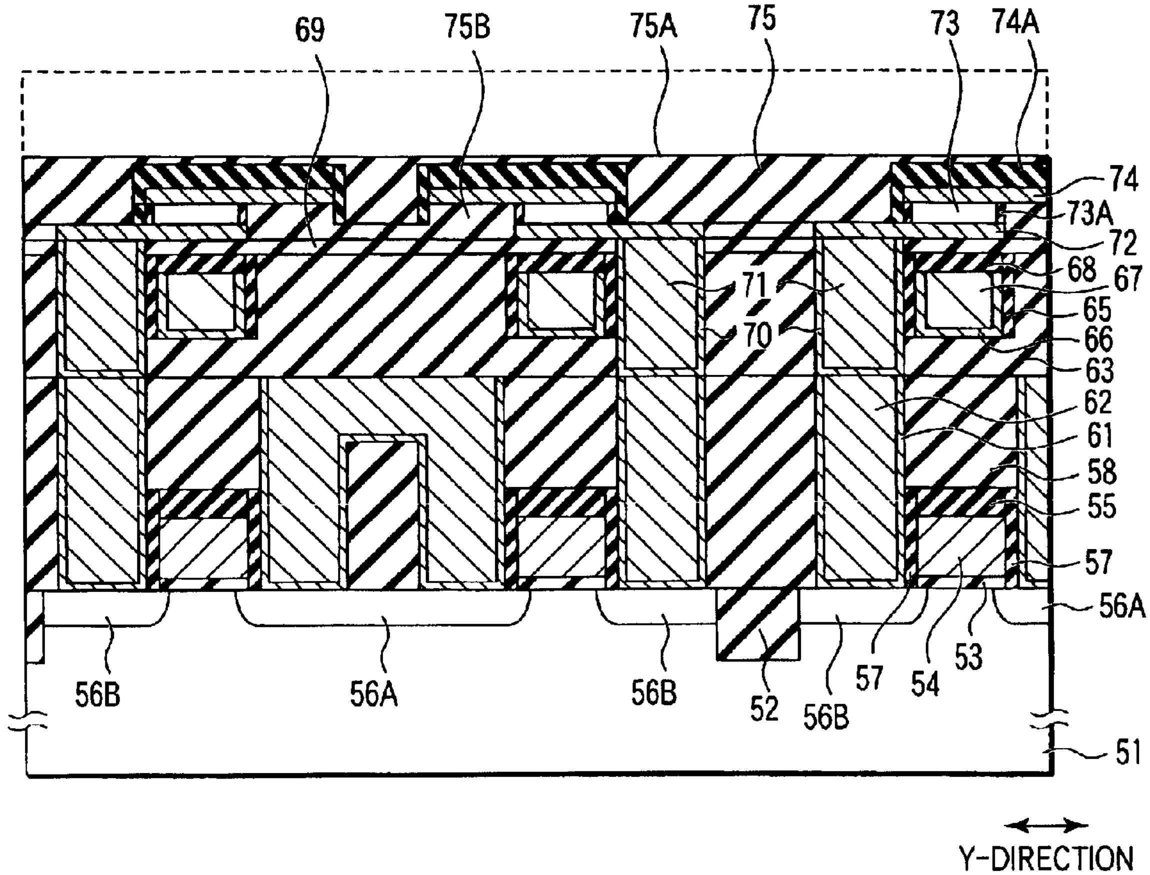
F I G. 143

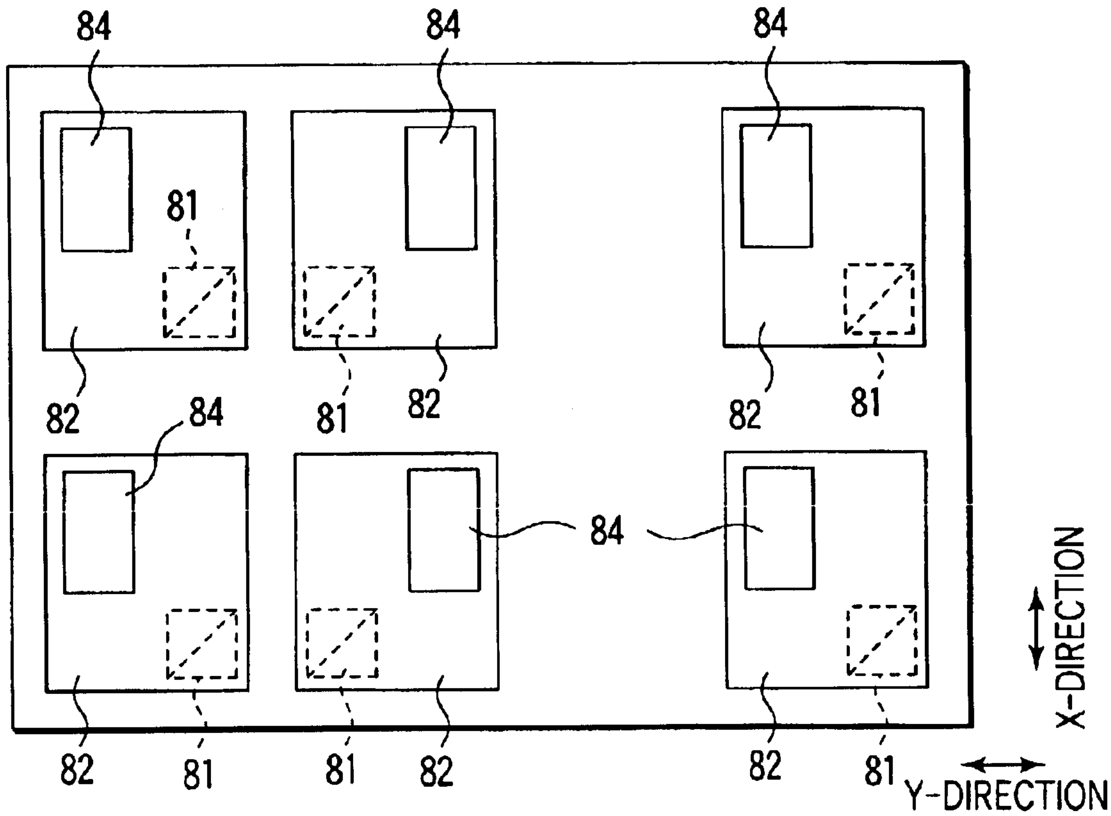
F I G. 147

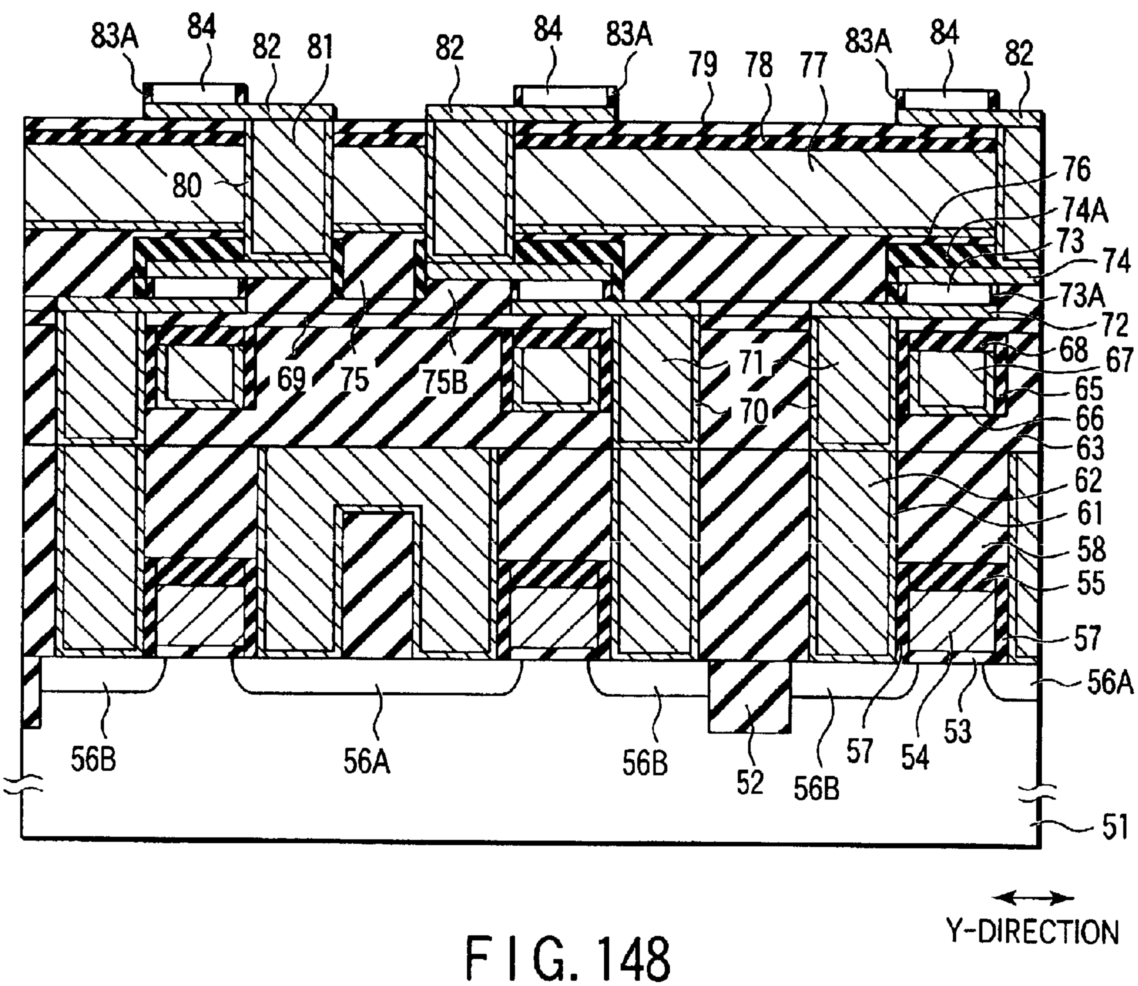
F I G. 148

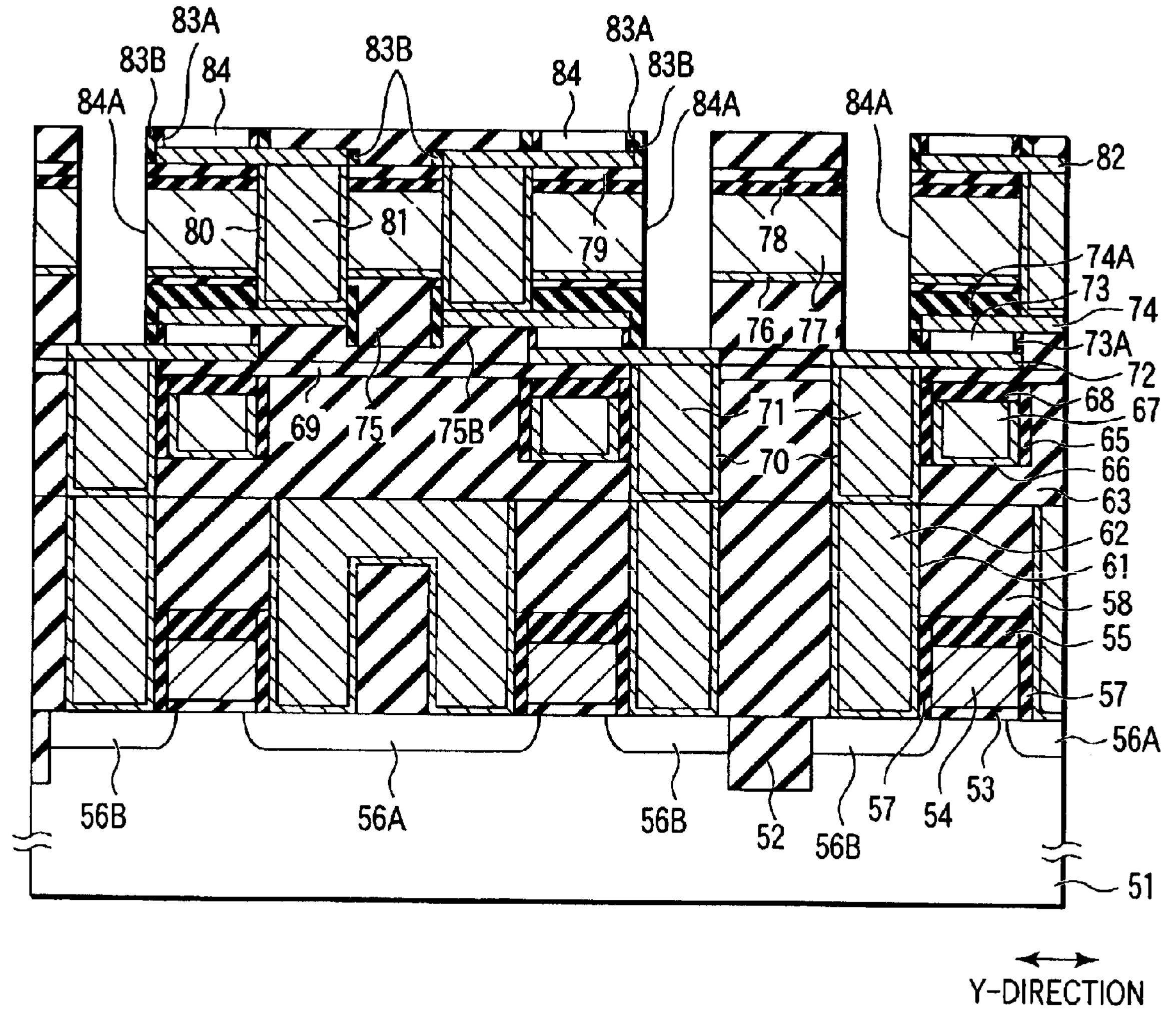
F I G. 149

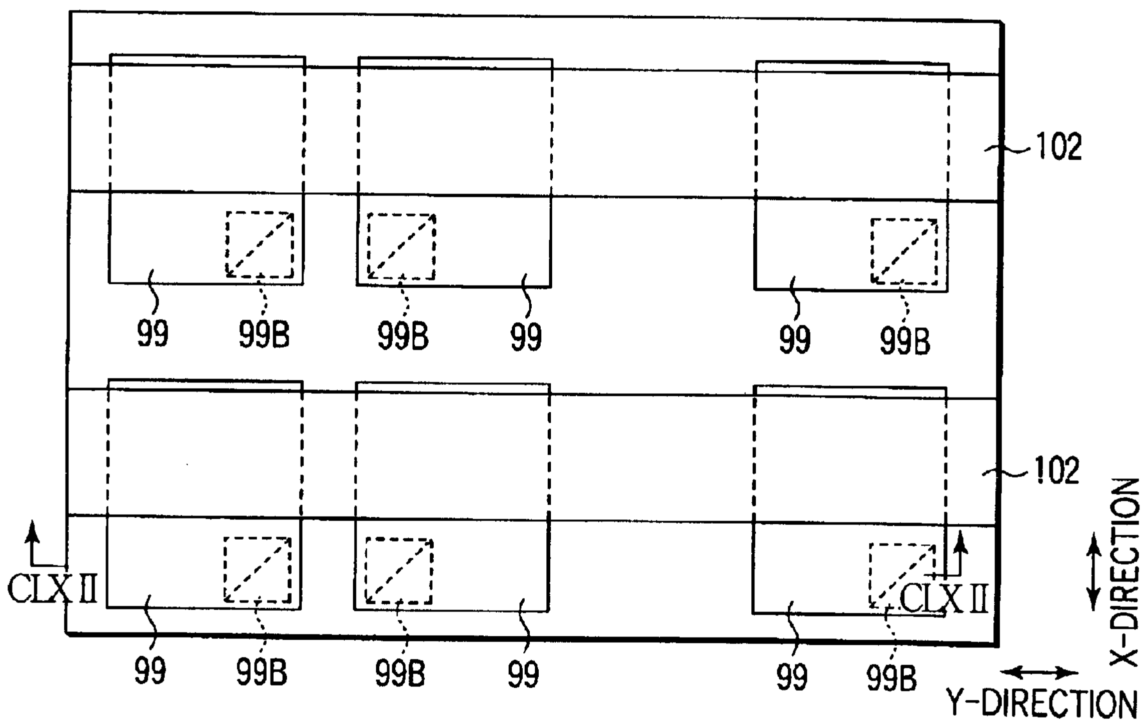
F I G. 161

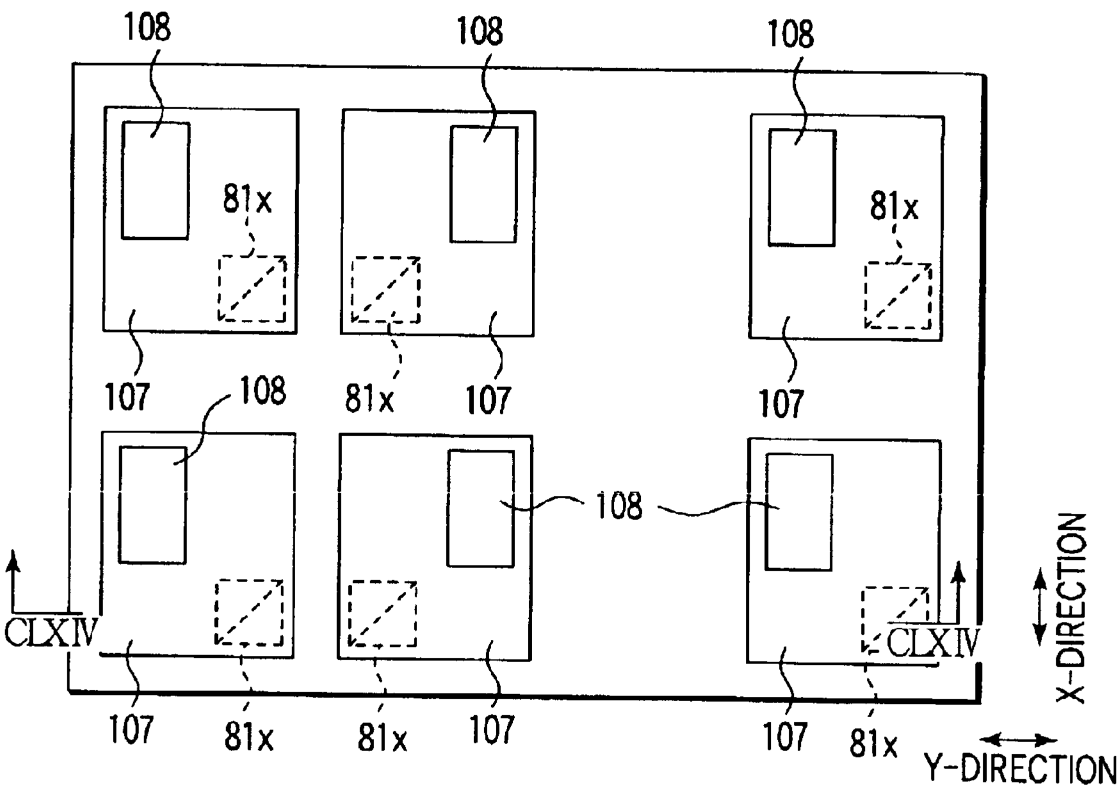
F I G. 163

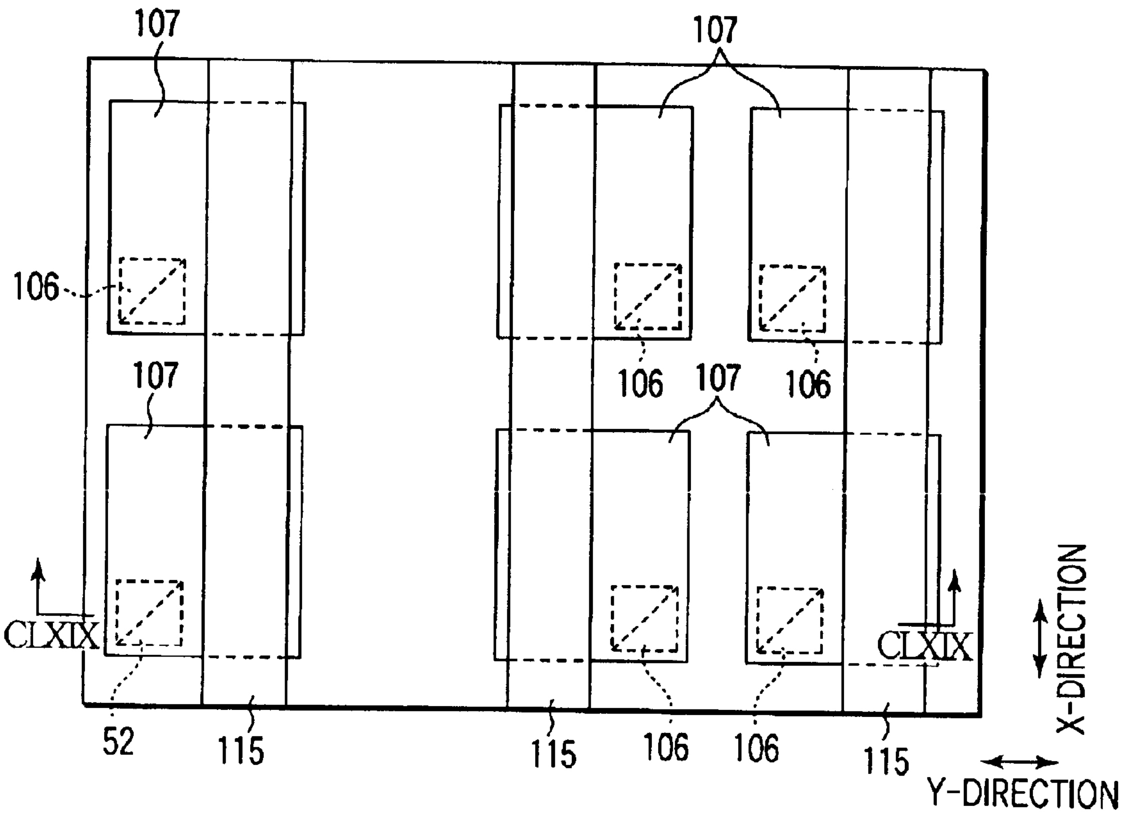
F I G. 168

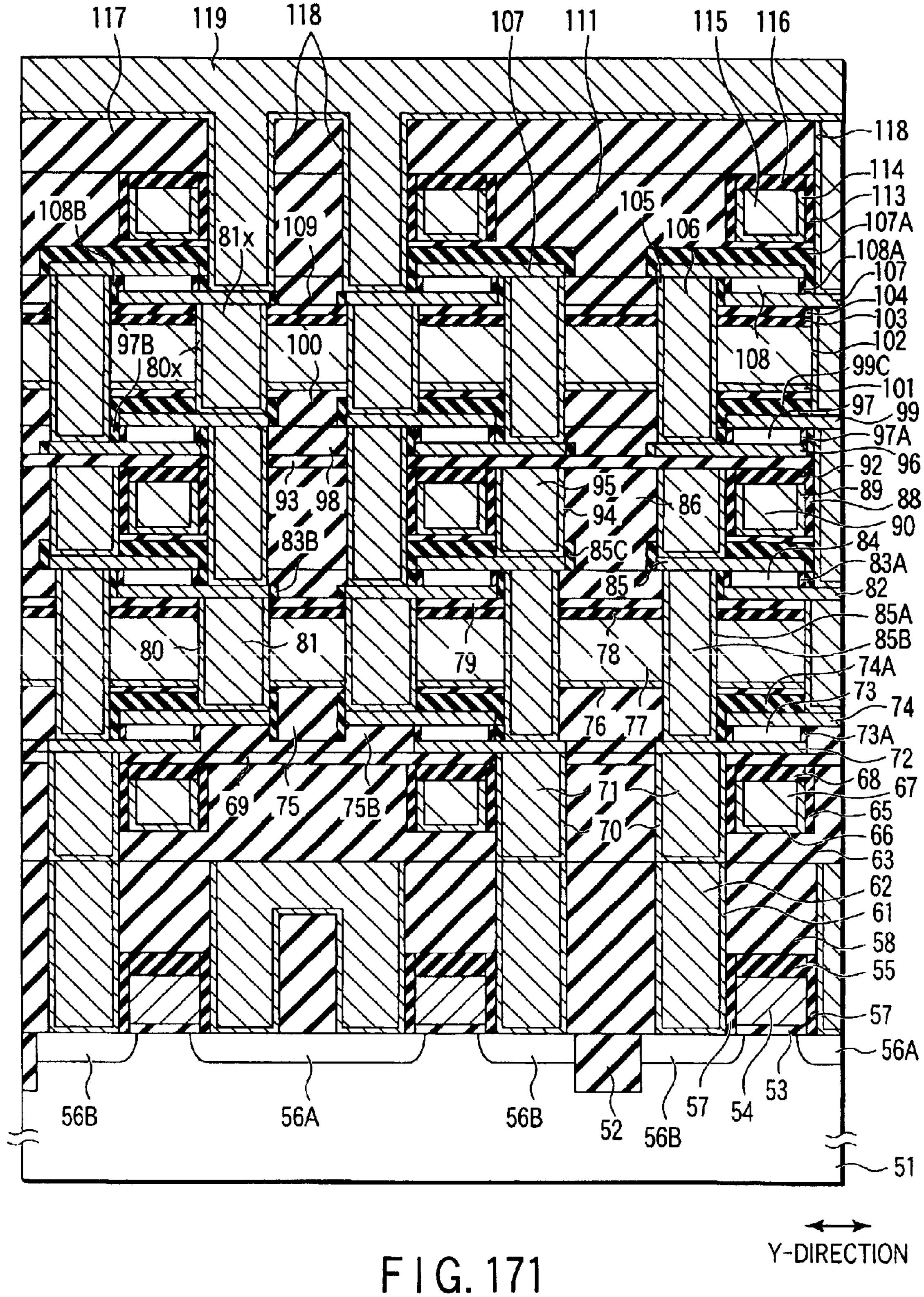
F I G. 171

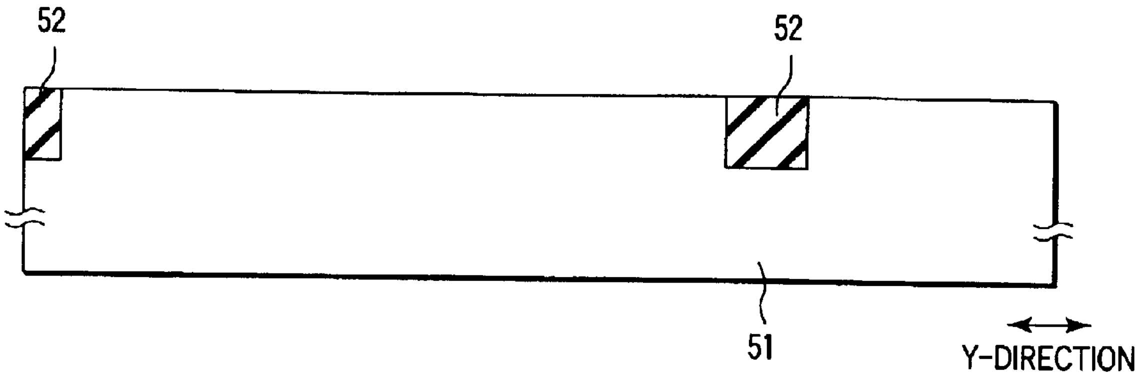
F I G. 173
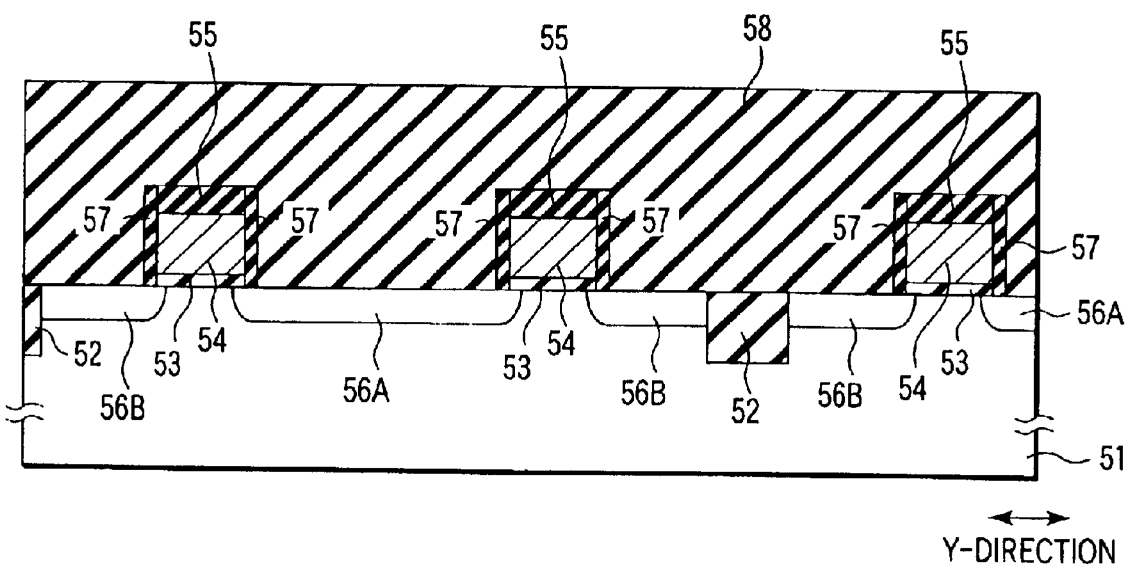
F I G. 174

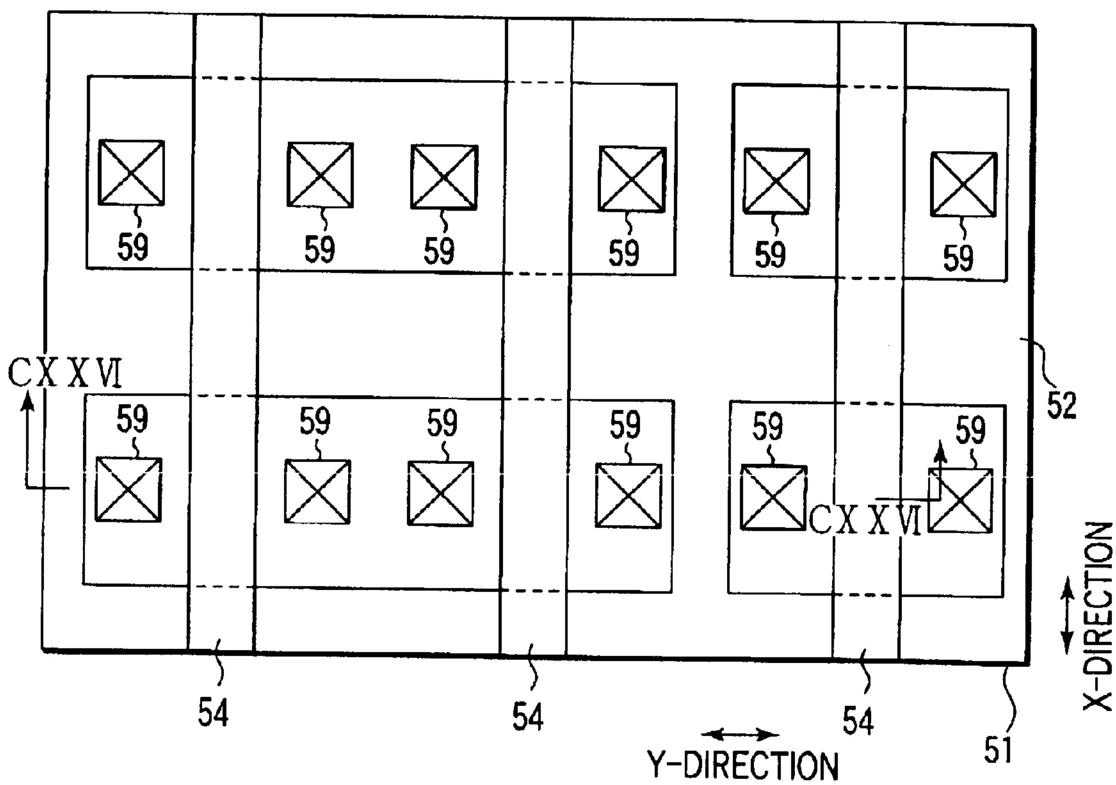
F I G. 175

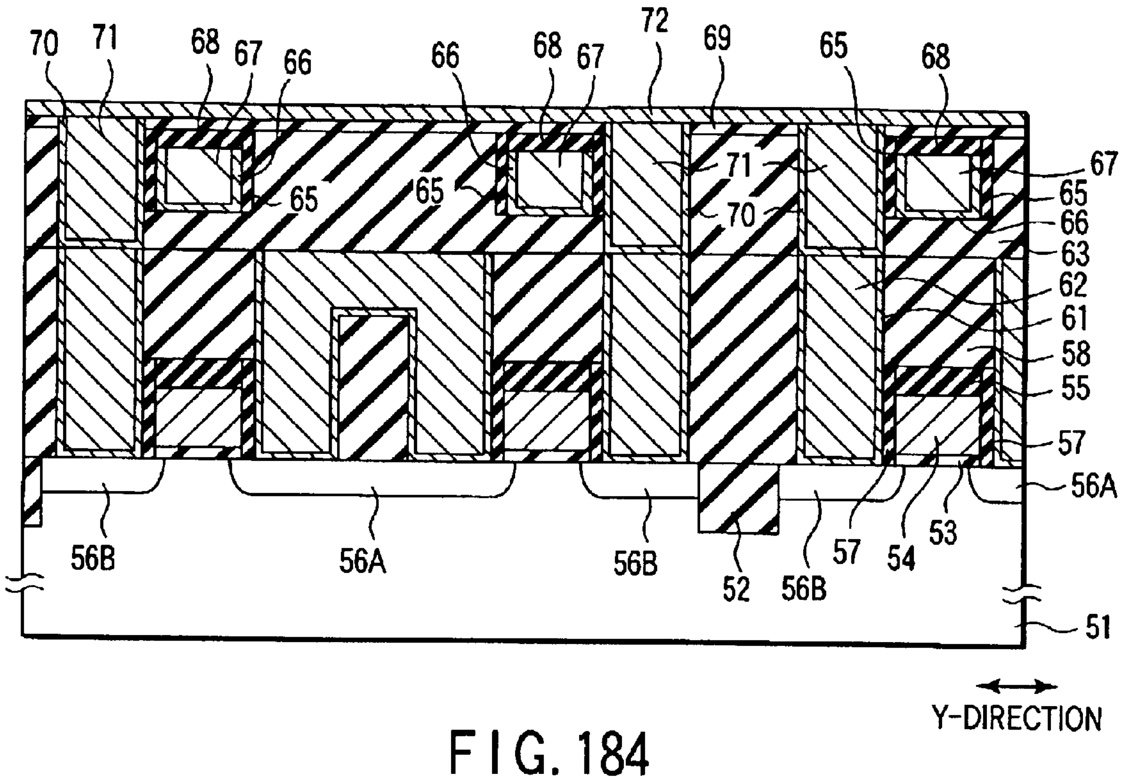
F I G. 184
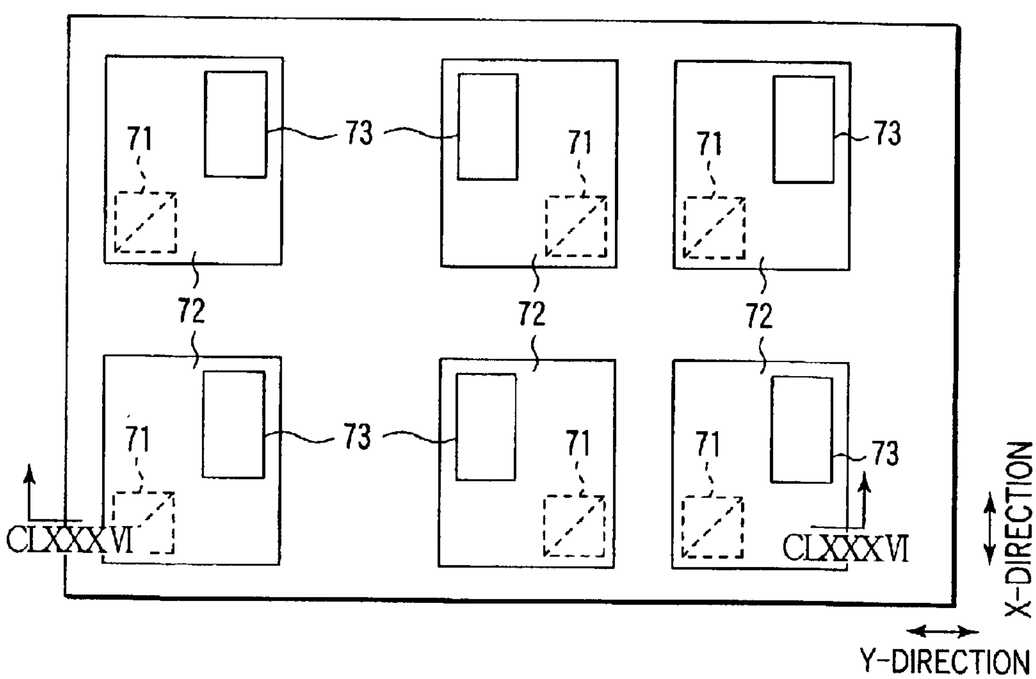
F I G. 185

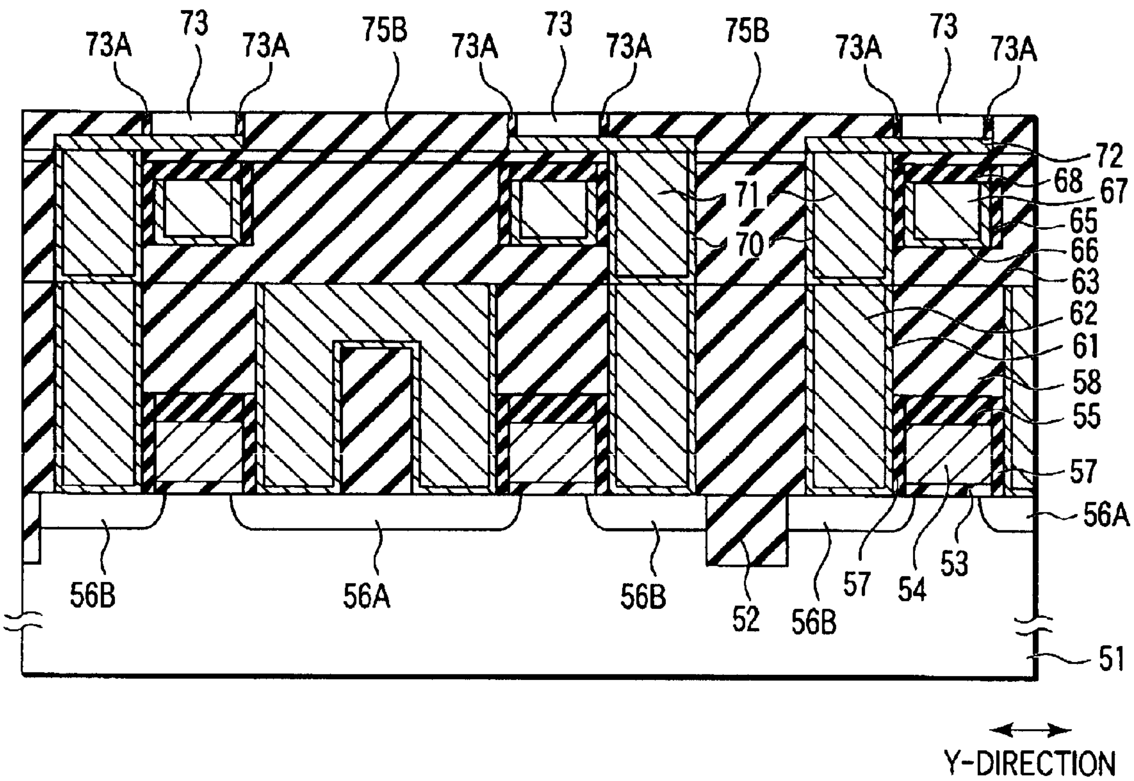
F I G. 186

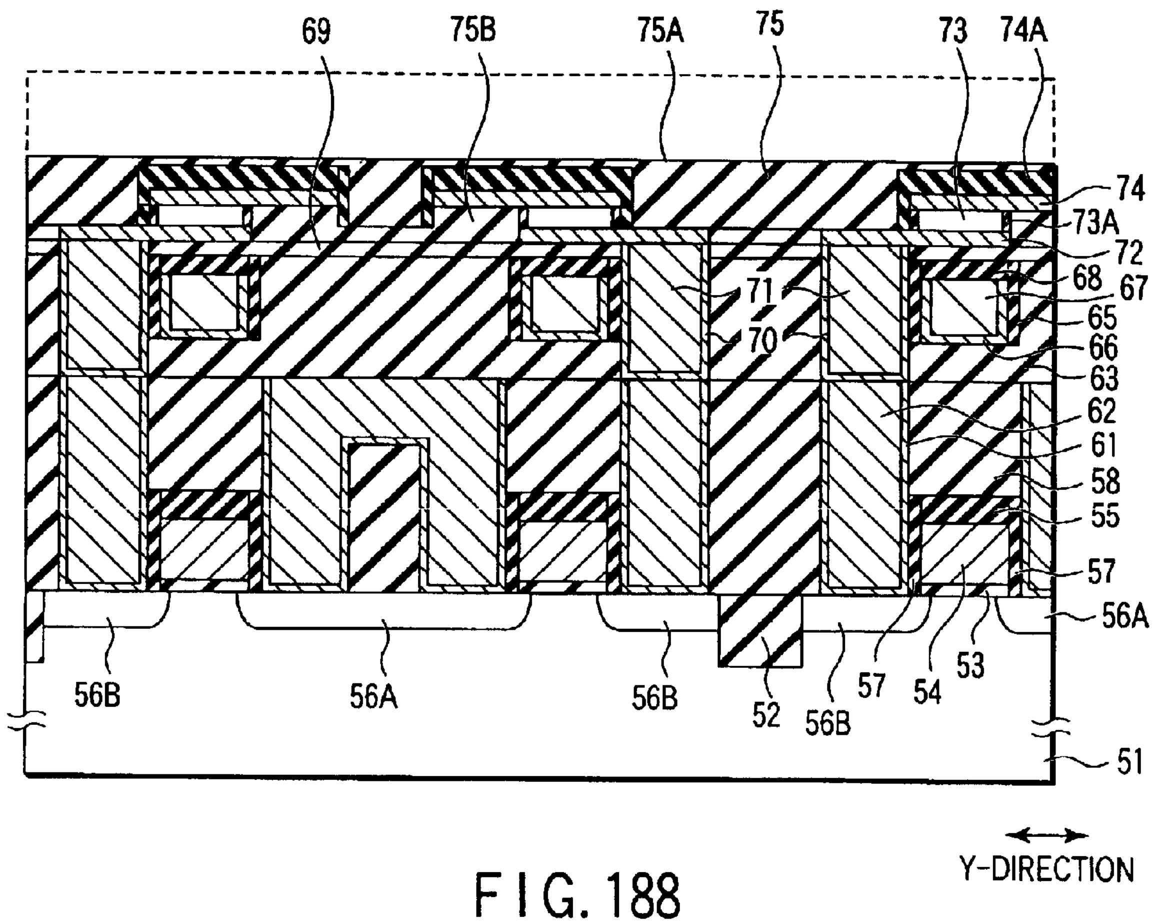
F I G. 188

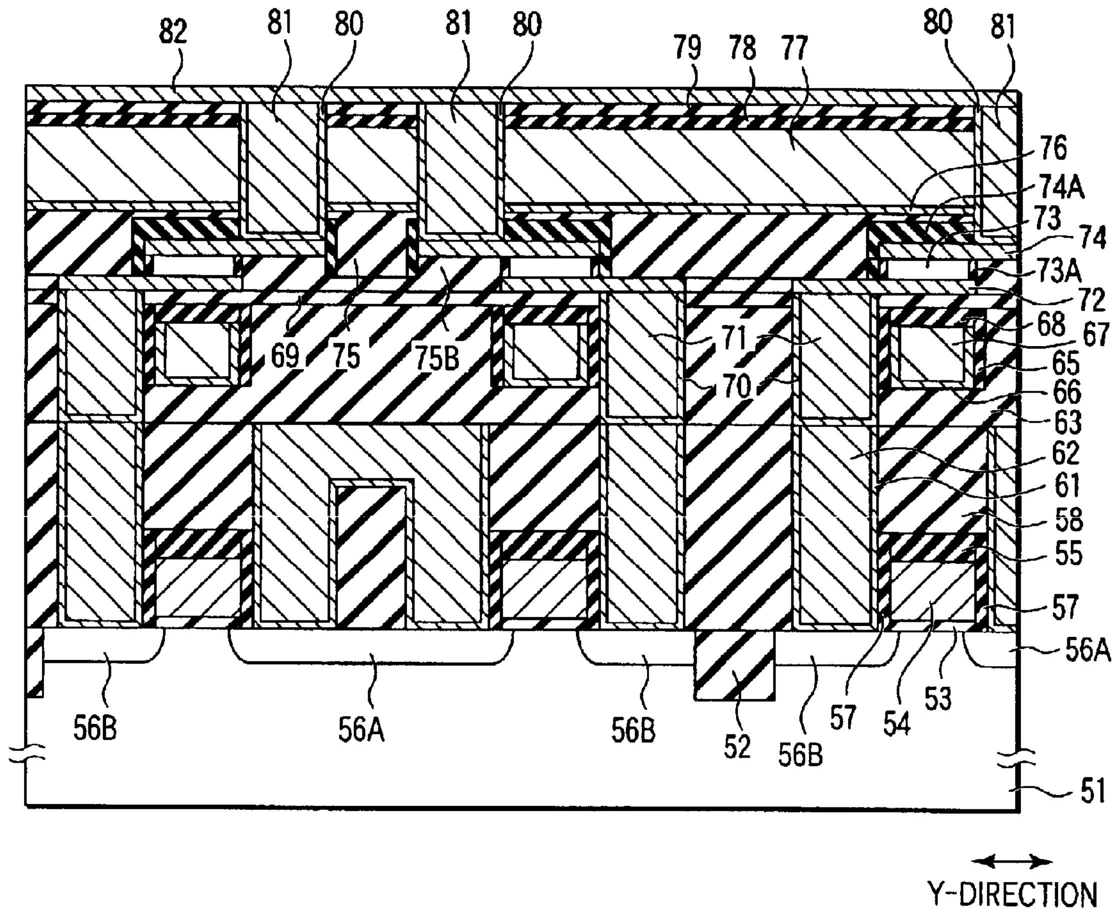
F I G. 191

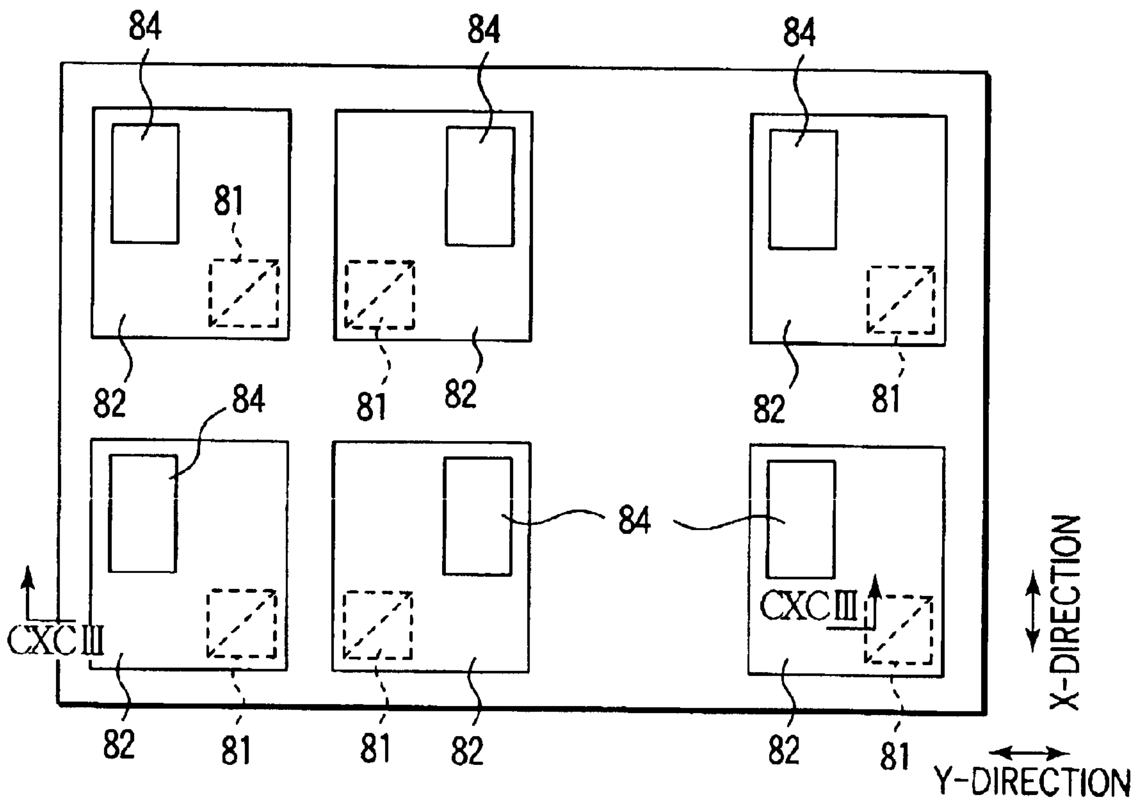
F I G. 192

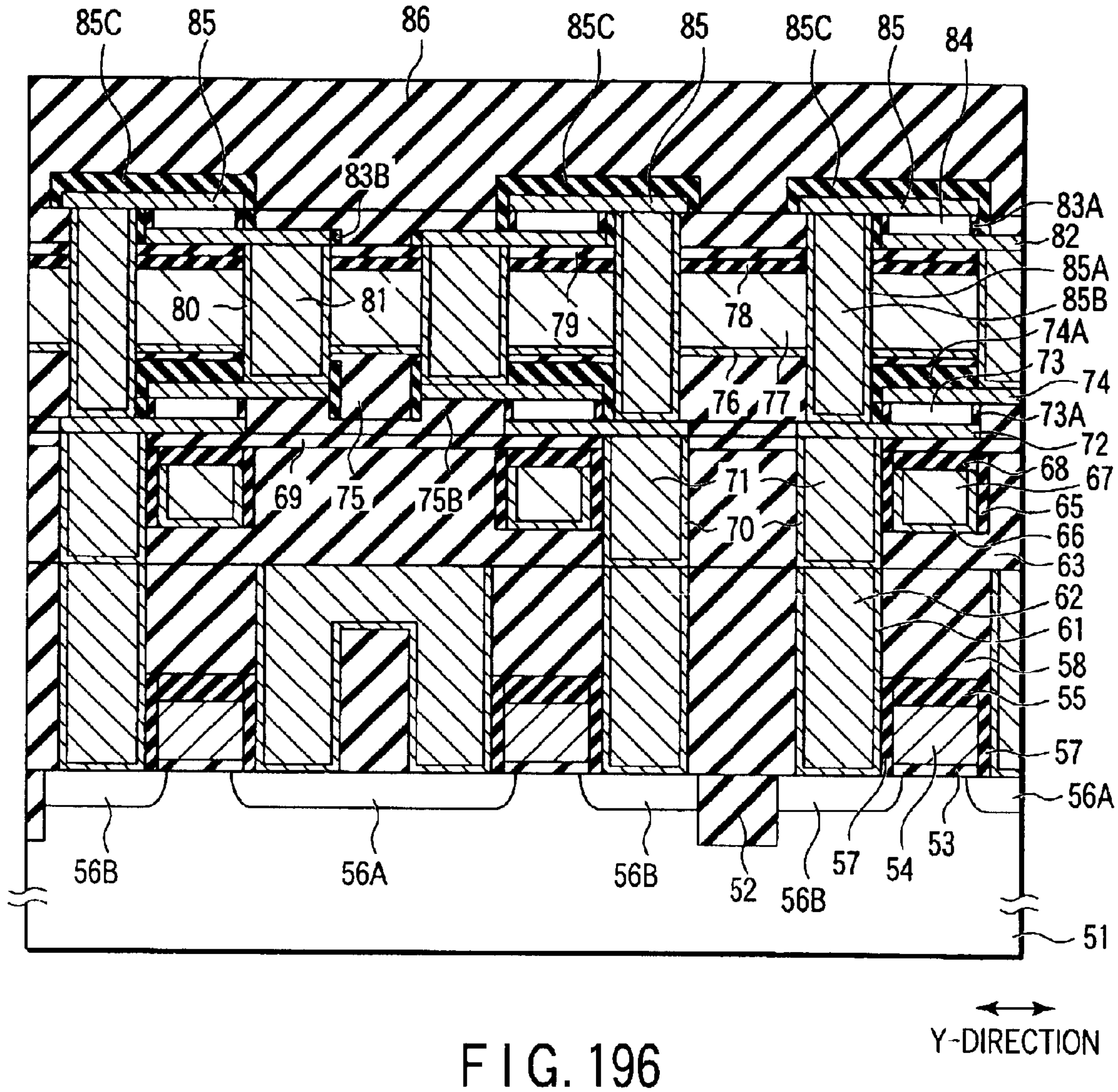
F I G. 196

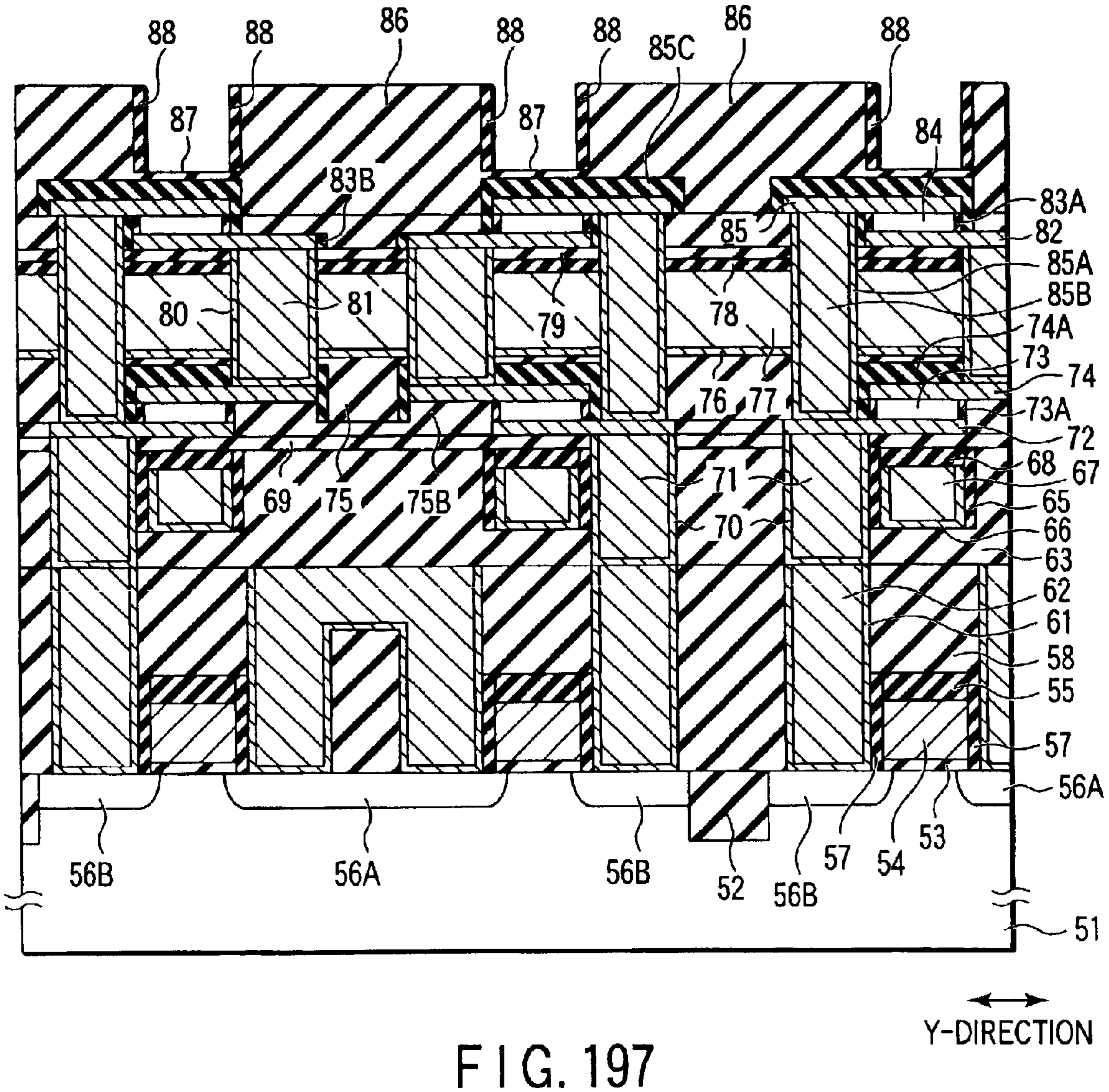
F I G. 197

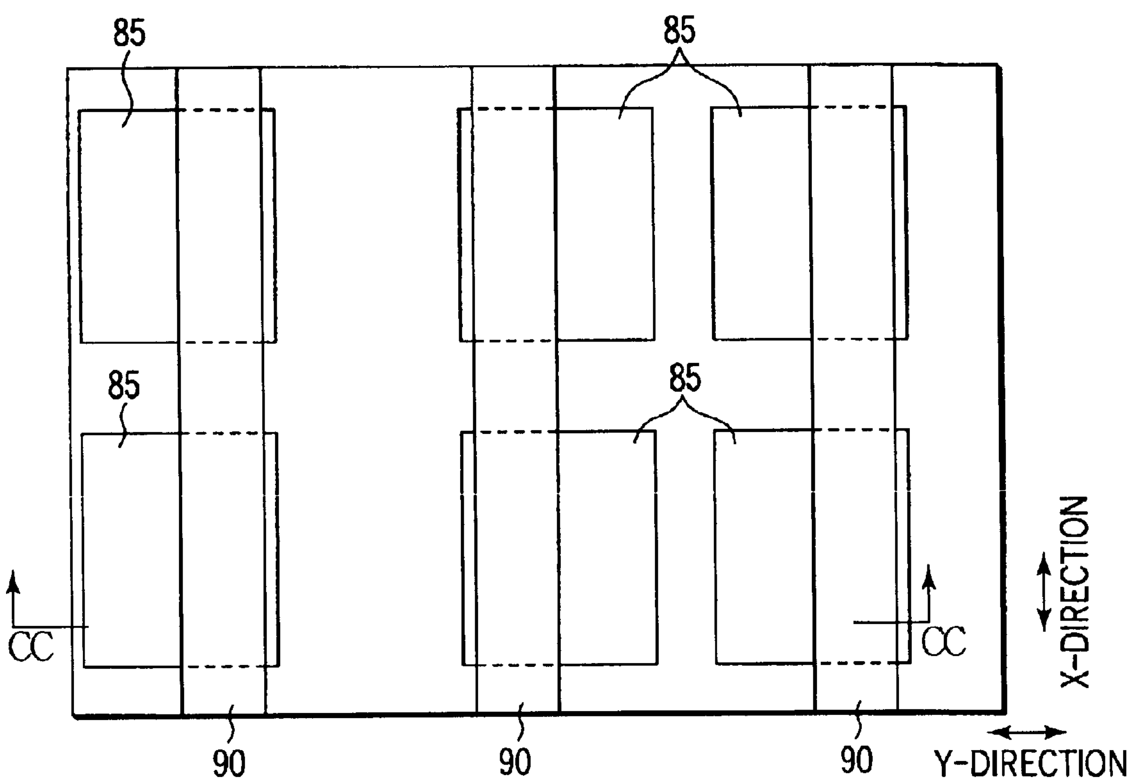
F I G. 199

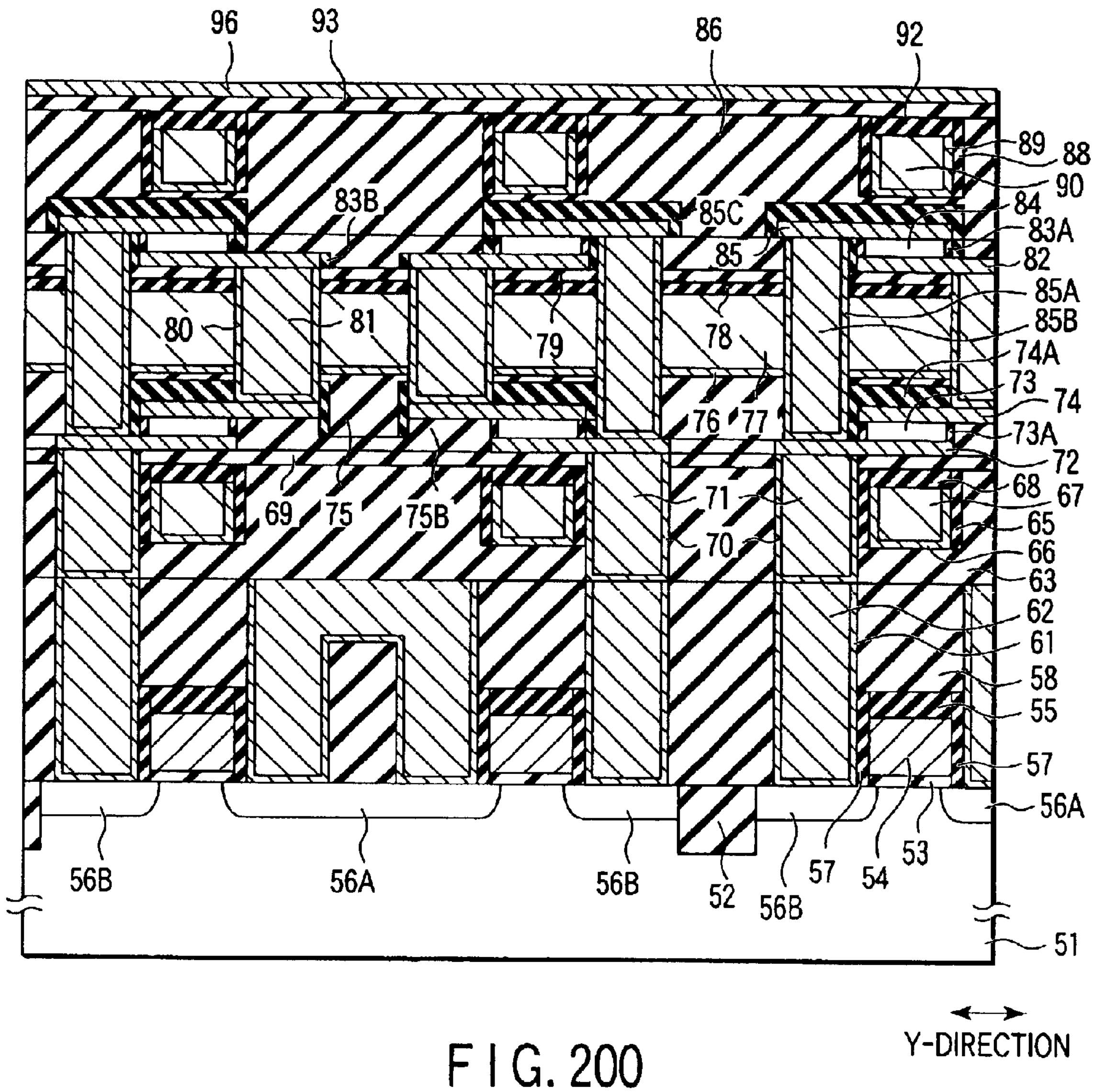
F I G. 200

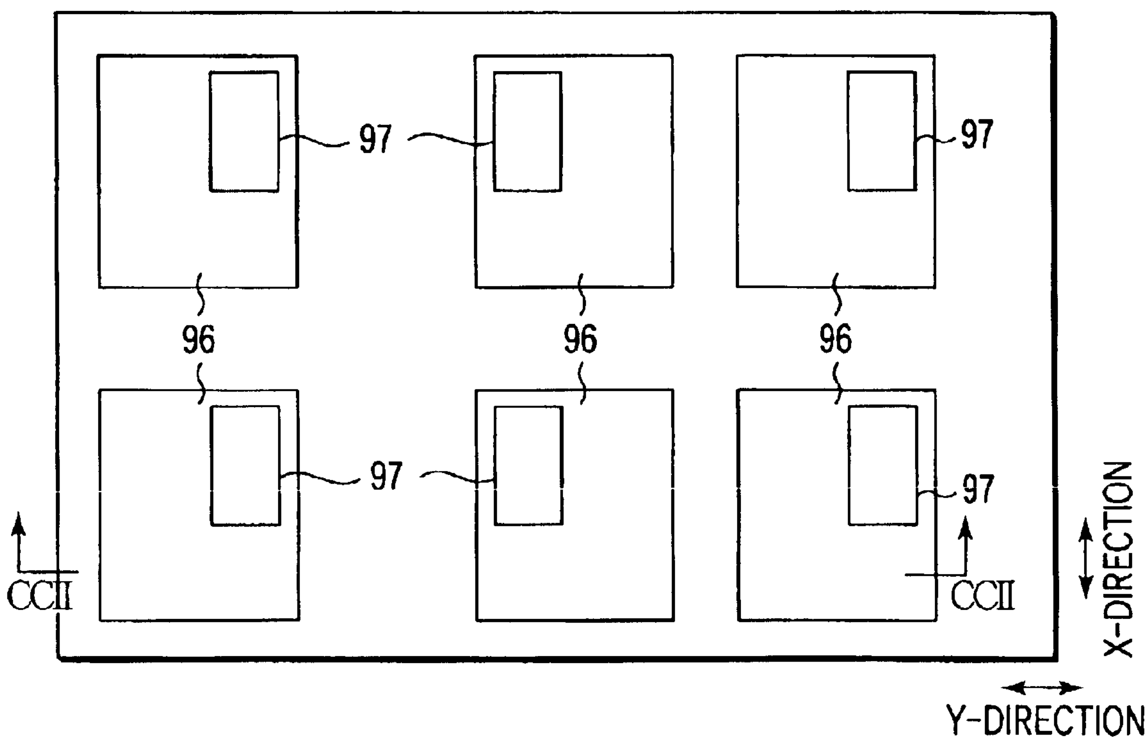
F I G. 201

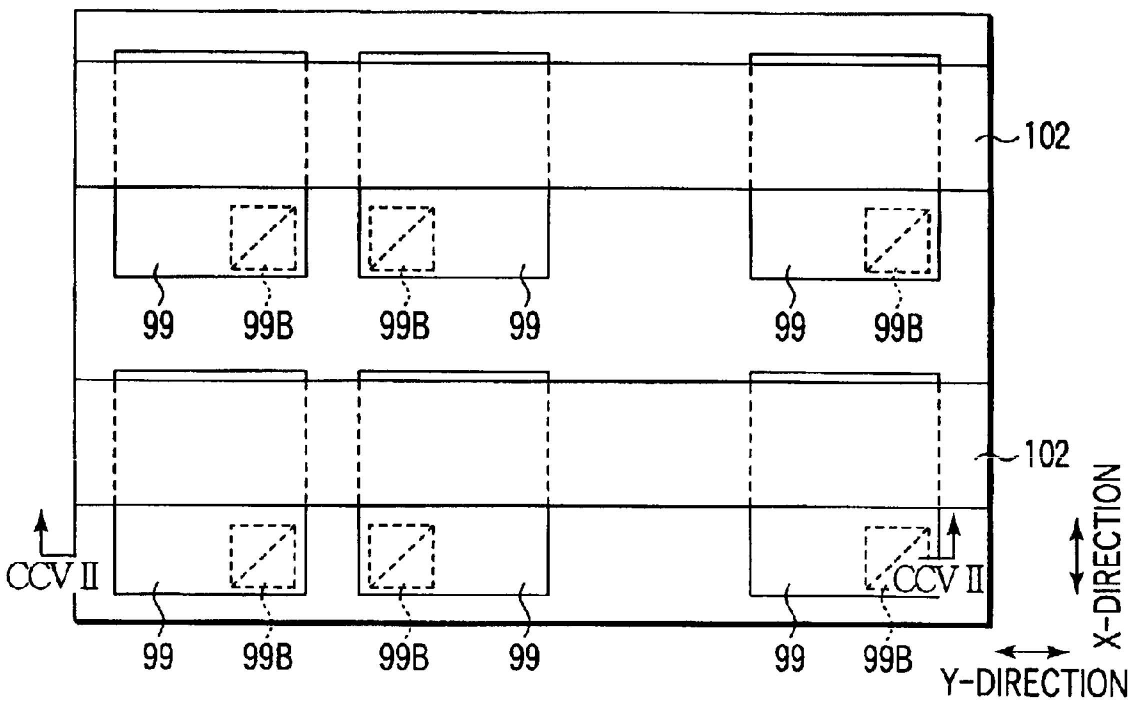
F I G. 206

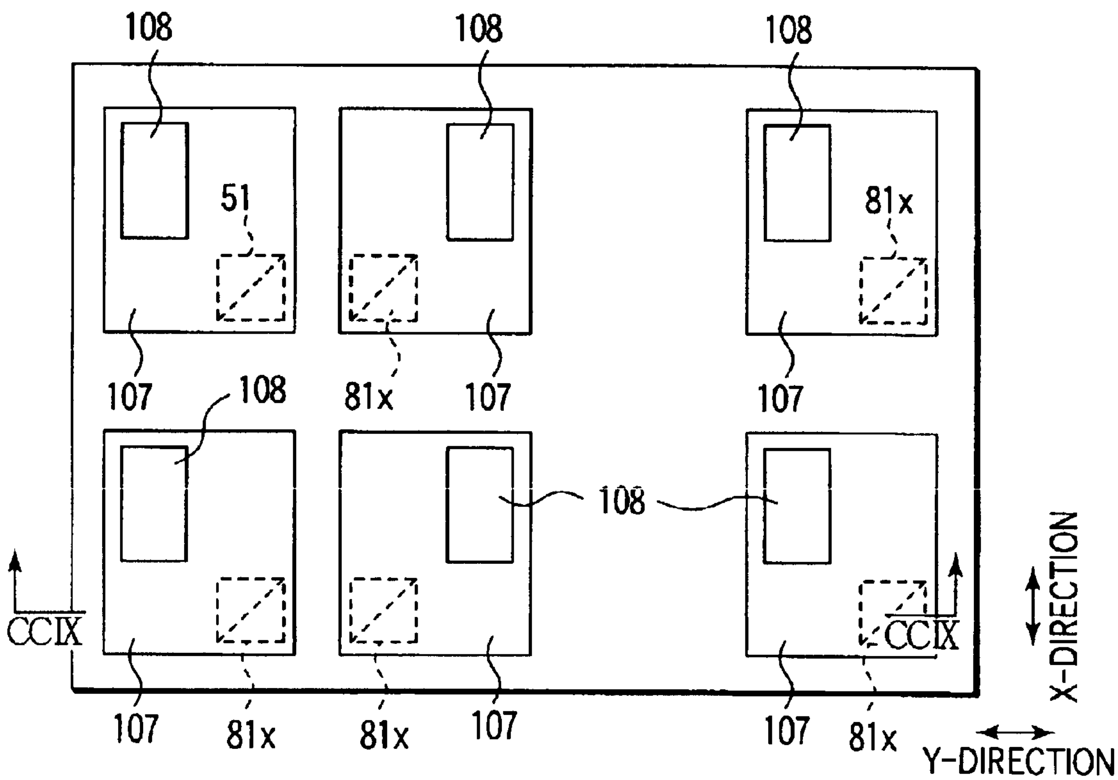
F I G. 208

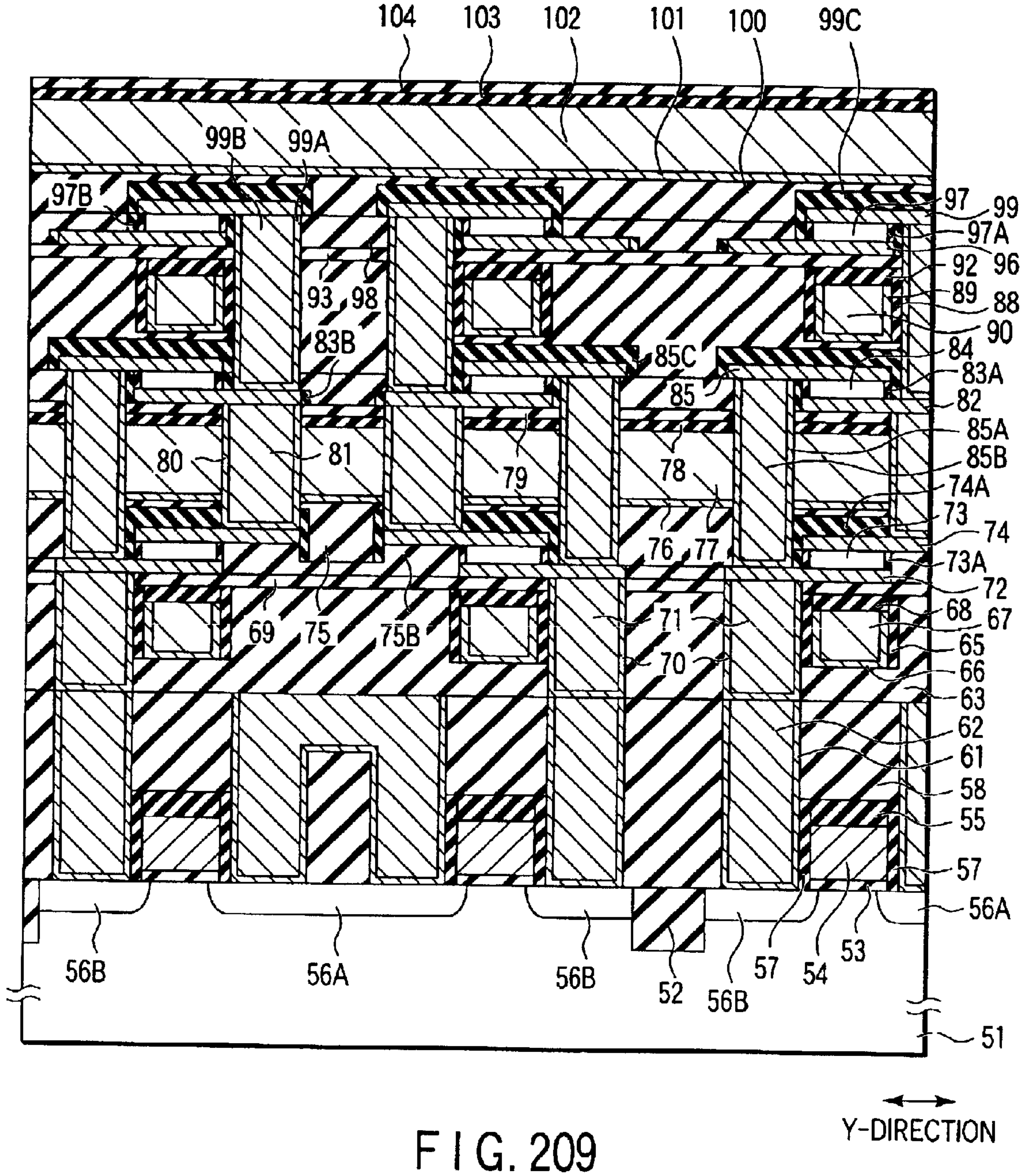
F I G. 209

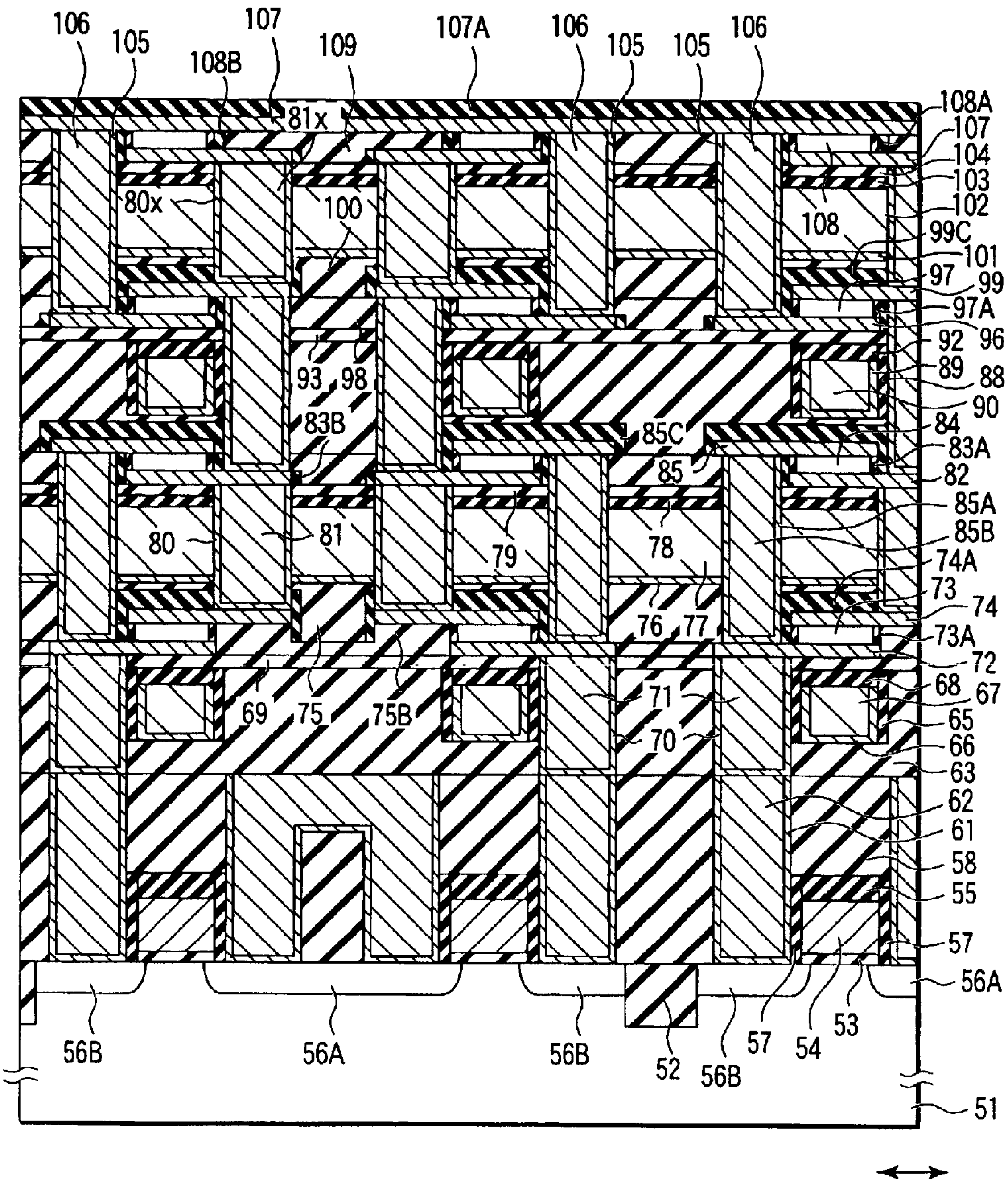
F I G. 211

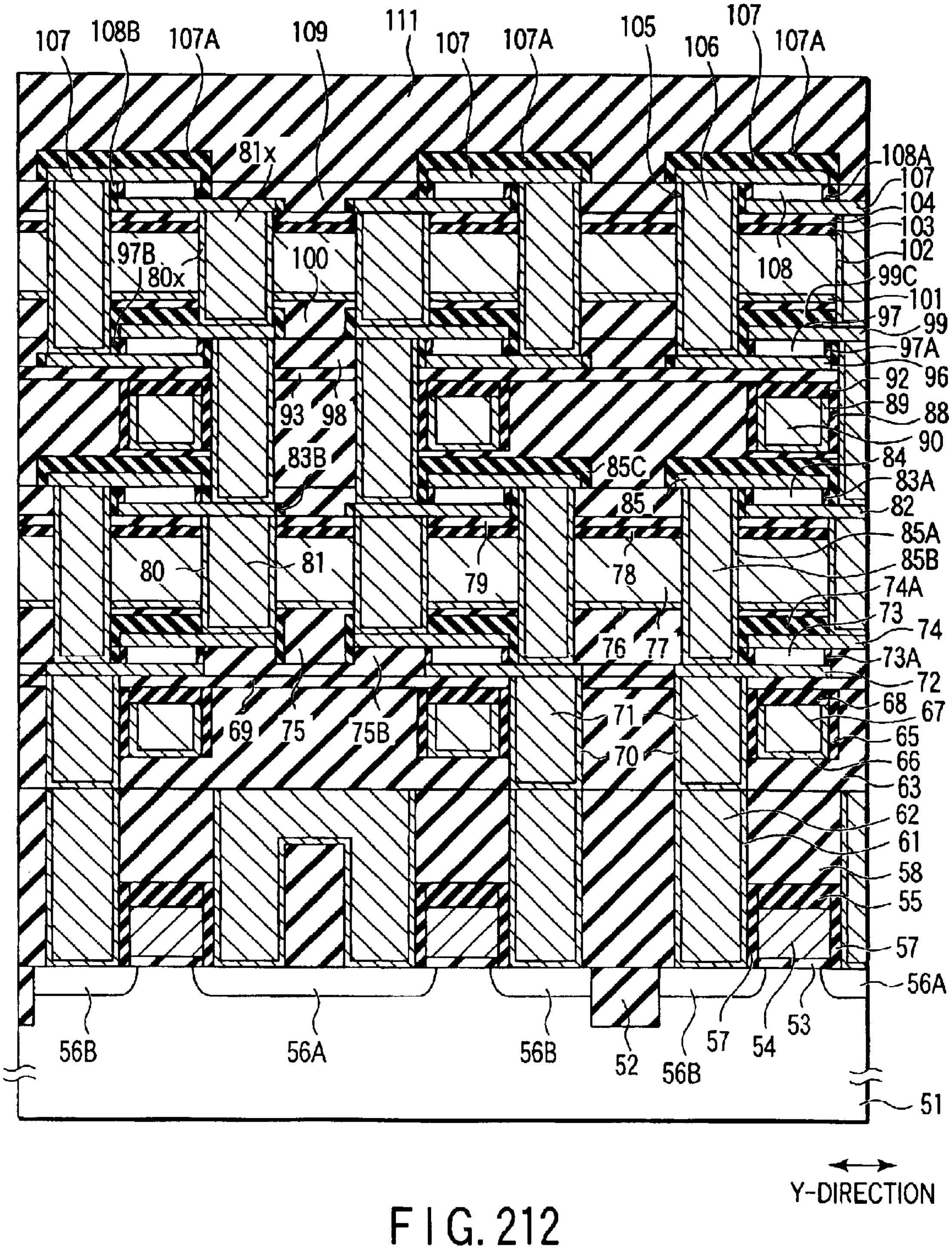
F I G. 212

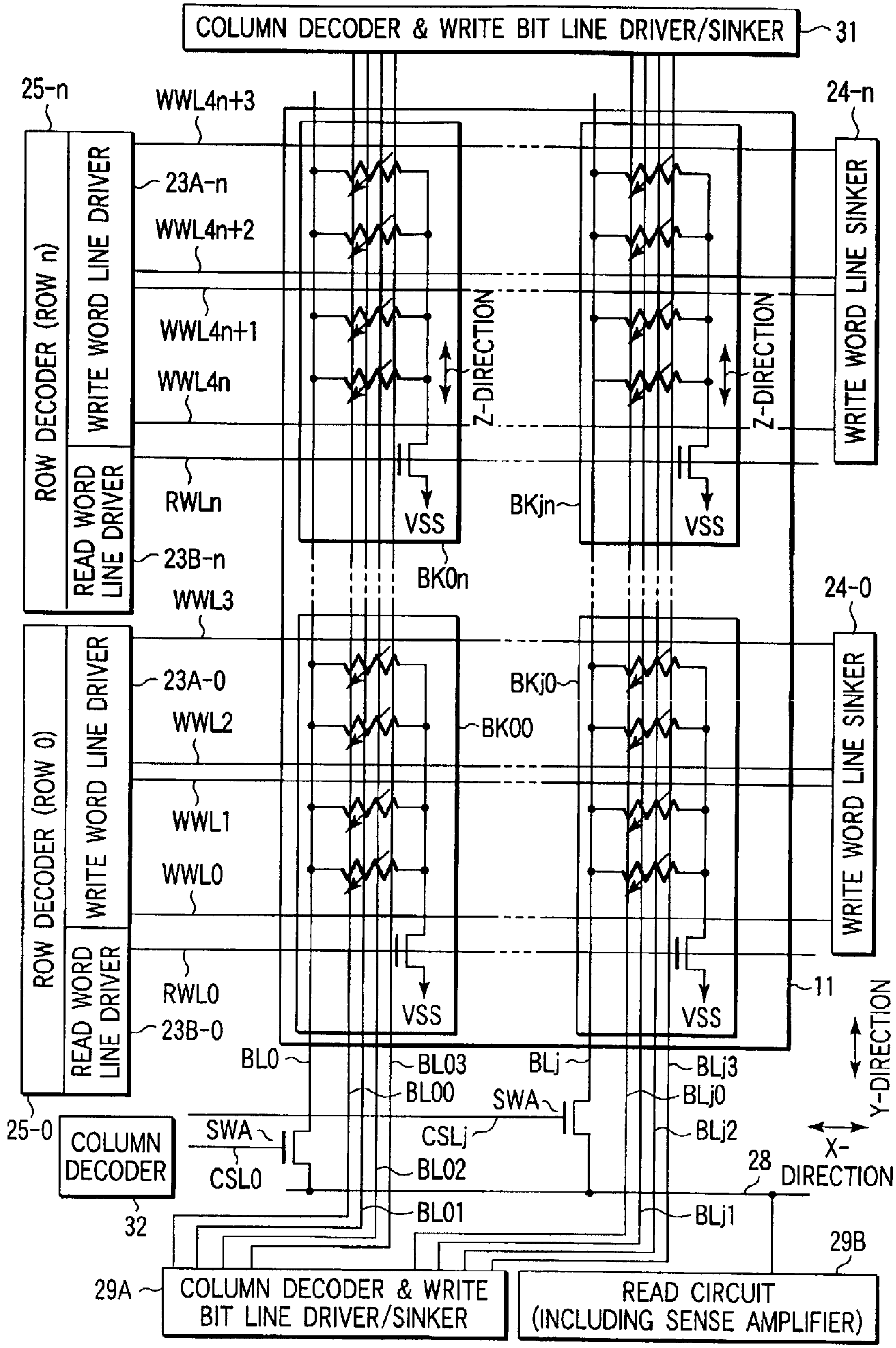
F I G. 219

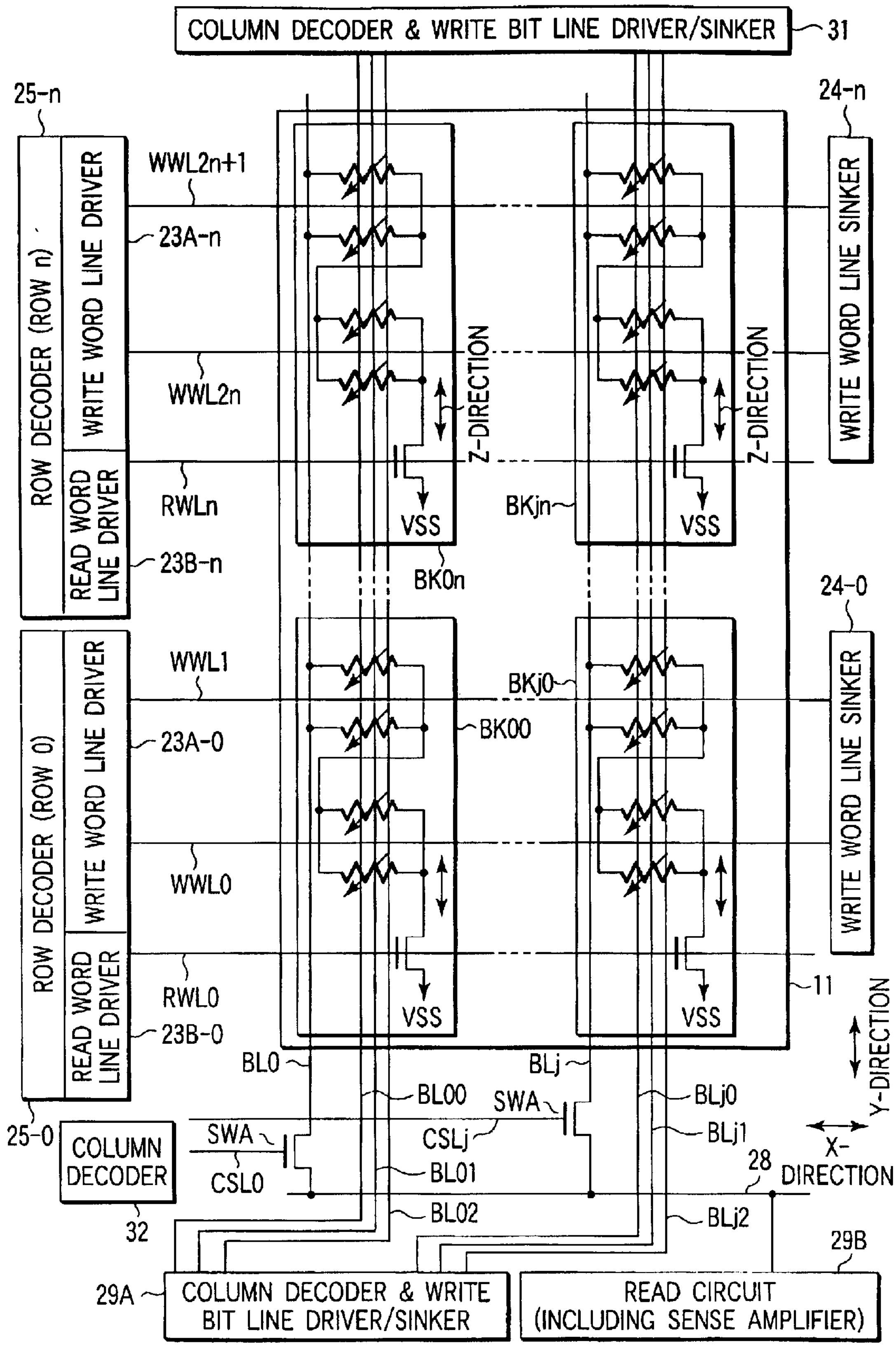
F I G. 222

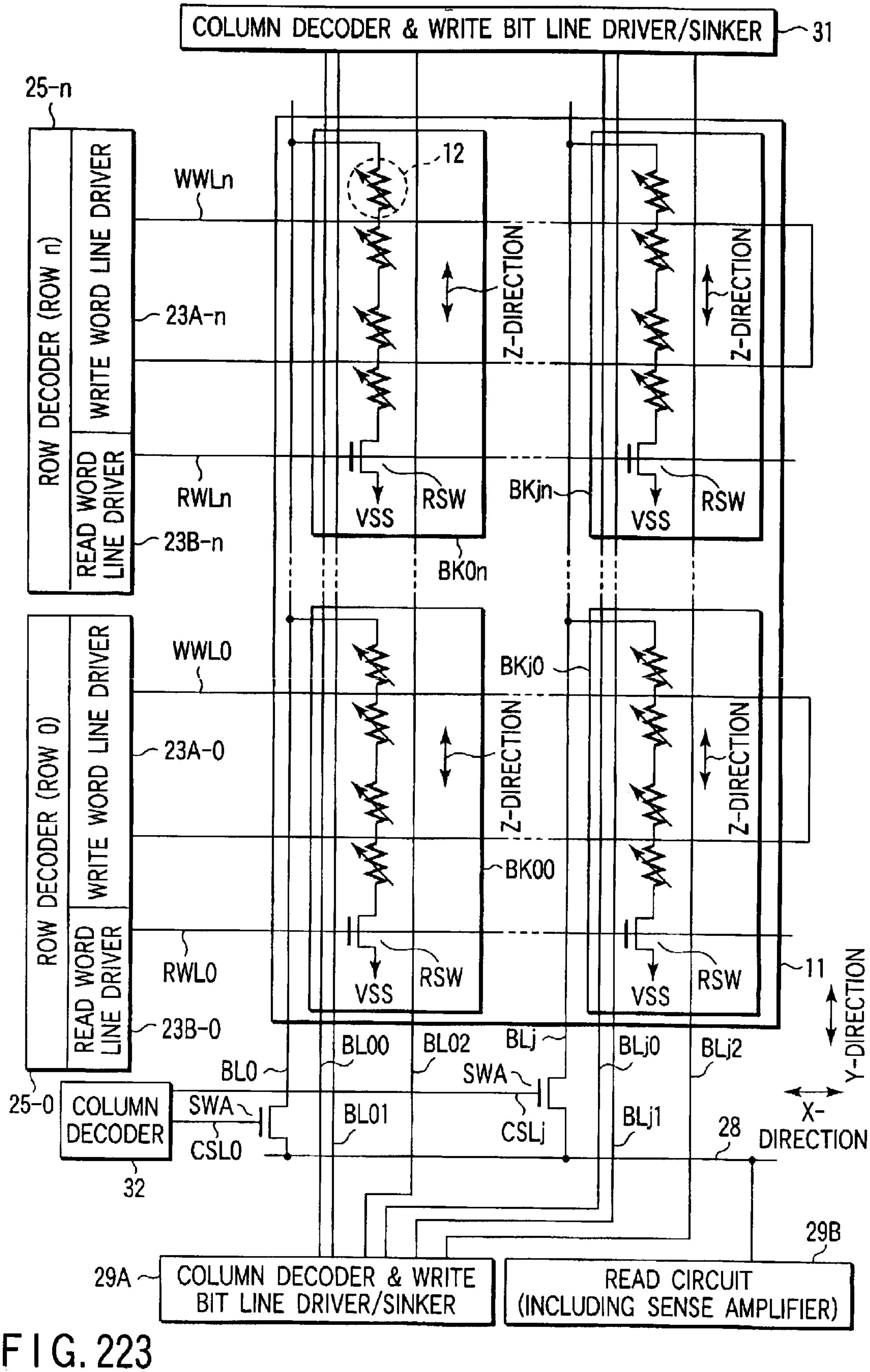
F I G. 223

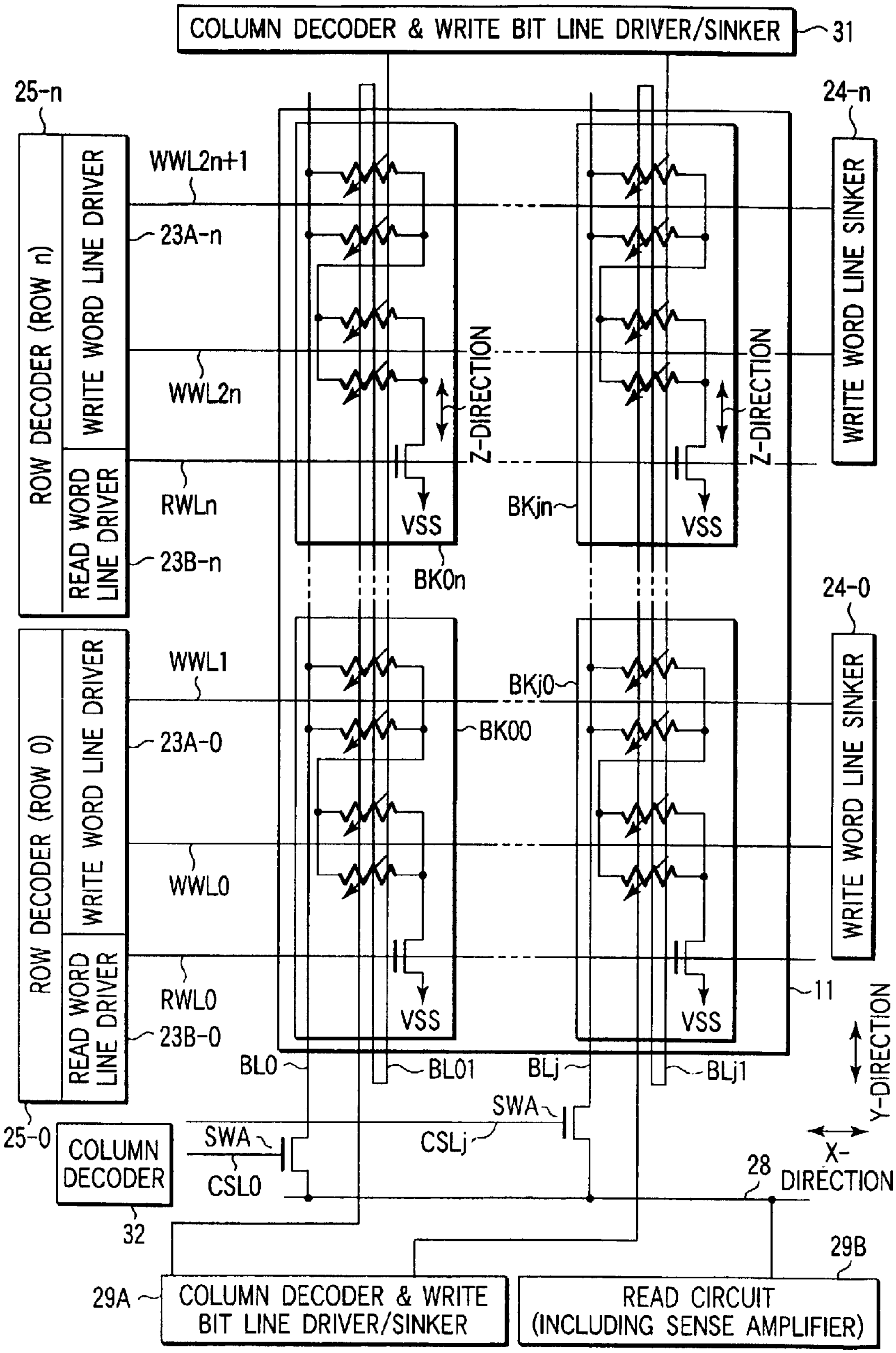
F I G. 228

MAGNETIC RANDOM ACCESS MEMORY

CROSS-REFERENCE TO RELATED APPLICATIONS

This application is based upon and claims the benefit of priority from the prior Japanese Patent Application No. 2001-390670, filed Dec. 21, 2001, the entire contents of which are incorporated herein by reference.

BACKGROUND OF THE INVENTION

1. Field of the Invention

The present invention relates to a magnetic random access memory (MRAM) which stores "1"- and "0"-data using a magnetoresistive effect.

2. Description of the Related Art

In recent years, many memories which store data by new principles have been proposed. One of them is a magnetic random access memory which stores "1"- and "0"-data using a tunneling magnetoresistive (to be referred to as TMR hereinafter) effect.

As a proposal for a magnetic random access memory, for example, Roy Scheuerlein et al, "A 10 ns Read and Write Non-Volatile Memory Array Using a Magnetic Tunnel Junction and FET Switch in each Cell", ISSCC2000 Technical Digest, p. 128 is known.

A magnetic random access memory stores "1"- and "0"-data using TMR elements. As the basic structure of a TMR element, an insulating layer (tunneling barrier) is sandwiched between two magnetic layers (ferromagnetic layers). However, various kinds of TMR element structures have been proposed to, e.g., optimize the MR (MagnetoResistive) ratio.

Data stored in the TMR element is determined on the basis of whether the magnetizing states of the two magnetic layers are parallel or antiparallel. "Parallel" means that the two magnetic layers have the same magnetizing direction. "Antiparallel" means that the two magnetic layers have opposite magnetizing directions.

Normally, one (fixed layer) of the two magnetic layers has an antiferromagnetic layer. The antiferromagnetic layer serves as a member for fixing the magnetizing direction of the fixed layer. In fact, data ("1" or "0") stored in the TMR element is determined by the magnetizing direction of the other (free layer) of the two magnetic layers.

When the magnetizing states in the TMR element are parallel, the tunneling resistance of the insulating layer (tunneling barrier) sandwiched between the two magnetic layers of the TMR element is minimized. For example, this state is defined as a "1"-state. When the magnetizing states in the TMR element are antiparallel, the tunneling resistance of the insulating layer (tunneling barrier) sandwiched between the two magnetic layers of the TMR element is maximized. For example, this state is defined as a "0"-state.

Currently, various kinds of cell array structures have been examined for a magnetic random access memory from the viewpoint of increasing the memory capacity or stabilizing write/read operation.

For example, currently, a cell array structure in which one memory cell is formed from one MOS transistor and one TMR element (or an MTJ (Magnetic Tunnel Junction) element) is known. Additionally, a magnetic random access memory which has such a cell array structure and stores 1-bit data using two memory cell arrays so as to realize stable read operation is also known.

However, in these magnetic random access memories, it is difficult to increase the memory capacity. This is because one MOS transistor corresponds to one TMR element in these cell array structures.

BRIEF SUMMARY OF THE INVENTION (1) According to a first aspect of the present invention, there is provided a magnetic random access memory comprising: a plurality of memory cells which are stacked one another and connected in series to store data using a magnetoresistive effect; a bit line which is connected to one terminal of each of the plurality of memory cells and extends in a first direction; and a read circuit connected to the bit line.

According to a second aspect of the present invention, there is provided a magnetic random access memory comprising: a plurality of memory cells which are stacked one another and connected in parallel to store data using a magnetoresistive effect; a bit line which is connected to one terminal of each of the plurality of memory cells and extends in a first direction; and a read circuit connected to the bit line.

According to a third aspect of the present invention, there is provided a magnetic random access memory comprising: a plurality of memory cells which are stacked one another and formed by combining series connection and parallel connection to store data using a magnetoresistive effect; a bit line which is connected to one terminal of each of the plurality of memory cells and extends in a first direction; and a read circuit connected to the bit line.

(2) According to an aspect of the present invention, there is provided a manufacturing method of a magnetic random access memory, comprising: forming a read select switch on a surface region of a semiconductor substrate; forming a first write line extending in a first direction on the read select switch; forming a first MTJ element right above the first write line; forming a second write line extending in a second direction perpendicular to the first direction right above the first MTJ element; forming, right above the second write line, a second MTJ element which is symmetrical to the first MTJ element with respect to the second write line; forming a third write line extending in the first direction right above the second MTJ element; forming, right above the third write line, a third MTJ element which is symmetrical to the second MTJ element with respect to the third write line; forming a fourth write line extending in the second direction right above the third MTJ element; forming, right above the fourth write line, a fourth MTJ element which is symmetrical to the third MTJ element with respect to the fourth write line; forming a fifth write line extending in the first direction immediately on the fourth MTJ element; and forming a read bit line extending on the second direction on the fifth write line.

BRIEF DESCRIPTION OF THE SEVERAL VIEWS OF THE DRAWING

FIG. 1 is a circuit diagram related to Structural Example 1 of a magnetic random access memory of the present invention;

FIG. 2 is a sectional view related to Structural Example 1 of the magnetic random access memory of the present invention;

FIG. 3 is a sectional view related to Structural Example 1 of the magnetic random access memory of the present invention;

FIG. 7 is a sectional view showing the second modification to Structural Example 1;

FIG. 8 is a circuit diagram related to Structural Example 2 of the magnetic random access memory of the present invention;

FIG. 9 is a sectional view related to Structural Example 2 of the magnetic random access memory of the present invention;

FIG. 10 is a sectional view related to Structural Example 2 of the magnetic random access memory of the present invention;

FIG. 12 is a plan view showing the first modification to Structural Example 2;

FIG. 13 is a circuit diagram showing a second modification to Structural Example 2;

FIG. 14 is a sectional view showing the second modification to Structural Example 2;

FIG. 17 is a circuit diagram related to Structural Example 3 of the magnetic random access memory of the present invention;

FIG. 20 is a sectional view showing the first modification to Structural Example 3;

FIG. 21 is a circuit diagram showing a second modification to Structural Example 3;

FIG. 22 is a sectional view showing the second modification to Structural Example 3;

FIG. 24 is a circuit diagram related to Structural Example 4 of the magnetic random access memory of the present invention;

FIG. 25 is a circuit diagram related to Structural Example 4 of the magnetic random access memory of the present invention;

FIG. 29 is a circuit diagram related to Structural Example 5 of the magnetic random access memory of the present invention;

FIG. 32 is a sectional view showing a modification to Structural Example 5;

FIG. 33 is a view showing an equivalent circuit of Structural Example 1 in read operation;

FIG. 34 is a view showing another equivalent circuit of Structural Example 1 in read operation;

FIG. 37 is a view showing another equivalent circuit of Structural Example 2 in read operation;

FIG. 38 is a view showing still another equivalent circuit of Structural Example 2 in read operation;

FIG. 50 is a view showing another structural example of the second TMR element;

FIG. 51 is a view showing another structural example of the third TMR element;

FIG. 54 is a view showing Circuit Example 2 of the read circuit according to the present invention;

FIG. 58 is a view showing another example of the differential amplifier in the sense amplifier;

FIG. 59 is a view showing another example of the sense amplifier;

FIG. 60 is a view showing an example of an operational amplifier in the read circuit;

FIG. 61 is a view showing another example of the operational amplifier in the read circuit;

FIG. 62 is a circuit diagram showing an example of an added current generating section;

FIG. 67 is a view showing a logic circuit which determines the data value of the first TMR element;

FIG. 68 is a view showing a circuit example of a write word line driver/sinker;

FIG. 69 is a view showing a circuit example of a write bit line driver/sinker;

FIG. 72 is a view showing another circuit example of the write word line driver/sinker;

FIG. 75 is a view showing TMR elements arranged symmetrically with respect to a write line;

FIG. 76 is a view showing TMR elements arranged symmetrically with respect to a write line;

FIG. 77 is a view showing TMR elements arranged symmetrically with respect to a write line;

FIG. 79 is a view showing TMR elements arranged symmetrically with respect to a write line;

FIG. 81 is a view showing a device structure to which Manufacturing Method 1 of the present invention is applied;

FIG. 84 is a plan view showing one step in Manufacturing Method 1 of the present invention;

FIG. 89 is a sectional view showing one step in Manufacturing Method 1 of the present invention;

FIG. 90 is a sectional view showing one step in Manufacturing Method 1 of the present invention;

FIG. 97 is a sectional view showing one step in Manufacturing Method 1 of the present invention;

FIG. 98 is a sectional view showing one step in Manufacturing Method 1 of the present invention;

FIG. 105 is a sectional view showing one step in Manufacturing Method 1 of the present invention;

FIG. 108 is a plan view showing one step in Manufacturing Method 1 of the present invention;

FIG. 117 is a sectional view taken along a line CXVII—CXVII in FIG. 116;

FIG. 120 is a sectional view taken along a line CXX—CXX in FIG. 119;

FIG. 121 is a sectional view showing one step in Manufacturing Method 1 of the present invention;

FIG. 122 is a sectional view showing one step in Manufacturing Method 1 of the present invention;

FIG. 123 is a plan view showing one step in Manufacturing Method 1 of the present invention;

FIG. 124 is a sectional view taken along a line CXXIV—CXXIV in FIG. 123;

FIG. 125 is a plan view showing one step in Manufacturing Method 1 of the present invention;

FIG. 126 is a sectional view taken along a line CXXVI—CXXVI in FIG. 125;

FIG. 127 is a view showing a device structure to which Manufacturing Method 2 of the present invention is applied;

FIG. 128 is a sectional view showing one step in Manufacturing Method 2 of the present invention;

FIG. 129 is a sectional view showing one step in Manufacturing Method 2 of the present invention;

FIG. 130 is a plan view showing one step in Manufacturing Method 2 of the present invention;

FIG. 131 is a sectional view taken along a line CXXXI—CXXXI in FIG. 130;

Figure 132:
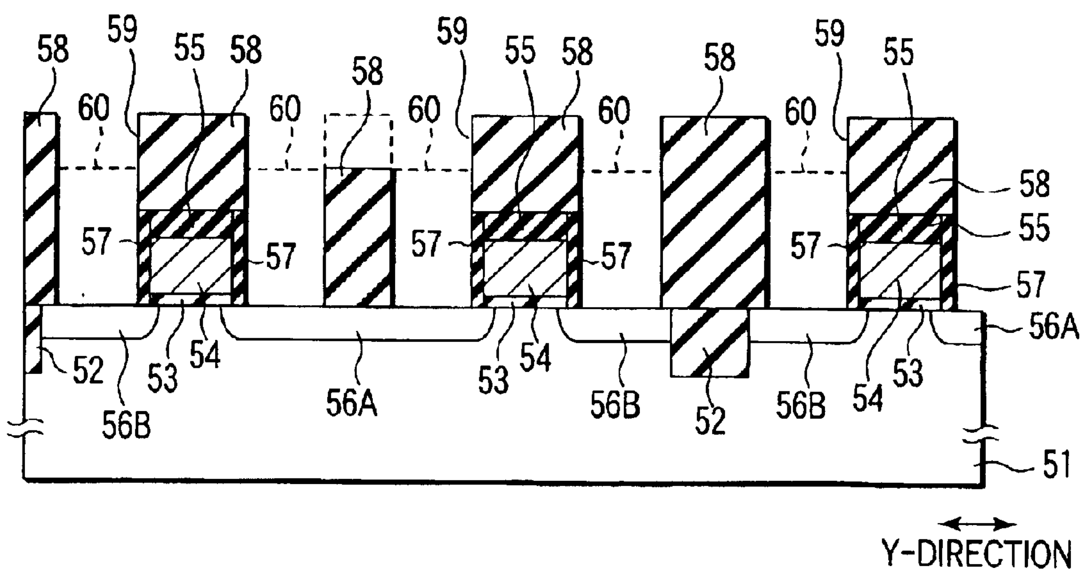
Figure 135:
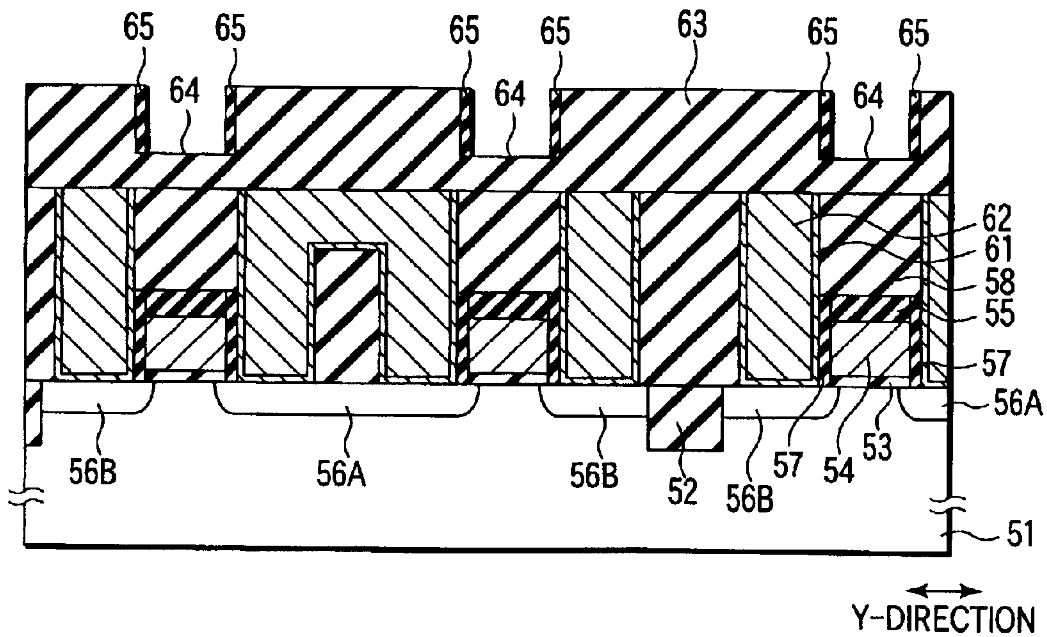
Figure 136:
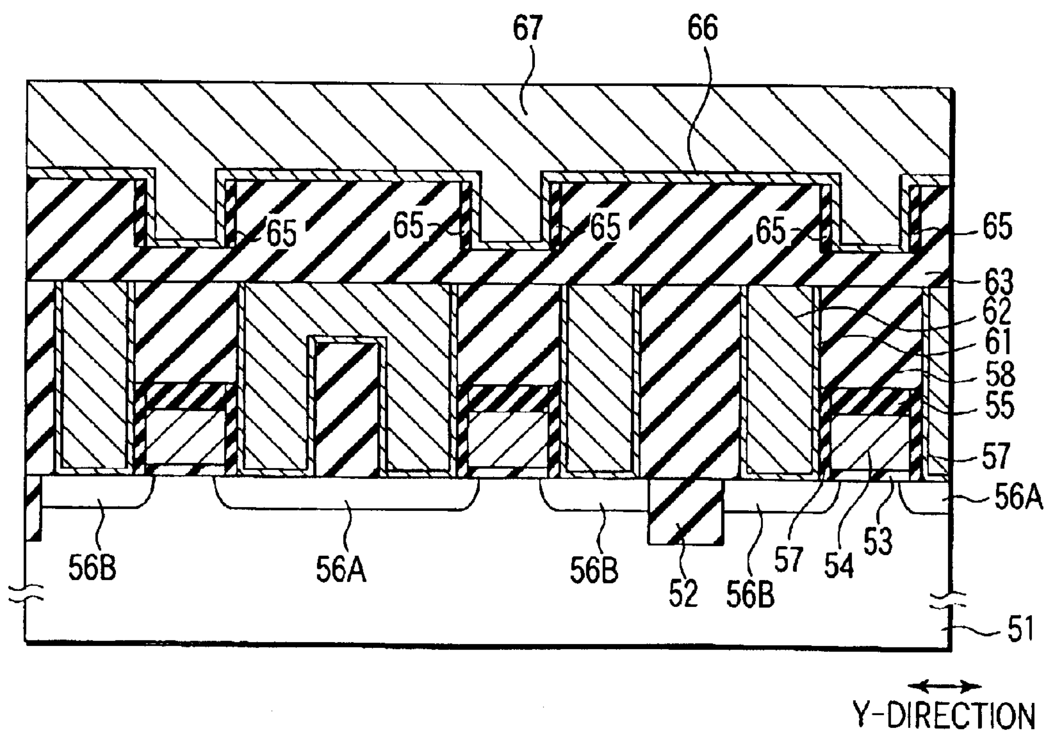
Figure 139:
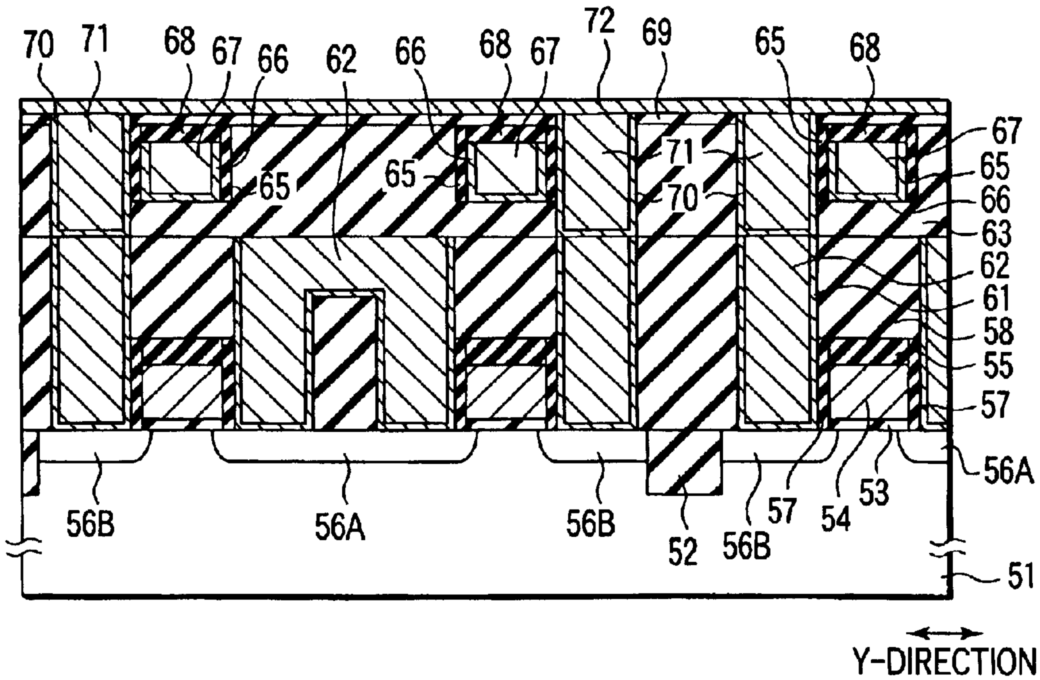
Figure 140:
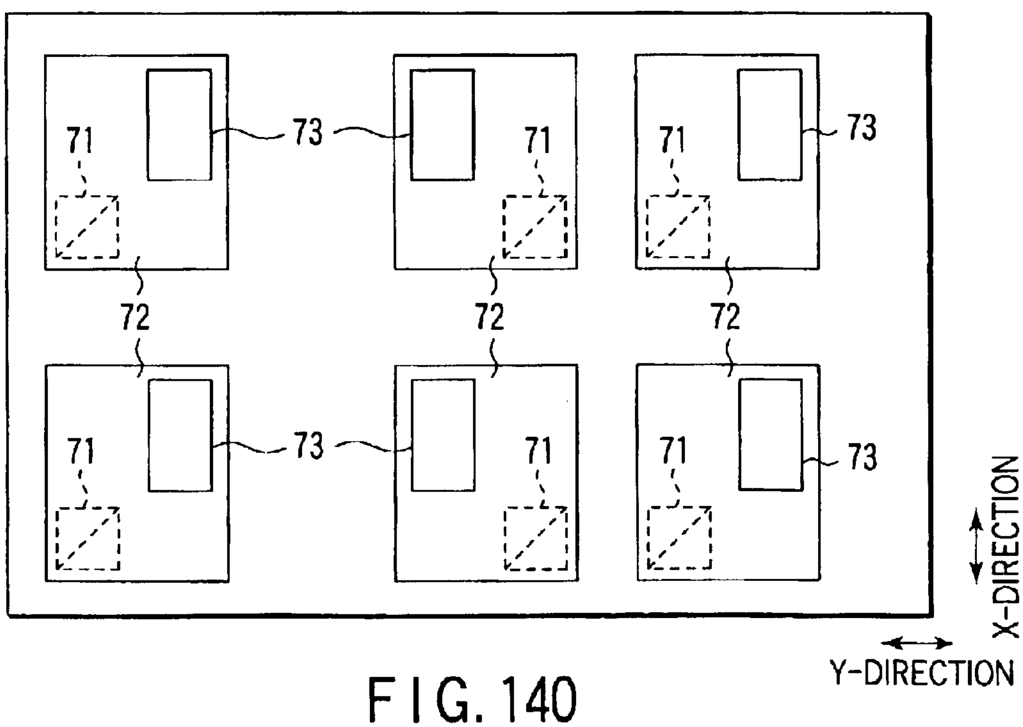
Figure 141:
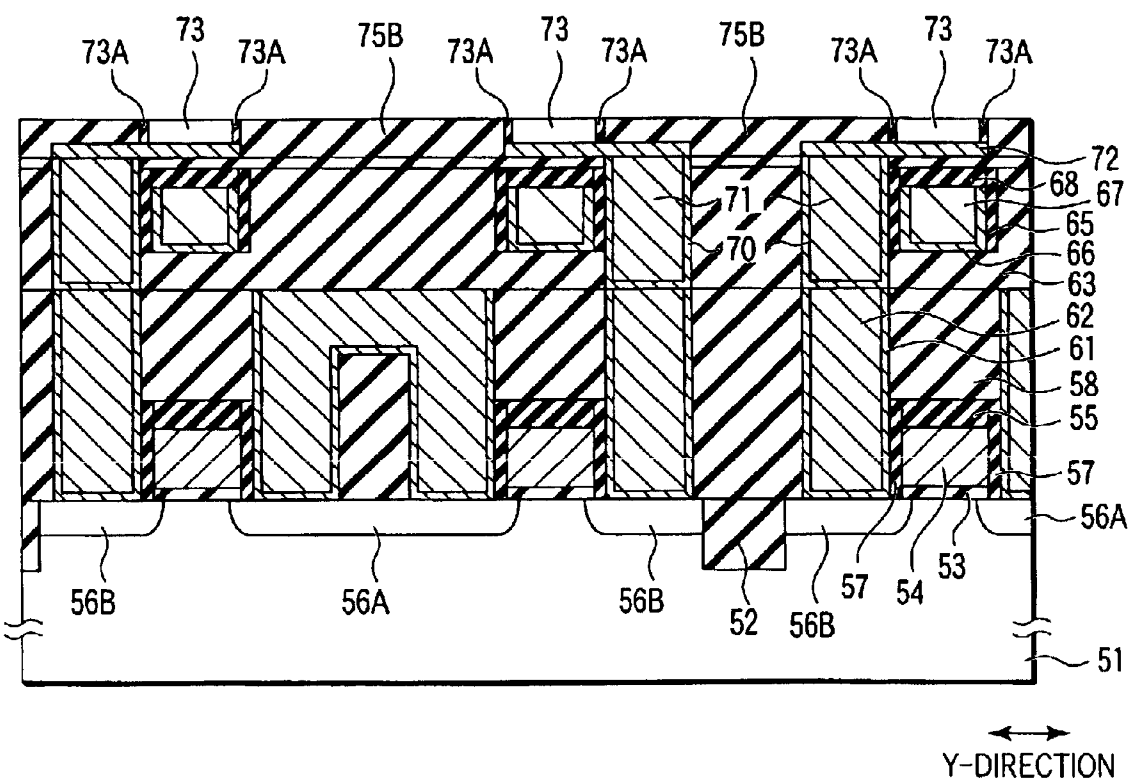
Figure 144:
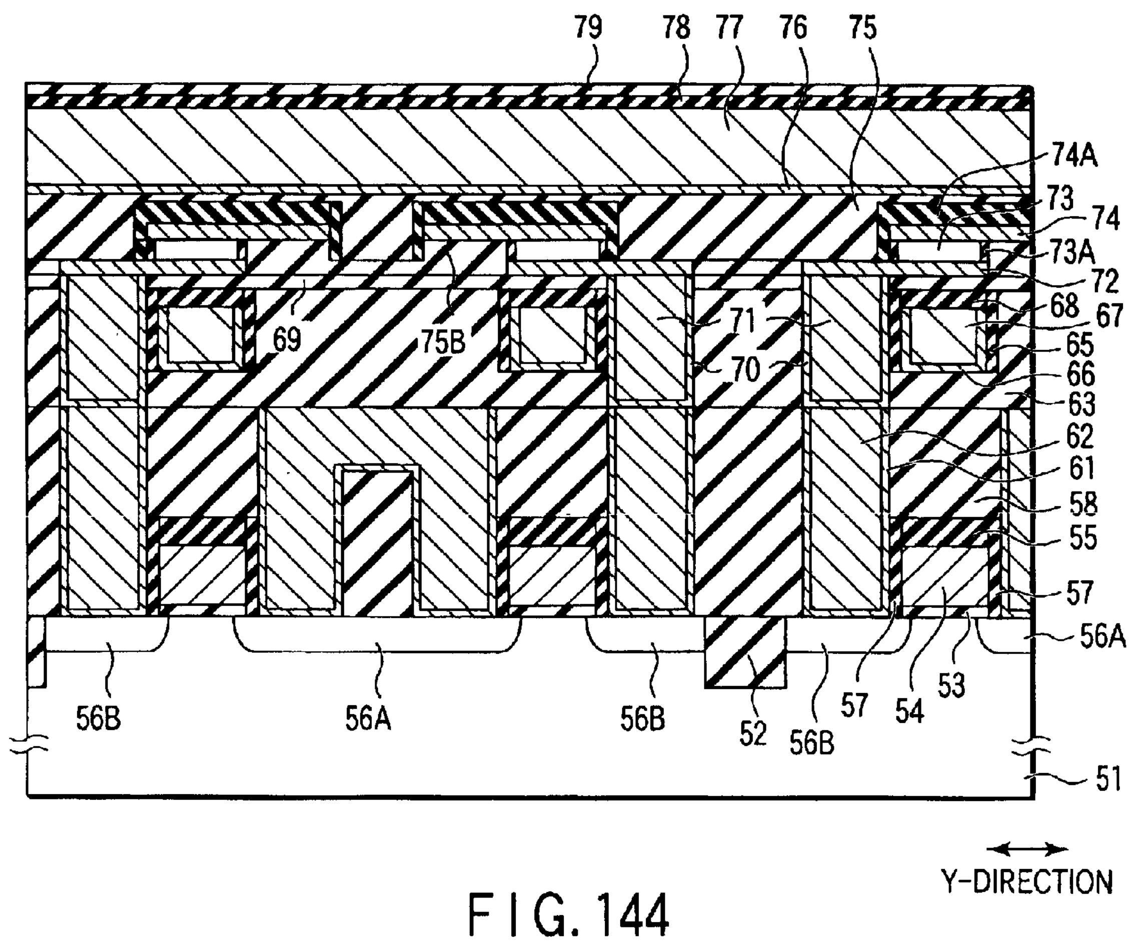
Figure 145:
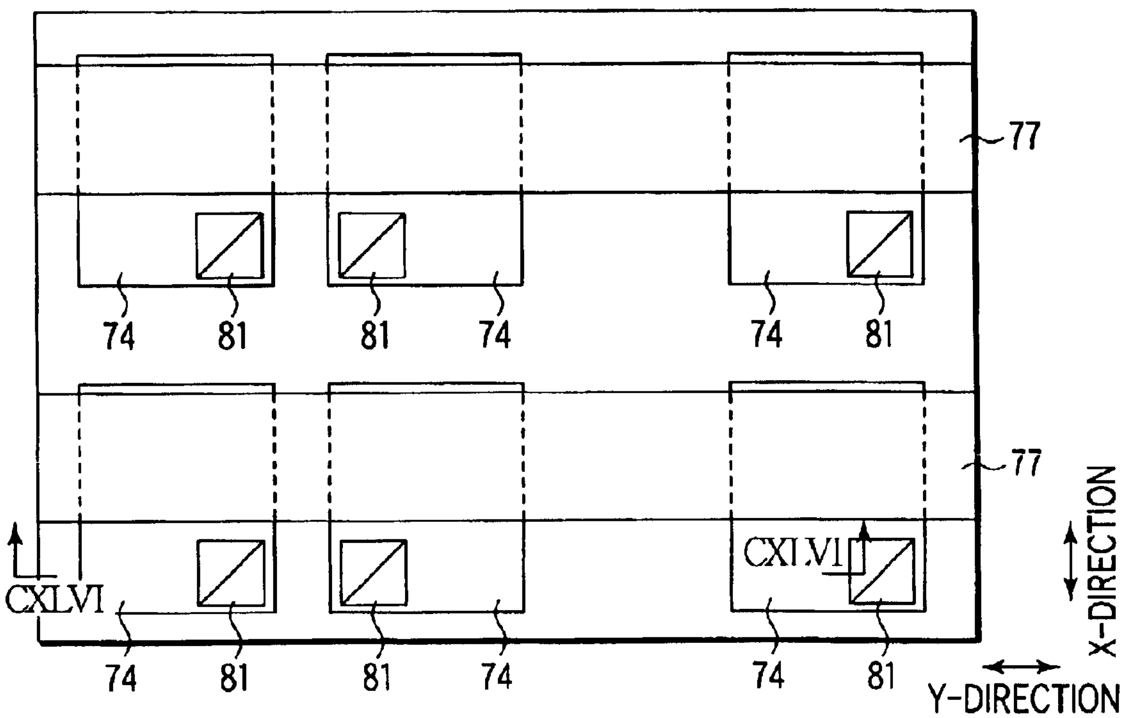
Figure 146:
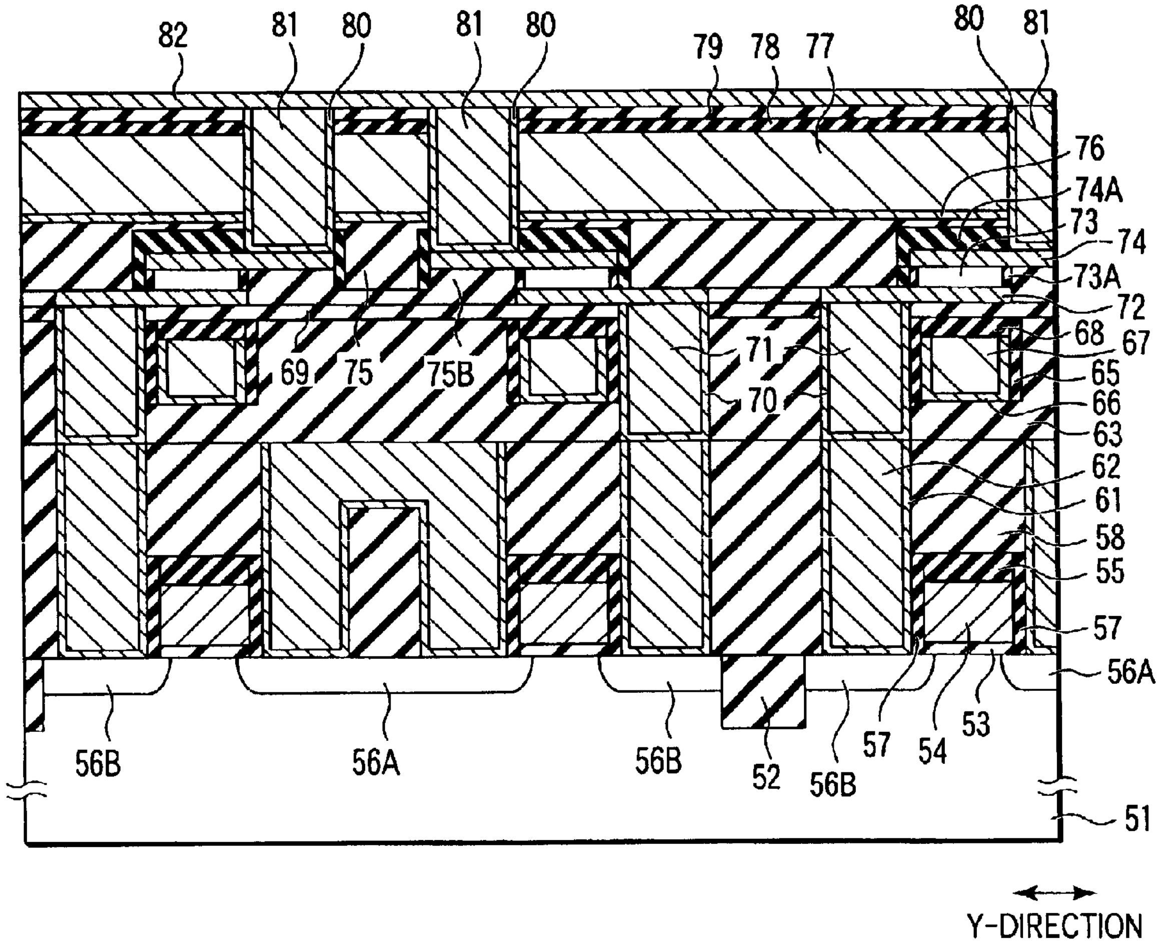
Figure 150:
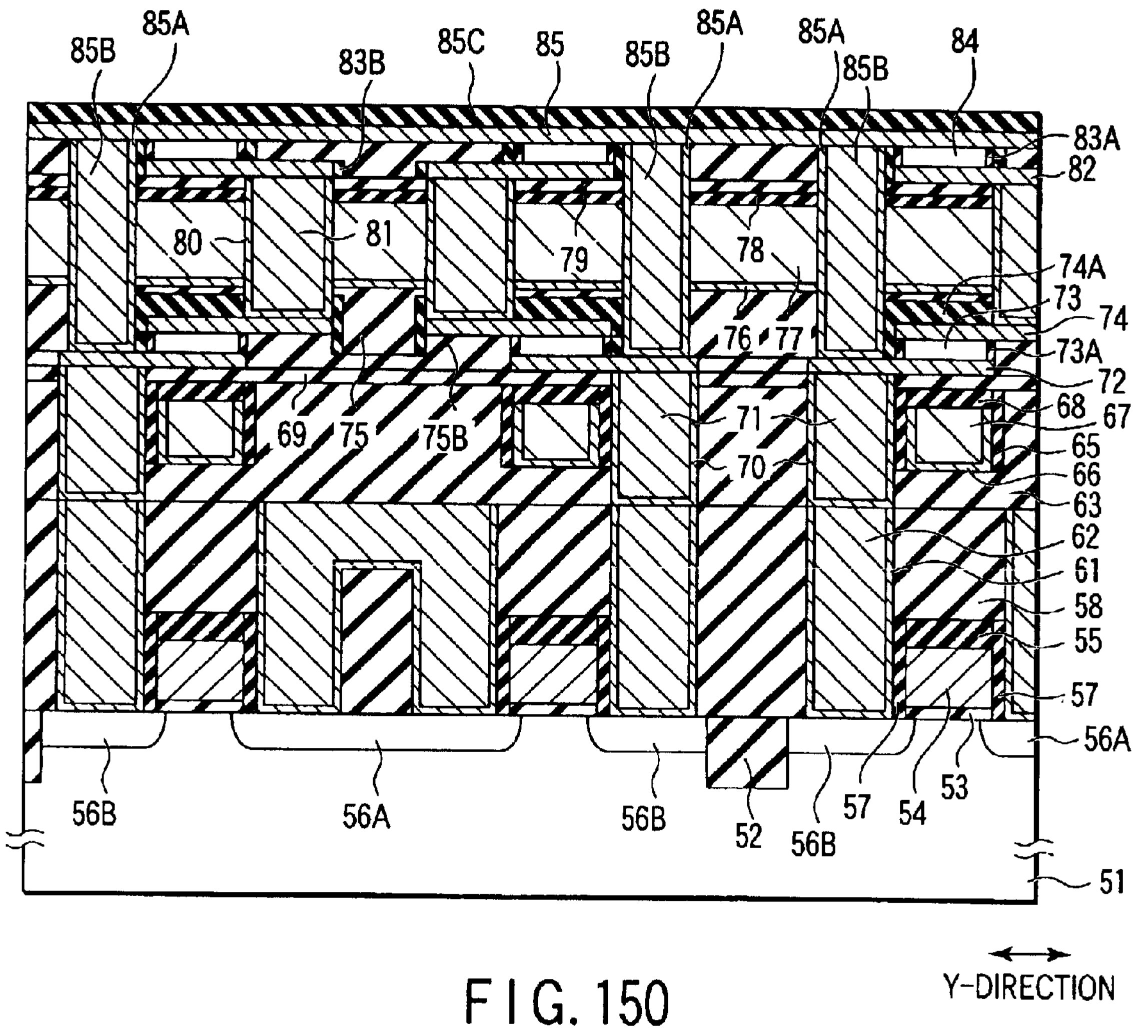
Figure 151:
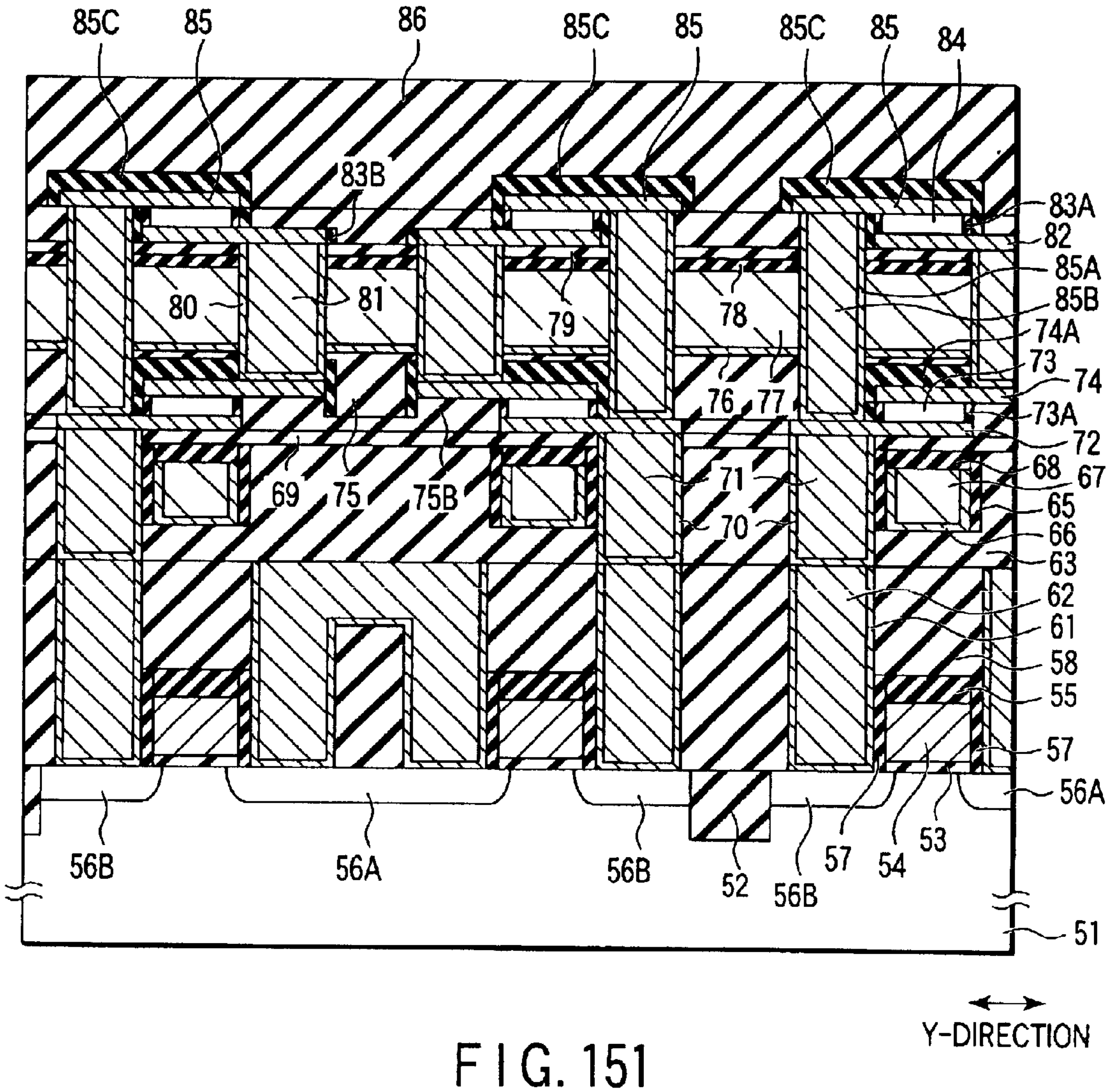
Figure 152:
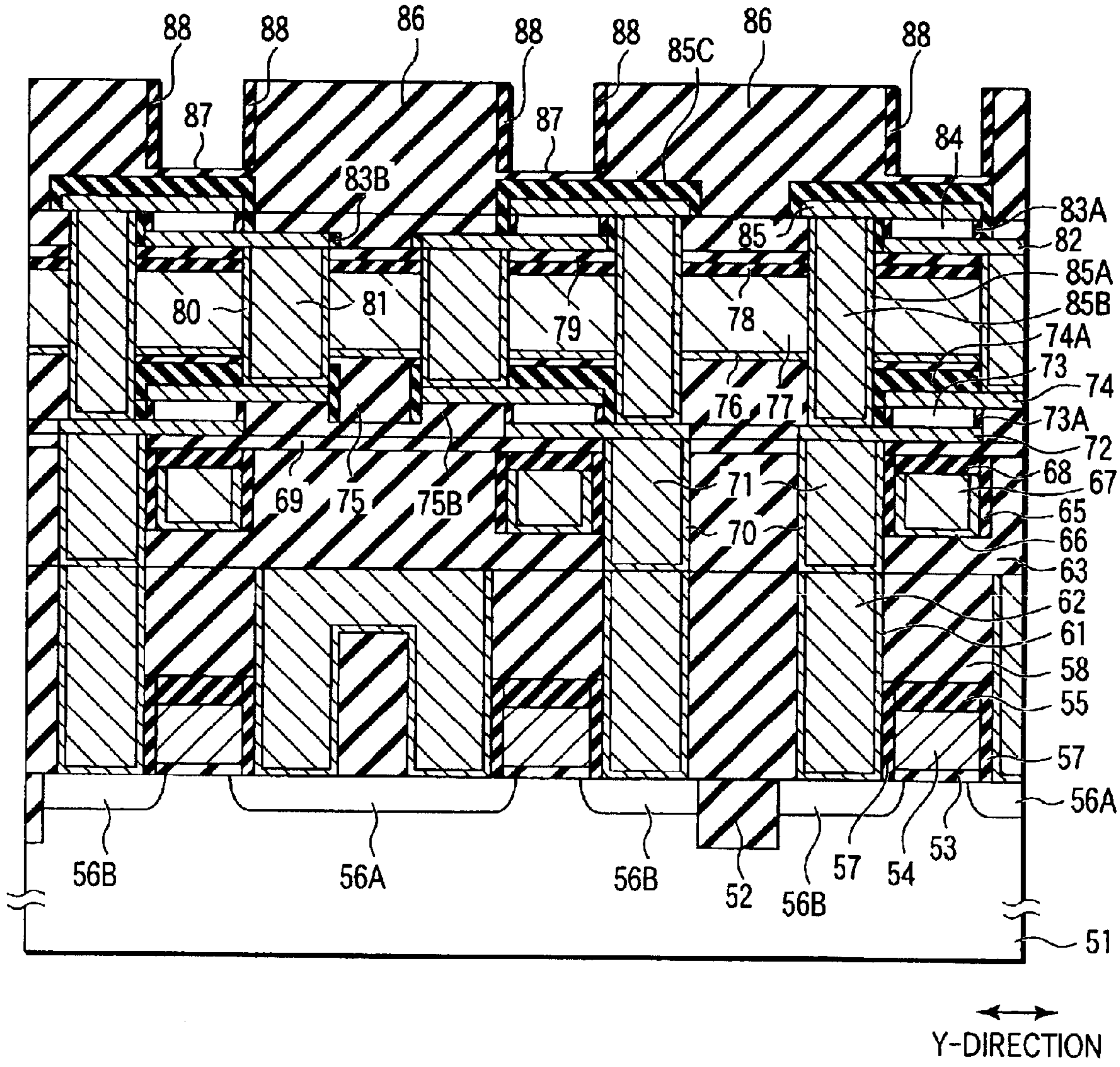
Figure 153:
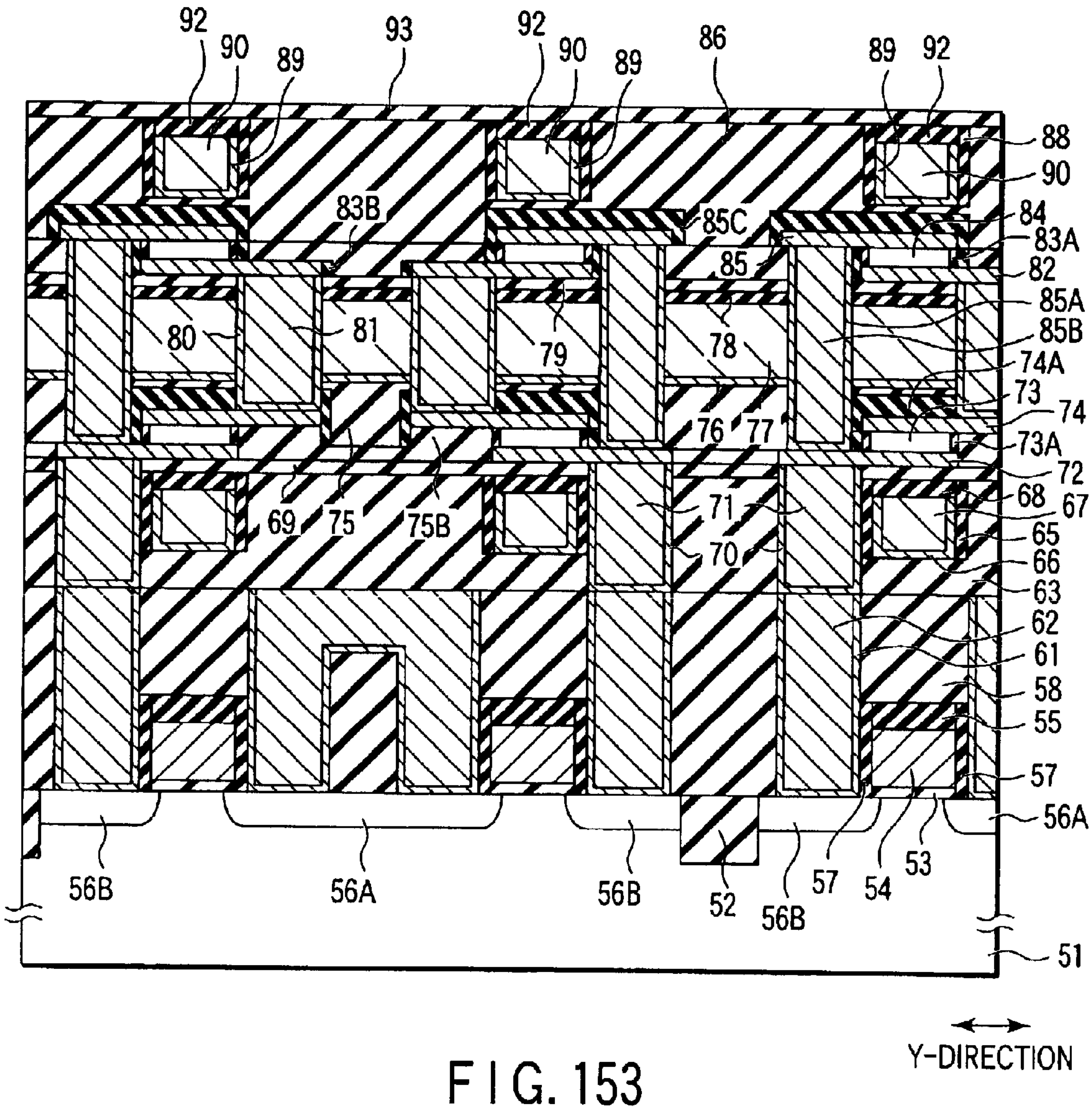
Figure 154:
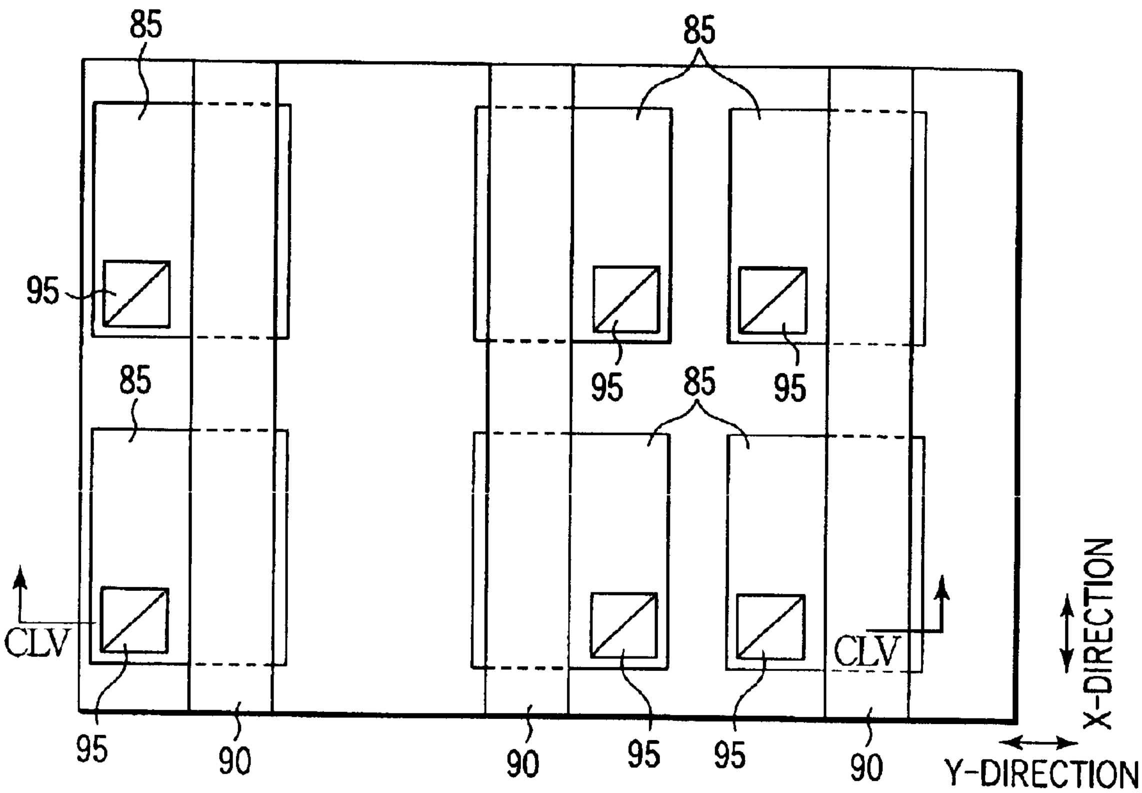
Figure 155:
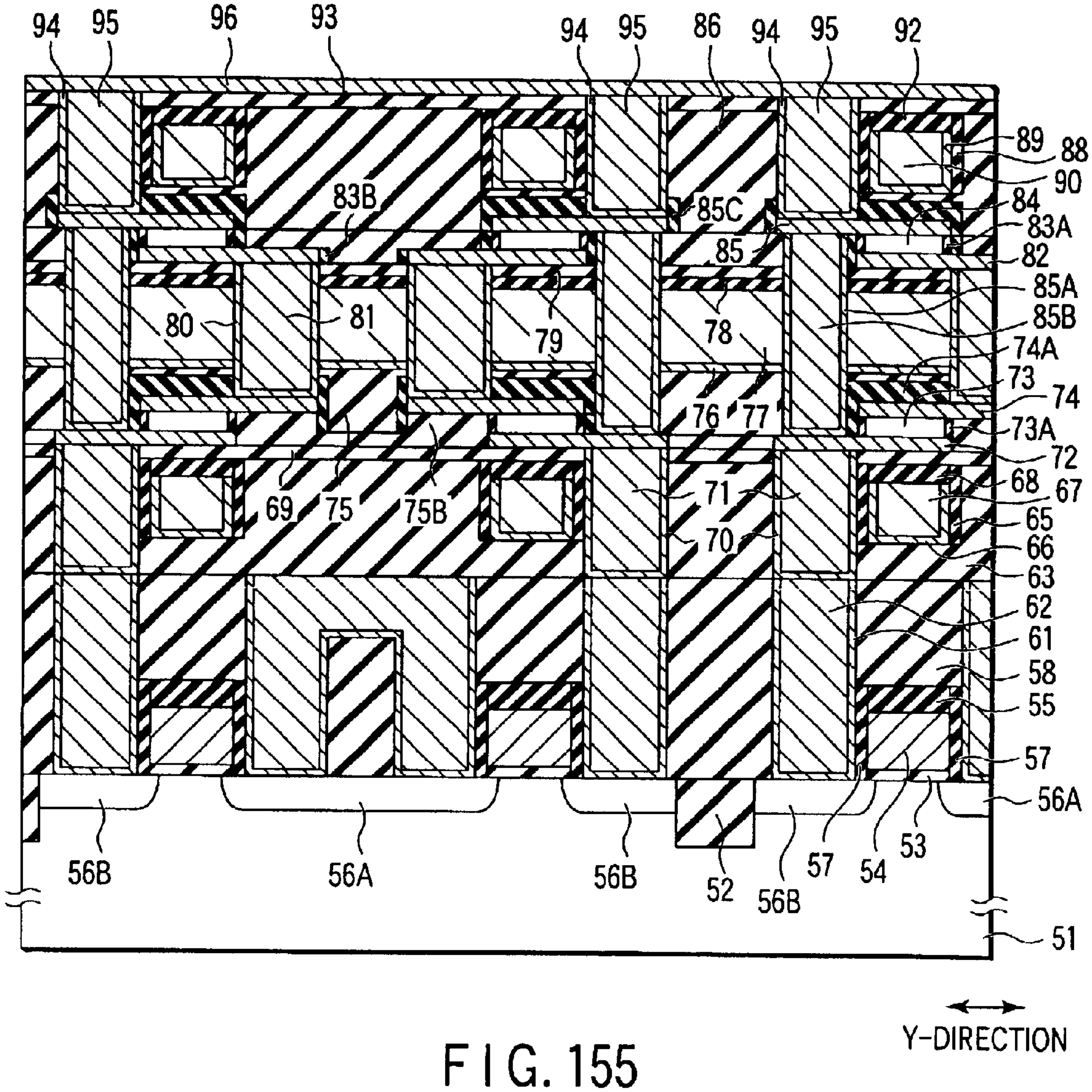
Figure 156:
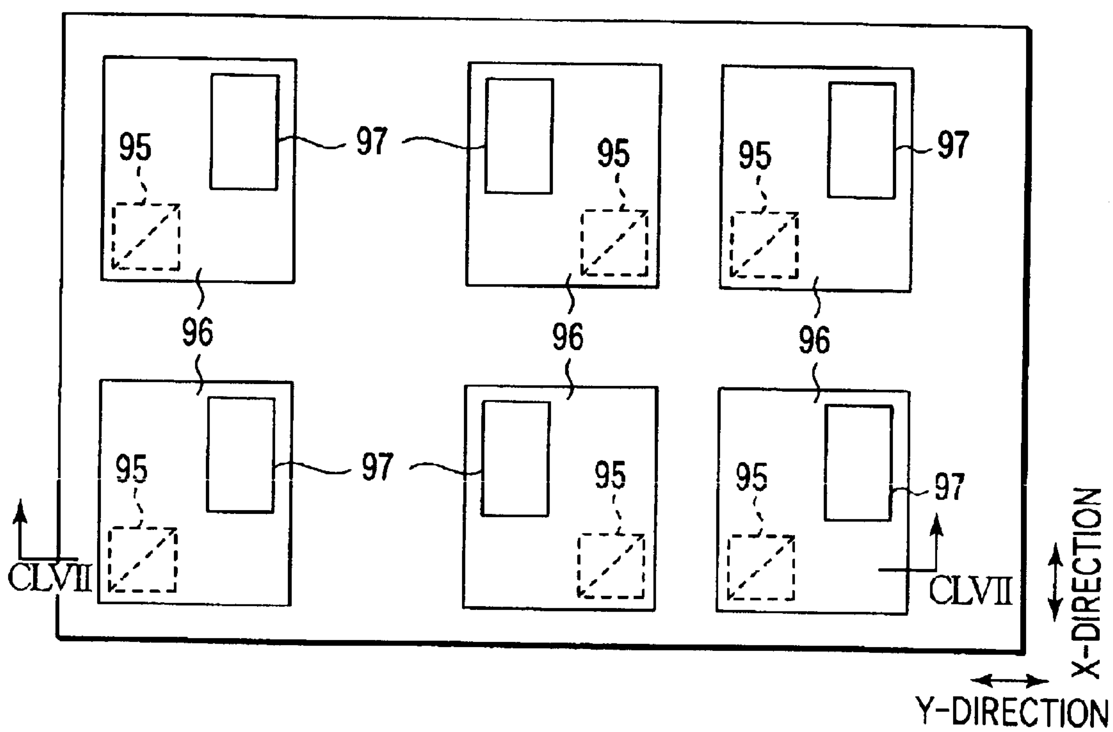
Figure 157:
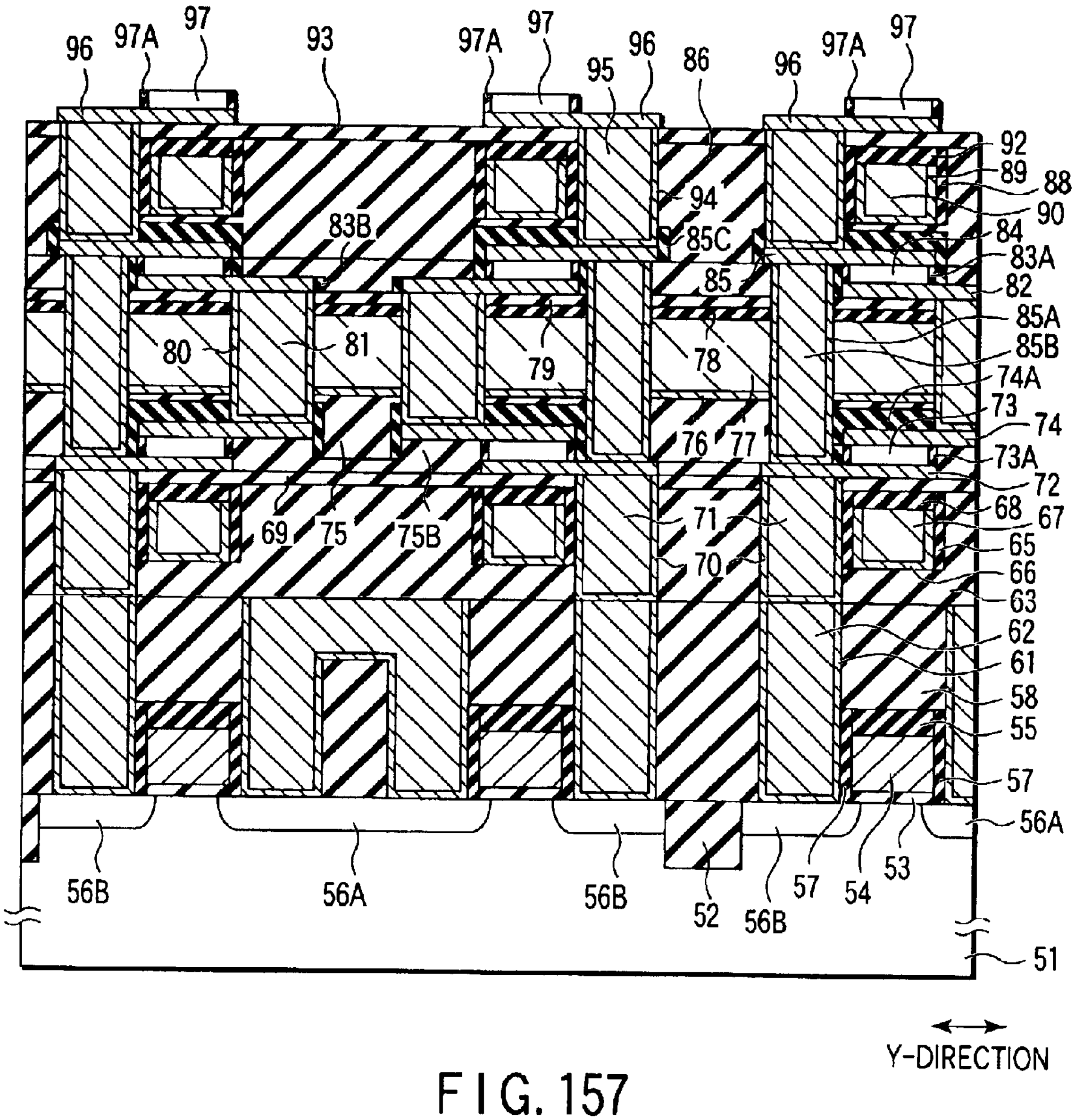
Figure 158:
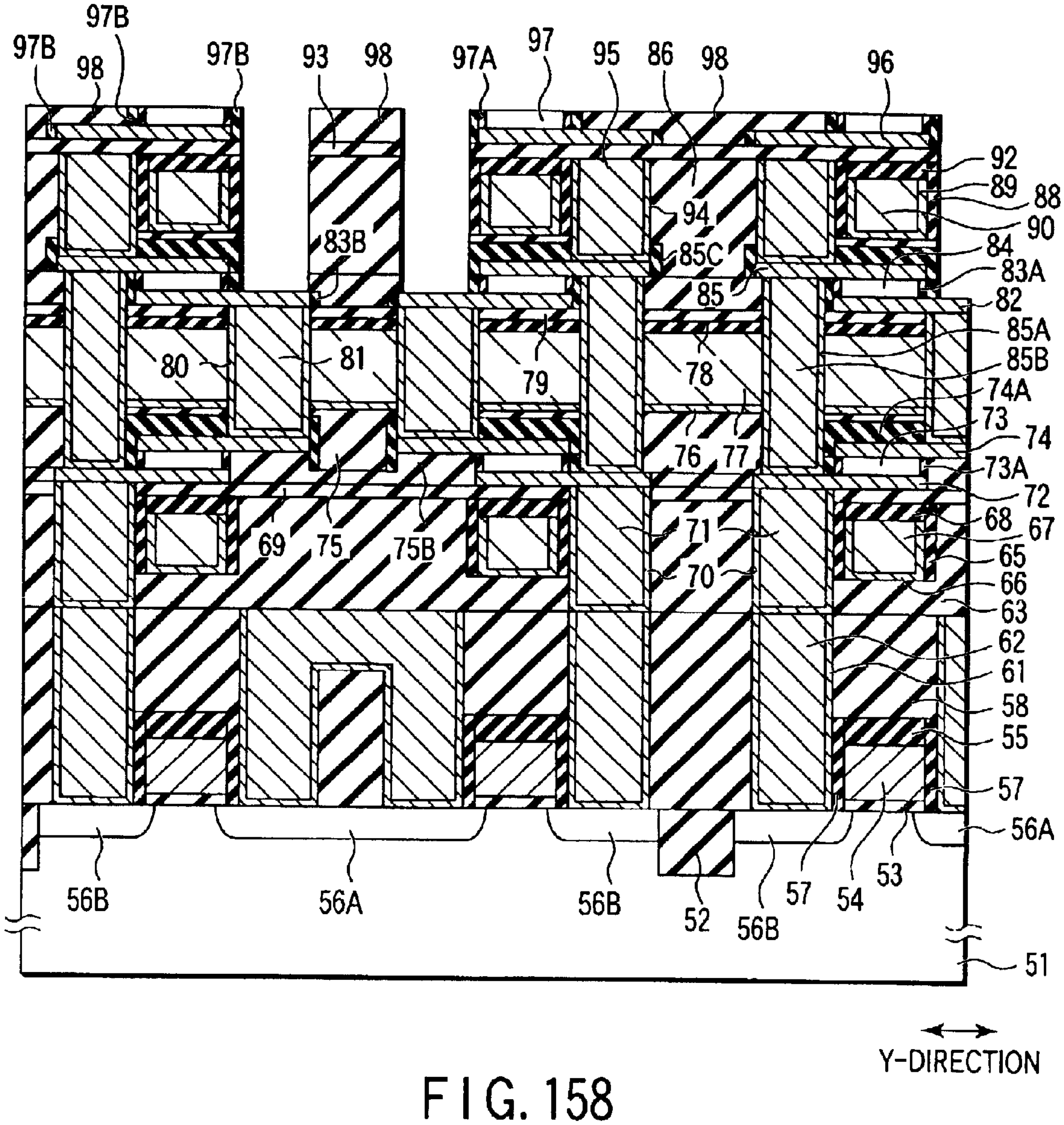
Figure 159:
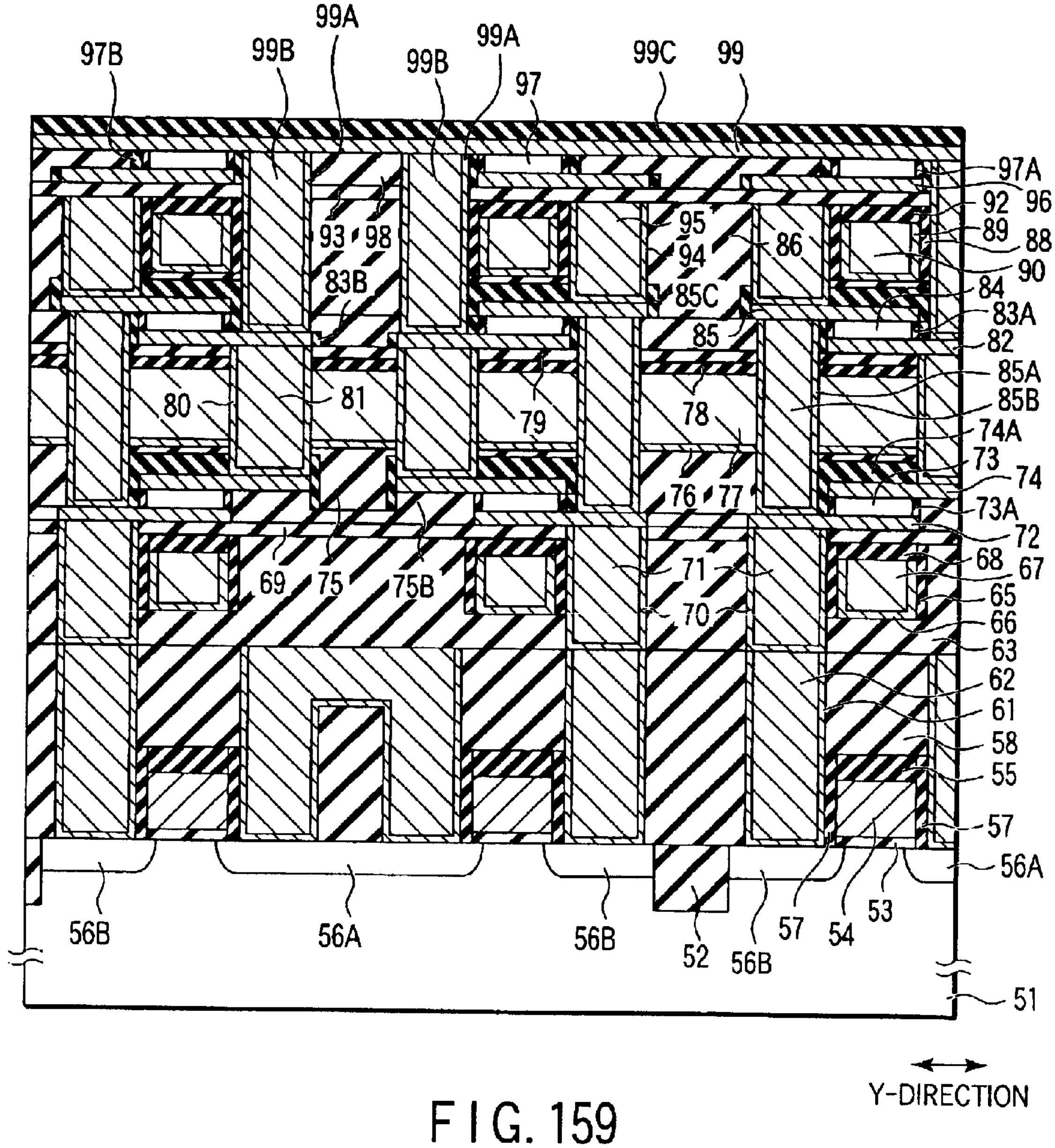
Figure 160:
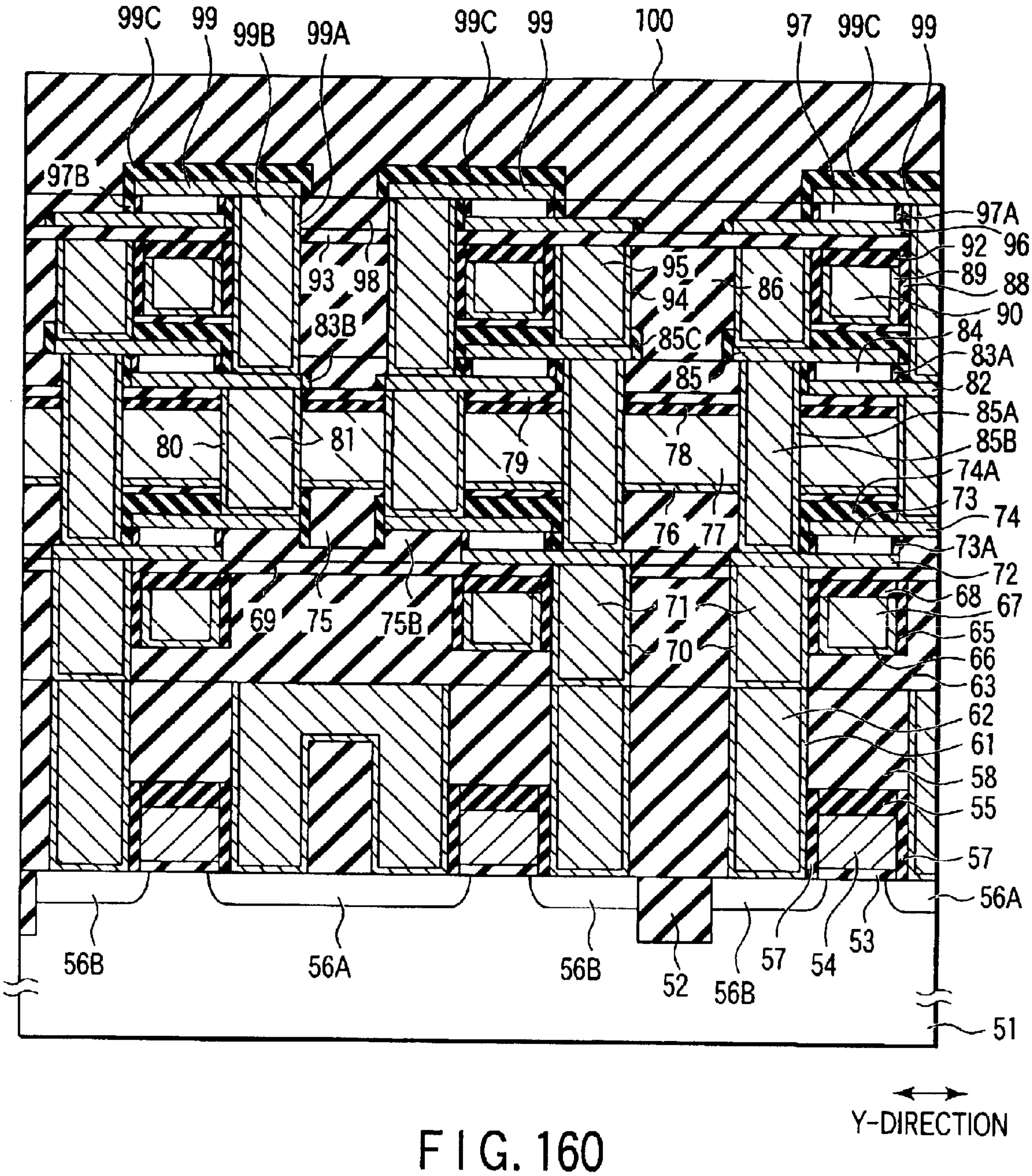
Figure 162:
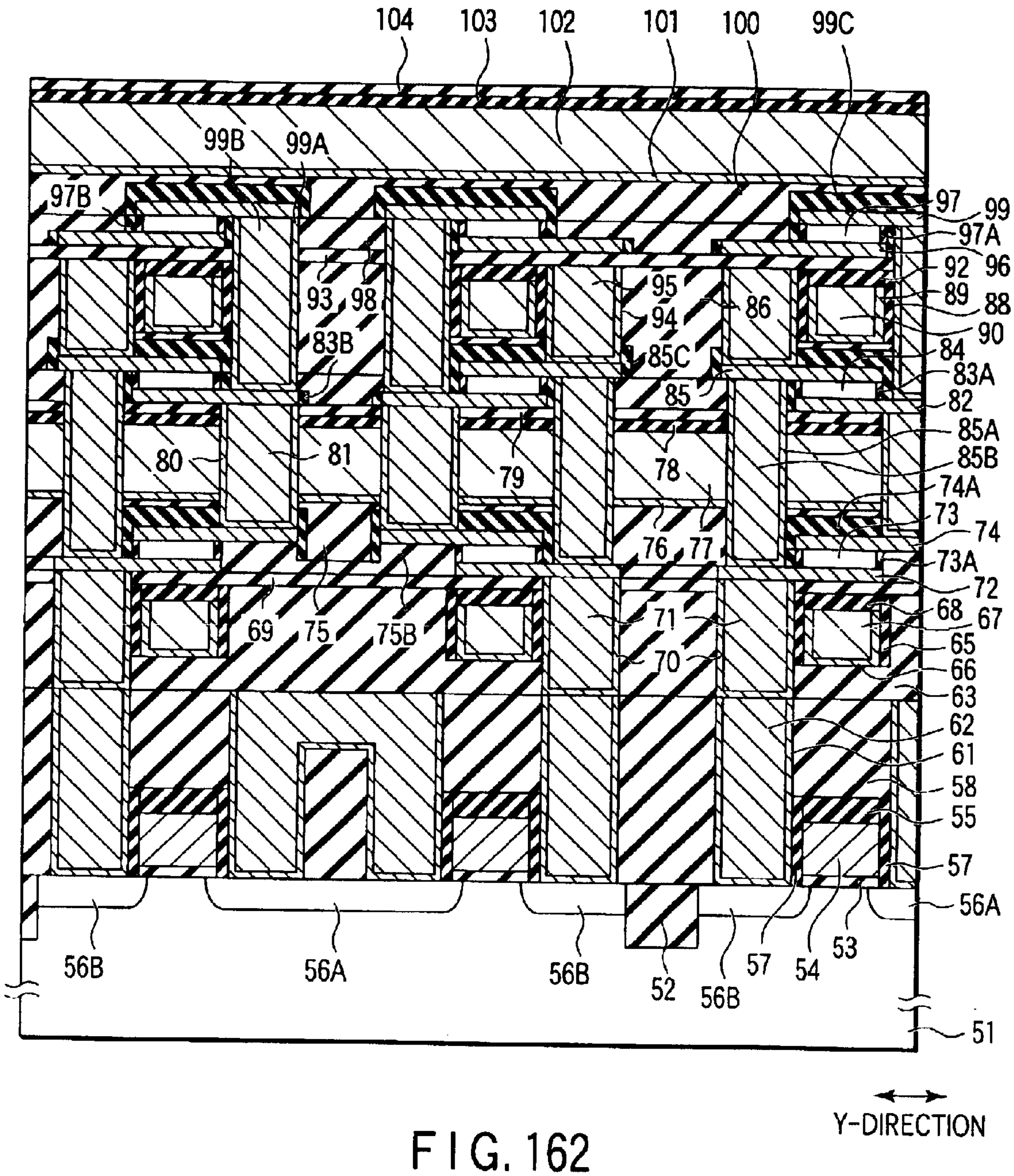
Figure 164:
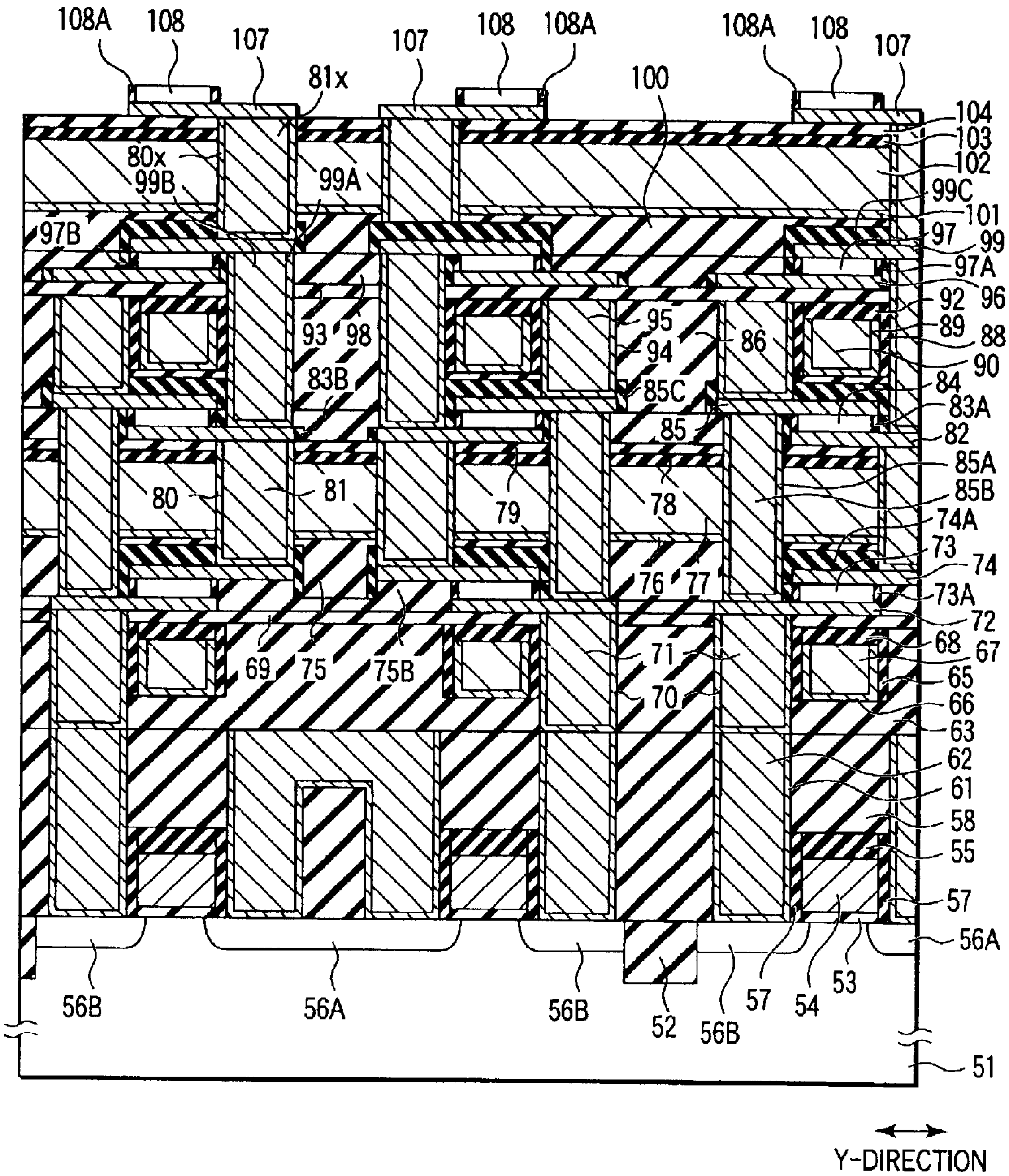
Figure 165:
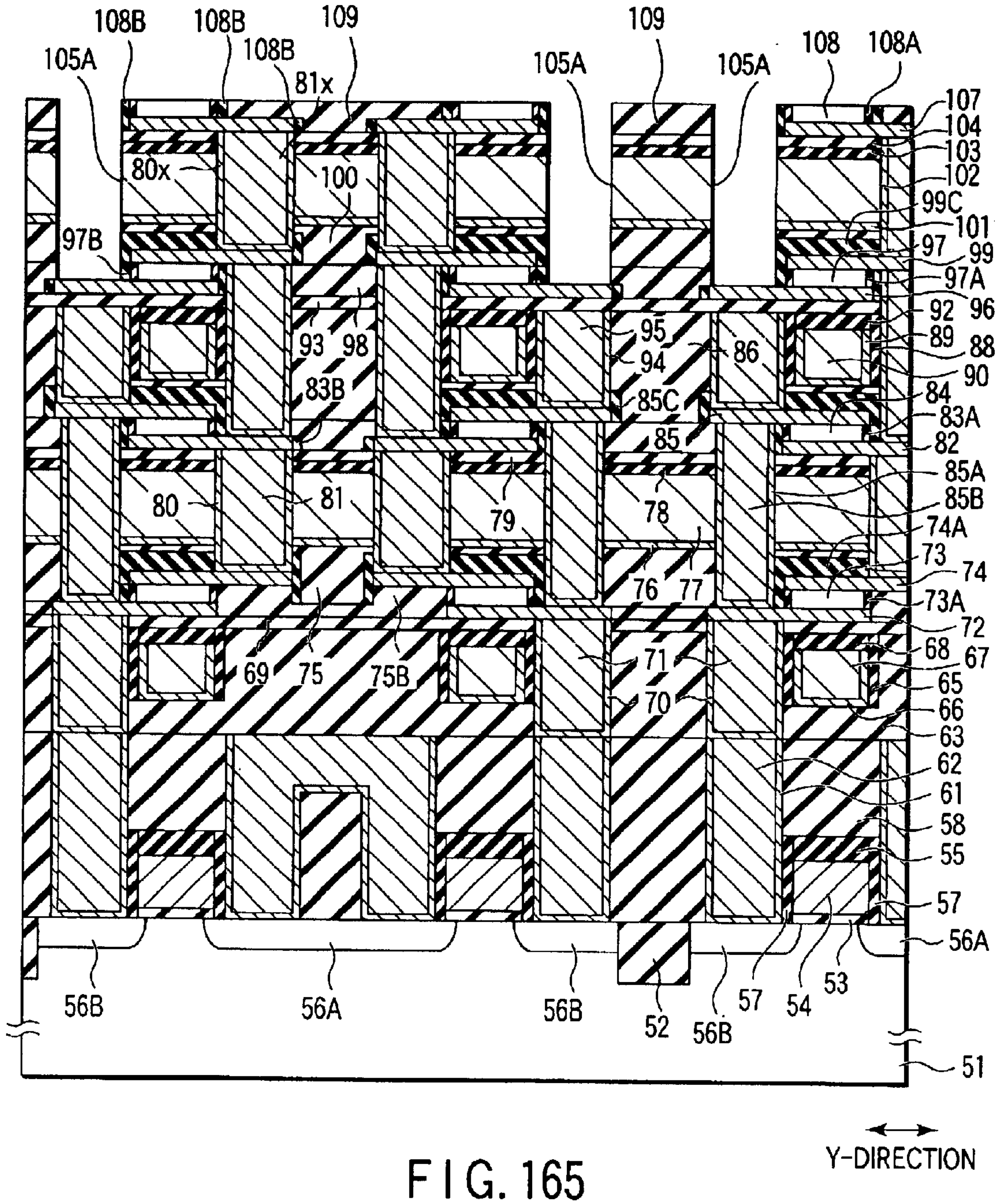
Figure 166:
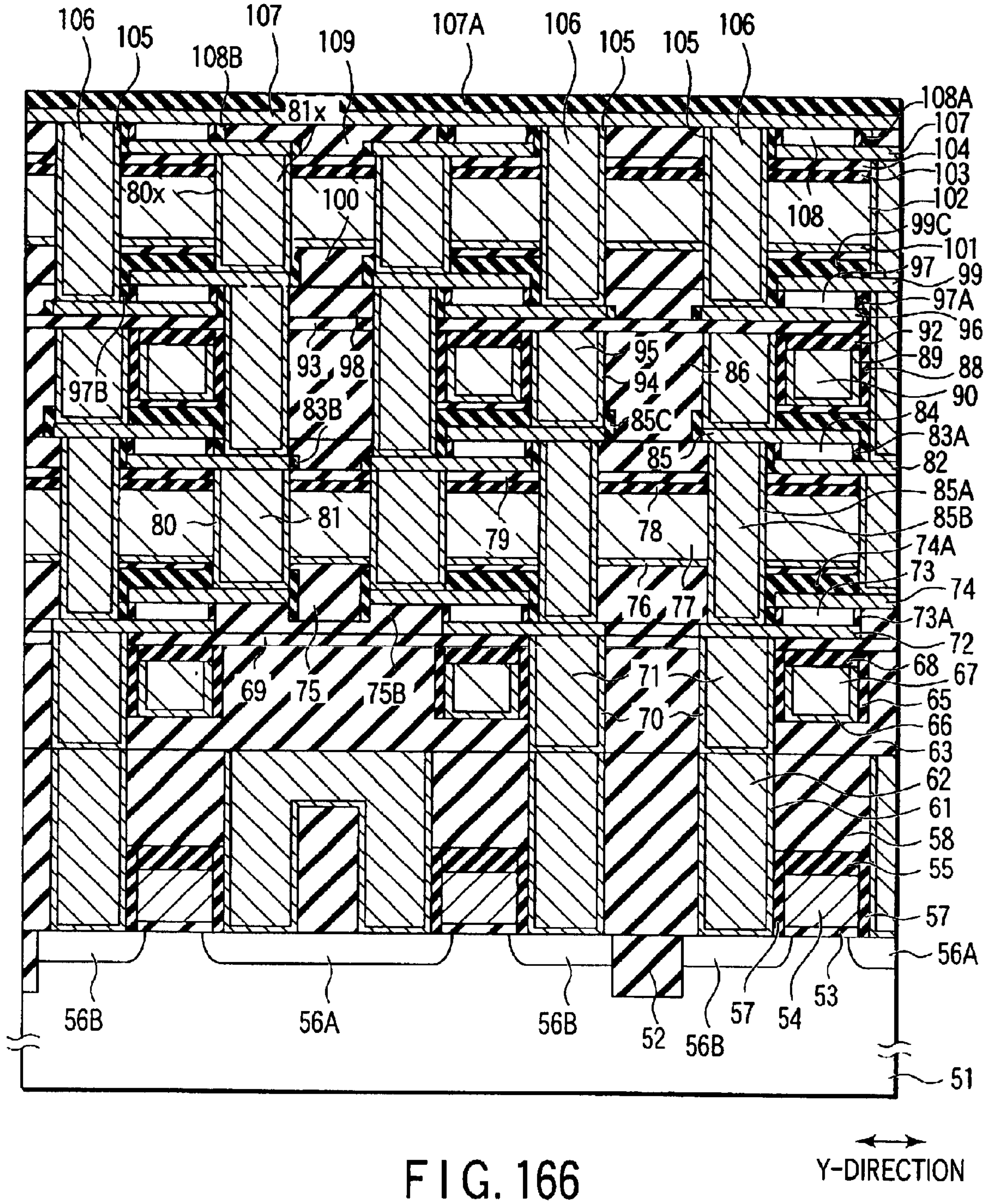
Figure 167:
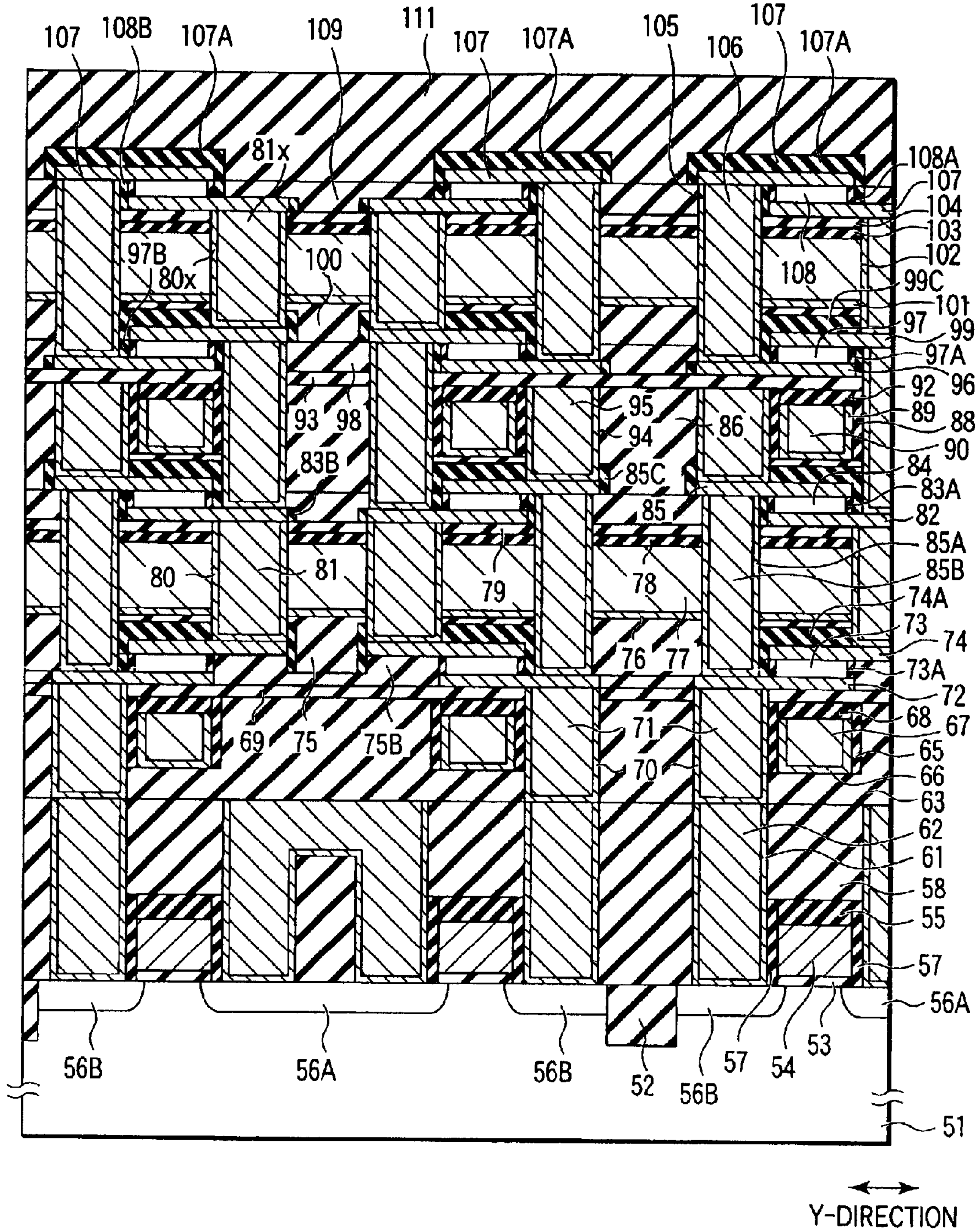
Figure 169:
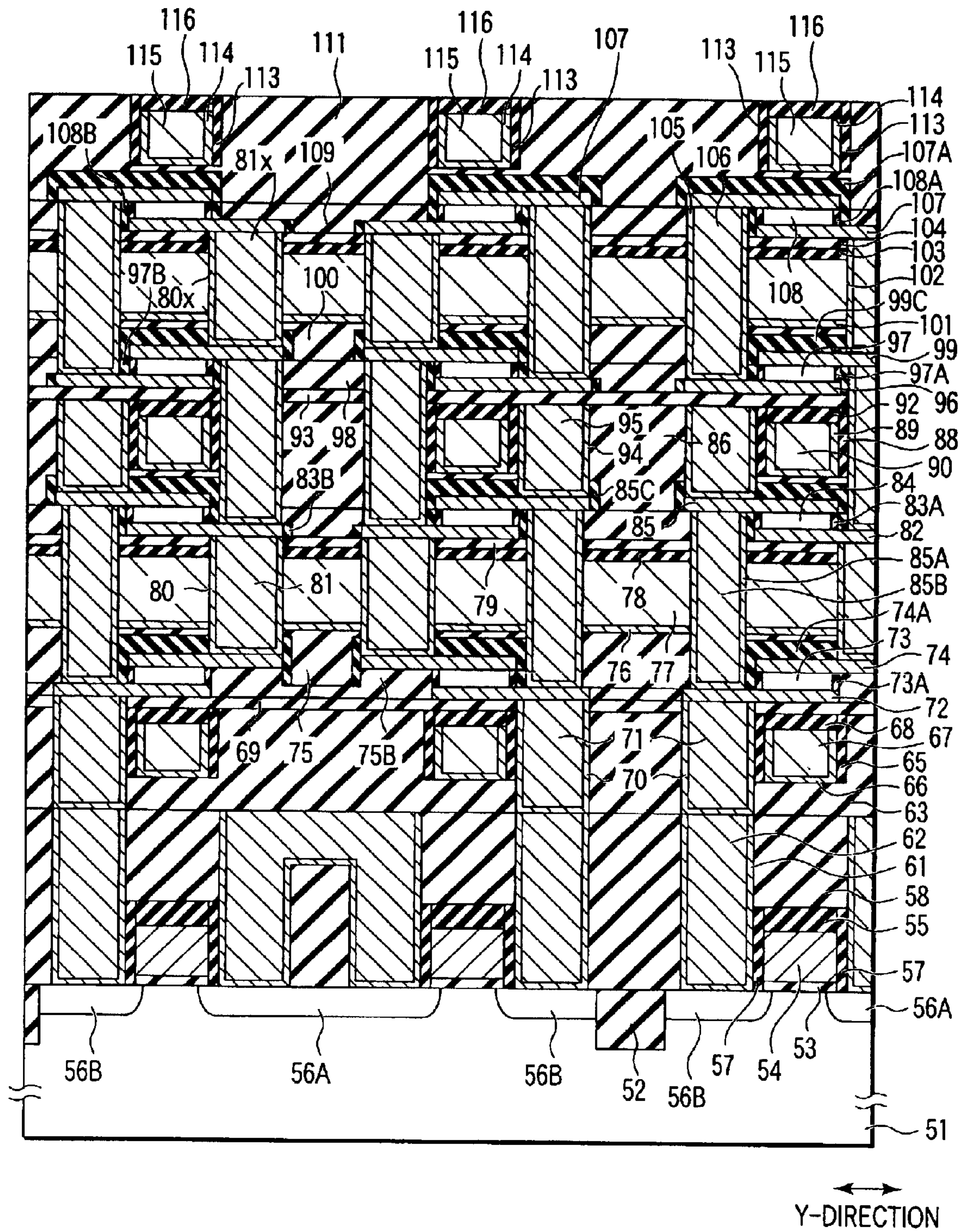
Figure 170:
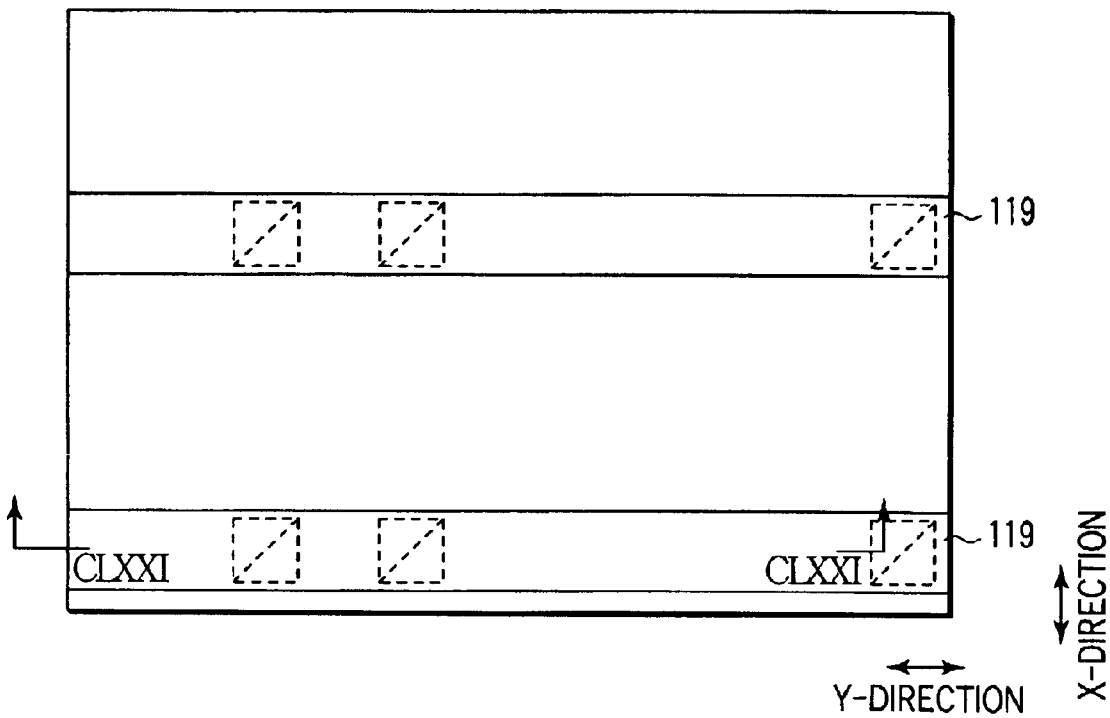
Figure 172:
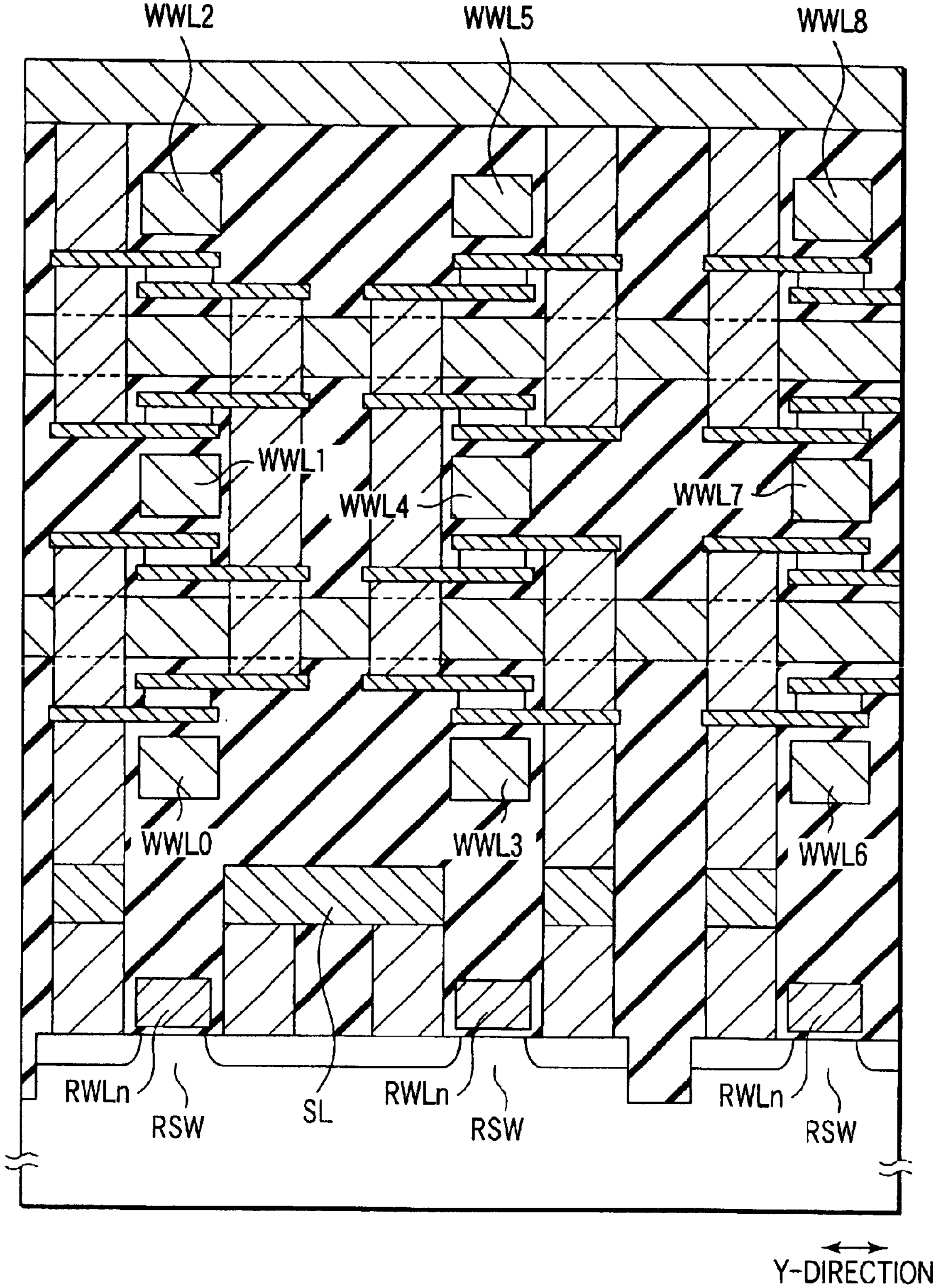
Figure 176:
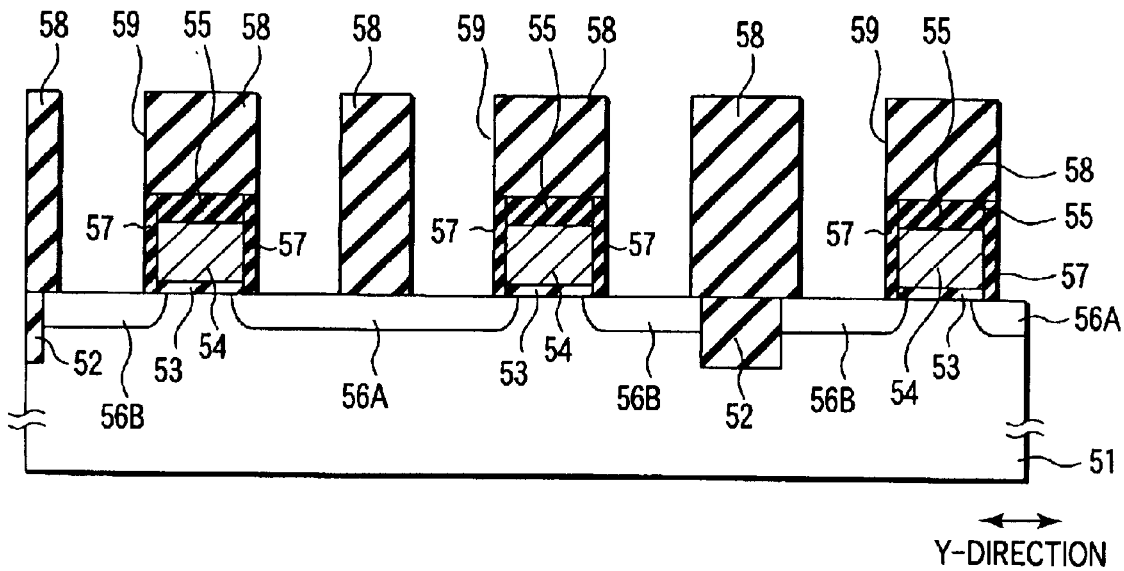
Figure 177:
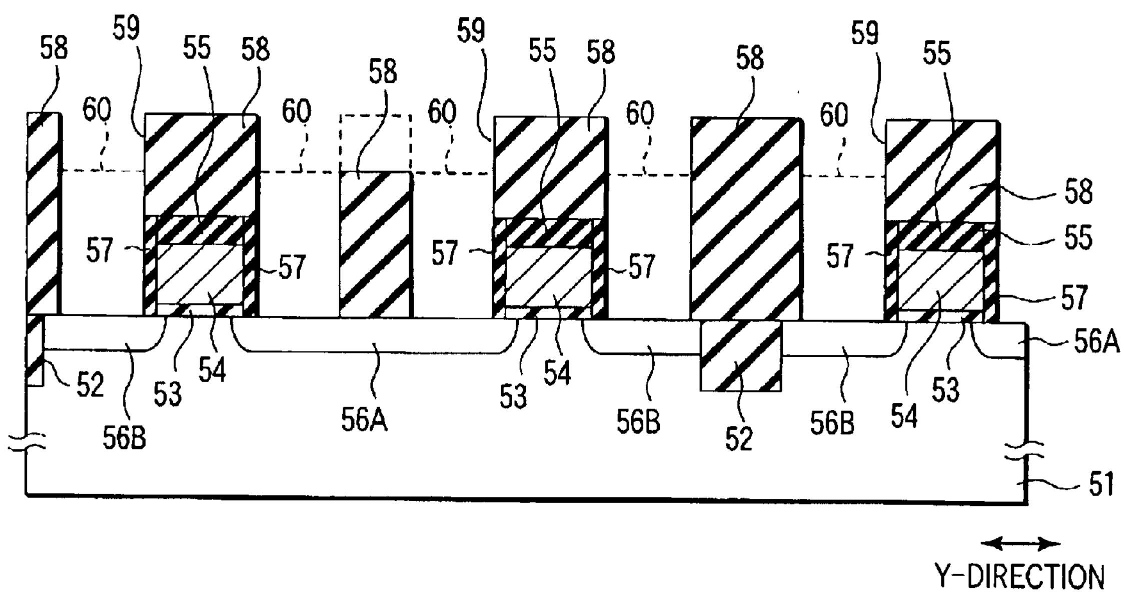
Figure 178:
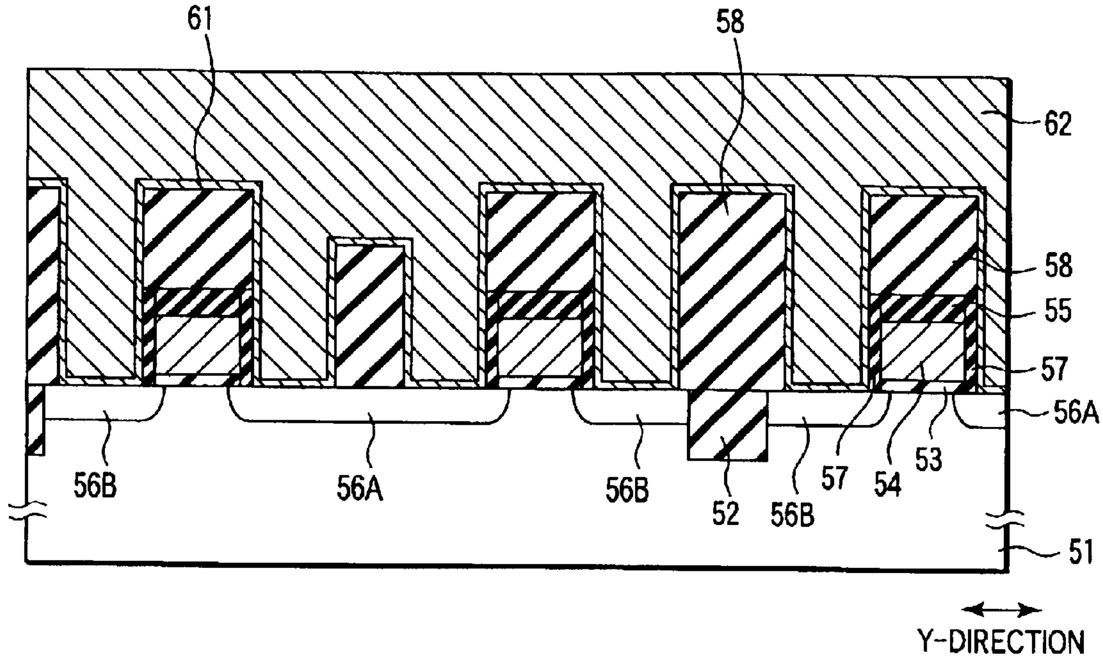
Figure 179:
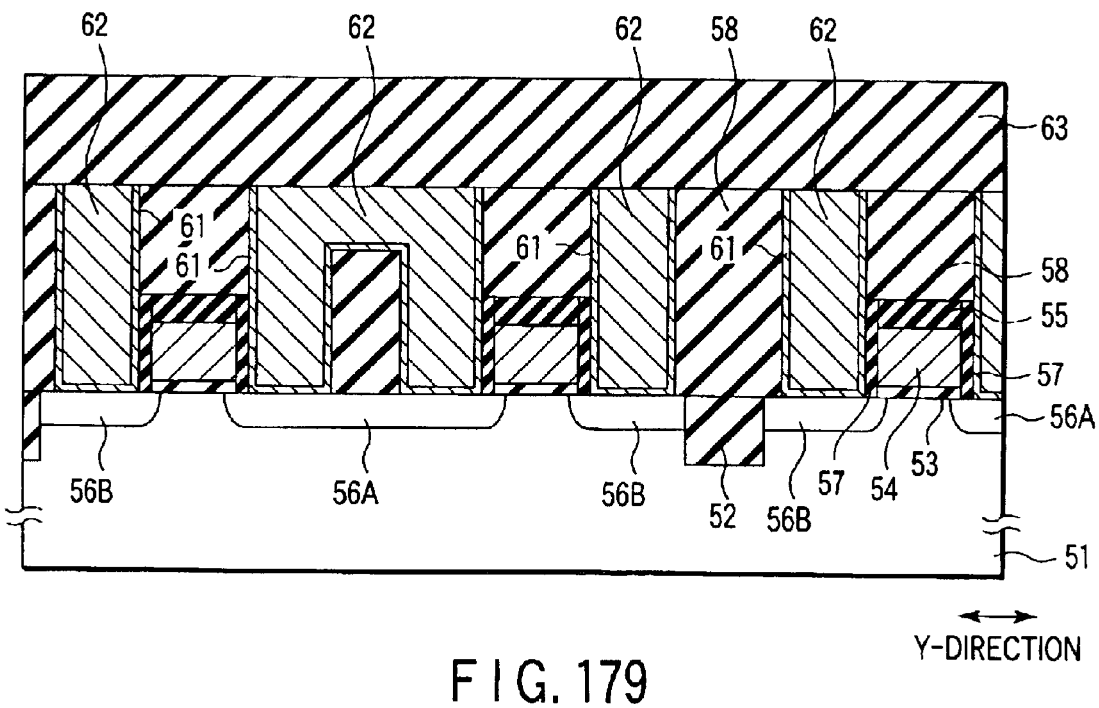
Figure 180:
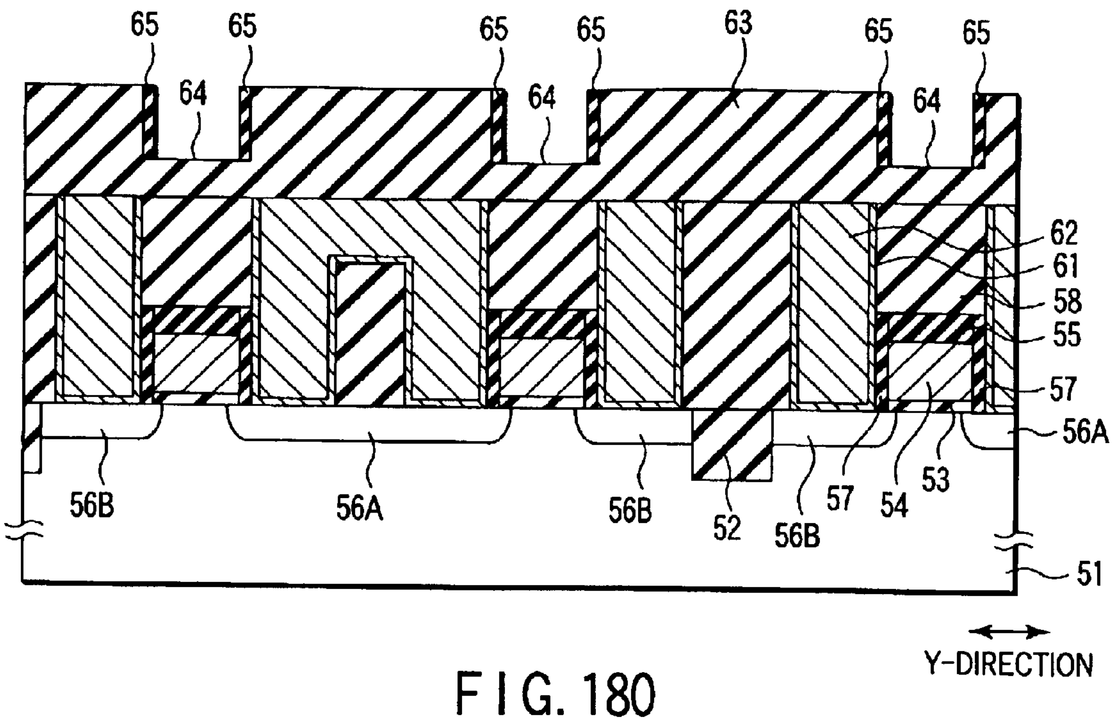
Figure 181:
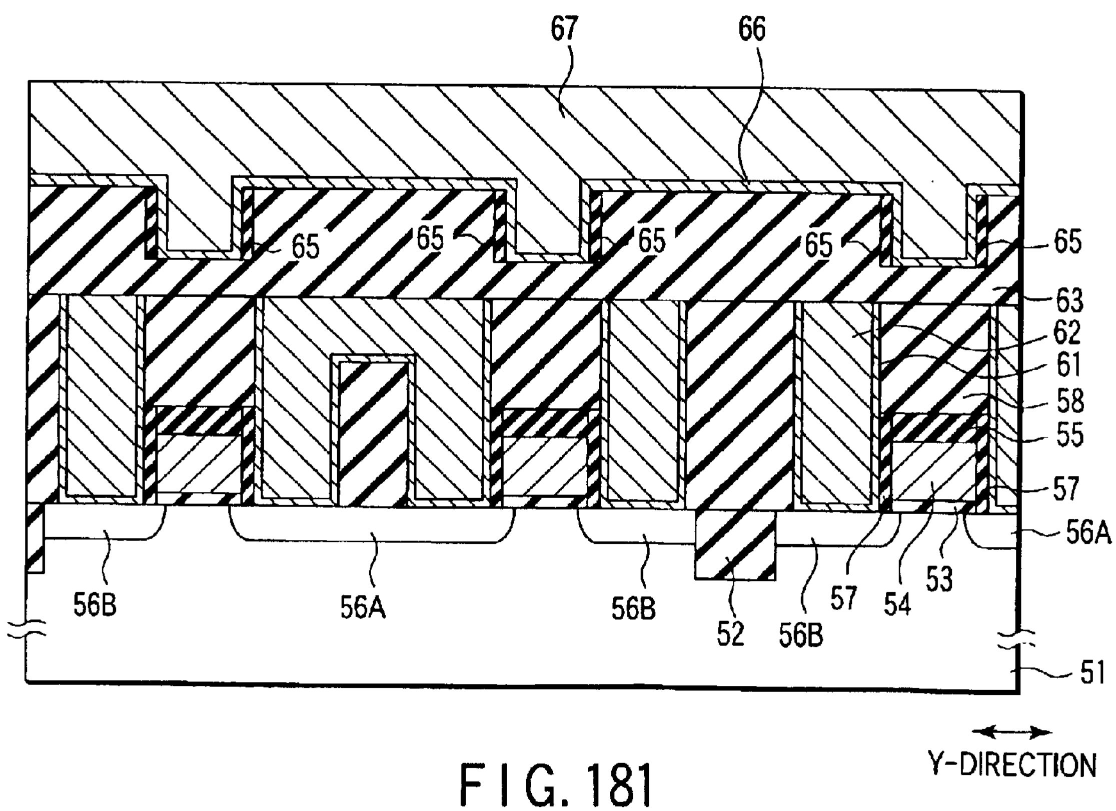
Figure 182:
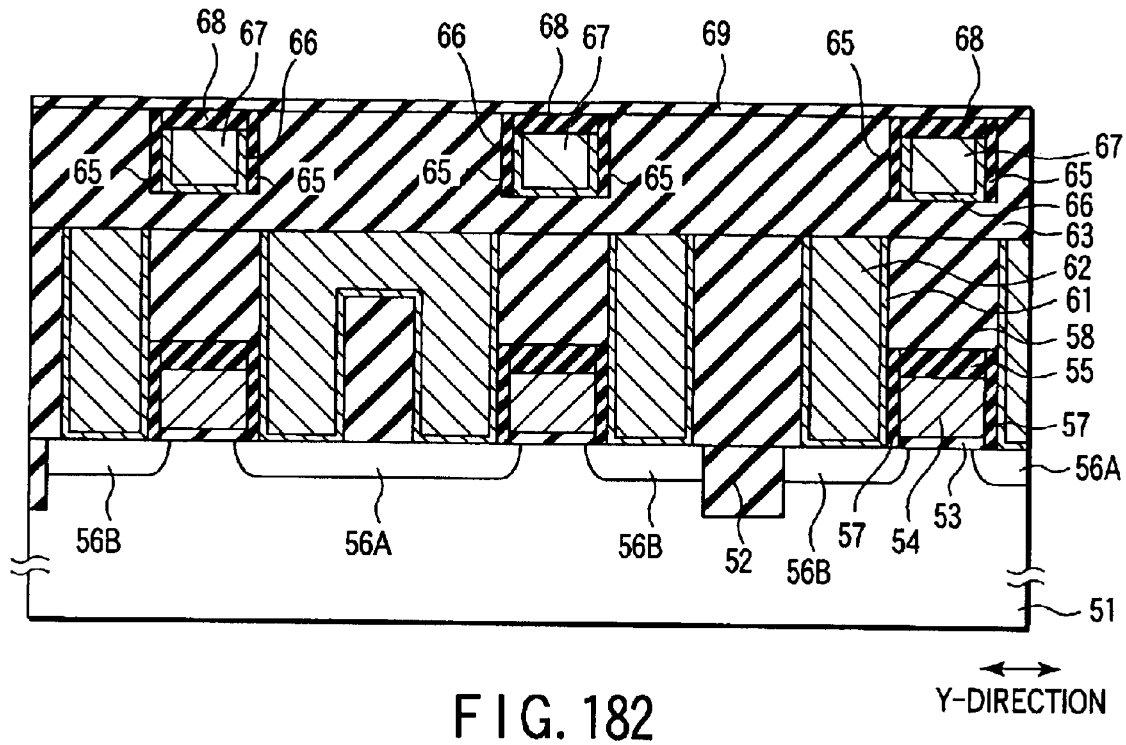
Figure 183:
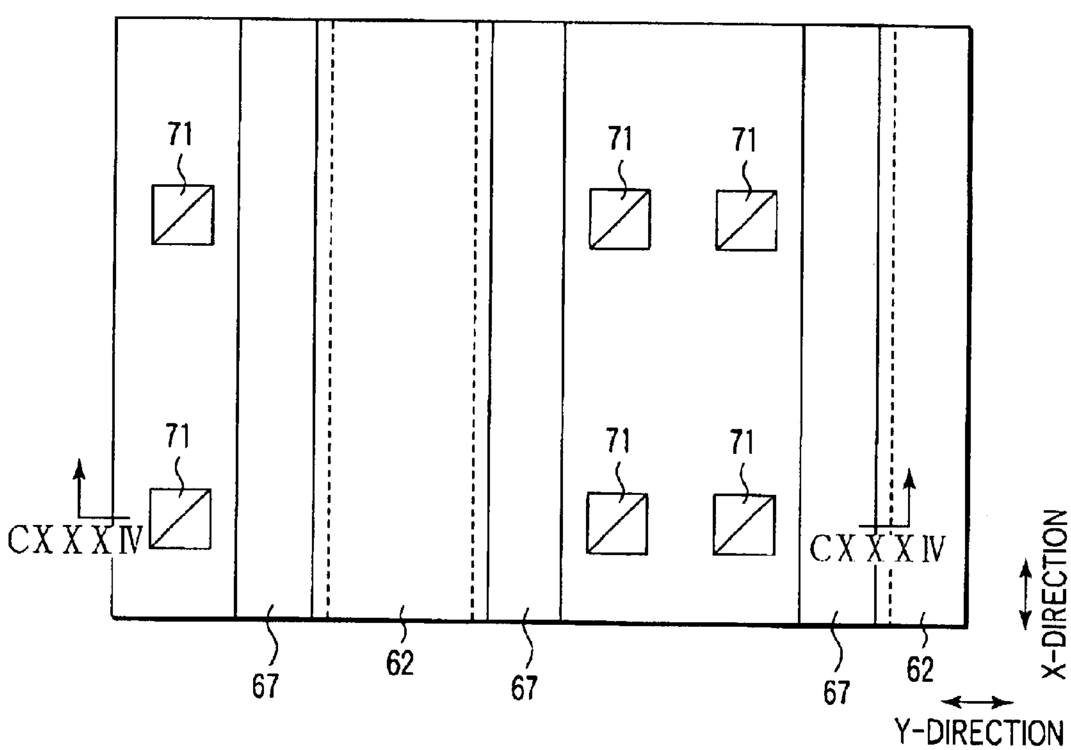
Figure 187:
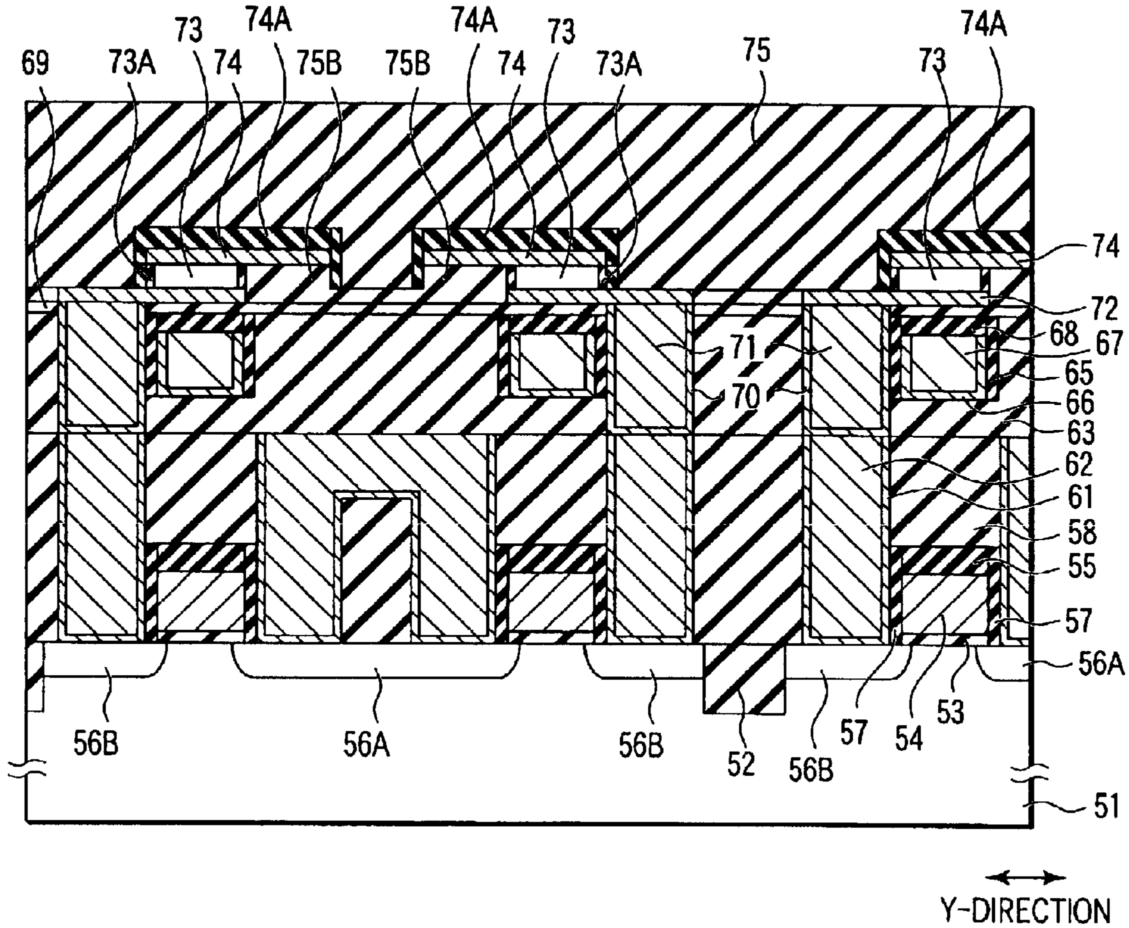
Figure 189:
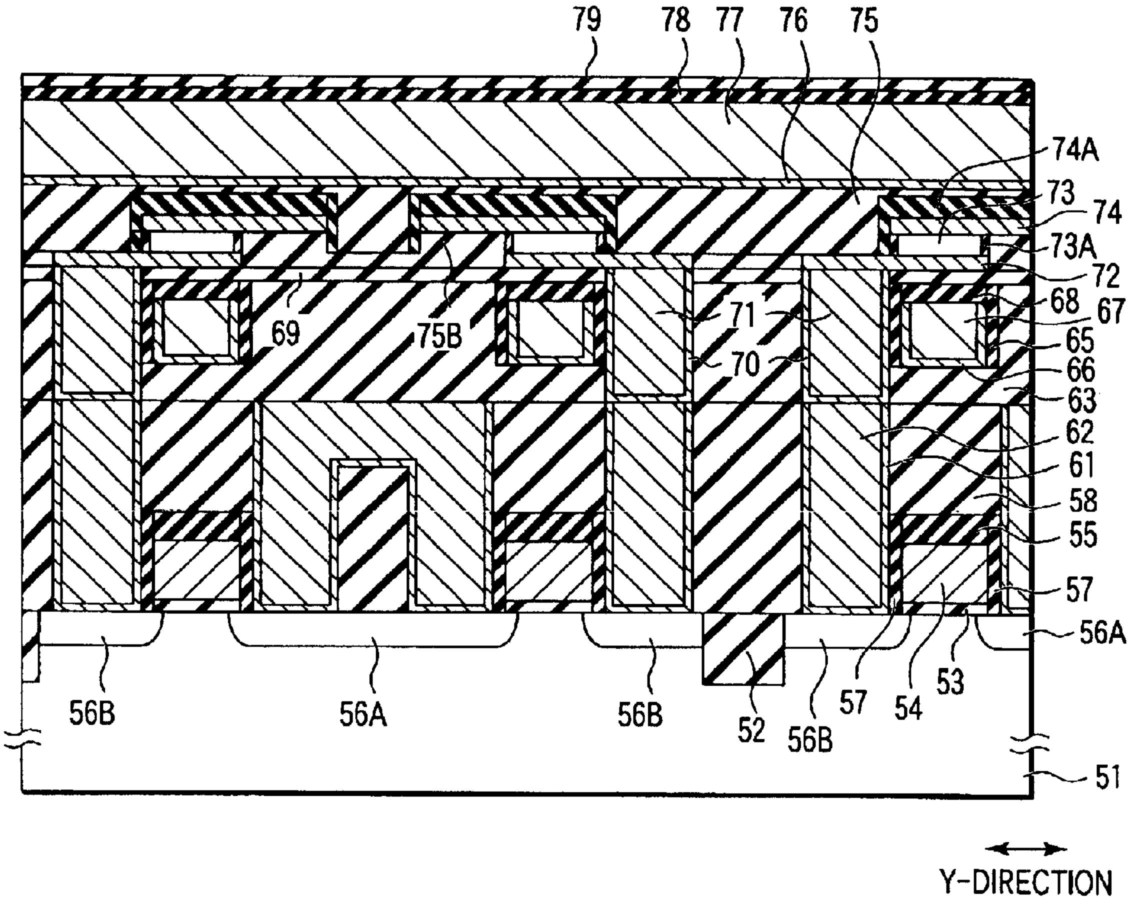
Figure 190:
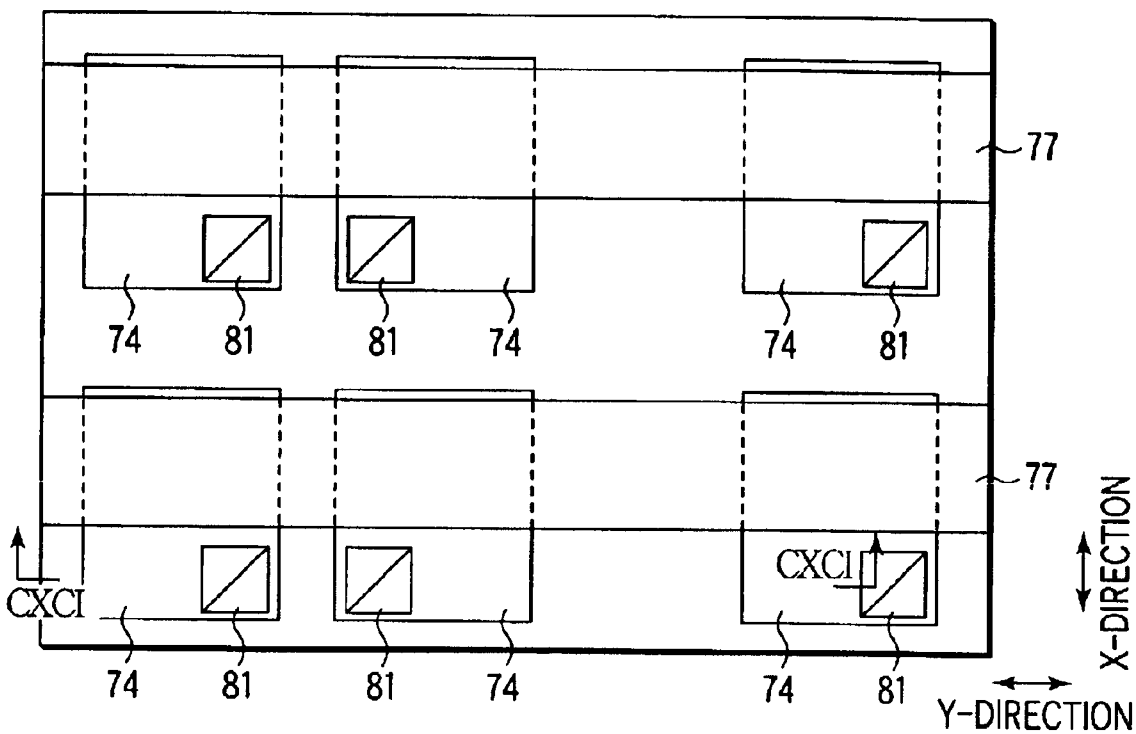
Figure 193:
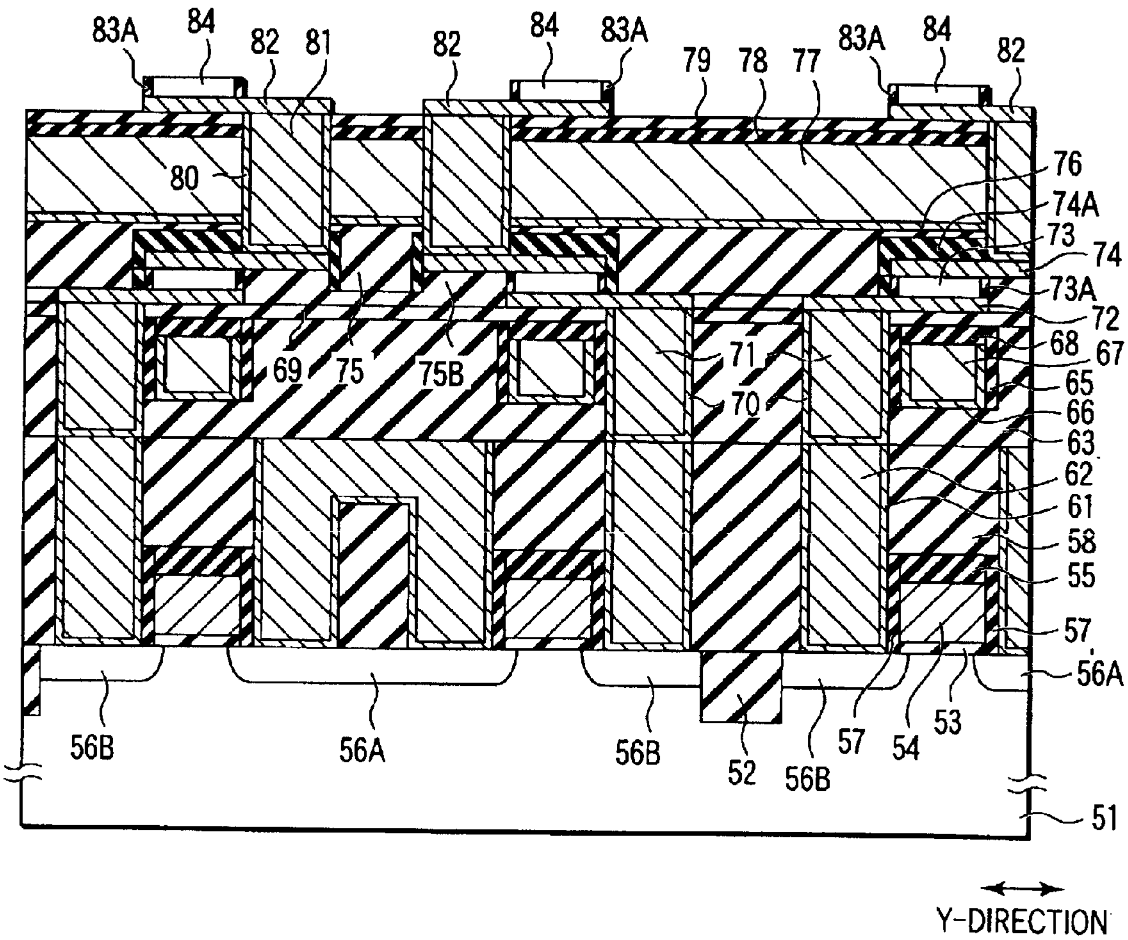
Figure 194:
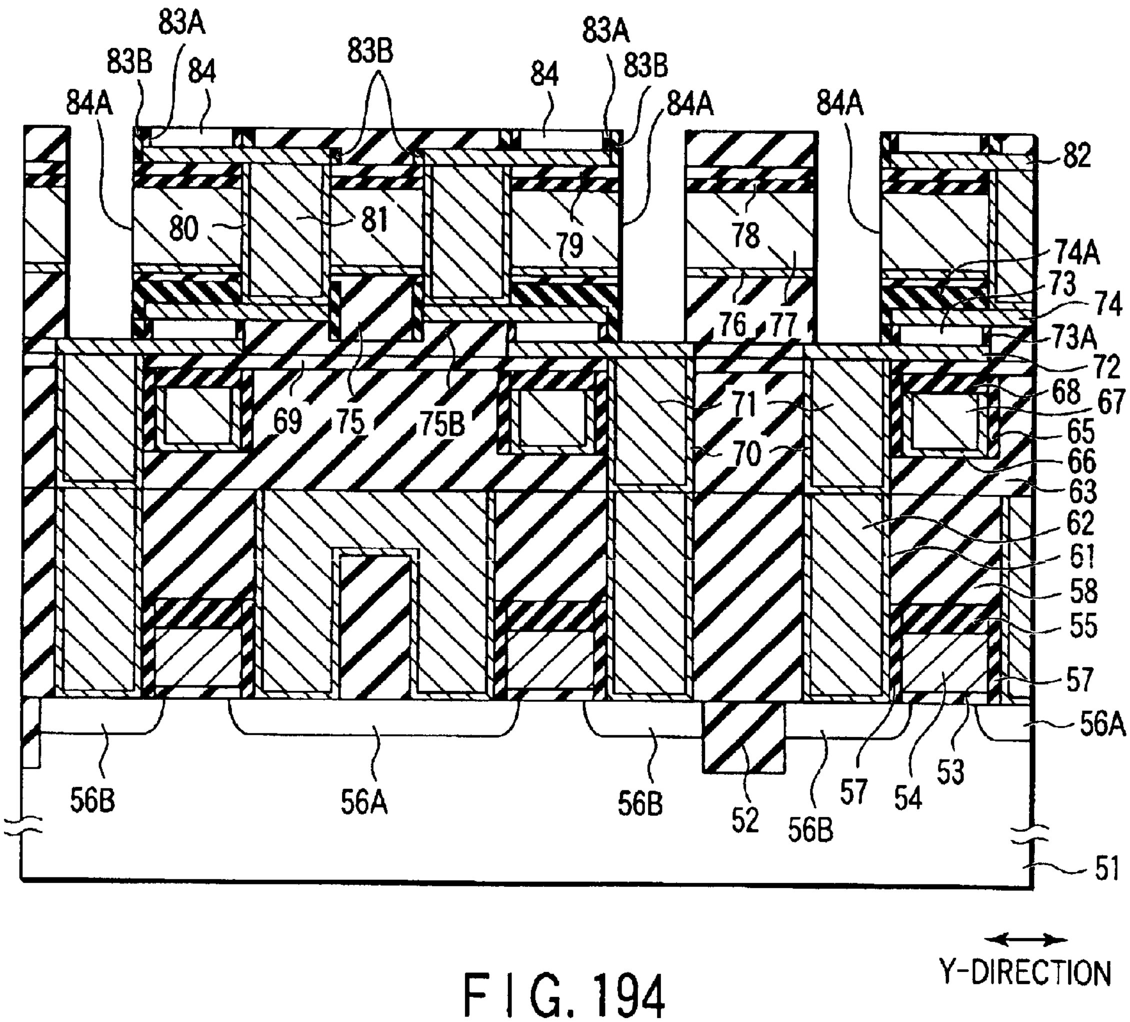
Figure 195:
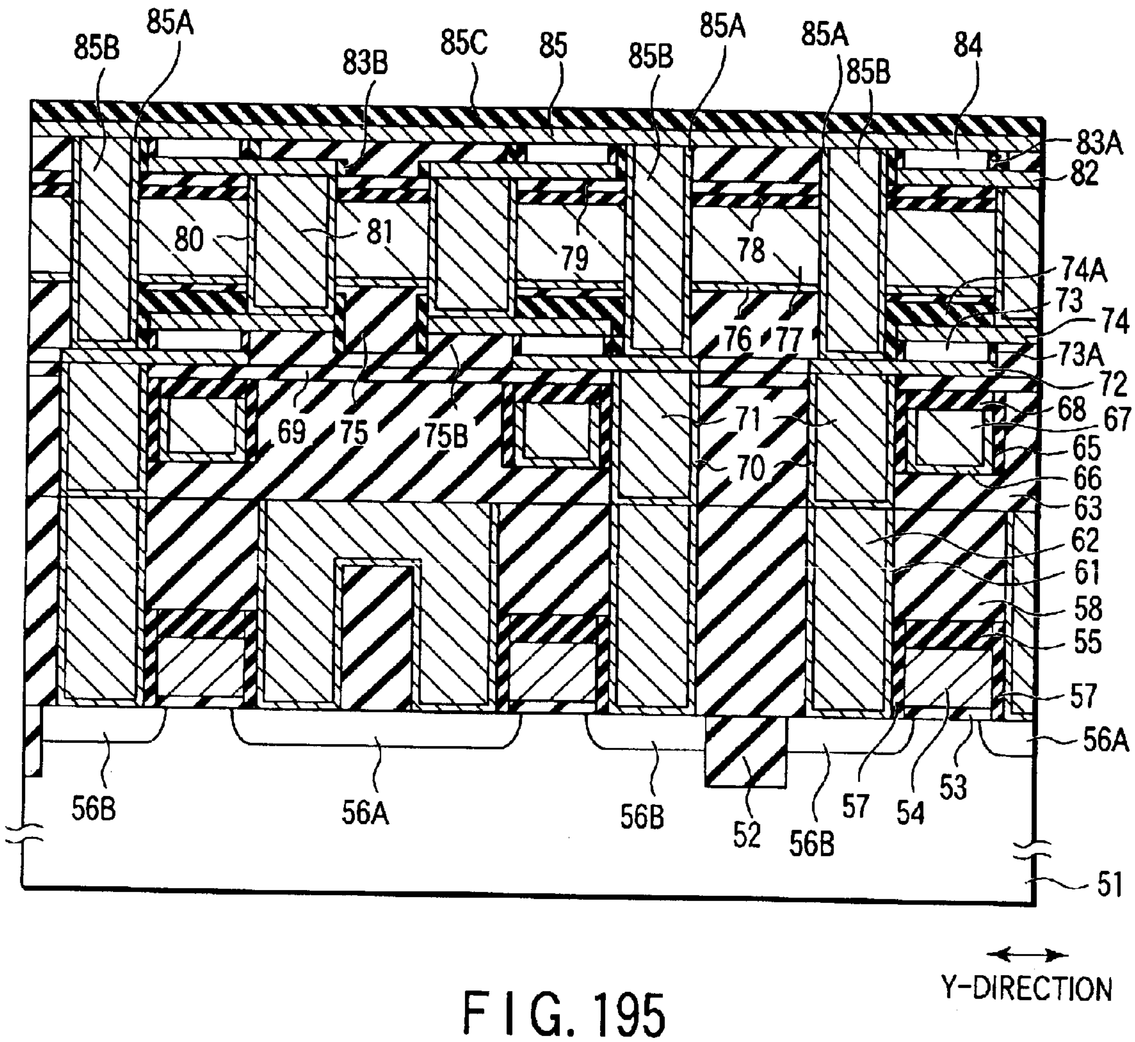
Figure 198:
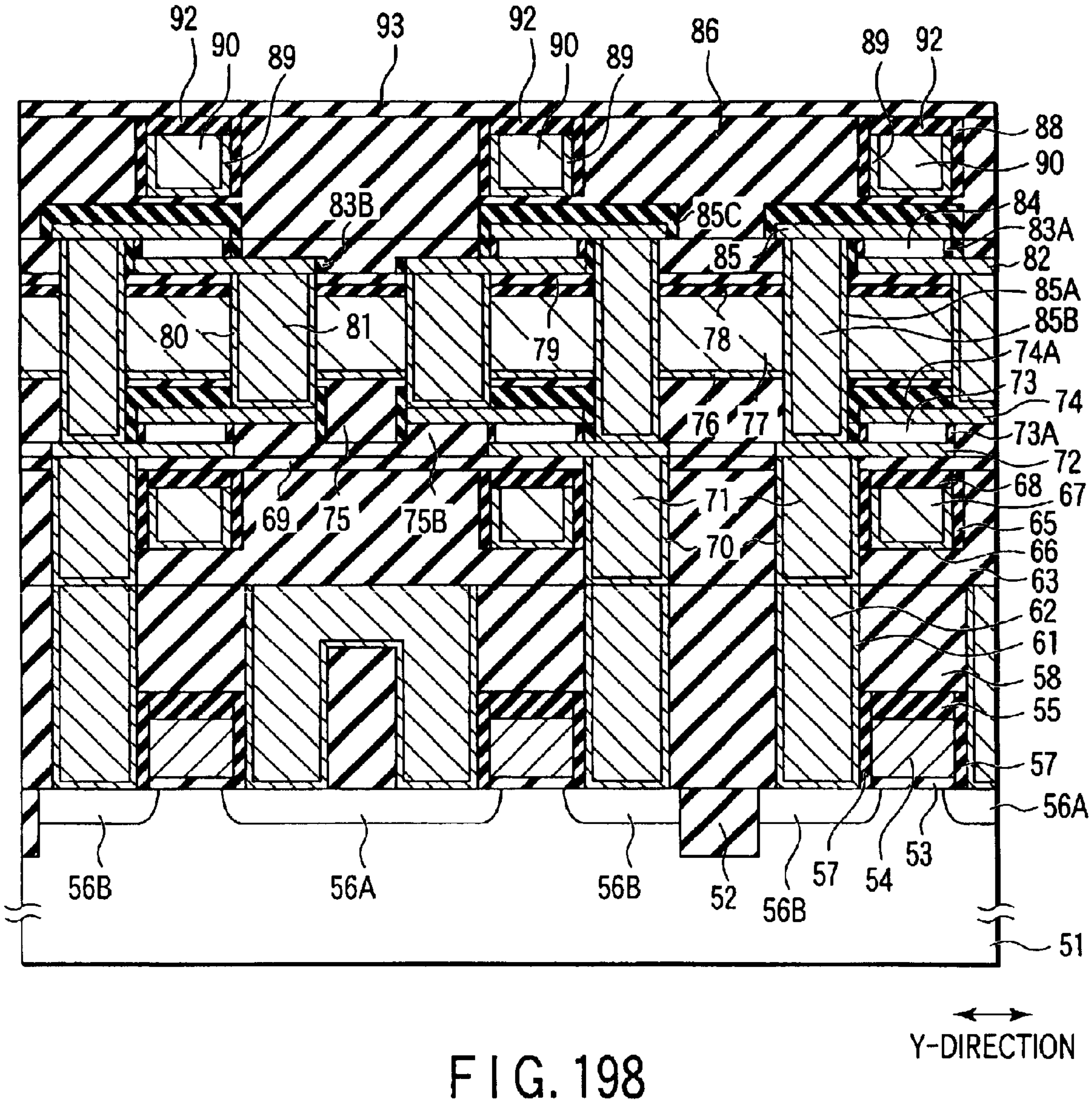
Figure 202:
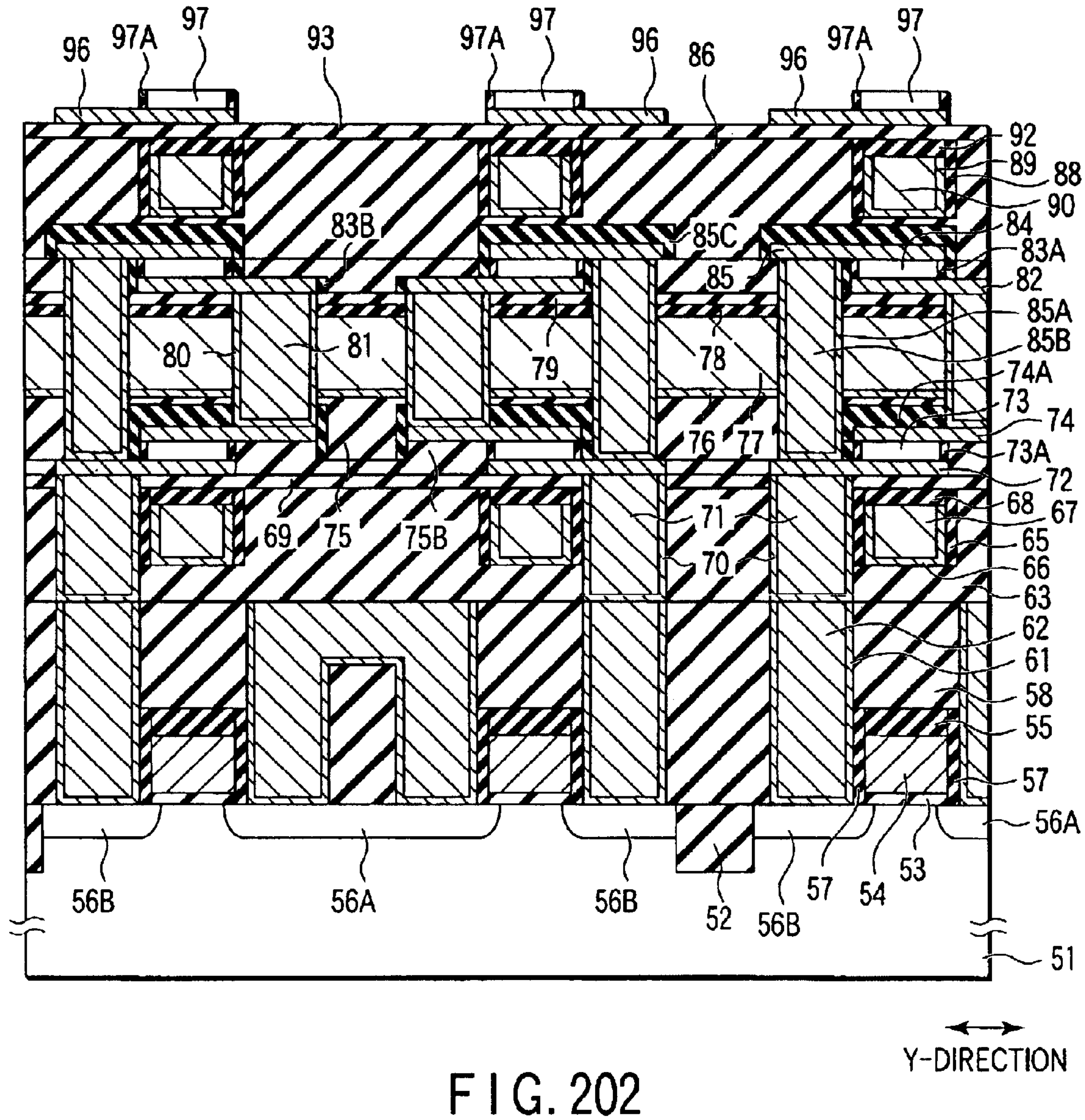
Figure 203:
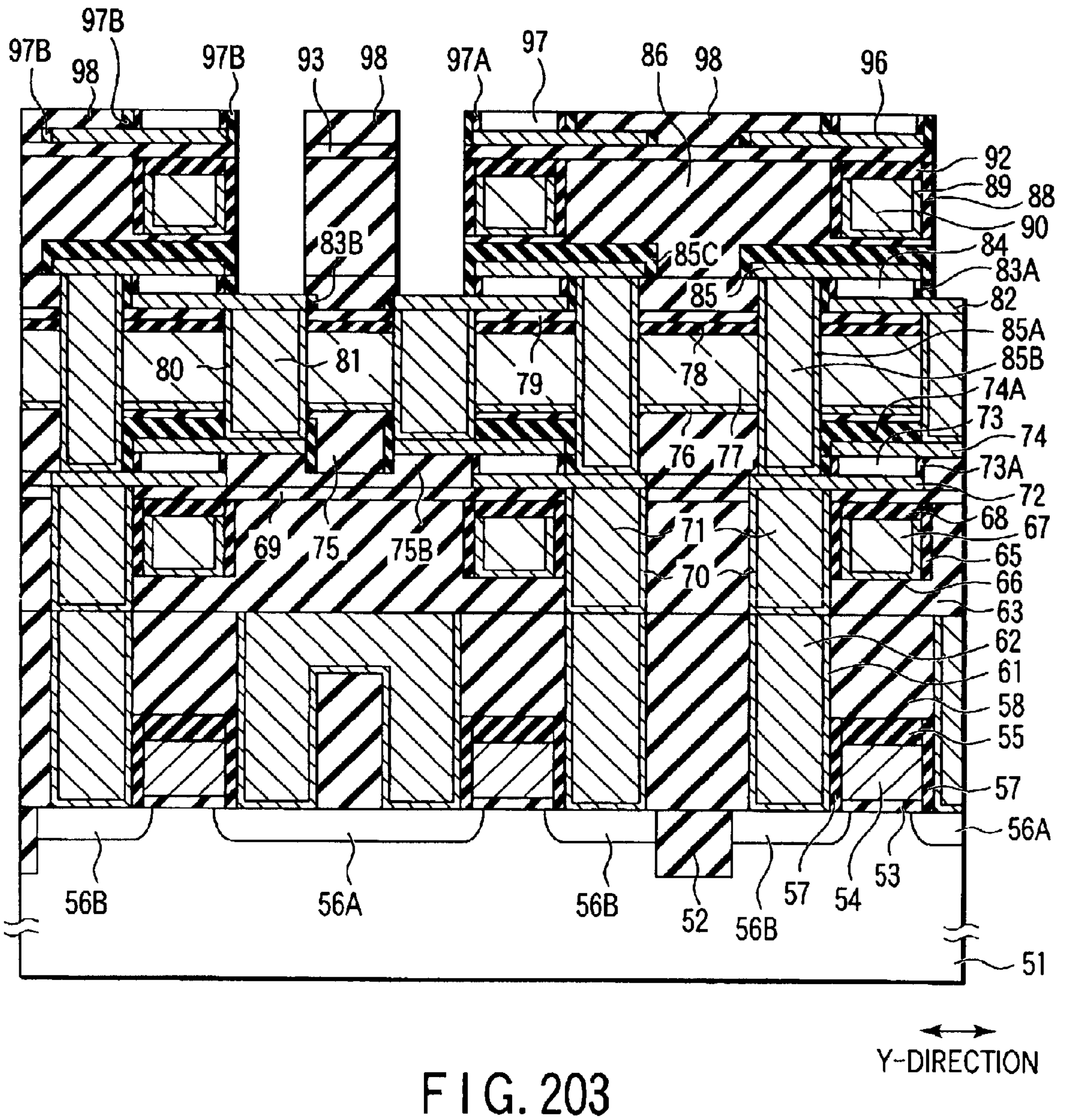
Figure 204:
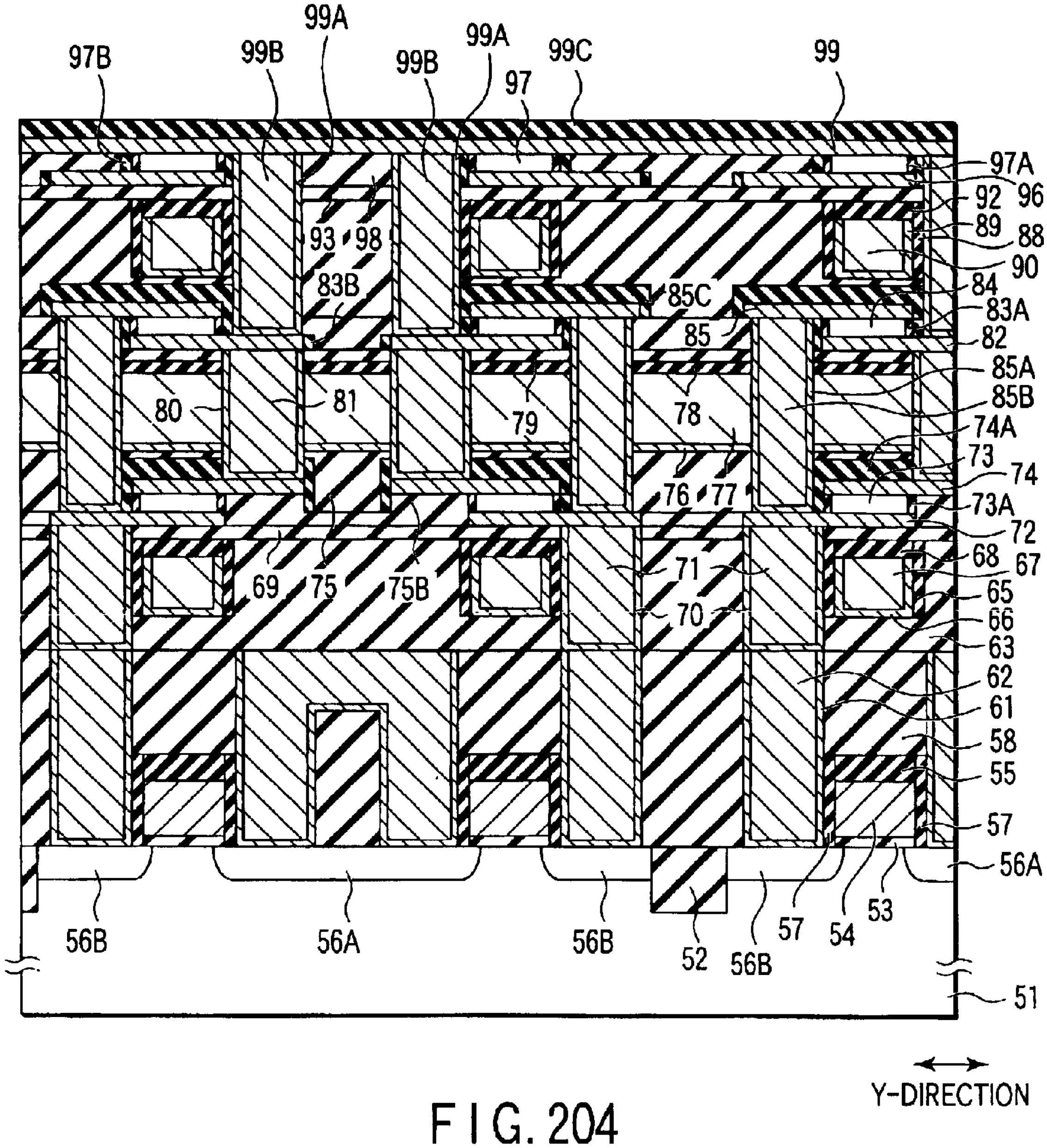
Figure 205:
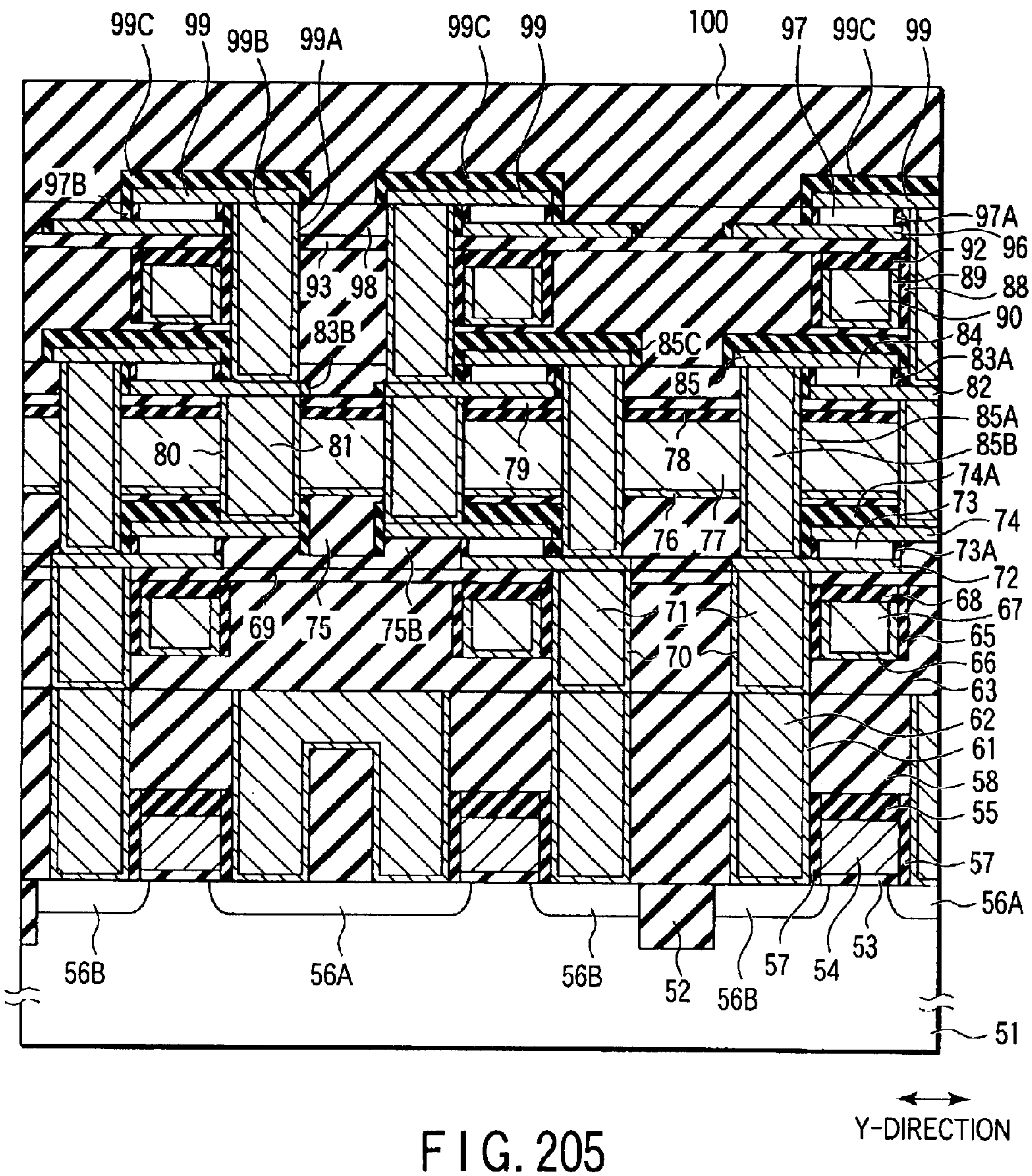
Figure 207:
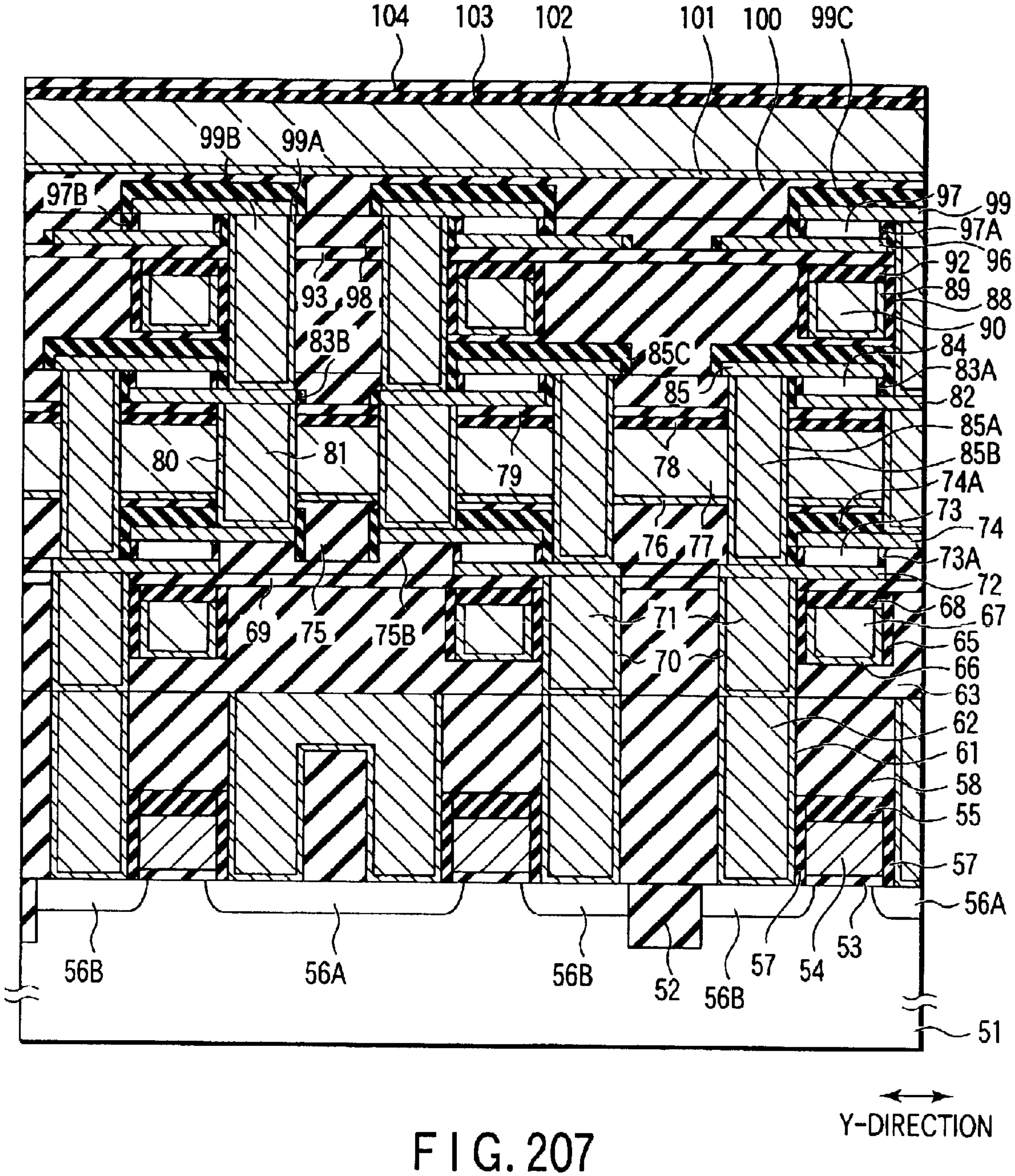
Figure 210:
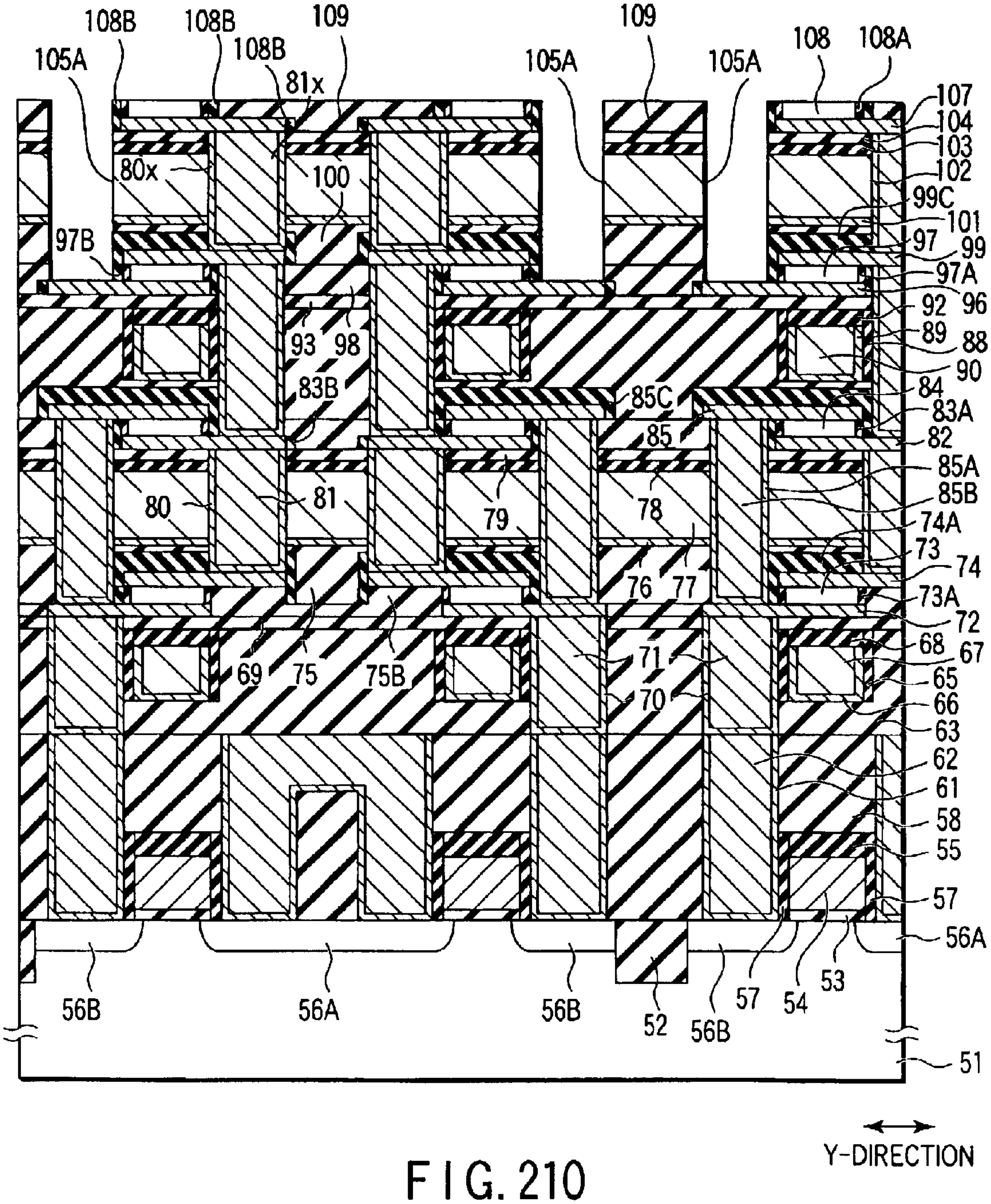
Figure 213:
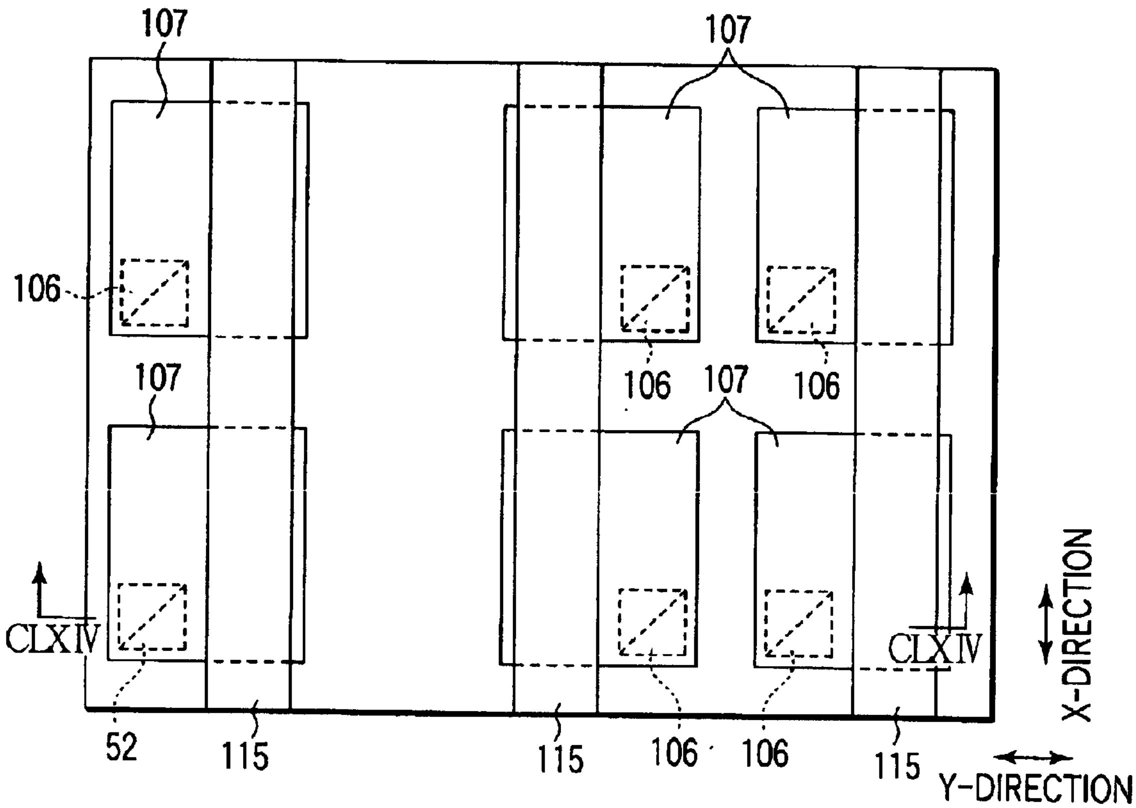
Figure 214:
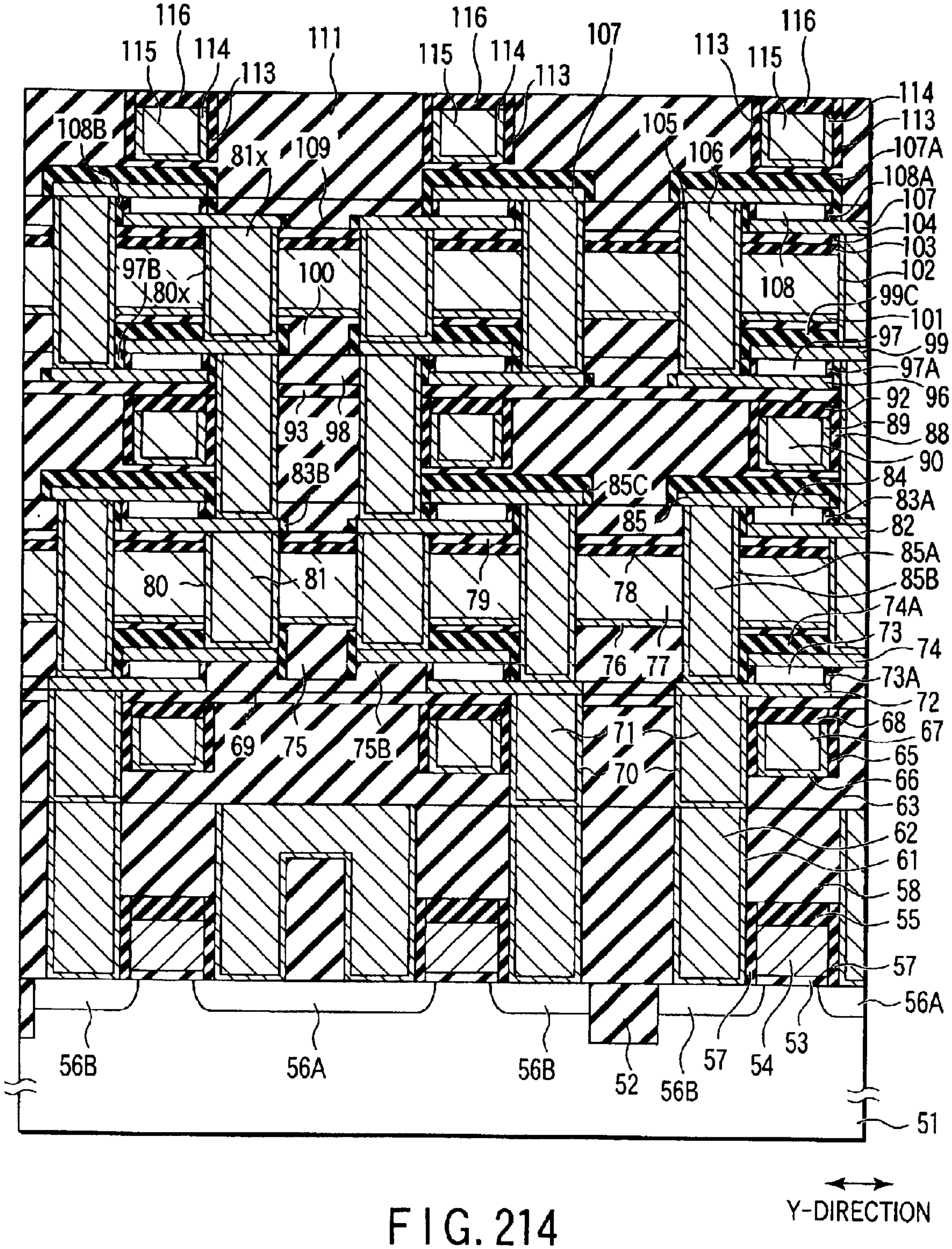
Figure 215:
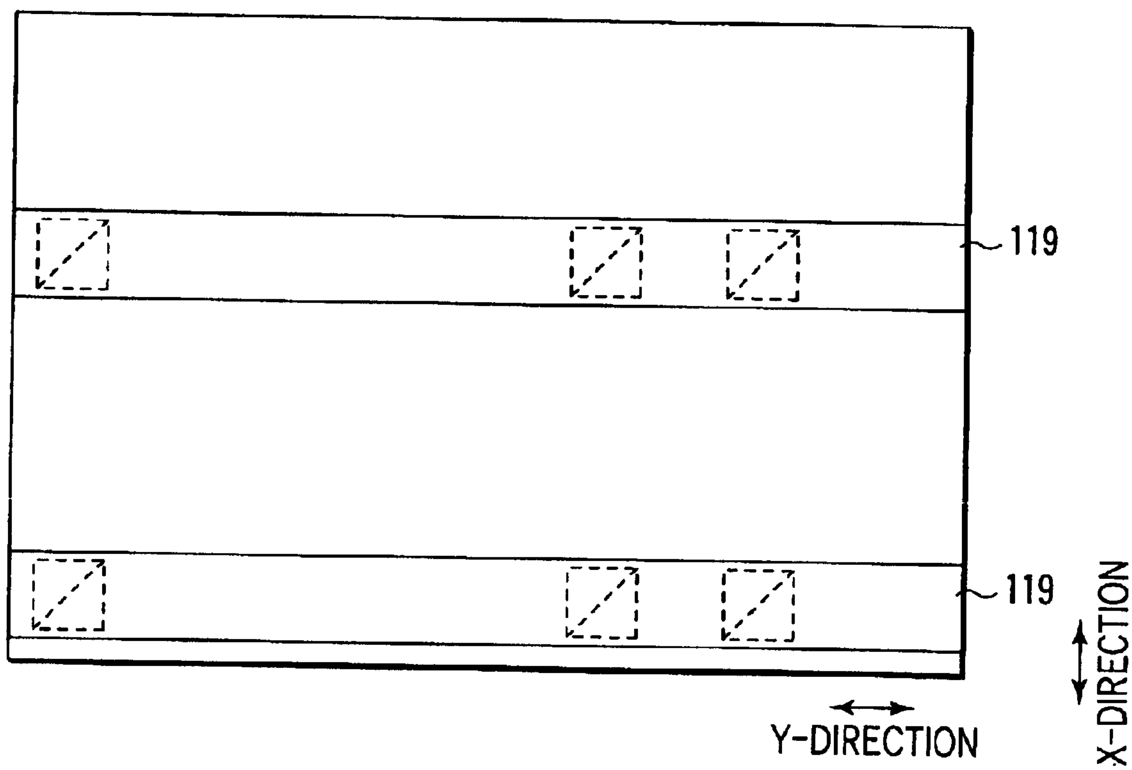
Figure 216:
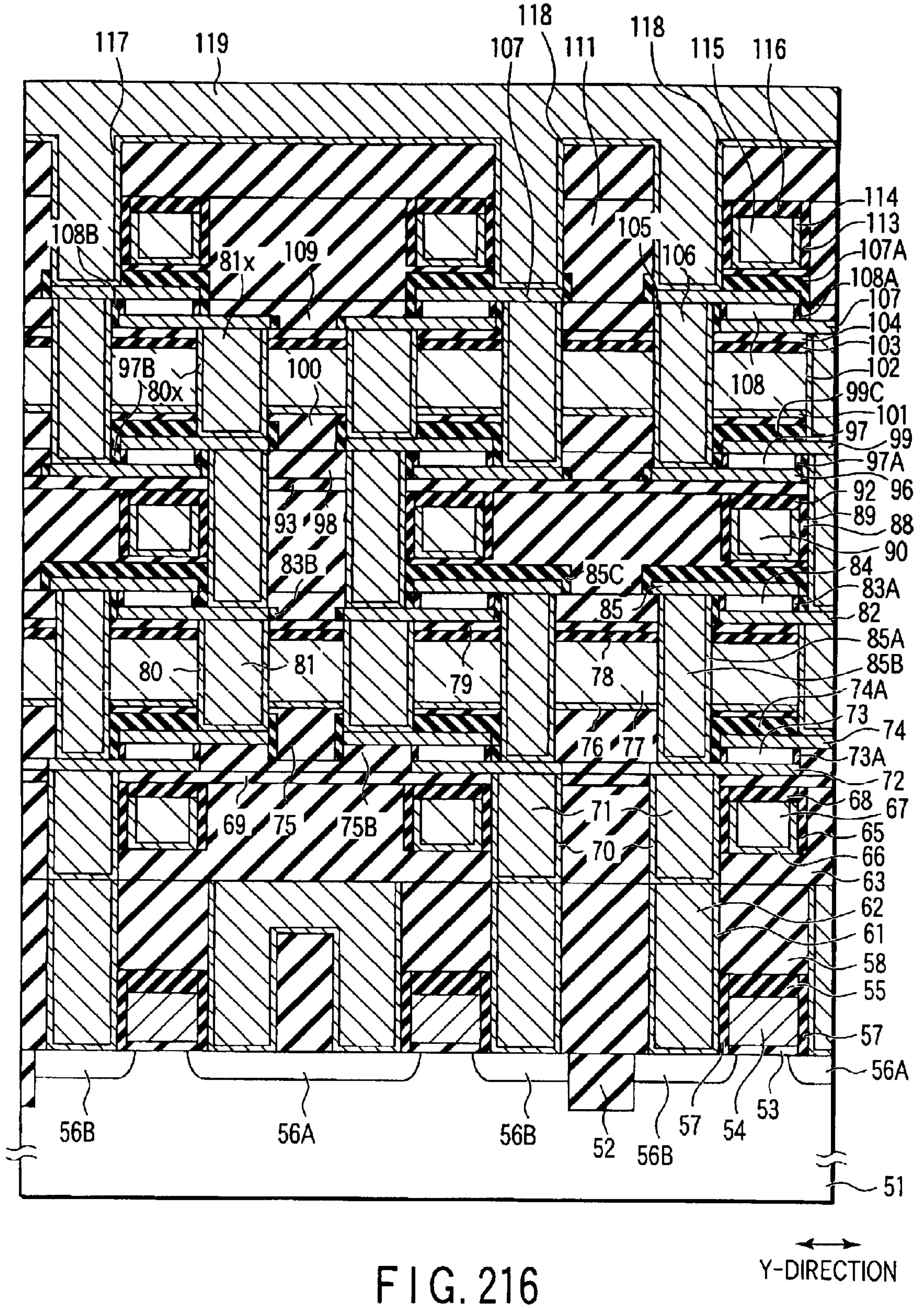
Figure 217:
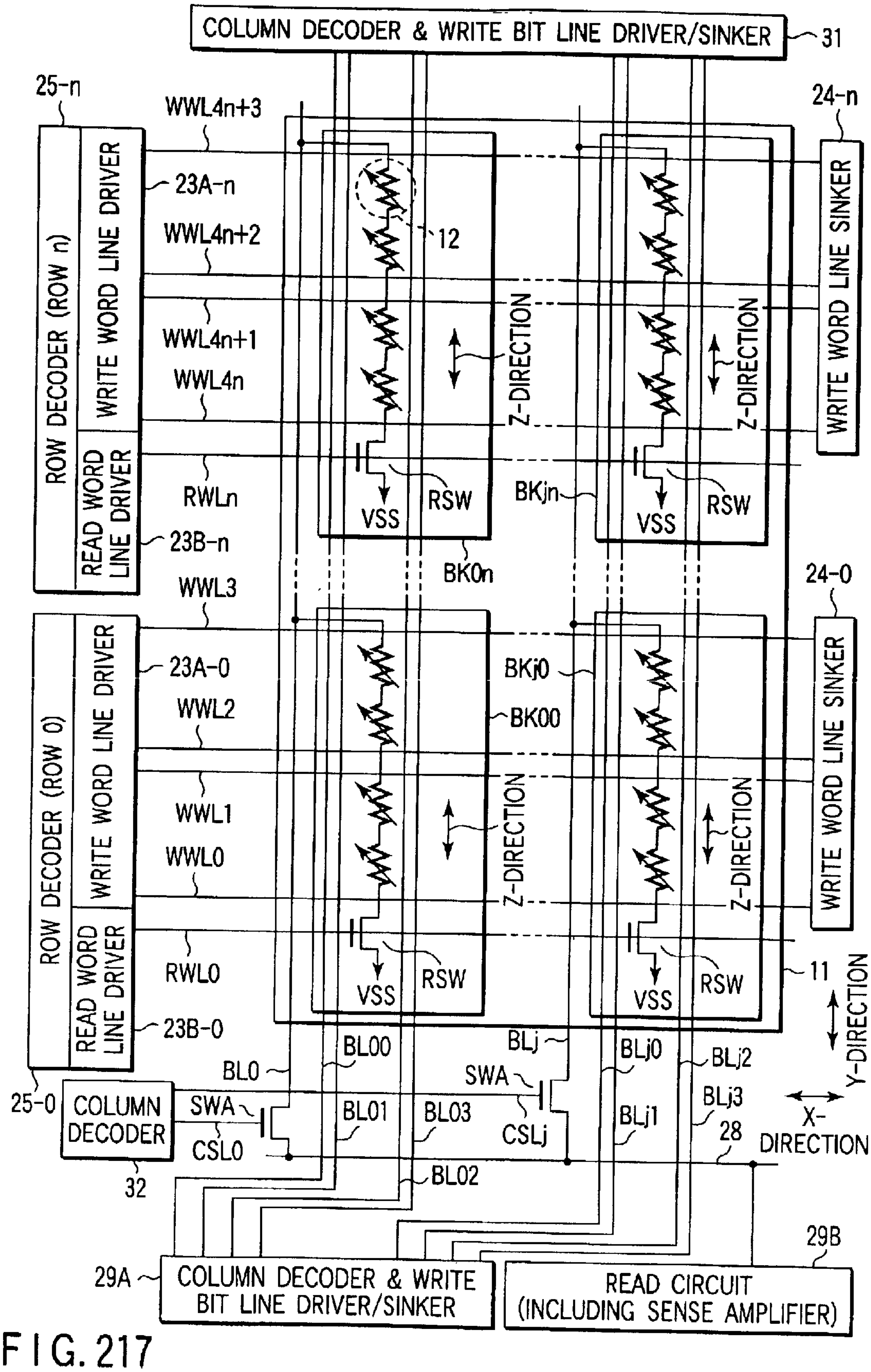
Figure 218:
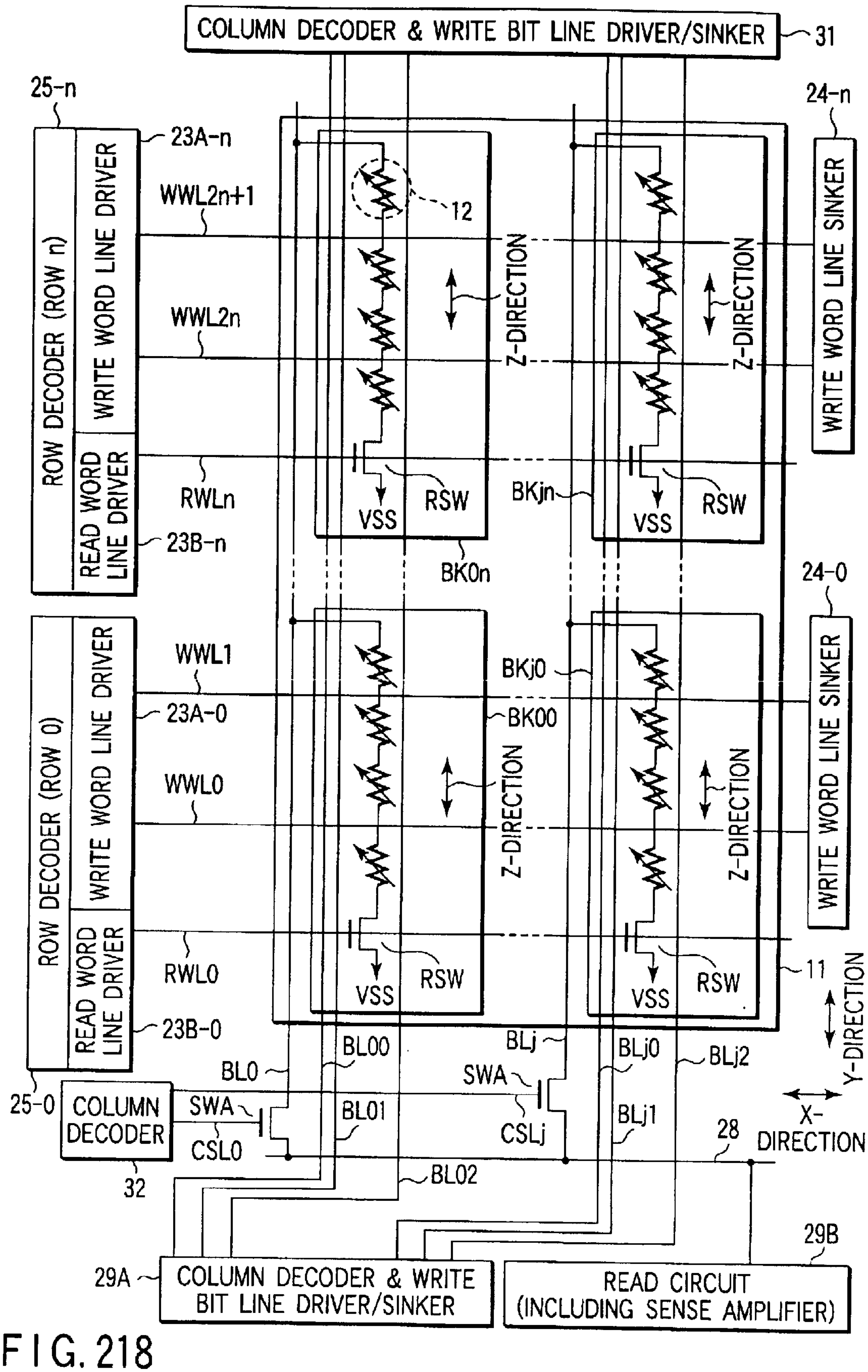
Figure 220:
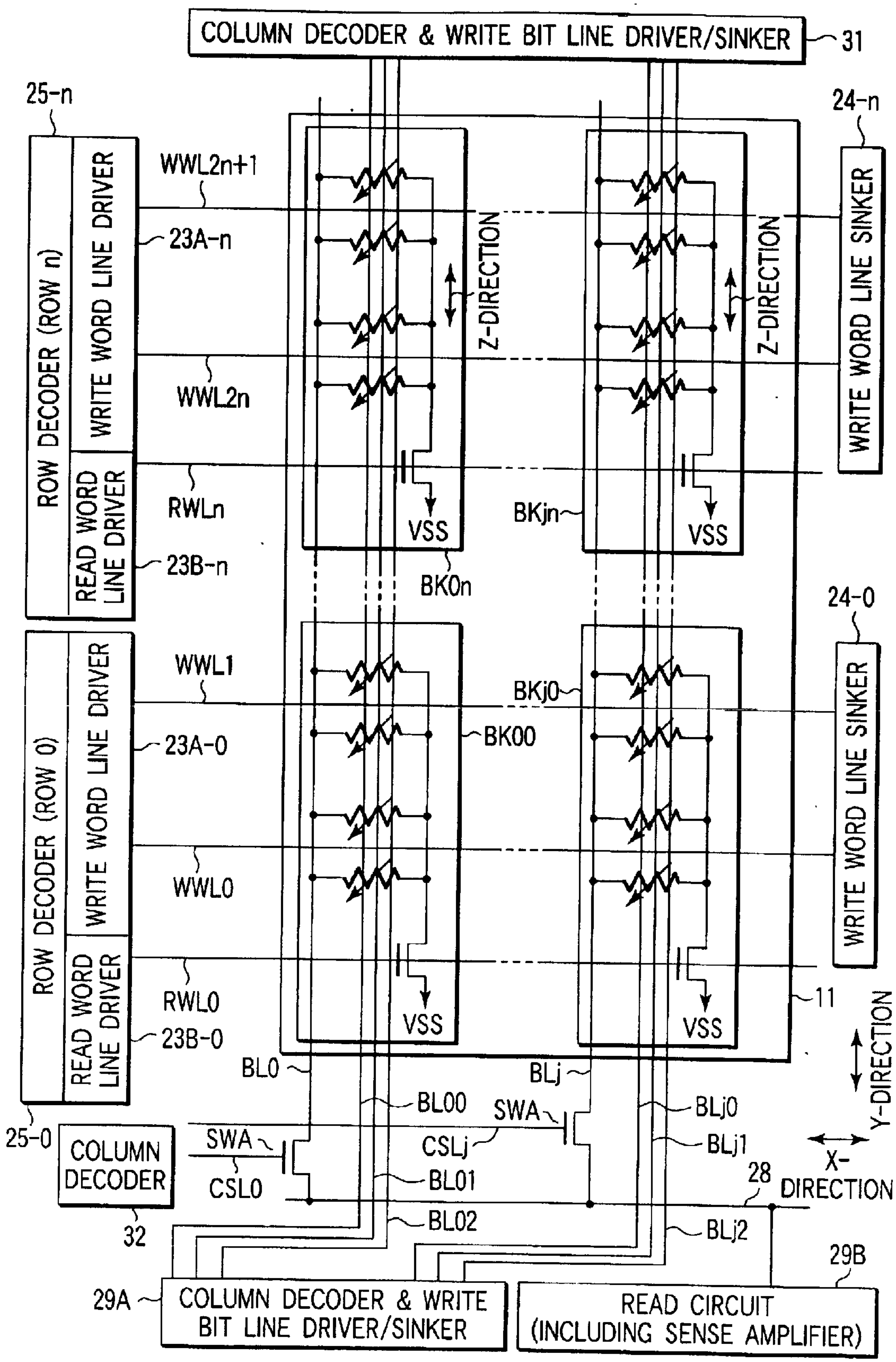
Figure 221:
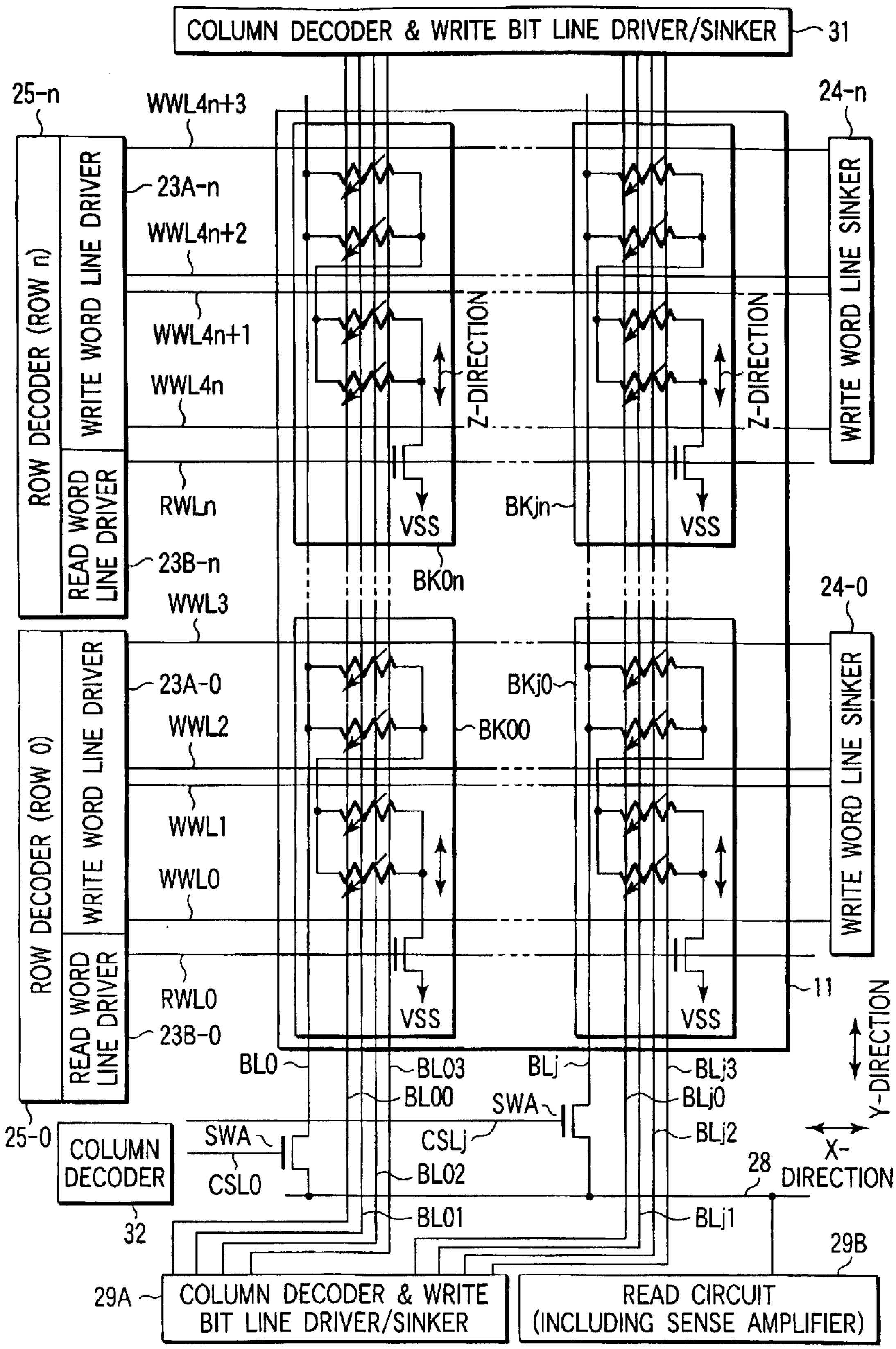
Figure 224:
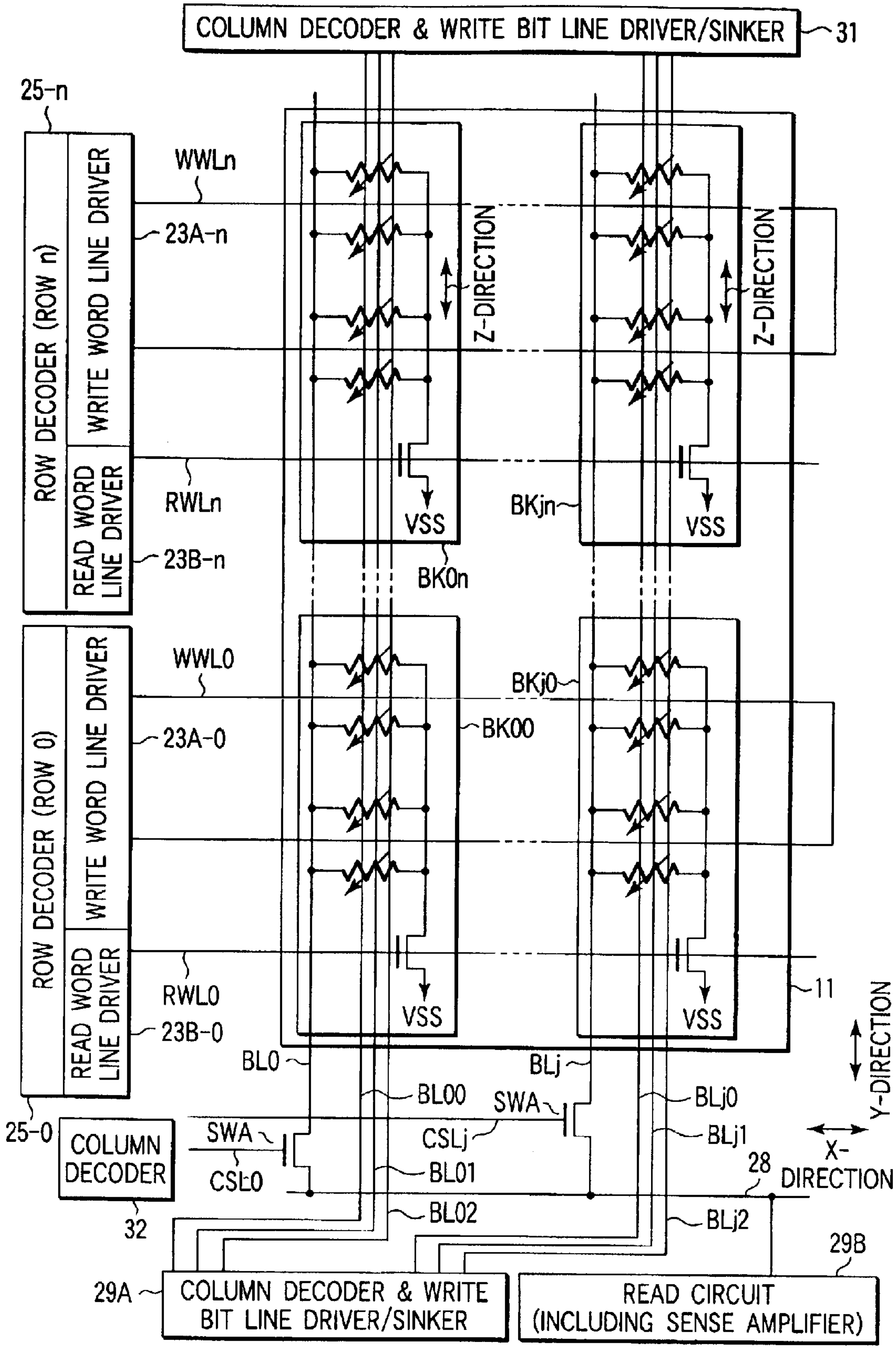
Figure 225:
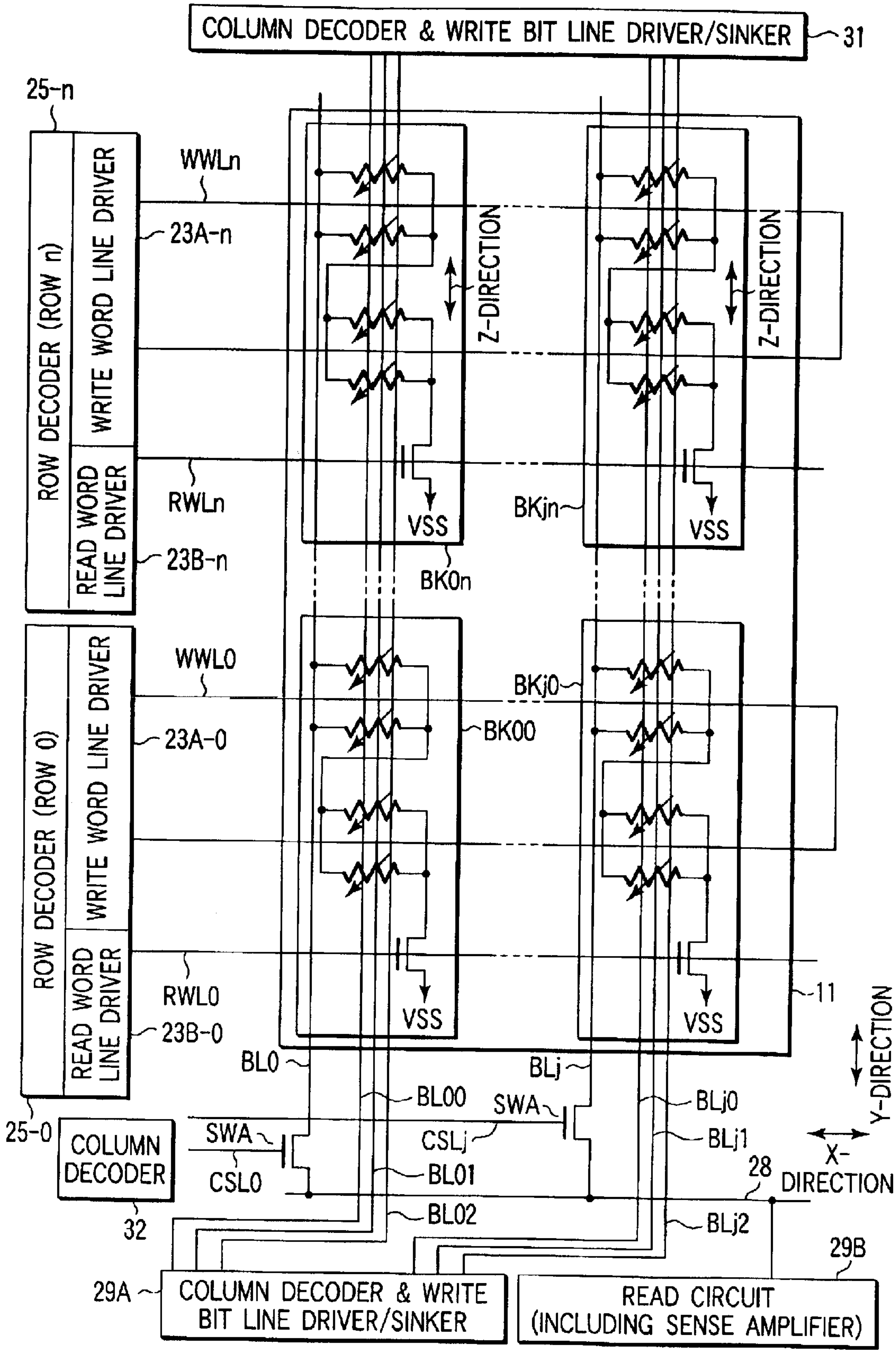
Figure 226:
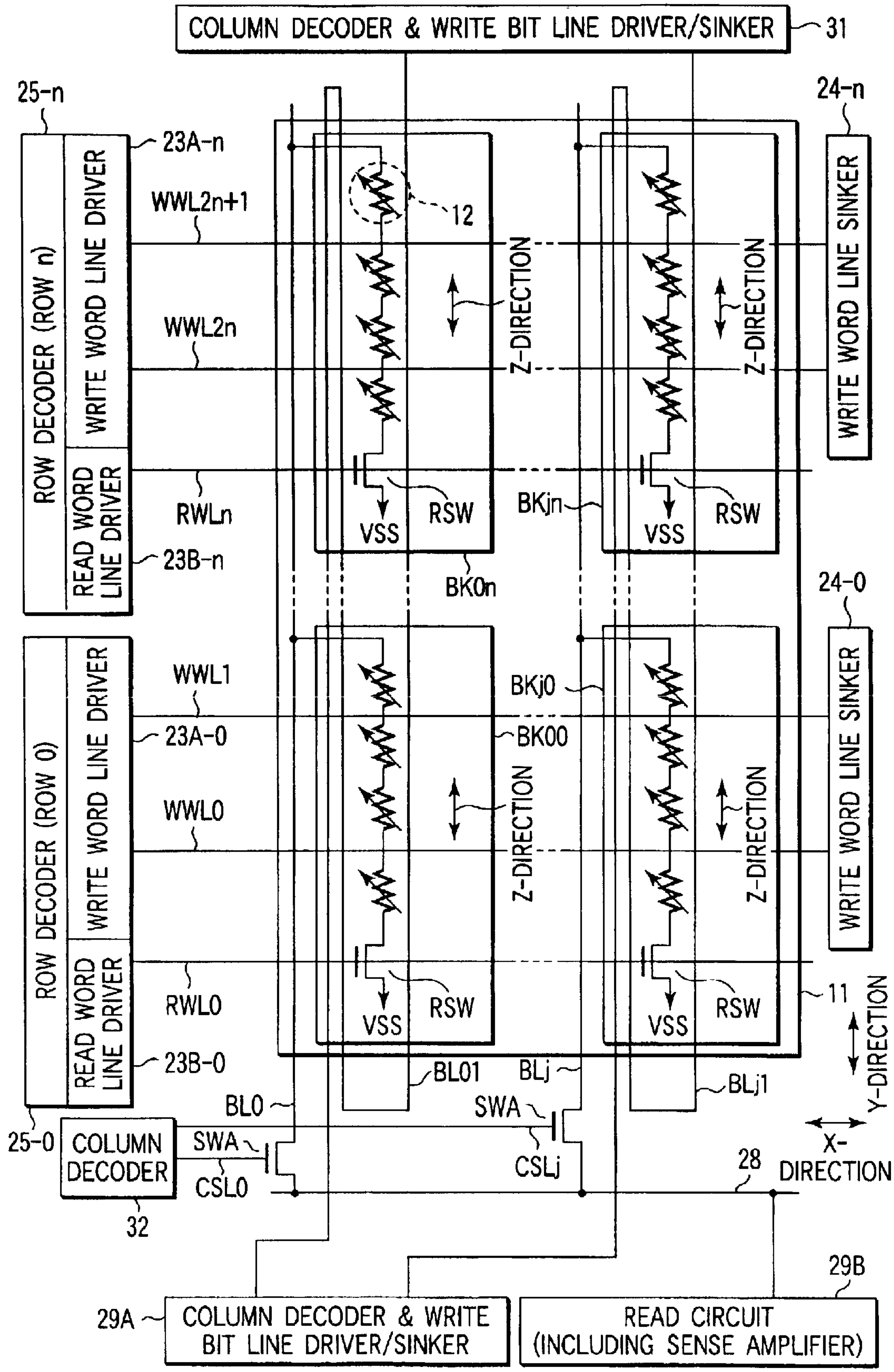
Figure 227:
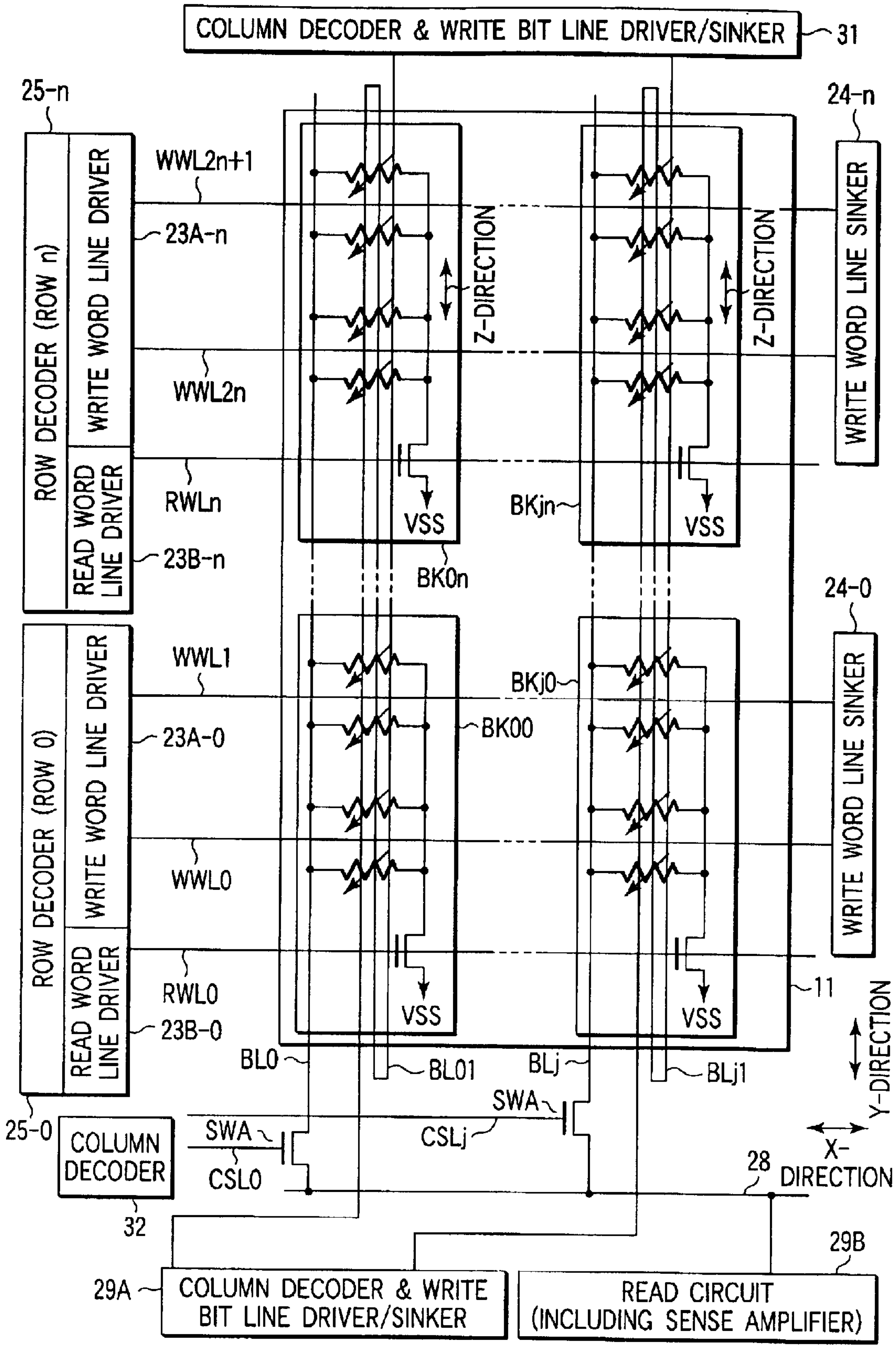

FIG. 132 is a sectional view showing one step in Manufacturing Method 2 of the present invention;

FIG. 133 is a sectional view showing one step in Manufacturing Method 2 of the present invention;

FIG. 134 is a sectional view showing one step in Manufacturing Method 2 of the present invention;

FIG. 135 is a sectional view showing one step in Manufacturing Method 2 of the present invention;

FIG. 136 is a sectional view showing one step in Manufacturing Method 2 of the present invention;

FIG. 137 is a sectional view showing one step in Manufacturing Method 2 of the present invention;

FIG. 138 is a plan view showing one step in Manufacturing Method 2 of the present invention;

FIG. 139 is a sectional view taken along a line CXXXIX—CXXXIX in FIG. 138;

FIG. 140 is a plan view showing one step in Manufacturing Method 2 of the present invention;

FIG. 141 is a sectional view taken along a line CXLI—CXLI in FIG. 140;

FIG. 142 is a sectional view showing one step in Manufacturing Method 2 of the present invention;

FIG. 143 is a sectional view showing one step in Manufacturing Method 2 of the present invention;

FIG. 144 is a sectional view showing one step in Manufacturing Method 2 of the present invention;

FIG. 145 is a plan view showing one step in Manufacturing Method 2 of the present invention;

FIG. 146 is a sectional view taken along a line CXLVI—CXLVI in FIG. 145;

FIG. 147 is a plan view showing one step in Manufacturing Method 2 of the present invention;

FIG. 148 is a sectional view taken along a line CXLVIII—CXLVIII in FIG. 147;

FIG. 149 is a sectional view showing one step in Manufacturing Method 2 of the present invention;

FIG. 150 is a sectional view showing one step in Manufacturing Method 2 of the present invention;

FIG. 151 is a sectional view showing one step in Manufacturing Method 2 of the present invention;

FIG. 152 is a sectional view showing one step in Manufacturing Method 2 of the present invention;

FIG. 153 is a sectional view showing one step in Manufacturing Method 2 of the present invention;

FIG. 154 is a plan view showing one step in Manufacturing Method 2 of the present invention;

FIG. 155 is a sectional view taken along a line CLV—CLV in FIG. 154;

FIG. 156 is a plan view showing one step in Manufacturing Method 2 of the present invention;

FIG. 157 is a sectional view taken along a line CLVII—CLVII in FIG. 156;

FIG. 158 is a sectional view showing one step in Manufacturing Method 2 of the present invention;

FIG. 159 is a sectional view showing one step in Manufacturing Method 2 of the present invention;

FIG. 160 is a sectional view showing one step in Manufacturing Method 2 of the present invention;

FIG. 161 is a plan view showing one step in Manufacturing Method 2 of the present invention;

FIG. 162 is a sectional view taken along a line CLXII—CLXII in FIG. 161;

FIG. 163 is a plan view showing one step in Manufacturing Method 2 of the present invention;

FIG. 164 is a sectional view taken along a line CLXIV—CLXIV in FIG. 163;

FIG. 165 is a sectional view showing one step in Manufacturing Method 2 of the present invention;

FIG. 166 is a sectional view showing one step in Manufacturing Method 2 of the present invention;

FIG. 167 is a sectional view showing one step in Manufacturing Method 2 of the present invention;

FIG. 168 is a plan view showing one step in Manufacturing Method 2 of the present invention;

FIG. 169 is a sectional view taken along a line CLXIX—CLXIX in FIG. 168;

FIG. 170 is a plan view showing one step in Manufacturing Method 2 of the present invention;

FIG. 171 is a sectional view taken along a line CLXXVI—CLXXVI in FIG. 170;

FIG. 172 is a view showing a device structure to which Manufacturing Method 3 of the present invention is applied;

FIG. 173 is a sectional view showing one step in Manufacturing Method 3 of the present invention;

FIG. 174 is a sectional view showing one step in Manufacturing Method 3 of the present invention;

FIG. 175 is a plan view showing one step in Manufacturing Method 3 of the present invention;

FIG. 176 is a sectional view taken along a line CLXXVI—CLXXVI in FIG. 175;

FIG. 177 is a sectional view showing one step in Manufacturing Method 3 of the present invention;

FIG. 178 is a sectional view showing one step in Manufacturing Method 3 of the present invention;

FIG. 179 is a sectional view showing one step in Manufacturing Method 3 of the present invention;

FIG. 180 is a sectional view showing one step in Manufacturing Method 3 of the present invention;

FIG. 181 is a sectional view showing one step in Manufacturing Method 3 of the present invention;

FIG. 182 is a sectional view showing one step in Manufacturing Method 3 of the present invention;

FIG. 183 is a plan view showing one step in Manufacturing Method 3 of the present invention;

FIG. 184 is a sectional view taken along a line CLXXXIV—CLXXXIV in FIG. 183;

FIG. 185 is a plan view showing one step in Manufacturing Method 3 of the present invention;

FIG. 186 is a sectional view taken along a line CLXXXVI—CLXXXVI in FIG. 185;

FIG. 187 is a sectional view showing one step in Manufacturing Method 3 of the present invention;

FIG. 188 is a sectional view showing one step in Manufacturing Method 3 of the present invention;

FIG. 189 is a sectional view showing one step in Manufacturing Method 3 of the present invention;

FIG. 190 is a plan view showing one step in Manufacturing Method 3 of the present invention;

FIG. 191 is a sectional view taken along a line CXCI—CXCI in FIG. 190;

FIG. 192 is a plan view showing one step in Manufacturing Method 3 of the present invention;

FIG. 193 is a sectional view taken along a line CXCIII—CXCIII in FIG. 192;

FIG. 194 is a sectional view showing one step in Manufacturing Method 3 of the present invention;

FIG. 195 is a sectional view showing one step in Manufacturing Method 3 of the present invention;

FIG. 196 is a sectional view showing one step in Manufacturing Method 3 of the present invention;

FIG. 197 is a sectional view showing one step in Manufacturing Method 3 of the present invention;

FIG. 198 is a sectional view showing one step in Manufacturing Method 3 of the present invention;

FIG. 199 is a plan view showing one step in Manufacturing Method 3 of the present invention;

FIG. 200 is a sectional view taken along a line CC—CC in FIG. 199;

FIG. 201 is a plan view showing one step in Manufacturing Method 3 of the present invention;

FIG. 202 is a sectional view taken along a line CCII—CCII in FIG. 201;

FIG. 203 is a sectional view showing one step in Manufacturing Method 3 of the present invention;

FIG. 204 is a sectional view showing one step in Manufacturing Method 3 of the present invention;

FIG. 205 is a sectional view showing one step in Manufacturing Method 3 of the present invention;

FIG. 206 is a plan view showing one step in Manufacturing Method 3 of the present invention;

FIG. 207 is a sectional view taken along a line CCVII—CCVII in FIG. 206;

FIG. 208 is a plan view showing one step in Manufacturing Method 3 of the present invention;

FIG. 209 is a sectional view taken along a line CCIX—CCIX in FIG. 208;

FIG. 210 is a sectional view showing one step in Manufacturing Method 3 of the present invention;

FIG. 211 is a sectional view showing one step in Manufacturing Method 3 of the present invention;

FIG. 212 is a sectional view showing one step in Manufacturing Method 3 of the present invention;

FIG. 213 is a plan view showing one step in Manufacturing Method 3 of the present invention;

FIG. 214 is a sectional view taken along a line CCXIV—CCXIV in FIG. 213;

FIG. 215 is a plan view showing one step in Manufacturing Method 3 of the present invention;

FIG. 216 is a sectional view taken along a line CCXVI—CCXVI in FIG. 215;

FIG. 217 is a circuit diagram showing a structural example obtained by partially changing Structural Example 1;

FIG. 218 is a circuit diagram showing another structural example obtained by partially changing Structural Example 1;

FIG. 219 is a circuit diagram showing a structural example obtained by partially changing Structural Example 2;

FIG. 220 is a circuit diagram showing another structural example obtained by partially changing Structural Example 2;

FIG. 221 is a circuit diagram showing a structural example obtained by partially changing Structural Example 3;

FIG. 222 is a circuit diagram showing another structural example obtained by partially changing Structural Example 3;

FIG. 223 is a circuit diagram showing a structural example obtained by partially changing Structural Example 4;

FIG. 224 is a circuit diagram showing another structural example obtained by partially changing Structural Example 4;

FIG. 225 is a circuit diagram showing still another structural example obtained by partially changing Structural Example 4;

FIG. 226 is a circuit diagram showing a structural example obtained by partially changing Structural Example 5;

FIG. 227 is a circuit diagram showing another structural example obtained by partially changing Structural Example 5; and FIG. 228 is a circuit diagram showing still another structural example obtained by partially changing Structural Example 5.

DETAILED DESCRIPTION OF THE INVENTION

A magnetic random access memory of an aspect of the present invention will be described below in detail with reference to the accompanying drawings.

1. Cell Array Structure

First, a cell array structure of a magnetic random access memory of an aspect of the present invention will be described below in detail.

(1) Structural Example 1

Structural Example 1 is related to a cell array structure in which a plurality of TMR elements stacked at a plurality of stages are connected in series.

① Circuit Structure

The circuit structure will be described first.

FIG. 1 shows main part of a magnetic random access memory as Structural Example 1 of the present invention.

A memory cell array 11 has a plurality of TMR elements 12 arrayed in the X-, Y-, and Z-directions. The Z-direction means a direction perpendicular to the X- and Y-directions, i.e., a direction perpendicular to the surface of the drawing sheet.

In this example, the memory cell array 11 has a cell array structure formed from (j+1) TMR elements 12 arranged in the X-direction, (n+1) TMR elements 12 arranged in the Y-direction, and four TMR elements 12 stacked in the Z-direction. In this example, the number of TMR elements 12 stacked in the Z-direction is four. However, the number of TMR elements stacked in the Z-direction is not particularly limited as long as the number is two or more.

The four TMR elements 12 stacked in the Z-direction are connected in series to form one block BKik (i=0, 1, . . . , j, k=0, 1, . . . , n). In fact, the four TMR elements 12 in the block BKik overlap one another in the direction (Z-direction) perpendicular to the page surface.

One terminal of each of the four TMR elements 12 in the block BKik is connected to a ground point through a read select switch (MOS transistor) RSW.

In this example, one row is constructed by (j+1) blocks BKik arranged in the X-direction. The memory cell array 11 has (n+1) rows. In addition, one column is constructed by (n+1) blocks BKik arranged in the Y-direction. The memory cell array 11 has (j+1) columns.

A plurality of (in this example, three) write word lines WWL3*n*, WWL3*n*+1, and WWL3*n*+2 that extend in the X-direction and are stacked in the Z-direction are arranged near the four TMR elements 12 of the block BKik. Here, n indicates a row number (n=0, 1, 2, . . . )

As for the write word lines extending in the X-direction, for example, one write word line can be arranged at one stage in one row, as shown in FIG. 217. In this case, the number of write word lines in one row extending in the X-direction is four (WWL4*n*, WWL4*n*+1, WWL4*n*+2, and WWL4*n*+3), i.e., the same as the number of stages of the stacked TMR elements 12.

As for write bit lines extending in the Y-direction as well, for example, one write bit line can be arranged at one stage in one column, as shown in FIG. 217. In this case, the number of write bit lines in one column extending in the Y-direction is four (BLj0, BLj1, BLj2, and BLj3), i.e., the same as the number of stages of the stacked TMR elements 12.

In this example, however, at least one of the write word lines in one row extending in the X-direction is shared by two TMR elements (a TMR element at the upper stage and a TMR element at the lower stage). More specifically, in this example, the write word line WWL3*n*+1 is shared by TMR elements at the second and third stages. In this case, the number of write word lines in one row extending in the X-direction decreases. For this reason, the insulating film immediately under the TMR elements 12 can be planarized. In addition, the manufacturing cost can be reduced.

In consideration of a block structure, for example, one write word line can be shared by TMR elements at the first and second stages, and one write word line can be shared by TMR elements at the third and fourth stages, as shown in FIG. 218. In this case, the number of write word lines in one row extending in the X-direction can be reduced to two (WWL2*n* and WWL2*n*+1).

Nevertheless, the number of write word lines in one row extending in the X-direction is three in this example. This is because the position of a write bit line in one column extending in the Y-direction is taken into consideration.

That is, in this example, one write bit line BLj0 extending in the Y-direction is arranged between the TMR elements 12 at the first stage and those at the second stage. One write bit line BLj1 extending in the Y-direction is arranged between the TMR elements 12 at the third stage and those at the fourth stage.

Consequently, as for the write bit lines on one column extending in the Y-direction, one write bit line is shared by TMR elements at the first and second stages. In addition, one write bit line is shared by TMR elements at the third and fourth stages. In this case, the number of write bit lines extending in the Y-direction is two.

Referring to FIG. 1, since the TMR elements 12 cannot be three-dimensionally expressed, the two write bit lines BLj0 and BLj1 are expressed to sandwich the four TMR elements 12 in a block BKjn. In fact, one write bit line BLj0 is arranged between the TMR elements at the first stage and those at the second stage, and one write bit line BLj1 is arranged between the TMR elements at the third stage and those at the fourth stage, as described above.

Each TMR element in a block and a detailed structure near it will become apparent from a device structure (to be described later).

One end of each of the write word lines WWL3*n*, WWL3*n*+1, and WWL3*n*+2 extending in the X-direction is connected to a write word line driver 23A-*n*. The other end is connected to a write word line sinker 24-*n*.

The gate of the read select switch RSW is connected to a read word line RWLn (n=0, 1, 2, . . . ) One read word line RWLn corresponds to one block BKik in one column and is common to a plurality of blocks BKik arranged in the X-direction.

For example, when one column is formed from four blocks, the number of read word lines RWLn is four. The read word line RWLn extends in the X-direction. One end of the read word line RWLn is connected to a read word line driver 23B-*n*.

In write operation, a row decoder 25-*n* selects one of the write word lines WWL3*n*, WWL3*n*+1, and WWL3*n*+2 on the basis of a row address signal. The write word line driver 23A-*n* supplies a write current to the selected write word line. The write current flows through the selected word line and is absorbed by the write word line sinker 24-*n*.

In read operation, the row decoder 25-*n* selects a block in one row on the basis of, e.g., high order bits of a row address signal. The read word line driver 23B-*n* applies a read word line voltage to the read word line RWLn connected to a selected block BK. In the selected block BK, the read select switch RSW is turned on. For this reason, a read current flows to the ground terminal through the plurality of TMR elements in the selected block BK.

The other terminal of each of the four TMR elements 12 in the block BKik is connected to a read bit line BLj. One end of the read bit line BLj is connected to a common data line 28 through a column select switch (MOS transistor) SWA. The common data line 28 is connected to a read circuit (including a sense amplifier) 29B.

One end of each of the write bit lines BLj0 and BLj1 is connected to a circuit block 29A including a write bit line driver and write bit line sinker.

The other end of each of the write bit lines BLj0 and BLj1 is connected to a circuit block 31 including a write bit line driver and write bit line sinker.

A column select line signal CSLj (j=0, 1, . . . ) is input to the column select switch SWA. A column decoder 32 outputs the column select line signal CSLj.

In the magnetic random access memory of this example, one column is formed from a plurality of blocks. One read operation is executed for each block. Additionally, one block is formed from a plurality of TMR elements stacked at a plurality of stages and connected in series.

In such a cell array structure, the TMR elements are three-dimensionally arranged on a semiconductor substrate. In addition, since one MOS transistor (read select switch) corresponds to a plurality of TMR elements, this cell array structure can eventually contribute to increase the memory capacity.

② Device Structure

The device structure will be described next.

FIGS. 2 and 3 show a device structure corresponding to one block of the magnetic random access memory as Structural Example 1 of the present invention.

FIG. 2 shows the Y-direction section of one block of the magnetic random access memory. FIG. 3 shows the X-direction section of one block of the magnetic random access memory. The same reference numerals as in FIG. 1 denote the same circuit elements in FIGS. 2 and 3 to show the correspondence between the elements.

The read select switch (MOS transistor) RSW is arranged on the surface region of a semiconductor substrate 41. The source of the read select switch RSW is connected to the ground terminal through a source line SL. The source line SL extends straight in, e.g., the X-direction.

The gate of the read select switch (MOS transistor) RSW serves as the read word line RWLn. The read word line RWLn extends in the X-direction. Four TMR elements (MTJ (Magnetic Tunnel Junction) elements) MTJ1, MTJ2, MTJ3, and MTJ4 are stacked on the read select switch RSW.

The TMR elements MTJ1, MTJ2, MTJ3, and MTJ4 are arranged between lower electrodes 41A1, 41A2, 41A3, and 41A4 and upper electrodes 41B1, 41B2, 41B3, and 41B4, respectively. Contact plugs 42B, 42C, 42D, 42E, and 42F connect the four TMR elements MTJ1, MTJ2, MTJ3, and MTJ4 in series.

The lower electrode 41A1 of the TMR element MTJ1 at the lowermost stage is connected to the drain of the read select switch (MOS transistor) RSW through a contact plug 42A, the contact plug 42B and an intermediate layer 43. The upper electrode 41B4 of the TMR element MTJ4 at the uppermost stage is connected to the read bit line BLj extending in the Y-direction through the contact plug 42F.

The write word line WWL3*n* is arranged right under the TMR element MTJ1. The write word line WWL3*n*+1 is arranged between the TMR elements MTJ2 and MTJ3. The write word line WWL3*n*+2 is arranged right above the TMR element MTJ4. The write word lines WWL3*n*, WWL3*n*+1, and WWL3*n*+2 extend in the X-direction.

The write bit line BLj0 is arranged between the TMR elements MTJ1 and MTJ2. The write bit line BLj1 is arranged between the TMR elements MTJ3 and MTJ4. The write bit lines BLj0 and BLj1 extend in the Y-direction.

According to this device structure, a plurality of (in this example, four) TMR elements MTJ1, MTJ2, MTJ3, and MTJ4 are arranged in correspondence with one read select switch RSW. These TMR elements MTJ1, MTJ2, MTJ3, and MTJ4 are stacked on the read select switch RSW and connected in series.

In this case, only one read bit line BLj formed on the uppermost layer suffices. At least one of the write word lines WWL3*n*, WWL3*n*+1, and WWL3*n*+2 and at least one of the write bit lines BLj0 and BLj1 can be shared by two TMR elements.

This device structure can contribute to increase the memory capacity because the TMR elements can be arranged on the semiconductor substrate at a high density. In addition, since the number of interconnections (write word lines, write bit lines, read bit lines, and the like) arranged in the TMR element array can be decreased, the insulating film right under the TMR elements can be planarized, and the characteristics of the TMR element can be improved.

③ Modifications

Modifications to Structural Example 1 will be described.

Figure 4:
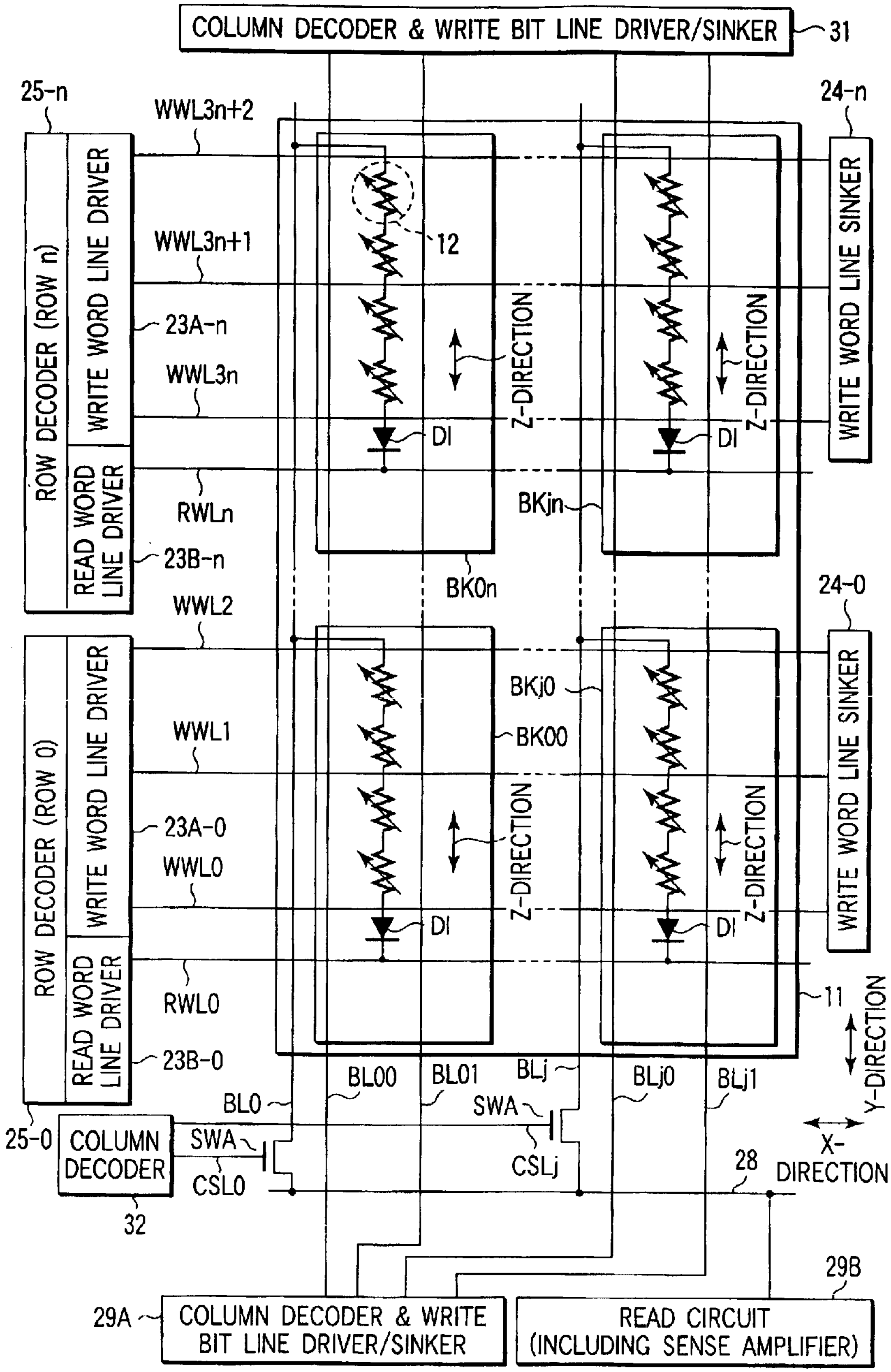
FIG. 4 is a circuit diagram showing a first modification to Structural Example 1.
Figure 5:
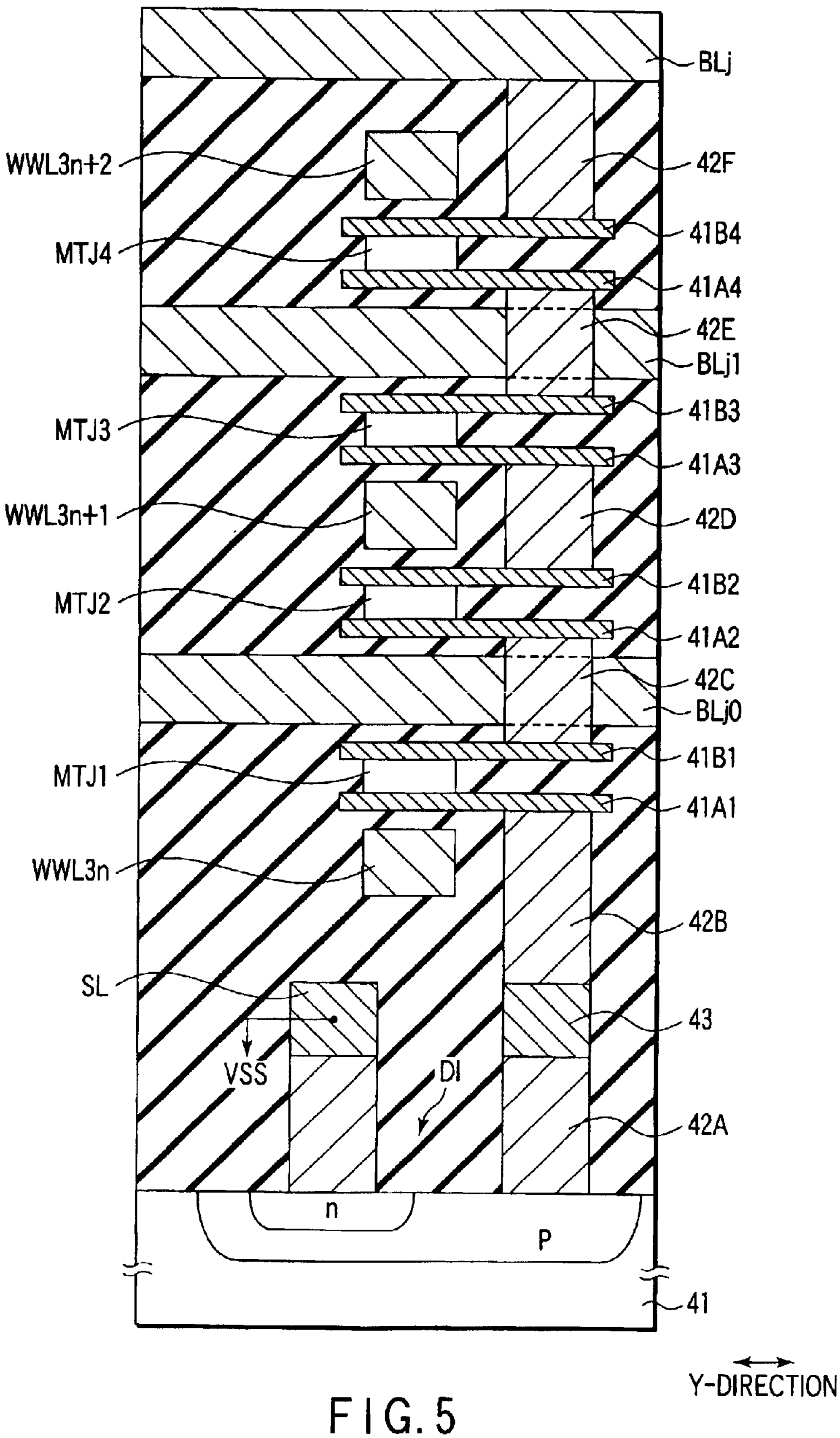
FIG. 5 is a sectional view showing the first modification to Structural Example 1.

FIGS. 4 and 5 show a first modification to Structural Example 1.

The circuit diagram of FIG. 4 corresponds to that of FIG. 1. The sectional view of the device structure shown in FIG. 5 corresponds to that in FIG. 2. The structure of this modification is different from the structure shown in FIGS. 1 to 3 in an element that implements the read select switch.

In the structure shown in FIGS. 1 to 3, the read select switch is formed from a MOS transistor. In the structure of this modification, the read select switch is formed from a diode DI. Hence, read word lines RWL0, . . . , RWLn are connected to the cathodes of the diodes DI.

When the structure of this modification is employed, in read operation, a read word line RWLi of the selected row is set at "L", i.e., the ground potential. At this time, a read current can be supplied to a plurality of series-connected TMR elements of the blocks of the selected row.

Figure 6:
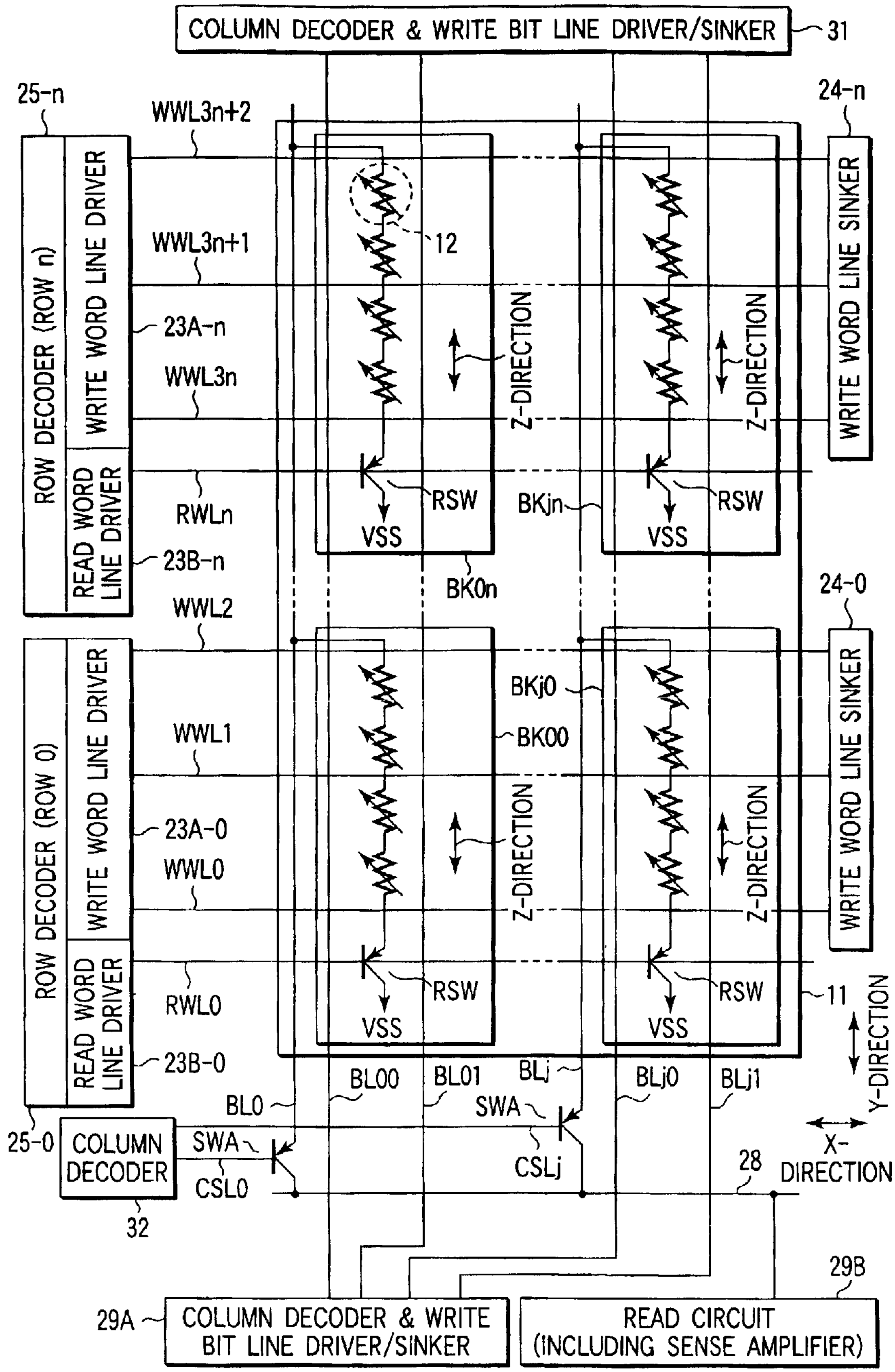
FIG. 6 is a circuit diagram showing a second modification to Structural Example 1.

FIGS. 6 and 7 show a second modification to Structural Example 1.

The circuit diagram of FIG. 6 corresponds to that of FIG. 1. The sectional view of the device structure shown in FIG. 7 corresponds to that in FIG. 2. The structure of this modification is different from the structure shown in FIGS. 1 to 3 in the type of transistors that form the memory cell array 11 and its peripheral circuits.

In the structure shown in FIGS. 1 to 3, the transistors that form the memory cell array 11 and its peripheral circuits are MOS transistors. In the structure of this modification, the transistors that form the memory cell array 11 and its peripheral circuits are bipolar transistors.

In the structure of this modification, all the transistors that form the memory cell array 11 and its peripheral circuits may be bipolar transistors, or some of them may be bipolar transistors.

(2) Structural Example 2

Structural Example 2 is related to a cell array structure in which a plurality of TMR elements stacked at a plurality of stages are connected in parallel.

① Circuit Structure

The circuit structure will be described first.

FIG. 8 shows main part of a magnetic random access memory as Structural Example 2 of the present invention.

A memory cell array 11 has a plurality of TMR elements 12 arrayed in the X-, Y-, and Z-directions. The Z-direction means a direction perpendicular to the X- and Y-directions, i.e., a direction perpendicular to the surface of the drawing sheet.

The memory cell array 11 has a cell array structure formed from (j+1) TMR elements 12 arranged in the X-direction, (n+1) TMR elements 12 arranged in the Y-direction, and four TMR elements 12 stacked in the Z-direction. In this example, the number of TMR elements 12 stacked in the Z-direction is four. However, the number of TMR elements stacked in the Z-direction is not particularly limited as long as the number is two or more.

The four TMR elements 12 stacked in the Z-direction are connected in parallel to form one block BKik (i=0, 1, . . . , j, k=0, 1, . . . , n). In fact, the four TMR elements 12 in the block BKik overlap one another in the direction (Z-direction) perpendicular to the page surface.

One terminal of each of the four TMR elements 12 in the block BKik is connected to a ground point through a read select switch (MOS transistor) RSW.

In this example, one row is constructed by (j+1) blocks BKik arranged in the X-direction. The memory cell array 11 has (n+1) rows. In addition, one column is constructed by (n+1) blocks BKik arranged in the Y-direction. The memory cell array 11 has (j+1) columns.

A plurality of (in this example, three) write word lines WWL3*n*, WWL3*n*+1, and WWL3*n*+2 that extend in the X-direction and are stacked in the Z-direction are arranged near the four TMR elements 12 of the block BKik. Here, n indicates a row number (n=0, 1, 2, . . . )

As for the write word lines extending in the X-direction, for example, one write word line can be arranged at one stage in one row, as shown in FIG. 219. In this case, the number of write word lines in one row extending in the X-direction is four (WWL4*n*, WWL4*n*+1, WWL4*n*+2, and WWL4*n*+3), i.e., the same as the number of stages of the stacked TMR elements 12.

As for write bit lines extending in the Y-direction as well, for example, one write bit line can be arranged at one stage in one column, as shown in FIG. 219. In this case, the number of write bit lines in one column extending in the Y-direction is four (BLj0, BLj1, BLj2, and BLj3), i.e., the same as the number of stages of the stacked TMR elements 12.

In this example, however, at least one of the write word lines in one row extending in the X-direction is shared by two TMR elements (a TMR element at the upper stage and a TMR element at the lower stage). More specifically, in this example, the write word line WWL3*n*+1 is shared by TMR elements at the second and third stages. In this case, the number of write word lines in one row extending in the X-direction decreases. For this reason, the insulating film immediately under the TMR elements 12 can be planarized. In addition, the manufacturing cost can be reduced.

In consideration of a block structure, for example, one write word line can be shared by TMR elements at the first and second stages, and one write word line can be shared by TMR elements at the third and fourth stages, as shown in FIG. 220. In this case, the number of write word lines in one row extending in the X-direction can be reduced to two (WWL2*n* and WWL2*n*+1).

Nevertheless, the number of write word lines in one row extending in the X-direction is three in this example. This is because the position of a write bit line in one column extending in the Y-direction is taken into consideration.

That is, in this example, one write bit line BLj0 extending in the Y-direction is arranged between the TMR elements 12 at the first stage and those at the second stage. One write bit line BLj1 extending in the Y-direction is arranged between the TMR elements 12 at the third stage and those at the fourth stage.

Consequently, as for the write bit lines on one column extending in the Y-direction, one write bit line is shared by TMR elements at the first and second stages. In addition, one write bit line is shared by TMR elements at the third and fourth stages. In this case, the number of write bit lines extending in the Y-direction is two.

Referring to FIG. 8, since the TMR elements 12 cannot be three-dimensionally expressed, the two write bit lines BLj0 and BLj1 are expressed to cross the four TMR elements 12 in a block BKjn. In fact, one write bit line BLj0 is arranged between the TMR elements at the first stage and those at the second stage, and one write bit line BLj1 is arranged between the TMR elements at the third stage and those at the fourth stage, as described above.

Each TMR element in a block and a detailed structure near it will become apparent from a device structure (to be described later).

One end of each of the write word lines WWL3*n*, WWL3*n*+1, and WWL3*n*+2 extending in the X-direction is connected to a write word line driver 23A-*n*. The other end is connected to a write word line sinker 24-*n*.

The gate of the read select switch RSW is connected to a read word line RWLn (n=0, 1, 2, . . . ) One read word line RWLn corresponds to one block BKik in one column and is common to a plurality of blocks BKik arranged in the X-direction.

For example, when one column is formed from four blocks, the number of read word lines RWLn is four. The read word line RWLn extends in the X-direction. One end of the read word line RWLn is connected to a read word line driver 23B-*n*.

In write operation, a row decoder 25-*n* selects one of the write word lines WWL3*n*, WWL3*n*+1, and WWL3*n*+2 on the basis of a row address signal. The write word line driver 23A-*n* supplies a write current to the selected write word line. The write current flows through the selected word line and is absorbed by the write word line sinker 24-*n*.

In read operation, the row decoder 25-*n* selects a block in one row on the basis of, e.g., high order bits of a row address signal. The read word line driver 23B-*n* applies a read word line voltage to the read word line RWLn connected to a selected block BK. In the selected block BK, the read select switch RSW is turned on. For this reason, a read current flows to the ground terminal through the plurality of TMR elements in the selected block BK.

The other terminal of each of the four TMR elements 12 in the block BKik is connected to a read bit line BLj. One end of the read bit line BLj is connected to a common data line 28 through a column select switch (MOS transistor) SWA. The common data line 28 is connected to a read circuit (including a sense amplifier) 29B.

One end of each of the write bit lines BLj0 and BLj1 is connected to a circuit block 29A including a write bit line driver and write bit line sinker.

The other end of each of the write bit lines BLj0 and BLj1 is connected to a circuit block 31 including a write bit line driver and write bit line sinker.

A column select line signal CSLj (j=0, 1, . . . ) is input to the column select switch SWA. A column decoder 32 outputs the column select line signal CSLj.

In the magnetic random access memory of this example, one column is formed from a plurality of blocks. One read operation is executed for each block. Additionally, one block is formed from a plurality of TMR elements stacked at a plurality of stages and connected in parallel.

In such a cell array structure, the TMR elements are three-dimensionally arranged on a semiconductor substrate. In addition, since one MOS transistor (read select switch) corresponds to a plurality of TMR elements, this cell array structure can eventually contribute to increase the memory capacity.

② Device Structure

The device structure will be described next.

FIGS. 9 and 10 show a device structure corresponding to one block of the magnetic random access memory as Structural Example 2 of the present invention.

FIG. 9 shows the Y-direction section of one block of the magnetic random access memory. FIG. 10 shows the X-direction section of one block of the magnetic random access memory. The same reference numerals as in FIG. 8 denote the same circuit elements in FIGS. 9 and 10 to show the correspondence between the elements.

The read select switch (MOS transistor) RSW is arranged on the surface region of a semiconductor substrate 41. The source of the read select switch RSW is connected to the ground terminal through a source line SL. The source line SL extends straight in, e.g., the X-direction.

The gate of the read select switch (MOS transistor) RSW serves as the read word line RWLn. The read word line RWLn extends in the X-direction. Four TMR elements (MTJ (Magnetic Tunnel Junction) elements) MTJ1, MTJ2, MTJ3, and MTJ4 are stacked on the read select switch RSW.

The TMR elements MTJ1, MTJ2, MTJ3, and MTJ4 are arranged between lower electrodes 41A1, 41A2, 41A3, and 41A4 and upper electrodes 41B1, 41B2, 41B3, and 41B4, respectively. Contact plugs 42C1, 42C2, 42D1, 42D2, 42E1, and 42E2 connect the four TMR elements MTJ1, MTJ2, MTJ3, and MTJ4 in parallel.

The lower electrode 41A1 of the TMR element MTJ1 at the lowermost stage is connected to the drain of the read select switch (MOS transistor) RSW through contact plugs 42A and 42B and an intermediate layer 43. The upper electrode 41B4 of the TMR element MTJ4 at the uppermost stage is connected to the read bit line BLj extending in the Y-direction through a contact plug 42F.

The write word line WWL3*n* is arranged right under the TMR element MTJ1. The write word line WWL3*n*+1 is arranged between the TMR elements MTJ2 and MTJ3. The write word line WWL3*n*+2 is arranged right above the TMR element MTJ4. The write word lines WWL3*n*, WWL3*n*+1, and WWL3*n*+2 extend in the X-direction.

The write bit line BLj0 is arranged between the TMR elements MTJ1 and MTJ2. The write bit line BLj1 is arranged between the TMR elements MTJ3 and MTJ4. The write bit lines BLj0 and BLj1 extend in the Y-direction.

According to this device structure, a plurality of (in this example, four) TMR elements MTJ1, MTJ2, MTJ3, and MTJ4 are arranged in correspondence with one read select switch RSW. These TMR elements MTJ1, MTJ2, MTJ3, and MTJ4 are stacked on the read select switch RSW and connected in parallel.

In this case, only one read bit line BLj formed on the uppermost layer suffices. At least one of the write word lines WWL3*n*, WWL3*n*+1, and WWL3*n*+2 and at least one of the write bit lines BLj0 and BLj1 can be shared by two TMR elements.

This device structure can contribute to increase the memory capacity because the TMR elements can be arranged on the semiconductor substrate at a high density. In addition, since the number of interconnections (write word lines, write bit lines, read bit lines, and the like) arranged in the TMR element array can be decreased, the insulating film right under the TMR elements can be planarized, and the characteristics of the TMR element can be improved.

③ Modifications

Modifications to Structural Example 2 will be described.

Figure 11:
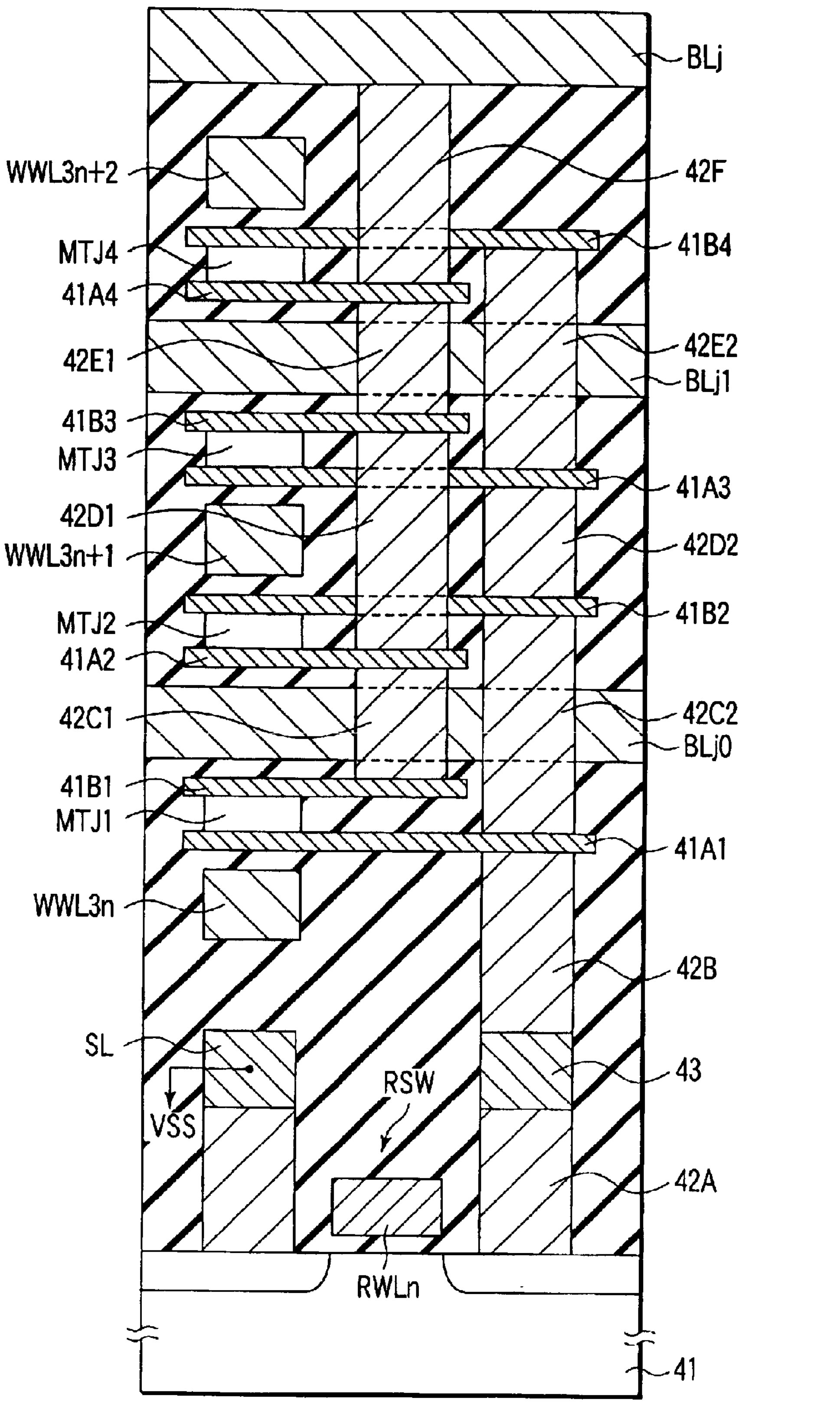
FIG. 11 is a sectional view showing a first modification to Structural Example 2.

FIG. 11 shows a first modification to Structural Example 2.

FIG. 11 corresponds to FIG. 9. The device structure of this modification is different from that in FIG. 9 in the position where the TMR elements MTJ1, MTJ2, MTJ3, and MTJ4 stacked.

In the device structure shown in FIG. 9, the TMR elements MTJ1, MTJ2, MTJ3, and MTJ4 are stacked right above the gate electrode of the read select switch (MOS transistor) RSW, i.e., the read word line RWLn.

In this case, the lower electrodes 41A1 and 41A3 and upper electrodes 41B2 and 41B4 extend from the TMR elements to one side. The lower electrodes 41A2 and 41A4 and upper electrodes 41B1 and 41B3 extend from the TMR elements to the other side. In addition, contact portions with respect to the lower and upper electrodes are formed on both sides of each TMR element.

In the device structure of this modification, the TMR elements MTJ1, MTJ2, MTJ3, and MTJ4 are stacked right above the source line SL connected to the source of the read select switch (MOS transistor) RSW.

In this case, the lower electrodes 41A1, 41A2, 41A3, and 41A4 and upper electrodes 41B1, 41B2, 41B3, and 41B4 extend from the TMR elements to one side. In addition, contact portions with respect to the lower and upper electrodes are formed only on one side of each TMR element.

FIG. 12 is a plan view showing the positional relationship between the TMR element, the lower electrode, and the upper electrode in the device structure shown in FIG. 11.

In this modification, the shape of the lower electrodes 41A1 and 41A3 and upper electrodes 41B2 and 41B4 is different from that of the lower electrodes 41A2 and 41A4 and upper electrodes 41B1 and 41B3. In addition, parts of the lower electrodes 41A1 and 41A3 and upper electrodes 41B2 and 41B4, i.e., the portions that overlap the lower electrodes 41A2 and 41A4 and upper electrodes 41B1 and 41B3 are removed.

FIGS. 13 and 14 show a second modification to Structural Example 2.

The circuit diagram of FIG. 13 corresponds to that of FIG. 8. The sectional view of the device structure shown in FIG. 14 corresponds to that in FIG. 9. The structure of this modification is different from the structure shown in FIGS. 8 to 10 in an element that implements the read select switch.

In the structure shown in FIGS. 8 to 10, the read select switch is formed from a MOS transistor. In the structure of this modification, the read select switch is formed from a diode DI. Hence, read word lines RWL0, . . . , RWLn are connected to the cathodes of the diodes DI.

When the structure of this modification is employed, in read operation, a read word line RWLi of the selected row is set at "L", i.e., the ground potential. At this time, a read current can be supplied to a plurality of parallel-connected TMR elements of the blocks of the selected row.

Figure 15:
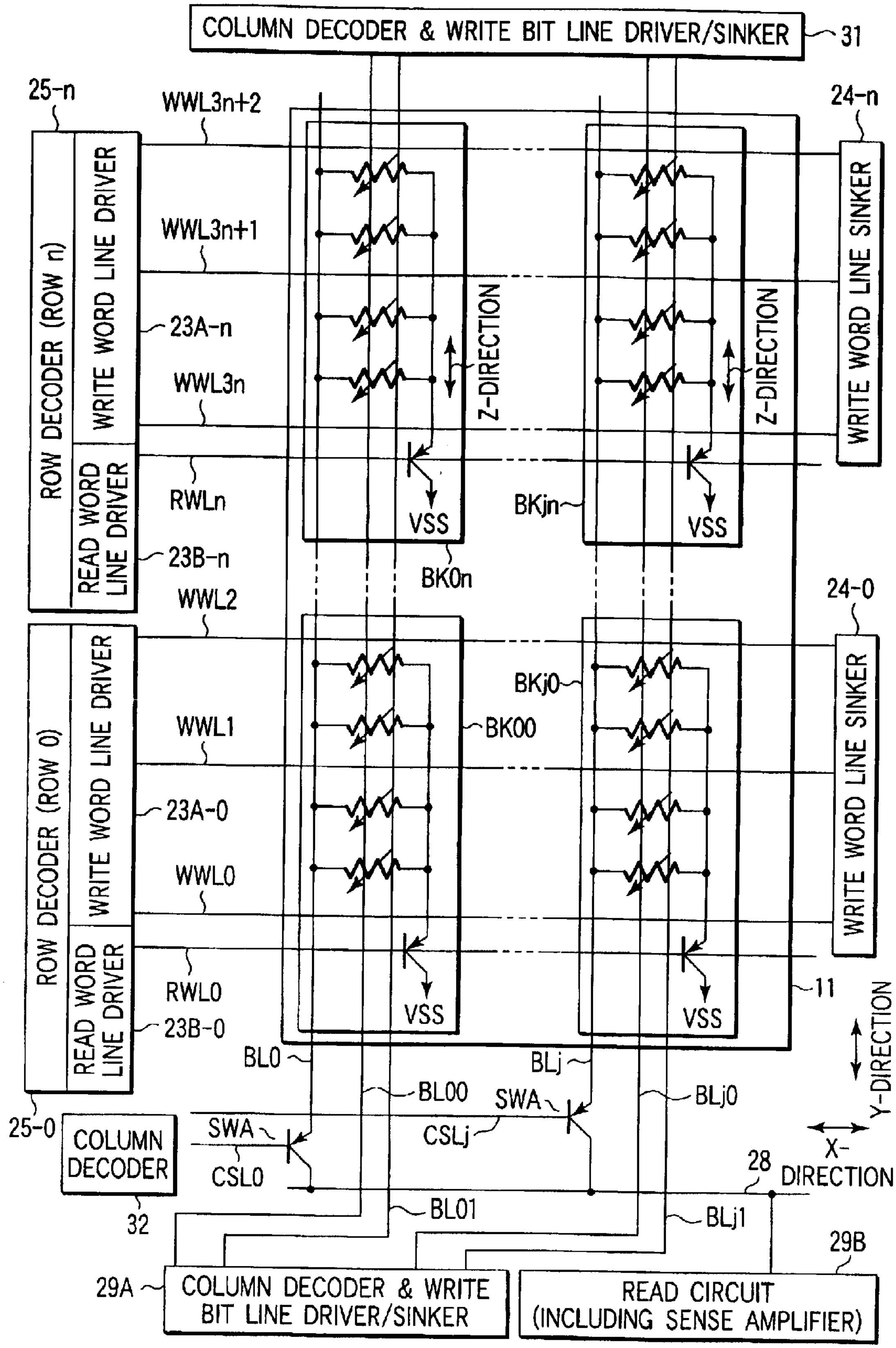
FIG. 15 is a circuit diagram showing a third modification to Structural Example 2.
Figure 16:
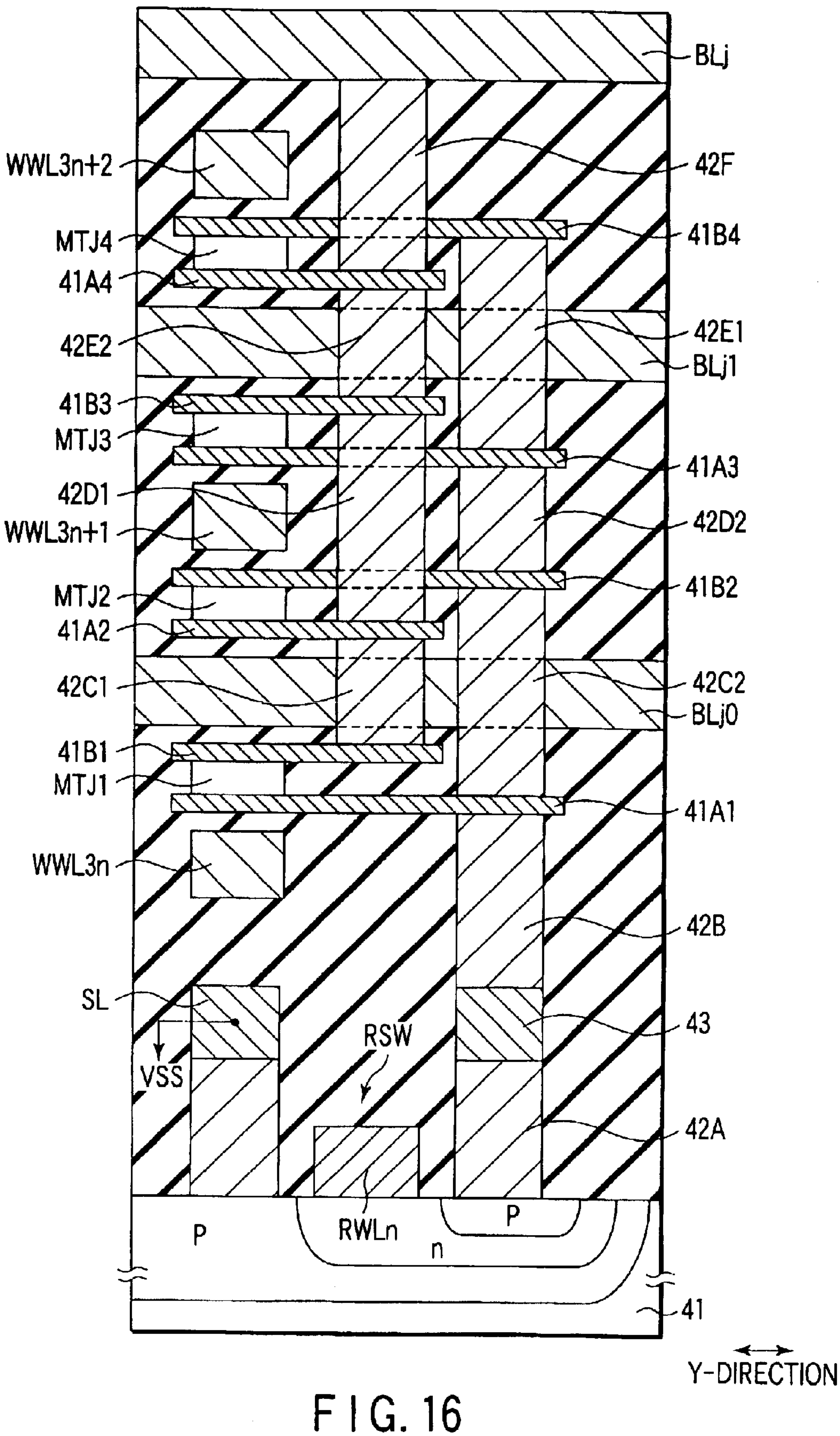
FIG. 16 is a sectional view showing the third modification to Structural Example 2.

FIGS. 15 and 16 show a third modification to Structural Example 2.

The circuit diagram of FIG. 15 corresponds to that of FIG. 8. The sectional view of the device structure shown in FIG. 16 corresponds to that in FIG. 9. The structure of this modification is different from the structure shown in FIGS. 8 to 10 in the type of transistors that form the memory cell array 11 and its peripheral circuits.

In the structure shown in FIGS. 8 to 10, the transistors that form the memory cell array 11 and its peripheral circuits are MOS transistors. In the structure of this modification, the transistors that form the memory cell array 11 and its peripheral circuits are bipolar transistors.

In the structure of this modification, all the transistors that form the memory cell array 11 and its peripheral circuits may be bipolar transistors, or some of them may be bipolar transistors.

(3) Structural Example 3

Structural Example 3 is related to a cell array structure in which a plurality of TMR elements stacked at a plurality of stages are connected in series-parallel.

① Circuit Structure

The circuit structure will be described first.

FIG. 17 shows main part of a magnetic random access memory as Structural Example 3 of the present invention.

A memory cell array 11 has a plurality of TMR elements 12 arrayed in the X-, Y-, and Z-directions. The Z-direction means a direction perpendicular to the X- and Y-directions, i.e., a direction perpendicular to the page surface.

The memory cell array 11 has a cell array structure formed from (j+1) TMR elements 12 arranged in the X-direction, (n+1) TMR elements 12 arranged in the Y-direction, and four TMR elements 12 stacked in the Z-direction. In this example, the number of TMR elements 12 stacked in the Z-direction is four. However, the number of TMR elements stacked in the Z-direction is not particularly limited as long as the number is two or more.

The four TMR elements 12 stacked in the Z-direction are connected in series-parallel to form one block BKik (i=0, 1, . . . , j, k=0, 1, . . . , n). In fact, the four TMR elements 12 in the block BKik overlap one another in the direction (Z-direction) perpendicular to the page surface.

In this example, the four TMR elements 12 in the block BKik are defined as first to fourth TMR elements. The first and second TMR elements are connected in parallel. The third and fourth TMR elements are connected in parallel. The parallel-connected first and second TMR elements and the parallel-connected third and fourth TMR elements are connected in series.

One terminal of each of the four TMR elements 12 in the block BKik is connected to the ground terminal through a read select switch (MOS transistor) RSW.

In this example, one row is constructed by (j+1) blocks BKik arranged in the X-direction. The memory cell array 11 has (n+1) rows. In addition, one column is constructed by (n+1) blocks BKik arranged in the Y-direction. The memory cell array 11 has (j+1) columns.

A plurality of (in this example, three) write word lines WWL3*n*, WWL3*n*+1, and WWL3*n*+2 that extend in the X-direction and are stacked in the Z-direction are arranged near the four TMR elements 12 of the block BKik. Here, n indicates a row number (n=0, 1, 2, . . . )

As for the write word lines extending in the X-direction, for example, one write word line can be arranged at one stage in one row, as shown in FIG. 221. In this case, the number of write word lines in one row extending in the X-direction is four (WWL4*n*, WWL4*n*+1, WWL4*n*+2, and WWL4*n*+3), i.e., the same as the number of stages of the stacked TMR elements 12.

As for write bit lines extending in the Y-direction as well, for example, one write bit line can be arranged at one stage in one column, as shown in FIG. 221. In this case, the number of write bit lines in one column extending in the Y-direction is four (BLj0, BLj1, BLj2, and BLj3), i.e., the same as the number of stages of the stacked TMR elements 12.

In this example, however, at least one of the write word lines in one row extending in the X-direction is shared by two TMR elements (a TMR element at the upper stage and a TMR element at the lower stage). More specifically, in this example, the write word line WWL3*n*+1 is shared by TMR elements at the second and third stages. In this case, the number of write word lines in one row extending in the X-direction decreases. For this reason, the insulating film right under the TMR elements 12 can be planarized. In addition, the manufacturing cost can be reduced.

In consideration of a block structure, for example, one write word line can be shared by TMR elements at the first and second stages, and one write word line can be shared by TMR elements at the third and fourth stages, as shown in FIG. 222. In this case, the number of write word lines in one row extending in the X-direction can be reduced to two (WWL2*n* and WWL2*n*+1).

Nevertheless, the number of write word lines in one row extending in the X-direction is three in this example. This is because the position of a write bit line in one column extending in the Y-direction is taken into consideration.

That is, in this example, one write bit line BLj0 extending in the Y-direction is arranged between the TMR elements 12 at the first stage and those at the second stage. One write bit line BLj1 extending in the Y-direction is arranged between the TMR elements 12 at the third stage and those at the fourth stage.

Consequently, as for the write bit lines on one column extending in the Y-direction, one write bit line is shared by TMR elements at the first and second stages. In addition, one write bit line is shared by TMR elements at the third and fourth stages. In this case, the number of write bit lines extending in the Y-direction is two.

Referring to FIG. 17, since the TMR elements 12 cannot be three-dimensionally expressed, the two write bit lines BLj0 and BLj1 are expressed to cross the four TMR elements 12 in a block BKjn. In fact, one write bit line BLj0 is arranged between the TMR elements at the first stage and those at the second stage, and one write bit line BLj1 is arranged between the TMR elements at the third stage and those at the fourth stage, as described above.

Each TMR element in a block and a detailed structure near it will become apparent from a device structure (to be described later).

One end of each of the write word lines WWL3*n*, WWL3*n*+1, and WWL3*n*+2 extending in the X-direction is connected to a write word line driver 23A-*n*. The other end is connected to a write word line sinker 24-*n*.

The gate of the read select switch RSW is connected to a read word line RWLn (n=0, 1, 2, . . . ) One read word line RWLn corresponds to one block BKik in one column and is common to a plurality of blocks BKik arranged in the X-direction.

For example, when one column is formed from four blocks, the number of read word lines RWLn is four. The read word line RWLn extends in the X-direction. One end of the read word line RWLn is connected to a read word line driver 23B-*n*.

In write operation, a row decoder 25-*n* selects one of the write word lines WWL3*n*, WWL3*n*+1, and WWL3*n*+2 on the basis of a row address signal. The write word line driver 23A-*n* supplies a write current to the selected write word line. The write current flows through the selected word line and is absorbed by the write word line sinker 24-*n*.

In read operation, the row decoder 25-*n* selects a block in one row on the basis of, e.g., high order bits of a row address signal. The read word line driver 23B-*n* applies a read word line voltage to the read word line RWLn connected to a selected block BK. In the selected block BK, the read select switch RSW is turned on. For this reason, a read current flows to the ground terminal through the plurality of TMR elements in the selected block BK.

The other terminal of each of the four TMR elements 12 in the block BKik is connected to a read bit line BLj. One end of the read bit line BLj is connected to a common data line 28 through a column select switch (MOS transistor) SWA. The common data line 28 is connected to a read circuit (including a sense amplifier) 29B.

One end of each of the write bit lines BLj0 and BLj1 is connected to a circuit block 29A including a write bit line driver and write bit line sinker.

The other end of each of the write bit lines BLj0 and BLj1 is connected to a circuit block 31 including a write bit line driver and write bit line sinker.

A column select line signal CSLj (j=0, 1, . . . ) is input to the column select switch SWA. A column decoder 32 outputs the column select line signal CSLj.

In the magnetic random access memory of this example, one column is formed from a plurality of blocks. A read is executed for each block. Additionally, one block is formed from a plurality of TMR elements stacked at a plurality of stages and connected in series-parallel.

In such a cell array structure, the TMR elements are three-dimensionally arranged on a semiconductor substrate.

In addition, since one MOS transistor (read select switch) corresponds to a plurality of TMR elements, this cell array structure can eventually contribute to increase the memory capacity.

② Device Structure

The device structure will be described next.

Figure 18:
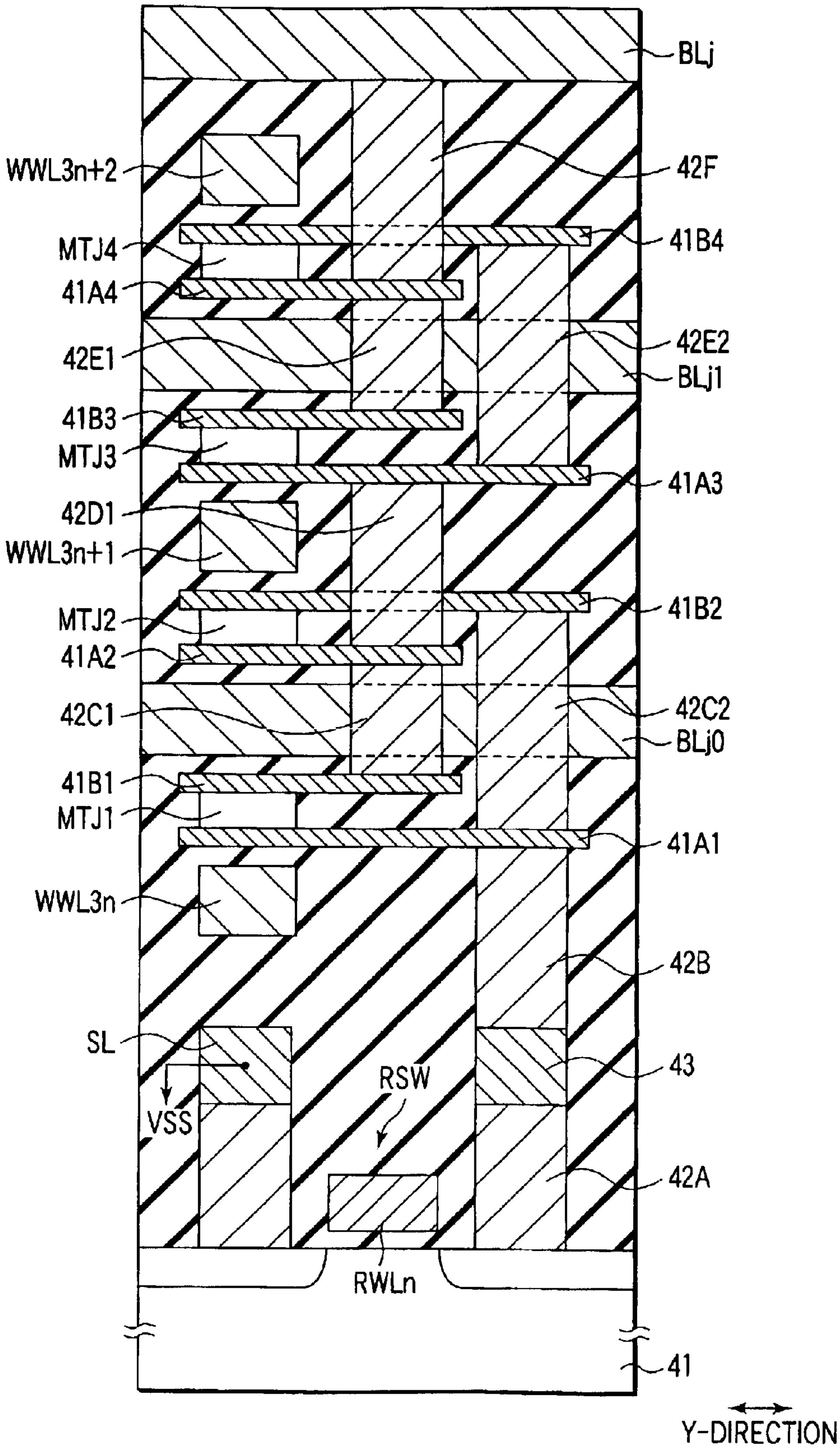
FIG. 18 is a sectional view related to Structural Example 3 of the magnetic random access memory of the present invention.

FIG. 18 shows a device structure corresponding to one block of the magnetic random access memory as Structural Example 3 of the present invention.

FIG. 18 shows the Y-direction section of one block of the magnetic random access memory. The same reference numerals as in FIG. 17 denote the same circuit elements in FIG. 18 to show the correspondence between the elements.

The read select switch (MOS transistor) RSW is arranged on the surface region of a semiconductor substrate 41. The source of the read select switch RSW is connected to the ground terminal through a source line SL. The source line SL extends straight in, e.g., the X-direction.

The gate of the read select switch (MOS transistor) RSW serves as the read word line RWLn. The read word line RWLn extends in the X-direction. Four TMR elements (MTJ (Magnetic Tunnel Junction) elements) MTJ1, MTJ2, MTJ3, and MTJ4 are stacked on the read select switch RSW.

The TMR elements MTJ1, MTJ2, MTJ3, and MTJ4 are arranged between lower electrodes 41A1, 41A2, 41A3, and 41A4 and upper electrodes 4lB1, 41B2, 41B3, and 41B4, respectively. Contact plugs 42C1, 42C2, 42D1, 42E1, and 42E2 connect the four TMR elements MTJ1, MTJ2, MTJ3, and MTJ4 in series-parallel.

The lower electrode 41A1 of the TMR element MTJ1 at the lowermost stage is connected to the drain of the read select switch (MOS transistor) RSW through contact plugs 42A and 42B and an intermediate layer 43. The upper electrode 41B4 of the TMR element MTJ4 at the uppermost stage is connected to the read bit line BLj extending in the Y-direction through a contact plug 42F.

The write word line WWL3*n* is arranged right under the TMR element MTJ1. The write word line WWL3*n*+1 is arranged between the TMR elements MTJ2 and MTJ3. The write word line WWL3*n*+2 is arranged right above the TMR element MTJ4. The write word lines WWL3*n*, WWL3*n*+1, and WWL3*n*+2 extend in the X-direction.

The write bit line BLj0 is arranged between the TMR elements MTJ1 and MTJ2. The write bit line BLj1 is arranged between the TMR elements MTJ3 and MTJ4. The write bit lines BLj0 and BLj1 extend in the Y-direction.

According to this device structure, a plurality of (in this example, four) TMR elements MTJ1, MTJ2, MTJ3, and MTJ4 are arranged in correspondence with one read select switch RSW. These TMR elements MTJ1, MTJ2, MTJ3, and MTJ4 are stacked on the read select switch RSW and connected in series-parallel.

In this case, only one read bit line BLj formed on the uppermost layer suffices. At least one of the write word lines WWL3*n*, WWL3*n*+1, and WWL3*n*+2 and at least one of the write bit lines BLj0 and BLj1 can be shared by two TMR elements.

This device structure can contribute to increase the memory capacity because the TMR elements can be arranged on the semiconductor substrate at a high density. In addition, since the number of interconnections (write word lines, write bit lines, read bit lines, and the like) arranged in the TMR element array can be decreased, the insulating film right under the TMR elements can be planarized, and the characteristics of the TMR element can be improved.

③ Modifications

Modifications to Structural Example 3 will be described.

Figure 19:
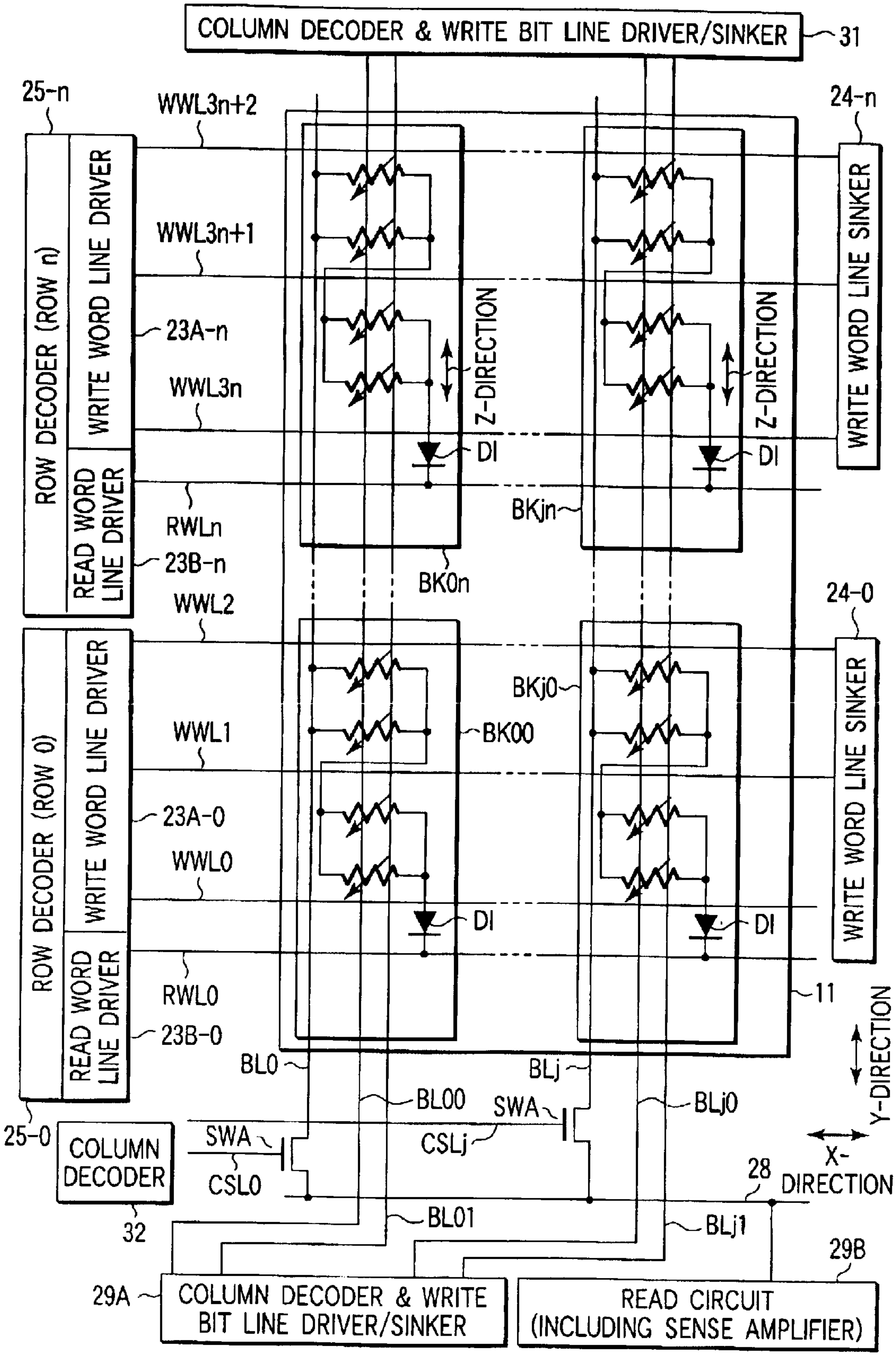
FIG. 19 is a circuit diagram showing a first modification to Structural Example 3.

FIGS. 19 and 20 show a first modification to Structural Example 3.

The circuit diagram of FIG. 19 corresponds to that of FIG. 17. The sectional view of the device structure shown in FIG. 20 corresponds to that in FIG. 18. The structure of this modification is different from the structure shown in FIGS. 17 and 18 in an element that implements the read select switch.

In the structure shown in FIGS. 17 and 18, the read select switch is formed from a MOS transistor. In the structure of this modification, the read select switch is formed from a diode DI. Hence, read word lines RWL0, . . . , RWLn are connected to the cathodes of the diodes DI.

When the structure of this modification is employed, in read operation, a read word line RWLi of the selected row is set at "L", i.e., the ground potential. At this time, a read current can be supplied to a plurality of series-parallel-connected TMR elements of the blocks of the selected row.

FIGS. 21 and 22 show a second modification to Structural Example 3.

The circuit diagram of FIG. 21 corresponds to that of FIG. 17. The sectional view of the device structure shown in FIG. 22 corresponds to that in FIG. 18. The structure of this modification is different from the structure shown in FIGS. 17 and 18 in the type of transistors that form the memory cell array 11 and its peripheral circuits.

In the structure shown in FIGS. 17 and 18, the transistors that form the memory cell array 11 and its peripheral circuits are MOS transistors. In the structure of this modification, the transistors that form the memory cell array 11 and its peripheral circuits are bipolar transistors.

In the structure of this modification, all the transistors that form the memory cell array 11 and its peripheral circuits may be bipolar transistors, or some of them may be bipolar transistors.

(4) Structural Example 4

Structural Example 4 is an improved example of Structural Examples 1 to 3. Structural Example 4 can be combined with Structural Examples 1 to 3.

As a characteristic feature of Structural Example 4, each write line in one row that extends in the Y-direction of a memory cell array has a folded structure (zigzag structure) or a parallel connection structure so that the number of write lines in one row is substantially reduced to one.

According to this structure, the number of write drivers/sinkers connected to the write line in one row can be decreased. For this reason, the manufacturing cost can be reduced by reducing the chip area.

① Circuit Structure

The circuit structure will be described first.

Figure 23:
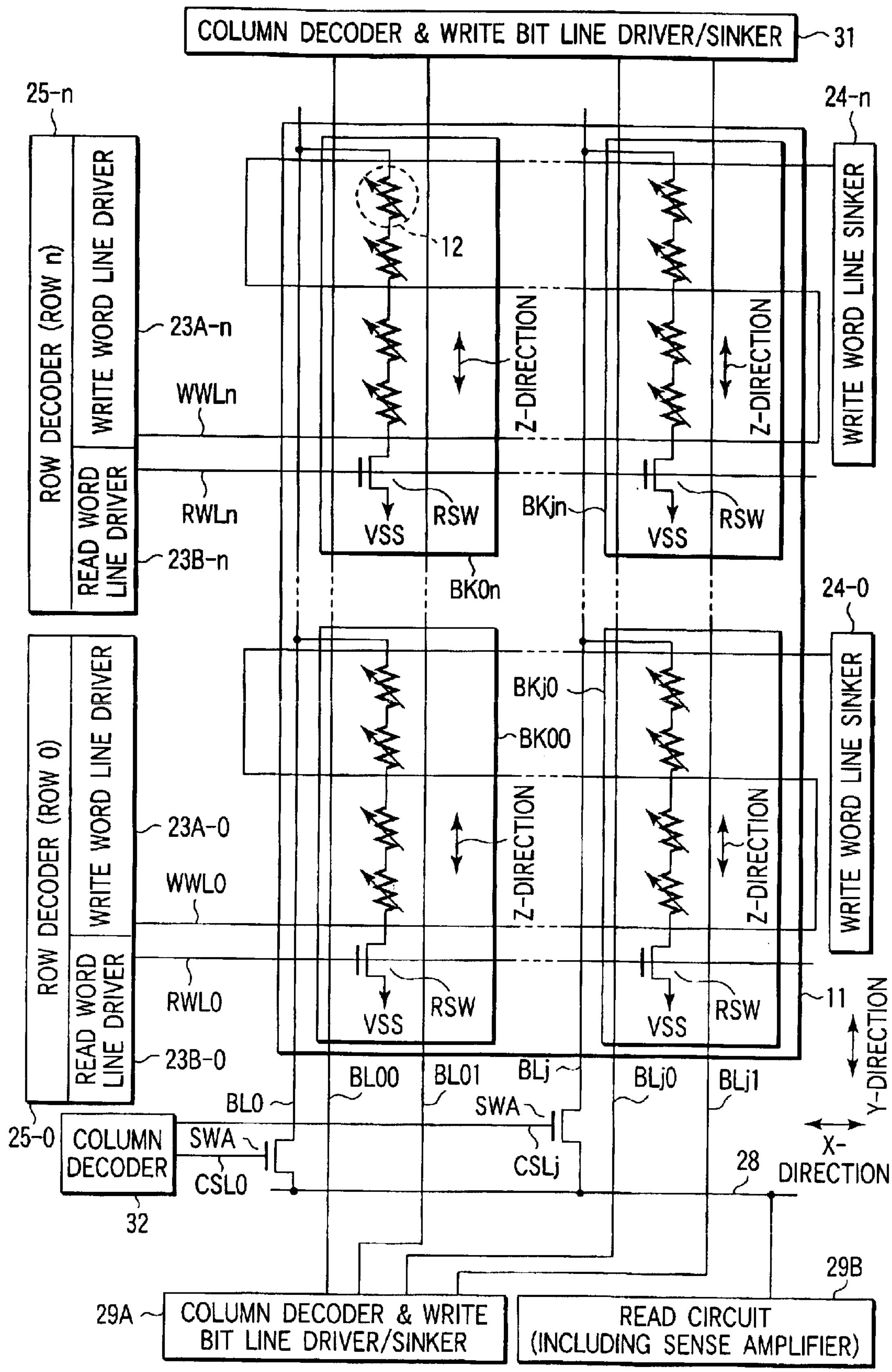
FIG. 23 is a circuit diagram related to Structural Example 4 of the magnetic random access memory of the present invention.

FIGS. 23 to 25 show main part of magnetic random access memories as Structural Example 4 of the present invention.

FIG. 23 shows an example in which Structural Example 4 is applied to Structural Example 1 shown in FIG. 1. FIG. 24 shows an example in which Structural Example 4 is applied to Structural Example 2 shown in FIG. 8. FIG. 25 shows an example in which Structural Example 4 is applied to Structural Example 3 shown in FIG. 17.

A memory cell array 11 has a plurality of TMR elements 12 arrayed in the X-, Y-, and Z-directions. The Z-direction means a direction perpendicular to the X- and Y-directions, i.e., a direction perpendicular to the surface of the drawing sheet.

The memory cell array 11 has a cell array structure formed from (j+1) TMR elements 12 arranged in the X-direction, (n+1) TMR elements 12 arranged in the Y-direction, and four TMR elements 12 stacked in the Z-direction. In this example, the number of TMR elements 12 stacked in the Z-direction is four. However, the number of TMR elements stacked in the Z-direction is not particularly limited as long as the number is two or more.

The four TMR elements 12 stacked in the Z-direction are connected in series (FIG. 23), in parallel (FIG. 24), or in series-parallel (FIG. 25) to form one block BKik (i=0, 1, . . . , j, k=0, 1, . . . , n). In fact, the four TMR elements 12 in the block BKik overlap one another in the direction (Z-direction) perpendicular to the page surface.

One terminal of each of the four TMR elements 12 in the block BKik is connected to a ground point through a read select switch (MOS transistor) RSW.

In this example, one row is constructed by (j+1) blocks BKik arranged in the X-direction. The memory cell array 11 has (n+1) rows. In addition, one column is constructed by (n+1) blocks BKik arranged in the Y-direction. The memory cell array 11 has (j+1) columns.

A plurality of write word lines that extend in the X-direction and are stacked in the Z-direction are arranged near the four TMR elements 12 of the block BKik. The plurality of write word lines are connected in series at the end portions of the memory cell array 11 to form one write word line WWLn. The write word line WWLn is arranged to zigzag through the memory cell array 11 as a whole.

Such a write word line structure will be called a folded structure (or a zigzag structure).

According to the folded structure (zigzag structure), substantially, only one write word line WWLn is arranged in one row. For this reason, the number of elements of write drivers/sinkers 23A-*n* and 24-*n* connected to the write word line WWLn in one row can be reduced. Hence, the manufacturing cost can be reduced by reducing the chip area.

In consideration of a block structure, when the write word lines WWLn are arranged between the TMR elements at the first and second stages and between the TMR elements at the third and fourth stages, as shown in FIGS. 223 to 225, the write word line WWLn can be shortened.

In this example, however, the write word lines WWLn having the folded structure are arranged right under the TMR element at the lowermost stage, between the TMR elements at the second and third stages, and immediately on the TMR elements at the uppermost stage.

This structure is employed because the position of a write bit line in one column extending in the Y-direction is taken into consideration.

That is, one write bit line BLj0 extending in the Y-direction is arranged between the TMR elements 12 at the first stage and those at the second stage. One write bit line BLj1 extending in the Y-direction is arranged between the TMR elements 12 at the third stage and those at the fourth stage.

Consequently, as for the write bit lines on one column extending in the Y-direction, one write bit line is shared by TMR elements at the first and second stages. In addition, one write bit line is shared by TMR elements at the third and fourth stages. In this case, the number of write bit lines extending in the Y-direction is two.

Referring to FIGS. 23 to 25, since the TMR elements 12 cannot be three-dimensionally expressed, the two write bit lines BLj0 and BLj1 are expressed to be parallel to or to cross the four TMR elements 12 in a block BKjn. In fact, one write bit line BLj0 is arranged between the TMR elements at the first stage and those at the second stage, and one write bit line BLj1 is arranged between the TMR elements at the third stage and those at the fourth stage, as described above.

One end of each write word line WWLn extending in the X-direction is connected to the write word line driver 23A-*n*. The other end is connected to the write word line sinker 24-*n*.

The gate of the read select switch RSW is connected to a read word line RWLn (n=0, 1, 2, . . . ) One read word line RWLn corresponds to one block BKik in one column and is common to a plurality of blocks BKik arranged in the X-direction.

For example, when one column is formed from four blocks, the number of read word lines RWLn is four. The read word line RWLn extends in the X-direction. One end of the read word line RWLn is connected to a read word line driver 23B-*n*.

In write operation, a row decoder 25-*n* selects one of the write word lines WWL0, . . . , WWLn on the basis of a row address signal. The write word line driver 23A-*n* supplies a write current to the selected write word line. The write current flows through the selected word line and is absorbed by the write word line sinker 24-*n*.

In read operation, the row decoder 25-*n* selects a block in one row on the basis of, e.g., high order bits of a row address signal. The read word line driver 23B-*n* applies a read word line voltage to the read word line RWLn connected to a selected block BK. In the selected block BK, the read select switch RSW is turned on. For this reason, a read current flows to the ground terminal through the plurality of TMR elements in the selected block BK.

The other terminal of each of the four TMR elements 12 in the block BKik is connected to a read bit line BLj. One end of the read bit line BLj is connected to a common data line 28 through a column select switch (MOS transistor) SWA. The common data line 28 is connected to a read circuit (including a sense amplifier) 29B.

One end of each of the write bit lines BLj0 and BLj1 is connected to a circuit block 29A including a write bit line driver and write bit line sinker.

The other end of each of the write bit lines BLj0 and BLj1 is connected to a circuit block 31 including a write bit line driver and write bit line sinker.

A column select line signal CSLj (j=0, 1, . . . ) is input to the column select switch SWA. A column decoder 32 outputs the column select line signal CSLj.

In the magnetic random access memory of this example, one column is formed from a plurality of blocks. One read operation is executed for each block. Additionally, one block is formed from a plurality of TMR elements stacked at a plurality of stages and connected in series, in parallel, or in series-parallel.

In such a cell array structure, the TMR elements 12 are three-dimensionally arranged on a semiconductor substrate. In addition, since one MOS transistor (read select switch) RSW corresponds to a plurality of TMR elements 12, this cell array structure can eventually contribute to increase the memory capacity.

In the magnetic random access memory of this example, the write word line WWLn has a folded structure (zigzag structure). For this reason, substantially, only one write word line WWLn is arranged in one row.

Since the number of elements of the write drivers/sinkers 23A-*n* and 24-*n* connected to the write word line WWLn in one row can be reduced, the manufacturing cost can be reduced by reducing the chip area.

② Device Structure

The device structure will be described next.

Figure 26:
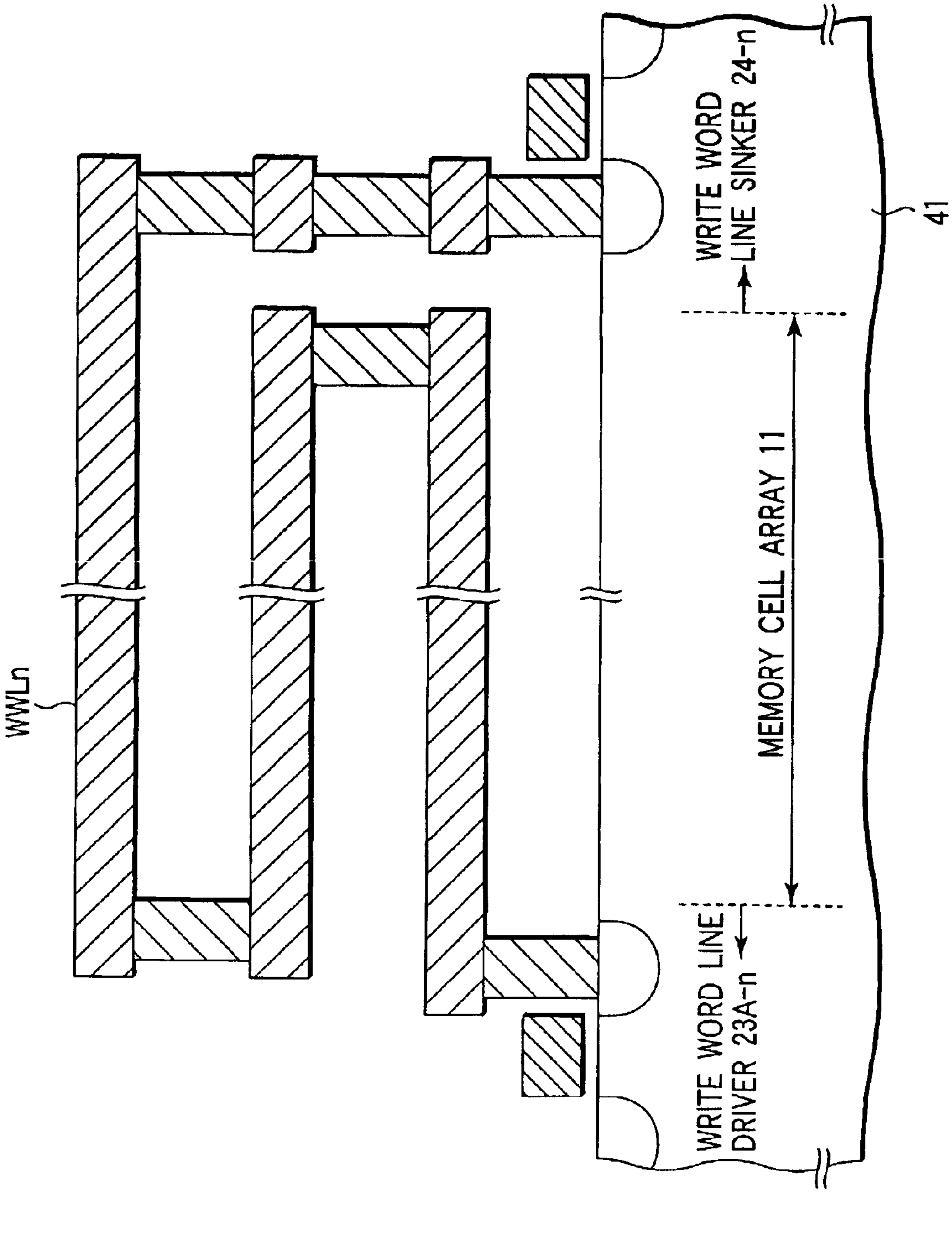
FIG. 26 is a sectional view related to Structural Example 4 of the magnetic random access memory of the present invention.

FIG. 26 shows a device structure corresponding to one block of the magnetic random access memory as Structural Example 4 of the present invention.

FIG. 26 shows the Y-direction section of one block of the magnetic random access memory. The same reference numerals as in FIGS. 23 to 25 denote the same circuit elements in FIG. 26 to show the correspondence between the elements.

Referring to FIG. 26, to clearly show the characteristic feature of Structural Example 4, all members in the memory cell array 11 are omitted except the write word line WWLn.

Interconnections serving as the write word line WWLn are stacked at three stages on the memory cell array 11. These interconnections are connected to each other by contact plugs at the end portions of the memory cell array 11. As a result, the write word line WWLn has a folded structure (or a zigzag structure) on the memory cell array 11.

One end of the write word line WWLn is connected to the write word line driver 23A-*n*. The other end is connected to the write word line sinker 24-*n*.

In this example, the interconnections that form the write word line WWLn are stacked at three stages (odd number of stages). Hence, the position of the write word line driver 23A-*n* and that of the write word line sinker 24-*n* oppose each other via the memory cell array 11.

If the interconnections that form the write word line WWLn are stacked at four stages (even number of stages), the write word line driver 23A-*n* and write word line sinker 24-*n* are arranged on one side of the memory cell array 11.

According to this device structure, the write word line WWLn has the folded structure (zigzag structure). For this reason, substantially, only one write word line WWLn is arranged in one row.

Since the number of elements of the write drivers/sinkers 23A-*n* and 24-*n* connected to the write word line WWLn in one row can be reduced, the manufacturing cost can be reduced by reducing the chip area.

③ Modification

A modification to the device structure of Structural Example 4 will be described.

Figure 27:
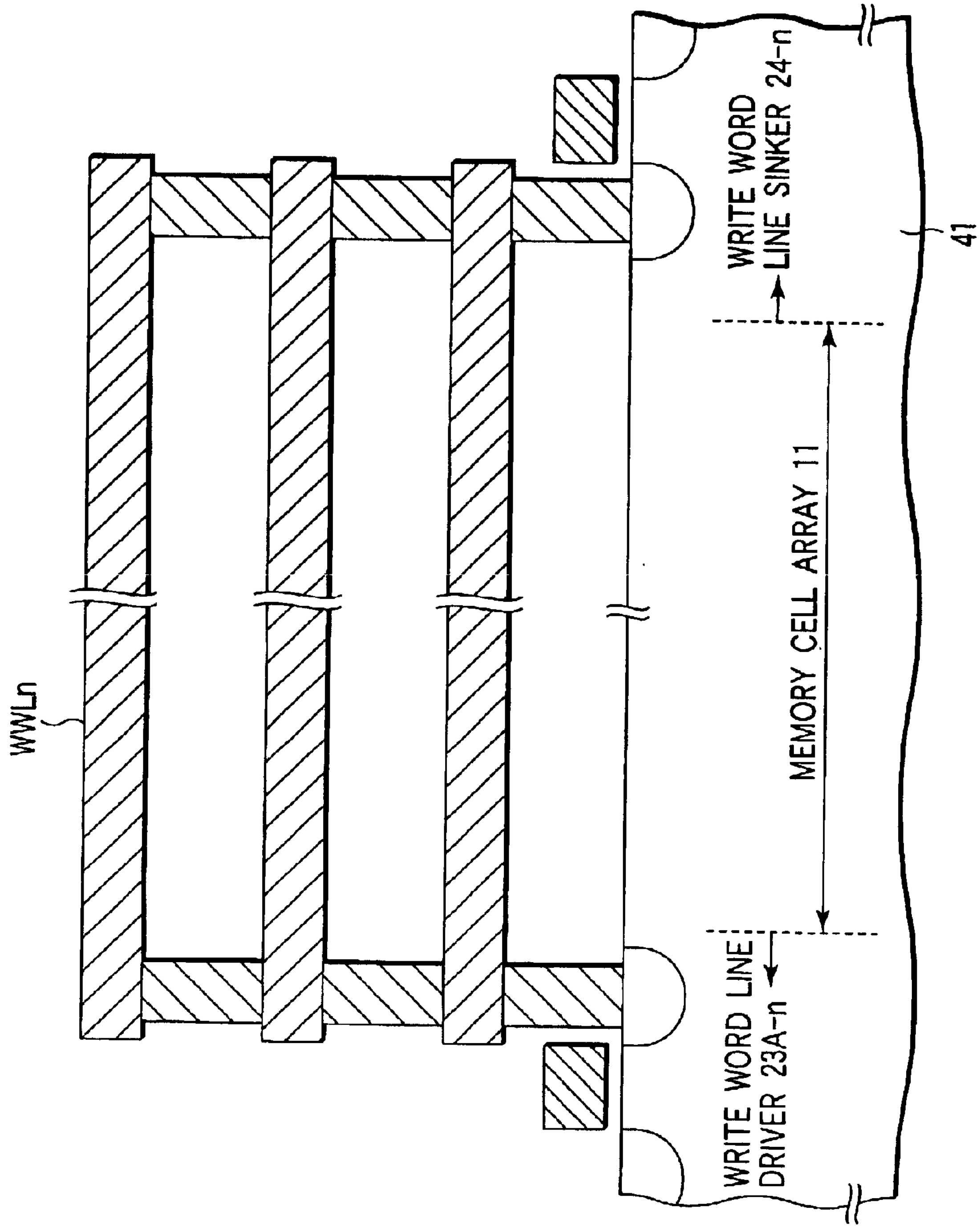
FIG. 27 is a sectional view showing a modification to Structural Example 4.

FIG. 27 shows a device structure corresponding to one block of the magnetic random access memory as Structural Example 4 of the present invention.

FIG. 27 shows the Y-direction section of one block of the magnetic random access memory. The same reference numerals as in FIGS. 23 to 25 denote the same circuit elements in FIG. 27 to show the correspondence between the elements.

Referring to FIG. 27, to clearly show the characteristic feature of Structural Example 4, all members in the memory cell array 11 are omitted except the write word line WWLn.

Interconnections serving as the write word line WWLn are stacked at three stages on the memory cell array 11. These interconnections are connected to each other by contact plugs at the end portions of the memory cell array 11. As a result, the write word line WWLn has a structure in which the interconnections are connected in parallel (parallel connection structure) on the memory cell array 11.

One end of the write word line WWLn is connected to the write word line driver 23A-*n*. The other end is connected to the write word line sinker 24-*n*.

In this example, the interconnections that form the write word line WWLn are stacked at three stages. However, the number of stages of stacked interconnections of the write word line WWLn is not particularly limited as long as they are stacked at a plurality of (two or more) stages.

According to this device structure, the write word line WWLn has the parallel connection structure. For this reason, substantially, only one write word line WWLn is arranged in one row.

Since the number of elements of the write drivers/sinkers 23A-*n* and 24-*n* connected to the write word line WWLn in one row can be reduced, the manufacturing cost can be reduced by reducing the chip area.

(5) Structural Example 5

Structural Example 5 is an improved example of Structural Examples 1 to 3. Structural Example 5 can be combined with Structural Examples 1 to 3.

As a characteristic feature of Structural Example 5, each write line in one column that extends in the X-direction of a memory cell array has a folded structure (zigzag structure) or a parallel connection structure so that the number of write lines in one column is substantially reduced to one.

According to this structure, the number of write drivers/sinkers connected to the write line in one column can be decreased. For this reason, the manufacturing cost can be reduced by reducing the chip area.

① Circuit Structure

The circuit structure will be described first.

Figure 28:
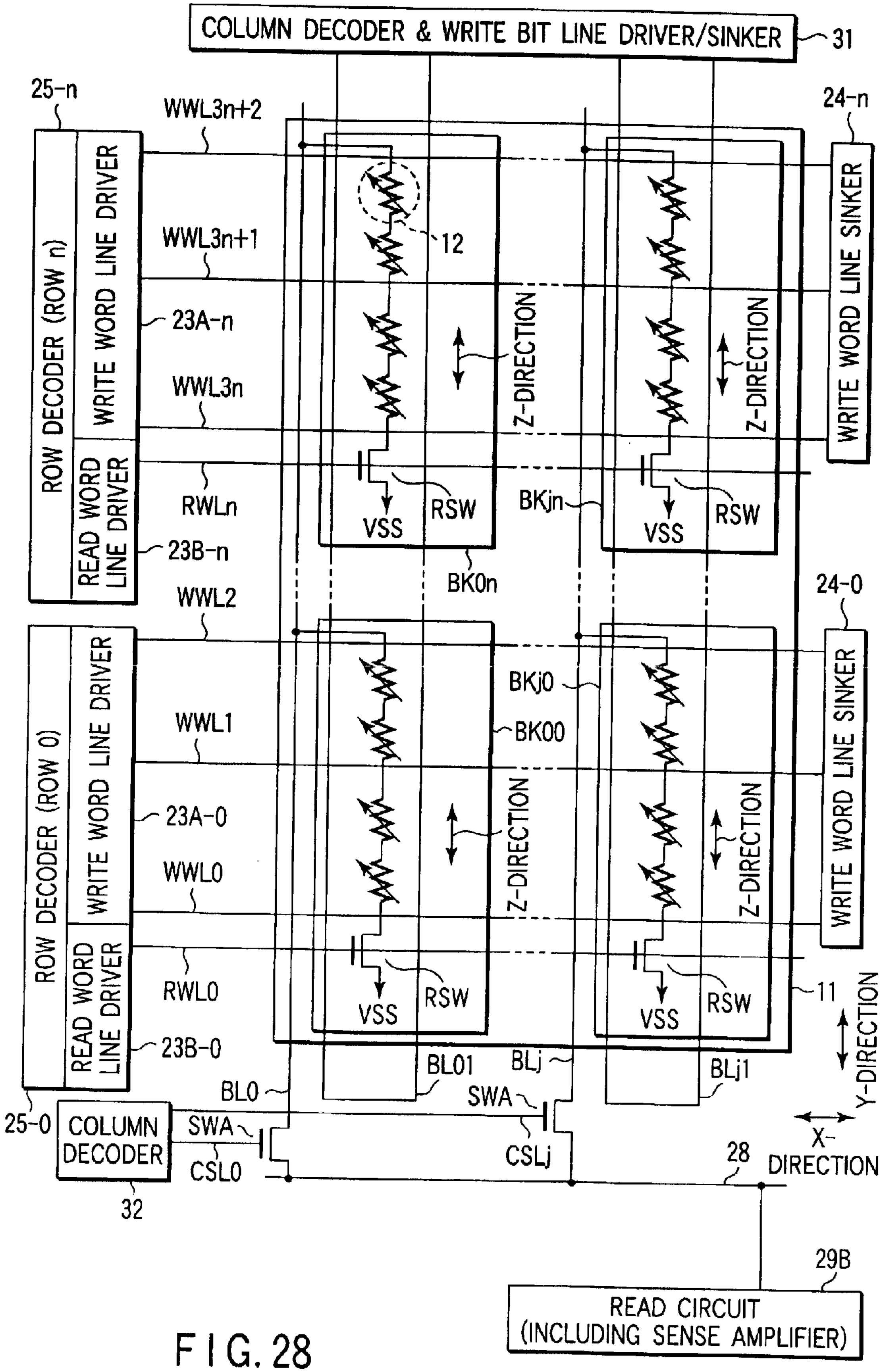
FIG. 28 is a circuit diagram related to Structural Example 5 of the magnetic random access memory of the present invention.
Figure 30:
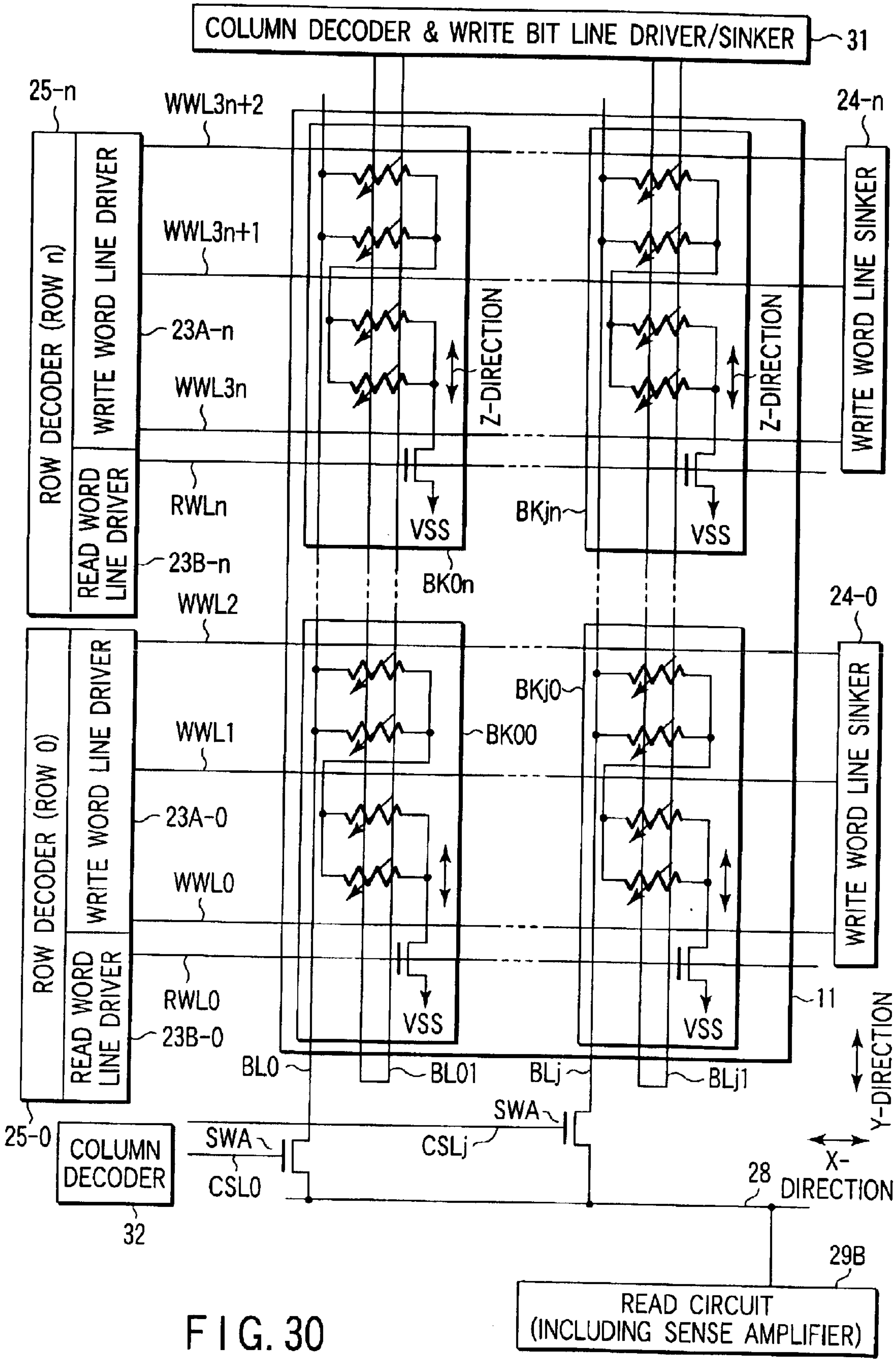
FIG. 30 is a circuit diagram related to Structural Example 5 of the magnetic random access memory of the present invention.

FIGS. 28 to 30 show main part of magnetic random access memories as Structural Example 5 of the present invention.

FIG. 28 shows an example in which Structural Example 5 is applied to Structural Example 1 shown in FIG. 1. FIG. 29 shows an example in which Structural Example 5 is applied to Structural Example 2 shown in FIG. 8. FIG. 30 shows an example in which Structural Example 5 is applied to Structural Example 3 shown in FIG. 17.

A memory cell array 11 has a plurality of TMR elements 12 arrayed in the X-, Y-, and Z-directions. The Z-direction means a direction perpendicular to the X- and Y-directions, i.e., a direction perpendicular to the page surface.

The memory cell array 11 has a cell array structure formed from (j+1) TMR elements 12 arranged in the X-direction, (n+1) TMR elements 12 arranged in the Y-direction, and four TMR elements 12 stacked in the Z-direction. In this example, the number of TMR elements 12 stacked in the Z-direction is four. However, the number of TMR elements stacked in the Z-direction is not particularly limited as long as the number is two or more.

The four TMR elements 12 stacked in the Z-direction are connected in series (FIG. 28), in parallel (FIG. 29), or in series-parallel (FIG. 30) to form one block BKik (i=0, 1, . . . , j, k=0, 1, . . . , n). In fact, the four TMR elements 12 in the block BKik overlap one another in the direction (Z-direction) perpendicular to the surface of the drawing sheet.

One terminal of each of the four TMR elements 12 in the block BKik is connected to the ground terminal through a read select switch (MOS transistor) RSW.

In this example, one row is constructed by (j+1) blocks BKik arranged in the X-direction. The memory cell array 11 has (n+1) rows. In addition, one column is constructed by (n+1) blocks BKik arranged in the Y-direction. The memory cell array 11 has (j+1) columns.

A plurality of write word lines WWL3*n*, WWL3*n*+1, and WWL3*n*+2 that extend in the X-direction and are stacked in the Z-direction are arranged near the four TMR elements 12 of the block BKik.

In consideration of a block structure, when the write word lines are arranged between the TMR elements at the first and second stages and between the TMR elements at the third and fourth stages, as shown in FIGS. 226 to 228, the write word lines can be shortened.

In this example, however, the write word lines WWL3*n*, WWL3*n*+1, and WWL3*n*+2 are arranged right under the TMR element at the lowermost stage, between the TMR elements at the second and third stages, and right above the TMR elements at the uppermost stage.

This structure is employed because the position of a write bit line in one column extending in the Y-direction is taken into consideration.

That is, a write bit line extending in the Y-direction is arranged between the TMR elements 12 at the first stage and those at the second stage. Another write bit line extending in the Y-direction is arranged between the TMR elements 12 at the third stage and those at the fourth stage.

The plurality of write bit lines are connected in series at the end portions of the memory cell array 11 to form one write bit line BLj1. The write bit line BLj1 is arranged to zigzag through the memory cell array 11 as a whole.

Such a write bit line structure will be called a folded structure (or a zigzag structure).

According to the folded structure (zigzag structure), substantially, only one write bit line BLj1 is arranged in one column. For this reason, the number of elements of a write driver/sinker 31 connected to the write bit line BLj1 in one column can be reduced. Hence, the manufacturing cost can be reduced by reducing the chip area.

Referring to FIGS. 28 to 30, since the TMR elements 12 cannot be three-dimensionally expressed, the write bit line BLj1 having the folded structure is expressed to be parallel to or to cross the four TMR elements 12 in a block BKjn. In fact, the write bit line BLj1 is arranged between the TMR elements at the first stage and those at the second stage and between the TMR elements at the third stage and those at the fourth stage, as described above.

One end of each of the write word lines WWL3*n*, WWL3*n*+1, and WWL3*n*+2 extending in the X-direction is connected to the write word line driver 23A-*n*. The other end is connected to the write word line sinker 24-*n*.

The gate of the read select switch RSW is connected to a read word line RWLn (n=0, 1, 2, . . . ) One read word line RWLn corresponds to one block BKik in one column and is common to a plurality of blocks BKik arranged in the X-direction.

For example, when one column is formed from four blocks, the number of read word lines RWLn is four. The read word line RWLn extends in the X-direction. One end of the read word line RWLn is connected to a read word line driver 23B-*n*.

In write operation, a row decoder 25-*n* selects one of the write word lines WWL3*n*, WWL3*n*+1, and WWL3*n*+2 on the basis of a row address signal. The write word line driver 23A-*n* supplies a write current to the selected write word line. The write current flows through the selected word line and is absorbed by the write word line sinker 24-*n*.

In read operation, the row decoder 25-*n* selects a block in one row on the basis of, e.g., high order bits of a row address signal. The read word line driver 23B-*n* applies a read word line voltage to the read word line RWLn connected to a selected block BK. In the selected block BK, the read select switch RSW is turned on. For this reason, a read current flows to the ground terminal through the plurality of TMR elements in the selected block BK.

The other terminal of each of the four TMR elements 12 in the block BKik is connected to a read bit line BLj. One end of the read bit line BLj is connected to a common data line 28 through a column select switch (MOS transistor) SWA. The common data line 28 is connected to a read circuit (including a sense amplifier) 29B.

One end and the other end of the write bit line BLj1 are connected to a circuit block 31 including a write bit line driver and write bit line sinker.

A column select line signal CSLj (j=0, 1, . . . ) is input to the column select switch SWA. A column decoder 32 outputs the column select line signal CSLj.

In the magnetic random access memory of this example, one column is formed from a plurality of blocks. One read operation is executed for each block. Additionally, one block is formed from a plurality of TMR elements stacked at a plurality of stages and connected in series, in parallel, or in series-parallel.

In such a cell array structure, the TMR elements 12 are three-dimensionally arranged on a semiconductor substrate. In addition, since one MOS transistor (read select switch) RSW corresponds to a plurality of TMR elements 12, this cell array structure can eventually contribute to increase the memory capacity.

In the magnetic random access memory of this example, the write bit line BLj1 has a folded structure (zigzag structure). For this reason, substantially, only one write bit line BLj1 is arranged in one column.

Since the number of elements of the write driver/sinker 31 connected to the write bit line BLj1 in one column can be reduced, the manufacturing cost can be reduced by reducing the chip area.

② Device Structure

The device structure will be described next.

Figure 31:
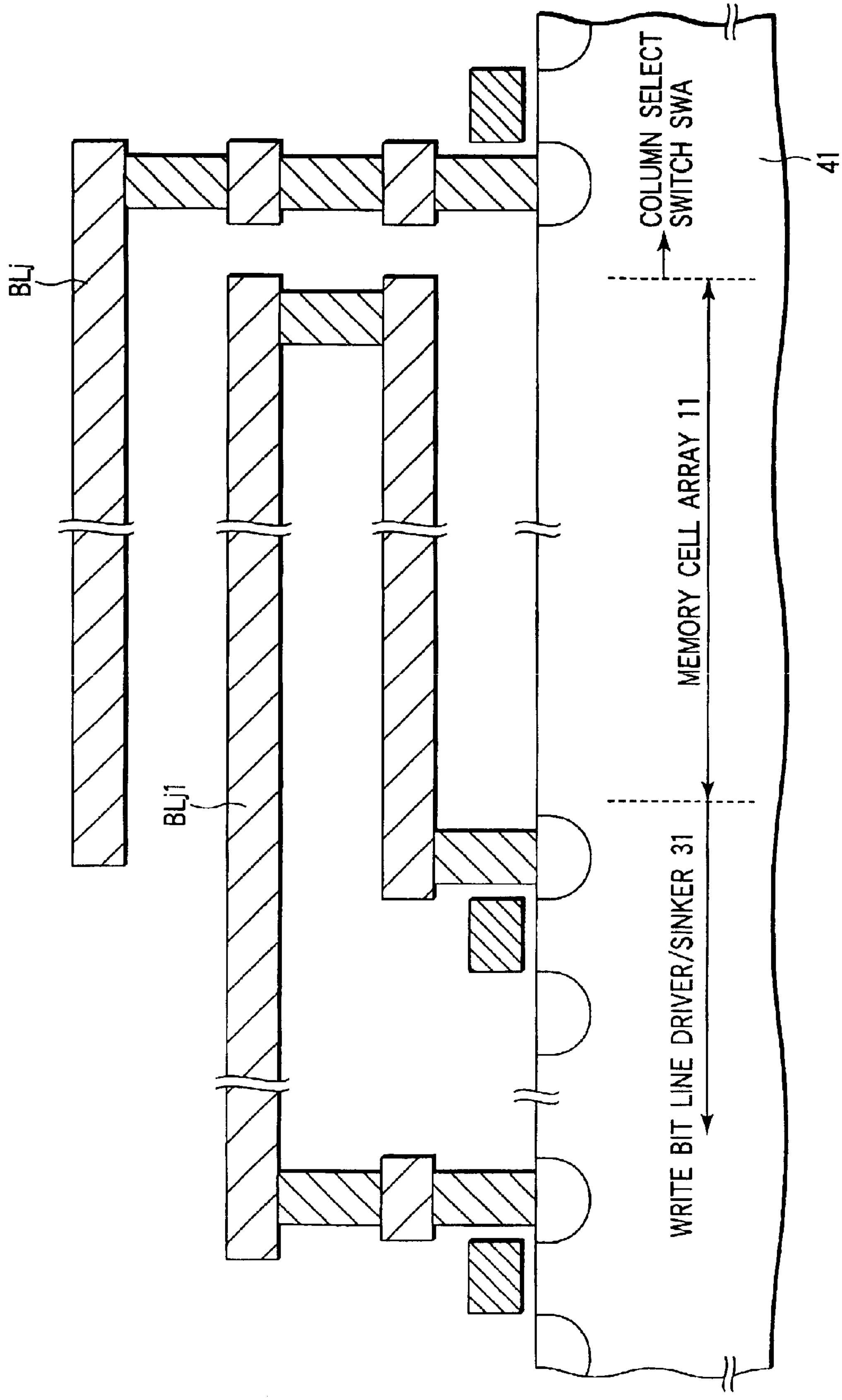
FIG. 31 is a sectional view related to Structural Example 5 of the magnetic random access memory of the present invention.

FIG. 31 shows a device structure corresponding to one block of the magnetic random access memory as Structural Example 5 of the present invention.

FIG. 31 shows the Y-direction section of one block of the magnetic random access memory. The same reference numerals as in FIGS. 28 to 30 denote the same circuit elements in FIG. 31 to show the correspondence between the elements.

Referring to FIG. 31, to clearly show the characteristic feature of Structural Example 5, all members in the memory cell array 11 are omitted except the write bit line BLj1 and read bit line BLj.

Interconnections serving as the write bit line BLj1 are stacked at two stages on the memory cell array 11. These interconnections are connected to each other by contact plugs at the end portions of the memory cell array 11. As a result, the write bit line BLj1 has a folded structure (or a zigzag structure) on the memory cell array 11.

One end and the other end of the write bit line BLj1 are connected to the write bit line driver/sinker 31.

In this example, the interconnections that form the write bit line BLj1 are stacked at two stages (even number of stages). Hence, the write bit line driver/sinker is arranged only on one side of the memory cell array 11.

If the interconnections that form the write bit line BLj1 are stacked at three stages (odd number of stages), the write bit line drivers/sinkers 31 are arranged on both sides of the memory cell array 11.

According to this device structure, the write bit line BLj1 has the folded structure (zigzag structure). For this reason, substantially, only one write bit line BLj1 is arranged in one column.

Since the number of elements of the write bit line driver/sinker 31 connected to the write bit line BLj1 in one column can be reduced, the manufacturing cost can be reduced by reducing the chip area.

③ Modification

A modification to the device structure of Structural Example 5 will be described.

FIG. 32 shows a device structure corresponding to one block of the magnetic random access memory as Structural Example 5 of the present invention.

FIG. 32 shows the Y-direction section of one block of the magnetic random access memory. The same reference numerals as in FIGS. 28 to 30 denote the same circuit elements in FIG. 32 to show the correspondence between the elements.

Referring to FIG. 32, to clearly show the characteristic feature of Structural Example 5, all members in the memory cell array 11 are omitted except the write bit line BLj1.

Interconnections serving as the write bit line BLj1 are stacked at two stages on the memory cell array 11. These interconnections are connected to each other by contact plugs at the end portions of the memory cell array 11. As a result, the write bit line BLj1 has a structure in which the interconnections are connected in parallel (parallel connection structure) on the memory cell array 11.

One end and the other end of the write bit line BLj1 are connected to the write bit line driver/sinker 31.

In this example, the interconnections that form the write bit line BLj1 are stacked at two stages. However, the number of stages of stacked interconnections of the write bit line BLj1 is not particularly limited as long as they are stacked at a plurality of (two or more) stages.

According to this device structure, the write bit line BLj1 has the parallel connection structure. For this reason, substantially, only one write bit line BLj1 is arranged in one column.

Since the number of elements of the write bit line driver/sinker 31 connected to the write bit line BLj1 in one column can be reduced, the manufacturing cost can be reduced by reducing the chip area.

2. Structures of TMR Element

In the above-described cell array structure, the plurality of TMR elements in one block are connected in series, in parallel, or in series-parallel.

On the assumption that this cell array structure is employed, if the plurality of TMR elements in one block have identical structures, a read operation principle such as a destructive read operation principle must be employed (e.g., Japanese Patent Application No. 2001-350013). Alternatively, the plurality of TMR elements in one block may be caused to have different structures, and not the destructive read operation principle but a batch read operation principle may be employed (e.g., Japanese Patent Application No. 2001-365236).

These read operation principles are described in detail in Japanese Patent Applications No. 2001-350013 and No. 2001-365236, the entire contents of which are incorporated herein by reference.

Structural examples of TMR elements to realize these read operation principles will be described here.

(1) Equivalent Circuits in Read Operation

Equivalent circuits of TMR elements (memory cells) in one block in read operation will be described first.

Figure 35:
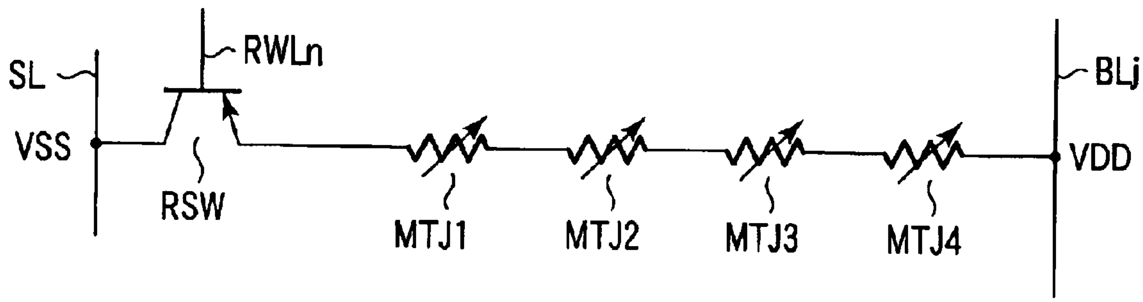
FIG. 35 is a view showing still another equivalent circuit of Structural Example 1 in read operation.

FIGS. 33 to 35 show equivalent circuits of Structural Example 1 of the cell array structure in read operation.

The four TMR elements MTJ1, MTJ2, MTJ3, and MTJ4 are connected in series. One end of the connection structure is connected to the read bit line BLj. The potential of the read bit line BLj is set at, e.g., an one read operation VDD. The read select switch (MOS transistor) RSW is connected between the source line SL and the other end of the series connection structure of the TMR elements MTJ1, MTJ2, MTJ3, and MTJ4.

When the read select switch RSW is formed from a MOS transistor (FIG. 33), the potential of its gate, i.e., the read word line RWLn is set at "H". For this reason, the read select switch RSW is turned on. The source line SL is set at, e.g., a ground potential VSS.

When the read select switch RSW is formed from a diode (FIG. 34), the potential of its cathode, i.e., the read word line RWLn is set at "L (=VSS)". For this reason, the read select switch RSW is turned on.

When the read select switch RSW is formed from a bipolar transistor (FIG. 35), the potential of its base, i.e., the read word line RWLn is set at "H". For this reason, the read select switch RSW is turned on. The source line SL is set at, e.g., the ground potential VSS.

Figure 36:
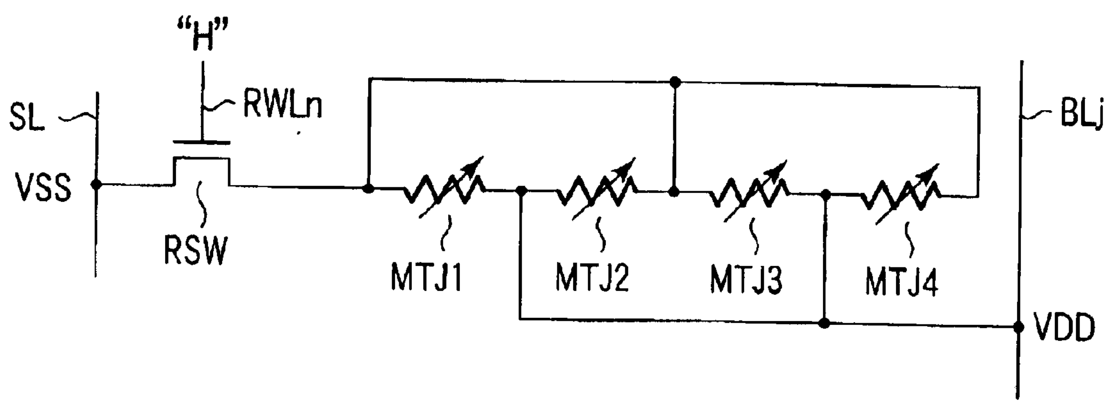
FIG. 36 is a view showing an equivalent circuit of Structural Example 2 in read operation.

FIGS. 36 to 38 show equivalent circuits of Structural Example 2 of the cell array structure in read operation.

The four TMR elements MTJ1, MTJ2, MTJ3, and MTJ4 are connected in parallel. One end of the connection structure is connected to the read bit line BLj. The potential of the read bit line BLj is set at, e.g., the one read operation VDD. The read select switch (MOS transistor) RSW is connected between the source line SL and the other end of the parallel connection structure of the TMR elements MTJ1, MTJ2, MTJ3, and MTJ4.

When the read select switch RSW is formed from a MOS transistor (FIG. 36), the potential of its gate, i.e., the read word line RWLn is set at "H". For this reason, the read select switch RSW is turned on. The source line SL is set at, e.g., the ground potential VSS.

When the read select switch RSW is formed from a diode (FIG. 37), the potential of its cathode, i.e., the read word line RWLn is set at "L (=VSS)". For this reason, the read select switch RSW is turned on.

When the read select switch RSW is formed from a bipolar transistor (FIG. 38), the potential of its base, i.e., the read word line RWLn is set at "H". For this reason, the read select switch RSW is turned on. The source line SL is set at, e.g., the ground potential VSS.

Figure 39:
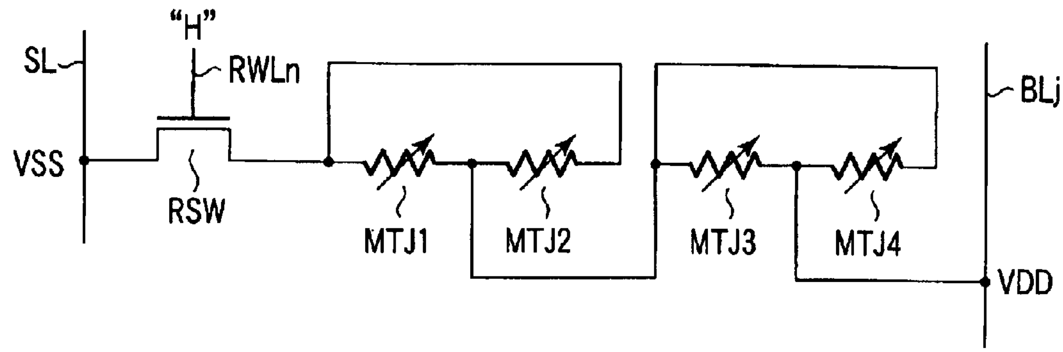
FIG. 39 is a view showing an equivalent circuit of Structural Example 3 in read operation.
Figure 40:
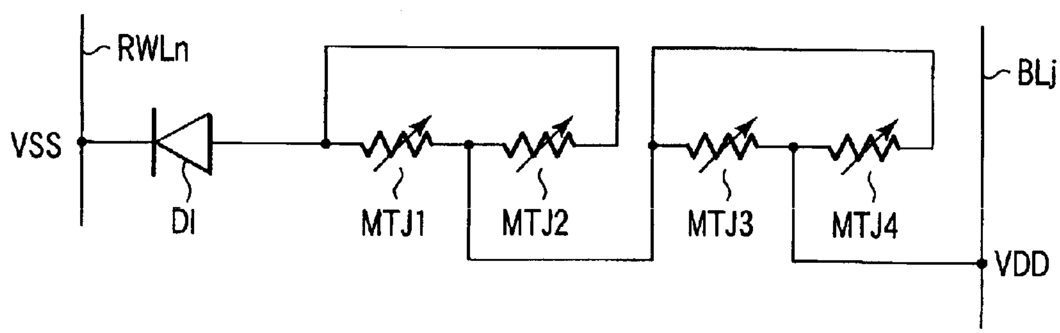
FIG. 40 is a view showing another equivalent circuit of Structural Example 3 in read operation.
Figure 41:
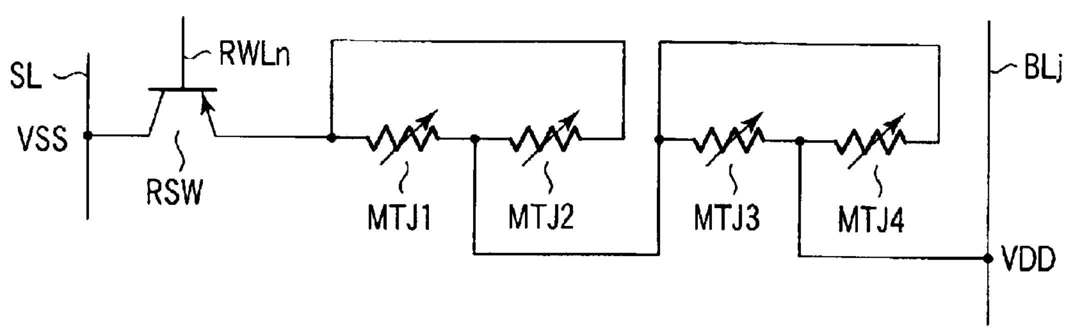
FIG. 41 is a view showing still another equivalent circuit of Structural Example 3 in read operation.

FIGS. 39 to 41 show equivalent circuits of Structural Example 3 of the cell array structure in read operation.

The four TMR elements MTJ1, MTJ2, MTJ3, and MTJ4 are connected in series-parallel. One end of the connection structure is connected to the read bit line BLj. The potential of the read bit line BLj is set at, e.g., the power supply potential VDD. The read select switch (MOS transistor) RSW is connected between the source line SL and the other end of the series-parallel connection structure of the TMR elements MTJ1, MTJ2, MTJ3, and MTJ4.

When the read select switch RSW is formed from a MOS transistor (FIG. 39), the potential of its gate, i.e., the read word line RWLn is set at "H". For this reason, the read select switch RSW is turned on. The source line SL is set at, e.g., the ground potential VSS.

When the read select switch RSW is formed from a diode (FIG. 40), the potential of its cathode, i.e., the read word line RWLn is set at "L (=VSS)". For this reason, the read select switch RSW is turned on.

When the read select switch RSW is formed from a bipolar transistor (FIG. 41), the potential of its base, i.e., the read word line RWLn is set at "H". For this reason, the read select switch RSW is turned on. The source line SL is set at, e.g., the ground potential VSS.

(2) Structures of TMR Element

① When Destructive Read Operation Principle is Applied

In this case, all the plurality of TMR elements MTJ1, MTJ2, MTJ3, and MTJ4 in the block BKjn can have identical structures.

Figure 42:
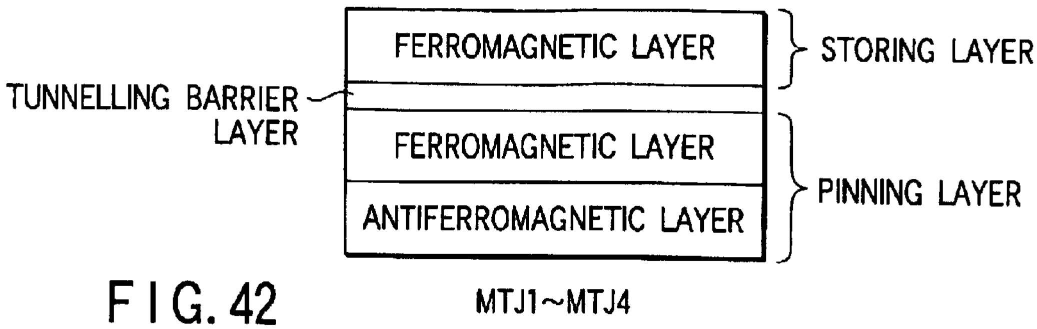
FIG. 42 is a view showing a structural example of a TMR element.
Figure 43:
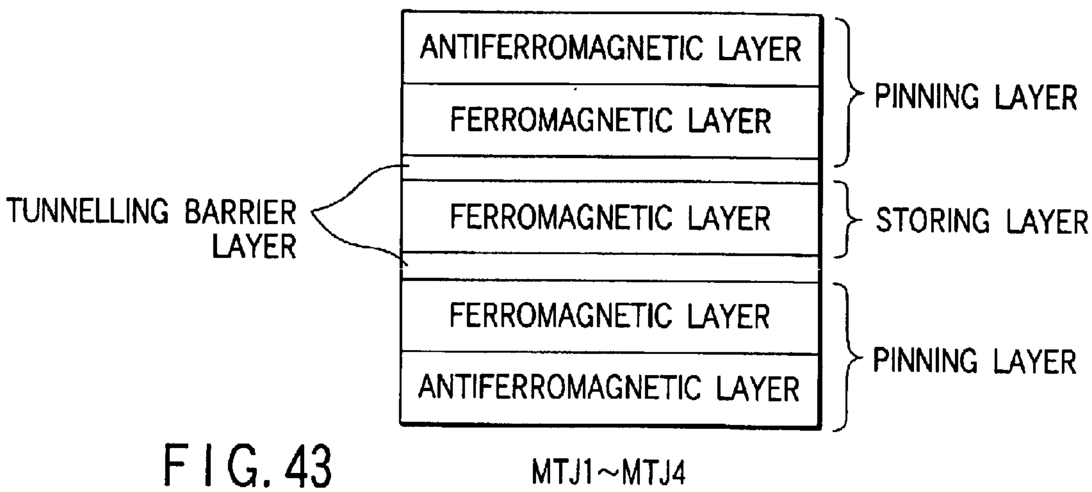
FIG. 43 is a view showing another structural example of the TMR element.
Figure 44:
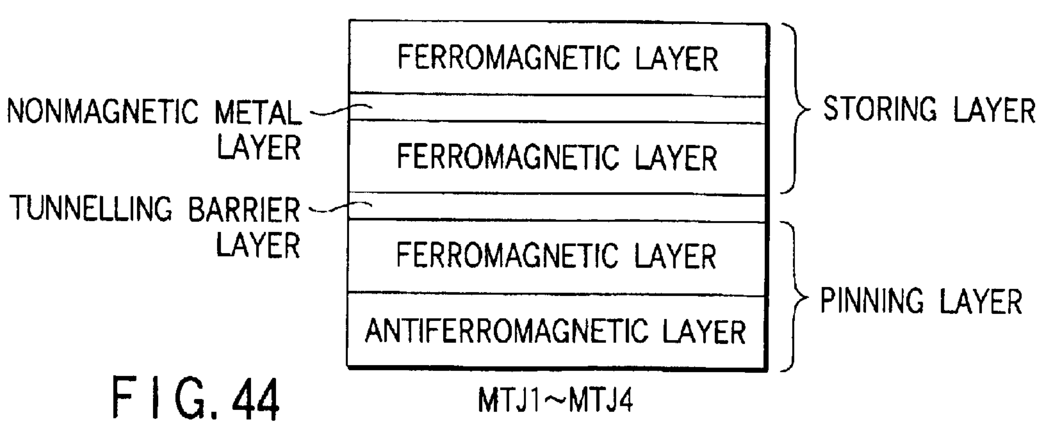
FIG. 44 is a view showing still another structural example of the TMR element.

FIGS. 42 to 44 show structural examples of a TMR element.

The TMR element shown in FIG. 42 has the most basic structure having two ferromagnetic layers and a tunneling barrier layer sandwiched between these layers.

An antiferromagnetic layer for fixing the magnetizing direction is added to a fixed layer (pinning layer) of the two ferromagnetic layers, in which the magnetizing direction is fixed. The magnetizing direction in a free layer (storing layer) of the two ferromagnetic layers, in which the magnetizing direction can be freely changed, is determined by a synthesized magnetic field formed by a write word line and write bit line.

The TMR element shown in FIG. 43 has two tunneling barrier layers in it to make the bias voltage higher than in the TMR element shown in FIG. 42.

The TMR element shown in FIG. 43 can be regarded to have a structure (double junction structure) in which two TMR elements shown in FIG. 42 are connected in series.

In this example, the TMR element has three ferromagnetic layers. Tunneling barrier layers are inserted between the ferromagnetic layers. Antiferromagnetic layers are added to the two ferromagnetic layers (pinning layers) at two ends. The middle layer in the three ferromagnetic layers serves as a free layer (storing layer) in which the magnetizing direction can be freely changed.

The TMR element shown in FIG. 44 can be easily reduced the switching current without deteriorating the memory retention characteristics, as compared to the TMR element shown in FIG. 42.

For the TMR element of this example, it can be regarded that the storing layer of the TMR element shown in FIG. 42 is replaced with a storing layer formed from two ferromagnetic layers and a nonmagnetic metal layer (e.g., an aluminum layer) sandwiched between those layers.

By thinning the storing layer consisted of one magnetic layer, the switching current can be reduced. But the memory retention characteristics, for example, the case of the disturbance by writing of a neighboring cell, deteriorate. The storing layer consisted of two magnetic layers and one non-magnetic layer can be reduced the switching current by thinning the storing layer like the storing layer consisted of one magnetic layer. By using magnetic coupling of two magnetic layers, the memory retention characteristics do not deteriorate.

② When Batch Read Operation Principle is Applied

In this case, the plurality of TMR elements connected in series, in parallel, or in series-parallel in the block have different structures.

More specifically, the structures of the plurality of TMR elements are determined such that the TMR elements have different resistance values when the magnetizing states of the plurality of TMR elements in the block are parallel (see "DESCRIPTION OF THE RELATED ART" for definition of "parallel" and "antiparallel")

STRUCTURAL EXAMPLE 1

Figure 45:
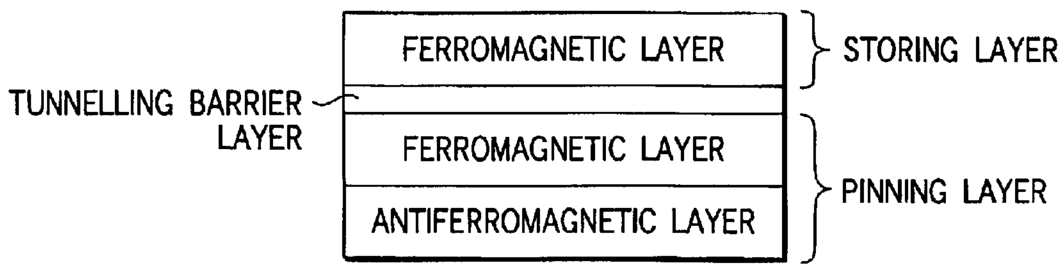
FIG. 45 is a view showing a structural example of a first TMR element.

FIG. 45 shows an example of the TMR element MTJ1.

The TMR element MTJ1 is formed from a basic unit. The basic unit means a unit that is formed from a tunneling barrier, a ferromagnetic layer (storing layer) arranged on one side of the tunneling barrier, and a ferromagnetic layer and antiferromagnetic layer which are arranged on the other side of the tunneling barrier.

The ferromagnetic layer arranged on the other side of the tunneling barrier is contact in the antiferromagnetic layer. Hence, its magnetizing direction is fixed. The ferromagnetic layer arranged on the other side of the tunneling barrier and the antiferromagnetic layer in contact with that ferromagnetic layer form a pinning layer.

The resistance value of the TMR element MTJ1 implemented by this structure is given by R.

Figure 46:
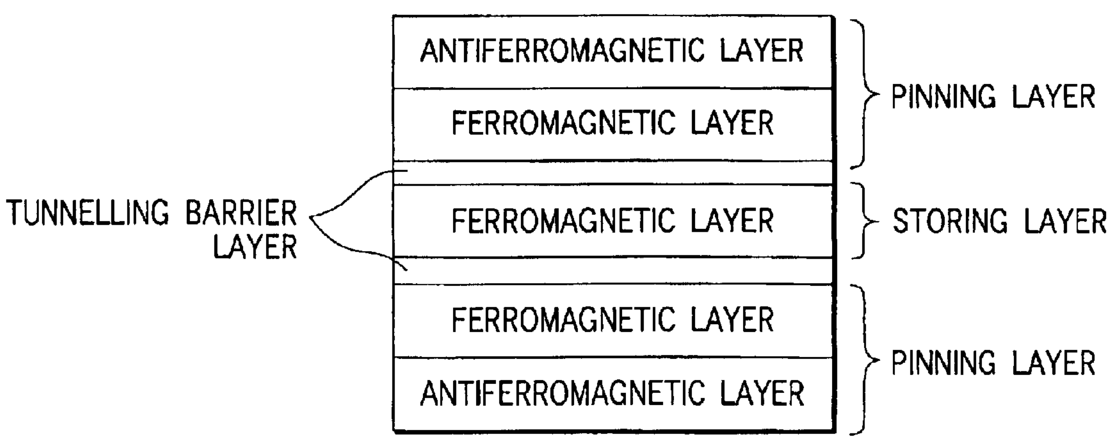
FIG. 46 is a view showing a structural example of a second TMR element.

FIG. 46 shows an example of the TMR element MTJ2.

The TMR element MTJ2 is formed from two basic units. The two basic units share one ferromagnetic layer (storing layer). That is, a pinning layer formed from a ferromagnetic layer and antiferromagnetic layer is arranged on one side of the ferromagnetic layer serving as the storing layer via a tunneling barrier. Another pinning layer formed from a ferromagnetic layer and antiferromagnetic layer is also arranged on the other side of the ferromagnetic layer serving as the storing layer via another tunneling barrier.

The TMR element MTJ2 has a structure in which tunneling barriers and pinning layers (ferromagnetic layers and antiferromagnetic layers) are arranged symmetrical with respect to the ferromagnetic layer serving as the storing layer.

The resistance value of the TMR element MTJ2 implemented by this structure is given by 2×R.

Figure 47:
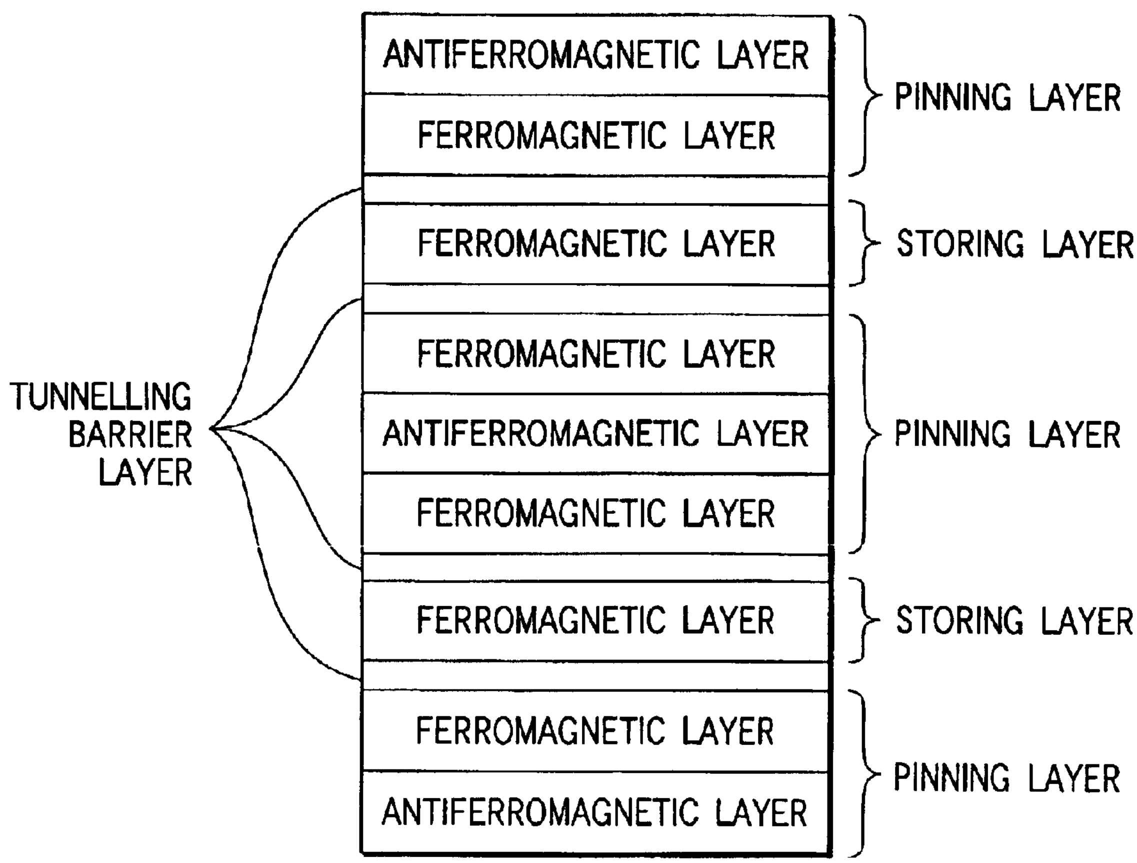
FIG. 47 is a view showing a structural example of a third TMR element.

FIG. 47 shows an example of the TMR element MTJ3.

The TMR element MTJ3 is formed from four basic units. The TMR element MTJ3 can be regarded to have two TMR elements MTJ2 connected in series. That is, the TMR element MTJ3 has a structure in which two TMR elements MTJ2 are connected in series, and the antiferromagnetic layer at the connection portion is shared by the two TMR elements MTJ2.

The TMR element MTJ3 has two storing layers. The two storing layers store identical data. That is, 1-bit data is stored in the TMR element MTJ3 by the two storing layers.

The resistance value of the TMR element MTJ3 implemented by this structure is given by 4×R.

Figure 48:
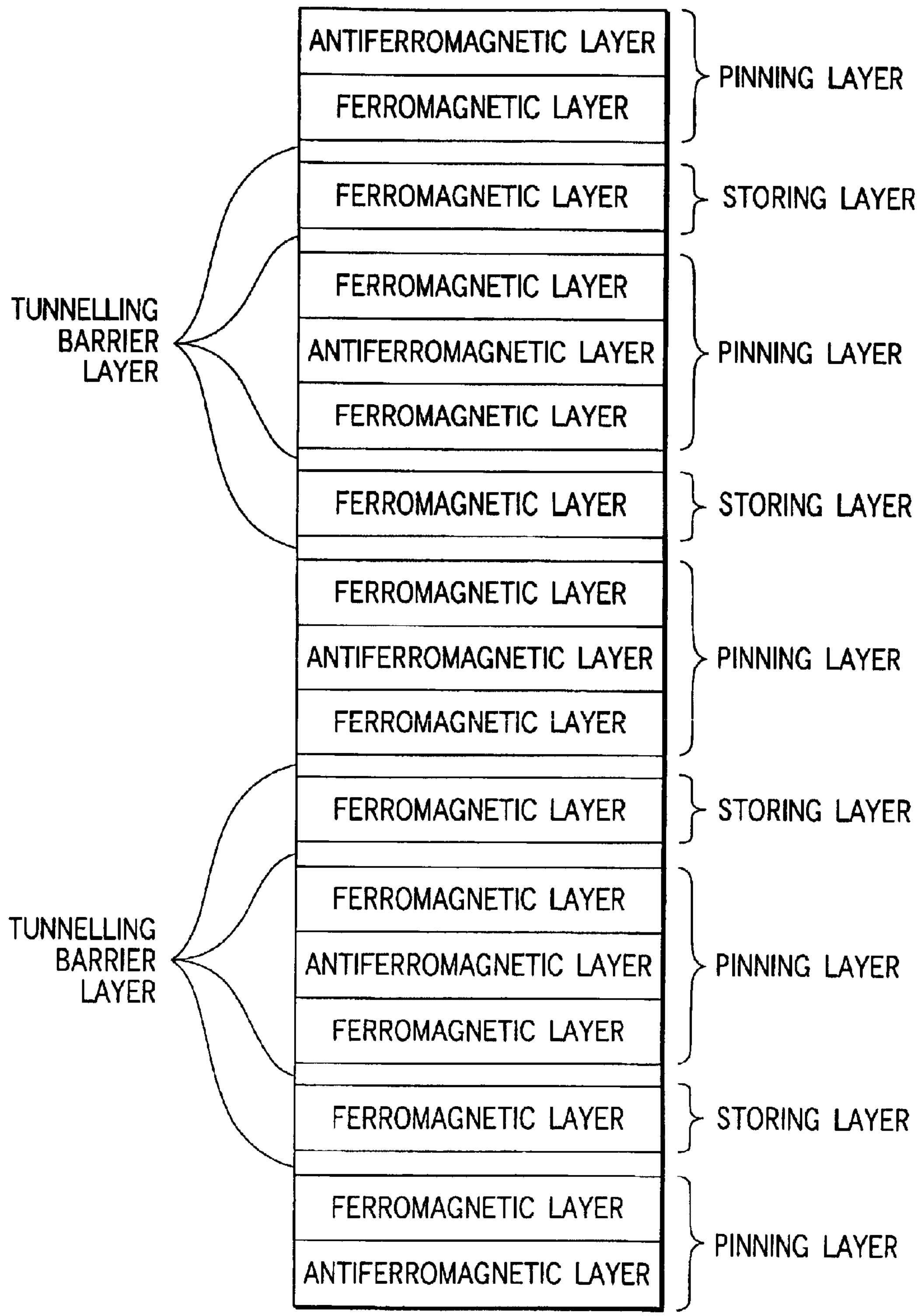
FIG. 48 is a view showing a structural example of a fourth TMR element.

FIG. 48 shows an example of the TMR element MTJ4.

The TMR element MTJ4 is formed from eight basic units. The TMR element MTJ4 can be regarded to have two TMR elements MTJ3 connected in series. That is, the TMR element MTJ4 has a structure in which two TMR elements MTJ3 are connected in series, and the antiferromagnetic layer at the connection portion is shared by the two TMR elements MTJ3.

The TMR element MTJ4 has four storing layers. The four storing layers store identical data. That is, 1-bit data is stored in the TMR element MTJ4 by the four storing layers.

The resistance value of the TMR element MTJ4 implemented by this structure is given by 8×R.

STRUCTURAL EXAMPLE 2

In Structural Example 1, a technique in which the number of tunneling barriers is changed by changing the number of basic units (MTJ elements) to change the resistance value of the TMR element has been described. In this case, however, since the number of basic units changes for each TMR element in one block, the TMR elements have different thicknesses.

In Structural Example 2, to solve the problem that the TMR elements in one block have different thicknesses, all the TMR elements in one block are formed from the same number of units to have the same thickness.

For example, when one block is formed from four TMR elements, each TMR element is formed from eight units.

To adjust the resistance value of each TMR element, some of the plurality of units of the TMR element are replaced with dummy units. A dummy unit is formed by replacing the tunneling barrier of a basic unit with a nonmagnetic metal layer.

For example, in the case that the resistance value of one basic unit is R, the resistance value of a TMR element formed from eight basic units is 8×R (eight tunneling barriers). In the case that four of the eight units are basic units, and the remaining four units are dummy units, the resistance value of the TMR element is 4×R (four tunneling barriers).

In the case that two of the eight units are basic units, and the remaining six units are dummy units, the resistance value of the TMR element is 2×R (two tunneling barriers). In the case that one of the eight units are a basic unit, and the remaining seven units are dummy units, the resistance value of the TMR element is R (one tunneling barrier).

The resistance value between two ferromagnetic layers that sandwich a nonmagnetic metal layer is much smaller than that between two ferromagnetic layers that sandwich a tunneling barrier. For this reason, if all the TMR elements are formed from the same number of units (basic and dummy units), the TMR elements can have the same thickness. In addition, the ratio of resistance values of TMR elements in one block can be set to, e.g., 1:2:4:8.

The tunneling barrier of the basic unit is made of, e.g., alumina. Alumina is made by oxidizing aluminum.

Hence, after an aluminum layer is formed, and a unit is formed without oxidizing the aluminum, the unit serves as a dummy unit. After an aluminum layer is formed, and the aluminum is oxidized to make alumina, the final unit serves as the basic unit having the resistance value R.

Figure 49:
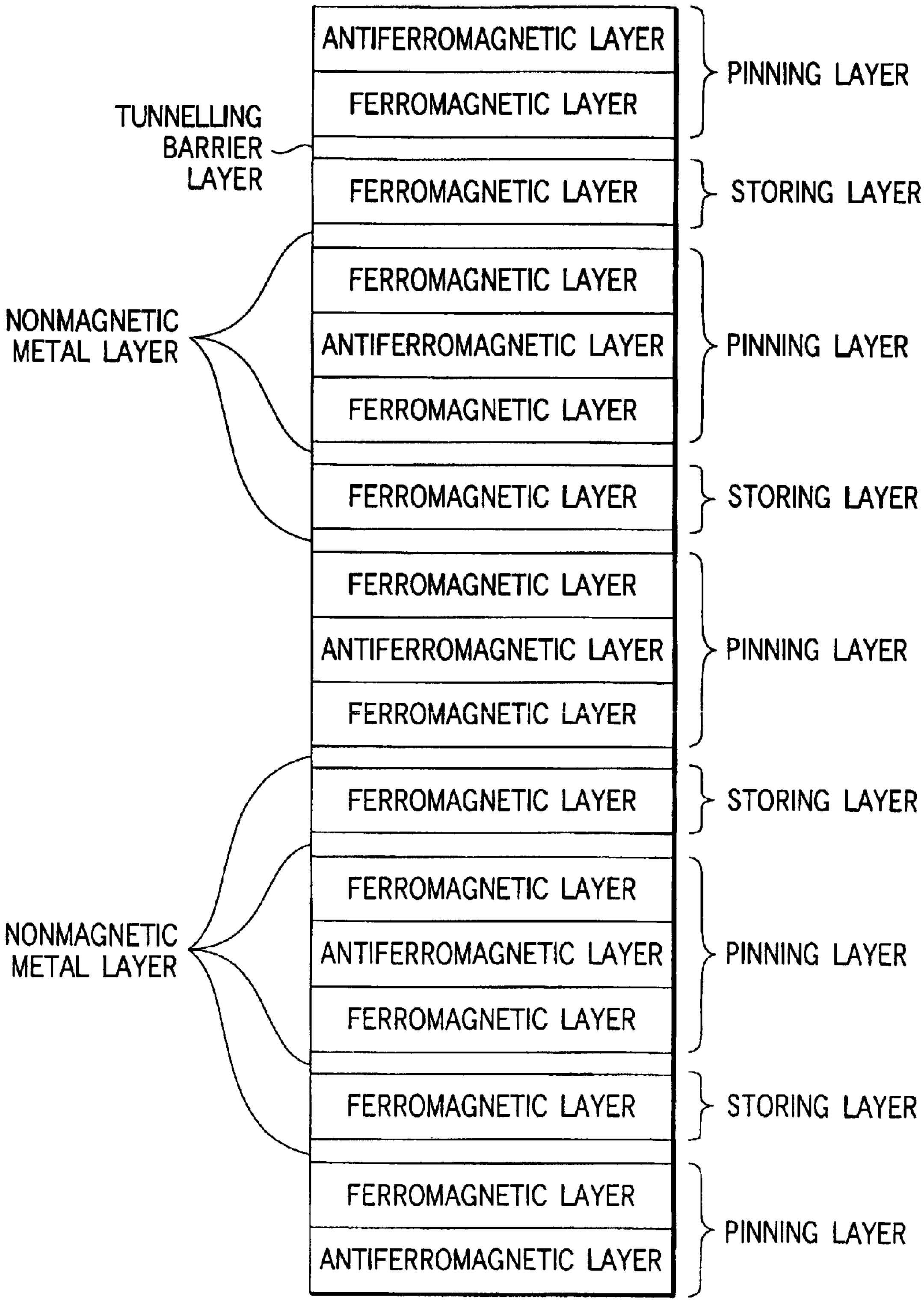
FIG. 49 is a view showing another structural example of the first TMR element.

FIG. 49 shows an example of the TMR element MTJ1.

The TMR element MTJ1 is formed from eight units. One of the eight units is a basic unit having a tunneling barrier. The remaining seven units are dummy units without any tunneling barriers (having nonmagnetic metal layers).

Hence, the resistance value of the TMR element MTJ1 implemented by this structure equals the resistance value R corresponding to one unit (or tunneling barrier).

FIG. 50 shows an example of the TMR element MTJ2.

The TMR element MTJ2 is formed from eight units. Two of the eight units are basic units each having a tunneling barrier. The remaining six units are dummy units without any tunneling barriers (having nonmagnetic metal layers).

Hence, the resistance value of the TMR element MTJ2 implemented by this structure equals the resistance value 2×R corresponding to two units (or tunneling barriers).

FIG. 51 shows an example of the TMR element MTJ3.

The TMR element MTJ3 is formed from eight units. Four of the eight units are basic units each having a tunneling barrier. The remaining four units are dummy units without any tunneling barriers (having nonmagnetic metal layers).

Hence, the resistance value of the TMR element MTJ3 implemented by this structure equals the resistance value 4×R corresponding to fouextendits (or tunneling barriers).

Figure 52:
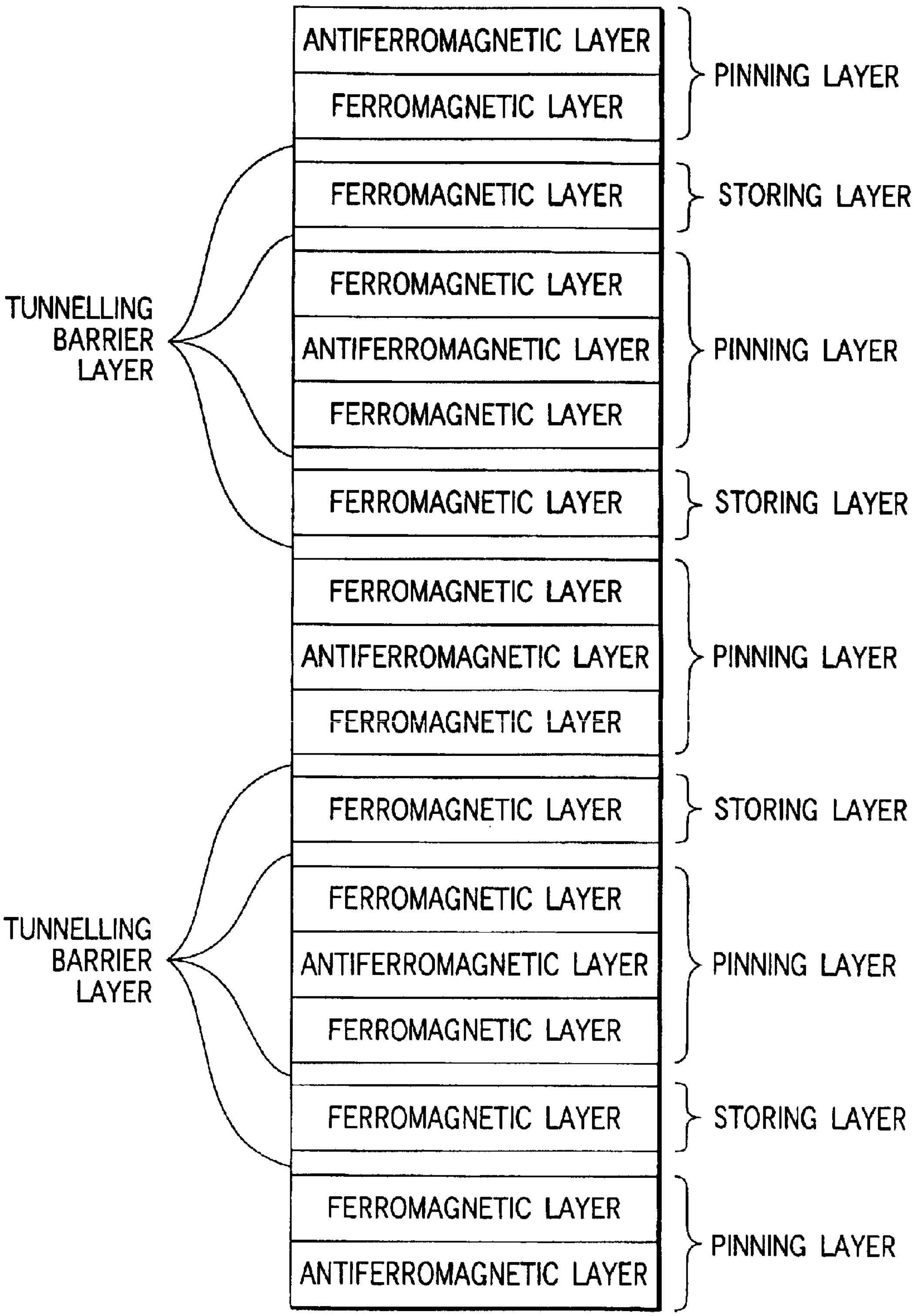
FIG. 52 is a view showing another structural example of the fourth TMR element.

FIG. 52 shows an example of the TMR element MTJ4.

The TMR element MTJ4 is formed from eight units. All the eight units are basic units each having a tunneling barrier.

Hence, the resistance value of the TMR element MTJ4 implemented by this structure equals the resistance value 8×R corresponding to eight units (or tunneling barriers).

Others

In this example, when all the plurality of TMR elements in one block have the same magnetizing states, the plurality of TMR elements in the block are caused to have different resistance values by changing the number of tunneling barriers.

This structure is a mere example, and various changes and modifications can be made. For example, for the TMR elements MTJ1, MTJ2, and MTJ3 shown in FIGS. 49 to 52, if the number of tunneling barriers is kept unchanged, the position of each basic unit having a tunneling barrier or the position of each dummy unit having a nonmagnetic metal layer can be arbitrarily changed.

(3) Conclusion

Structural examples of the TMR element have been described above. For the present invention (circuit structure, device structure, read operation mechanism, read circuit, read operation principle, read circuit, and manufacturing method), the structure of the TMR element is not particularly limited. The above-described structural examples are mere representative examples of the TMR element structure.

3. Read Operation Principle

In a magnetic random access memory, if only data of selected TMR elements can be read, ① a normal read operation principle for detecting read data by a sense amplifier is applied. When data of all TMR elements in a block are to be read in a mixed form (when a read bit line is shared), ② a so-called destructive read operation principle or ③ a batch read operation principle is applied.

A magnetic random access memory to which the destructive read operation principle can be applied is described in detail in, e.g., Japanese Patent Application No. 2001-350013. A magnetic random access memory to which the batch read operation principle can be applied is described in detail in, e.g., Japanese Patent Application No. 2001-365236.

4. Read Circuit

Circuit examples of a read circuit which implements the read operation principle of the present invention will be described.

(1) When Destructive Read Operation Principle is Applied

① Circuit Example 1

Figure 53:
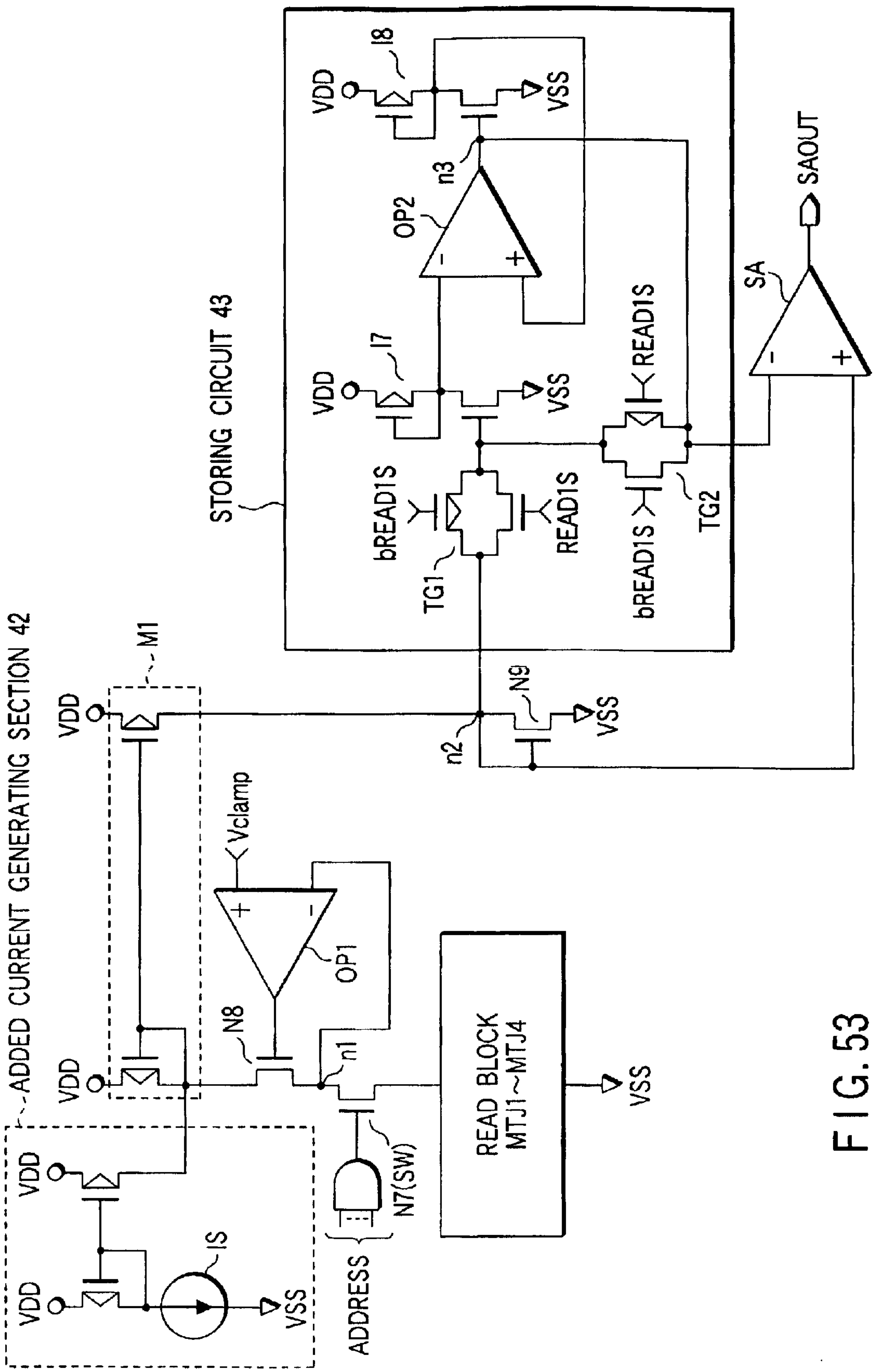
FIG. 53 is a view showing Circuit Example 1 of a read circuit according to the present invention.

FIG. 53 shows Circuit Example 1 of the read circuit of the magnetic random access memory.

A plurality of TMR elements are connected in parallel. One end of the TMR element group is connected to the ground point. The other end is connected to a node n1 through an NMOS transistor N7 (SW) serving as a column select switch. The TMR element group shown in FIG. 53 corresponds to one column in a reference example and Improved Examples 1, 2, and 5 and corresponds to one block in one column in Improved Examples 3, 4, and 6.

The node n1 is set at a clamp potential Vclamp by a clamp circuit. The clamp circuit is formed from an operational amplifier OP1 and NMOS transistor N8.

The NMOS transistor N8 is arranged between the node n1 and a current mirror circuit M1. The operational amplifier OP1 controls the gate potential of the NMOS transistor N8 such that, e.g., the potential of the node n1 equals the clamp potential Vclamp.

The clamp circuit adjusts the voltage across each TMR element in one column or one block.

For example, assume that the ground potential is applied to one terminal of a TMR element. If the potential at the other terminal of the TMR element becomes too high, the MR ratio of the TMR element becomes low. That the MR ratio of the TMR element is low means that the difference between the resistance value of the TMR element in a "1" state and that in a "0" state is small. That is, the margin for discriminating between "1" and "0" in the read mode is small.

To prevent this, in this example, the potential at the other terminal of the TMR element, i.e., the voltage across the TMR element is adjusted using the clamp circuit, thereby preventing the MR ratio of the TMR element from becoming low.

The current mirror circuit M1 supplies to an NMOS transistor N9 a current equal to the sum value of read currents that flow to the plurality of TMR elements. The potential (e.g., initial data) of a node n2 at this time is stored in a storing circuit 43 by a transfer gate circuit TG1.

The transfer gate circuit TG1 is ON/OFF-controlled by control signals READ1S and bREAD1S. The control signal READ1S changes to "H" in the read operation for the first time (in reading initial data). The control signal bREAD1S is an inverted signal having a value opposite to that of the control signal READ1S.

When the control signal READ1S is "H" (in the read operation for the first time), the potential of the node n2 is input to an inverter circuit I7 through the transfer gate circuit TG1. The output signal from the inverter circuit I7 is input to the negative input terminal of an operational amplifier OP2. The output signal from the operational amplifier OP2 is input to an inverter circuit I8. The output signal from the inverter circuit I8 is input to the positive input terminal of the operational amplifier OP2.

The operational amplifier OP2 controls, e.g., the gate potential of the NMOS transistor in the inverter circuit I8 such that the input potential input to the negative input terminal equals the input potential input to the positive input terminal. As a result, the current that flows to the inverter circuit I8 that receives the output signal from the operational amplifier OP2 becomes initial data (cell data).

A transfer gate circuit TG2 is connected between the output terminal of the operational amplifier OP2 and the input terminal of the inverter circuit I7. When the read operation for the first time is ended, the control signal READ1S changes to "L". The control signal bREAD1S changes to "H". Consequently, the initial data is latched into the storing circuit 43.

The positive input terminal of a sense amplifier SA is connected to the node n2. The negative input terminal is connected to an output terminal n3 of the operational amplifier OP2. To determine the data of a selected TMR element, the sense amplifier SA compares the potential of the node n2 with the potential of the output terminal n3 of the operational amplifier OP2.

That is, the potential of the node n1 represents the read result (comparison data) for the second time. The potential of the output terminal n3 of the operational amplifier OP2 represents the read result (initial data) for the first time.

When the number of TMR elements connected in parallel in one column or in one block increases, the signal current value with respect to the read current value becomes very small. Hence, it is difficult to detect the small signal current by the sense amplifier.

To prevent this, an added current generating section 42 is used in this example.

The added current generating section 42 has a current source Is. A constant current generated by the current source Is is supplied to the TMR elements by a current mirror circuit M2.

That is, in Circuit Example 1, when the cell current flowing to the TMR elements connected in parallel in one column or in one block is represented by Icell, the current flowing to the current mirror circuit M1, i.e., a current Isense flowing to the NMOS transistor N9 is given by Isense=Icell−Is.

With this arrangement, the signal current value with respect to the read current value can be made large. Hence, the signal current detection sensitivity by the sense amplifier can be improved.

② Circuit Example 2

FIG. 54 shows Circuit Example 2 of the read circuit of the magnetic random access memory.

Circuit Example 2 is a modification to Circuit Example 1. Circuit Example 2 is characterized in a storing circuit 43, as compared to Circuit Example 1. In Circuit Example 1, the storing circuit 43 has the two inverter circuits I7 and I8 and the operational amplifier OP2. In Circuit Example 2, the storing circuit 43 has no operational amplifier but four stage current mirror circuits I9, I9', I10, and I11.

That is, in Circuit Example 2, initial data is latched into the storing circuit 43 using a current mirror circuit without using any operational amplifiers.

For example, in the read operation for the first time (in reading initial data), a control signal READ1S changes to "H". For this reason, the potential (initial data) of the node n1 is transferred to the storing circuit 43 formed from the four stage current mirror circuits I9, I9', I10, and I11. Each current of 19, I9', I10, I11 is equal to each other, because I9, I9', I10, I11 are consist of the current mirror circuit. If the current mirror circuit is designed to that MOS transistors which consist of I9, I9', I10, I11 operate in the saturation region, the potential of the node n3 is equal to the gate potential of the NMOS transistor in I9, because the structure of I9 is equal to that of I10. When the read operation for the first time is ended, the control signal READ1S changes to "L". When the control signal bREAD1S changes to "H", the potential of the node n3 that is equal to that of the node n1 is transferred to the gate potential of the NMOS transistor in I9. Hence, the initial data is latched by the storing circuit 43.

③ Circuit Example 3

Figure 55:
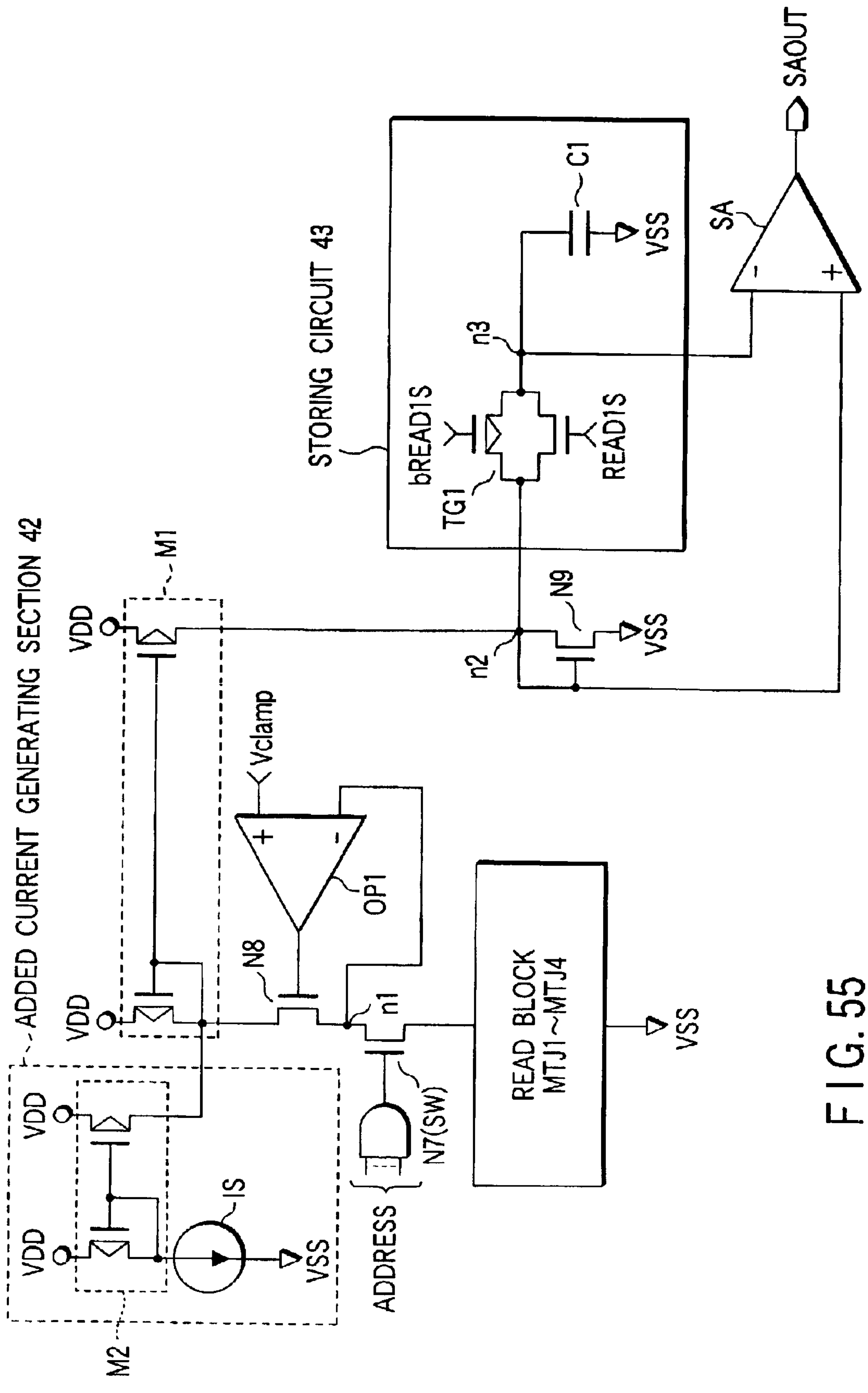
FIG. 55 is a view showing Circuit Example 3 of the read circuit according to the present invention.

FIG. 55 shows Circuit Example 3 of the read circuit of the magnetic random access memory.

Circuit Example 3 is also a modification to Circuit Example 1. Circuit Example 3 is characterized in a storing circuit 43, as compared to Circuit Example 1. In Circuit Example 3, the storing circuit 43 is formed from a capacitor C1.

In this example, for example, the potential (initial data) of a node n2 is dynamically stored in the capacitor C1. For this purpose, for example, the period from the first read to the second read must be made shorter than the period when the capacitor C1 continuously holds data.

The period when the capacitor C1 continuously holds data is, e.g., several ten msec, as has been sufficiently studied in the field of DRAM (Dynamic Random Access Memory). Hence, when the period from the first read to the second read is made shorter than several msec, the capacitor C1 can be used for the storing circuit 43.

④ Detailed Examples of Sense Amplifier

Detailed examples of the sense amplifier SA used in Circuit Examples 1, 2, and 3 will be described. The arrangement of the sense amplifier SA is determined by the value of trial data written in a selected TMR element in the destructive read operation.

When Trial Data Is "1"

Figure 56:
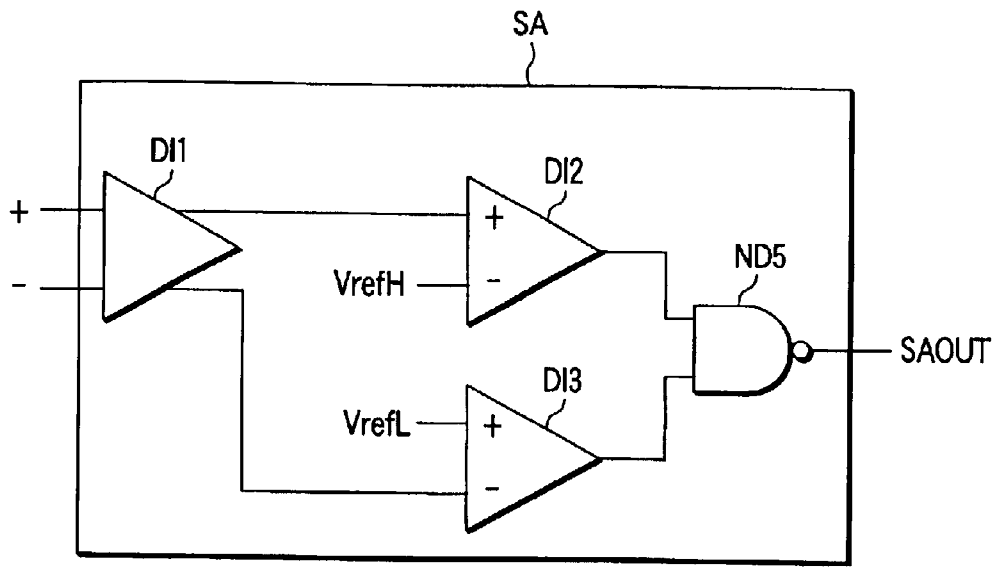
FIG. 56 is a view showing an example of a sense amplifier.

FIG. 56 shows an example of the sense amplifier when trial data is "1".

The sense amplifier SA is formed from, e.g., three differential amplifiers DI1, DI2, and DI3 and a NAND circuit ND5.

The differential amplifier DI1 at the first stage compares the potential (e.g., comparison data) of the node n2 with the potential (e.g., initial data) of the node n3 shown in FIGS. 53 to 55. The differential amplifier DI1 outputs two output potentials on the basis of the two input potentials. The difference between the two output potentials of the differential amplifier DI1 is determined on the difference between the two input potentials.

A potential based on the potential of the node n2 is input to the positive input terminal of the differential amplifier DI2. A reference potential VrefH is input to the negative input terminal. When the potential input to the positive input terminal is higher than the reference potential VrefH, the differential amplifier DI2 outputs "H". When the potential input to the positive input terminal is lower than the reference potential VrefH, the differential amplifier DI2 outputs "L".

A potential based on the potential of the node n3 is input to the negative input terminal of the differential amplifier DI3. A reference potential VrefL is input to the positive input terminal. When the potential input to the negative input terminal is lower than the reference potential VrefL, the differential amplifier DI3 outputs "H". When the potential input to the negative input terminal is higher than the reference potential VrefL, the differential amplifier DI3 outputs "L".

For example, when data of a selected TMR element is "0", and trial data is "1", comparison data read by the read operation for the second time, i.e., the potential of the node n2 is higher than initial data read by the read operation for the first time, i.e., the potential of the node n3.

At this time, the potential input to the positive input terminal of the differential amplifier DI2 is higher than the reference potential VrefH input to the negative input terminal. Hence, the output signal from the differential amplifier DI2 changes to "H". In addition, the potential input to the negative input terminal of the differential amplifier DI3 is lower than the reference potential VrefL input to the positive input terminal. Hence, the output signal from the differential amplifier DI3 also changes to "H".

Hence, the output signal from the NAND circuit ND5 is "L", i.e., the output signal from the sense amplifier SA is "0" ("L"="0"). That is, it is determined that the data of the selected TMR element is "0".

For example, when data of a selected TMR element is "1", and trial data is "1", comparison data read by the read operation for the second time, i.e., the potential of the node n2 substantially equals initial data read by the read operation for the first time, i.e., the potential of the node n3.

At this time, the differential amplifier DI1 outputs two output potentials on the basis of the small potential difference between the nodes n2 and n3.

However, the potential input to the positive input terminal of the differential amplifier DI2 does not become higher than the reference potential VrefH input to the negative input terminal at all. For this reason, the output signal from the differential amplifier DI2 changes to "L". In addition, the potential input to the negative input terminal of the differential amplifier DI3 does not become lower than the reference potential VrefL input to the positive input terminal at all. For this reason, the output signal from the differential amplifier DI3 also changes to "L".

Hence, the output signal from the NAND circuit ND5 is "H", i.e., the output signal from the sense amplifier SA is "1" ("H"="1"). That is, it is determined that the data of the selected TMR element is "1".

Figure 57:
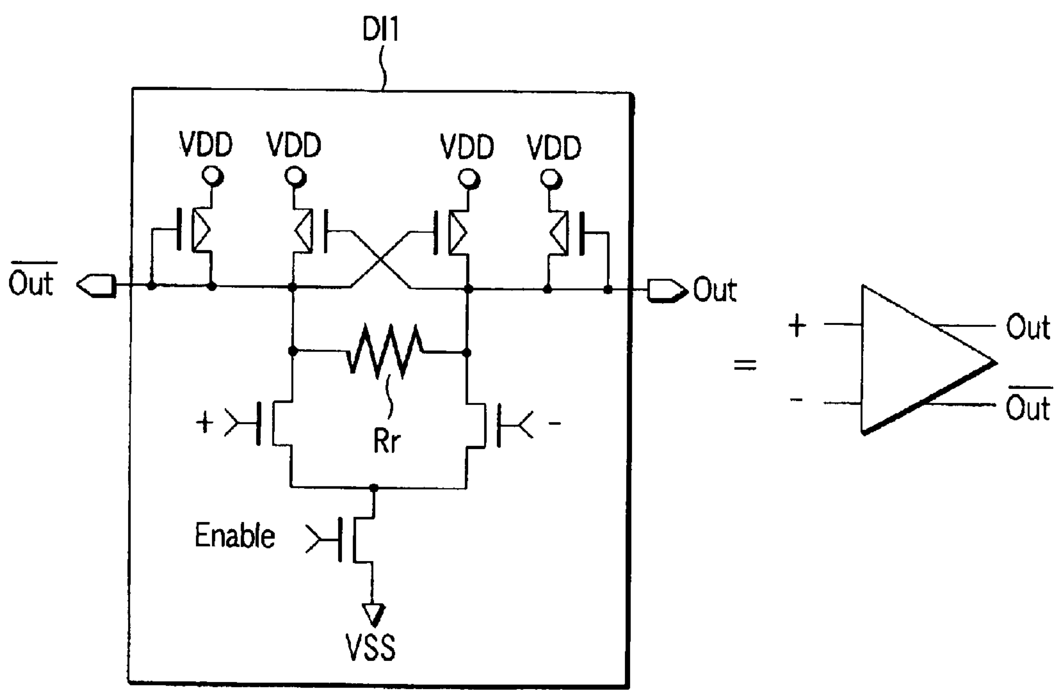
FIG. 57 is a view showing an example of a differential amplifier in the sense amplifier.

FIG. 57 shows an example of the differential amplifier at the first stage of the sense amplifier shown in FIG. 56.

As a characteristic feature of this differential amplifier DI1, a resistor Rr having an adequate resistance value is connected between the two output terminals.

The resistor is connected between the two output terminals of the differential amplifier DI1. If the data of a selected TMR element is the same as the trial data, i.e., the two input potentials have little difference, the differential amplifier DI1 does not amplify the difference. Only when the two input potentials have an obvious difference, the differential amplifier DI1 amplifies and outputs the difference.

FIG. 58 shows another example of the differential amplifier at the first stage of the sense amplifier shown in FIG. 56.

As a characteristic feature of this differential amplifier DI1, a depletion-type MOS transistor QD is connected between the two output terminals.

The depletion-type MOS transistor QD has the same function as that of the resistor Rr shown in FIG. 57. That is, if the data of a selected TMR element is the same as the trial data, i.e., the two input potentials have little difference, the differential amplifier DI1 does not amplify the difference. Only when the two input potentials have an obvious difference, the differential amplifier DI1 amplifies and outputs the difference.

When Trial Data Is "0"

FIG. 59 shows an example of the sense amplifier when trial data is "0".

The sense amplifier SA is formed from, e.g., the three differential amplifiers DI1, DI2, and DI3 and a NOR circuit NR3.

The differential amplifier DI1 at the first stage compares the potential (e.g., comparison data) of the node n2 with the potential (e.g., initial data) of the node n3 shown in FIGS. 53 to 55. The differential amplifier DI1 outputs two output potentials on the basis of the two input potentials. The difference between the two output potentials of the differential amplifier DI1 is determined on the difference between the two input potentials.

A potential based on the potential of the node n2 is input to the positive input terminal of the differential amplifier DI2. The reference potential VrefL is input to the negative input terminal. When the potential input to the positive input terminal is lower than the reference potential VrefL, the differential amplifier DI2 outputs "L". When the potential input to the positive input terminal is higher than the reference potential VrefL, the differential amplifier DI2 outputs "H".

A potential based on the potential of the node n3 is input to the negative input terminal of the differential amplifier DI3. The reference potential VrefH is input to the positive input terminal. When the potential input to the negative input terminal is higher than the reference potential VrefH, the differential amplifier D13 outputs "L". When the potential input to the positive input terminal is lower than the reference potential VrefH, the differential amplifier DI3 outputs "H".

For example, when data of a selected TMR element is "1", and trial data is "0", comparison data read by the read operation for the second time, i.e., the potential of the node n2 is lower than initial data read by the read operation for the first time, i.e., the potential of the node n3.

At this time, the potential input to the positive input terminal of the differential amplifier DI2 is lower than the reference potential VrefL input to the negative input terminal. Hence, the output signal from the differential amplifier DI2 changes to "L". In addition, the potential input to the negative input terminal of the differential amplifier DI3 is higher than the reference potential VrefH input to the positive input terminal. Hence, the output signal from the differential amplifier DI3 also changes to "L".

Hence, the output signal from the NOR circuit NR3 is "H", i.e., the output signal from the sense amplifier SA is "1" ("H"="1"). That is, it is determined that the data of the selected TMR element is "1".

For example, when data of a selected TMR element is "0", and trial data is "0", comparison data read by the read operation for the second time, i.e., the potential of the node n2 substantially equals initial data read by the read operation for the first time, i.e., the potential of the node n3.

At this time, the differential amplifier DI1 outputs two output potentials on the basis of the small potential difference between the nodes n2 and n3.

However, the potential input to the positive input terminal of the differential amplifier DI2 does not become lower than the reference potential VrefL input to the negative input terminal at all. For this reason, the output signal from the differential amplifier DI2 changes to "H". In addition, the potential input to the negative input terminal of the differential amplifier DI3 does not become higher than the reference potential VrefH input to the positive input terminal at all. For this reason, the output signal from the differential amplifier DI3 also changes to "H".

Hence, the output signal from the NOR circuit NR3 is "L", i.e., the output signal from the sense amplifier SA is "0" ("L"="0"). That is, it is determined that the data of the selected TMR element is "0".

As the differential amplifier DI1 of the sense amplifier SA shown in FIG. 59 as well, the differential amplifier DI1 having the arrangement shown in FIG. 57 or 58 can be used.

If the data of a selected TMR element is the same as the trial data, i.e., the two input potentials have little difference, the sense amplifier does not amplify the difference. Only when the two input potentials have an obvious difference, the sense amplifier amplifies and outputs the difference.

⑤ Detailed Examples of Operational Amplifiers

FIG. 60 shows a detailed example of the operational amplifier OP1 shown in FIGS. 53 to 55.

The clamp potential Vclamp is input to the positive input terminal of the operational amplifier OP1. The potential of the node n1 is input to the negative input terminal. When an enable signal Enable changes to "H", an output signal Out that equalizes the potential of the node n1 with the clamp potential Vclamp is output.

FIG. 61 shows a detailed example of the operational amplifier OP2 shown in FIG. 53.

The output signal from the inverter circuit I8 shown in FIG. 53 is input to the positive input terminal of the operational amplifier OP2. The output signal from the inverter circuit I7 is input to the negative input terminal. When the enable signal Enable changes to "H", the output signal Out that equalizes the output signal from the inverter circuit I7 with the output signal from the inverter circuit I8 is output.

⑥ Detailed Example of Current Source of Added current generating section

FIG. 62 shows an example of the current source of the added current generating section.

The current source Is of the added current generating section 42 can have the same arrangement as that of, e.g., the memory cell array section. That is, the current source Is can be formed from a plurality of TMR elements connected in parallel, a clamp circuit, and an NMOS transistor.

The number of TMR elements in the current source Is is preferably smaller than the number of TMR elements connected in parallel in one column or in one block of the memory cell array.

In this example, the added current generating section 42 is formed using TMR elements. Instead, e.g., a BGR circuit may be used.

⑦ Operations of Circuit Examples 1, 2, and 3

Read Operation for First Time

In the read operation for the first time, initial data is read.

A column address signal is input to turn on the column select switch N7 (SW). The operational amplifier OP1 controls the gate potential of the NMOS transistor N8 such that the potential of the node n1 equals the clamp potential Vclamp.

At this time, the read current flows from the power supply terminal VDD to the ground point through the transistors N7 and N8 and the plurality of TMR elements. The current mirror circuit M1 supplies a current equal to the read current to the NMOS transistor N9.

Hence, a potential (initial data) corresponding to the combined resistance of the plurality of TMR elements appears at the node n2.

In the read operation for the first time, the control signal READ1S is "H". That is, the transfer gate circuit TG1 is ON, and the transfer gate circuit TG2 is OFF. For this reason, the potential of the node n2 is input to the storing circuit 43 through the transfer gate circuit TG1.

In the example shown in FIG. 53, the operational amplifier OP2 controls the gate potential of the NMOS transistor in the inverter circuit I8 such that the negative-side input potential equals the positive-side input potential. As a result, the current flowing to the inverter circuit I8 becomes initial data (cell data).

In the example shown in FIG. 54, the potential of the output node n3 of the inverter circuit I11 becomes initial data (cell data). In the example shown in FIG. 55, the potential of one terminal n3 of the capacitor Cl becomes initial data (cell data).

When the read operation for the first time is ended, the control signal READ1S changes to "L". The control signal bREAD1S changes to "H". As a consequence, the initial data is latched into the storing circuit 43.

Read Operation for Second Time and Data Determining Operation

After trial data is written in a selected TMR element (normal destructive read operation), or simultaneously with the write operation (improved destructive read operation), the read operation for the second time is executed to read comparison data.

A column address signal is input to turn on the column select switch N7 (SW). The operational amplifier OP1 controls the gate potential of the NMOS transistor N8 such that the potential of the node n1 equals the clamp potential Vclamp.

At this time, the read current flows from the power supply terminal VDD to the ground point through the transistors N7 and N8 and the plurality of TMR elements. The current mirror circuit M1 supplies a current equal to the read current to the NMOS transistor N9.

Hence, a potential (comparison data) corresponding to the combined resistance of the plurality of TMR elements appears at the node n2.

At this time, the potential of the node n2 is input to the positive input terminal of the sense amplifier SA. The potential of the node n3 of the storing circuit 43 is input to the negative input terminal. As a result, the sense amplifier SA determines the value of the data of the selected TMR element on the basis of the potential of the node n2 and the potential of the node n3.

(2) When Batch Read Operation Principle is Applied

According to the batch read operation principle, in the read operation, a read potential Vtotal corresponding to the combined resistance value of the plurality of TMR elements in the read block appears on the read bit line BLj. When the number of TMR elements in the read block is N (N is 2 or more), $2^N$ kinds of combined resistance values corresponding to the number of combinations of data values of the TMR elements are present.

Hence, when the read potential Vtotal that appears on the read bit line BLj is detected by the read circuit (including a sense amplifier), the data of the TMR elements in the read block can easily be read at once.

① Sense Amplifier

Figure 63:
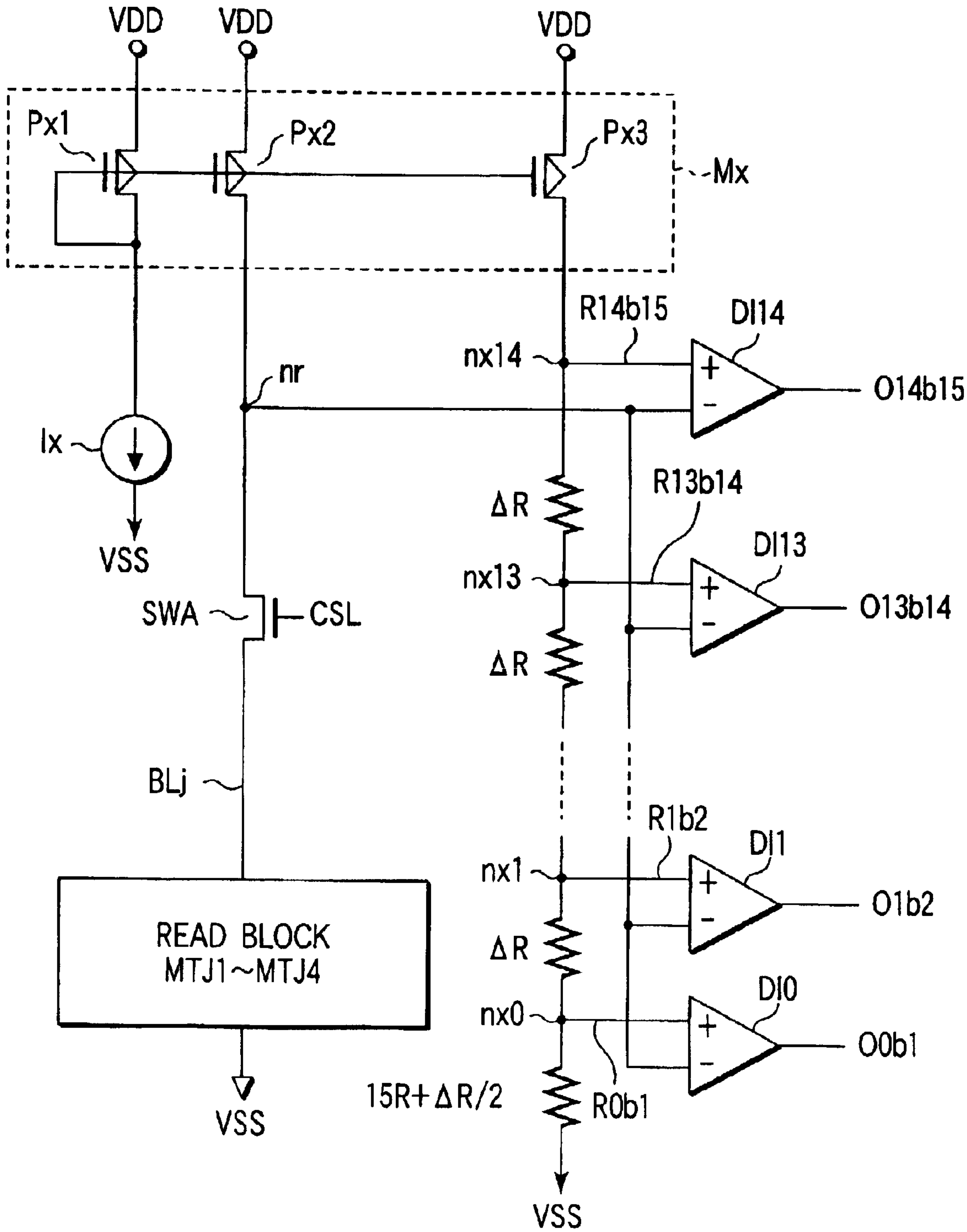
FIG. 63 is a view showing Circuit Example 4 of the read circuit according to the present invention.

FIG. 63 shows a circuit example of the read circuit according to the present invention.

This read circuit is formed from an analog/digital converter (A/D converter) serving as a sense amplifier.

One terminal of a block BKjn formed from four TMR elements connected in series is connected to the power supply terminal through an NMOS transistor SWA and PMOS transistor P×2. The other terminal is connected to the ground terminal. The four TMR elements in the block BKjn may be connected not in series but in parallel.

A first current path means a path from the power supply terminal to the ground terminal through the MOS transistors P×2 and SWA and the plurality of TMR elements.

One terminal of each of 14 resistive elements each having a resistance value ΔR is connected to the power supply terminal through a PMOS transistor P×3. The other terminal is connected to the ground terminal through a resistive element having a resistance value 15R+ΔR/2. A second current path means a path from the power supply terminal to the ground terminal through the MOS transistor P×3 and the plurality of resistive elements.

R and ΔR have the same meanings as those described in "Read Operation Principles".

A PMOS transistor P×1 and the PMOS transistors P×2 and P×3 form a current mirror circuit. For this reason, a constant current generated by a constant current source Ix flows to the above-described first and second current paths.

The current flowing to the first current path is a read current. This read current flows to the plurality of TMR elements. As a result, the read potential Vtotal corresponding to the data value (combined resistance value) of the data of the TMR elements in the block BKjn appears at a node nr. On the other hand, when a current flows to the second current path, predetermined reference potentials appear at connection points n×0, n×1, . . . , n×13, and n×14 of the respective resistive elements.

Differential amplifiers DI0, DI1, . . . , DI13, and DI14 compare the read potential Vtotal of the node nr with the predetermined reference potentials and output the comparison results as output signals O0b1, O1b2, . . . , O13b14, and O14b15.

For example, the reference potential of the node n×0 is input to the positive input terminal of the differential amplifier DI0. The read potential Vtotal of the node nr is input to the negative input terminal. Similarly, the reference potential of the node n×1 is input to the positive input terminal of the differential amplifier DI1. The read potential Vtotal of the node nr is input to the negative input terminal. The reference potential of the node n×14 is input to the positive input terminal of the differential amplifier DI14. The read potential Vtotal of the node nr is input to the negative input terminal.

Detailed operation of the sense amplifier is disclosed in Japanese Patent Application No. 2001-365236, and a description thereof will be omitted.

② Logic Circuit

Logic circuits which actually determine the data values of the TMR elements MTJ1, MTJ2, MTJ3, and MTJ4 in the read block on the basis of the output signals O0b1, O1b2, . . . , O13b14, and O14b15 from the sense amplifier (A/D converter) will be described next.

Figure 64:
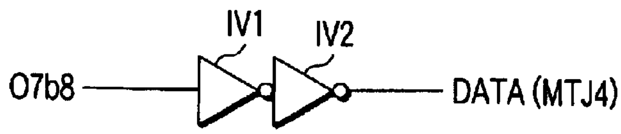
FIG. 64 is a view showing a logic circuit which determines the data value of the fourth TMR element.

FIG. 64 shows an example of a logic circuit which determines the data value of the TMR element MTJ4 on the basis of an output signal from the A/D converter.

The data value of the TMR element MTJ4 is determined on the basis of the output signal O7b8 of the output signals O0b1, O1b2, . . . , O13b14, and O14b15 from the A/D converter.

As described above, the data value of the TMR element MTJ4 can be determined from only the value of the output signal O7b8. Hence, the logic circuit for determining the data value of the TMR element MTJ4 is constituted by inverters IV1 and IV2 connected in series.

Figure 65:
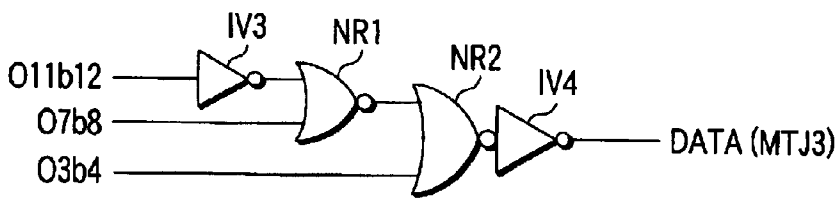
FIG. 65 is a view showing a logic circuit which determines the data value of the third TMR element.

FIG. 65 shows an example of a logic circuit which determines the data value of the TMR element MTJ3 on the basis of output signals from the A/D converter.

The data value of the TMR element MTJ3 is determined on the basis of the output signals O3b4, 07b8, and O11b12 of the output signals O0bl, O1b2, . . . , O13b14, and O14b15 from the A/D converter.

As described above, the data value of the TMR element MTJ3 can be determined from the values of the output signals O3b4, O7b8, and O11b12. Hence, the logic circuit for determining the data value of the TMR element MTJ3 is constituted by inverters IV3 and IV4 and NOR gate circuits NR1 and NR2.

For example, when O3b4="1", the data value of the TMR element MTJ3 is determined to be "1". When O3b4="0" and O7b8="1", the data value of the TMR element MTJ3 is determined to be "0". When O3b4="0", O7b8="0", and O11b12="1", the data value of the TMR element MTJ3 is determined to be "1". When O3b4="0", O7b8="0", and O11b12="0", the data value of the TMR element MTJ3 is determined to be "0".

Figure 66:
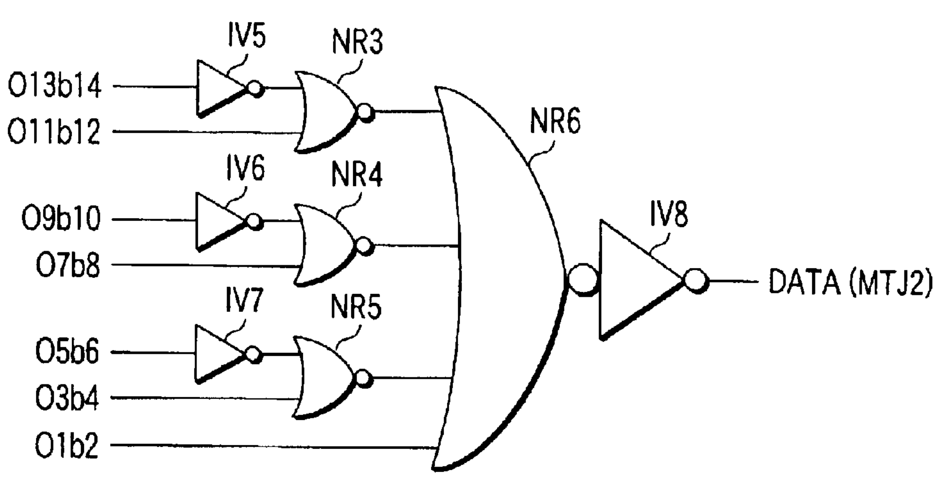
FIG. 66 is a view showing a logic circuit which determines the data value of the second TMR element.

FIG. 66 shows an example of a logic circuit which determines the data value of the TMR element MTJ2 on the basis of output signals from the A/D converter.

The data value of the TMR element MTJ2 is determined on the basis of the output signals O1b2, O3b4, O5b6, O7b8, O9b10, and O11b12, and O13b14 of the output signals O0b1, O1b2, . . . , O13b14, and O14b15 from the A/D converter.

The logic circuit for determining the data value of the TMR element MTJ2 is constituted by inverters IV5, IV6, IV7, and IV8 and NOR gate circuits NR3, NR4, NR5, and NR6.

For example, when O1b2="1", the data value of the TMR element MTJ2 is determined to be "1". When O1b2="0" and O3b4="1", the data value of the TMR element MTJ2 is determined to be "0". When O1b2="0", O3b4="0", and O5b6="1", the data value of the TMR element MTJ2 is determined to be "1".

FIG. 67 shows an example of a logic circuit which determines the data value of the TMR element MTJ1 on the basis of output signals from the A/D converter.

The data value of the TMR element MTJ1 is determined on the basis of all the output signals O0b1, O1b2, . . . , O13b14, and O14b15 from the A/D converter.

The logic circuit for determining the data value of the TMR element MTJ1 is constituted by inverters IV9, IV10, IV11, IV12, IV13, IV14, IV15, and IV16 and NOR gate circuits NR7, NR8, NR9, NR10, NR11, NR12, NR13, and NR14.

For example, when O0b1="1", the data value of the TMR element MTJ1 is determined to be "1". When O0b1="0" and O1b2="1", the data value of the TMR element MTJ1 is determined to be "0". When O0b1="0", O1b2="0", and O2b3="1", the data value of the TMR element MTJ1 is determined to be "1".

The output signals O0b1, O1b2, . . . , O13b14, and O14b15 from the A/D converter can take three patterns: all the output signals are "1", all the output signals are "0", and both the output signals "0" and "1" are present.

When output signals "0" and "1" are present, the boundary between "0" and "1" is always present. All the output signals on one side of the boundary are "0". The output signals on the other side are "1".

5. Circuit Examples Except Read Circuit

Circuit examples except the read circuit, i.e., circuit examples of the write word line driver/sinker, circuit examples of the write bit line drivers/sinkers, a circuit example of the read word line driver, and a circuit example of the column decoder will be described.

(1) Write Word Line Driver/Sinker

FIG. 68 shows a circuit example of the write word line driver/sinker.

In this example, as described in "1. Cell Array Structure", assume that TMR elements stacked at four stages and three write word lines are present in one row. FIG. 68 shows a write word line driver/sinker corresponding to only one row.

A write word line driver 23A-0 includes PMOS transistors QP15, QP16, and QP17 and NAND gate circuits ND1, ND2, and ND3. A write word line sinker 24-0 is formed from NMOS transistors QN15, QN16, and QN17.

The PMOS transistor QP15 is connected between the power supply terminal and a write word line WWL0 at the lower stage. The output signal from the NAND gate circuit ND1 is supplied to the gate of the PMOS transistor QP15. The NMOS transistor QN15 is connected between the ground terminal and the write word line WWL0 at the lower stage.

When the output signal from the NAND gate circuit ND1 is "0", a write current flows to the write word line WWL0.

The PMOS transistor QP16 is connected between the power supply terminal and a write word line WWL1 at the intermediate stage. The output signal from the NAND gate circuit ND2 is supplied to the gate of the PMOS transistor QP16. The NMOS transistor QN16 is connected between the ground terminal and the write word line WWL1 at the intermediate stage.

When the output signal from the NAND gate circuit ND2 is "0", a write current flows to the write word line WWL1.

The PMOS transistor QP17 is connected between the power supply terminal and a write word line WWL2 at the upper stage. The output signal from the NAND gate circuit ND3 is supplied to the gate of the PMOS transistor QP17. The NMOS transistor QN17 is connected between the ground terminal and the write word line WWL2 at the upper stage.

When the output signal from the NAND gate circuit ND3 is "0", a write current flows to the write word line WWL2.

Low order two bits of a plurality of row address signal bits are input to each of a NOR gate circuit NR15 and exclusive OR gate circuit Ex-OR1. The low order two bits are used to select one of the three write word lines WWL0, WWL1, and WWL2 in the selected row.

The output signal from the NOR gate circuit NR15 is input to the NAND gate circuit ND1. The output signal from the exclusive OR gate circuit Ex-OR1 is input to the NAND gate circuit ND2.

In such a write word line driver/sinker, a write signal WRITE is "1" in the write operation. In addition, one of the plurality of rows is selected on the basis of high order bits of the plurality of row address signal bits except the low order two bits. In the selected row, all the superior row address signal bits are "1".

In the selected row, on the basis of low order two bits RA0 and RA1 of the plurality of row address signal bits, it is determined whether a write current is to be supplied to the write word lines WWL0, WWL1, and WWL2.

For example, in the write operation, when RA0="0" and RA1="0" in the selected row, all input signal bits to the NAND gate circuit ND1 are "1". As a result, the output signal from the NAND gate circuit ND1 changes to "0" to turn on the PMOS transistor QP15. Hence, a write current flows to the write word line WWL0.

When RA0="1" and RA1="1", all input signal bits to the NAND gate circuit ND3 are "1". As a result, the output signal from the NAND gate circuit ND3 changes to "0" to turn on the PMOS transistor QP17. Hence, a write current flows to the write word line WWL2.

When the signal bits RA0 and RA1 have different values (one is "0" and the other is "1"), all input signal bits to the NAND gate circuit ND2 are "1". As a result, the output signal from the NAND gate circuit ND2 changes to "0" to turn on the PMOS transistor QP16. Hence, a write current flows to the write word line WWL1.

(2) Write Bit Line Drivers/Sinkers

FIG. 69 shows a circuit example of the write bit line drivers/sinkers.

In this example, assume that TMR elements stacked at four stages and two write bit lines are present in one column. FIG. 69 shows write bit line drivers/sinkers corresponding to only one column.

The write bit line driver/sinker 29A is formed from PMOS transistors QP18 and QP19, NMOS transistors QN18 and QN19, NAND gate circuits ND4 and ND5, AND gate circuits AD1 and AD2, NOR gate circuit NR16, and inverters IV17 and IV18.

The write bit line driver/sinker 31 is formed from PMOS transistors QP20 and QP21, NMOS transistors QN20 and QN21, NAND gate circuits ND6 and ND7, AND gate circuits AD3 and AD4, NOR gate circuit NR17, and inverters IV19 and IV20.

The PMOS transistor QP18 is connected between the power supply terminal and a write bit line BL00 at the lower stage. The NMOS transistor QN18 is connected between the ground terminal and the write bit line BL00 at the lower stage. The PMOS transistor QP20 is connected between the power supply terminal and the write bit line BL00 at the lower stage. The NMOS transistor QN20 is connected between the ground terminal and the write bit line BL00 at the lower stage.

When the output signal from the NAND gate circuit ND4 is "0", and the output signal from the AND gate circuit AD3 is "1", a write current from the write bit line driver/sinker 29A toward the write bit line driver/sinker 31 flows to the write bit line BL00.

When the output signal from the NAND gate circuit ND6 is "0", and the output signal from the AND gate circuit AD1 is "1", a write current from the write bit line driver/sinker 31 toward the write bit line driver/sinker 29A flows to the write bit line BL00.

The PMOS transistor QP19 is connected between the power supply terminal and a write bit line BLOT at the upper stage. The NMOS transistor QN19 is connected between the ground terminal and the write bit line BLOT at the upper stage. The PMOS transistor QP21 is connected between the power supply terminal and the write bit line BL01 at the upper stage. The NMOS transistor QN21 is connected between the ground terminal and the write bit line BL01 at the upper stage.

When the output signal from the NAND gate circuit ND5 is "0", and the output signal from the AND gate circuit AD4 is "1", a write current from the write bit line driver/sinker 29A toward the write bit line driver/sinker 31 flows to the write bit line BL01.

When the output signal from the NAND gate circuit ND7 is "0", and the output signal from the AND gate circuit AD2 is "1", a write current from the write bit line driver/sinker 31 toward the write bit line driver/sinker 29A flows to the write bit line BL01.

In such write bit line drivers/sinkers, the write signal WRITE is "1" in the write operation. Additionally, in the selected column, all bits of a plurality of column address signal bits are "1"s.

In this example, one of the two write bit lines BL00 and BL01 in one column is selected using a bit RA1 of a plurality of row address signal bits. For example, when RAT="1", the write bit line BLOT is selected. When RA1="0", the write bit line BL00 is selected.

The direction of the write current to be supplied to the selected write bit line in the selected column is determined in accordance with the value of write data DATA.

For example, when the write bit line BL01 is selected (RA1="1"), and the write data DATA is "1", the output signal from the NAND circuit ND5 is "0", and the output signal from the AND gate circuit AD4 is "1". As a result, a write current from the write bit line driver/sinker 29A toward the write bit line driver/sinker 31 flows to the write bit line BL01.

When the write bit line BL01 is selected (RA1="1"), and the write data DATA is "0", the output signal from the NAND circuit ND7 is "0", and the output signal from the AND gate circuit AD2 is "1". As a result, a write current from the write bit line driver/sinker 31 toward the write bit line driver/sinker 29A flows to the write bit line BL01.

When the write bit line BL00 is selected (RA1="0"), and the write data DATA is "1", the output signal from the NAND circuit ND4 is "0", and the output signal from the AND gate circuit AD3 is "1". As a result, a write current from the write bit line driver/sinker 29A toward the write bit line driver/sinker 31 flows to the write bit line BL00.

When the write bit line BL00 is selected (RA1="0"), and the write data DATA is "0", the output signal from the NAND circuit ND6 is "0", and the output signal from the AND gate circuit AD1 is "1". As a result, a write current from the write bit line driver/sinker 31 toward the write bit line driver/sinker 29A flows to the write bit line BL00.

When the device structure as shown in FIGS. 2 and 3 is employed, e.g., the write bit line BLj0 is shared by the two TMR elements MTJ1 and MTJ2. When viewed from the TMR element MTJ1, the write bit line BLJ0 is present on the upper side. When viewed from the TMR element MTJ2, the write bit line BLj0 is present on the lower side.

Hence, for example, when the write current flows from the write bit line driver/sinker 29A toward the write bit line driver/sinker 31 in FIG. 1, the magnetic field received by the TMR element MTJ1 and that received by the TMR element MTJ2 have opposite directions due to the write current.

When one write bit line is shared by two TMR elements, magnetic fields that act on the two TMR elements have opposite directions and also opposite magnetizing directions even though the direction of the write current supplied to the write bit line is constant.

This also applies to the two TMR elements MTJ3 and MTJ4 in the device structure shown in, e.g., FIGS. 2 and 3.

If the magnetizing directions of the pinning layers can be individually set for the TMR elements MTJ1, MTJ2, MTJ3, and MTJ4, for example, the magnetizing direction of the pinning layer of the TMR element MTJ1 which is present on the lower side of the write bit line BLj0 is made opposite to that of the pinning layer of the TMR element MTJ2 which is present on the upper side of the write bit line BLj0. In this case, the logic described above for the read operation principle and read circuit can be directly applied.

That is, a state wherein the magnetizing direction of the pinning layer is the same as that of the storing layer can be defined as "1". A state wherein the magnetizing direction of the pinning layer is different from that of the storing layer can be defined as "0".

Assume that all the magnetizing directions of the pinning layers of the TMR elements MTJ1, MTJ2, MTJ3, and MTJ4 are the same. In this case, to directly apply the logic described above for the read operation principle and read circuits the write operation or read operation must be further implemented.

For example, in the write operation, the write in the TMR element on the lower side of the write bit line and the write in the TMR element on the upper side of the write bit line are separately executed with a time lag. In this case, a state wherein the magnetizing direction of the pinning layer is the same as that of the storing layer can be defined as "1". In addition, a state wherein the magnetizing direction of the pinning layer is different from that of the storing layer can be defined as "0".

If the condition (the relationship between the magnetizing direction of the pinning layer and that of the storing layer) for "1"/"0" of the TMR element on the lower side of the write bit line is opposite to that for "1"/"0" of the TMR element on the upper side of the write bit line, the logic used to determine data in the read operation must be changed.

(3) Read Word Line Driver

Figure 70:
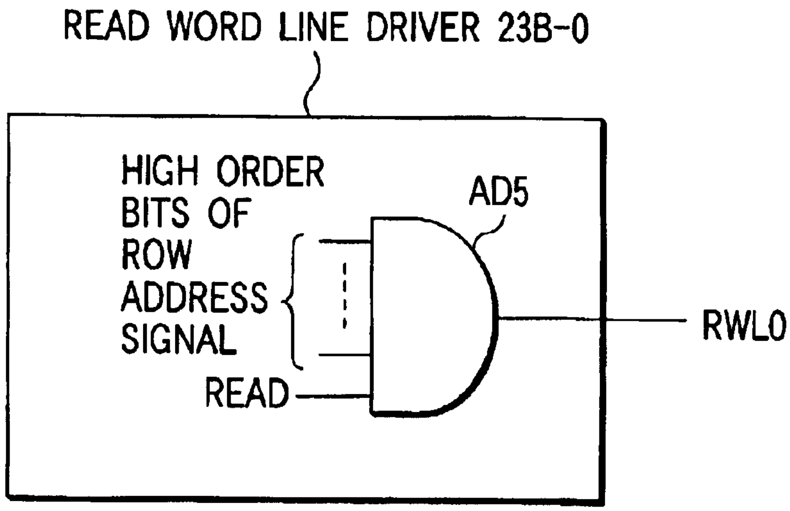
FIG. 70 is a view showing a circuit example of a read word line driver.

FIG. 70 shows a circuit example of the read word line driver.

A read word line driver 23B-0 is formed from an AND gate circuit ADS. A read signal READ and high order bits of a row address signal are input to the AND gate circuit ADS.

The read signal is "1" in the read operation. The high order bits of a row address signal are the same as that in the write word line driver/sinker (FIG. 68). That is, the potential of the read word line RWL0 is determined on the basis of high order bits of a plurality of row address signal bits, which are used to select a column.

In the selected row, all the high order bits of a row address signal are "1"s. Hence, the potential of the read word line RWL0 is "1".

(4) Column Decoder

Figure 71:
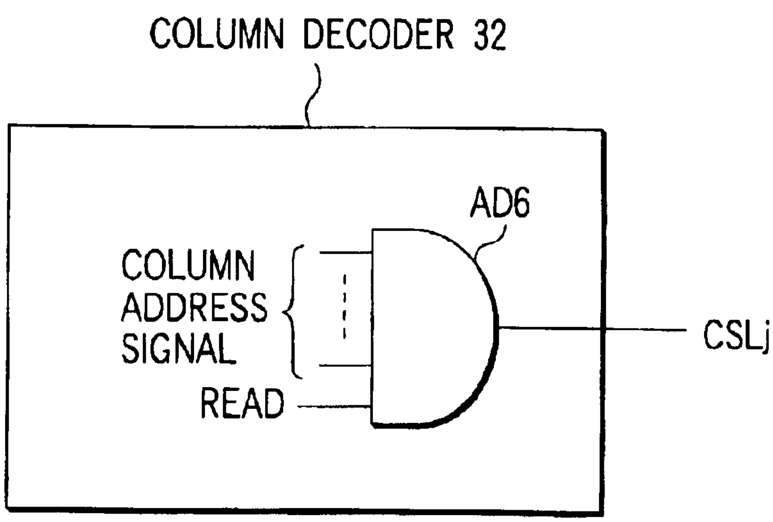
FIG. 71 is a view showing a circuit example of a column decoder.

FIG. 71 shows a circuit example of the column decoder.

The column decoder 32 is formed from an AND gate circuit AD6. The read signal READ and column address signal are input to the AND gate circuit AD6. The read signal is "1" in the read operation. In the selected column, all bits of the column address signal are "1"s. Hence, the potential of the column select line signal CSLj is "1".

(5) In Case of Structural Examples 4 and 5

① Write Word Line Driver/Sinker

FIG. 72 shows another circuit example of the write word line driver/sinker.

FIG. 72 shows a write word line driver/sinker corresponding to only one row in correspondence with FIG. 68.

As is apparent from a comparison between FIG. 68 and FIG. 72, when Structural Example 4 or 5 is employed, the write word line driver/sinker is simplified.

More specifically, in FIG. 68, three drivers/sinkers are required to drive the three write word lines WWL0, WWL1, and WWL2. In FIG. 72, however, one driver/sinker suffices to drive one write word line WWL0.

The write word line driver 23A-0 is formed from the PMOS transistor QP15 and NAND gate circuit ND1. The write word line sinker 24-0 is formed from the NMOS transistor QN15.

The PMOS transistor QP15 is connected between the power supply terminal and the write word line WWL0. The output signal from the NAND gate circuit ND1 is supplied to the gate of the PMOS transistor QP15. The NMOS transistor QN15 is connected between the ground terminal and the write word line WWL0.

When the output signal from the NAND gate circuit ND1 is "0", a write current flows to the write word line WWL0.

In such a write word line driver/sinker, the write signal WRITE is "1" in the write operation. In addition, one of the plurality of rows is selected on the basis of a plurality of row address signal bits. In the selected row, all the superior row address signal bits are "1"s. In the selected row, a write current flows to the write word line.

② Write Bit Line Driver/Sinker

Figure 73:
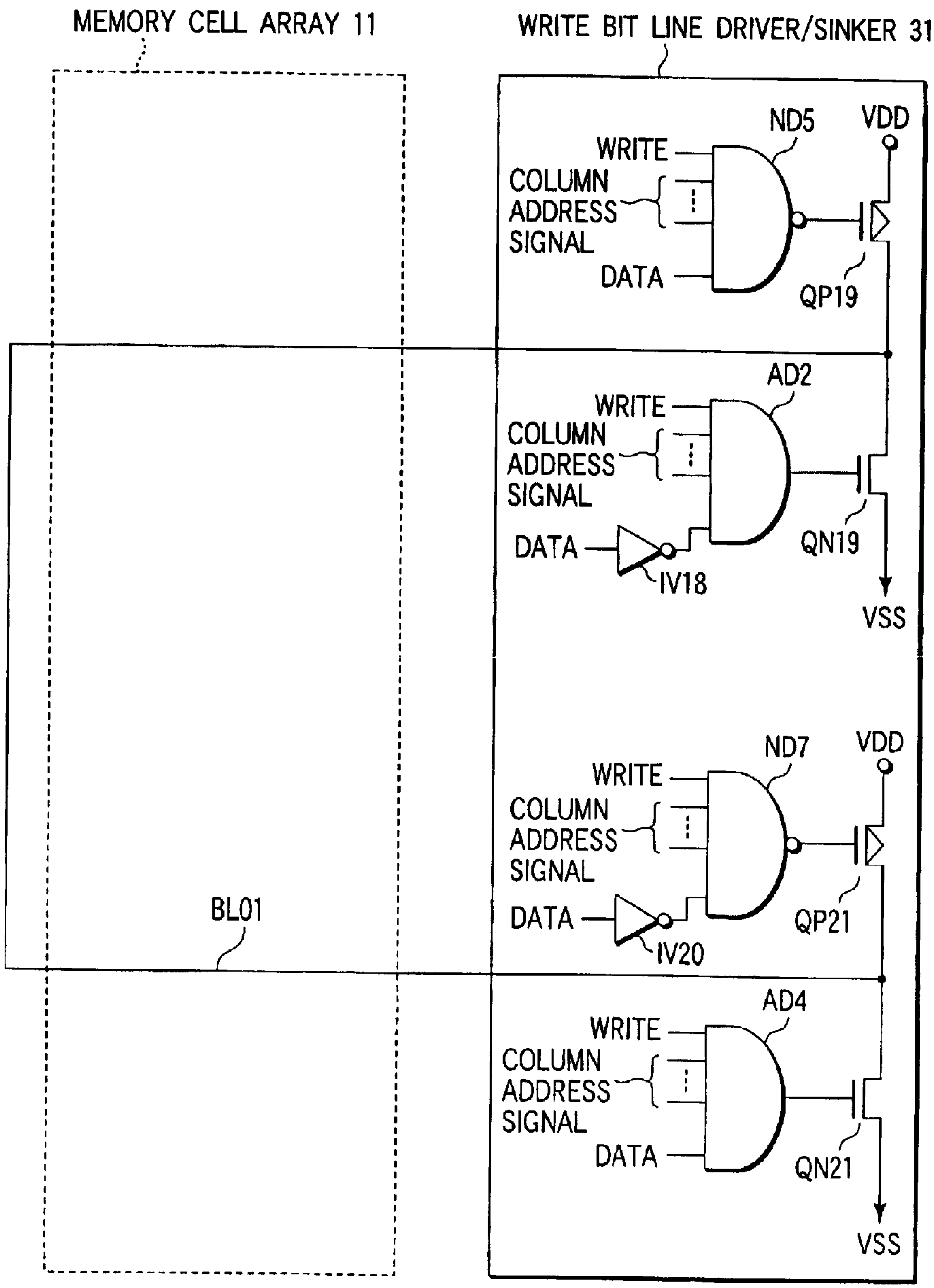
FIG. 73 is a view showing another circuit example of the write bit line driver/sinker.

FIG. 73 shows another circuit example of the write bit line driver/sinker.

FIG. 73 shows a write bit line driver/sinker corresponding to only one column in correspondence with FIG. 69.

As is apparent from a comparison between FIG. 69 and FIG. 73, when Structural Example 4 or 5 is employed, the write bit line driver/sinker is simplified.

More specifically, in FIG. 69, two drivers/sinkers are required to drive the two write bit lines BL00 and BL01. In FIG. 73, however, one driver/sinker suffices to drive one write bit line BLO1.

The write bit line driver/sinker 31 is formed from the PMOS transistors QP19 and QP21, NMOS transistors QN19 and QN21, NAND gate circuits ND5 and ND7, AND gate circuits AD2 and AD4, and inverters IV18 and IV20.

The PMOS transistor QP19 is connected between the power supply terminal and the write bit line BL01. The NMOS transistor QN19 is connected between the ground terminal and the write bit line BL01. The PMOS transistor QP21 is connected between the power supply terminal and the write bit line BL01. The NMOS transistor QN21 is connected between the ground terminal and the write bit line BL01.

When the output signal from the NAND gate circuit ND5 is "0", and the output signal from the AND gate circuit AD4 is "1", a write current from the PMOS transistor QP19 toward the NMOS transistor QN21 flows to the write bit line BL01.

When the output signal from the NAND gate circuit ND7 is "0", and the output signal from the AND gate circuit AD2 is "1", a write current from the PMOS transistor QP21 toward the NMOS transistor QN19 flows to the write bit line BL01.

In such a write bit line driver/sinker, the write signal WRITE is "1" in the write operation. Additionally, in the selected column, all bits of a plurality of column address signal bits are "1"s.

The direction of the write current to be supplied to the selected write bit line in the selected column is determined in accordance with the value of write data DATA.

For example, when the write data DATA is "1", the output signal from the NAND circuit ND5 is "0", and the output signal from the AND gate circuit AD4 is "1". As a result, a write current from the PMOS transistor QP19 toward the NMOS transistor QN21 flows to the write bit line BLO1.

When the write data DATA is "0", the output signal from the NAND circuit ND7 is "0", and the output signal from the AND gate circuit AD2 is "1". As a result, a write current from the PMOS transistor QP21 toward the NMOS transistor QN19 flows to the write bit line BL01.

6. Positional Relationship Between Pinning Layer and Storing Layer of Each TMR Element As in Structural Examples 1 to 6, for example, when TMR elements are arranged on the upper and lower sides of a write line (write word line or write bit line), and data is to be written in the TMR element on the upper or lower side of the write line using a magnetic field generated by a write current that flows to the write line, the positional relationship between the pinning layer (fixed layer) and the storing layer (free layer) or the magnetizing direction of the pinning layer in each TMR element must be examined.

This is because the write operation principle or the write circuit arrangement changes depending on the direction of the current flowing to the write line.

Figure 74:
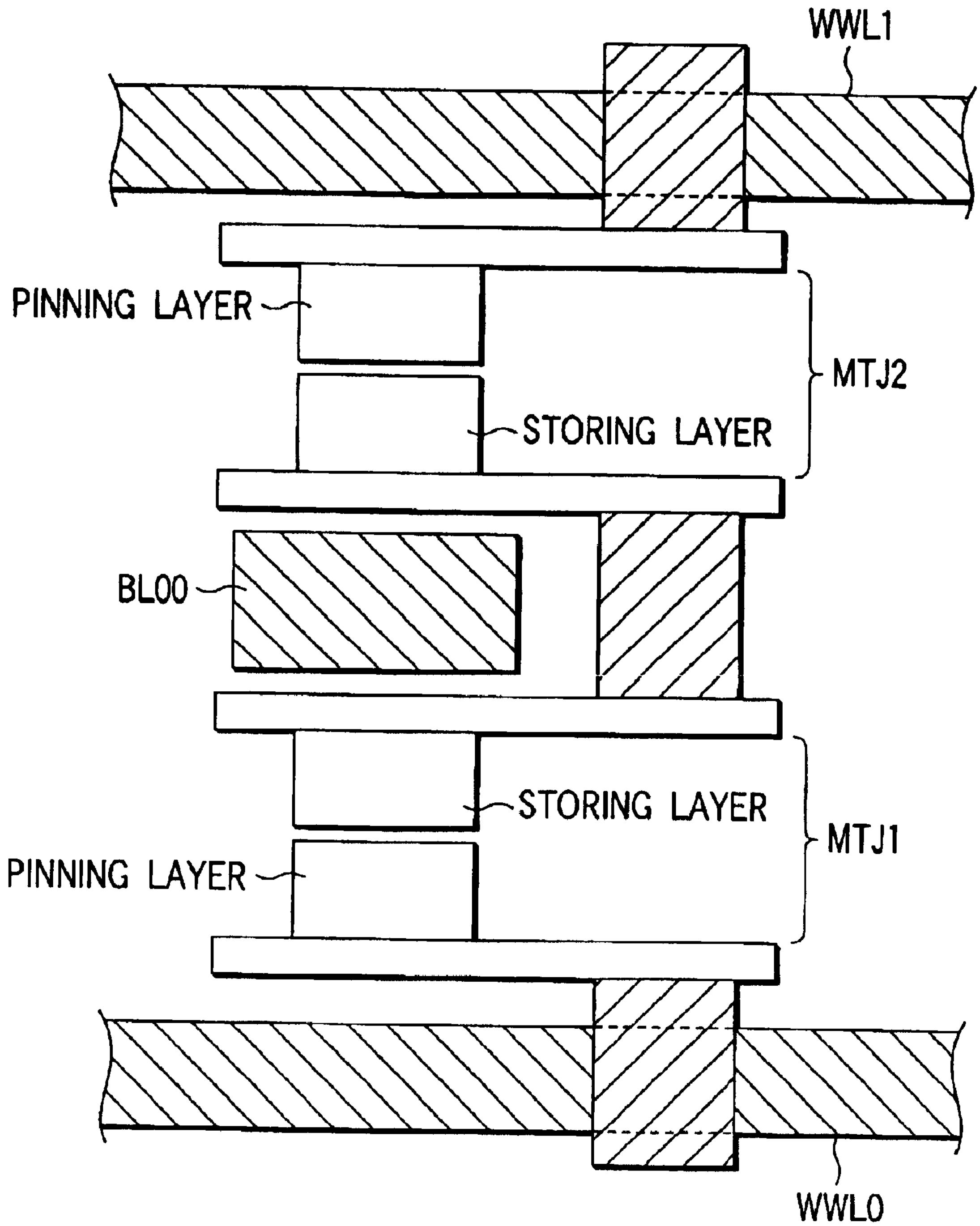
FIG. 74 is a view showing TMR elements arranged symmetrically with respect to a write line.

(1) Positional Relationship Between Pinning Layer and Storing Layer of Each TMR Element As shown in FIG. 74, the positional relationship (relative relationship) between the pinning layer and the storing layer of each TMR element (MTJ element) is preferably symmetrical with respect to a write line to be used.

For example, when TMR elements are arranged on the upper and lower sides of a write line (write word line or write bit line), and data is to be written in the TMR element on the upper or lower side of the write line using a magnetic field generated by a write current that flows to the write line, the positional relationship between the pinning layer and the storing layer of each TMR element is set to be symmetrical with respect to the write line.

More specifically, assume that the TMR element on the lower side of the write line has a storing layer on a side close to the write interconnection and a pinning layer on a side far from the write interconnection. In this case, the TMR element on the upper side of the write line also has a storing layer on a side close to the write interconnection and a pinning layer on a side far from the write interconnection.

Similarly, assume that the TMR element on the lower side of the write line has a pinning layer on a side close to the write interconnection and a storing layer on a side far from the write interconnection. In this case, the TMR element on the upper side of the write line also has a pinning layer on a side close to the write interconnection and a storing layer on a side far from the write interconnection.

Note that this positional relationship is ensured for all TMR elements in the memory cell array. In addition, for all write lines in the memory cell array, the TMR element arranged on the upper side and that arranged on the lower side are symmetrically arranged.

With this positional relationship, the distance from a write line to a storing layer is substantially the same for all TMR elements. That is, since the influence of a magnetic field generated by a write current flowing to a write line due to the write current flowing to the write line is the same for all TMR elements. Hence, all TMR elements can have the same write characteristic.

In this case, the direction of the TMR element arranged on the lower (or upper) side of the write line is opposite to the direction of the TMR element arranged on the upper (or lower) side of the write line.

However, that the directions of all the TMR elements in the memory cell array are not the same, and, for example, the directions of the TMR elements change for each stage is no disadvantage for the present invention (directions here include only two directions: upward and downward, and the semiconductor substrate side is defined as the lower side).

This is because in forming TMR elements, the directions of the TMR elements can easily be changed only by changing the order of forming the layers of TMR elements.

(2) Magnetizing Direction of Pinning Layer of TMR Element

When TMR elements are arranged on the upper and lower sides of a write line (write word line or write bit line), and data is to be written in the TMR element on the upper or lower side of the write line using a magnetic field generated by a write current that flows to the write line, the write operation principle and read operation principle must be changed depending on the magnetizing direction of the pinning layer of the TMR element.

This is because the direction of a magnetic field applied to a TMR element arranged on the upper side of a write line is opposite to that of a magnetic field applied to a TMR element arranged on the lower side of the write line even though the direction of a current that flows to the write line is constant.

① When Magnetizing Directions of Pinning Layers are Individually Set

When the magnetizing directions of pinning layers can be individually set, the magnetizing direction of the pinning layer of each TMR element that is present on the lower side of a write line (write word line or write bit line) is made opposite to that of the pinning layer of each TMR element that is present on the upper side of the write line. With this arrangement, the normal read operation principle and write operation principle can be applied.

That is, a state wherein the magnetizing direction of the pinning layer is the same as that of the storing layer can be defined as "1". A state wherein the magnetizing direction of the pinning layer is different from that of the storing layer can be defined as "0".

A detailed example will be described below.

As a presupposition, the axes of easy magnetization of the TMR elements MTJ1 and MTJ2 are directed in the X-direction (a direction in which the write word lines extend), as shown in FIGS. 75 and 76. In addition, the magnetizing direction of the pinning layer of the TMR element MTJ1 arranged on the lower side of the write bit line BL00 is leftward. The magnetizing direction of the pinning layer of the TMR element MTJ2 arranged on the upper side of the write bit line BL00 is rightward.

Furthermore, write data is determined by the direction of a write current flowing to the write bit line BL00. Only a write current directed in one direction flows to the write word lines WWL0 and WWL1.

When Data is to be Written in TMR Element on Lower Side of Write Bit Line

["1"-Write]

As shown in FIG. 75, a write current directed in one direction is supplied to the write word line WWL0. A write current is supplied to the write bit line BL00 in a direction in which the current is absorbed in the direction perpendicular to the surface of the drawing sheet. A magnetic field generated by the write current flowing to the write bit line BL00 forms a circle clockwise about the write bit line BL00.

In this case, a leftward magnetic field is applied to the TMR element MTJ1 on the lower side of the write bit line BL00. For this reason, the magnetizing direction of the TMR element MTJ1 on the lower side of the write bit line BL00 is leftward.

Hence, the magnetizing state of the TMR element MTJ1 on the lower side of the write bit line BL00 is parallel, and data "1" is written.

["0"-Write]

A write current directed in one direction is supplied to the write word line WWL0. A write current is supplied to the write bit line BL00 in a direction in which the current comes out from the direction perpendicular to the surface of the drawing sheet. A magnetic field generated by the write current flowing to the write bit line BL00 forms a circle counterclockwise about the write bit line BL00.

In this case, a rightward magnetic field is applied to the TMR element MTJ1 on the lower side of the write bit line BL00. For this reason, the magnetizing direction of the TMR element MTJ1 on the lower side of the write bit line BL00 is rightward.

Hence, the magnetizing state of the TMR element MTJ1 on the lower side of the write bit line BL00 is antiparallel, and data "0" is written.

When Data is to be Written in TMR Element on Upper Side of Write Bit Line

If the same data can be written in the TMR element MTJ2 on the upper side of the write bit line BL00 under the same write condition as for the TMR element MTJ1, the write and read operations can be executed for the two TMR elements MTJ1 and MTJ2 using the same write circuit (write bit line driver/sinker) and same read circuit.

["1"-Write]

As shown in FIG. 76, a write current directed in one direction is supplied to the write word line WWL1. A write current is supplied to the write bit line BL00 in a direction in which the current is absorbed in the direction perpendicular to the surface of the drawing sheet.

This write condition is the same as the "1"-write condition for the TMR element MTJ1 on the lower side of the write bit line BL00. At this time, a magnetic field generated by the write current flowing to the write bit line BL00 forms a circle clockwise about the write bit line BL00.

In this case, a rightward magnetic field is applied to the TMR element MTJ2 on the upper side of the write bit line BL00. For this reason, the magnetizing direction of the TMR element MTJ2 on the upper side of the write bit line BL00 is rightward.

Hence, the magnetizing state of the TMR element MTJ2 on the upper side of the write bit line BL00 is parallel, and data "1" is written.

As described above, when the magnetizing directions of the pinning layers of the TMR elements MTJ1 and MTJ2 are opposite to each other, the same data can be written in the TMR elements MTJ1 and MTJ2 under the same write condition.

["0"-Write]

A write current directed in one direction is supplied to the write word line WWL1. A write current is supplied to the write bit line BL00 in a direction in which the current comes out from the direction perpendicular to the surface of the drawing sheet.

This write condition is the same as the "0"-write condition for the TMR element MTJ1 on the lower side of the write bit line BL00. At this time, a magnetic field generated by the write current flowing to the write bit line BL00 forms a circle counterclockwise about the write bit line BL00.

In this case, a leftward magnetic field is applied to the TMR element MTJ2 on the upper side of the write bit line BL00. For this reason, the magnetizing direction of the TMR element MTJ2 on the upper side of the write bit line BL00 is leftward.

Hence, the magnetizing state of the TMR element MTJ2 on the upper side of the write bit line BL00 is antiparallel, and data "0" is written.

As described above, when the magnetizing directions of the pinning layers of the TMR elements MTJ1 and MTJ2 are opposite to each other, the same data can be written in the TMR elements MTJ1 and MTJ2 under the same write condition.

② When Pinning Layers of All TMR Elements Have Same Magnetizing Direction

When the pinning layers of all the TMR elements have the same magnetizing direction, for example, after the wafer process is ended, the magnetizing direction of the pinning layers of all the TMR elements can be instantaneously determined by simultaneously applying magnetic fields in the same direction to the pinning layers of all the TMR elements.

Especially, when the temperature of the wafer is increased in applying the magnetic field, the magnetizing directions of the pinning layers of all the TMR elements can easily be determined.

In this case, however, identical data cannot be written in the TMR elements arranged on the lower side of a write line and TMR elements arranged on the upper side of the write line under the same condition.

The following two countermeasures can be used: A. the arrangement of the read circuit is changed without changing the arrangement of the write circuit (write bit line driver/sinker), i.e., the write condition, and B. the arrangement of the write circuit (write bit line driver/sinker), i.e., the write condition is changed without changing the arrangement of the read circuit.

A detailed example will be described below.

As a presupposition, the axes of easy magnetization of the TMR elements MTJ1 and MTJ2 are directed in the X-direction (a direction in which the write word lines extend), as shown in FIGS. 77 and 79. In addition, both the magnetizing direction of the pinning layer of the TMR element MTJ1 arranged on the lower side of the write bit line BL00 and the magnetizing direction of the pinning layer of the TMR element MTJ2 arranged on the upper side of the write bit line BL00 are leftward.

Furthermore, write data is determined by the direction of a write current flowing to the write bit line BL00. Only a write current directed in one direction flows to the write word lines WWL0 and WWL1.

A. When Write Condition Is Not Changed

When Data is to be Written in TMR Element on Lower Side of Write Bit Line

["1"-Write]

As shown in FIG. 77, a write current directed in one direction is supplied to the write word line WWL0. A write current is supplied to the write bit line BL00 in a direction in which the current is absorbed in the direction perpendicular to the surface of the drawing sheet. A magnetic field generated by the write current flowing to the write bit line BL00 forms a circle clockwise about the write bit line BL00.

In this case, a leftward magnetic field is applied to the TMR element MTJ1 on the lower side of the write bit line BL00. For this reason, the magnetizing direction of the TMR element MTJ1 on the lower side of the write bit line BL00 is leftward.

Hence, the magnetizing state of the TMR element MTJ1 on the lower side of the write bit line BL00 is parallel, and data "1" is written.

["0"-Write]

A write current directed in one direction is supplied to the write word line WWL0. A write current is supplied to the write bit line BL00 in a direction in which the current comes out from the direction perpendicular to the surface of the drawing sheet. A magnetic field generated by the write current flowing to the write bit line BL00 forms a circle counterclockwise about the write bit line BL00.

In this case, a rightward magnetic field is applied to the TMR element MTJ1 on the lower side of the write bit line BL00. For this reason, the magnetizing direction of the TMR element MTJ1 on the lower side of the write bit line BL00 is rightward.

Hence, the magnetizing state of the TMR element MTJ1 on the lower side of the write bit line BL00 is antiparallel, and data "0" is written.

When Data is to be Written in TMR Element on Upper Side of Write Bit Line

For the TMR element MTJ2 on the upper side of the write bit line BL00, the write operation is executed using the same write condition, i.e., the same write circuit (write bit line driver/sinker) as that for the TMR element MTJ1.

["1"-Write]

Figure 78:
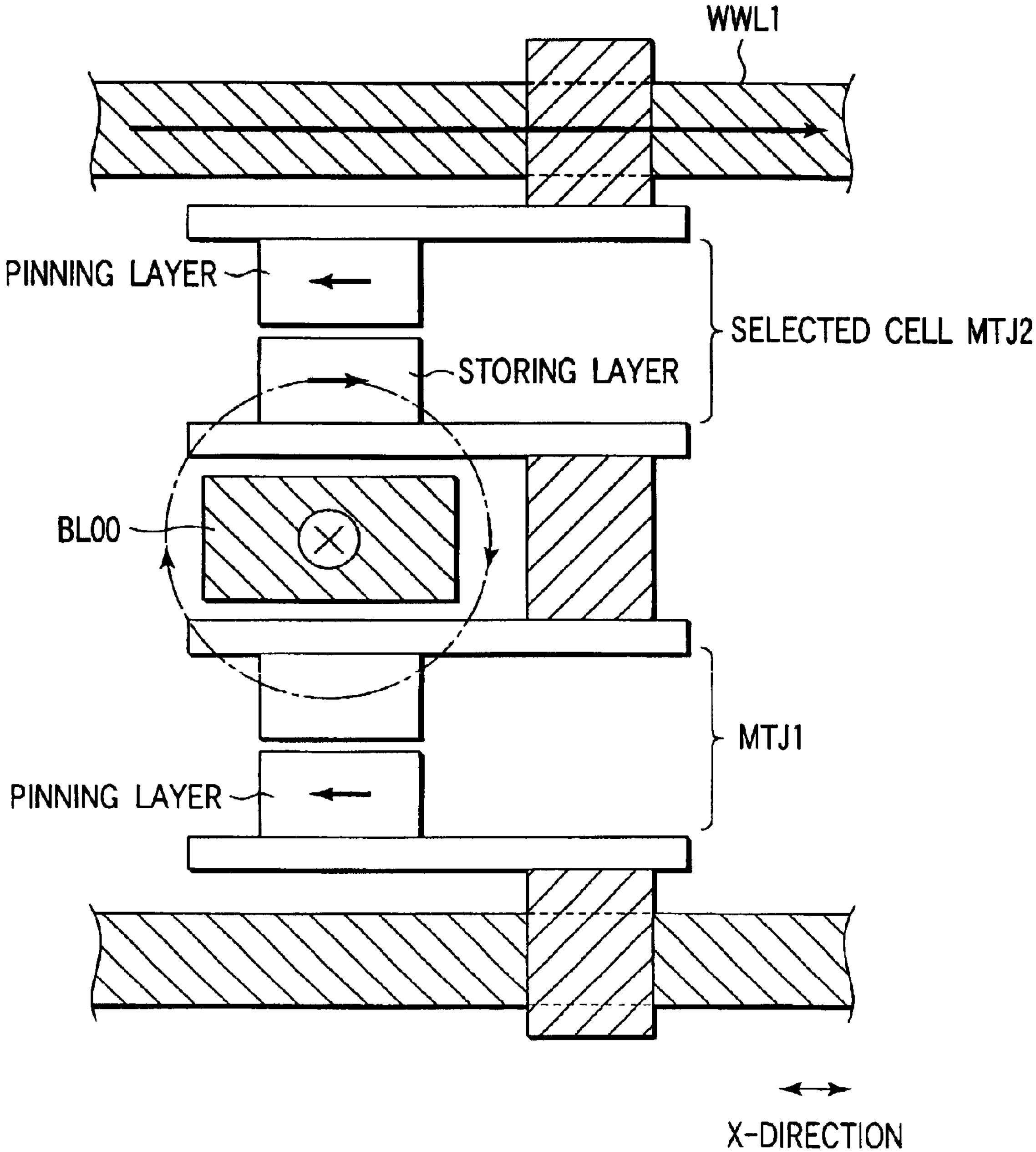
FIG. 78 is a view showing TMR elements arranged symmetrically with respect to a write line.

As shown in FIG. 78, a write current directed in one direction is supplied to the write word line WWL1. A write current is supplied to the write bit line BL00 in a direction in which the current is absorbed in the direction perpendicular to the surface of the drawing sheet.

This write condition is the same as the "1"-write condition for the TMR element MTJ1 on the lower side of the write bit line BL00. At this time, a magnetic field generated by the write current flowing to the write bit line BL00 forms a circle clockwise about the write bit line BL00.

In this case, a rightward magnetic field is applied to the TMR element MTJ2 on the upper side of the write bit line BL00. For this reason, the magnetizing direction of the TMR element MTJ2 on the upper side of the write bit line BL00 is rightward.

Hence, the magnetizing state of the TMR element MTJ2 on the upper side of the write bit line BL00 is antiparallel, i.e., data "0" is stored.

The write data for the TMR element MTJ2 is "1". Hence, in the read mode, the "0"-data stored in the TMR element MTJ2 must be read out not as "0" but as "1".

To do this, the arrangement of the read circuit is slightly changed.

Basically, since write data in an inverted state is stored in the TMR element that is present on the upper side of the write bit line, one inverter is added to the output section (final stage) of the read circuit for reading the data of the TMR element that is present on the upper side of the write bit line.

For example, in Structural Examples 1 to 6, the TMR element MTJ2 at the second stage and TMR element MTJ4 at the fourth stage are arranged on the upper side of the write bit line.

For example, when the so-called batch read operation principle is applied, one inverter is added to each of the output sections of the logic circuits shown in FIGS. 64 and 66.

When the pinning layers of the TMR elements MTJ1 and MTJ2 have the same magnetizing direction, data opposite to write data is stored in one of the TMR element arranged on the upper side of the write line and that arranged on the lower side of the write line.

Hence, when one inverter is added to the output section (final stage) of the read circuit for reading the data of the TMR element that stores opposite data, the write operation can be executed without changing the arrangement of the write circuit (write bit line driver/sinker).

["0"-Write]

A write current directed in one direction is supplied to the write word line WWL1. A write current is supplied to the write bit line BL00 in a direction in which the current comes out from the direction perpendicular to the surface of the drawing sheet.

This write condition is the same as the "0"-write condition for the TMR element MTJ1 on the lower side of the write bit line BL00. At this time, a magnetic field generated by the write current flowing to the write bit line BL00 forms a circle counterclockwise about the write bit line BL00.

In this case, a leftward magnetic field is applied to the TMR element MTJ2 on the upper side of the write bit line BL00. For this reason, the magnetizing direction of the TMR element MTJ2 on the upper side of the write bit line BL00 is leftward.

Hence, the magnetizing state of the TMR element MTJ2 on the upper side of the write bit line BL00 is parallel, i.e., data "1" is stored.

The write data for the TMR element MTJ2 is "0". Hence, in the read mode, the "1"-data stored in the TMR element MTJ2 must be read out not as "1" but as "0".

When one inverter is added to the output section (final stage) of the read circuit for reading the data of the TMR element that is present on the upper side of the write bit line, as described above, the data can be read without any problem.

B. When Write Condition is Changed

When the write condition is changed, both the states of the TMR elements MTJ1 and MTJ2 can be set to parallel when the write data is "1". When the write data is "0", both the states of the TMR elements MTJ1 and MTJ2 can be set to antiparallel.

That is, the read circuit need not be changed.

When Data is to be Written in TMR Element on Lower Side of Write Bit Line

["1"-Write]

As shown in FIG. 77, a write current directed in one direction is supplied to the write word line WWL0. A write current is supplied to the write bit line BL00 in a direction in which the current is absorbed in the direction perpendicular to the surface of the drawing sheet page surface. A magnetic field generated by the write current flowing to the write bit line BL00 forms a circle clockwise about the write bit line BL00.

In this case, a leftward magnetic field is applied to the TMR element MTJ1 on the lower side of the write bit line BL00. For this reason, the magnetizing direction of the TMR element MTJ1 on the lower side of the write bit line BL00 is leftward.

Hence, the magnetizing state of the TMR element MTJ1 on the lower side of the write bit line BL00 is parallel, and data "1" is written.

["0"-Write]

A write current directed in one direction is supplied to the write word line WWL0. A write current is supplied to the write bit line BL00 in a direction in which the current comes out from the direction perpendicular to the surface of the drawing sheet. A magnetic field generated by the write current flowing to the write bit line BL00 forms a circle counterclockwise about the write bit line BL00.

In this case, a rightward magnetic field is applied to the TMR element MTJ1 on the lower side of the write bit line BL00. For this reason, the magnetizing direction of the TMR element MTJ1 on the lower side of the write bit line BL00 is rightward.

Hence, the magnetizing state of the TMR element MTJ1 on the lower side of the write bit line BL00 is antiparallel, and data "0" is written.

When Data is to be Written in TMR Element on Upper Side of Write Bit Line

["1"-Write]

As shown in FIG. 79, a write current directed in one direction is supplied to the write word line WWL1. A write current is supplied to the write bit line BL00 in a direction in which the current comes out from the direction perpendicular to the surface of the drawing sheet.

This write condition is different from the "1"-write condition for the TMR element MTJ1 on the lower side of the write bit line BL00. That is, if the write data is the same, the direction of the write current to be supplied to the write line changes depending on whether the TMR element is present on the upper or lower side of the write line.

A write circuit (write bit line driver/sinker) which realizes such operation will be described later.

At this time, a magnetic field generated by the write current flowing to the write bit line BL00 forms a circle counterclockwise about the write bit line BL00.

In this case, a leftward magnetic field is applied to the TMR element MTJ2 on the upper side of the write bit line BL00. For this reason, the magnetizing direction of the TMR element MTJ2 on the upper side of the write bit line BL00 is leftward.

Hence, the magnetizing state of the TMR element MTJ2 on the upper side of the write bit line BL00 is parallel, i.e., data "1" is stored.

["0"-Write]

A write current directed in one direction is supplied to the write word line WWL1. A write current is supplied to the write bit line BL00 in a direction in which the current is absorbed in the direction perpendicular to the surface of the drawing sheet.

This write condition is different from the "0"-write condition for the TMR element MTJ1 on the lower side of the write bit line BL00. That is, if the write data is the same, the direction of the write current to be supplied to the write line changes depending on whether the TMR element is present on the upper or lower side of the write line.

At this time, a magnetic field generated by the write current flowing to the write bit line BL00 forms a circle clockwise about the write bit line BL00.

In this case, a rightward magnetic field is applied to the TMR element MTJ2 on the upper side of the write bit line BL00. For this reason, the magnetizing direction of the TMR element MTJ2 on the upper side of the write bit line BL00 is rightward.

Hence, the magnetizing state of the TMR element MTJ2 on the upper side of the write bit line BL00 is antiparallel, i.e., data "0" is stored.

Figure 80:
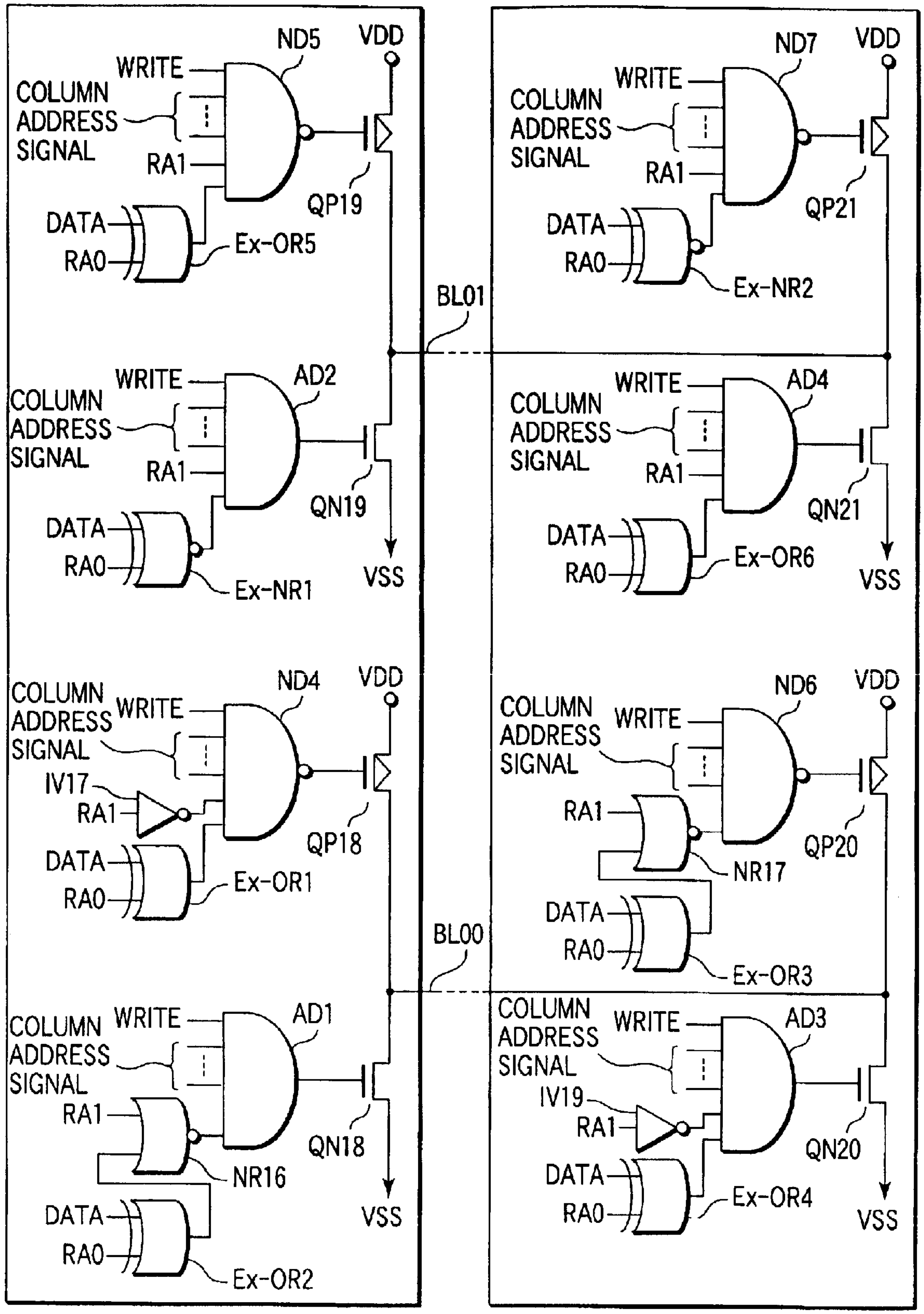
FIG. 80 is a view showing still another circuit example of the write bit line driver/sinker.

③ Arrangement of Write Circuit (Write Bit Line Driver/Sinker) When Pinning Layers of All TMR Elements Have Same Magnetizing Direction FIG. 80 shows a circuit example of the write bit line drivers/sinkers.

The circuit shown in FIG. 80 is a modification to the circuit shown in FIG. 69. That is, as a characteristic feature of the circuit shown in FIG. 80, a new function, i.e., a function of changing the direction of write current on the basis of the position information of a TMR element is imparted to the circuit shown in FIG. 69.

This write bit line drivers/sinkers correspond to the cell array structures of the magnetic random access memories of Structural Examples 1 to 6.

The four TMR elements MTJ1, MTJ2, MTJ3, and MTJ4 of a read block are stacked at four stages. The write bit line BL00 is arranged between the TMR element MTJ1 and the TMR element MTJ2. The write bit line BL01 is arranged between the TMR element MTJ3 and the TMR element MTJ4.

The TMR elements MTJ1 and MTJ3 are arranged on the lower side of the write bit lines BL00 and BLO1. The TMR elements MTJ2 and MTJ4 are arranged on the upper side of the write bit lines BL00 and BLO1.

FIG. 80 shows write bit line drivers/sinkers corresponding to only one column.

The write bit line driver/sinker 29A is formed from the PMOS transistors QP18 and QP19, NMOS transistors QN18 and QN19, NAND gate circuits ND4 and ND5, AND gate circuits AD1 and AD2, NOR gate circuit NR16, inverter IV17, exclusive OR circuits Ex-OR1, Ex-OR2, and Ex-OR5, and exclusive NOR circuit Ex-NR1.

The write bit line driver/sinker 31 is formed from the PMOS transistors QP20 and QP21, NMOS transistors QN20 and QN21, NAND gate circuits ND6 and ND7, AND gate circuits AD3 and AD4, NOR gate circuit NR17, inverter IV19, exclusive OR circuits Ex-OR3, Ex-OR4, and Ex-OR6, and exclusive NOR circuit Ex-NR2.

The PMOS transistor QP18 is connected between the power supply terminal and the write bit line BL00 at the lower stage. The NMOS transistor QN18 is connected between the ground terminal and the write bit line BL00 at the lower stage. The PMOS transistor QP20 is connected between the power supply terminal and the write bit line BL00 at the lower stage. The NMOS transistor QN20 is connected between the ground terminal and the write bit line BL00 at the lower stage.

When the output signal from the NAND gate circuit ND4 is “0”, and the output signal from the AND gate circuit AD3 is “1”, a write current from the write bit line driver/sinker 29A toward the write bit line driver/sinker 31 flows to the write bit line BL00.

When the output signal from the NAND gate circuit ND6 is “0”, and the output signal from the AND gate circuit AD1 is “1”, a write current from the write bit line driver/sinker 31 toward the write bit line driver/sinker 29A flows to the write bit line BL00.

The PMOS transistor QP19 is connected between the power supply terminal and the write bit line BLO1 at the upper stage. The NMOS transistor QN19 is connected between the ground terminal and the write bit line BL01 at the upper stage. The PMOS transistor QP21 is connected between the power supply terminal and the write bit line BLO1 at the upper stage. The NMOS transistor QN21 is connected between the ground terminal and the write bit line BL01 at the upper stage.

When the output signal from the NAND gate circuit ND5 is “0”, and the output signal from the AND gate circuit AD4 is “1”, a write current from the write bit line driver/sinker 29A toward the write bit line driver/sinker 31 flows to the write bit line BLO1.

When the output signal from the NAND gate circuit ND7 is “0”, and the output signal from the AND gate circuit AD2 is “1”, a write current from the write bit line driver/sinker 31 toward the write bit line driver/sinker 29A flows to the write bit line BL01.

In such write bit line drivers/sinkers, the write signal WRITE is “1” in the write operation. Additionally, in the selected column, all bits of a plurality of column address signal bits are “1”.

In this example, one of the two write bit lines BL00 and BL01 in one column is selected using a bit RA1 of a plurality of row address signal bits. For example, when RA1=“0”, the write bit line BL00 is selected. When RA1=“1”, the write bit line BL01 is selected.

The direction of the write current to be supplied to the selected write bit line in the selected column is determined in accordance with the values of write data DATA and signal bit RA0.

The value of signal bit RA0 is a signal which determines whether the TMR elements MTJ1 and MTJ3 on the lower side of the write bit lines BL00 and BL01 or the TMR elements MTJ2 and MTJ4 on the upper side of the write bit lines BL00 and BLO1 are to be selected.

When BL00 is Selected

For example, when the write bit line BL00 is selected (RA1=“0”), and RA0=0, the TMR element MTJ1 on the lower side of the write bit line BL00 is selected.

At this time, when the write data DATA is “1”, all the output signals from the exclusive OR circuits Ex-OR1 to Ex-OR4 are “1”. Both the output signals from the NOR gate circuits NR16 and NR17 are “0”.

Hence, the output signal from the NAND gate circuit ND4 is “0”. The output signal from the AND gate circuit AD3 is “1”. As a result, a write current from the write bit line driver/sinker 29A toward the write bit line driver/sinker 31 flows to the write bit line BL00.

When the write data DATA is “0”, all the output signals from the exclusive OR circuits Ex-OR1 to Ex-OR4 are “0”. Both the output signals from the NOR gate circuits NR16 and NR17 are “1”.

Hence, the output signal from the NAND gate circuit ND6 is “0”. The output signal from the AND gate circuit AD1 is “1”. As a result, a write current from the write bit line driver/sinker 31 toward the write bit line driver/sinker 29A flows to the write bit line BL00.

For example, when the write bit line BL00 is selected (RA1=“0”), and RA0=1, the TMR element MTJ2 on the upper side of the write bit line BL00 is selected.

At this time, when the write data DATA is “1”, all the output signals from the exclusive OR circuits Ex-OR1 to Ex-OR4 are “0”. Both the output signals from the NOR gate circuits NR16 and NR17 are “1”.

Hence, the output signal from the NAND gate circuit ND6 is “0”. The output signal from the AND gate circuit AD1 is “1”. As a result, a write current from the write bit line driver/sinker 31 toward the write bit line driver/sinker 29A flows to the write bit line BL00.

When the write data DATA is “0”, all the output signals from the exclusive OR circuits Ex-OR1 to Ex-OR4 are “1”. Both the output signals from the NOR gate circuits NR16 and NR17 are “0”.

Hence, the output signal from the NAND gate circuit ND4 is “0”. The output signal from the AND gate circuit AD3 is “1”. As a result, a write current from the write bit line driver/sinker 29A toward the write bit line driver/sinker 31 flows to the write bit line BL00.

When BL01 is Selected

For example, when the write bit line BL01 is selected (RA1=“1”), and RA0=0, the TMR element MTJ3 on the lower side of the write bit line BL01 is selected.

At this time, when the write data DATA is “1”, both the output signals from the exclusive OR circuits Ex-OR5 and Ex-OR6 are “1”. Both the output signals from the exclusive NOR circuits Ex-NR1 and Ex-NR2 are Hence, the output signal from the NAND gate circuit ND5 is “0”. The output signal from the AND gate circuit AD4 is “1”. As a result, a write current from the write bit line driver/sinker 29A toward the write bit line driver/sinker 31 flows to the write bit line BL01.

When the write data DATA is “0”, both the output signals from the exclusive OR circuits Ex-OR5 and Ex-OR6 are “0”. Both the output signals from the exclusive NOR circuits Ex-NR1 and Ex-NR2 are “1”.

Hence, the output signal from the NAND gate circuit ND7 is “0”. The output signal from the AND gate circuit AD2 is "1". As a result, a write current from the write bit line driver/sinker 31 toward the write bit line driver/sinker 29A flows to the write bit line BL01.

For example, when the write bit line BL01 is selected (RA1="1"), and RA0=1, the TMR element MTJ4 on the upper side of the write bit line BL01 is selected.

At this time, when the write data DATA is "1", both the output signals from the exclusive OR circuits Ex-OR5 and Ex-OR6 are "0". Both the output signals from the exclusive NOR circuits Ex-NR1 and Ex-NR2 are "1".

Hence, the output signal from the NAND gate circuit ND7 is "0". The output signal from the AND gate circuit AD2 is "1". As a result, a write current from the write bit line driver/sinker 31 toward the write bit line driver/sinker 29A flows to the write bit line BL01.

When the write data DATA is "0", both the output signals from the exclusive OR circuits Ex-OR5 and Ex-OR6 are "1". Both the output signals from the exclusive NOR circuits Ex-NR1 and Ex-NR2 are "0".

Hence, the output signal from the NAND gate circuit ND5 is "0". The output signal from the AND gate circuit AD4 is "1". As a result, a write current from the write bit line driver/sinker 29A toward the write bit line driver/sinker 31 flows to the write bit line BL01.

7. Manufacturing Method

The cell array structures, read operation principles, TMR element structures, peripheral circuits including the read circuit, and the positional relationship between the pinning layer and the storing layer with respect to the write line in the magnetic random access memory of the present invention have been described above.

Finally, manufacturing methods of implementing the magnetic random access memory of the present invention will be described.

(1) Manufacturing Method 1

Manufacturing Method 1 is applied to a magnetic random access memory having a cell array structure (1-switch n-MTJ structure) in which a plurality of TMR elements are stacked at a plurality of stages, and the plurality of TMR elements are connected in series between a read bit line and the ground terminal.

The cell array structure completed by the manufacturing method of the present invention will be briefly described first. Then, the manufacturing method of the cell array structure will be described.

① Cell Array Structure Related to Manufacturing Method 1

FIG. 81 is a view showing the cell array structure of a magnetic random access memory in which one block is formed from a plurality of TMR elements connected in series.

As a characteristic feature of this cell array structure, one read bit line is arranged in one column (Y-direction), and a plurality of TMR elements connected in series are arranged immediately under the read bit line. The plurality of TMR elements form one read block and are connected between the read bit line and the ground terminal.

A read select switch (MOS transistor) RSW is arranged on the surface region of a semiconductor substrate. The source of the read select switch RSW is connected to the ground terminal through a source line SL. The source line SL is shared by two read blocks adjacent in the column direction. The source line SL extends straight in, e.g., the X-direction (a direction perpendicular to the surface of the drawing sheet).

The gate of the read select switch (MOS transistor) RSW serves as a read word line RWLn. The read word line RWLn extends in the X-direction. Four TMR elements (MTJ (Magnetic Tunnel Junction) elements) are stacked on the read select switch RSW.

Each TMR element is arranged between the lower electrode and the upper electrode. The TMR elements are connected in series through contact plugs. The lower electrode of the TMR element at the lowermost stage is connected to the drain of the read select switch (MOS transistor) RSW. The upper electrode of the TMR element at the uppermost stage is connected, through a contact plug, to a read bit line BL0 that extends in the Y-direction.

Three write word lines WWL0, WWL1, and WWL2 extending in the X-direction are present in one row. Two write bit lines BL00 and BL01 extending in the Y-direction are present in one column.

When the cell array structure is viewed from the upper side of the semiconductor substrate, for example, the plurality of TMR elements that are stacked are laid out to overlap each other. The three write word lines are also laid out to overlap each other. The read bit line and two write bit lines are also laid out to overlap each other.

The contact plugs for connecting the plurality of TMR elements in series are laid out not to overlap the write word lines and write bit lines. The upper and lower electrodes of the TMR elements are formed in a pattern that can easily come into contact with the contact plugs.

② Steps in Manufacturing Method 1

The manufacturing method for implementing the cell array structure shown in FIG. 81 will be described below. A detailed manufacturing method (e.g., employment of a dual damascene process) will be described here. Hence, note that elements that are not illustrated in the cell array structure of FIG. 81 will be mentioned. However, the outline of the finally completed cell array structure is almost the same as that shown in FIG. 81.

Element Isolation Step

Figure 82:
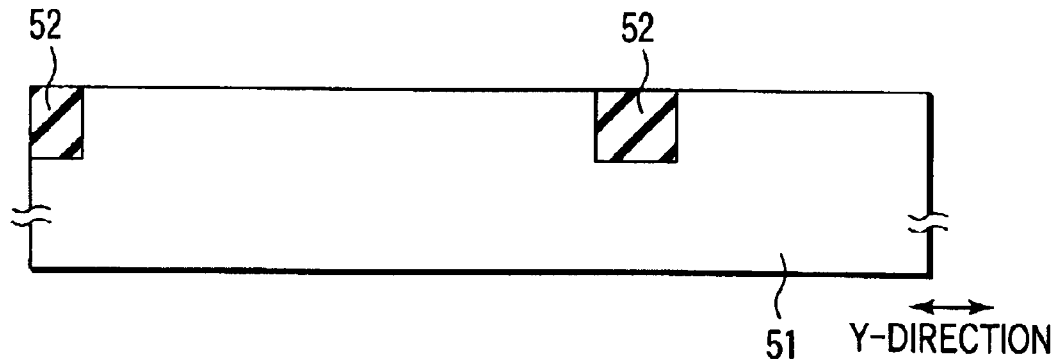
FIG. 82 is a sectional view showing one step in Manufacturing Method 1 of the present invention.

First, as shown in FIG. 82, the STI (Sallow Trench Isolation) structure 52, which is the shallow trenches are filled by field oxide for isolating active areas, is formed in the semiconductor substrate 51.

The STI structure 52 can be formed by, e.g., the following process.

A mask pattern (e.g., a silicon nitride film) is formed on the semiconductor substrate 51 by PEP (Photo Engraving Process). The semiconductor substrate 51 is etched by RIE (Reactive Ion Etching) using the mask pattern as a mask to form trenches in the semiconductor substrate 51. These trenches are filled with insulating films (for example, silicon oxide films) using, e.g., CVD (Chemical Vapor Deposition) and CMP (Chemical Mechanical Polishing).

After that, p-type impurities (e.g., B or $BF_2$) or n-type impurities (e.g., P or As) are doped into the semiconductor substrate by, e.g., ion implantation, as needed, to form p-type well regions or n-type well regions.

MOSFET Forming Step

Figure 83:
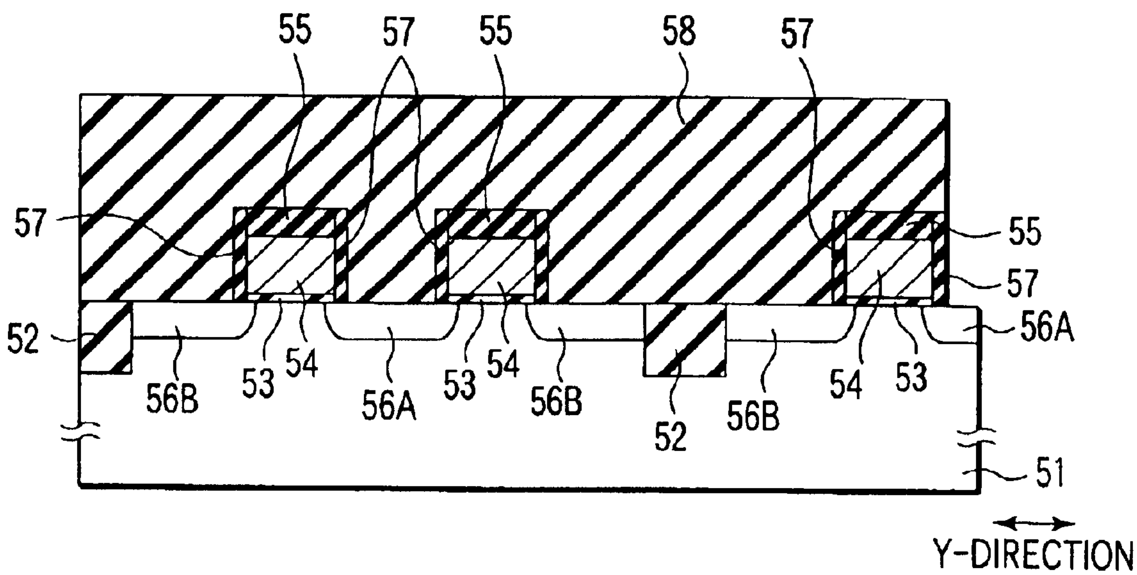
FIG. 83 is a sectional view showing one step in Manufacturing Method 1 of the present invention.

Next, as shown in FIG. 83, MOS transistors including read select switches are formed on the surface region of the semiconductor substrate 51.

The MOS transistor can be formed by, e.g., the following process.

Impurities for controlling the threshold value of the MOS transistor are ion-implanted into necessitate channel potions in active areas surrounding by field oxides 52. A gate insulating film (e.g., a silicon oxide film) 53 is formed on the active regions by thermal oxidation. A gate electrode material (e.g., polysilicon containing an impurity) and cap insulating film (e.g., a silicon nitride film) 55 are formed on the gate insulating film 53 by CVD.

The cap insulating film 55 is patterned by PEP. Then, the gate electrode material and gate insulating film 53 are processed (etched) by RIE using the cap insulating film 55 as a mask. As a consequence, gate electrodes 54 extending in the X-direction are formed on the semiconductor substrate 51.

P- or n-type impurities are doped into the semiconductor substrate 51 by ion implantation using the cap insulating films 55 and gate electrodes 54 as a mask. Lightly-doped impurity regions (LDD regions or extension regions) are formed in the semiconductor substrate.

An insulating film (e.g., a silicon nitride film) is formed on the entire surface of the semiconductor substrate 51 by CVD. After that, the insulating film is etched by RIE to form sidewall insulating layers 57 on the side surfaces of the gate electrodes 54 and cap insulating films 55. P- or n-type impurities are doped into the semiconductor substrate 51 by ion implantation using the cap insulating films 55, gate electrodes 54, and sidewall insulating layers 57 as a mask. As a result, source regions 56A and drain regions 56B are formed in the semiconductor substrate 51.

After that, a dielectric interlayer (e.g., a silicon oxide layer) 58 that completely covers the MOS transistors is formed on the entire surface of the semiconductor substrate 51 by CVD. In addition, the surface of the dielectric interlayer 58 is planarized by CMP.

Contact Hole Forming Step

Figure 85:
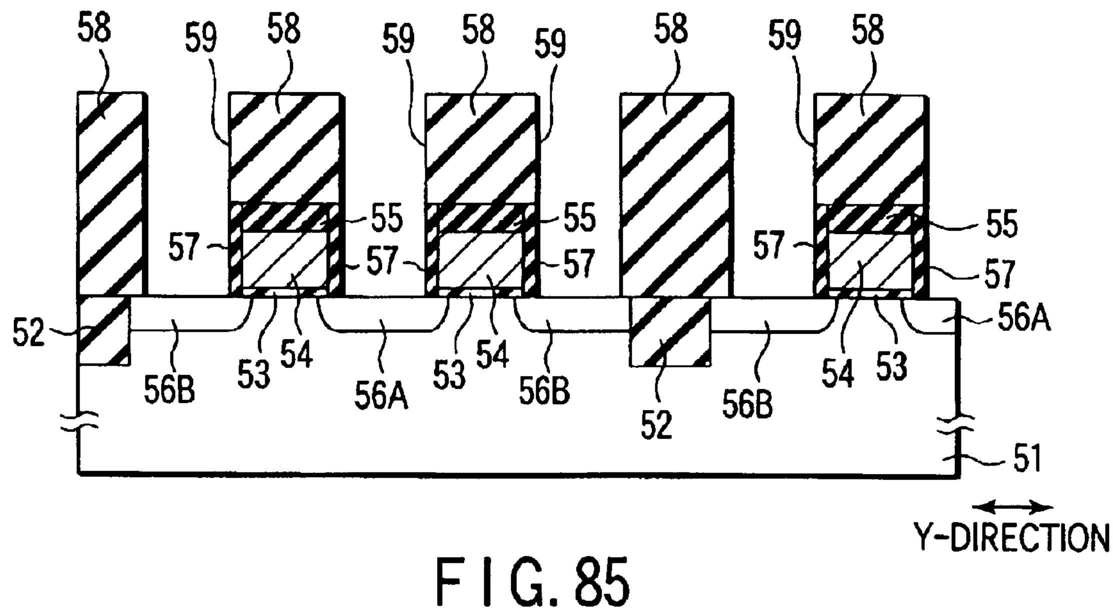
FIG. 85 is a sectional view taken along a line LXXXV-LXXXV in FIG. 84.

Next, as shown in FIGS. 84 and 85, contact holes 59 that reach the source regions 56A and drain regions 56B of MOS transistors are formed in the dielectric interlayer 58 on the semiconductor substrate 51.

The contact holes 59 can easily be formed by, e.g., forming a resist pattern on the dielectric interlayer 58 by PEP and etching the dielectric interlayer 58 by RIE using the resist pattern as a mark. After etching, the resist pattern is removed.

Interconnection Trench Forming Step

Figure 86:
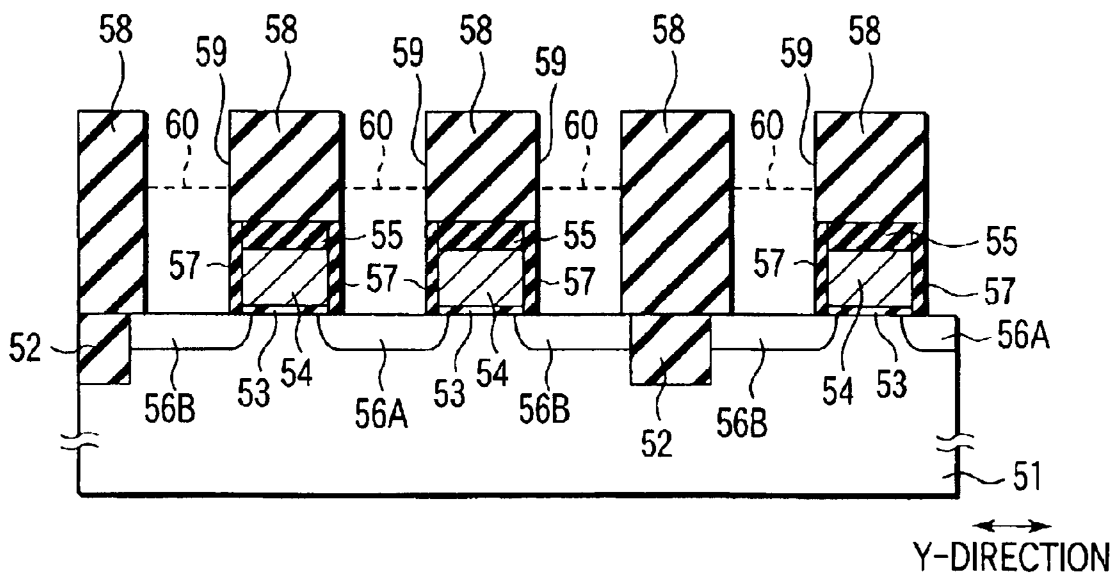
FIG. 86 is a sectional view showing one step in Manufacturing Method 1 of the present invention.

As shown in FIG. 86, interconnection trenches 60 are formed in the dielectric interlayer 58 on the semiconductor substrate 51. In this example, the interconnection trenches 60 extend in the X-direction. Hence, in the section along the Y-direction, the interconnection trenches 60 overlap the contact holes 59. The interconnection trenches 60 are indicated by broken lines in FIG. 86.

The interconnection trenches 60 can easily be formed by, e.g., forming a resist pattern on the dielectric interlayer 58 by PEP and etching the dielectric interlayer 58 by RIE using the resist pattern as a mark. After etching, the resist pattern is removed.

First Interconnection Layer Forming Step

Figure 87:
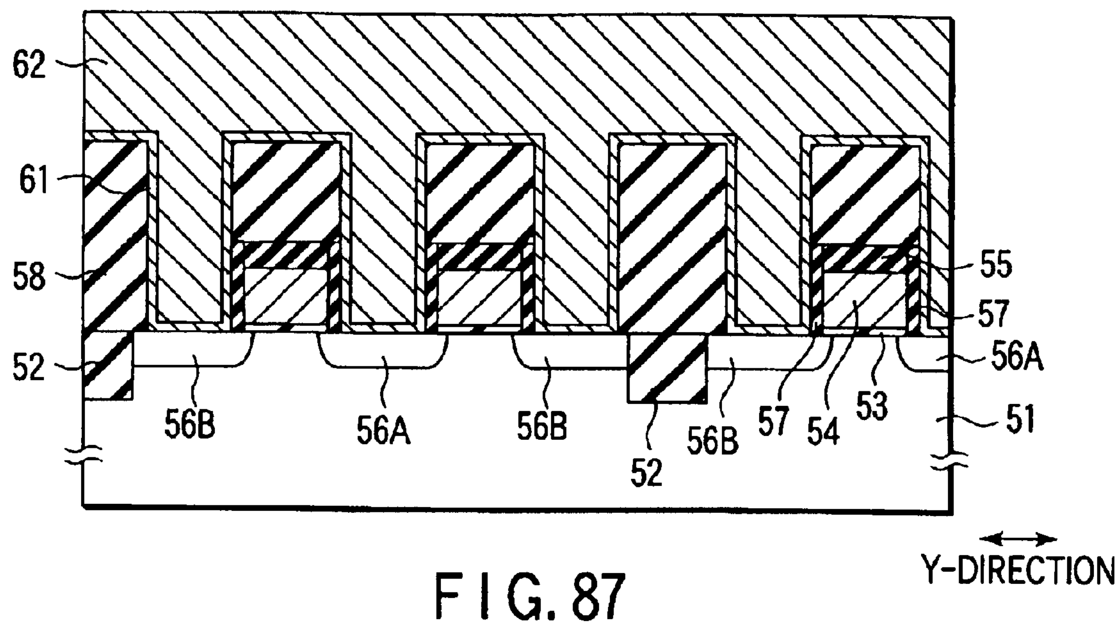
FIG. 87 is a sectional view showing one step in Manufacturing Method 1 of the present invention.

As shown in FIG. 87, a barrier metal layer (e.g., a multilayer of Ti and TiN) 61 is formed on the dielectric interlayer 58, the inner surfaces of the contact holes 59, and the inner surfaces of the interconnection trenches 60 by, e.g., sputtering. Subsequently, a metal layer (e.g., a W layer) 62 that completely fills the contact holes 59 and interconnection trenches 60 is formed on the barrier metal layer 61 by, e.g., sputtering.

Figure 88:
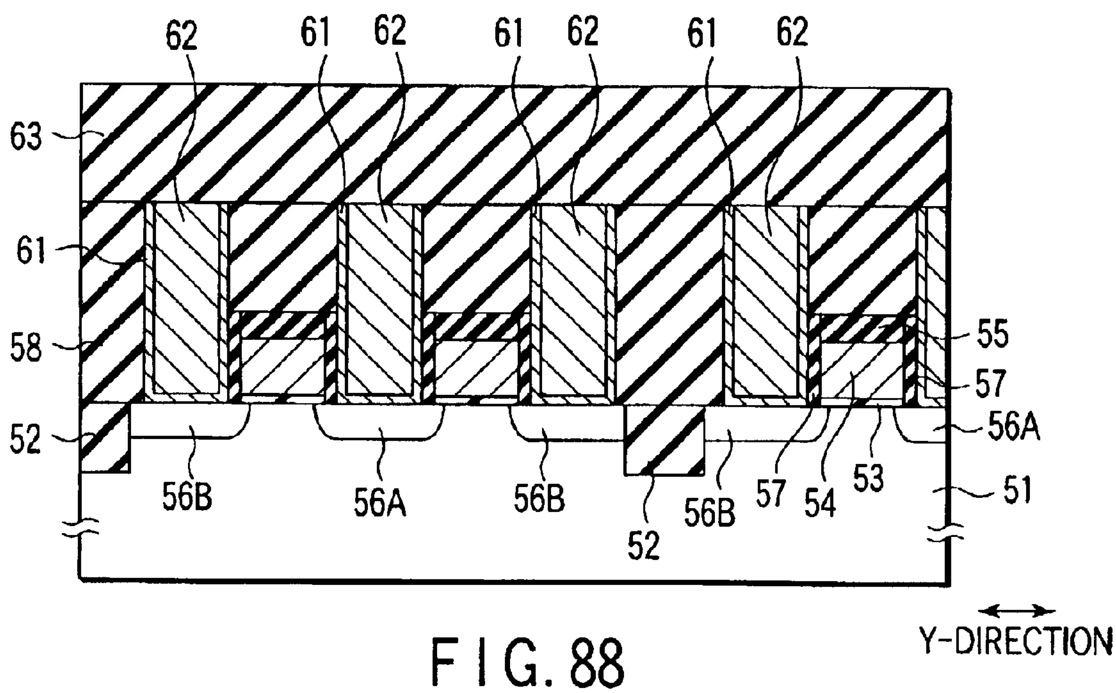
FIG. 88 is a sectional view showing one step in Manufacturing Method 1 of the present invention.

After that, as shown in FIG. 88, the metal layer 62 is polished by, e.g., CMP and left only in the contact holes 59 and interconnection trenches 60. The metal layer 62 remaining in each contact hole 59 forms a contact plug. The metal layer 62 remaining in each interconnection trench 60 forms a first interconnection layer. A dielectric interlayer (e.g., a silicon oxide layer) 63 is formed on the dielectric interlayer 58 by CVD.

The step comprising the contact hole forming step, the interconnection trench forming step, and the first interconnection layer forming step is called a dual damascene process.

Interconnection Trench Forming Step

Next, as shown in FIG. 89, interconnection trenches 64 are formed in the dielectric interlayer 63. In this example, the interconnection trenches 64 serve as trenches used to form write word lines and extend in the X-direction. Sidewall insulating layers (e.g., silicon nitride layers) 65 for self-aligned contacts are formed on the side surfaces of the interconnection trenches 64.

The interconnection trenches 64 can easily be formed by, e.g., forming a resist pattern on the dielectric interlayer 63 by PEP and etching the dielectric interlayer 63 by RIE using the resist pattern as a mask. After etching, the resist pattern is removed.

The sidewall insulating layers 65 can easily be formed by forming an insulating film (e.g., a silicon nitride film) on the entire surface of the dielectric interlayer 63 by CVD and etching the insulating film by RIE.

Second Interconnection Layer Forming Step

As shown in FIG. 90, a barrier metal layer (e.g., a multilayer of Ta and TaN) 66 is formed on the dielectric interlayer 63, the inner surfaces of the interconnection trenches 64, and the sidewall insulating layers 65 by, e.g., sputtering. Subsequently, a metal layer (e.g., a Cu layer) 67 that completely fills the interconnection trenches 64 is formed on the barrier metal layer 66 by, e.g., sputtering.

Figure 91:
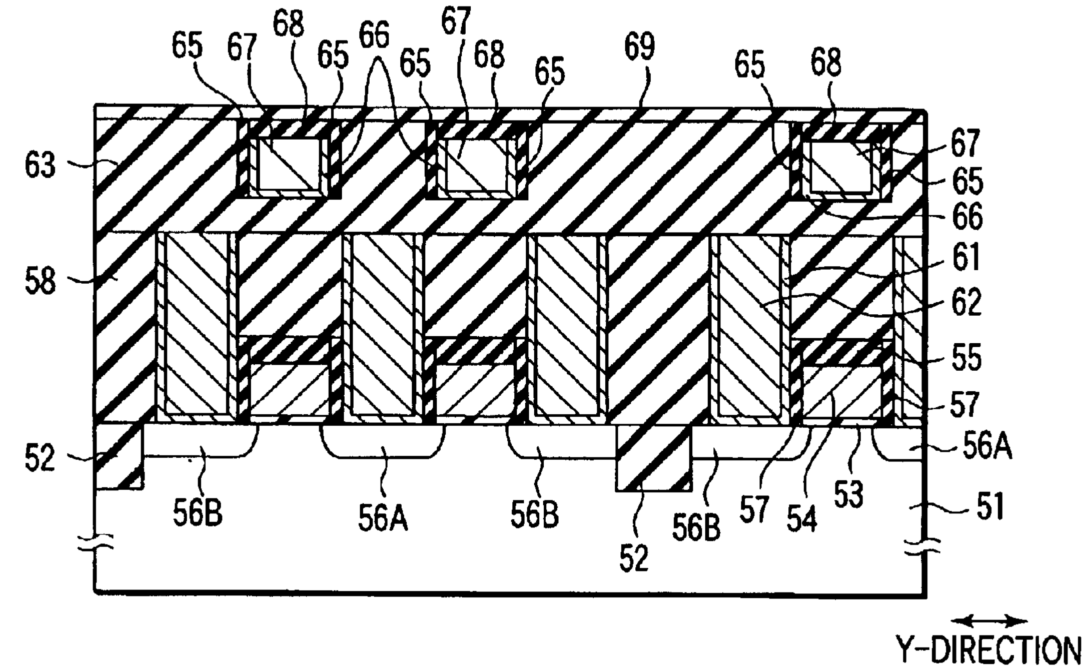
FIG. 91 is a sectional view showing one step in Manufacturing Method 1 of the present invention.

After that, as shown in FIG. 91, the metal layer 67 is polished by, e.g., CMP and left only in the interconnection trenches 64. The metal layer 67 remaining in each interconnection trench 64 forms a second interconnection layer that functions as a write word line.

An insulating layer (e.g., a silicon nitride layer) 68 is formed on the dielectric interlayer 63 by CVD. The insulating layer 68 is polished by CMP and left only on the metal layers 67 serving as the second interconnection layers. In addition, a dielectric interlayer (e.g., a silicon oxide layer) 69 that completely covers the metal layers 67 serving as the second interconnection layers is formed on the dielectric interlayer 63.

Figure 92:
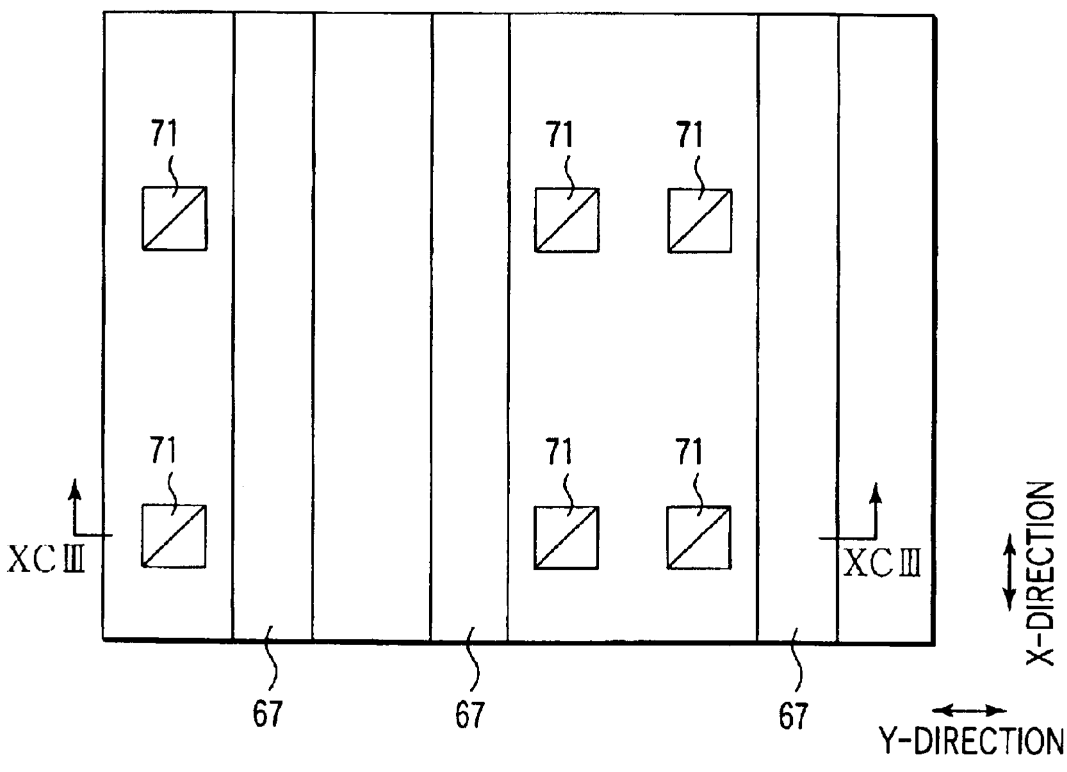
FIG. 92 is a plan view showing one step in Manufacturing Method 1 of the present invention.
Figure 93:
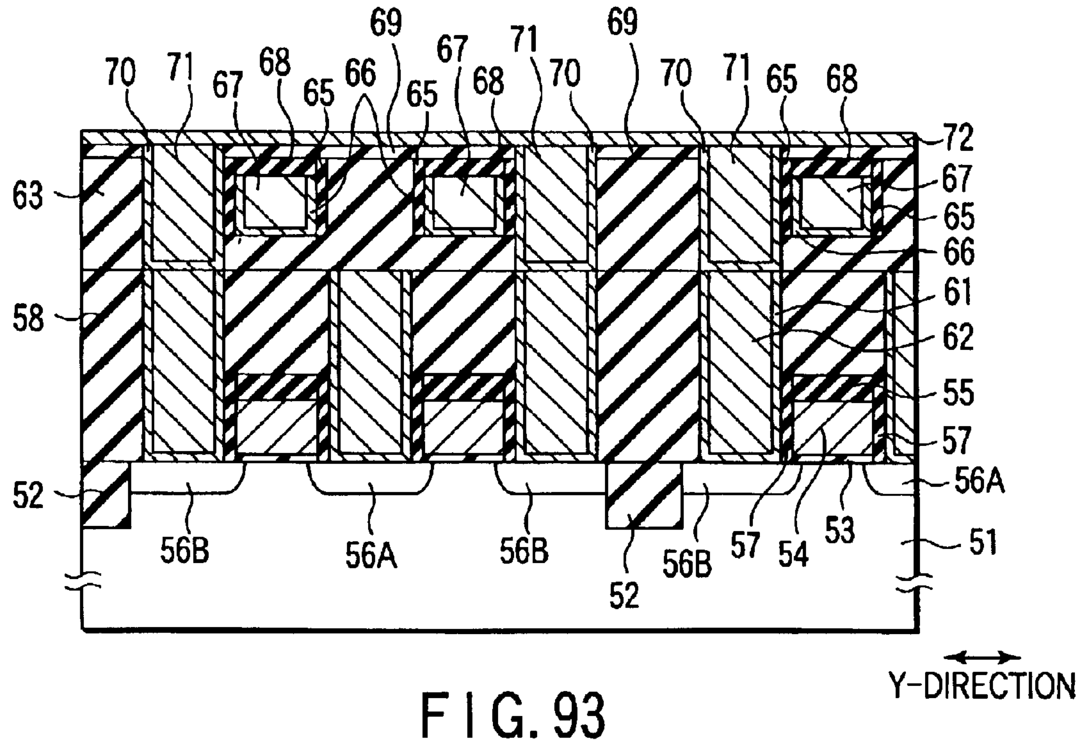
FIG. 93 is a sectional view taken along a line XCIII-XCIII in FIG. 92.

The step comprising the interconnection trench forming step and the second interconnection layer forming step is called a damascene process. Step of Forming Lower Electrode of First MTJ Element Next, as shown in FIGS. 92 and 93, contact holes that reach the metal layers 62 serving as the first interconnection layers are formed in the dielectric interlayer 69.

These contact holes can easily be formed by, e.g., forming a resist pattern on the dielectric interlayer 69 by PEP and etching the dielectric interlayers 63 and 69 by RIE using the resist pattern as a mask. After etching, the resist pattern is removed.

In addition, a barrier metal layer (e.g., a multilayer of Ti and TiN) 70 is formed on the inner surfaces of the contact holes by, e.g., sputtering. Subsequently, a metal layer (e.g., a W layer) 71 that completely fills the contact holes is formed on the barrier metal layer 70 by, e.g., sputtering.

After that, the metal layer 71 is polished by, e.g., CMP and left only in the contact holes. The metal layer 71 remaining in each contact hole forms a contact plug. In addition, a metal layer (e.g., a Ta layer) 72 serving as the lower electrodes of the first MTJ elements is formed on the dielectric interlayer 69 by CVD.

Step of Forming First MTJ Element and its Upper Electrode

Figure 94:
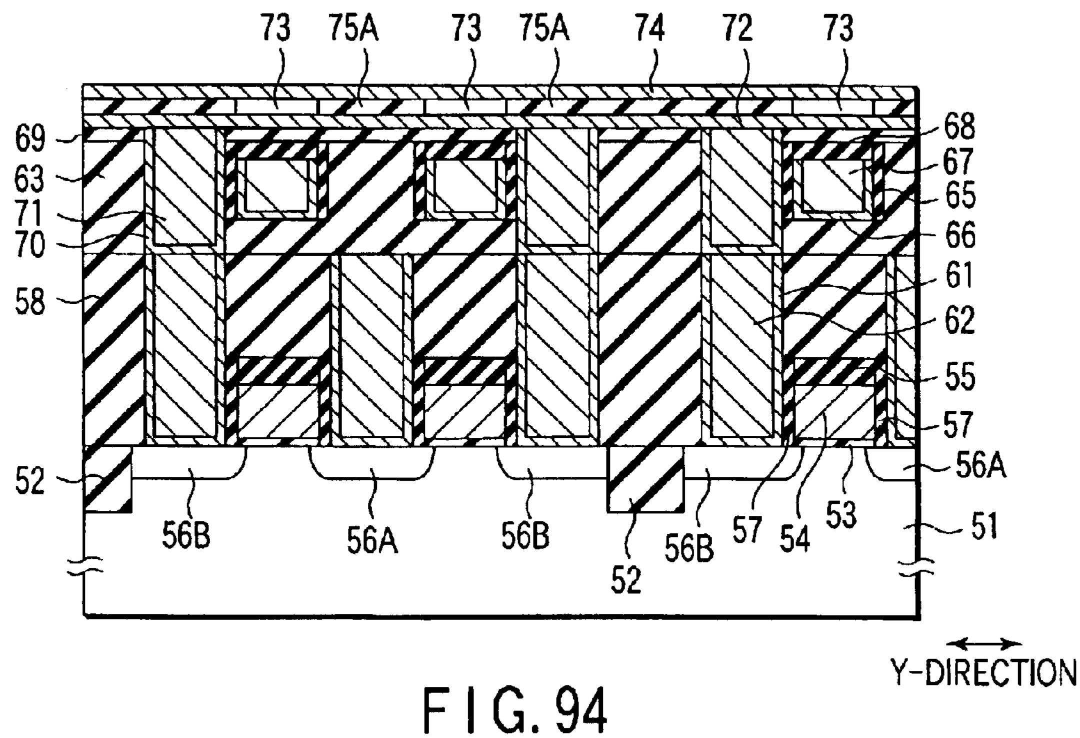
FIG. 94 is a sectional view showing one step in Manufacturing Method 1 of the present invention.

As shown in FIG. 94, first MTJ elements 73 are formed on the metal layer 72. Each first MTJ element 73 is formed from a tunneling barrier, two ferromagnetic layers that sandwich the tunneling barrier, and an antiferromagnetic layer and has, e.g., the structure as shown in FIG. 45.

A dielectric interlayer (e.g., a silicon oxide layer) 75A that completely covers the first MTJ elements 73 is formed by CVD. The dielectric interlayer 75A is polished by, e.g., CMP and left only between the first MTJ elements 73.

A metal layer 74 (e.g., a Ta layer) serving as the upper electrodes of the first MTJ elements 73 are formed on the dielectric interlayer 75A by sputtering.

Step of Pattering Lower and Upper Electrodes of First MTJ Element

Figure 95:
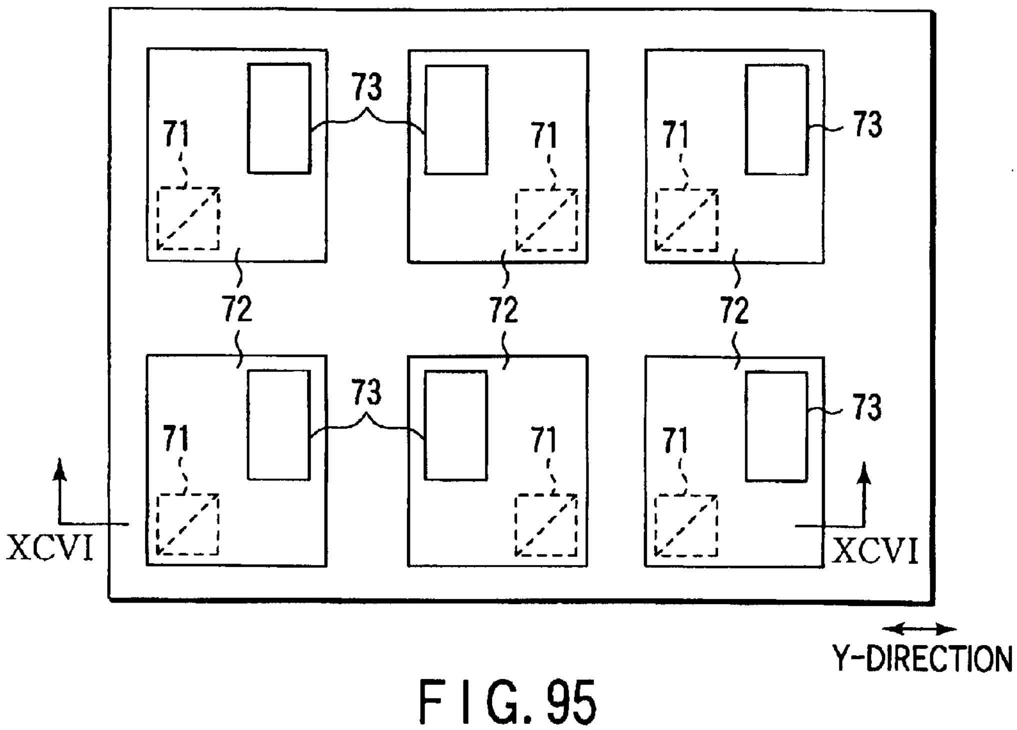
FIG. 95 is a plan view showing one step in Manufacturing Method 1 of the present invention.
Figure 96:
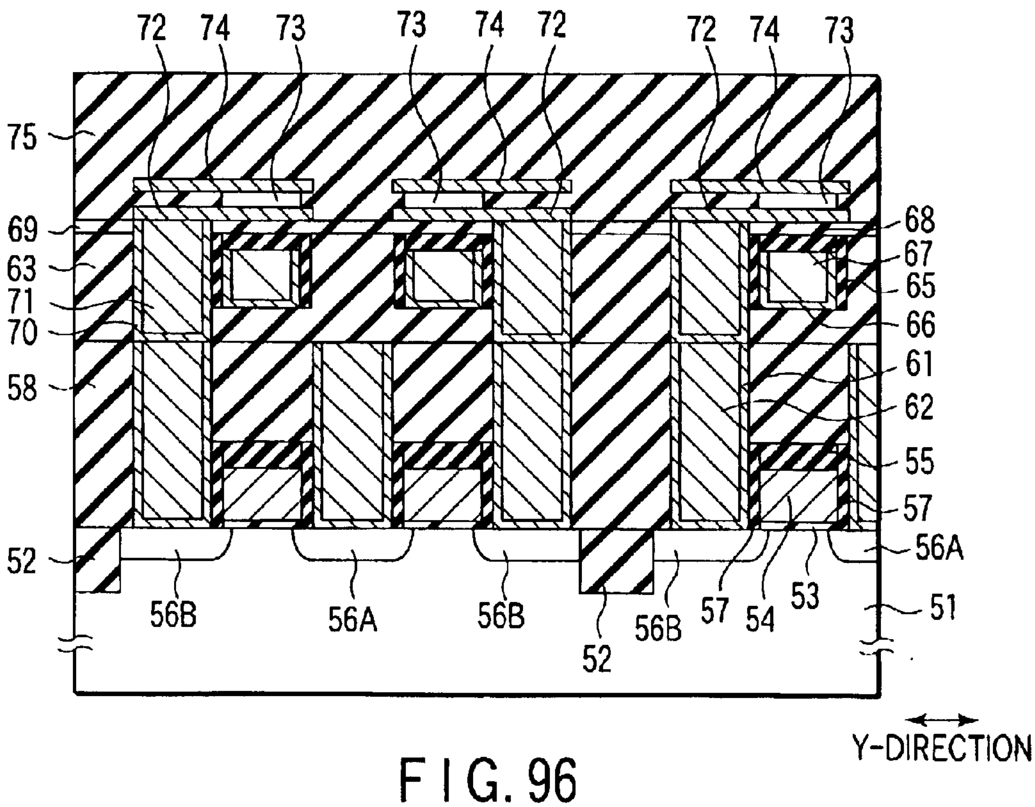
FIG. 96 is a sectional view taken along a line XCVI-XCVI in FIG. 95.

Next, as shown in FIGS. 95 and 96, the lower electrodes 72 and upper electrodes 74 of the first MTJ elements 73 are patterned.

The lower and upper electrodes 72 and 74 of the first MTJ elements 73 can easily be patterned by forming a resist pattern on the upper electrodes 74 by PEP and etching the lower and upper electrodes 72 and 74 by RIE using the resist pattern as a mask. Then, the resist pattern is removed.

A dielectric interlayer 75 that completely covers the upper electrodes 74 of the first MTJ elements 73 is formed by CVD.

Interconnection Trench Forming Step

As shown in FIG. 97, interconnection trenches 75A are formed in the dielectric interlayer 75. In this example, the interconnection trenches 75A serve as trenches used to form write bit lines and extend in the Y-direction. Sidewall insulating layers (e.g., silicon nitride layers) for self-aligned contacts are formed on the side surfaces of the interconnection trenches 75A.

The interconnection trenches 75A can easily be formed by, e.g., forming a resist pattern on the dielectric interlayer 75 by PEP and etching the dielectric interlayer 75 by RIE using the resist pattern as a mask. After etching, the resist pattern is removed.

The sidewall insulating layers can easily be formed by forming an insulating film (e.g., a silicon nitride film) on the entire surface of the dielectric interlayer 75 by CVD and etching the insulating film by RIE.

Third Interconnection Layer Forming Step

As shown in FIG. 98, a barrier metal layer (e.g., a multilayer of Ta and TaN) 76 is formed on the dielectric interlayer 75, the inner surfaces of the interconnection trenches 75A, and the sidewall insulating layers by, e.g., sputtering. Subsequently, a metal layer (e.g., a Cu layer) 77 that completely fills the interconnection trenches 75A is formed on the barrier metal layer 76 by, e.g., sputtering.

Figure 99:
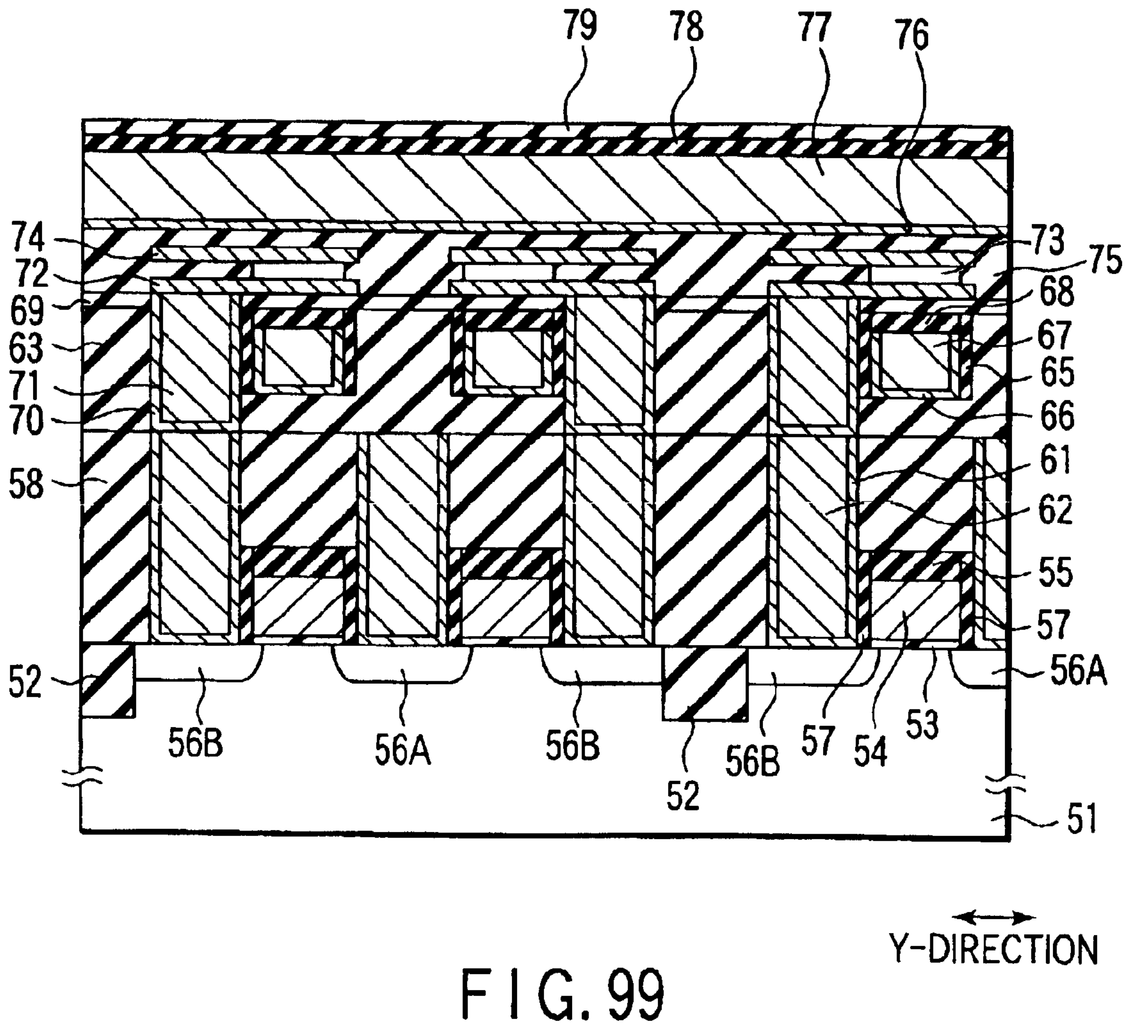
FIG. 99 is a sectional view showing one step in Manufacturing Method 1 of the present invention.

After that, as shown in FIG. 99, the metal layer 77 is polished by, e.g., CMP and left only in the interconnection trenches 75A. The metal layer 77 remaining in each interconnection trench 75A forms a third interconnection layer that functions as a write bit line.

An insulating layer (e.g., a silicon nitride layer) 78 is formed on the dielectric interlayer 75 by CVD. The insulating layer 78 is polished by CMP and left only on the metal layers 77 serving as the third interconnection layers. In addition, a dielectric interlayer (e.g., a silicon oxide layer) 79 that completely covers the metal layers 77 serving as the third interconnection layers is formed on the dielectric interlayer 75.

Step of Forming Lower Electrode of Second MTJ Element

Figure 100:
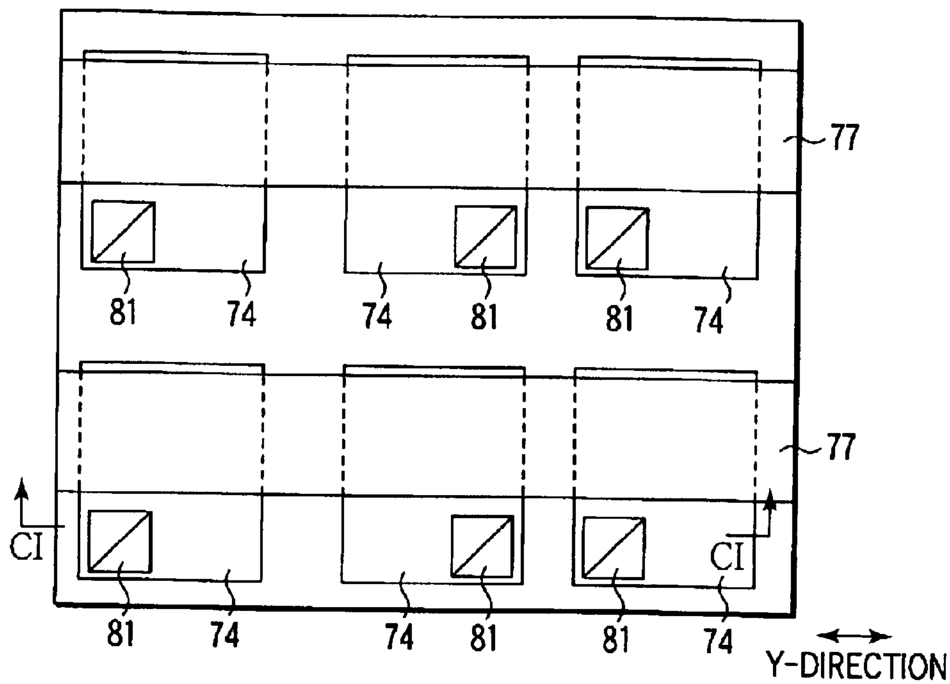
FIG. 100 is a plan view showing one step in Manufacturing Method 1 of the present invention.
Figure 101:
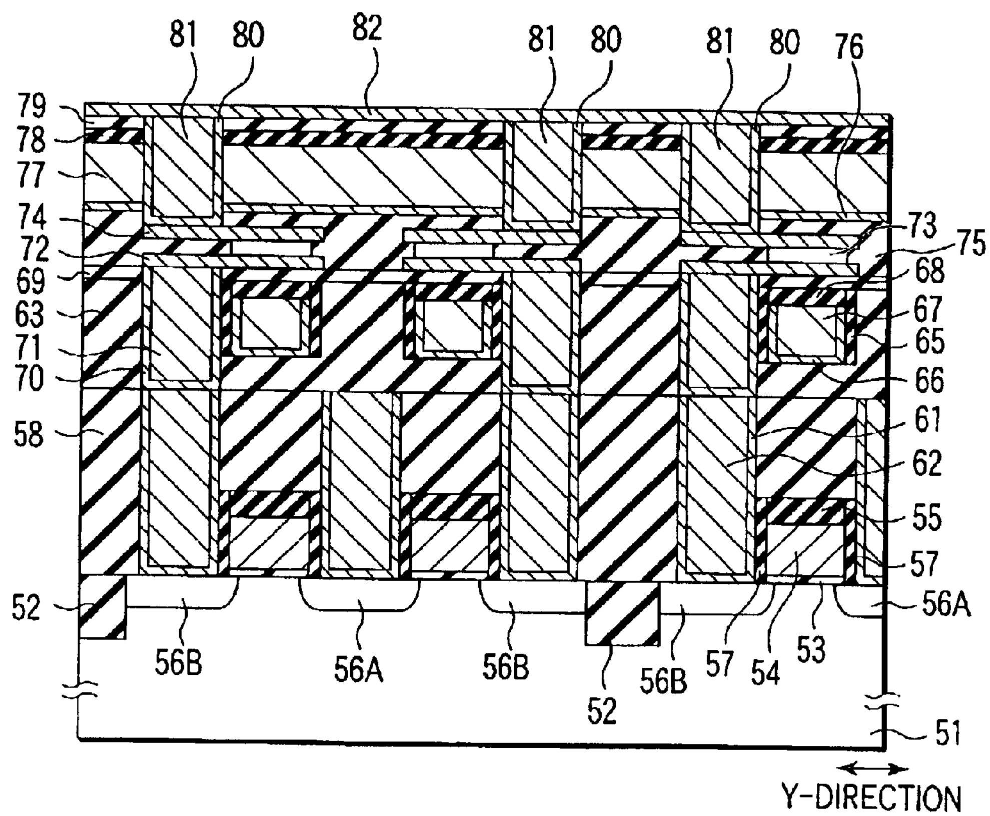
FIG. 101 is a sectional view taken along a line CI—CI in FIG. 100.

Next, as shown in FIGS. 100 and 101, contact holes that reach the upper electrodes 74 of the first MTJ elements are formed in the dielectric interlayers 75 and 79.

These contact holes can easily be formed by, e.g., forming a resist pattern on the dielectric interlayer 79 by PEP and etching the dielectric interlayers 75 and 79 by RIE using the resist pattern as a mask. After etching, the resist pattern is removed.

In addition, a barrier metal layer (e.g., a multilayer of Ti and TiN) 80 is formed on the inner surfaces of the contact holes by, e.g., sputtering. Subsequently, a metal layer (e.g., a W layer) 81 that completely fills the contact holes is formed on the barrier metal layer 80 by, e.g., sputtering.

After that, the metal layer 81 is polished by, e.g., CMP and left only in the contact holes. The metal layer 81 remaining in each contact hole forms a contact plug. In addition, a metal layer (e.g., a Ta layer) 82 serving as the lower electrodes of the second MTJ elements is formed on the dielectric interlayer 79 by sputtering.

Step of Forming Second MTJ Element and its Upper Electrode

Figure 102:
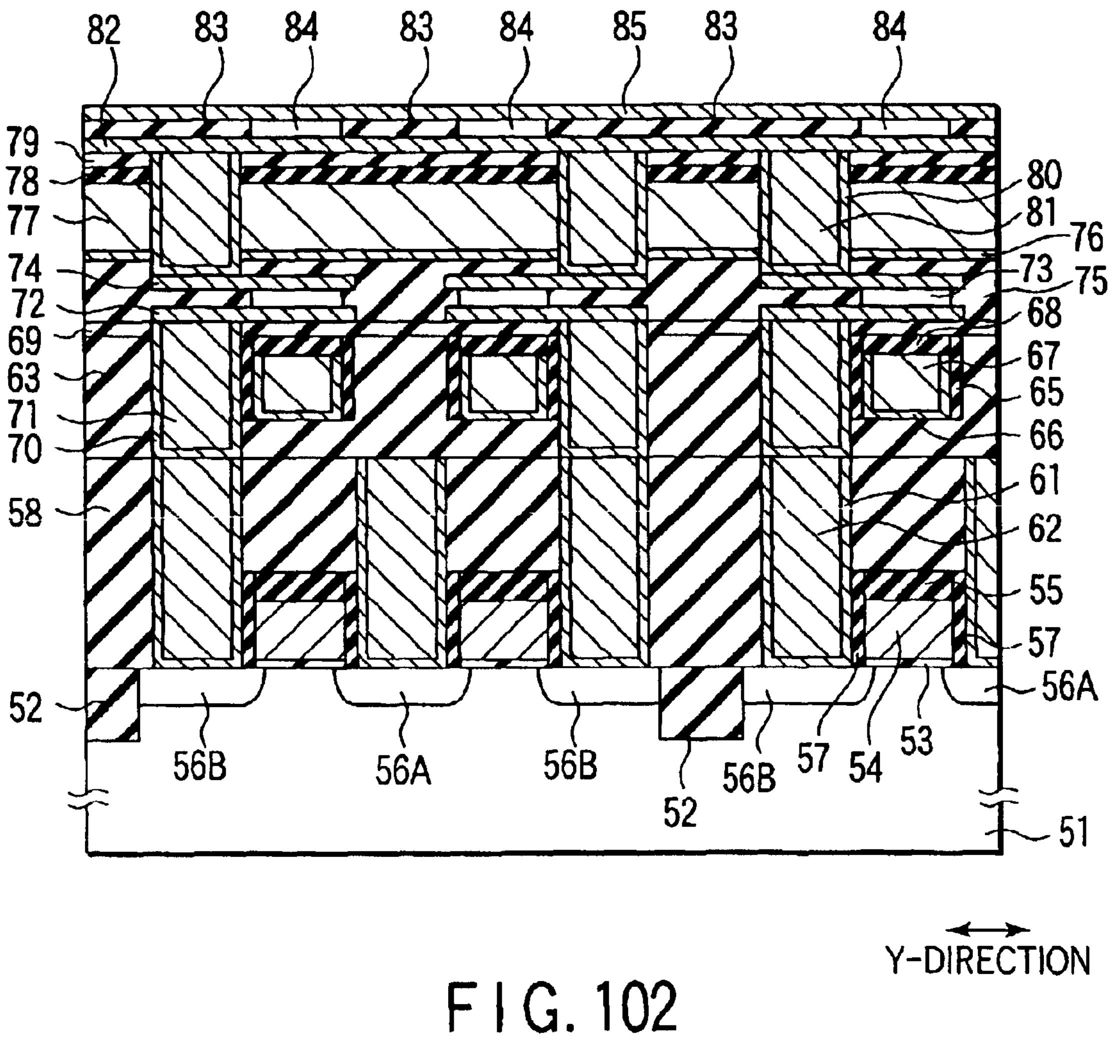
FIG. 102 is a sectional view showing one step in Manufacturing Method 1 of the present invention.

As shown in FIG. 102, second MTJ elements 84 are formed on the metal layer 82. Each second MTJ element 84 is formed from a tunneling barrier, two ferromagnetic layers that sandwich the tunneling barrier, and an antiferromagnetic layer and has, e.g., the structure as shown in FIG. 46.

A dielectric interlayer 83 (e.g., a silicon oxide layer) that completely covers the second MTJ elements 84 are formed by CVD. The dielectric interlayer 83 is polished by, e.g., CMP and left only between the second MTJ elements 84.

A metal layer 85 (e.g., a Ta layer) serving as the upper electrodes of the second MTJ elements 84 are formed on the dielectric interlayer 83 by sputtering.

Step of Pattering Lower and Upper Electrodes of Second MTJ Element

Figure 103:
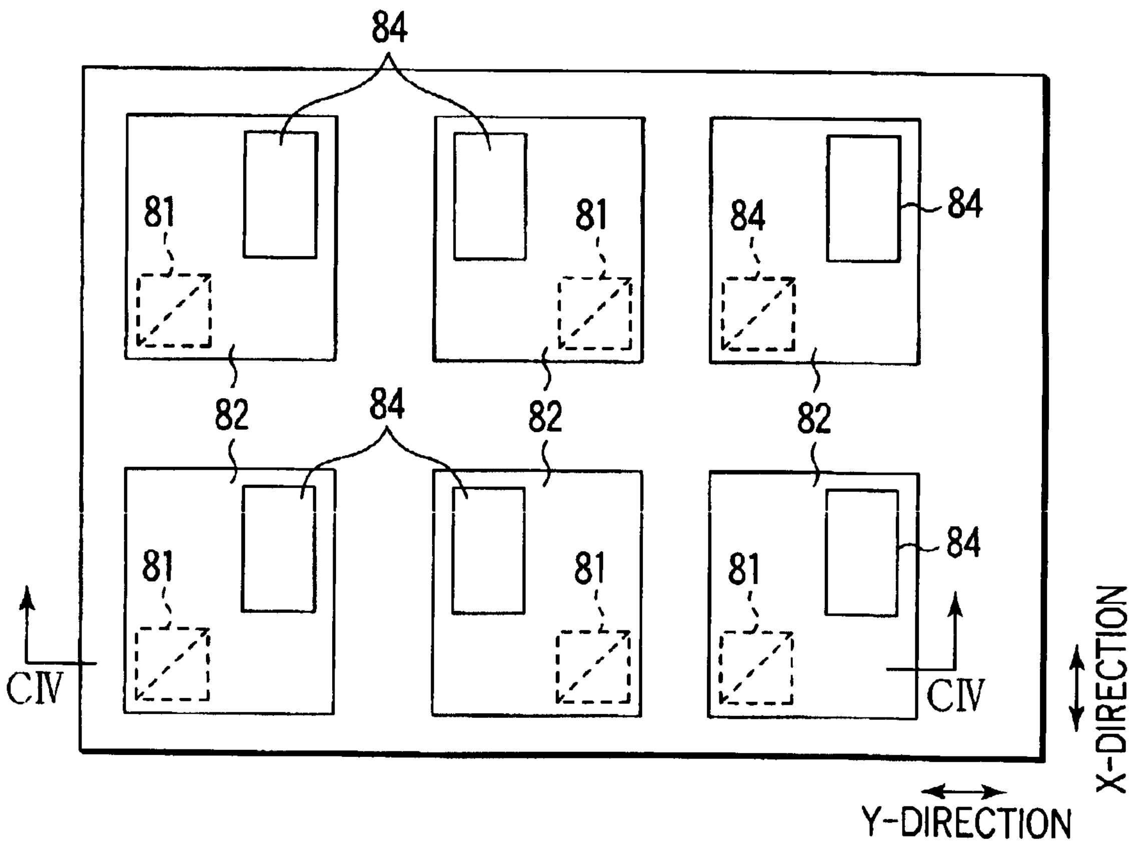
FIG. 103 is a plan view showing one step in Manufacturing Method 1 of the present invention.
Figure 104:
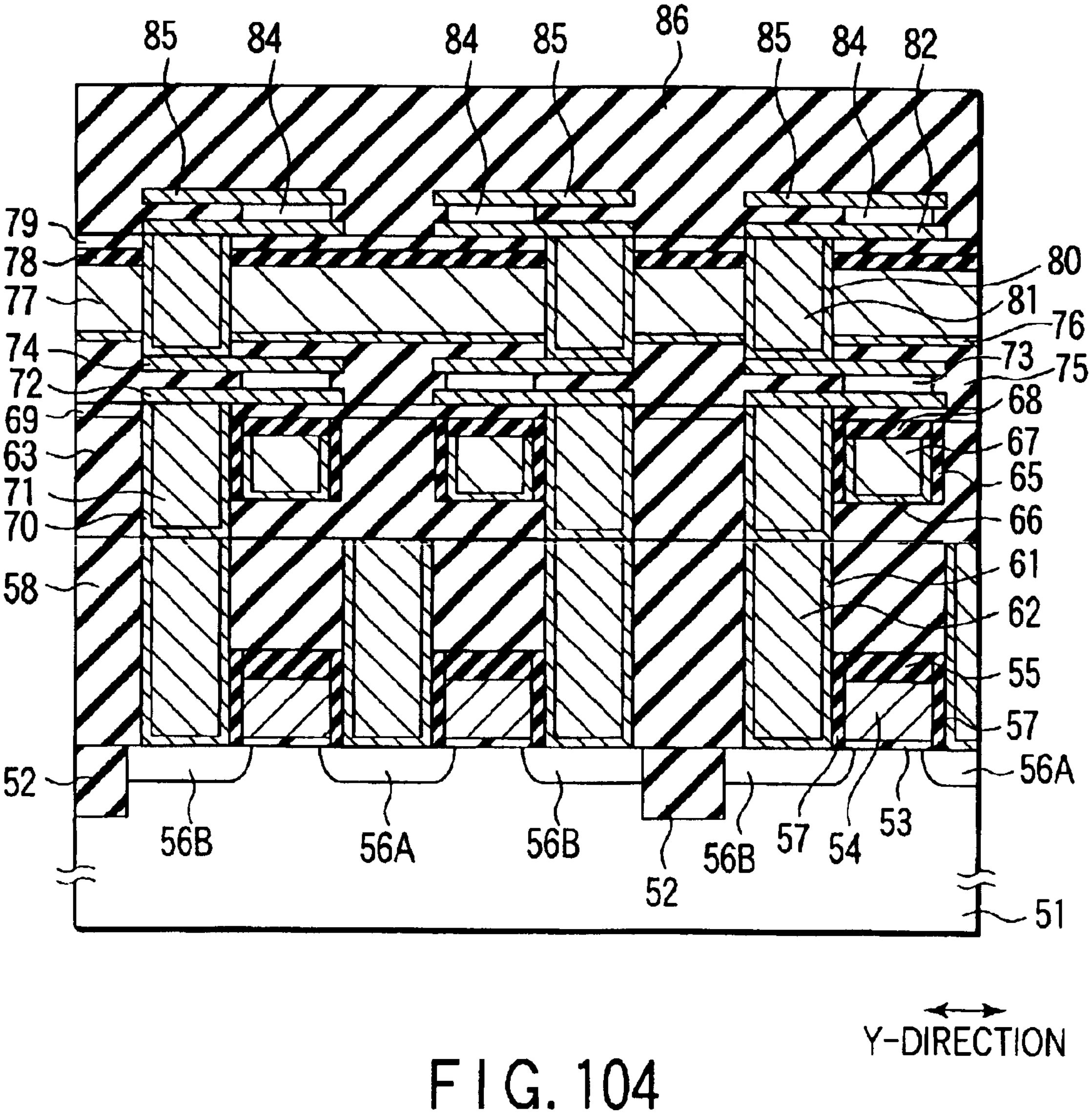
FIG. 104 is a sectional view taken along a line CIV—CIV in FIG. 103.

Next, as shown in FIGS. 103 and 104, the lower electrodes 82 and upper electrodes 85 of the second MTJ elements 84 are patterned.

The lower and upper electrodes 82 and 85 of the second MTJ elements 84 can easily be patterned by forming a resist pattern on the upper electrodes 85 by PEP and etching the lower and upper electrodes 82 and 85 by RIE using the resist pattern as a mask. Then, the resist pattern is removed.

A dielectric interlayer 86 that completely covers the upper electrodes 85 of the second MTJ elements 84 is formed by CVD.

Interconnection Trench Forming Step

Next, as shown in FIG. 105, interconnection trenches 87 are formed in the dielectric interlayer 86. In this example, the interconnection trenches 87 serve as trenches used to form write word lines and extend in the X-direction. Sidewall insulating layers (e.g., silicon nitride layers) 88 for self-aligned contacts are formed on the side surfaces of the interconnection trenches 87.

The interconnection trenches 87 can easily be formed by, e.g., forming a resist pattern on a dielectric interlayer 86 by PEP and etching the dielectric interlayer 86 by RIE using the resist pattern as a mask. After etching, the resist pattern is removed.

The sidewall insulating layers 88 can easily be formed by forming an insulating film (e.g., a silicon nitride film) on the entire surface of the dielectric interlayer 86 by CVD and etching the insulating film by RIE.

Fourth Interconnection Layer Forming Step

Figure 106:
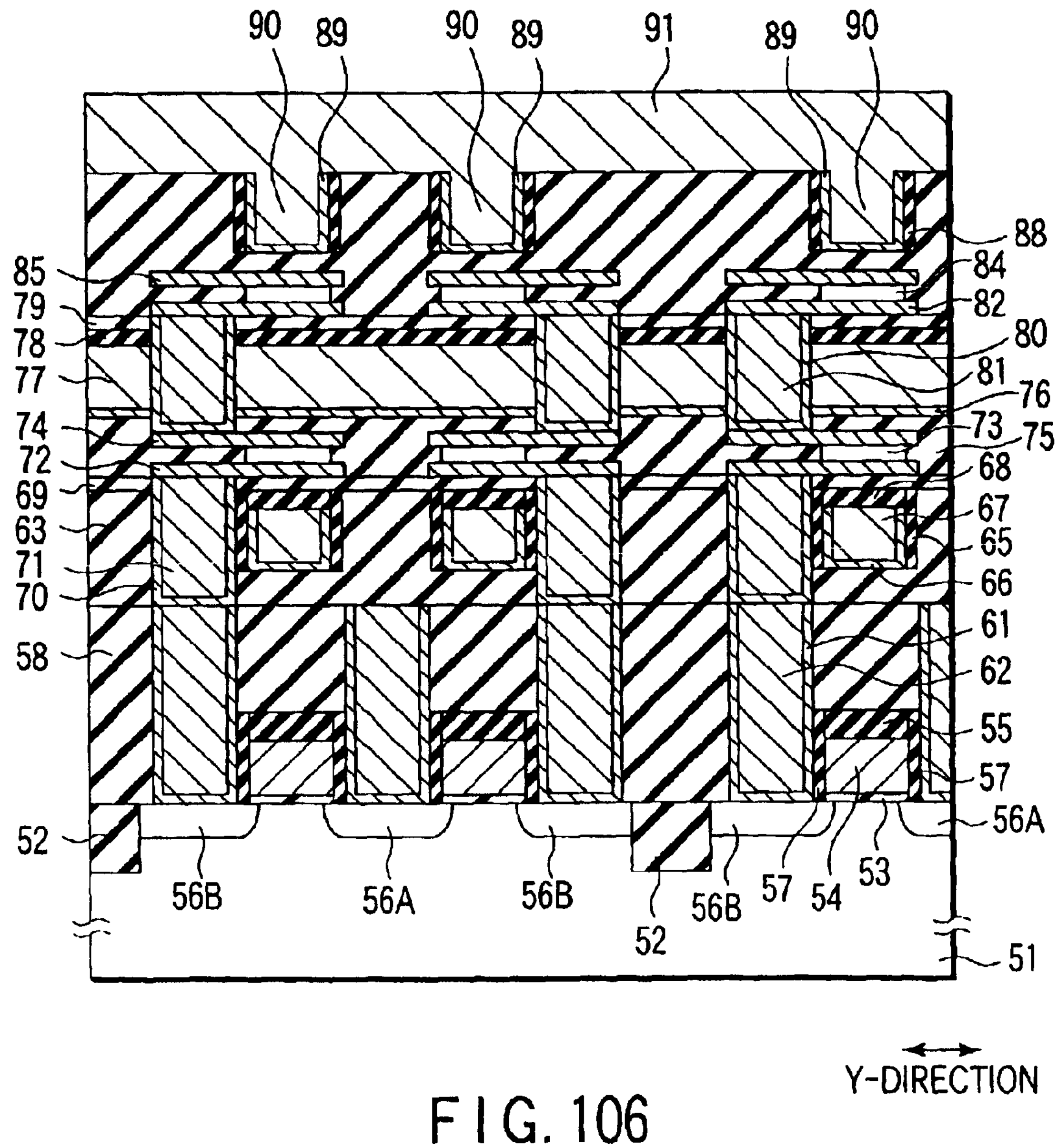
FIG. 106 is a sectional view showing one step in Manufacturing Method 1 of the present invention.

As shown in FIG. 106, a barrier metal layer (e.g., a multilayer of Ta and TaN) 89 is formed on the dielectric interlayer 86, the inner surfaces of the interconnection trenches 87, and the sidewall insulating layers 88 by, e.g., sputtering. Subsequently, a metal layer (e.g., a Cu layer) 91 that completely fills the interconnection trenches 87 is formed on the barrier metal layer 89 by, e.g., sputtering.

Figure 107:
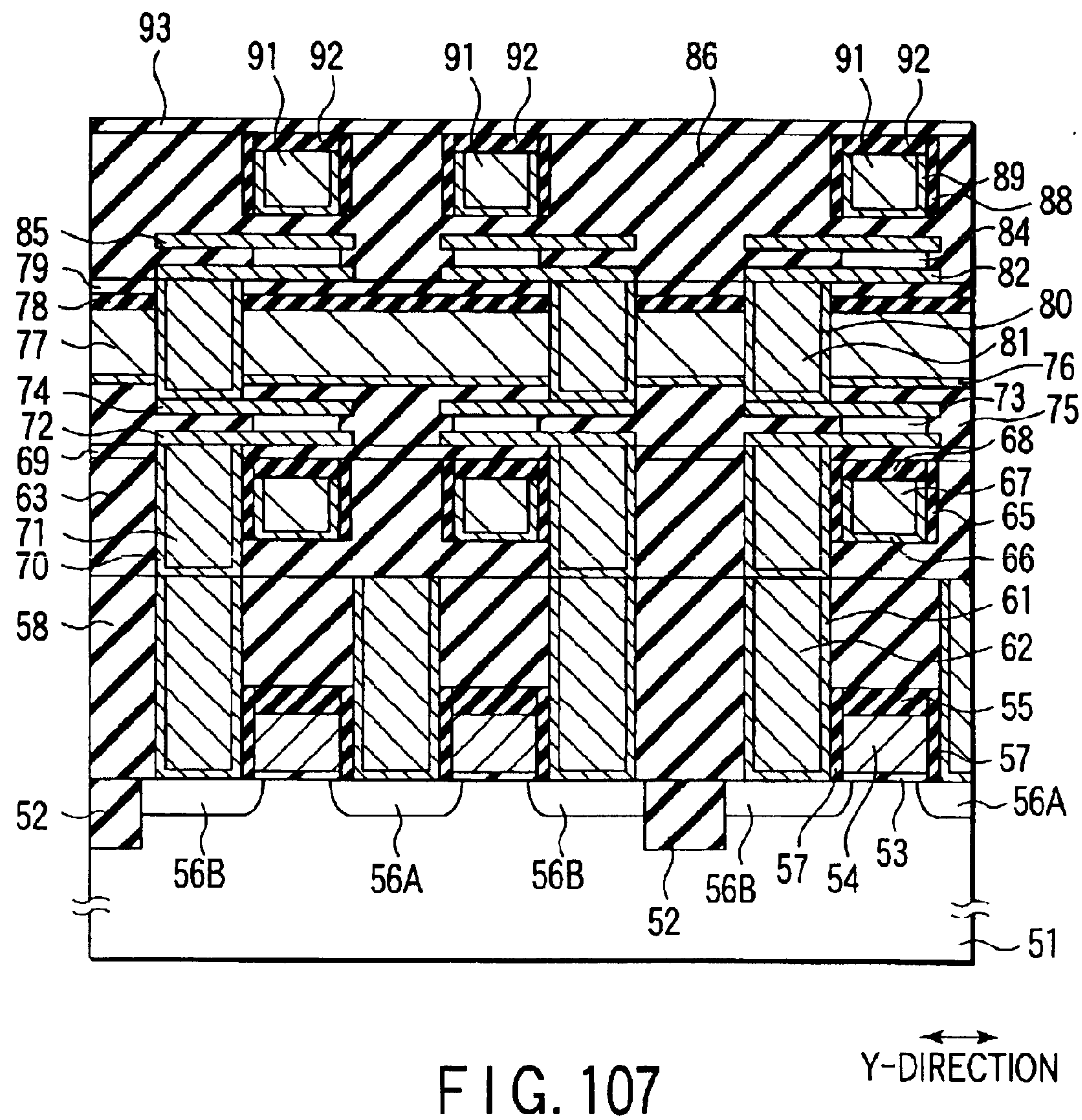
FIG. 107 is a sectional view showing one step in Manufacturing Method 1 of the present invention.

After that, as shown in FIG. 107, the metal layer 91 is polished by, e.g., CMP and left only in the interconnection trenches 87. The metal layer 91 remaining in each interconnection trench 87 forms a fourth interconnection layer that functions as a write word line.

An insulating layer (e.g., a silicon nitride layer) 92 is formed on the dielectric interlayer 86 by CVD. The insulating layer 92 is polished by CMP and left only on the metal layers 91 serving as the fourth interconnection layers. In addition, a dielectric interlayer (e.g., a silicon oxide layer) 93 that completely covers the metal layers 91 serving as the fourth interconnection layers is formed on the dielectric interlayer 86.

Step of Forming Lower Electrode of Third MTJ Element

Figure 109:
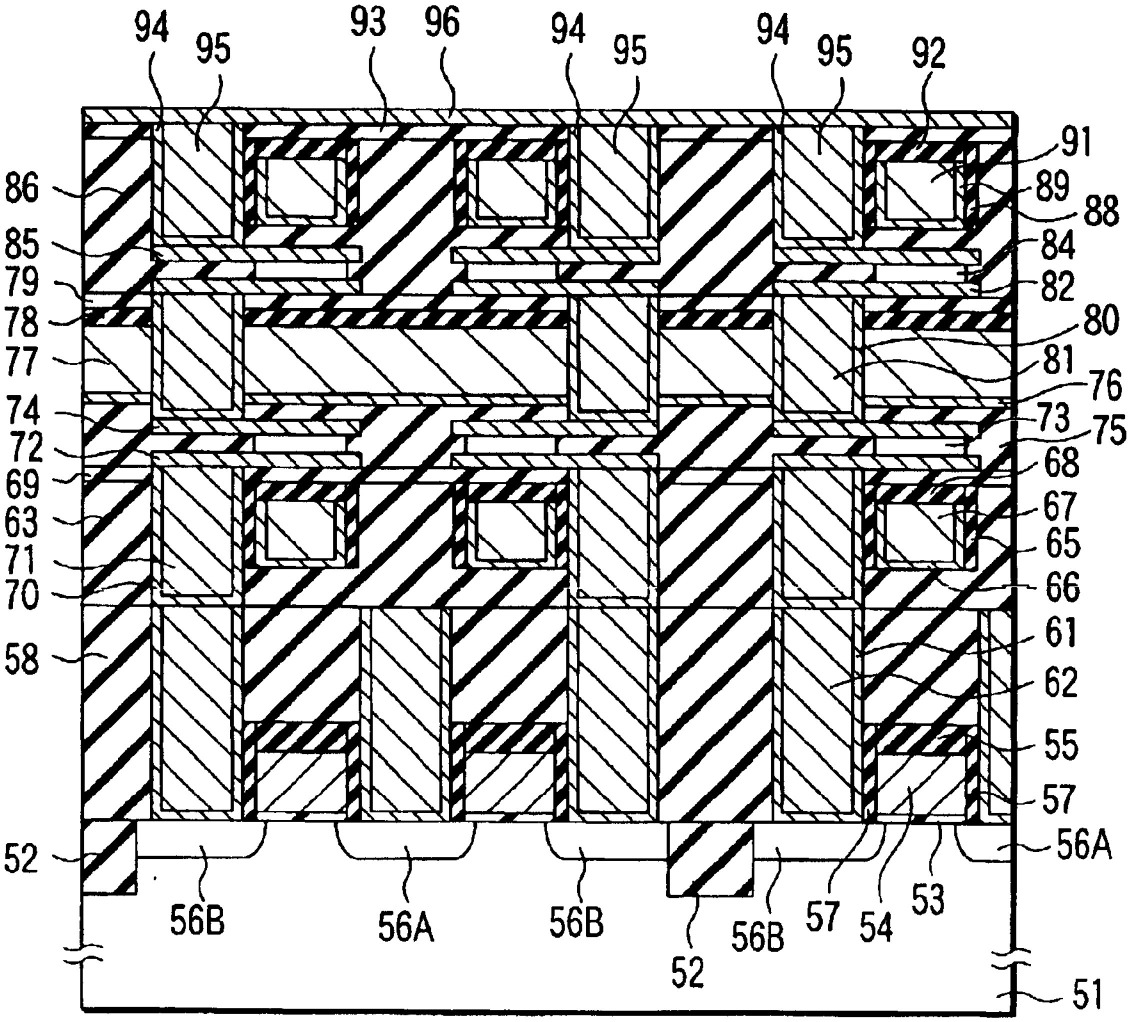
FIG. 109 is a sectional view taken along a line CIX—CIX in FIG. 108.

Next, as shown in FIGS. 108 and 109, contact holes that reach the upper electrodes 85 of the second MTJ elements are formed in the dielectric interlayers 86 and 93.

These contact holes can easily be formed by, e.g., forming a resist pattern on the dielectric interlayer 93 by PEP and etching the dielectric interlayers 86 and 93 by RIE using the resist pattern as a mask. After etching, the resist pattern is removed.

In addition, a barrier metal layer (e.g., a multilayer of Ti and TiN) 94 is formed on the inner surfaces of the contact holes by, e.g., sputtering. Subsequently, a metal layer (e.g., a W layer) 95 that completely fills the contact holes is formed on the barrier metal layer 94 by, e.g., sputtering.

After that, the metal layer 95 is polished by, e.g., CMP and left only in the contact holes. The metal layer 95 remaining in each contact hole forms a contact plug. In addition, a metal layer (e.g., a Ta layer) 96 serving as the lower electrodes of the third MTJ elements is formed on the dielectric interlayer 93 by sputtering.

Step of Forming Third MTJ Element and its Upper Electrode

Figure 110:
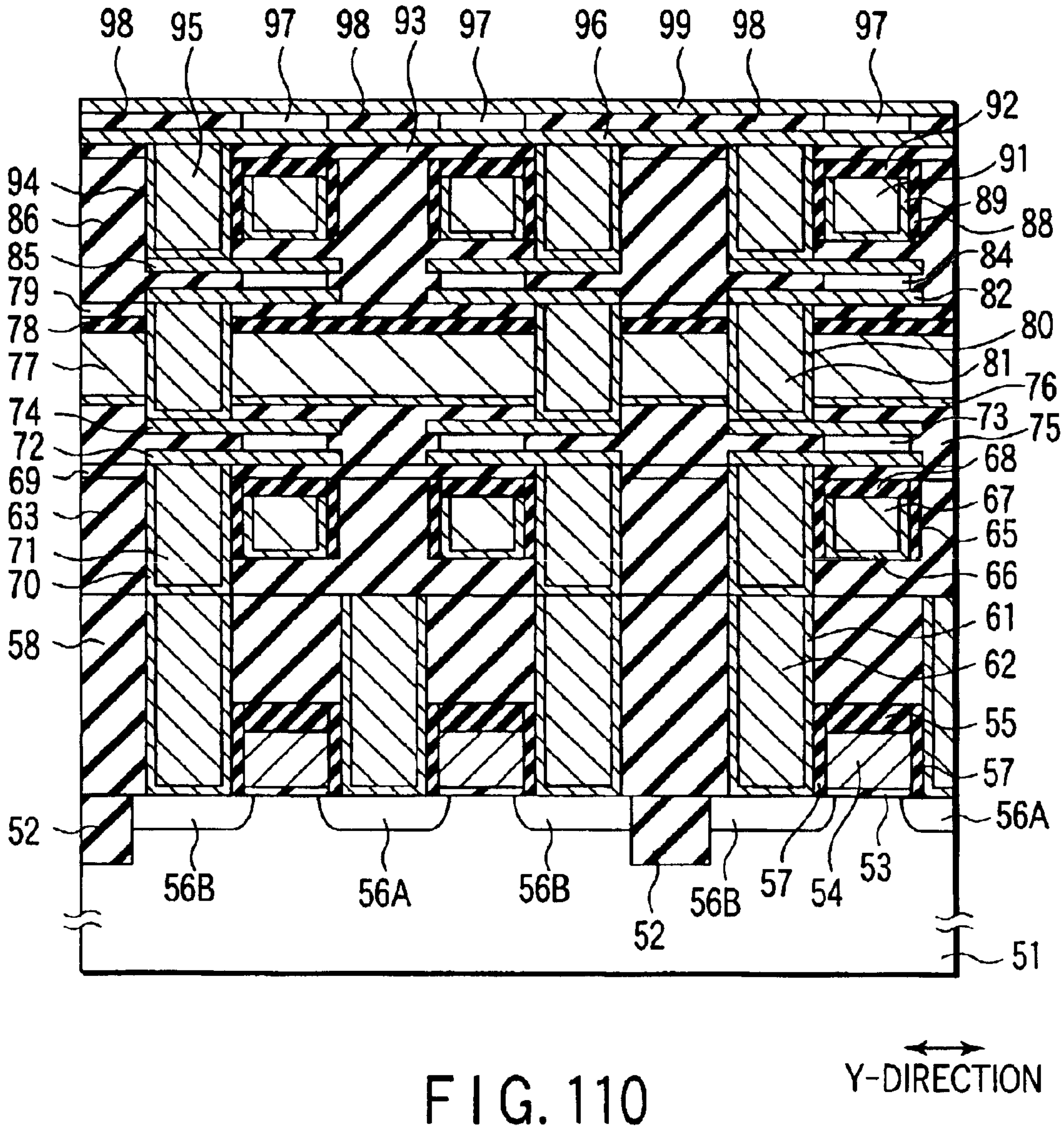
FIG. 110 is a sectional view showing one step in Manufacturing Method 1 of the present invention.

As shown in FIG. 110, third MTJ elements 97 are formed on the metal layer 96. Each third MTJ element 97 is formed from a tunneling barrier, two ferromagnetic layers that sandwich the tunneling barrier, and an antiferromagnetic layer and has, e.g., the structure as shown in FIG. 47.

A dielectric interlayer 98 (e.g., a silicon oxide layer) that completely covers the third MTJ elements 97 are formed by CVD. The dielectric interlayer 98 is polished by, e.g., CMP and left only between the third MTJ elements 97.

A metal layer 99 (e.g., a Ta layer) serving as the upper electrodes of the third MTJ elements 97 is formed on the dielectric interlayer 98 by sputtering.

Step of Pattering Lower and Upper Electrodes of Third MTJ Element

Figure 111:
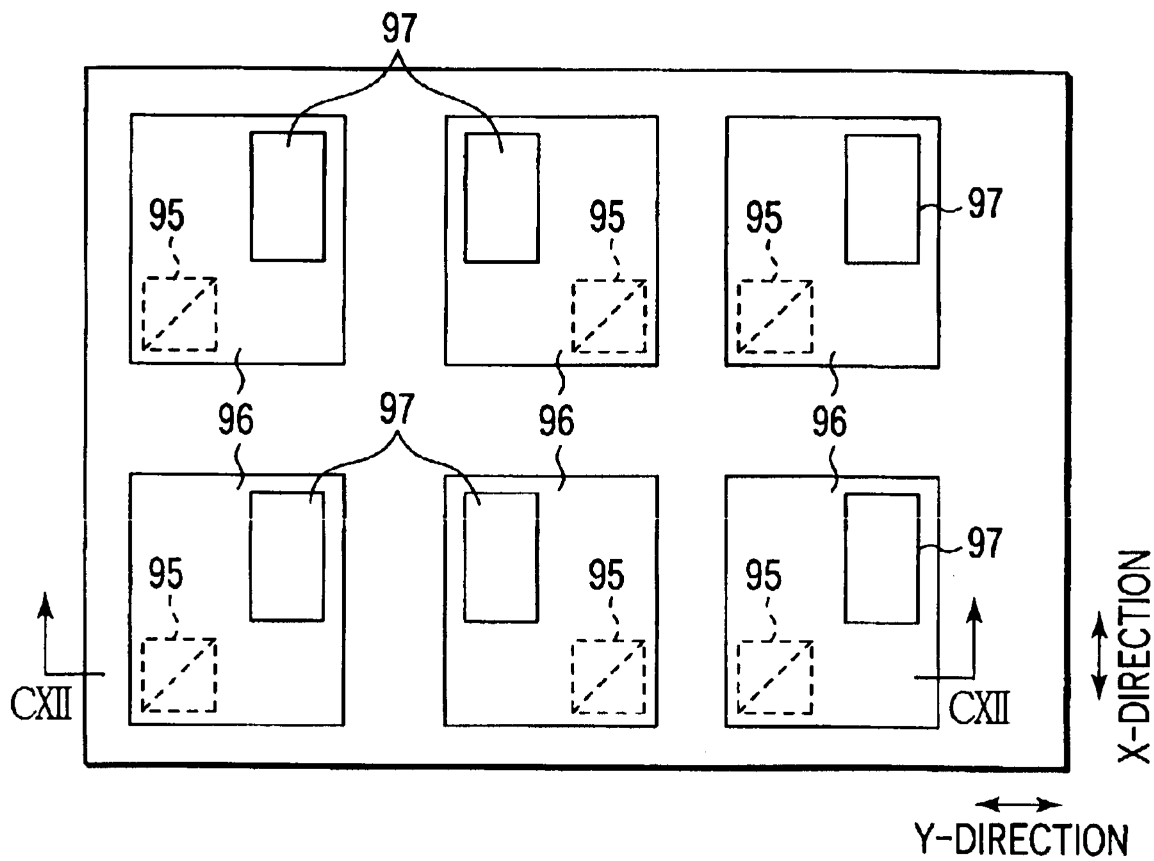
FIG. 111 is a plan view showing one step in Manufacturing Method 1 of the present invention.
Figure 112:
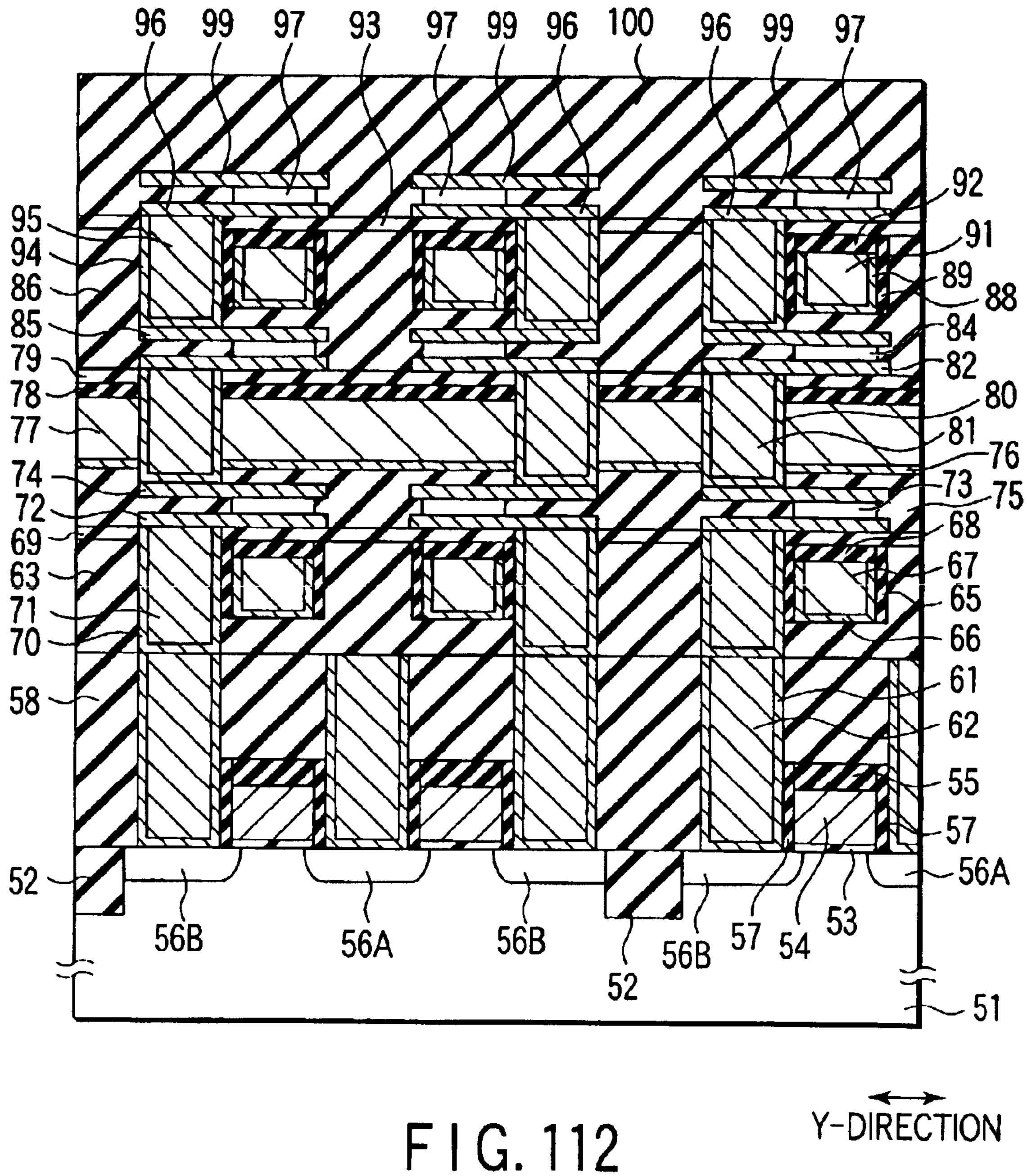
FIG. 112 is a sectional view taken along a line CXII—CXII in FIG. 111.

Next, as shown in FIGS. 111 and 112, the lower electrodes 96 and upper electrodes 99 of the third MTJ elements 97 are patterned.

The lower and upper electrodes 96 and 99 of the third MTJ elements 97 can easily be patterned by forming a resist pattern on the upper electrodes 99 by PEP and etching the lower and upper electrodes 96 and 99 by RIE using the resist pattern as a mask. Then, the resist pattern is removed.

A dielectric interlayer 100 that completely covers the upper electrodes 99 of the third MTJ elements 97 is formed by CVD.

Interconnection Trench Forming Step

Figure 113:
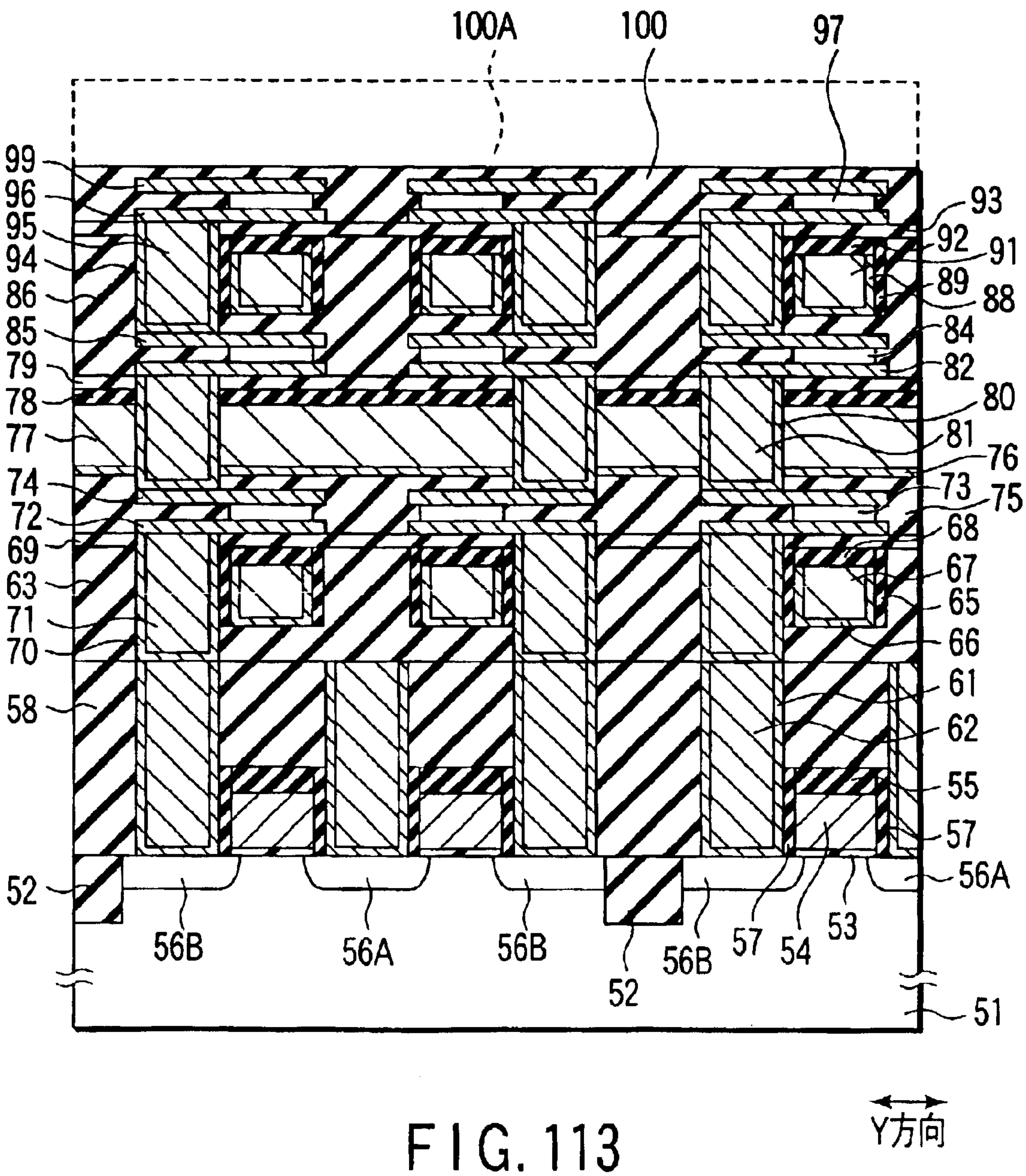
FIG. 113 is a sectional view showing one step in Manufacturing Method 1 of the present invention.

As shown in FIG. 113, interconnection trenches 100A are formed in the dielectric interlayer 100. In this example, the interconnection trenches 100A serve as trenches used to form write bit lines and extend in the Y-direction. Sidewall insulating layers (e.g., silicon nitride layers) for self-aligned contacts are formed on the side surfaces of the interconnection trenches 100A.

The interconnection trenches 100A can easily be formed by, e.g., forming a resist pattern on the dielectric interlayer 100 by PEP and etching the dielectric interlayer 100 by RIE using the resist pattern as a mask. After etching, the resist pattern is removed.

The sidewall insulating layers can easily be formed by forming an insulating film (e.g., a silicon nitride film) on the entire surface of the dielectric interlayer 100 by CVD and etching the insulating film by RIE.

Fifth Interconnection Layer Forming Step

Figure 114:
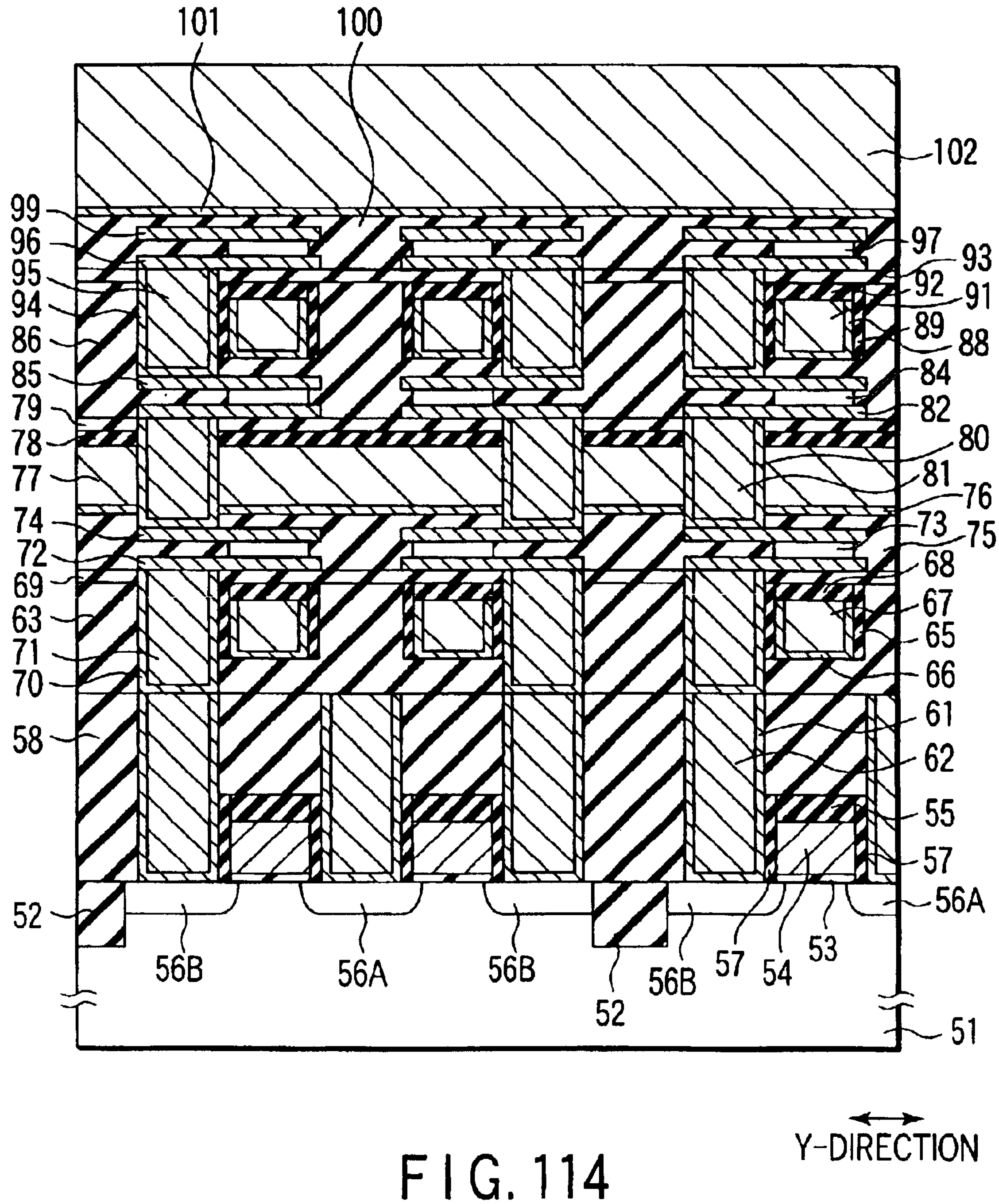
FIG. 114 is a sectional view showing one step in Manufacturing Method 1 of the present invention.

As shown in FIG. 114, a barrier metal layer (e.g., a multilayer of Ta and TaN) 101 is formed on the dielectric interlayer 100, the inner surfaces of the interconnection trenches 100A, and the sidewall insulating layers by, e.g., sputtering. Subsequently, a metal layer (e.g., a Cu layer) 102 that completely fills the interconnection trenches 100A is formed on the barrier metal layer 101 by, e.g., sputtering.

Figure 115:
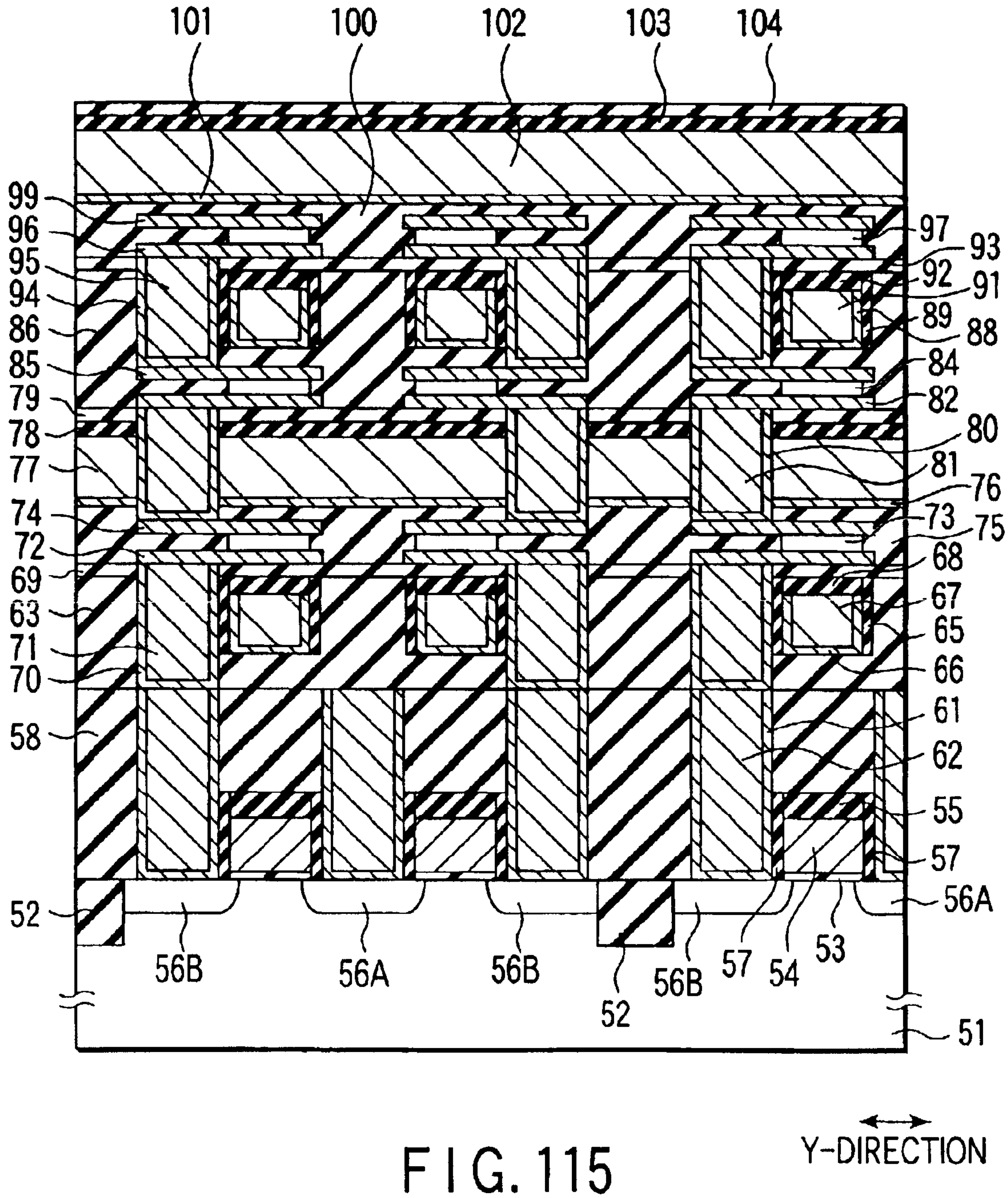
FIG. 115 is a sectional view showing one step in Manufacturing Method 1 of the present invention.

After that, as shown in FIG. 115, the metal layer 102 is polished by, e.g., CMP and left only in the interconnection trenches 100A. The metal layer 102 remaining in each interconnection trench 100A forms a fifth interconnection layer that functions as a write bit line.

An insulating layer (e.g., a silicon nitride layer) 103 is formed on the dielectric interlayer 100 by CVD. The insulating layer 103 is polished by CMP and left only on the metal layers 102 serving as the fifth interconnection layers. In addition, a dielectric interlayer (e.g., a silicon oxide layer) 104 that completely covers the metal layers 102 serving as the fifth interconnection layers is formed on the dielectric interlayer 100.

Step of Forming Lower Electrode of Fourth MTJ Element

Figure 116:
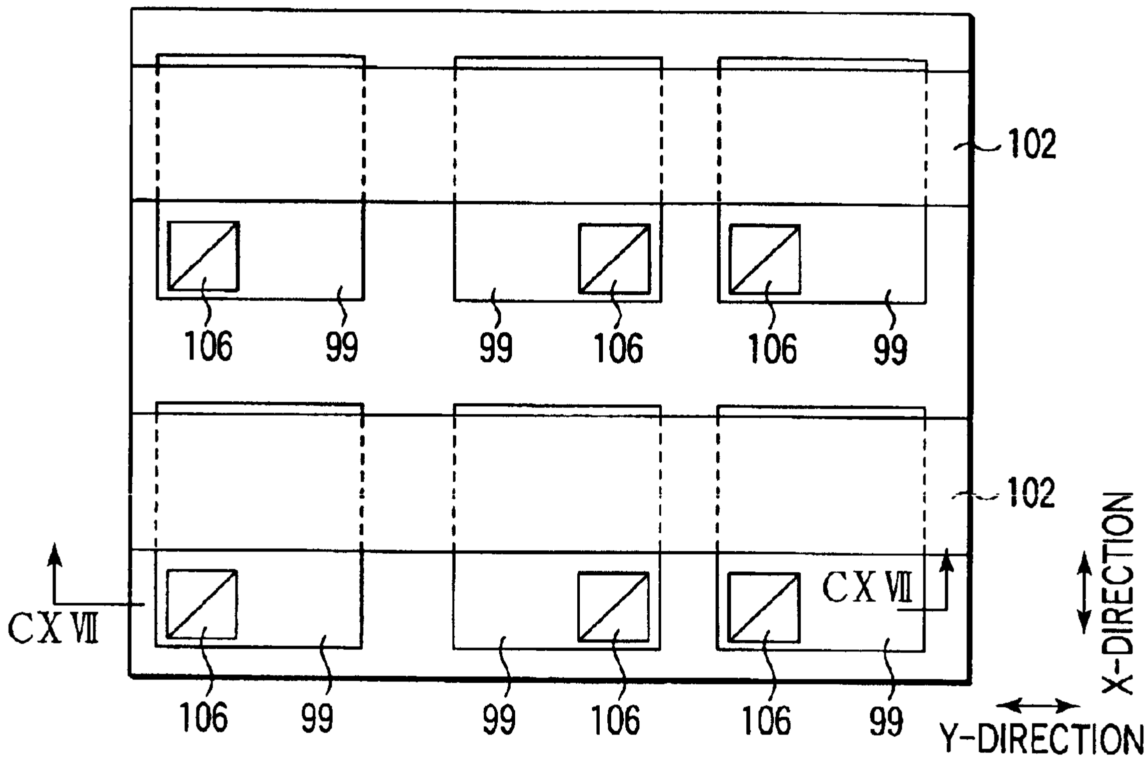
FIG. 116 is a plan view showing one step in Manufacturing Method 1 of the present invention.

Next, as shown in FIGS. 116 and 117, contact holes that reach the upper electrodes 99 of the third MTJ elements are formed in the dielectric interlayers 100 and 104.

These contact holes can easily be formed by, e.g., forming a resist pattern on the dielectric interlayer 104 by PEP and etching the dielectric interlayers 100 and 104 by RIE using the resist pattern as a mask. After etching, the resist pattern is removed.

In addition, a barrier metal layer (e.g., a multilayer of Ti and TiN) 105 is formed on the inner surfaces of the contact holes by, e.g., sputtering. Subsequently, a metal layer (e.g., a W layer) 106 that completely fills the contact holes is formed on the barrier metal layer 105 by, e.g., sputtering.

After that, the metal layer 106 is polished by, e.g., CMP and left only in the contact holes. The metal layer 106 remaining in each contact hole forms a contact plug. In addition, a metal layer (e.g., a Ta layers) 107 serving as the lower electrodes of the fourth MTJ elements is formed on the dielectric interlayer 104 by sputtering.

Step of Forming Fourth MTJ Element and its Upper Electrode

Figure 118:
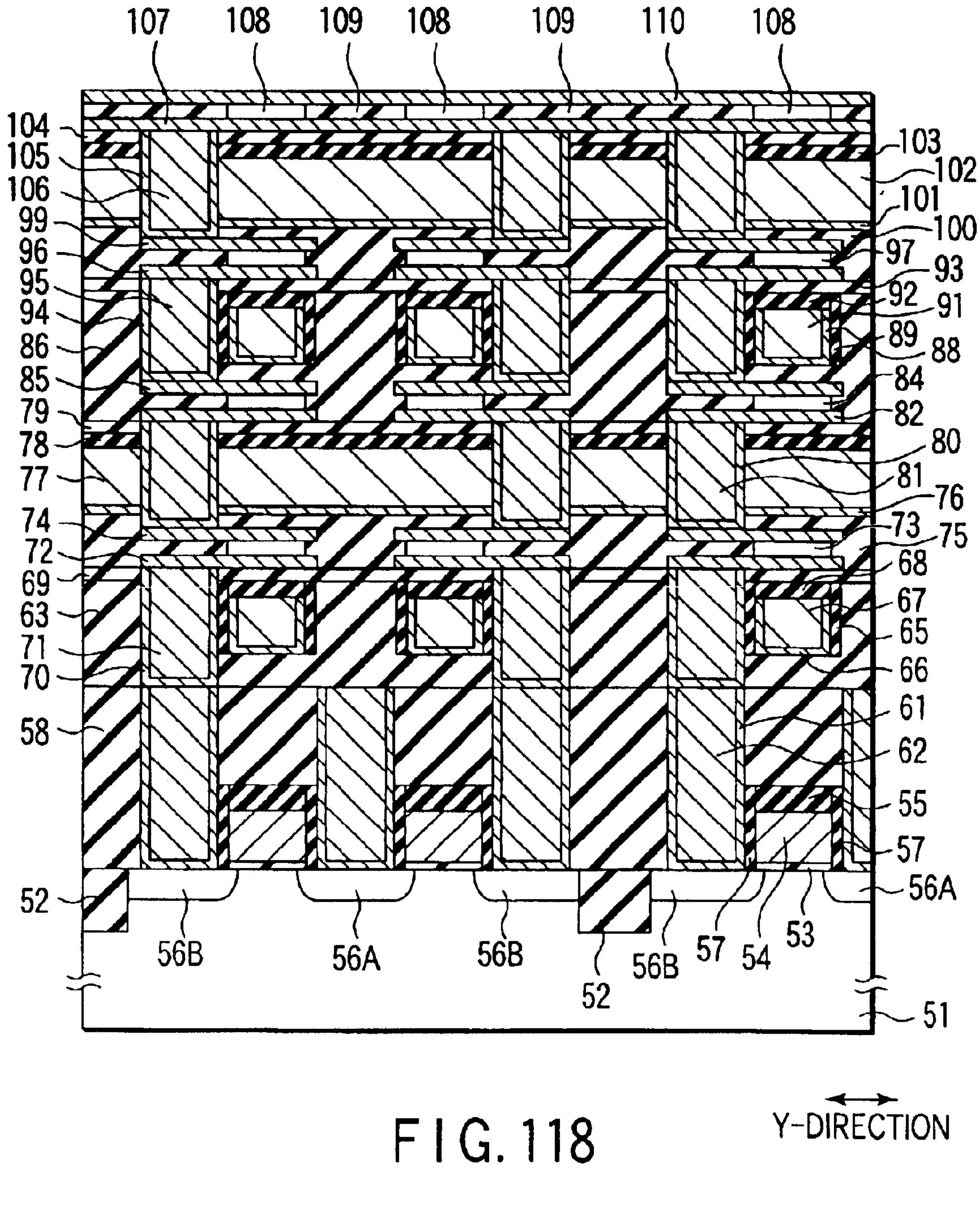
FIG. 118 is a sectional view showing one step in Manufacturing Method 1 of the present invention.

As shown in FIG. 118, fourth MTJ elements 108 are formed on the metal layer 107. Each fourth MTJ element 108 is formed from a tunneling barrier, two ferromagnetic layers that sandwich the tunneling barrier, and an antiferromagnetic layer and has, e.g., the structure as shown in FIG. 48.

A dielectric interlayer 109 (e.g., a silicon oxide layer) that completely covers the fourth MTJ elements 108 are formed by CVD. The dielectric interlayer 109 is polished by, e.g., CMP and left only between the fourth MTJ elements 108.

A metal layer 110 (e.g., a Ta layer) serving as the upper electrodes of the fourth MTJ elements 108 are formed on the dielectric interlayer 109 by sputtering.

Step of Pattering Lower and Upper Electrodes of Fourth MTJ Element

Figure 119:
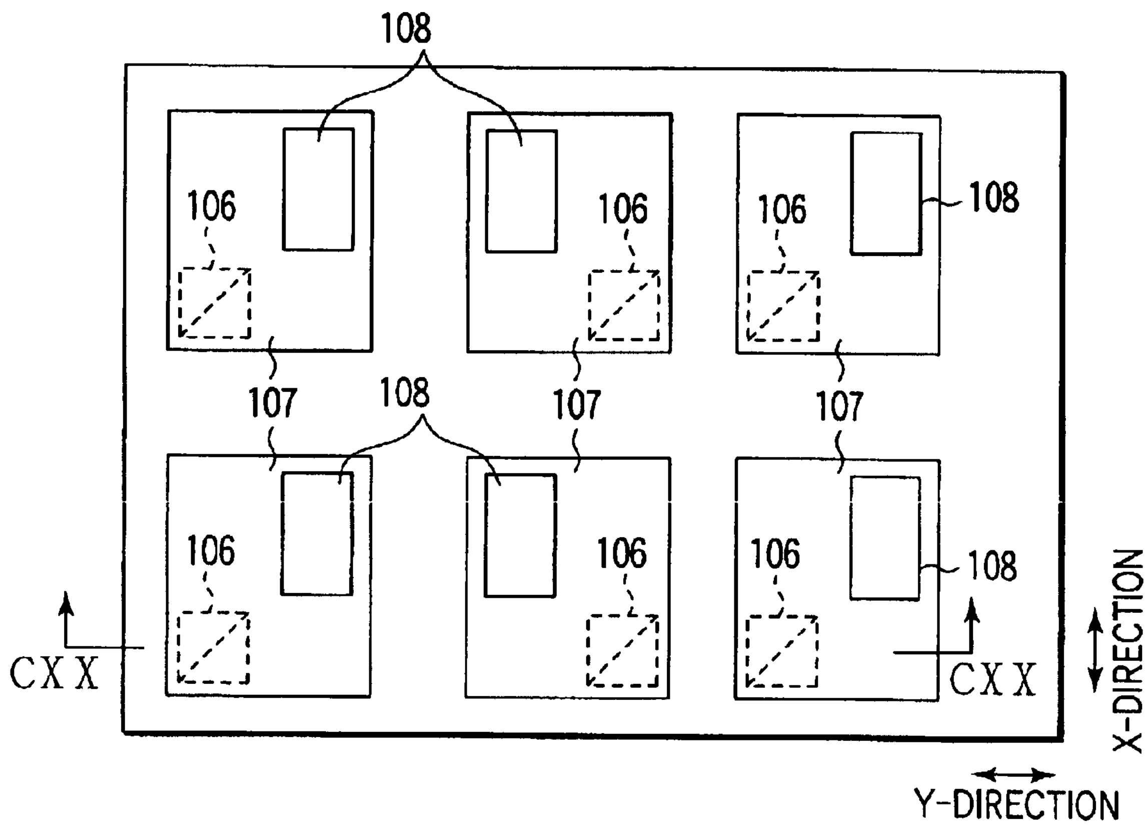
FIG. 119 is a plan view showing one step in Manufacturing Method 1 of the present invention.
Figure 120:
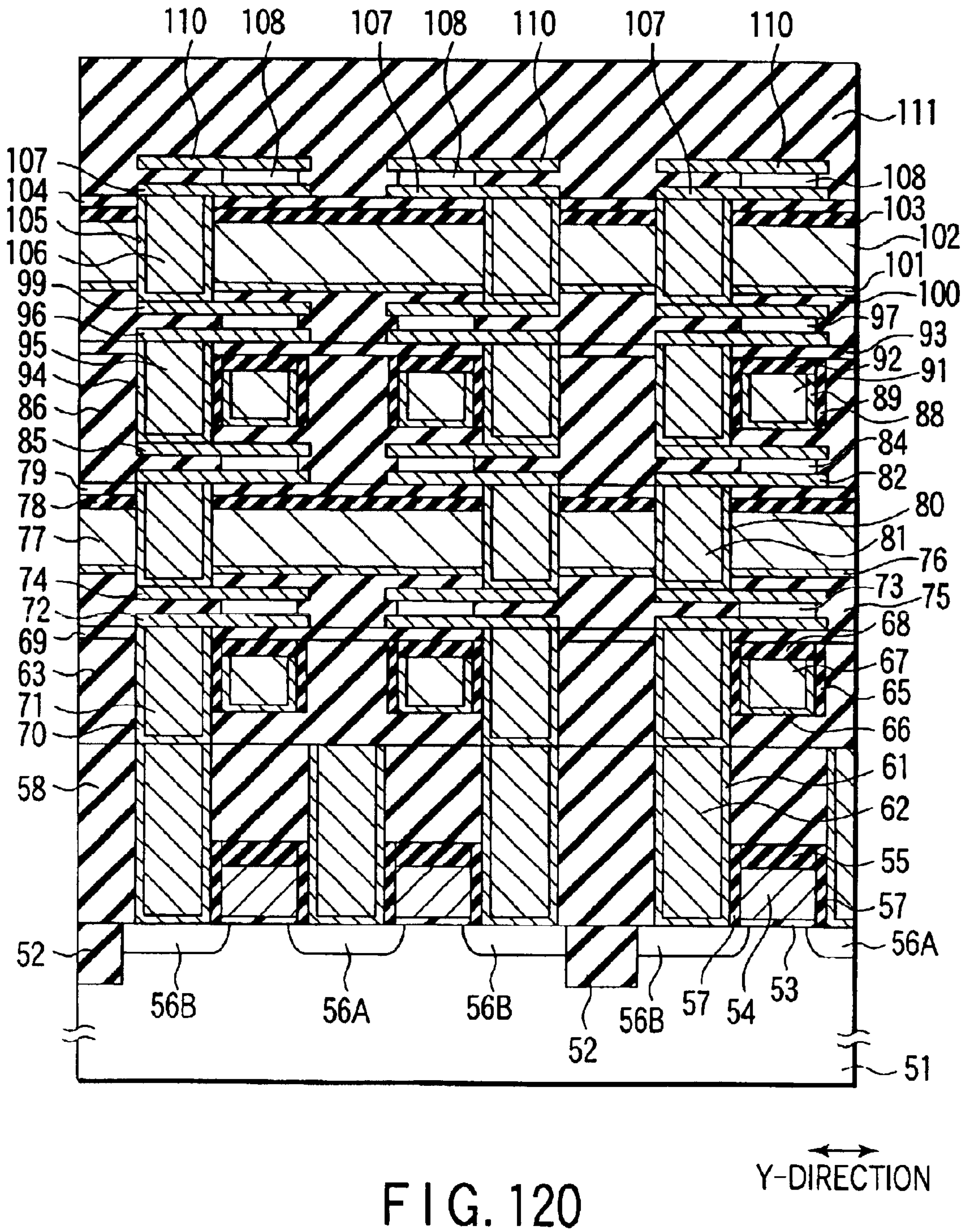

Next, as shown in FIGS. 119 and 120, the lower electrodes 107 and upper electrodes 110 of the fourth MTJ elements 108 are patterned.

The lower and upper electrodes 107 and 110 of the fourth MTJ elements 108 can easily be patterned by forming a resist pattern on the upper electrodes 110 by PEP and etching the lower and upper electrodes 107 and 110 by RIE using the resist pattern as a mask. Then, the resist pattern is removed.

A dielectric interlayer 111 that completely covers the upper electrodes 110 of the fourth MTJ elements 108 is formed by CVD.

Interconnection Trench Forming Step

Figure 121:
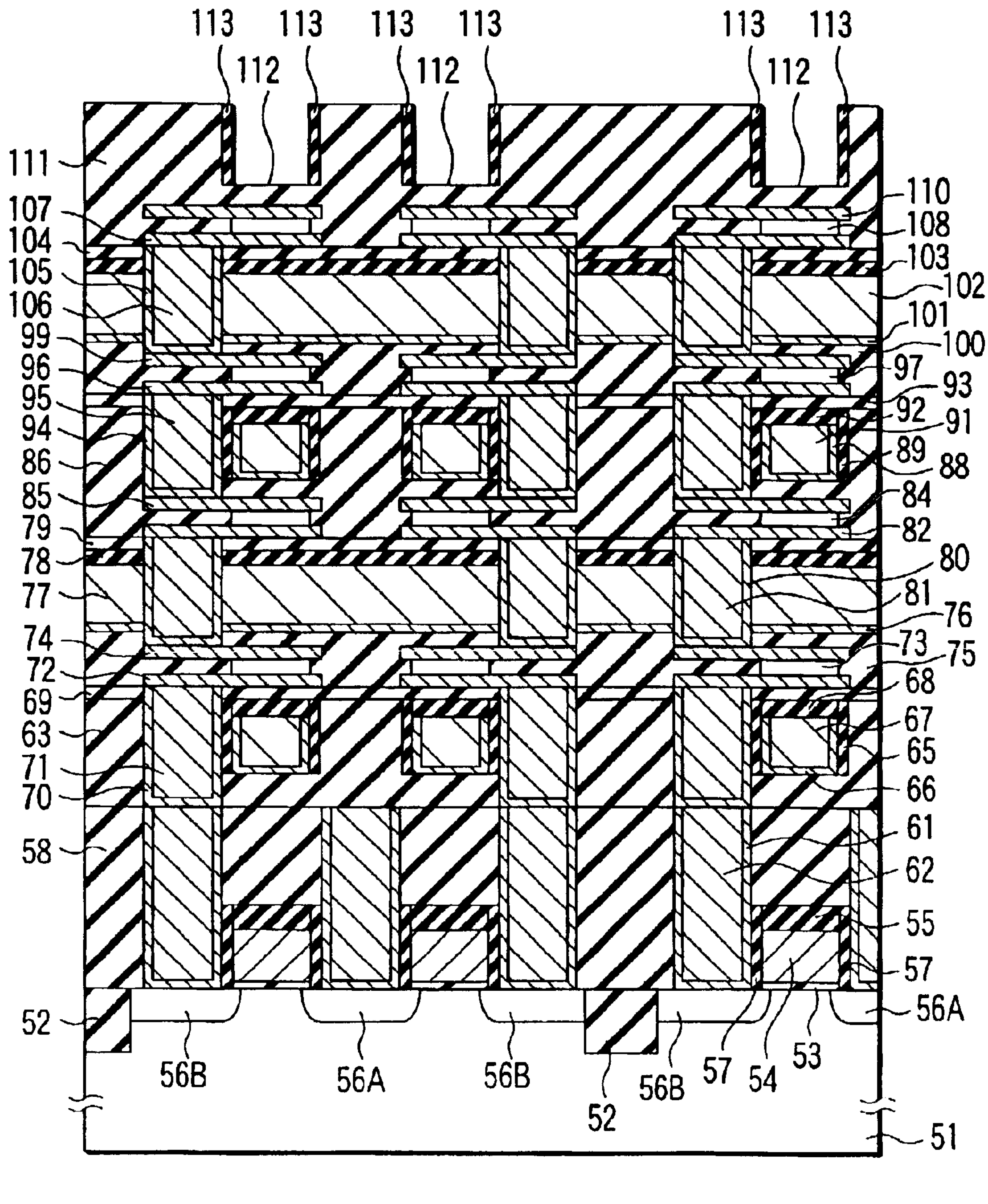

Next, as shown in FIG. 121, interconnection trenches 112 are formed in the dielectric interlayer 111. In this example, the interconnection trenches 112 serve as trenches used to form write word lines and extend in the X-direction. Sidewall insulating layers (e.g., silicon nitride layers) 113 for self-aligned contacts are formed on the side surfaces of the interconnection trenches 112.

The interconnection trenches 112 can easily be formed by, e.g., forming a resist pattern on the dielectric interlayer 111 by PEP and etching the dielectric interlayer 111 by RIE using the resist pattern as a mask. After etching, the resist pattern is removed.

The sidewall insulating layers 113 can easily be formed by forming an insulating film (e.g., a silicon nitride film) on the entire surface of the dielectric interlayer 111 by CVD and etching the insulating film by RIE.

Sixth Interconnection Layer Forming Step

Figure 122:
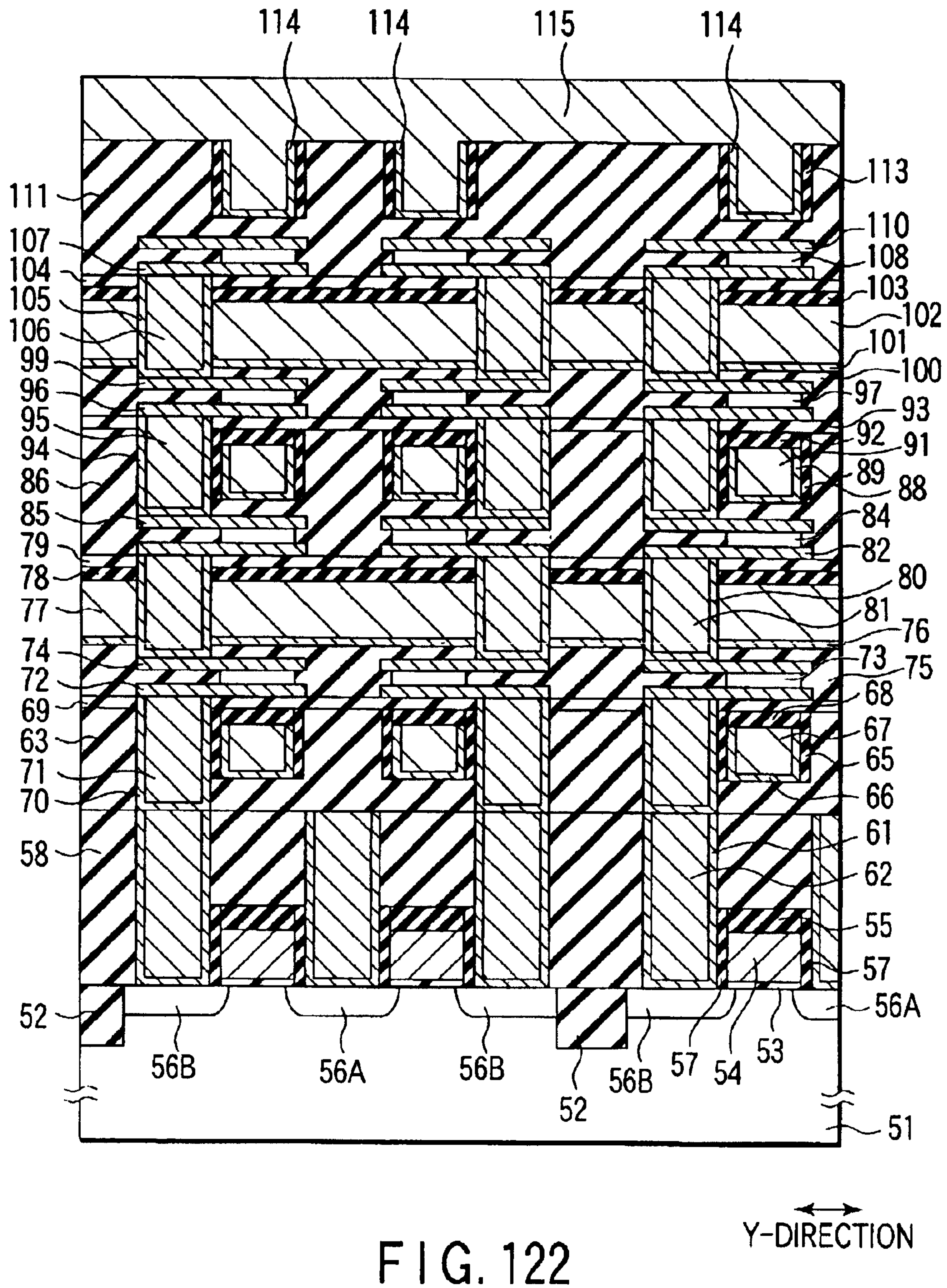

As shown in FIG. 122, a barrier metal layer (e.g., a multilayer of Ta and TaN) 114 is formed on the dielectric interlayer 111, the inner surfaces of the interconnection trenches 112, and the sidewall insulating layers 113 by, e.g., sputtering. Subsequently, a metal layer (e.g., a Cu layer) 115 that completely fills the interconnection trenches 112 is formed on the barrier metal layer 114 by, e.g., sputtering.

Figure 123:
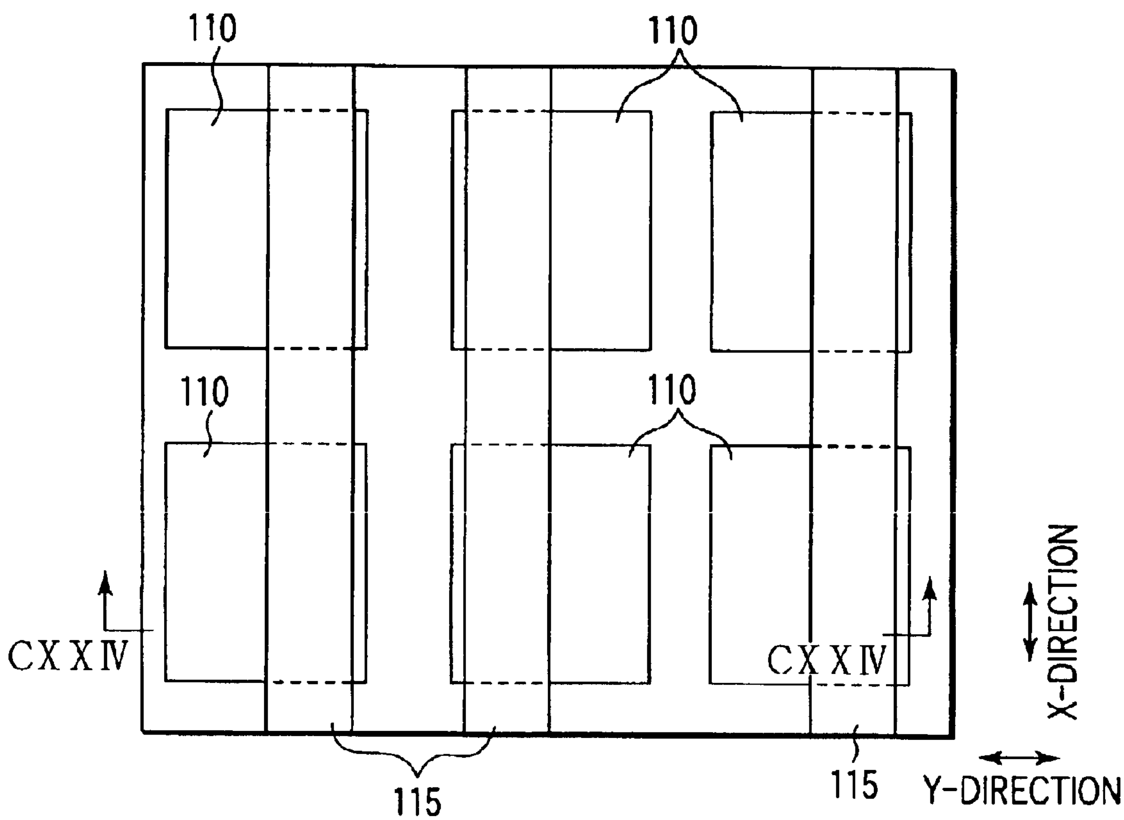

After that, as shown in FIGS. 123 and 124, the metal layer 115 is polished by, e.g., CMP and left only in the interconnection trenches 112. The metal layer 115 remaining in each interconnection trench 112 forms a sixth interconnection layer that functions as a write word line.

An insulating layer (e.g., a silicon nitride layer) 116 is formed on the dielectric interlayer 111 by CVD. The insulating layer 116 is polished by CMP and left only on the metal layers 115 serving as the sixth interconnection layers. In addition, a dielectric interlayer (e.g., a silicon oxide layer) 117 that completely covers the metal layers 115 serving as the sixth interconnection layers is formed on the dielectric interlayer 111.

Seventh Interconnection Layer Forming Step

Figure 126:
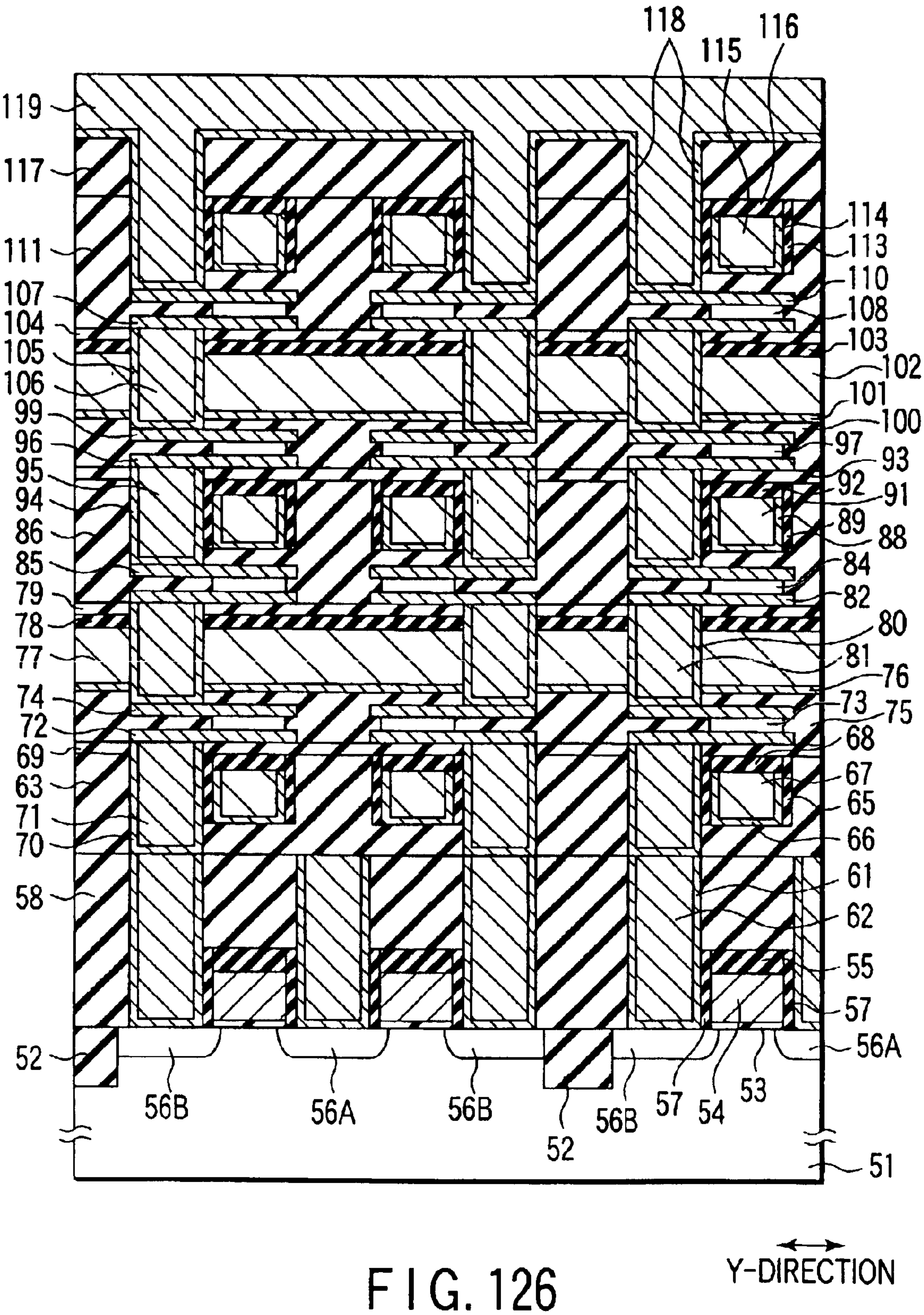

As shown in FIGS. 125 and 126, contact holes that reach the upper electrodes 110 of the fourth MTJ elements are formed in the dielectric interlayers 111 and 117.

These contact holes can easily be formed by, e.g., forming a resist pattern on the dielectric interlayer 117 by PEP and etching the dielectric interlayers 111 and 117 by RIE using the resist pattern as a mask. After etching, the resist pattern is removed.

In addition, interconnection trenches used to form read bit lines are formed in the dielectric interlayer 117.

The interconnection trenches can easily be formed by, e.g., forming a resist pattern on the dielectric interlayer 117 by PEP and etching the dielectric interlayer 117 by RIE using the resist pattern as a mask. After etching, the resist pattern is removed.

After that, a barrier metal layer (e.g., a multilayer of Ti and TiN) 118 is formed on the dielectric interlayer 117, the inner surfaces of the contact holes, and the inner surfaces of the interconnection trenches by, e.g., sputtering. Subsequently, a metal layer (e.g., a W layer) 119 that completely fills the contact holes and interconnection trenches is formed on the barrier metal layer 118 by, e.g., sputtering.

The metal layer 119 and barrier metal layer 118 are polished by, e.g., CMP and left only in the contact holes and interconnection trenches. The metal layer 119 remaining in each contact hole forms a contact plug. The metal layer 119 remaining in each interconnection trench forms a seventh interconnection layer that functions as a read bit line.

③ Conclusion

According to Manufacturing Method 1, a cell array structure (1-transistor n-MTJ structure) in which a plurality of TMR elements are stacked at a plurality of stages, and the plurality of TMR elements are connected in series between a read bit line and the ground terminal can be realized.

In this example, to form an interconnection layer, a damascene process and dual damascene process are employed. Instead, for example, a process of forming an interconnection layer by etching may be employed.

(2) Manufacturing Method 2

Manufacturing Method 2 is applied to a magnetic random access memory having a cell array structure (1-switch n-MTJ structure) in which a plurality of TMR elements are stacked at a plurality of stages, and the plurality of TMR elements are connected in parallel between a read bit line and the ground terminal.

The cell array structure completed by the manufacturing method of the present invention will be briefly described first. Then, the manufacturing method of the cell array structure will be described.

① Cell Array Structure Related to Manufacturing Method 2

Figure 127:
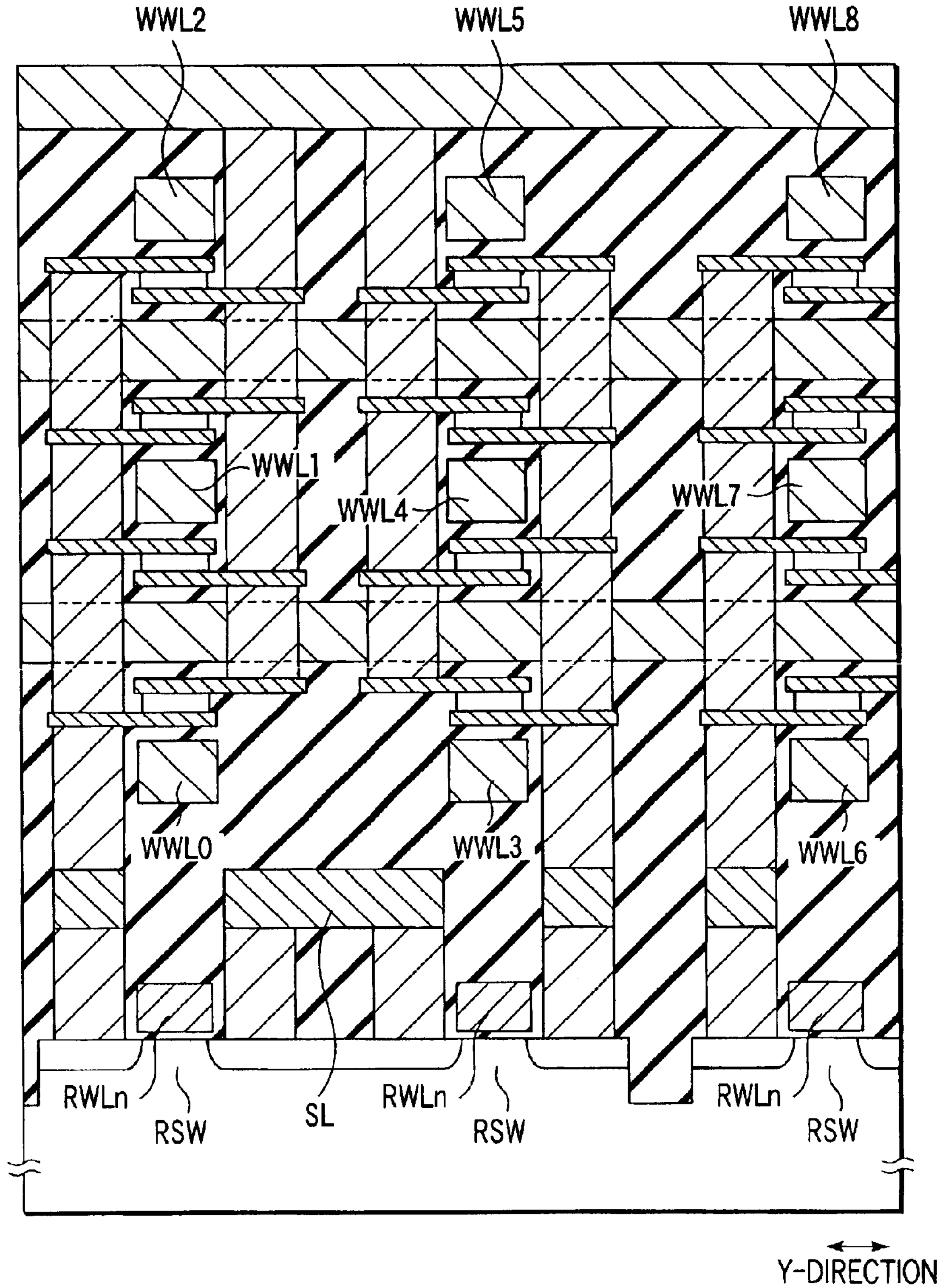

FIG. 127 is a view showing the cell array structure of a magnetic random access memory in which one block is formed from a plurality of TMR elements connected in parallel.

As a characteristic feature of this cell array structure, one read bit line is arranged in one column (Y-direction), and a plurality of TMR elements connected in parallel are arranged immediately under the read bit line. The plurality of TMR elements form one read block and are connected between the read bit line and the ground terminal.

A read select switch (MOS transistor) RSW is arranged on the surface region of a semiconductor substrate. The source of the read select switch RSW is connected to the ground terminal through a source line SL. The source line SL is shared by two read blocks adjacent in the column direction. The source line SL extends straight in, e.g., the X-direction (a direction perpendicular to the page surface).

The gate of the read select switch (MOS transistor) RSW serves as a read word line RWLn. The read word line RWLn extends in the X-direction. Four TMR elements (MTJ (Magnetic Tunnel Junction) elements) are stacked on the read select switch RSW.

Each TMR element is arranged between the lower electrode and the upper electrode. The TMR elements are connected in parallel through contact plugs. The lower electrode of the TMR element at the lowermost stage is connected to the drain of the read select switch (MOS transistor) RSW. The upper electrode of the TMR element at the uppermost stage is connected, through a contact plug, to a read bit line BL0 that extends in the Y-direction.

Three write word lines WWL0, WWL1, and WWL2 extending in the X-direction are present in one row. Two write bit lines BL00 and BL01 extending in the Y-direction are present in one column.

When the cell array structure is viewed from the upper side of the semiconductor substrate, for example, the plurality of TMR elements that are stacked are laid out to overlap each other. The three write word lines are also laid out to overlap each other. The read bit line and two write bit lines are also laid out to overlap each other.

The contact plugs for connecting the plurality of TMR elements in parallel are laid out not to overlap the write word lines and write bit lines. The upper and lower electrodes of the TMR elements are formed in a pattern that can easily come into contact with the contact plugs.

(2) Steps in Manufacturing Method 2

The manufacturing method for implementing the cell array structure shown in FIG. 127 will be described below. A detailed manufacturing method (e.g., employment of a dual damascene process) will be described here. Hence, note that elements that are not illustrated in the cell array structure of FIG. 127 will be mentioned. However, the outline of the finally completed cell array structure is almost the same as that shown in FIG. 127.

Element Isolation Step

Figure 128:
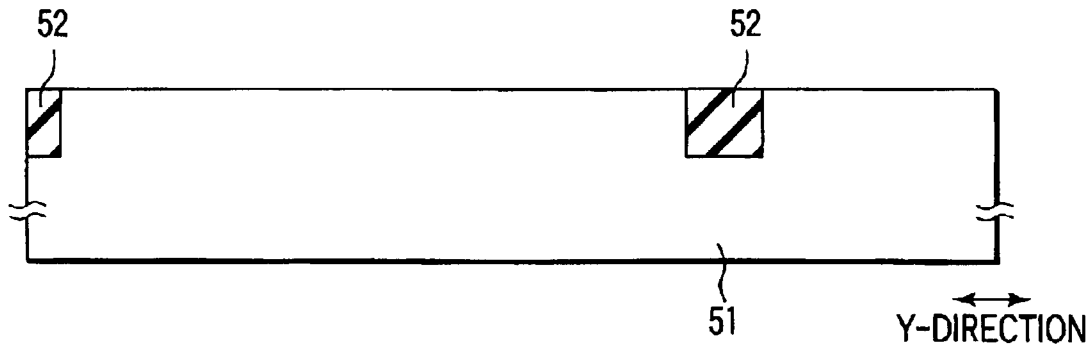

First, as shown in FIG. 128, the STI (Sallow Trench Isolation) structure 52, which is the shallow trenches are filled by field oxide for isolating active areas, is formed in the semiconductor substrate 51.

The STI structure 52 can be formed by, e.g., the following process.

A mask pattern (e.g., a silicon nitride film) is formed on the semiconductor substrate 51 by PEP (Photo Engraving Process). The semiconductor substrate 51 is etched by RIE (Reactive Ion Etching) using the mask pattern as a mask to form trenches in the semiconductor substrate 51. These trenches are filled with insulating films (for example, silicon oxzide films) using, e.g., CVD (Chemical Vapor Deposition) and CMP (Chemical Mechanical Polishing).

After that, p-type impurities (e.g., B or $BF_2$) or n-type impurities (e.g., P or As) are doped into the semiconductor substrate by, e.g., ion implantation, as needed, to form p-type well regions or n-type well regions.

MOSFET Forming Step

Figure 129:
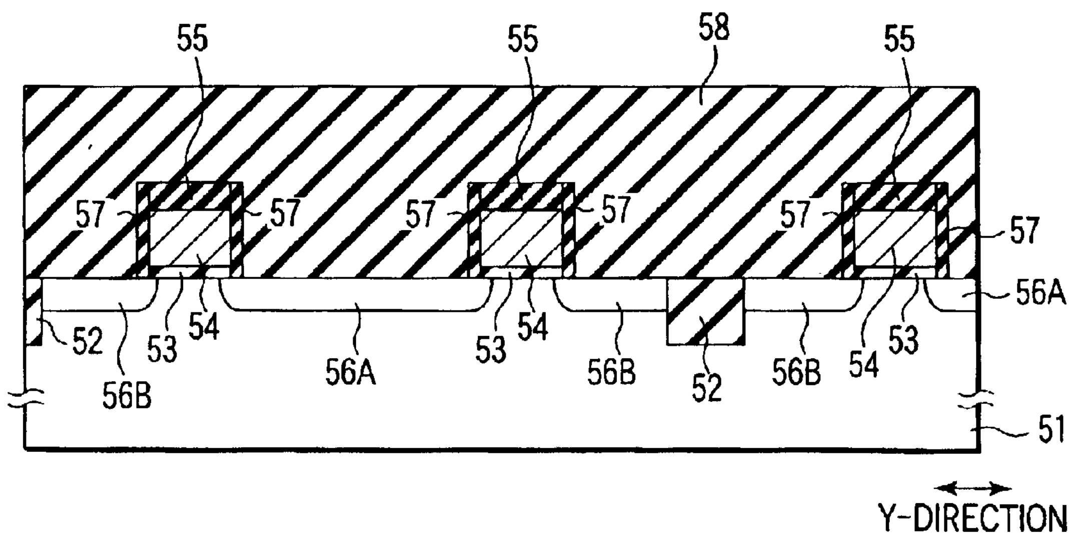

Next, as shown in FIG. 129, MOS transistors including read select switches are formed on the surface region of the semiconductor substrate 51.

The MOS transistor can be formed by, e.g., the following process.

Impurities for controlling the threshold value of the MOS transistor are ion-implanted into necessitate channel portions in active areas surrounding by field oxides 52. A gate insulating film (e.g., a silicon oxide film) 53 is formed on the active regions by thermal oxidation. A gate electrode material (e.g., polysilicon containing an impurity) and cap insulating film (e.g., a silicon nitride film) 55 are formed on the gate insulating film 53 by CVD.

The cap insulating film 55 is patterned by PEP. Then, the gate electrode material and gate insulating film 53 are processed (etched) by RIE using the cap insulating film 55 as a mask. As a consequence, gate electrodes 54 extending in the X-direction are formed on the semiconductor substrate 51.

P- or n-type impurities are doped into the semiconductor substrate 51 by ion implantation using the cap insulating films 55 and gate electrodes 54 as a mask. Lightly-doped impurity regions (LDD regions or extension regions) are formed in the semiconductor substrate.

An insulating film (e.g., a silicon nitride film) is formed on the entire surface of the semiconductor substrate 51 by CVD. After that, the insulating film is etched by RIE to form sidewall insulating layers 57 on the side surfaces of the gate electrodes 54 and cap insulating films 55. P- or n-type impurities are doped into the semiconductor substrate 51 by ion implantation using the cap insulating films 55, gate electrodes 54, and sidewall insulating layers 57 as a mask. As a result, source regions 56A and drain regions 56B are formed in the semiconductor substrate 51.

After that, a dielectric interlayer (e.g., a silicon oxide layer) 58 that completely covers the MOS transistors is formed on the entire surface of the semiconductor substrate 51 by CVD. In addition, the surface of the dielectric interlayer 58 is planarized by CMP.

Contact Hole Forming Step

Figure 130:
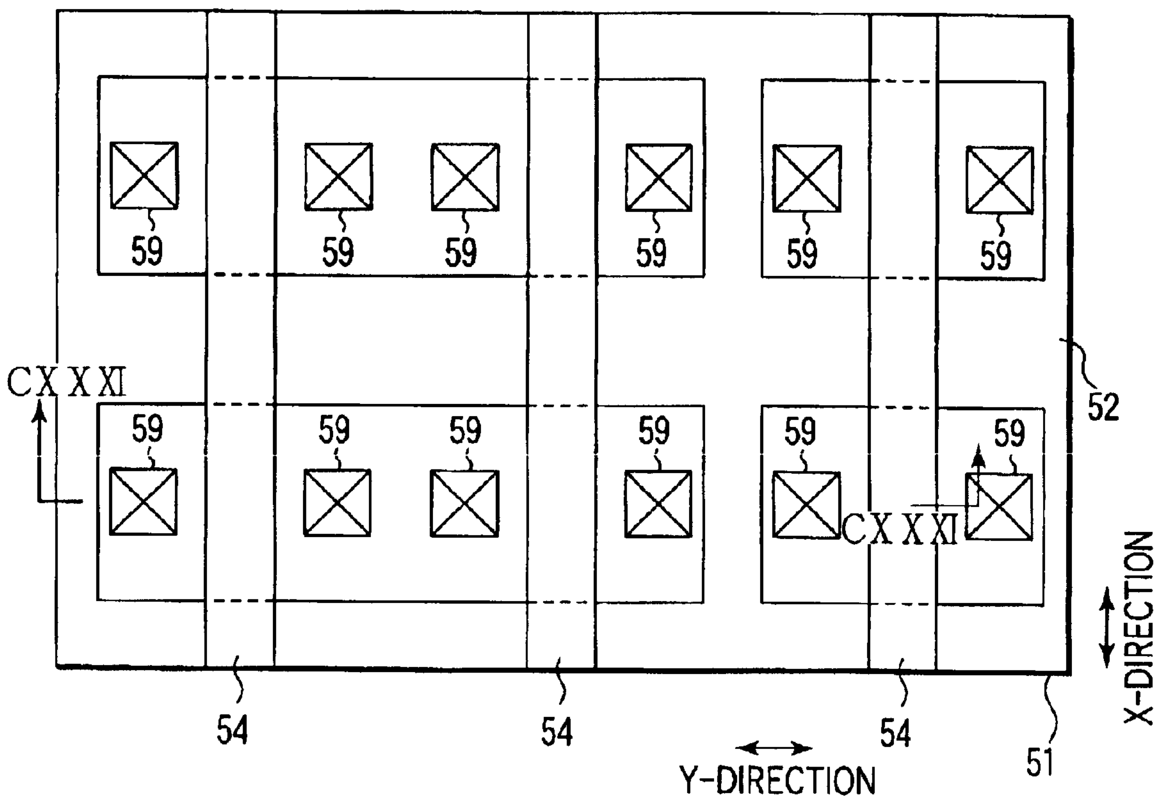
Figure 131:
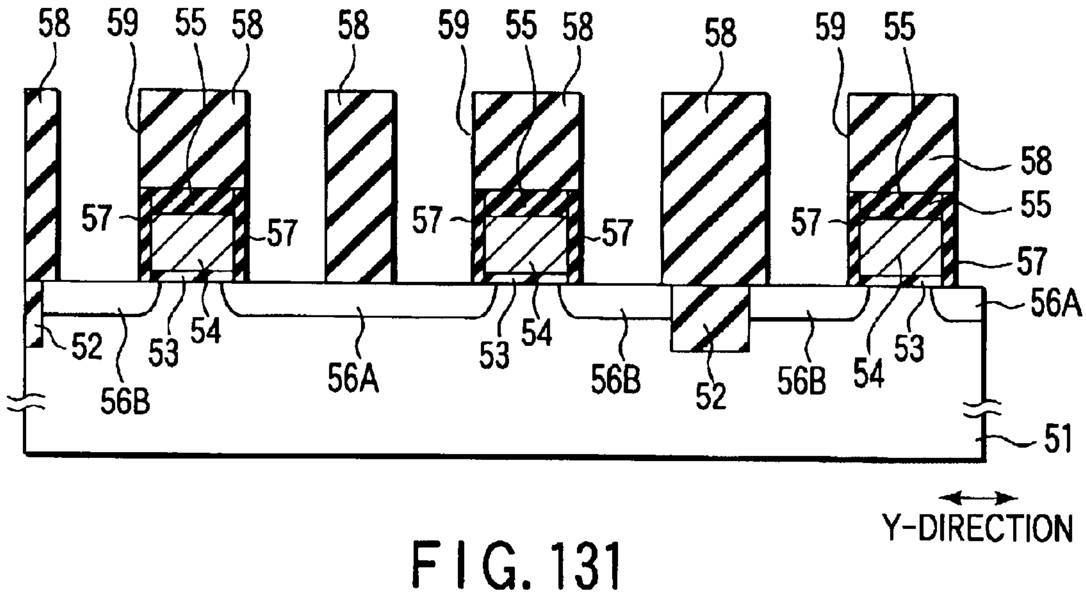

Next, as shown in FIGS. 130 and 131, contact holes 59 that reach the source regions 56A and drain regions 56B of MOS transistors are formed in the dielectric interlayer 58 on the semiconductor substrate 51.

The contact holes 59 can easily be formed by, e.g., forming a resist pattern on the dielectric interlayer 58 by PEP and etching the dielectric interlayer 58 by RIE using the resist pattern as a mark. After etching, the resist pattern is removed.

Interconnection Trench Forming Step

As shown in FIG. 132, interconnection trenches 60 are formed in the dielectric interlayer 58 on the semiconductor substrate 51. In this example, the interconnection trenches 60 extend in the X-direction. Hence, in the section along the Y-direction, the interconnection trenches 60 overlap the contact holes 59. The interconnection trenches 60 are indicated by broken lines in FIG. 132.

The interconnection trenches 60 can easily be formed by, e.g., forming a resist pattern on the dielectric interlayer 58 by PEP and etching the dielectric interlayer 58 by RIE using the resist pattern as a mark. After etching, the resist pattern is removed.

First Interconnection Layer Forming Step

As shown in FIG. 133, a barrier metal layer (e.g., a multilayer of Ti and TiN) 61 is formed on the dielectric interlayer 58, the inner surfaces of the contact holes 59, and the inner surfaces of the interconnection trenches 60 by, e.g., sputtering. Subsequently, a metal layer (e.g., a W layer) 62 that completely fills the contact holes 59 and interconnection trenches 60 is formed on the barrier metal layer 61 by, e.g., sputtering.

After that, as shown in FIG. 134, the metal layer 62 is polished by, e.g., CMP and left only in the contact holes 59 and interconnection trenches 60. The metal layer 62 remaining in each contact hole 59 forms a contact plug. The metal layer 62 remaining in each interconnection trench 60 forms a first interconnection layer. A dielectric interlayer (e.g., a silicon oxide layer) 63 is formed on the dielectric interlayer 58 by CVD.

The step comprising the contact hole forming step, the interconnection trench forming step, and the first interconnection layer forming step is called a dual damascene process.

Interconnection Trench Forming Step

Next, as shown in FIG. 135, interconnection trenches 64 are formed in the dielectric interlayer 63. In this example, the interconnection trenches 64 serve as trenches used to form write word lines and extend in the X-direction. Sidewall insulating layers (e.g., silicon nitride layers) 65 for self-aligned contacts are formed on the side surfaces of the interconnection trenches 64.

The interconnection trenches 64 can easily be formed by, e.g., forming a resist pattern on the dielectric interlayer 63 by PEP and etching the dielectric interlayer 63 by RIE using the resist pattern as a mask. After etching, the resist pattern is removed.

The sidewall insulating layers 65 can easily be formed by forming an insulating film (e.g., a silicon nitride film) on the entire surface of the dielectric interlayer 63 by CVD and etching the insulating film by RIE.

Second Interconnection Layer Forming Step

As shown in FIG. 136, a barrier metal layer (e.g., a multilayer of Ta and TaN) 66 is formed on the dielectric interlayer 63, the inner surfaces of the interconnection trenches 64, and the sidewall insulating layers 65 by, e.g., sputtering. Subsequently, a metal layer (e.g., a Cu layer) 67 that completely fills the interconnection trenches 64 is formed on the barrier metal layer 66 by, e.g., sputtering.

After that, as shown in FIG. 137, the metal layer 67 is polished by, e.g., CMP and left only in the interconnection trenches 64. The metal layer 67 remaining in each interconnection trench 64 forms a second interconnection layer that functions as a write word line.

An insulating layer (e.g., a silicon nitride layer) 68 is formed on the dielectric interlayer 63 by CVD. The insulating layer 68 is polished by CMP and left only on the metal layers 67 serving as the second interconnection layers. In addition, a dielectric interlayer (e.g., a silicon oxide layer) 69 that completely covers the metal layers 67 serving as the second interconnection layers is formed on the dielectric interlayer 63.

The step comprising the interconnection trench forming step and the second interconnection layer forming step is called a damascene process.

Step of Forming Lower Electrode of First MTJ Element

Next, as shown in FIGS. 138 and 139, contact holes that reach the metal layers 62 serving as the first interconnection layers are formed in the dielectric interlayer 69.

These contact holes can easily be formed by, e.g., forming a resist pattern on the dielectric interlayer 69 by PEP and etching the dielectric interlayers 63 and 69 by RIE using the resist pattern as a mask. After etching, the resist pattern is removed.

In addition, a barrier metal layer (e.g., a multilayer of Ti and TiN) 70 is formed on the inner surfaces of the contact holes by, e.g., sputtering. Subsequently, a metal layer (e.g., a W layer) 71 that completely fills the contact holes is formed on the barrier metal layer 70 by, e.g., sputtering.

After that, the metal layer 71 is polished by, e.g., CMP and left only in the contact holes. The metal layer 71 remaining in each contact hole forms a contact plug. In addition, a metal layer (e.g., a Ta layers) 72 serving as the lower electrodes of the first MTJ elements is formed on the dielectric interlayer 69 by sputtering.

Step of Forming First MTJ Element and its Upper Electrode

As shown in FIGS. 140 and 141, first MTJ elements 73 are formed on the metal layer 72. Each first MTJ element 73 is formed from a tunneling barrier, two ferromagnetic layers that sandwich the tunneling barrier, and an antiferromagnetic layer and has, e.g., the structure as shown in FIG. 45.

In this example, protective insulating layers (e.g., silicon oxide layers) 73A which protect the first MTJ elements 73 are formed on the side surfaces of the first MTJ elements 73. The protective insulating layers 73A can easily be formed on the side surfaces of the first MTJ elements 73 by CVD and RIE.

A dielectric interlayer (e.g., a silicon oxide layer) 75B that completely covers the first MTJ elements 73 is formed by CVD. The dielectric interlayer 75B is polished by, e.g., CMP and left only between the first MTJ elements 73.

As shown in FIG. 142, a metal layer 74 serving as the upper electrodes of the first MTJ elements 73 is formed on the dielectric interlayer 75B by sputtering. Subsequently, an alumina layer 74A which protects the first MTJ elements 73 is formed on the metal layer 74 by CVD.

After this, a resist pattern is formed by PEP. The alumina layer 74A, metal layer 74, and dielectric interlayer 75B are patterned using the resist pattern as a mask. Simultaneously, the surfaces of the metal layers 72 serving as the lower electrodes of the first MTJ elements 73 are exposed.

The alumina layer 74A is formed again and then is etched by RIE. The alumina layer 74A remains while covering the upper and side surfaces of the metal layers 74, i.e., upper electrodes, and the first MTJ elements 73.

After that, a dielectric interlayer 75 that completely covers the first MTJ elements 73 is formed by CVD.

Interconnection Trench Forming Step

As shown in FIG. 143, interconnection trenches 75A are formed in the dielectric interlayer 75 by RIE using, e.g., a resist pattern as a mask. At this time, the alumina layer 74A functions as an etching stopper. For this reason, the bottom portions of the interconnection trenches 75A do not reach the metal layers 74 and first MTJ elements 73.

In this example, the interconnection trenches 75A serve as trenches used to form write bit lines and extend in the Y-direction. Sidewall insulating layers (e.g., silicon nitride layers) for self-aligned contacts are formed on the side surfaces of the interconnection trenches 75A.

The interconnection trenches 75A can easily be formed by, e.g., forming a resist pattern on the dielectric interlayer 75 by PEP and etching the dielectric interlayer 75 by RIE using the resist pattern as a mask. After etching, the resist pattern is removed.

The sidewall insulating layers can easily be formed by forming an insulating film (e.g., a silicon nitride film) on the entire surface of the dielectric interlayer 75 by CVD and etching the insulating film by RIE.

Third Interconnection Layer Forming Step

As shown in FIG. 144, a barrier metal layer (e.g., a multilayer of Ta and TaN) 76 is formed on the dielectric interlayer 75, the inner surfaces of the interconnection trenches 75A, and the sidewall insulating layers by, e.g., sputtering. Subsequently, a metal layer (e.g., a Cu layer) 77 that completely fills the interconnection trenches 75A is formed on the barrier metal layer 76 by, e.g., sputtering.

After that, the metal layer 77 is polished by, e.g., CMP and left only in the interconnection trenches 75A. The metal layer 77 remaining in each interconnection trench 75A forms a third interconnection layer that functions as a write bit line.

An insulating layer (e.g., a silicon nitride layer) 78 is formed on the dielectric interlayer 75 by CVD. The insulating layer 78 is polished by CMP and left only on the metal layers 77 serving as the third interconnection layers. In addition, a dielectric interlayer (e.g., a silicon oxide layer) 79 that completely covers the metal layers 77 serving as the third interconnection layers is formed on the dielectric interlayer 75.

Step of Forming Lower Electrode of Second MTJ Element

Next, as shown in FIGS. 145 and 146, contact holes that reach the upper electrodes 74 of the first MTJ elements are formed in the dielectric interlayers 75 and 79 and alumina layers 74A.

These contact holes can easily be formed by, e.g., forming a resist pattern on the dielectric interlayer 79 by PEP and etching the dielectric interlayers 75 and 79 and alumina layers 74A by RIE using the resist pattern as a mask. After etching, the resist pattern is removed.

In addition, a barrier metal layer (e.g., a multilayer of Ti and TiN) 80 is formed on the inner surfaces of the contact holes by, e.g., sputtering. Subsequently, a metal layer (e.g., a W layer) 81 that completely fills the contact holes is formed on the barrier metal layer 80 by, e.g., sputtering.

After that, the metal layer 81 is polished by, e.g., CMP and left only in the contact holes. The metal layer 81 remaining in each contact hole forms a contact plug. In addition, a metal layer 82 serving as the lower electrodes of the second MTJ elements is formed on the dielectric interlayer 79 by sputtering.

Step of Forming Second MTJ Element and its Upper Electrode

As shown in FIGS. 147 and 148, second MTJ elements 84 are formed on the metal layer 82. Each second MTJ element 84 is formed from a tunneling barrier, two ferromagnetic layers that sandwich the tunneling barrier, and an antiferromagnetic layer and has, e.g., the structure as shown in FIG. 46.

In this example, protective insulating layers (e.g., silicon oxide layers) 83A which protect the second MTJ elements 84 are formed on the side surfaces of the second MTJ elements 84. The protective insulating layers 83A can easily be formed on the side surfaces of the second MTJ elements 84 by CVD and RIE.

After that, the lower electrodes 82 of the second MTJ elements 84 are patterned. The lower electrodes 82 of the second MTJ elements 84 can easily be patterned by forming a resist pattern on the lower electrodes 82 by PEP and etching the lower electrodes 82 by RIE using the resist pattern as a mask. Then, the resist pattern is removed.

Next, as shown in FIG. 149, an alumina layer 83B which protects the second MTJ elements 84 is formed on the second MTJ elements 84. Then, the alumina layer 83B is etched by RIE. As a result, the alumina layer 83B remains on the side surface of each second MTJ element 84.

A dielectric interlayer (e.g., a silicon oxide layer) 84B that completely covers the second MTJ elements 84 is formed by CVD. The dielectric interlayer 84B is polished by, e.g., CMP and left only between the second MTJ elements 84.

Contact holes that reach the lower electrodes 72 of the first MTJ elements are formed in the dielectric interlayers 75, 79, and 84B.

These contact holes can easily be formed by, e.g., forming a resist pattern on the dielectric interlayer 84B by PEP and etching the dielectric interlayers 75, 79, and 84B by RIE using the resist pattern as a mask. After etching, the resist pattern is removed.

In this etching step, the etching rate of the alumina layers 74A and 83B is set to be much lower than that of the dielectric interlayers 75, 79, and 84B.

That is, according to this example, even when the contact holes are misaligned, the first and second MTJ elements 73 and 84 are not etched because the alumina layers 74A and 83B protect the first and second MTJ elements 73 and 84.

As shown in FIG. 150, a barrier metal layer (e.g., a multilayer of Ti and TiN) 85A is formed on the inner surfaces of the contact holes by, e.g., sputtering. Subsequently, a metal layer (e.g., a W layer) 85B that completely fills the contact holes is formed on the barrier metal layer 85A by, e.g., sputtering.

After that, the metal layer 85B is polished by, e.g., CMP and left only in the contact holes. The metal layer 85B remaining in each contact hole forms a contact plug. In addition, a metal layer 85 serving as the upper electrodes of the second MTJ elements 84 is formed on the dielectric interlayer 84B by sputtering. Subsequently, an alumina layer 85C which protects the second MTJ elements 84 is formed on the metal layer 85 by CVD.

After that, as shown in FIG. 151, a resist pattern is formed by PEP. The alumina layer 85C and metal layer 85 are patterned using the resist pattern as a mask. The alumina layer 85C is formed again and then is etched by RIE. The alumina layer 85C remains while covering the upper and side surfaces of the metal layers 85, i.e., upper electrodes, and the second MTJ elements 84.

After that, a dielectric interlayer 86 that completely covers the second MTJ elements 84 is formed by CVD.

Interconnection Trench Forming Step

As shown in FIG. 152, interconnection trenches 87 are formed in the dielectric interlayer 86 by RIE using, e.g., a resist pattern as a mask. At this time, the alumina layer 85C functions as an etching stopper. For this reason, the bottom portions of the interconnection trenches 87 do not reach the metal layers 85 and second MTJ elements 84.

In this example, the interconnection trenches 87 serve as trenches used to form write bit lines and extend in the X-direction. Sidewall insulating layers (e.g., silicon nitride layers) 88 for self-aligned contacts are formed on the side surfaces of the interconnection trenches 87.

The interconnection trenches 87 can easily be formed by, e.g., forming a resist pattern on the dielectric interlayer 86 by PEP and etching the dielectric interlayer 86 by RIE using the resist pattern as a mask. After etching, the resist pattern is removed.

The sidewall insulating layers 88 can easily be formed by forming an insulating film (e.g., a silicon nitride film) on the entire surface of the dielectric interlayer 86 by CVD and etching the insulating film by RIE.

Fourth Interconnection Layer Forming Step

As shown in FIG. 153, a barrier metal layer (e.g., a multilayer of Ta and TaN) 89 is formed on the dielectric interlayer 86, the inner surfaces of the interconnection trenches 87, and the sidewall insulating layers 88 by, e.g., sputtering. Subsequently, a metal layer (e.g., a Cu layer) 90 that completely fills the interconnection trenches 87 is formed on the barrier metal layer 89 by, e.g., sputtering.

After that, the metal layer 90 is polished by, e.g., CMP and left only in the interconnection trenches 87. The metal layer 90 remaining in each interconnection trench 87 forms a fourth interconnection layer that functions as a write word line.

An insulating layer (e.g., a silicon nitride layer) 92 is formed on the dielectric interlayer 86 by CVD. The insulating layer 92 is polished by CMP and left only on the metal layers 90 serving as the fourth interconnection layers. In addition, a dielectric interlayer (e.g., a silicon oxide layer) 93 that completely covers the metal layers 90 serving as the fourth interconnection layers is formed on the dielectric interlayer 86.

Step of Forming Lower Electrode of Third MTJ Element

Next, as shown in FIGS. 154 and 155, contact holes that reach the upper electrodes 85 of the second MTJ elements 84 are formed in the dielectric interlayers 86 and 93.

These contact holes can easily be formed by, e.g., forming a resist pattern on the dielectric interlayer 93 by PEP and etching the dielectric interlayers 86 and 93 by RIE using the resist pattern as a mask. After etching, the resist pattern is removed.

In addition, a barrier metal layer (e.g., a multilayer of Ti and TiN) 94 is formed on the inner surfaces of the contact holes by, e.g., sputtering. Subsequently, a metal layer (e.g., a W layer) 95 that completely fills the contact holes is formed on the barrier metal layer 94 by, e.g., sputtering.

After that, the metal layer 95 is polished by, e.g., CMP and left only in the contact holes. The metal layer 95 remaining in each contact hole forms a contact plug. In addition, a metal layer 96 serving as the lower electrodes of the third MTJ elements is formed on the dielectric interlayer 93 by CVD.

Step of Forming Third MTJ Element and its Upper Electrode

As shown in FIGS. 156 and 157, third MTJ elements 97 are formed on the metal layer 96. Each third MTJ element 97 is formed from a tunneling barrier, two ferromagnetic layers that sandwich the tunneling barrier, and an antiferromagnetic layer and has, e.g., the structure as shown in FIG. 47.

In this example, protective insulating layers (e.g., silicon oxide layers) 97A which protect the third MTJ elements 97 are formed on the side surfaces of the third MTJ elements 97. The protective insulating layers 97A can easily be formed on the side surfaces of the third MTJ elements 97 by CVD and RIE.

After that, the lower electrodes 96 of the third MTJ elements 97 are patterned. The lower electrodes 96 of the third MTJ elements 97 can easily be patterned by forming a resist pattern on the lower electrodes 96 by PEP and etching the lower electrodes 96 by RIE using the resist pattern as a mask. Then, the resist pattern is removed.

As shown in FIG. 158, a dielectric interlayer (e.g., a silicon oxide layer) 98 that completely covers the third MTJ elements 97 is formed by CVD. The dielectric interlayer 98 is polished by, e.g., CMP and left only between the third MTJ elements 97.

After that, contact holes that reach the lower electrodes 82 of the second MTJ elements 84 are formed in the dielectric interlayers 86, 93, and 98.

These contact holes can easily be formed by, e.g., forming a resist pattern on the dielectric interlayer 98 by PEP and etching the dielectric interlayers 86, 93, and 98 by RIE using the resist pattern as a mask. After etching, the resist pattern is removed.

As shown in FIG. 159, a barrier metal layer (e.g., a multilayer of Ti and TiN) 99A is formed on the inner surfaces of the contact holes by, e.g., sputtering. Subsequently, a metal layer (e.g., a W layer) 99B that completely fills the contact holes is formed on the barrier metal layer 99A by, e.g., sputtering.

After that, the metal layer 99B is polished by, e.g., CMP and left only in the contact holes. The metal layer 99B remaining in each contact hole forms a contact plug. In addition, a metal layer 99 serving as the upper electrodes of the third MTJ elements is formed on the dielectric interlayer 98 by CVD.

In addition, an alumina layer 99C which protects the third MTJ elements 97 is formed on the upper electrodes 99 of the third MTJ elements 97 by CVD.

Next, as shown in FIG. 160, a resist pattern is formed by PEP. The alumina layer 99C and metal layer 99 are patterned using the resist pattern as a mask. The alumina layer 99C is formed again and then is etched by RIE. The alumina layer 99C remains while covering the upper and side surfaces of the metal layers 99, i.e., upper electrodes, and the third MTJ elements 97.

After that, a dielectric interlayer 100 that completely covers the third MTJ elements 97 is formed by CVD.

Interconnection Trench Forming Step

As shown in FIGS. 161 and 162, interconnection trenches that extend in the Y-direction are formed in the dielectric interlayer 100 by RIE using, e.g., a resist pattern as a mask. At this time, the alumina layer 99C functions as an etching stopper. For this reason, the bottom portions of the interconnection trenches do not reach the metal layers 99 and third MTJ elements 97.

In this example, the interconnection trenches serve as trenches used to form write bit lines and extend in the Y-direction. Sidewall insulating layers (e.g., silicon nitride layers) for self-aligned contacts are formed on the side surfaces of the interconnection trenches.

The interconnection trenches can easily be formed by, e.g., forming a resist pattern on the dielectric interlayer 100 by PEP and etching the dielectric interlayer 100 by RIE using the resist pattern as a mask. After etching, the resist pattern is removed.

The sidewall insulating layers can easily be formed by forming an insulating film (e.g., a silicon nitride film) on the entire surface of the dielectric interlayer 100 by CVD and etching the insulating film by RIE.

Fifth Interconnection Layer Forming Step

As shown in FIGS. 161 and 162, a barrier metal layer (e.g., a multilayer of Ta and TaN) 101 is formed on the dielectric interlayer 100, the inner surfaces of the interconnection trenches, and the sidewall insulating layers by, e.g., sputtering. Subsequently, a metal layer (e.g., a Cu layer) 102 that completely fills the interconnection trenches is formed on the barrier metal layer 101 by, e.g., sputtering.

After that, the metal layer 102 is polished by, e.g., CMP and left only in the interconnection trenches. The metal layer 102 remaining in each interconnection trench forms a fifth interconnection layer that functions as a write word line.

An insulating layer (e.g., a silicon nitride layer) 103 is formed on the dielectric interlayer 100 by CVD. The insulating layer 103 is polished by CMP and left only on the metal layers 102 serving as the fifth interconnection layers. In addition, a dielectric interlayer (e.g., a silicon oxide layer) 104 that completely covers the metal layers 102 serving as the fifth interconnection layers is formed on the dielectric interlayer 100.

Step of Forming Lower Electrode of Fourth MTJ Element

Next, as shown in FIGS. 163 and 164, contact holes that reach the upper electrodes 99 of the third MTJ elements 97 are formed in the dielectric interlayers 100 and 104 and alumina layers 99C.

These contact holes can easily be formed by, e.g., forming a resist pattern on the dielectric interlayer 104 by PEP and etching the dielectric interlayers 100 and 104 and alumina layers 99C by RIE using the resist pattern as a mask. After etching, the resist pattern is removed.

In addition, a barrier metal layer (e.g., a multilayer of Ti and TiN) 80X is formed on the inner surfaces of the contact holes by, e.g., sputtering. Subsequently, a metal layer (e.g., a W layer) 81X that completely fills the contact holes is formed on the barrier metal layer 80X by, e.g., sputtering.

After that, the metal layer 81X is polished by, e.g., CMP and left only in the contact holes. The metal layer 81X remaining in each contact hole forms a contact plug. In addition, a metal layer 107 serving as the lower electrodes of the fourth MTJ elements is formed on the dielectric interlayer 104 by sputtering.

Step of Forming Fourth MTJ Element and its Upper Electrode

As shown in FIGS. 163 and 164, fourth MTJ elements 108 are formed on the metal layer 107. Each fourth MTJ element 108 is formed from a tunneling barrier, two ferromagnetic layers that sandwich the tunneling barrier, and an antiferromagnetic layer and has, e.g., the structure as shown in FIG. 48.

In this example, protective insulating layers (e.g., silicon oxide layers) 108A which protect the fourth MTJ elements 108 are formed on the side surfaces of the fourth MTJ elements 108. The protective insulating layers 108A can easily be formed on the side surfaces of the fourth MTJ elements 108 by CVD and RIE.

After that, the lower electrodes 107 of the fourth MTJ elements 108 are patterned. The lower electrodes 107 of the fourth MTJ elements 108 can easily be patterned by forming a resist pattern on the lower electrodes 107 by PEP and etching the lower electrodes 107 by RIE using the resist pattern as a mask. Then, the resist pattern is removed.

Next, as shown in FIG. 165, an alumina layer 108B which protects the fourth MTJ elements 108 is formed on the fourth MTJ elements 108. Then, the alumina layer 108B is etched by RIE. As a result, the alumina layer 108B remains on the side surface of each fourth MTJ element 108.

A dielectric interlayer (e.g., a silicon oxide layer) 109 that completely covers the fourth MTJ elements 108 is formed by CVD. The dielectric interlayer 109 is polished by, e.g., CMP and left only between the fourth MTJ elements 108.

Contact holes that reach the lower electrodes 96 of the third MTJ elements 97 are formed in the dielectric interlayers 100, 104, and 109.

These contact holes can easily be formed by, e.g., forming a resist pattern on the dielectric interlayer 109 by PEP and etching the dielectric interlayers 100, 104, and 109 by RIE using the resist pattern as a mask. After etching, the resist pattern is removed.

In this etching step, the etching rate of the alumina layers 99C and 108B is set to be much lower than that of the dielectric interlayers 100, 104, and 109.

That is, according to this example, even when the contact holes are misaligned, the third and fourth MTJ elements 97 and 108 are not etched because the alumina layers 99C and 108B protect the third and fourth MTJ elements 97 and 108.

As shown in FIG. 166, a barrier metal layer (e.g., a multilayer of Ti and TiN) 105 is formed on the inner surfaces of the contact holes by, e.g., sputtering. Subsequently, a metal layer (e.g., a W layer) 106 that completely fills the contact holes is formed on the barrier metal layer 105 by, e.g., sputtering.

After that, the metal layer 106 is polished by, e.g., CMP and left only in the contact holes. The metal layer 106 remaining in each contact hole forms a contact plug. In addition, a metal layer 107 serving as the upper electrodes of the fourth MTJ elements 108 is formed on the dielectric interlayer 109 by sputtering. Subsequently, an alumina layer 107A which protects the fourth MTJ elements 108 is formed on the metal layer 107 by CVD.

Next, as shown in FIG. 167, a resist pattern is formed by PEP. The alumina layer 107A and metal layer 107 are patterned using the resist pattern as a mask.

The alumina layer 107A is formed again and then is etched by RIE. The alumina layer 107A remains while covering the upper and side surfaces of the metal layers 107, i.e., upper electrodes, and the fourth MTJ elements 108.

After that, a dielectric interlayer 111 that completely covers the fourth MTJ elements 108 is formed by CVD.

Interconnection Trench Forming Step

As shown in FIGS. 168 and 169, interconnection trenches 112 that extend in the X-direction are formed in the dielectric interlayer 111 by RIE using, e.g., a resist pattern as a mask. At this time, the alumina layer 107A functions as an etching stopper. For this reason, the bottom portions of the interconnection trenches 112 do not reach the metal layers 107 and fourth MTJ elements 108.

In this example, the interconnection trenches 112 serve as trenches used to form write bit lines and extend in the X-direction. Sidewall insulating layers (e.g., silicon nitride layers) 113 for self-aligned contacts are formed on the side surfaces of the interconnection trenches 112.

The interconnection trenches 112 can easily be formed by, e.g., forming a resist pattern on the dielectric interlayer 111 by PEP and etching the dielectric interlayer 111 by RIE using the resist pattern as a mask. After etching, the resist pattern is removed.

The sidewall insulating layers 113 can easily be formed by forming an insulating film (e.g., a silicon nitride film) on the entire surface of the dielectric interlayer 111 by CVD and etching the insulating film by RIE.

Sixth Interconnection Layer Forming Step

As shown in FIGS. 168 and 169, a barrier metal layer (e.g., a multilayer of Ta and TaN) 114 is formed on the dielectric interlayer 111, the inner surfaces of the interconnection trenches 112, and the sidewall insulating layers 113 by, e.g., sputtering. Subsequently, a metal layer (e.g., a Cu layer) 115 that completely fills the interconnection trenches 112 is formed on the barrier metal layer 114 by, e.g., sputtering.

After that, the metal layer 115 is polished by, e.g., CMP and left only in the interconnection trenches 112. The metal layer 115 remaining in each interconnection trench 112 forms a sixth interconnection layer that functions as a write word line.

An insulating layer (e.g., a silicon nitride layer) 116 is formed on the dielectric interlayer 111 by CVD. The insulating layer 116 is polished by CMP and left only on the metal layers 115 serving as the sixth interconnection layers.

Seventh Interconnection Layer Forming Step

Next, as shown in FIGS. 170 and 171, a dielectric interlayer (e.g., a silicon oxide layer) 117 that completely covers the metal layers 115 serving as the sixth interconnection layers is formed on the dielectric interlayer 111. Contact holes that reach the lower electrodes 107 of the fourth MTJ elements are formed in the dielectric interlayers 111 and 117.

These contact holes can easily be formed by, e.g., forming a resist pattern on the dielectric interlayer 117 by PEP and etching the dielectric interlayers 111 and 117 by RIE using the resist pattern as a mask. After etching, the resist pattern is removed.

In addition, interconnection trenches used to form read bit lines are formed in the dielectric interlayer 117.

The interconnection trenches can easily be formed by, e.g., forming a resist pattern on the dielectric interlayer 117 by PEP and etching the dielectric interlayer 117 by RIE using the resist pattern as a mask. After etching, the resist pattern is removed.

After that, a barrier metal layer (e.g., a multilayer of Ti and TiN) 118 is formed on the dielectric interlayer 117, the inner surfaces of the contact holes, and the inner surfaces of the interconnection trenches by, e.g., sputtering. Subsequently, a metal layer (e.g., a W layer) 119 that completely fills the contact holes and interconnection trenches is formed on the barrier metal layer 118 by, e.g., sputtering.

The metal layer 119 and barrier metal layer 118 are polished by, e.g., CMP and left only in the contact holes and interconnection trenches. The metal layer 119 remaining in each contact hole forms a contact plug. The metal layer 119 remaining in each interconnection trench forms a seventh interconnection layer that functions as a read bit line.

③ Conclusion

According to Manufacturing Method 2, a cell array structure (1-transistor n-MTJ structure) in which a plurality of TMR elements are stacked at a plurality of stages, and the plurality of TMR elements are connected in parallel between a read bit line and the ground terminal can be realized.

In this example, to form an interconnection layer, a damascene process and dual damascene process are employed. Instead, for example, a process of forming an interconnection layer by etching may be employed.

(3) Manufacturing Method 3

Manufacturing Method 3 is applied to a magnetic random access memory having a cell array structure (1-switch n-MTJ structure) in which a plurality of TMR elements are stacked at a plurality of stages, and the plurality of TMR elements are connected in series-parallel between a read bit line and the ground terminal.

The cell array structure completed by the manufacturing method of the present invention will be briefly described first. Then, the manufacturing method of the cell array structure will be described.

① Cell Array Structure Related to Manufacturing Method 3

FIG. 172 is a view showing the cell array structure of a magnetic random access memory in which one block is formed from a plurality of TMR elements connected in series-parallel.

As a characteristic feature of this cell array structure, one read bit line is arranged in one column (Y-direction), and a plurality of TMR elements connected in series-parallel are arranged immediately under the read bit line. The plurality of TMR elements form one read block and are connected between the read bit line and the ground terminal.

A read select switch (MOS transistor) RSW is arranged on the surface region of a semiconductor substrate. The source of the read select switch RSW is connected to the ground terminal through a source line SL. The source line SL is shared by two read blocks adjacent in the column direction. The source line SL extends straight in, e.g., the X-direction (a direction perpendicular to the page surface).

The gate of the read select switch (MOS transistor) RSW serves as a read word line RWLn. The read word line RWLn extends in the X-direction. Four TMR elements (MTJ (Magnetic Tunnel Junction) elements) are stacked on the read select switch RSW.

Each TMR element is arranged between the lower electrode and the upper electrode. The TMR elements are connected in series-parallel through contact plugs. The lower electrode of the TMR element at the lowermost stage is connected to the drain of the read select switch (MOS transistor) RSW. The upper electrode of the TMR element at the uppermost stage is connected, through a contact plug, to a read bit line BL0 that extends in the Y-direction.

Three write word lines WWL0, WWL1, and WWL2 extending in the X-direction are present in one row. Two write bit lines BL00 and BL01 extending in the Y-direction are present in one column.

When the cell array structure is viewed from the upper side of the semiconductor substrate, for example, the plurality of TMR elements that are stacked are laid out to overlap each other. The three write word lines are also laid out to overlap each other. The read bit line and two write bit lines are also laid out to overlap each other.

The contact plugs for connecting the plurality of TMR elements in series-parallel are laid out not to overlap the write word lines and write bit lines. The upper and lower electrodes of the TMR elements are formed in a pattern that can easily come into contact with the contact plugs.

② Steps in Manufacturing Method 3

The manufacturing method for implementing the cell array structure shown in FIG. 172 will be described below. A detailed manufacturing method (e.g., employment of a dual damascene process) will be described here. Hence, note that elements that are not illustrated in the cell array structure of FIG. 172 will be mentioned. However, the outline of the finally completed cell array structure is almost the same as that shown in FIG. 172.

Element Isolation Step

First, as shown in FIG. 173, the STI (Sallow Trench Isolation) structure 52, which is the shallow trenches are filled by field oxide for isolating active areas, is formed in the semiconductor substrate 51.

The STI structure 52 can be formed by, e.g., the following process.

A mask pattern (e.g., a silicon nitride film) is formed on the semiconductor substrate 51 by PEP (Photo Engraving Process). The semiconductor substrate 51 is etched by RIE (Reactive Ion Etching) using the mask pattern as a mask to form trenches in the semiconductor substrate 51. These trenches are filled with insulating films (for example, silicon oxide films) using, e.g., CVD (Chemical Vapor Deposition) and CMP (Chemical Mechanical Polishing).

After that, p-type impurities (e.g., B or $BF_2$) or n-type impurities (e.g., P or As) are doped into the semiconductor substrate by, e.g., ion implantation, as needed, to form p-type well regions or n-type well regions.

MOSFET Forming Step

Next, as shown in FIG. 174, MOS transistors including read select switches are formed on the surface region of the semiconductor substrate 51.

The MOS transistor can be formed by, e.g., the following process.

Impurities for controlling the threshold value of the MOS transistor are ion-implanted into necessitate channel portions in active areas surrounding by field oxides 52. A gate insulating film (e.g., a silicon oxide film) 53 is formed on the active regions by thermal oxidation. A gate electrode material (e.g., polysilicon containing an impurity) and cap insulating film (e.g., a silicon nitride film) 55 are formed on the gate insulating film 53 by CVD.

The cap insulating film 55 is patterned by PEP. Then, the gate electrode material and gate insulating film 53 are processed (etched) by RIE using the cap insulating film 55 as a mask. As a consequence, gate electrodes 54 extending in the X-direction are formed on the semiconductor substrate 51.

P- or n-type impurities are doped into the semiconductor substrate 51 by ion implantation using the cap insulating films 55 and gate electrodes 54 as a mask. Lightly-doped impurity regions (LDD regions or extension regions) are formed in the semiconductor substrate.

An insulating film (e.g., a silicon nitride film) is formed on the entire surface of the semiconductor substrate 51 by CVD. After that, the insulating film is etched by RIE to form sidewall insulating layers 57 on the side surfaces of the gate electrodes 54 and cap insulating films 55. P- or n-type impurities are doped into the semiconductor substrate 51 by ion implantation using the cap insulating films 55, gate electrodes 54, and sidewall insulating layers 57 as a mask. As a result, source regions 56A and drain regions 56B are formed in the semiconductor substrate 51.

After that, a dielectric interlayer (e.g., a silicon oxide layer) 58 that completely covers the MOS transistors is formed on the entire surface of the semiconductor substrate 51 by CVD. In addition, the surface of the dielectric interlayer 58 is planarized by CMP.

Contact Hole Forming Step

Next, as shown in FIGS. 175 and 176, contact holes 59 that reach the source regions 56A and drain regions 56B of MOS transistors are formed in the dielectric interlayer 58 on the semiconductor substrate 51.

The contact holes 59 can easily be formed by, e.g., forming a resist pattern on the dielectric interlayer 58 by PEP and etching the dielectric interlayer 58 by RIE using the resist pattern as a mark. After etching, the resist pattern is removed.

Interconnection Trench Forming Step

As shown in FIG. 177, interconnection trenches 60 are formed in the dielectric interlayer 58 on the semiconductor substrate 51. In this example, the interconnection trenches 60 extend in the X-direction. Hence, in the section along the Y-direction, the interconnection trenches 60 overlap the contact holes 59. The interconnection trenches 60 are indicated by broken lines in FIG. 177.

The interconnection trenches 60 can easily be formed by, e.g., forming a resist pattern on the dielectric interlayer 58 by PEP and etching the dielectric interlayer 58 by RIE using the resist pattern as a mark. After etching, the resist pattern is removed.

First Interconnection Layer Forming Step

As shown in FIG. 178, a barrier metal layer (e.g., a multilayer of Ti and TiN) 61 is formed on the dielectric interlayer 58, the inner surfaces of the contact holes 59, and the inner surfaces of the interconnection trenches 60 by, e.g., sputtering. Subsequently, a metal layer (e.g., a W layer) 62 that completely fills the contact holes 59 and interconnection trenches 60 is formed on the barrier metal layer 61 by, e.g., sputtering.

After that, as shown in FIG. 179, the metal layer 62 is polished by, e.g., CMP and left only in the contact holes 59 and interconnection trenches 60. The metal layer 62 remaining in each contact hole 59 forms a contact plug. The metal layer 62 remaining in each interconnection trench 60 forms a first interconnection layer. A dielectric interlayer (e.g., a silicon oxide layer) 63 is formed on the dielectric interlayer 58 by CVD.

The step comprising the contact hole forming step, the interconnection trench forming step, and the first interconnection layer forming step is called a dual damascene process.

Interconnection Trench Forming Step

Next, as shown in FIG. 180, interconnection trenches 64 are formed in the dielectric interlayer 63. In this example, the interconnection trenches 64 serve as trenches used to form write word lines and extend in the X-direction. Sidewall insulating layers (e.g., silicon nitride layers) 65 for self-aligned contacts are formed on the side surfaces of the interconnection trenches 64.

The interconnection trenches 64 can easily be formed by, e.g., forming a resist pattern on the dielectric interlayer 63 by PEP and etching the dielectric interlayer 63 by RIE using the resist pattern as a mask. After etching, the resist pattern is removed.

The sidewall insulating layers 65 can easily be formed by forming an insulating film (e.g., a silicon nitride film) on the entire surface of the dielectric interlayer 63 by CVD and etching the insulating film by RIE.

Second Interconnection Layer Forming Step

As shown in FIG. 181, a barrier metal layer (e.g., a multilayer of Ta and TaN) 66 is formed on the dielectric interlayer 63, the inner surfaces of the interconnection trenches 64, and the sidewall insulating layers 65 by, e.g., sputtering. Subsequently, a metal layer (e.g., a Cu layer) 67 that completely fills the interconnection trenches 64 is formed on the barrier metal layer 66 by, e.g., sputtering.

After that, as shown in FIG. 182, the metal layer 67 is polished by, e.g., CMP and left only in the interconnection trenches 64. The metal layer 67 remaining in each interconnection trench 64 forms a second interconnection layer that functions as a write word line.

An insulating layer (e.g., a silicon nitride layer) 68 is formed on the dielectric interlayer 63 by CVD. The insulating layer 68 is polished by CMP and left only on the metal layers 67 serving as the second interconnection layers. In addition, a dielectric interlayer (e.g., a silicon oxide layer) 69 that completely covers the metal layers 67 serving as the second interconnection layers is formed on the dielectric interlayer 63.

The step comprising the interconnection trench forming step and the second interconnection layer forming step is called a damascene process.

Step of Forming Lower Electrode of First MTJ Element

Next, as shown in FIGS. 183 and 184, contact holes that reach the metal layers 62 serving as the first interconnection layers are formed in the dielectric interlayer 69.

These contact holes can easily be formed by, e.g., forming a resist pattern on the dielectric interlayer 69 by PEP and etching the dielectric interlayers 63 and 69 by RIE using the resist pattern as a mask. After etching, the resist pattern is removed.

In addition, a barrier metal layer (e.g., a multilayer of Ti and TiN) 70 is formed on the inner surfaces of the contact holes by, e.g., sputtering. Subsequently, a metal layer (e.g., a W layer) 71 that completely fills the contact holes is formed on the barrier metal layer 70 by, e.g., sputtering.

After that, the metal layer 71 is polished by, e.g., CMP and left only in the contact holes. The metal layer 71 remaining in each contact hole forms a contact plug. In addition, a metal layer (e.g., a Ta layer) 72 serving as the lower electrodes of the first MTJ elements is formed on the dielectric interlayer 69 by CVD.

Step of Forming First MTJ Element and its Upper Electrode

As shown in FIGS. 185 and 186, first MTJ elements 73 are formed on the metal layer 72. Each first MTJ element 73 is formed from a tunneling barrier, two ferromagnetic layers that sandwich the tunneling barrier, and an antiferromagnetic layer and has, e.g., the structure as shown in FIG. 45.

In this example, protective insulating layers (e.g., silicon oxide layers) 73A which protect the first MTJ elements 73 are formed on the side surfaces of the first MTJ elements 73. The protective insulating layers 73A can easily be formed on the side surfaces of the first MTJ elements 73 by CVD and RIE.

A dielectric interlayer (e.g., a silicon oxide layer) 75B that completely covers the first MTJ elements 73 is formed by CVD. The dielectric interlayer 75B is polished by, e.g., CMP and left only between the first MTJ elements 73.

As shown in FIG. 187, a metal layer 74 serving as the upper electrodes of the first MTJ elements 73 is formed on the dielectric interlayer 75B by sputtering. Subsequently, an alumina layer 74A which protects the first MTJ elements 73 is formed on the metal layer 74 by CVD.

After this, a resist pattern is formed by PEP. The alumina layer 74A, metal layer 74, and dielectric interlayer 75B are patterned using the resist pattern as a mask. Simultaneously, the surfaces of the metal layers 72 serving as the lower electrodes of the first MTJ elements 73 are exposed.

The alumina layer 74A is formed again and then is etched by RIE. The alumina layer 74A remains while covering the upper and side surfaces of the metal layers 74, i.e., upper electrodes, and the first MTJ elements 73.

After that, a dielectric interlayer 75 that completely covers the first MTJ elements 73 is formed by CVD.

Interconnection Trench Forming Step

As shown in FIG. 188, interconnection trenches 75A are formed in the dielectric interlayer 75 by RIE using, e.g., a resist pattern as a mask. At this time, the alumina layer 74A functions as an etching stopper. For this reason, the bottom portions of the interconnection trenches 75A do not reach the metal layers 74 and first MTJ elements 73.

In this example, the interconnection trenches 75A serve as trenches used to form write bit lines and extend in the Y-direction. Sidewall insulating layers (e.g., silicon nitride layers) for self-aligned contacts are formed on the side surfaces of the interconnection trenches 75A.

The interconnection trenches 75A can easily be formed by, e.g., forming a resist pattern on the dielectric interlayer 75 by PEP and etching the dielectric interlayer 75 by RIE using the resist pattern as a mask. After etching, the resist pattern is removed.

The sidewall insulating layers can easily be formed by forming an insulating film (e.g., a silicon nitride film) on the entire surface of the dielectric interlayer 75 by CVD and etching the insulating film by RIE.

Third Interconnection Layer Forming Step

As shown in FIG. 189, a barrier metal layer (e.g., a multilayer of Ta and TaN) 76 is formed on the dielectric interlayer 75, the inner surfaces of the interconnection trenches 75A, and the sidewall insulating layers by, e.g., sputtering. Subsequently, a metal layer (e.g., a Cu layer) 77 that completely fills the interconnection trenches 75A is formed on the barrier metal layer 76 by, e.g., sputtering.

After that, the metal layer 77 is polished by, e.g., CMP and left only in the interconnection trenches 75A. The metal layer 77 remaining in each interconnection trench 75A forms a third interconnection layer that functions as a write bit line.

An insulating layer (e.g., a silicon nitride layer) 78 is formed on the dielectric interlayer 75 by CVD. The insulating layer 78 is polished by CMP and left only on the metal layers 77 serving as the third interconnection layers. Tn addition, a dielectric interlayer (e.g., a silicon oxide layer) 79 that completely covers the metal layers 77 serving as the third interconnection layers is formed on the dielectric interlayer 75.

Step of Forming Lower Electrode of Second MTJ Element

Next, as shown in FIGS. 190 and 191, contact holes that reach the upper electrodes 74 of the first MTJ elements are formed in the dielectric interlayers 75 and 79 and alumina layers 74A.

These contact holes can easily be formed by, e.g., forming a resist pattern on the dielectric interlayer 79 by PEP and etching the dielectric interlayers 75 and 79 and alumina layers 74A by RIE using the resist pattern as a mask. After etching, the resist pattern is removed.

In addition, a barrier metal layer (e.g., a multilayer of Ti and TiN) 80 is formed on the inner surfaces of the contact holes by, e.g., sputtering. Subsequently, a metal layer (e.g., a W layer) 81 that completely fills the contact holes is formed on the barrier metal layer 80 by, e.g., sputtering.

After that, the metal layer 81 is polished by, e.g., CMP and left only in the contact holes. The metal layer 81 remaining in each contact hole forms a contact plug. In addition, a metal layer 82 serving as the lower electrodes of the second MTJ elements is formed on the dielectric interlayer 79 by sputtering.

Step of Forming Second MTJ Element and its Upper Electrode

As shown in FIGS. 192 and 193, second MTJ elements 84 are formed on the metal layer 82. Each second MTJ element 84 is formed from a tunneling barrier, two ferromagnetic layers that sandwich the tunneling barrier, and an antiferromagnetic layer and has, e.g., the structure as shown in FIG. 46.

In this example, protective insulating layers (e.g., silicon oxide layers) 83A which protect the second MTJ elements 84 are formed on the side surfaces of the second MTJ elements 84. The protective insulating layers 83A can easily be formed on the side surfaces of the second MTJ elements 84 by CVD and RIE.

After that, the lower electrodes 82 of the second MTJ elements 84 are patterned. The lower electrodes 82 of the second MTJ elements 84 can easily be patterned by forming a resist pattern on the lower electrodes 82 by PEP and etching the lower electrodes 82 by RIE using the resist pattern as a mask. Then, the resist pattern is removed.

Next, as shown in FIG. 194, an alumina layer 83B which protects the second MTJ elements 84 is formed on the second MTJ elements 84. Then, the alumina layer 83B is etched by RIE. As a result, the alumina layer 83B remains on the side surface of each second MTJ element 84.

A dielectric interlayer (e.g., a silicon oxide layer) 84B that completely covers the second MTJ elements 84 is formed by CVD. The dielectric interlayer 84B is polished by, e.g., CMP and left only between the second MTJ elements 84.

Contact holes that reach the lower electrodes 72 of the first MTJ elements are formed in the dielectric interlayers 75, 79, and 84B.

These contact holes can easily be formed by, e.g., forming a resist pattern on the dielectric interlayer 84B by PEP and etching the dielectric interlayers 75, 79, and 84B by RIE using the resist pattern as a mask. After etching, the resist pattern is removed.

In this etching step, the etching rate of the alumina layers 74A and 83B is set to be much lower than that of the dielectric interlayers 75, 79, and 84B.

That is, according to this example, even when the contact holes are misaligned, the first and second MTJ elements 73 and 84 are not etched because the alumina layers 74A and 83B protect the first and second MTJ elements 73 and 84.

As shown in FIG. 195, a barrier metal layer (e.g., a multilayer of Ti and TiN) 85A is formed on the inner surfaces of the contact holes by, e.g., sputtering. Subsequently, a metal layer (e.g., a W layer) 85B that completely fills the contact holes is formed on the barrier metal layer 85A by, e.g., sputtering.

After that, the metal layer 85B is polished by, e.g., CMP and left only in the contact holes. The metal layer 85B remaining in each contact hole forms a contact plug. In addition, a metal layer 85 serving as the upper electrodes of the second MTJ elements 84 is formed on the dielectric interlayer 84B by sputtering. Subsequently, an alumina layer 85C which protects the second MTJ elements 84 is formed on the metal layer 85 by CVD.

After that, as shown in FIG. 196, a resist pattern is formed by PEP. The alumina layer 85C and metal layer 85 are patterned using the resist pattern as a mask. The alumina layer 85C is formed again and then is etched by RIE. The alumina layer 85C remains while covering the upper and side surfaces of the metal layers 85, i.e., upper electrodes, and the second MTJ elements 84.

After that, a dielectric interlayer 86 that completely covers the second MTJ elements 84 is formed by CVD.

Interconnection Trench Forming Step

As shown in FIG. 197, interconnection trenches 87 are formed in the dielectric interlayer 86 by RIE using, e.g., a resist pattern as a mask. At this time, the alumina layer 85C functions as an etching stopper. For this reason, the bottom portions of the interconnection trenches 87 do not reach the metal layers 85 and second MTJ elements 84.

In this example, the interconnection trenches 87 serve as trenches used to form write bit lines and extend in the X-direction. Sidewall insulating layers (e.g., silicon nitride layers) 88 for self-aligned contacts are formed on the side surfaces of the interconnection trenches 87.

The interconnection trenches 87 can easily be formed by, e.g., forming a resist pattern on the dielectric interlayer 86 by PEP and etching the dielectric interlayer 86 by RIE using the resist pattern as a mask. After etching, the resist pattern is removed.

The sidewall insulating layers 88 can easily be formed by forming an insulating film (e.g., a silicon nitride film) on the entire surface of the dielectric interlayer 86 by CVD and etching the insulating film by RIE.

Fourth Interconnection Layer Forming Step

As shown in FIG. 198, a barrier metal layer (e.g., a multilayer of Ta and TaN) 89 is formed on the dielectric interlayer 86, the inner surfaces of the interconnection trenches 87, and the sidewall insulating layers 88 by, e.g., sputtering. Subsequently, a metal layer (e.g., a Cu layer) 90 that completely fills the interconnection trenches 87 is formed on the barrier metal layer 89 by, e.g., sputtering.

After that, the metal layer 90 is polished by, e.g., CMP and left only in the interconnection trenches 87. The metal layer 90 remaining in each interconnection trench 87 forms a fourth interconnection layer that functions as a write word line.

An insulating layer (e.g., a silicon nitride layer) 92 is formed on the dielectric interlayer 86 by CVD. The insulating layer 92 is polished by CMP and left only on the metal layers 90 serving as the fourth interconnection layers. In addition, a dielectric interlayer (e.g., a silicon oxide layer) 93 that completely covers the metal layers 90 serving as the fourth interconnection layers is formed on the dielectric interlayer 86.

Step of Forming Lower Electrode of Third MTJ Element

Next, as shown in FIGS. 199 and 200, a metal layer 96 serving as the lower electrodes of the third MTJ elements is formed on the dielectric interlayer 93 by CVD.

In Manufacturing Method 3, a step of forming contact holes that reach the upper electrodes 85 of the second MTJ elements to connect the TMR elements stacked at four stages in series-parallel is omitted, unlike Manufacturing Method 2.

Step of Forming Third MTJ Element and its Upper Electrode

As shown in FIGS. 201 and 202, third MTJ elements 97 are formed on the metal layer 96. Each third MTJ element 97 is formed from a tunneling barrier, two ferromagnetic layers that sandwich the tunneling barrier, and an antiferromagnetic layer and has, e.g., the structure as shown in FIG. 47.

In this example, protective insulating layers (e.g., silicon oxide layers) 97A which protect the third MTJ elements 97 are formed on the side surfaces of the third MTJ elements 97. The protective insulating layers 97A can easily be formed on the side surfaces of the third MTJ elements 97 by CVD and RIE.

After that, the lower electrodes 96 of the third MTJ elements 97 are patterned. The lower electrodes 96 of the third MTJ elements 97 can easily be patterned by forming a resist pattern on the lower electrodes 96 by PEP and etching the lower electrodes 96 by RIE using the resist pattern as a mask. Then, the resist pattern is removed.

As shown in FIG. 203, a dielectric interlayer (e.g., a silicon oxide layer) 98 that completely covers the third MTJ elements 97 is formed by CVD. The dielectric interlayer 98 is polished by, e.g., CMP and left only between the third MTJ elements 97.

After that, contact holes that reach the lower electrodes 82 of the second MTJ elements 84 are formed in the dielectric interlayers 86, 93, and 98.

These contact holes can easily be formed by, e.g., forming a resist pattern on the dielectric interlayer 98 by PEP and etching the dielectric interlayers 86, 93, and 98 by RIE using the resist pattern as a mask. After etching, the resist pattern is removed.

As shown in FIG. 204, a barrier metal layer (e.g., a multilayer of Ti and TiN) 99A is formed on the inner surfaces of the contact holes by, e.g., sputtering. Subsequently, a metal layer (e.g., a W layer) 99B that completely fills the contact holes is formed on the barrier metal layer 99A by, e.g., sputtering.

After that, the metal layer 99B is polished by, e.g., CMP and left only in the contact holes. The metal layer 99B remaining in each contact hole forms a contact plug. In addition, a metal layer 99 serving as the upper electrodes of the third MTJ elements is formed on the dielectric interlayer 98 by CVD.

In addition, an alumina layer 99C which protects the third MTJ elements 97 is formed on the upper electrodes 99 of the third MTJ elements 97 by CVD.

Next, as shown in FIG. 205, a resist pattern is formed by PEP. The alumina layer 99C and metal layer 99 are patterned using the resist pattern as a mask. The alumina layer 99C is formed again and then is etched by RIE. The alumina layer 99C remains while covering the upper and side surfaces of the metal layers 99, i.e., upper electrodes, and the third MTJ elements 97.

After that, a dielectric interlayer 100 that completely covers the third MTJ elements 97 is formed by CVD.

Interconnection Trench Forming Step

As shown in FIGS. 206 and 207, interconnection trenches that extend in the Y-direction are formed in the dielectric interlayer 100 by RIE using, e.g., a resist pattern as a mask. At this time, the alumina layer 99C functions as an etching stopper. For this reason, the bottom portions of the interconnection trenches do not reach the metal layers 99 and third MTJ elements 97.

In this example, the interconnection trenches serve as trenches used to form write bit lines and extend in the Y-direction. Sidewall insulating layers (e.g., silicon nitride layers) for self-aligned contacts are formed on the side surfaces of the interconnection trenches.

The interconnection trenches can easily be formed by, e.g., forming a resist pattern on the dielectric interlayer 100 by PEP and etching the dielectric interlayer 100 by RIE using the resist pattern as a mask. After etching, the resist pattern is removed.

The sidewall insulating layers can easily be formed by forming an insulating film (e.g., a silicon nitride film) on the entire surface of the dielectric interlayer 100 by CVD and etching the insulating film by RIE.

Fifth Interconnection Layer Forming Step

As shown in FIGS. 206 and 207, a barrier metal layer (e.g., a multilayer of Ta and TaN) 101 is formed on the dielectric interlayer 100, the inner surfaces of the interconnection trenches, and the sidewall insulating layers by, e.g., sputtering. Subsequently, a metal layer (e.g., a Cu layer) 102 that completely fills the interconnection trenches is formed on the barrier metal layer 101 by, e.g., sputtering.

After that, the metal layer 102 is polished by, e.g., CMP and left only in the interconnection trenches. The metal layer 102 remaining in each interconnection trench forms a fifth interconnection layer that functions as a write word line.

An insulating layer (e.g., a silicon nitride layer) 103 is formed on the dielectric interlayer 100 by CVD. The insulating layer 103 is polished by CMP and left only on the metal layers 102 serving as the fifth interconnection layers. In addition, a dielectric interlayer (e.g., a silicon oxide layer) 104 that completely covers the metal layers 102 serving as the fifth interconnection layers is formed on the dielectric interlayer 100.

Step of Forming Lower Electrode of Fourth MTJ Element

Next, as shown in FIGS. 208 and 209, contact holes that reach the upper electrodes 99 of the third MTJ elements 97 are formed in the dielectric interlayers 100 and 104 and alumina layers 99C.

These contact holes can easily be formed by, e.g., forming a resist pattern on the dielectric interlayer 104 by PEP and etching the dielectric interlayers 100 and 104 and alumina layers 99C by RIE using the resist pattern as a mask. After etching, the resist pattern is removed.

In addition, a barrier metal layer (e.g., a multilayer of Ti and TiN) 80X is formed on the inner surfaces of the contact holes by, e.g., sputtering. Subsequently, a metal layer (e.g., a W layer) 81X that completely fills the contact holes is formed on the barrier metal layer 80X by, e.g., sputtering.

After that, the metal layer 81X is polished by, e.g., CMP and left only in the contact holes. The metal layer 81X remaining in each contact hole forms a contact plug. In addition, a metal layer 107 serving as the lower electrodes of the fourth MTJ elements is formed on the dielectric interlayer 104 by sputtering.

Step of Forming Fourth MTJ Element and its Upper Electrode

As shown in FIGS. 208 and 209, fourth MTJ elements 108 are formed on the metal layer 107. Each fourth MTJ element 108 is formed from a tunneling barrier, two ferromagnetic layers that sandwich the tunneling barrier, and an antiferromagnetic layer and has, e.g., the structure as shown in FIG. 48.

In this example, protective insulating layers (e.g., silicon oxide layers) 108A which protect the fourth MTJ elements 108 are formed on the side surfaces of the fourth MTJ elements 108. The protective insulating layers 108A can easily be formed on the side surfaces of the fourth MTJ elements 108 by CVD and RIE.

After that, the lower electrodes 107 of the fourth MTJ elements 108 are patterned. The lower electrodes 107 of the fourth MTJ elements 108 can easily be patterned by forming a resist pattern on the lower electrodes 107 by PEP and etching the lower electrodes 107 by RIE using the resist pattern as a mask. Then, the resist pattern is removed.

Next, as shown in FIG. 210, an alumina layer 108B which protects the fourth MTJ elements 108 is formed on the fourth MTJ elements 108. Then, the alumina layer 108B is etched by RIE. As a result, the alumina layer 108B remains on the side surface of each fourth MTJ element 108.

A dielectric interlayer (e.g., a silicon oxide layer) 109 that completely covers the fourth MTJ elements 108 is formed by CVD. The dielectric interlayer 109 is polished by, e.g., CMP and left only between the fourth MTJ elements 108.

Contact holes that reach the lower electrodes 96 of the third MTJ elements 97 are formed in the dielectric interlayers 100, 104, and 109.

These contact holes can easily be formed by, e.g., forming a resist pattern on the dielectric interlayer 109 by PEP and etching the dielectric interlayers 100, 104, and 109 by RIE using the resist pattern as a mask. After etching, the resist pattern is removed.

In this etching step, the etching rate of the alumina layers 99C and 108B is set to be much lower than that of the dielectric interlayers 100, 104, and 109.

That is, according to this example, even when the contact holes are misaligned, the third and fourth MTJ elements 97 and 108 are not etched because the alumina layers 99C and 108B protect the third and fourth MTJ elements 97 and 108.

As shown in FIG. 211, a barrier metal layer (e.g., a multilayer of Ti and TiN) 105 is formed on the inner surfaces of the contact holes by, e.g., sputtering. Subsequently, a metal layer (e.g., a W layer) 106 that completely fills the contact holes is formed on the barrier metal layer 105 by, e.g., sputtering.

After that, the metal layer 106 is polished by, e.g., CMP and left only in the contact holes. The metal layer 106 remaining in each contact hole forms a contact plug. In addition, a metal layer 107 serving as the upper electrodes of the fourth MTJ elements 108 is formed on the dielectric interlayer 109 by sputtering. Subsequently, an alumina layer 107A which protects the fourth MTJ elements 108 is formed on the metal layer 107 by CVD.

Next, as shown in FIG. 212, a resist pattern is formed by PEP. The alumina layer 107A and metal layer 107 are patterned using the resist pattern as a mask.

The alumina layer 107A is formed again and then is etched by RIE. The alumina layer 107A remains while covering the upper and side surfaces of the metal layers 107, i.e., upper electrodes, and the fourth MTJ elements 108.

After that, a dielectric interlayer 111 that completely covers the fourth MTJ elements 108 is formed by CVD.

Interconnection Trench Forming Step

As shown in FIGS. 213 and 214, interconnection trenches 112 that extend in the X-direction are formed in the dielectric interlayer 111 by RIE using, e.g., a resist pattern as a mask. At this time, the alumina layer 107A functions as an etching stopper. For this reason, the bottom portions of the interconnection trenches 112 do not reach the metal layers 107 and fourth MTJ elements 108.

In this example, the interconnection trenches 112 serve as trenches used to form write bit lines and extend in the X-direction. Sidewall insulating layers (e.g., silicon nitride layers) 113 for self-aligned contacts are formed on the side surfaces of the interconnection trenches 112.

The interconnection trenches 112 can easily be formed by, e.g., forming a resist pattern on the dielectric interlayer 111 by PEP and etching the dielectric interlayer 111 by RIE using the resist pattern as a mask. After etching, the resist pattern is removed.

The sidewall insulating layers 113 can easily be formed by forming an insulating film (e.g., a silicon nitride film) on the entire surface of the dielectric interlayer 111 by CVD and etching the insulating film by RIE.

Sixth Interconnection Layer Forming Step

As shown in FIGS. 213 and 214, a barrier metal layer (e.g., a multilayer of Ta and TaN) 114 is formed on the dielectric interlayer 111, the inner surfaces of the interconnection trenches 112, and the sidewall insulating layers 113 by, e.g., sputtering. Subsequently, a metal layer (e.g., a Cu layer) 115 that completely fills the interconnection trenches 112 is formed on the barrier metal layer 114 by, e.g., sputtering.

After that, the metal layer 115 is polished by, e.g., CMP and left only in the interconnection trenches 112. The metal layer 115 remaining in each interconnection trench 112 forms a sixth interconnection layer that functions as a write word line.

An insulating layer (e.g., a silicon nitride layer) 116 is formed on the dielectric interlayer 111 by CVD. The insulating layer 116 is polished by CMP and left only on the metal layers 115 serving as the sixth interconnection layers.

Seventh Interconnection Layer Forming Step

Next, as shown in FIGS. 215 and 216, a dielectric interlayer (e.g., a silicon oxide layer) 117 that completely covers the metal layers 115 serving as the sixth interconnection layers is formed on the dielectric interlayer 111. Contact holes that reach the lower electrodes 107 of the fourth MTJ elements are formed in the dielectric interlayers 111 and 117.

These contact holes can easily be formed by, e.g., forming a resist pattern on the dielectric interlayer 117 by PEP and etching the dielectric interlayers 111 and 117 by RIE using the resist pattern as a mask. After etching, the resist pattern is removed.

In addition, interconnection trenches used to form read bit lines are formed in the dielectric interlayer 117.

The interconnection trenches can easily be formed by, e.g., forming a resist pattern on the dielectric interlayer 117 by PEP and etching the dielectric interlayer 117 by RIE using the resist pattern as a mask. After etching, the resist pattern is removed.

After that, a barrier metal layer (e.g., a multilayer of Ti and TiN) 118 is formed on the dielectric interlayer 117, the inner surfaces of the contact holes, and the inner surfaces of the interconnection trenches by, e.g., sputtering. Subsequently, a metal layer (e.g., a W layer) 119 that completely fills the contact holes and interconnection trenches is formed on the barrier metal layer 118 by, e.g., sputtering.

The metal layer 119 and barrier metal layer 118 are polished by, e.g., CMP and left only in the contact holes and interconnection trenches. The metal layer 119 remaining in each contact hole forms a contact plug. The metal layer 119 remaining in each interconnection trench forms a seventh interconnection layer that functions as a read bit line.

③ Conclusion

According to Manufacturing Method 3, a cell array structure (1-transistor n-MTJ structure) in which a plurality of TMR elements are stacked at a plurality of stages, and the plurality of TMR elements are connected in series-parallel between a read bit line and the ground terminal can be realized.

In this example, to form an interconnection layer, a damascene process and dual damascene process are employed. Instead, for example, a process of forming an interconnection layer by etching may be employed.

8. Others

In the above description, a TMR element is used as a memory cell of the magnetic random access memory. However, even when the memory cell is formed from a GMR (Giant MagnetoResistance) element, the present invention, i.e., various kinds of cell array structures, the read operation principle, and the detailed example of the read circuit can be applied.

The structure of a TMR element or GMR element and the materials thereof are not particularly limited in applying the present invention.

As a read select switch of the magnetic random access memory, a MOS transistor, bipolar transistor, or diode is used. However, any other switch element such as a MIS (Metal Insulator Semiconductor) transistor (including a MOSFET), MES (Metal Semiconductor) transistor, or junction transistor can also be used as a read select switch.

As has been described above, according to the present invention, a magnetic random access memory having a new cell array structure suitable for an increase in memory capacity and a manufacturing method thereof can be provided.

What is claimed is:

1. A magnetic random access memory comprising:

memory cells which are stacked on a semiconductor substrate and connected in series to store data using a magnetoresistive effect;

a bit line which is connected to one terminal of said memory cells;

a read circuit connected to said bit line;

a first write line which is used to write data in one of said memory cells and extends in a first direction; and a second write line which is used to write data in the one of said memory cells and extends in a second direction perpendicular to the first direction.

2. A memory according to claim 1, wherein the data in the one of said memory cells are detected by supplying a first read current to said memory cells, supplying a second read current to said memory cells at the same time of or in parallel with writing of data to the one of said memory cells, and sensing a difference or a change between the first and second read currents.

3. A memory according to claim 1, further comprising:

a storing circuit which is stored a first read current flowing said memory cells, and a sense amplifier which is determined data in the one of said memory cells on the basis of a second read current flowing said memory cells and said first read current storing said storing circuit.

4. A memory according to claim 1, wherein when said memory cells have the same magnetizing state, said memory cells have the same resistance value.

5. A memory according to claim 1, wherein even when said memory cells have the same magnetizing state, said memory cells have different resistance values.

6. A memory according to claim 1, further comprising a third write line which use to write data to a memory cell except to the one of said memory cells and extends in the first direction, wherein the first and third write lines are stacked and connected in series.

7. A memory according to claim 6, wherein said first and third write lines are arranged between said memory cells or right above or right under said memory cells.

8. A memory according to claim 6, wherein said first and third write lines are arranged right above odd- or even-numbered memory cells from the semiconductor substrate side.

9. A memory according to claim 1, further comprising a third write line which use to write data to a memory cell except to the one of said memory cells and extends in the second direction, wherein the second and third write lines are stacked and connected in series.

10. A memory according to claim 9, wherein said second and third write lines are arranged between said memory cells or right above or right under said memory cells.

11. A memory according to claim 9, wherein said second and third write lines are arranged right above odd- or even-numbered memory cells from the semiconductor substrate side.

12. A memory according to claim 1, further comprising a third write line which use to write data to a memory cell except to the one of said memory cells and extends in the first direction, wherein the first and third write lines are stacked and connected in parallel.

13. A memory according to claim 12, wherein said first and third write lines are arranged between said memory cells or right above or right under said memory cells.

14. A memory according to claim 12, wherein said first and third write lines are arranged right above odd- or even-numbered memory cells from the semiconductor substrate side.

15. A memory according to claim 1, further comprising a third write line which use to write data to a memory cell except to the one of said memory cells and extends in the second direction, wherein the second and third write lines are stacked and connected in parallel.

16. A memory according to claim 15, wherein said second and fourth write lines are arranged between said memory cells or right above or right under said memory cells.

17. A memory according to claim 15, wherein said second and fourth write lines are arranged right above odd- or even-numbered memory cells from the semiconductor substrate side.

18. A memory according to claim 1, further comprising a memory cell array including said memory cells, a driver which supplies a write current to said first write line; and a sinker which absorbs the write current.

19. A memory according to claim 18, wherein said driver is arranged on one end side of said memory cell array, and said sinker is arranged on the other end side of said memory cell array.

20. A memory according to claim 18, wherein said driver and sinker are arranged on one end side of said memory cell array.

21. A memory according to claim 1, wherein the one of said memory cells is arranged between said first write line and said second write line.

22. A memory according to claim 1, wherein a layer structure of memory cells arranged right under said first write line and a layer structure of memory cells arranged right above said first write line are symmetrical with respect to said first write line.

23. A memory according to claim 1, wherein a layer structure of memory cells arranged right under said second write line and a layer structure of memory cells arranged right above said second write line are symmetrical with respect to said second write line.

24. A memory according to claim 1, wherein each of said memory cells includes at least a pinning layer having a fixed magnetizing direction, a storing layer whose magnetizing direction changes depending on write data, and a tunneling barrier layer arranged between said pinning layer and said storing layer.

25. A memory according to claim 24, wherein the magnetizing direction of said pinning layer is the same in all of said memory cells.

26. A memory according to claim 24, wherein the magnetizing direction of said pinning layer changes between odd-numbered memory cells and even-numbered memory cells from the semiconductor substrate side.

27. A memory according to claim 1, wherein said memory cells are arranged between the semiconductor substrate and said bit line.

28. A memory according to claim 1, wherein said memory cells form one read block, and the other terminal of each of said memory cells is connected to a source line through a read select switch.

29. A memory according to claim 28, wherein the read select switch is arranged on a surface region of the semiconductor substrate right under said memory cells.

30. A memory according to claim 29, further comprising a read word line which is connected to a control terminal of the read select switch and extends in the first direction or in the second direction.

31. A memory according to claim 1, wherein each of said memory cells is sandwiched between an upper electrode and a lower electrode, and said memory cells are connected in series through contact plugs which are in contact with the upper electrodes or lower electrodes.

32. A memory according to claim 28, wherein the read select switch is formed from at least one of a MIS transistor, a MES transistor, a junction transistor, a bipolar transistor, and a diode.

33. A magnetic random access memory comprising:

memory cells which are stacked one another and connected in parallel to store data using a magnetoresistive effect;

a bit line which is connected to one terminal of said memory cells;

a read circuit connected to said bit line;

a first write line which is used to write data in one of said memory cells and extends in a first direction; and a second write line which is used to write data in the one of said memory cells and extends in a second direction perpendicular to the first direction.

34. A memory according to claim 33, wherein the data in the one of said memory cells are detected by supplying a first read current to said memory cells, supplying a second read current to said memory cells at the same time of or in parallel with writing of data to the one of said memory cells, and sensing a difference or a change between the first and second read currents.

35. A memory according to claim 33, wherein when said memory cells have the same magnetizing state, said memory cells have the same resistance value.

36. A memory according to claim 33, wherein even when said memory cells have the same magnetizing state, said memory cells have different resistance values.

37. A memory according to claim 33, further comprising a third write line which use to write data to a memory cell except to the one of said memory cells and extends in the first direction, wherein the first and third write lines are stacked and connected in series.

38. A memory according to claim 37, wherein said first and third write lines are arranged between said memory cells or right above or right under said memory cells.

39. A memory according to claim 37, wherein said first and third write lines are arranged right above odd- or even-numbered memory cells from the semiconductor substrate side.

40. A memory according to claim 33, further comprising a third write line which use to write data to a memory cell except to the one of said memory cells and extends in the second direction, wherein the second and third write lines are stacked and connected in series.

41. A memory according to claim 40, wherein said second and fourth write lines are arranged between said memory cells or right above or right under said memory cells.

42. A memory according to claim 40, wherein said second and fourth write lines are arranged right above odd- or even-numbered memory cells from the semiconductor substrate side.

43. A memory according to claim 33, further comprising a third write line which use to write data to a memory cell except to the one of said memory cells and extends in the first direction, wherein the first and third write lines are stacked and connected in parallel.

44. A memory according to claim 43, wherein said first and third write lines are arranged between said memory cells or right above or right under said memory cells.

45. A memory according to claim 43, wherein said first and third write lines are arranged right above odd- or even-numbered memory cells from the semiconductor substrate side.

46. A memory according to claim 33, further comprising a third write line which use to write data to a memory cell except to the one of said memory cells and extends in the second direction, wherein the second and third write lines are stacked and connected in parallel.

47. A memory according to claim 46, wherein said second and fourth write lines are arranged between said memory cells or right above or right under said memory cells.

48. A memory according to claim 46, wherein said second and fourth write lines are arranged right above odd- or even-numbered memory cells from the semiconductor substrate side.

49. A memory according to claim 33, further comprising a memory cell array including said memory cells, a driver which supplies a write current to said first write line; and a sinker which absorbs the write current.

50. A memory according to claim 49, wherein said driver is arranged on one end side of said memory cell array, and said sinker is arranged on the other end side of said memory cell array.

51. A memory according to claim 49, wherein said driver and sinker are arranged on one end side of said memory cell array.

52. A memory according to claim 33, wherein the one of said memory cells is arranged between said first write line and said second write line.

53. A memory according to claim 33, wherein a layer structure of memory cells arranged right under said first write line and a layer structure of memory cells arranged right above said first write line are symmetrical with respect to said first write line.

54. A memory according to claim 33, wherein a layer structure of memory cells arranged right under said second write line and a layer structure of memory cells arranged right above said second write line are symmetrical with respect to said second write line.

55. A memory according to claim 33, wherein each of said memory cells includes at least a pinning layer having a fixed magnetizing direction, a storing layer whose magnetizing direction changes depending on write data, and a tunneling barrier layer arranged between said pinning layer and said storing layer.

56. A memory according to claim 55, wherein the magnetizing direction of said pinning layer is the same in all of said memory cells.

57. A memory according to claim 55, wherein the magnetizing direction of said pinning layer changes between odd-numbered memory cells and even-numbered memory cells from the semiconductor substrate side.

58. A memory according to claim 33, wherein said memory cells are arranged between the semiconductor substrate and said bit line.

59. A memory according to claim 33, wherein said memory cells form one read block, and the other terminal of each of said memory cells is connected to a source line through a read select switch.

60. A memory according to claim 59, wherein the read select switch is arranged on a surface region of the semiconductor substrate right under said memory cells.

61. A memory according to claim 60, further comprising a read word line which is connected to a control terminal of the read select switch and extends in the first direction or in the second direction.

62. A memory according to claim 33, wherein each of said memory cells is sandwiched between an upper electrode and a lower electrode, and said memory cells are connected in parallel through contact plugs which are in contact with the upper electrodes or lower electrodes.

63. A memory according to claim 59, wherein the read select switch is formed from at least one of a MIS transistor, a MES transistor, a junction transistor, a bipolar transistor, and a diode.

64. A magnetic random access memory comprising:

memory cells which are stacked one another and formed by combining series connection and parallel connection to store data using a magnetoresistive effect;

a bit line which is connected to one terminal of said memory cells;

a read circuit connected to said bit line;

a first write line which is used to write data in one of said memory cells and extends in a first direction; and a second write line which is used to write data in the one of said memory cells and extends in a second direction perpendicular to the first direction.

65. A memory according to claim 64, wherein the data in the one of said memory cells are detected by supplying a first read current to said memory cells, supplying a second read current to said memory cells at the same time of or in parallel with writing of data to the one of said memory cells, and sensing a difference or a change between the first and second read currents.

66. A memory according to claim 64, wherein when said memory cells have the same magnetizing state, said memory cells have the same resistance value.

67. A memory according to claim 64, wherein even when said memory cells have the same magnetizing state, said memory cells have different resistance values.

68. A memory according to claim 64, further comprising a third write line which use to write data to a memory cell except to the one of said memory cells and extends in the first direction, wherein the first and third write lines are stacked and connected in series.

69. A memory according to claim 68, wherein said first and third write lines are arranged between said memory cells or right above or right under said memory cells.

70. A memory according to claim 68, wherein said first and third write lines are arranged right above odd- or even-numbered memory cells from the semiconductor substrate side.

71. A memory according to claim 64, further comprising a third write line which use to write data to a memory cell except to the one of said memory cells and extends in the second direction, wherein the second and third write lines are stacked and connected in series.

72. A memory according to claim 71, wherein said second and fourth write lines are arranged between said memory cells or right above or right under said memory cells.

73. A memory according to claim 71, wherein said second and fourth write lines are arranged right above odd- or even-numbered memory cells from the semiconductor substrate side.

74. A memory according to claim 64, further comprising a third write line which use to write data to a memory cell except to the one of said memory cells and extends in the first direction, wherein the first and third write lines are stacked and connected in parallel.

75. A memory according to claim 74, wherein said first and third write lines are arranged between said memory cells or right above or right under said memory cells.

76. A memory according to claim 74, wherein said first and third write lines are arranged right above odd- or even-numbered memory cells from the semiconductor substrate side.

77. A memory according to claim 64, further comprising a third write line which use to write data to a memory cell except to the one of said memory cells and extends in the second direction, wherein the second and third write lines are stacked and connected in parallel.

78. A memory according to claim 77, wherein said second and fourth write lines are arranged between said memory cells or right above or right under said memory cells.

79. A memory according to claim 77, wherein said second and fourth write lines are arranged right above odd- or even-numbered memory cells from the semiconductor substrate side.

80. A memory according to claim 64, further comprising a memory cell array including said memory cells, a driver which supplies a write current to said first write line; and a sinker which absorbs the write current.

81. A memory according to claim 80, wherein said driver is arranged on one end side of said memory cell array, and said sinker is arranged on the other end side of said memory cell array.

82. A memory according to claim 80, wherein said driver and sinker are arranged on one end side of said memory cell array.

83. A memory according to claim 64, wherein the one of said memory cells is arranged between said first write line and said second write line.

84. A memory according to claim 64, wherein a layer structure of memory cells arranged right under said first write line and a layer structure of memory cells arranged right above said first write line are symmetrical with respect to said first write line.

85. A memory according to claim 64, wherein a layer structure of memory cells arranged right under said second write line and a layer structure of memory cells arranged right above said second write line are symmetrical with respect to said second write line.

86. A memory according to claim 64, wherein each of said memory cells includes at least a pinning layer having a fixed magnetizing direction, a storing layer whose magnetizing direction changes depending on write data, and a tunneling barrier layer arranged between said pinning layer and said storing layer.

87. A memory according to claim 86, wherein the magnetizing direction of said pinning layer is the same in all of said memory cells.

88. A memory according to claim 86, wherein the magnetizing direction of said pinning layer changes between odd-numbered memory cells and even-numbered memory cells from the semiconductor substrate side.

89. A memory according to claim 64, wherein said memory cells are arranged between the semiconductor substrate and said bit line.

90. A memory according to claim 64, wherein said memory cells form one read block, and the other terminal of each of said memory cells is connected to a source line through a read select switch.

91. A memory according to claim 90, wherein the read select switch is arranged on a surface region of the semiconductor substrate right under said memory cells.

92. A memory according to claim 91, further comprising a read word line which is connected to a control terminal of the read select switch and extends in the first direction or in the second direction.

93. A memory according to claim 64, wherein each of said memory cells is sandwiched between an upper electrode and a lower electrode, and said memory cells are connected in series through contact plugs which are in contact with the upper electrodes or lower electrodes.

94. A memory according to claim 90, wherein the read select switch is formed from at least one of a MIS transistor, a MES transistor, a junction transistor, a bipolar transistor, and a diode.

95. A manufacturing method of a magnetic random access memory, comprising:

forming a read select switch on a surface region of a semiconductor substrate;

forming a first write line extending in a first direction on the read select switch;

forming a first MTJ element right above the first write line;

forming a second write line extending in a second direction perpendicular to the first direction right above the first MTJ element;

forming, right above the second write line, a second MTJ element which is symmetrical to the first MTJ element with respect to the second write line;

forming a third write line extending in the first direction right above the second MTJ element;

forming, right above the third write line, a third MTJ element which is symmetrical to the second MTJ element with respect to the third write line;

forming a fourth write line extending in the second direction right above the third MTJ element;

forming, right above the fourth write line, a fourth MTJ element which is symmetrical to the third MTJ element with respect to the fourth write line;

forming a fifth write line extending in the first direction right above the fourth MTJ element; and forming a read bit line extending on the second direction on the fifth write line.

96. A method according to claim 95, wherein the first to fifth write lines are formed by a damascene process.

97. A method according to claim 95, wherein the first to fifth write lines are formed by steps of forming an interconnection trench in an insulating layer, forming a metal layer that completely fills the interconnection trench, and removing the metal layer except that in the interconnection trench.

98. A method according to claim 97, wherein before the metal layer is formed, a barrier metal layer is formed.

99. A method according to claim 98, wherein before the barrier metal layer is formed, a sidewall insulating layer is formed on a side surface of the interconnection trench.

100. A method according to claim 99, wherein after the metal layer except that in the interconnection trench is removed, an insulating layer made of the same material as that of the sidewall insulating layer is formed only on the metal layer.

101. A method according to claim 100, wherein the sidewall insulating layer is formed from silicon nitride.

102. A method according to claim 95, further comprising forming a first protective layer which covers the first MTJ element, forming a second protective layer which covers the second MTJ element, forming a third protective layer which covers the third MTJ element, and forming a fourth protective layer which covers the fourth MTJ element.

103. A method according to claim 102, wherein the first, second, third, and fourth protective layers are formed from alumina.

* * * * *